US010361182B2

(12) United States Patent
Tamagawa et al.

(10) Patent No.: US 10,361,182 B2
(45) Date of Patent: Jul. 23, 2019

(54) CHIP PARTS AND METHOD FOR MANUFACTURING THE SAME, CIRCUIT ASSEMBLY HAVING THE CHIP PARTS AND ELECTRONIC DEVICE

(71) Applicant: ROHM CO., LTD., Kyoto (JP)

(72) Inventors: Hiroshi Tamagawa, Kyoto (JP); Yasuhiro Kondo, Kyoto (JP); Hiroki Yamamoto, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/581,460

(22) Filed: Dec. 23, 2014

(65) Prior Publication Data

US 2015/0216044 A1 Jul. 30, 2015

(30) Foreign Application Priority Data

Dec. 27, 2013 (JP) ................................ 2013-272825
Dec. 27, 2013 (JP) ................................ 2013-272826
Nov. 5, 2014 (JP) ................................ 2014-225234

(51) Int. Cl.

| | |
|---|---|
| ***H05K 1/02*** | (2006.01) |
| ***H01L 27/01*** | (2006.01) |
| ***H01G 4/30*** | (2006.01) |
| ***H01G 4/33*** | (2006.01) |
| ***H01C 1/14*** | (2006.01) |
| ***H01C 1/142*** | (2006.01) |
| ***H01C 7/00*** | (2006.01) |
| ***H01C 17/00*** | (2006.01) |
| ***H01G 4/012*** | (2006.01) |
| *H05K 1/16* | (2006.01) |
| *H01L 27/08* | (2006.01) |
| *H01L 49/02* | (2006.01) |

(52) U.S. Cl.

CPC ............ *H01L 27/016* (2013.01); *H01C 1/14* (2013.01); *H01C 1/142* (2013.01); *H01C 7/003* (2013.01); *H01C 7/006* (2013.01); *H01C 17/006* (2013.01); *H01G 4/012* (2013.01); *H01G 4/30* (2013.01); *H01G 4/33* (2013.01); *H01L 27/0802* (2013.01); *H01L 27/0805* (2013.01); *H01L 28/20* (2013.01); *H01L 28/60* (2013.01); *H05K 1/167* (2013.01); *Y10T 29/49158* (2015.01)

(58) Field of Classification Search

CPC ....... H05K 1/0296; H05K 5/0091; H05K 1/11
USPC .................................. 174/255; 361/760–767
See application file for complete search history.

(56) References Cited

U.S. PATENT DOCUMENTS 6,208,525 B1 * 3/2001 Imasu .................. H01L 21/563 174/255
8,929,092 B2 * 1/2015 Yoshioka .......... H01L 23/49811 174/250

(Continued)

FOREIGN PATENT DOCUMENTS

JP S58-14502 A 1/1983
JP S58-106933 U 7/1983

(Continued)

*Primary Examiner* — Stanley Tso
(74) *Attorney, Agent, or Firm* — Rabin & Berdo, P.C.

(57) ABSTRACT

The chip part of the present invention includes a substrate, an electrode on the substrate and having a front surface in which a plurality of recessed portions are formed toward the thickness direction thereof, and an element region having a circuit element that is electrically connected to the electrode.

17 Claims, 151 Drawing Sheets

(56) References Cited

U.S. PATENT DOCUMENTS

| | | | | |
|---|---|---|---|---|
| 2007/0229197 | A1* | 10/2007 | Okano | H01P 7/082 333/219 |
| 2011/0079912 | A1* | 4/2011 | Marcoux | H01L 23/481 257/773 |
| 2011/0180308 | A1* | 7/2011 | Nakamura | H01L 51/5268 174/255 |
| 2012/0189029 | A1* | 7/2012 | Kashiwagi | B82Y 20/00 372/44.011 |
| 2013/0252416 | A1* | 9/2013 | Takeda | H01L 21/486 438/630 |
| 2014/0034993 | A1* | 2/2014 | Shimokawa | H01L 23/367 257/99 |
| 2015/0305159 | A1* | 10/2015 | Yamamoto | H05K 1/18 361/767 |

FOREIGN PATENT DOCUMENTS

| | | | |
|---|---|---|---|
| JP | S62-28422 | U | 2/1987 |
| JP | H05-175003 | A | 7/1993 |
| JP | 2001-044001 | A | 2/2001 |
| JP | 2001-076912 | A | 3/2001 |
| JP | 2003-535466 | A | 11/2003 |
| JP | 2010-073961 | A | 4/2010 |
| JP | 2011-086750 | A | 4/2011 |
| JP | 2013-153129 | A | 8/2013 |
| JP | 2013-201419 | A | 10/2013 |

* cited by examiner

4
VIb
4B
4A
22
R
R
22
R
R
F(22)
F (22)
1
X
D (22)
3A
3B
3
2F
85(90)

22
21
20
2
4
23
24
2A
22
R
(F) 22
X
3

XXXI-XXXI

XXXa-XXXa

XXXb-XXXb

XXXc-XXXc

XXXa-XXXa

XXXb-XXXb

XXXc-XXXc

401A

401C

401D

401E

XCVII-XCVII

XCVIa-XCVIa

XCVIb-XCVIb

XCVIc-XCVIc

1301

1331

1401B

1401C

1401D

1401E

CHIP PARTS AND METHOD FOR MANUFACTURING THE SAME, CIRCUIT ASSEMBLY HAVING THE CHIP PARTS AND ELECTRONIC DEVICE

CROSS-REFERENCE TO RELATED APPLICATIONS

The present application corresponds to Japanese Patent Application No. 2013-272825 filed in the Japan Patent Office on Dec. 27, 2013, Japanese Patent Application No. 2013-272826 filed in the Japan Patent Office on Dec. 27, 2013, and Japanese Patent Application No. 2014-225234 filed in the Japan Patent Office on Nov. 5, 2014, and all the disclosures of the applications will be incorporated herein by citation.

FIELD OF THE INVENTION

The present invention relates to a chip part, a method for manufacturing the chip part, and a circuit assembly and an electronic device which include the chip part.

BACKGROUND ART

Patent Document 1 (Japanese Patent Application Publication No. 2001-76912) has disclosed a chip resistor in which an electrode is formed on a surface at one side of an insulating substrate. This chip resistor is soldered onto a mounting substrate, with the surface at one side faced downward.

BRIEF SUMMARY OF THE INVENTION

In general, where a chip part, for example, such a chip part that has been described in Patent Document 1, is soldered onto a mounting substrate, an automatic mounting machine is used. The chip part housed in the automatic mounting machine is suctioned by a suction nozzle installed on the automatic mounting machine and, thereafter, conveyed up to the mounting substrate to be mounted on the mounting substrate. Prior to being mounted on the mounting substrate, the chip part which has been suctioned by the suction nozzle is subjected to a front-surface/rear-surface determination step by using a part recognizing camera.

In the front-surface/rear-surface determination step performed by the part recognizing camera, light is irradiated from a light source (for example, a LED) installed in the peripheries of the part recognizing camera onto a surface at a side where an electrode of the chip part is formed. The part recognizing camera detects reflection light reflected by the electrode of the chip part and also by a portion at which the electrode is not formed, thereby distinguishing a region in which the electrode is formed from a region in which the electrode is not formed on the basis of brightness to determine the front surface or rear surface of the chip part.

However, the chip part is not always suctioned by the suction nozzle horizontally but may be suctioned by the suction nozzle in an inclined manner from time to time. There is a case that light which has been irradiated in an inclined manner onto the electrode of the chip part is reflected (total reflection) by the electrode toward the outside of a region at which the part recognizing camera is disposed and may not be detected by the part recognizing camera. In this case, according to image information by the part recognizing camera, the electrode of the chip part will appear dark partially or entirely. The automatic mounting machine, therefore, misrecognizes a region in which the electrode has been formed as a region in which the electrode has not been formed, thereby stopping conveyance of the chip part to the mounting substrate.

Although the problem may be solved by changing a condition (specification) of the light source which is disposed in the peripheries of the part recognizing camera, there is a fear that some restrictions may arise, for example, the same automatic mounting machine may not be used in a chip part different in specification. As a result, smooth mounting of the chip part is prevented by occurrence of misrecognition by the automatic mounting machine.

A preferred embodiment of the present invention is to provide a chip part which can be determined satisfactorily for a front surface or a rear surface thereof and mounted smoothly on a mounting substrate and also to provide a method for manufacturing thereof.

Further, another preferred embodiment of the present invention is to provide a circuit assembly which includes the chip part of the present invention and also to provide an electronic device which includes the circuit assembly.

Figure 1:
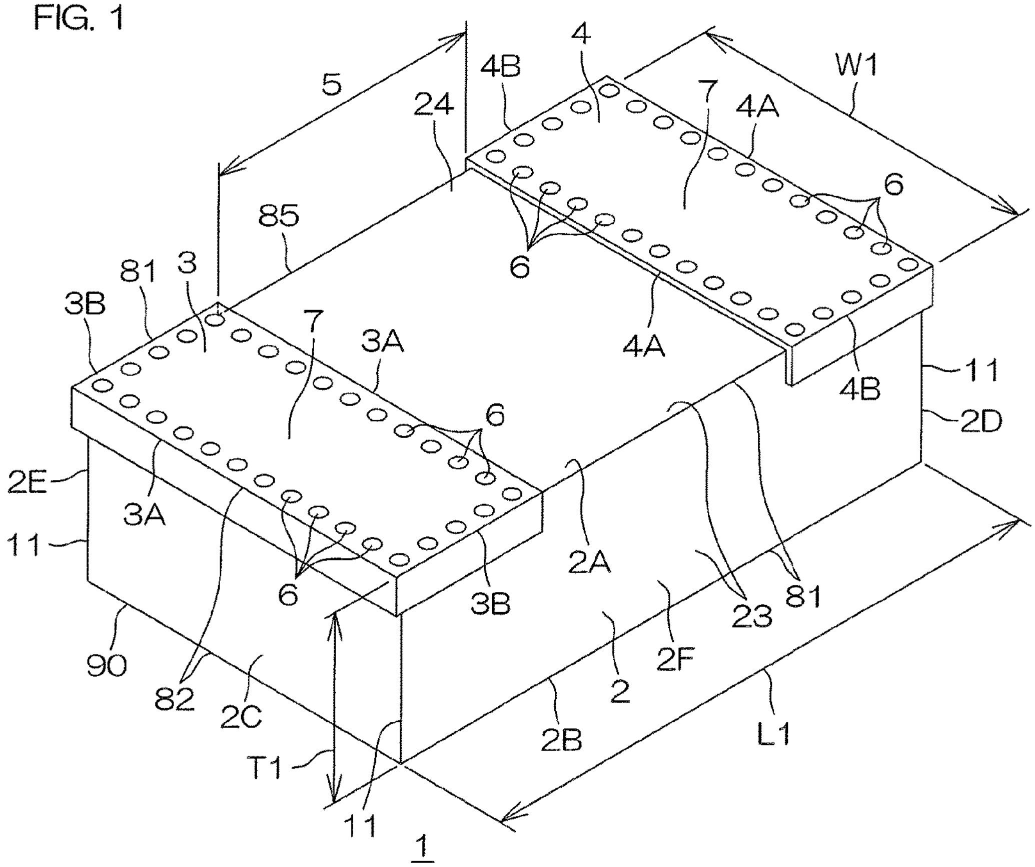
FIG. 1 is a schematic perspective view of a chip part of Embodiment 1 of the present invention.

Each of FIG. 11A to FIG. 11I is a sectional view which shows a method for manufacturing the chip part shown in FIG. 1.

Figure 11A:
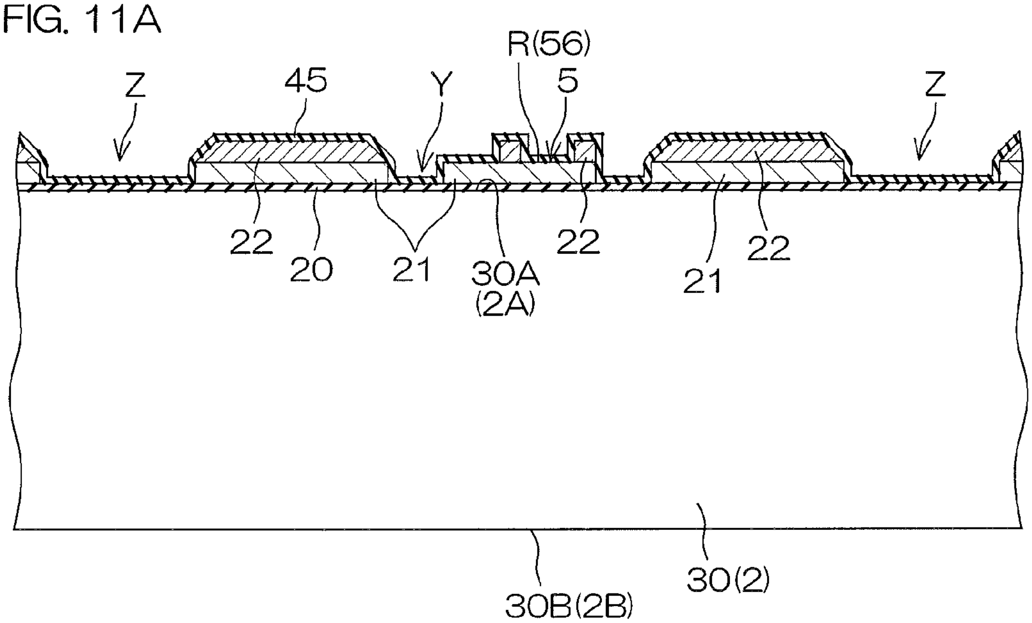
Figure 11B:
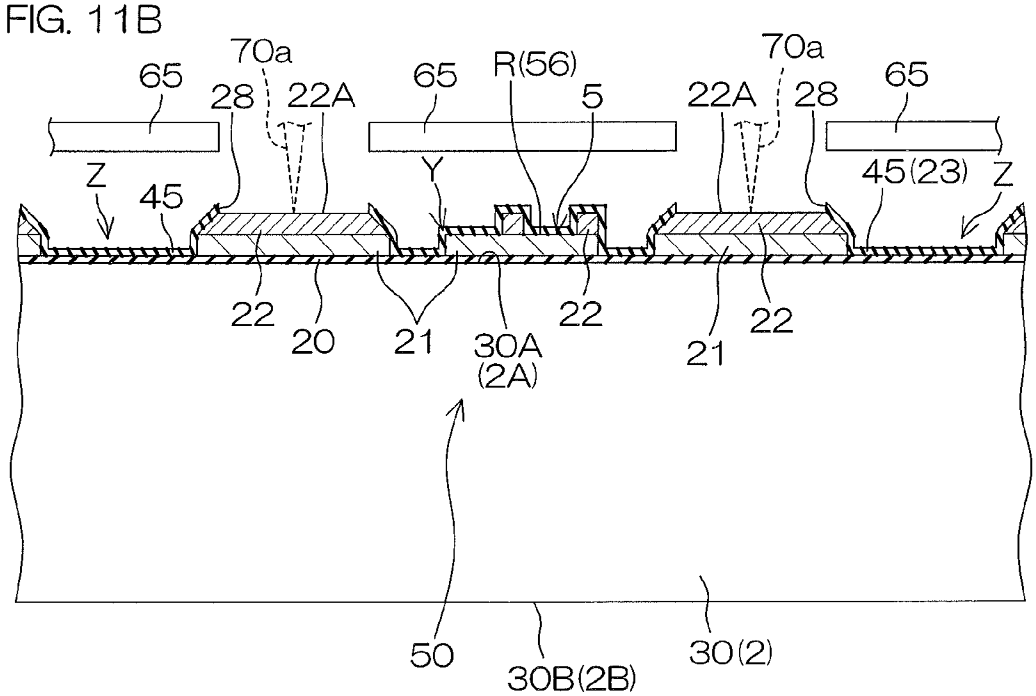
Figure 11C:
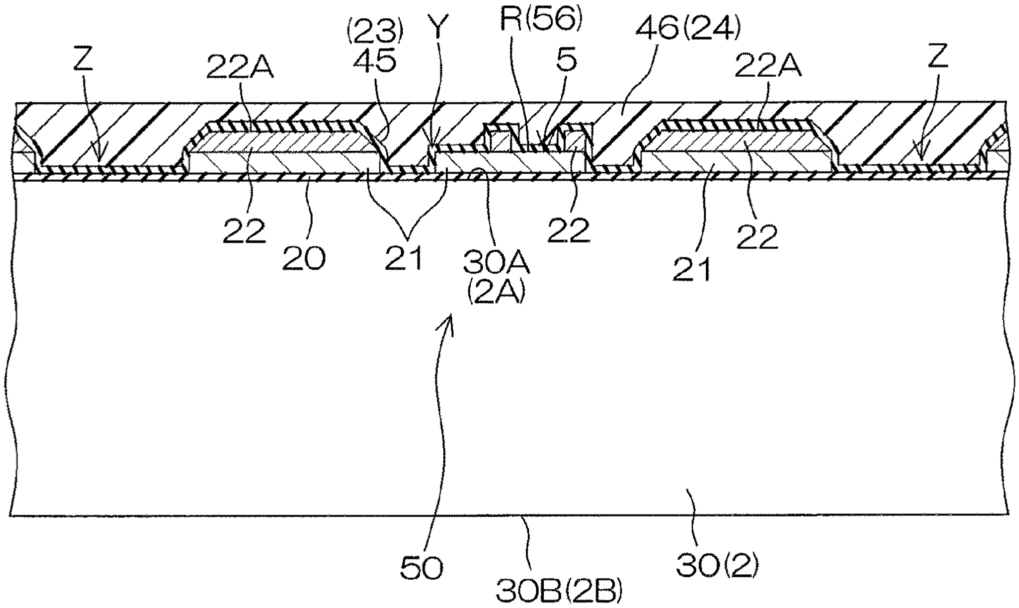
Figure 11D:
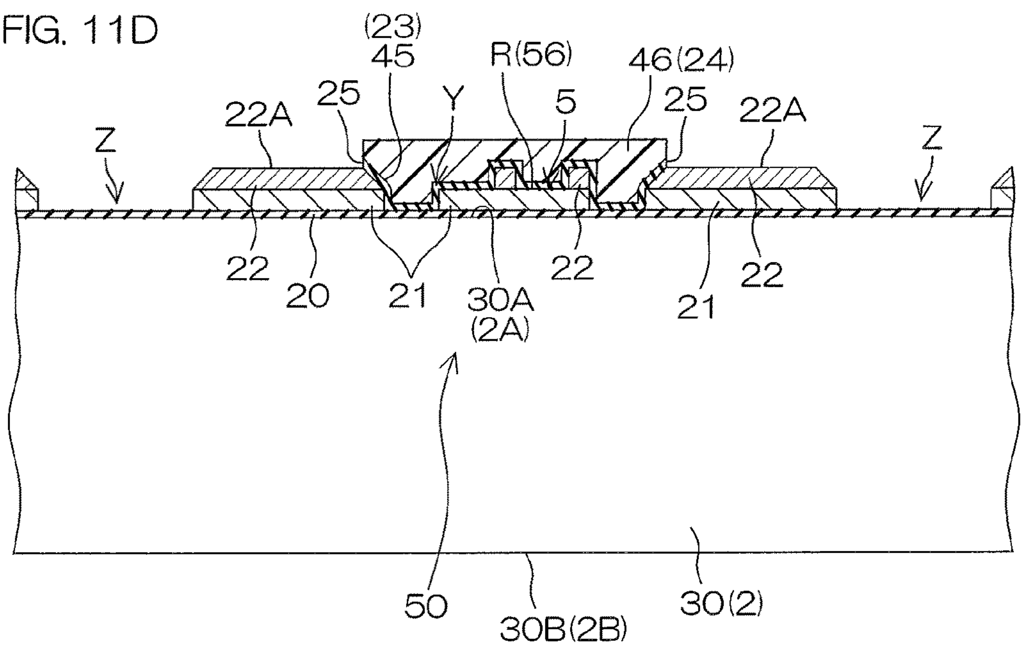
Figure 11E:
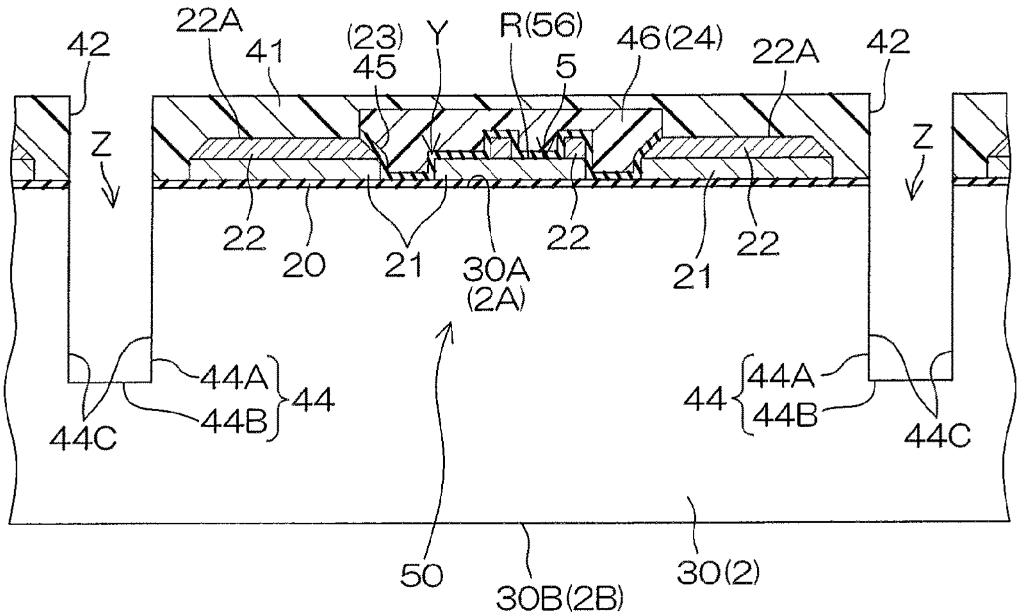
Figure 12:
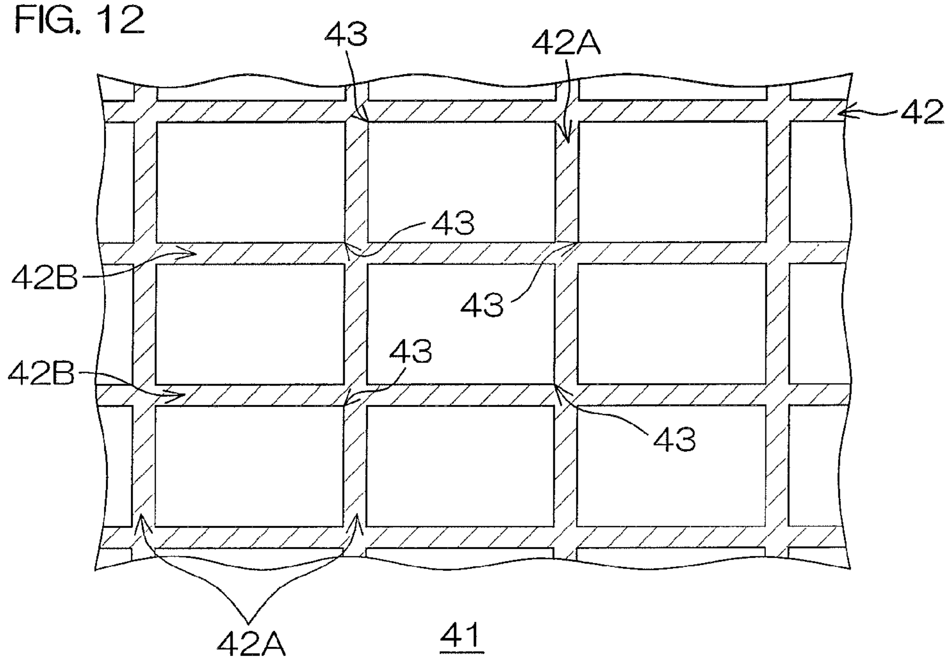

FIG. 12 is a schematic plan view of a portion of a resist pattern used for forming a groove in the step of FIG. 11E.

Figure 13:
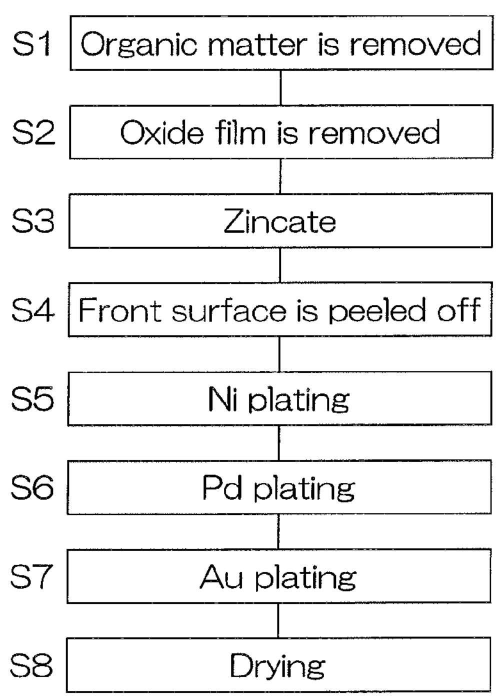

FIG. 13 is a flow chart which describes steps of manufacturing a connection electrode.

Each of FIG. 14A to 14E is a sectional view which specifically describes the steps of manufacturing the connection electrode.

Each of FIG. 15A to FIG. 15D is a schematic sectional view which shows a step of recovering the chip part subsequent to the step of FIG. 11I.

Figure 16A:
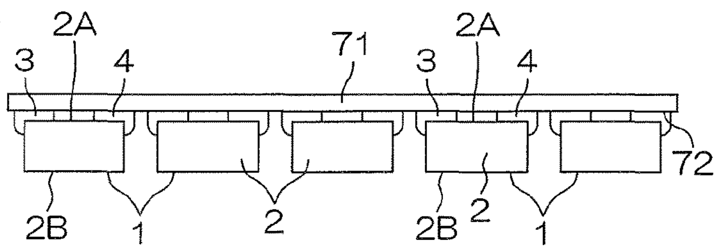
Figure 16B:
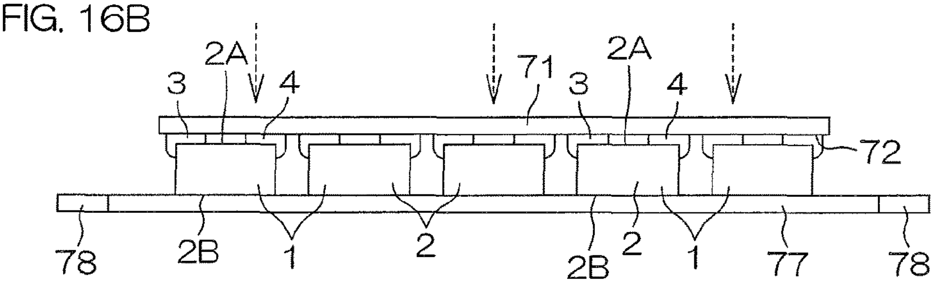
Figure 16C:
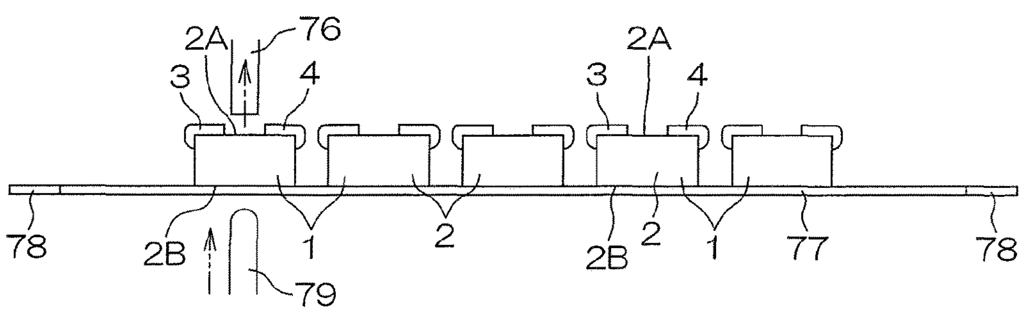

Each of FIG. 16A to FIG. 16C is a schematic sectional view which shows a step of recovering a chip part (modification example) subsequent to the step of FIG. 11I.

Figure 17:
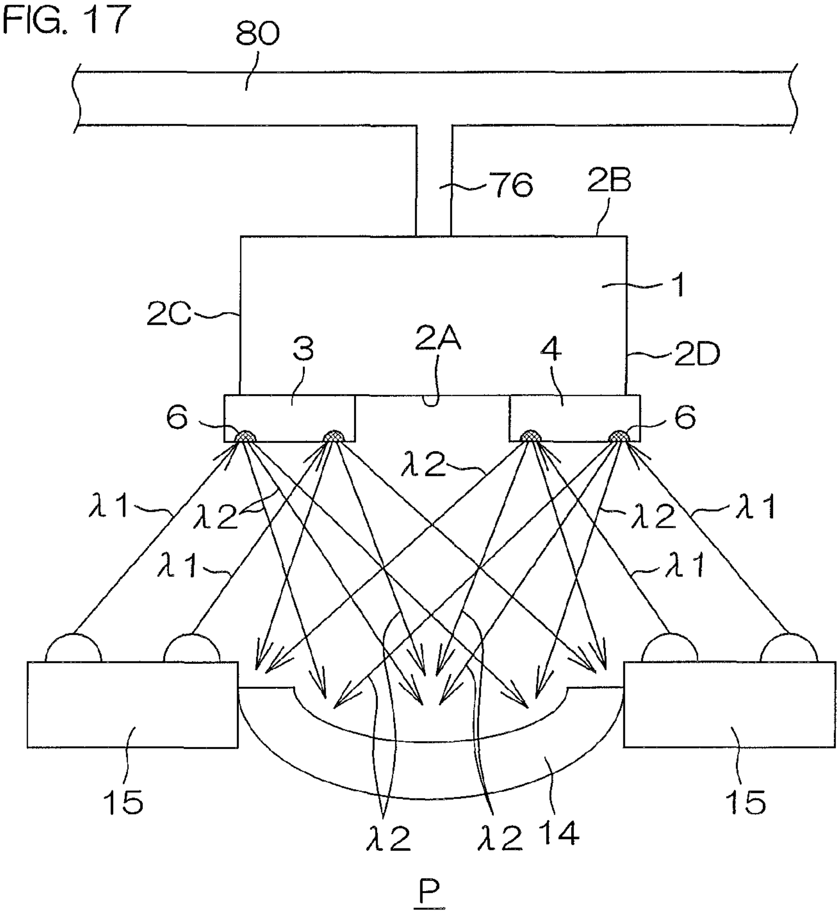

FIG. 17 is a view which describes a front-surface/rear-surface determination step of the chip part according to a preferred embodiment of the present invention.

Figure 18:
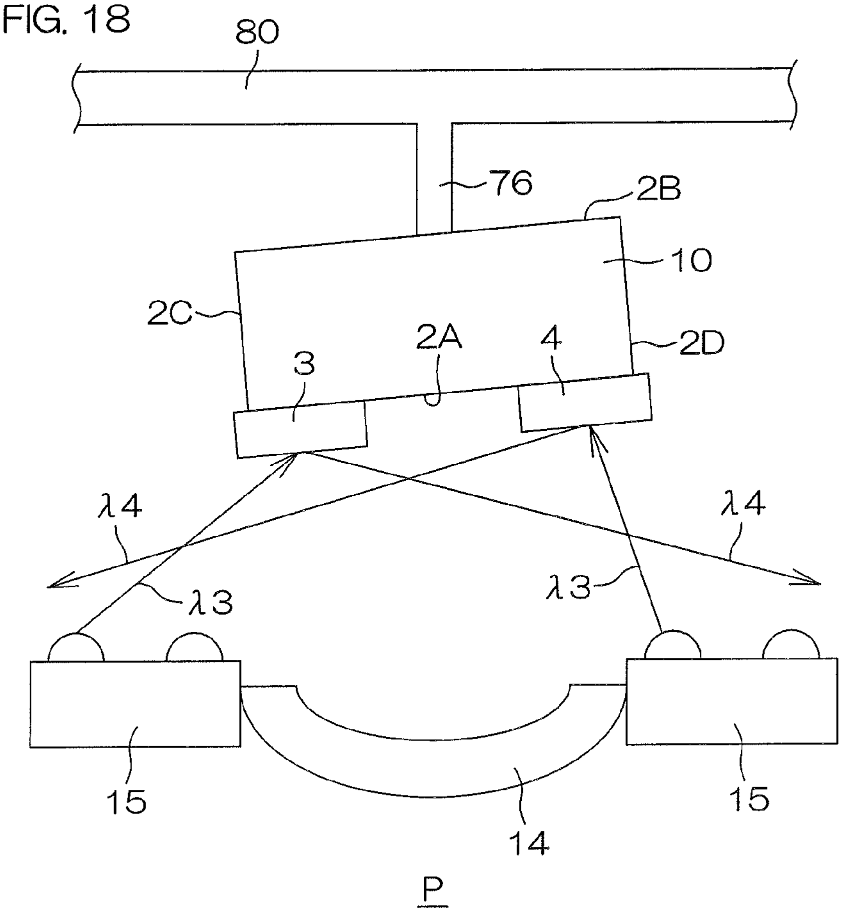

FIG. 18 is a view which describes a front-surface/rear-surface determination step of a chip part according to a reference example.

Figure 19:
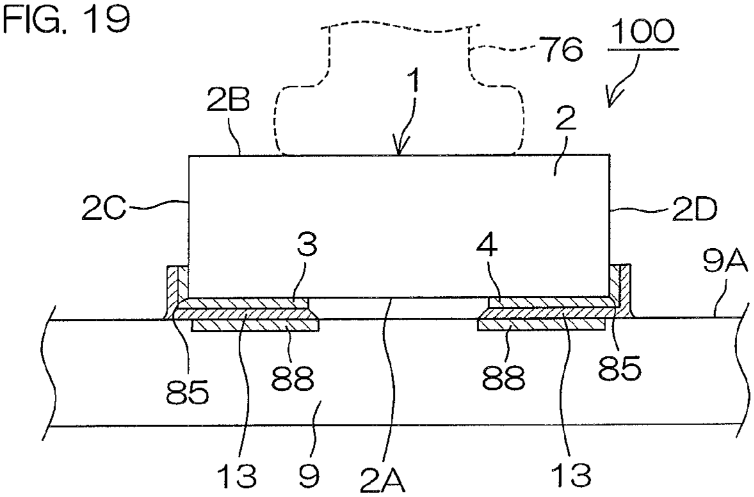

FIG. 19 is a schematic sectional view obtained when a circuit assembly in a state that the chip part is mounted on a mounting substrate is cut along the long direction of the chip part.

Figure 20:
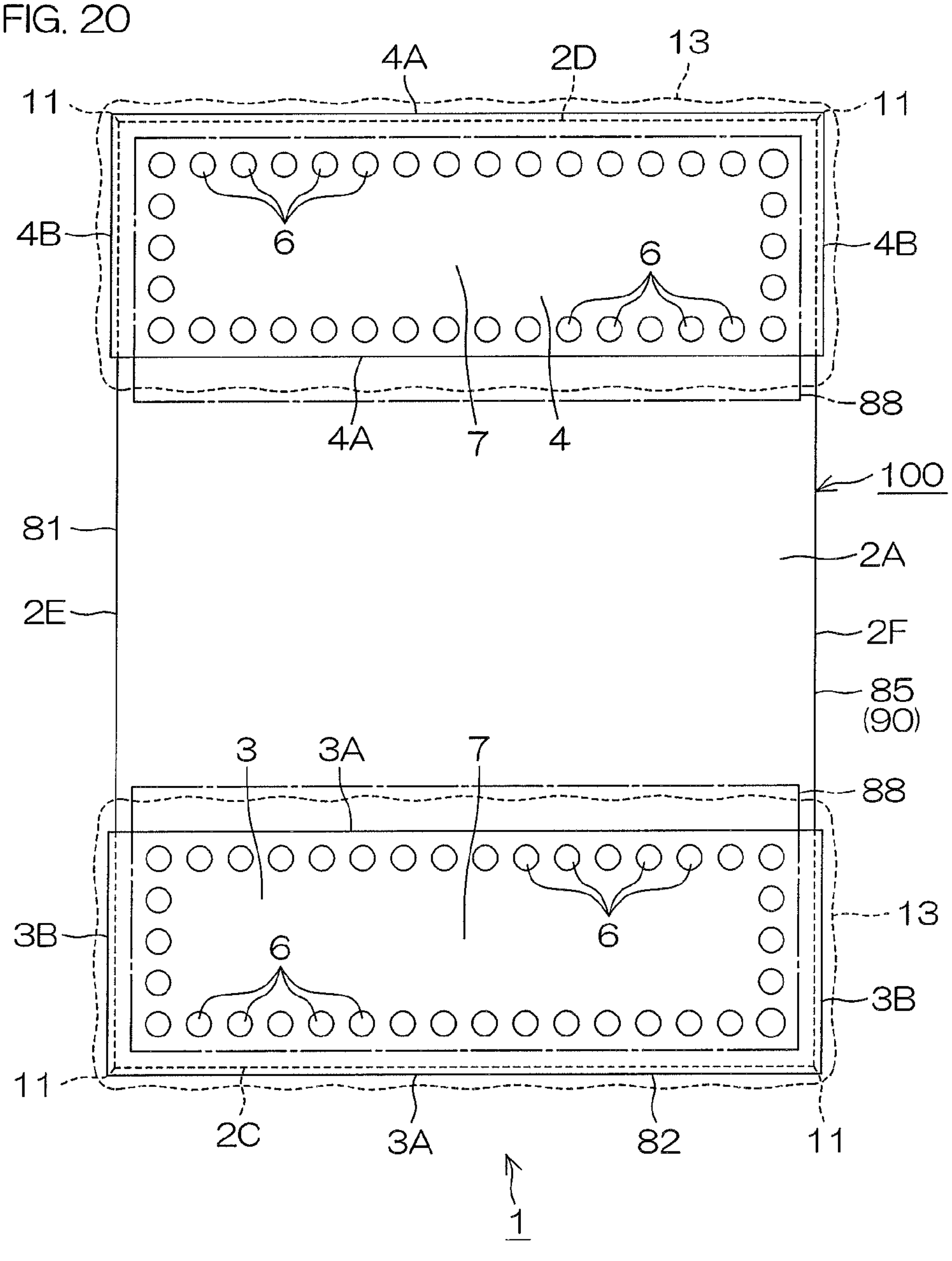

FIG. 20 is a schematic plan view of the chip part in the state of being mounted on the mounting substrate, as viewed from an element forming surface side.

Figure 21:
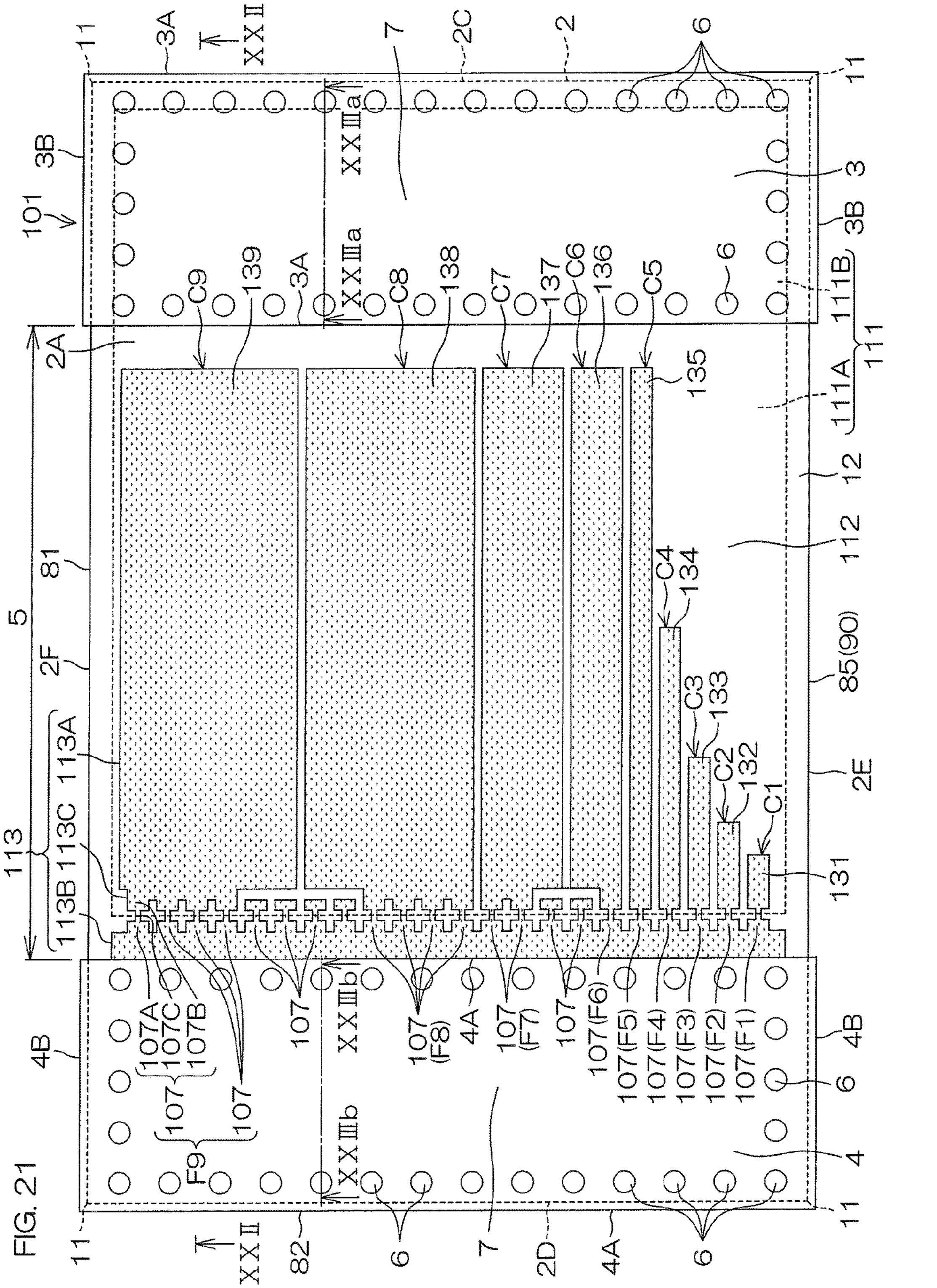

FIG. 21 is a plan view of a chip part according to Embodiment 2 of the present invention or a view which shows a positional relationship between a connection electrode and a circuit element as well as an arrangement of the element in a plan view.

Figure 22:
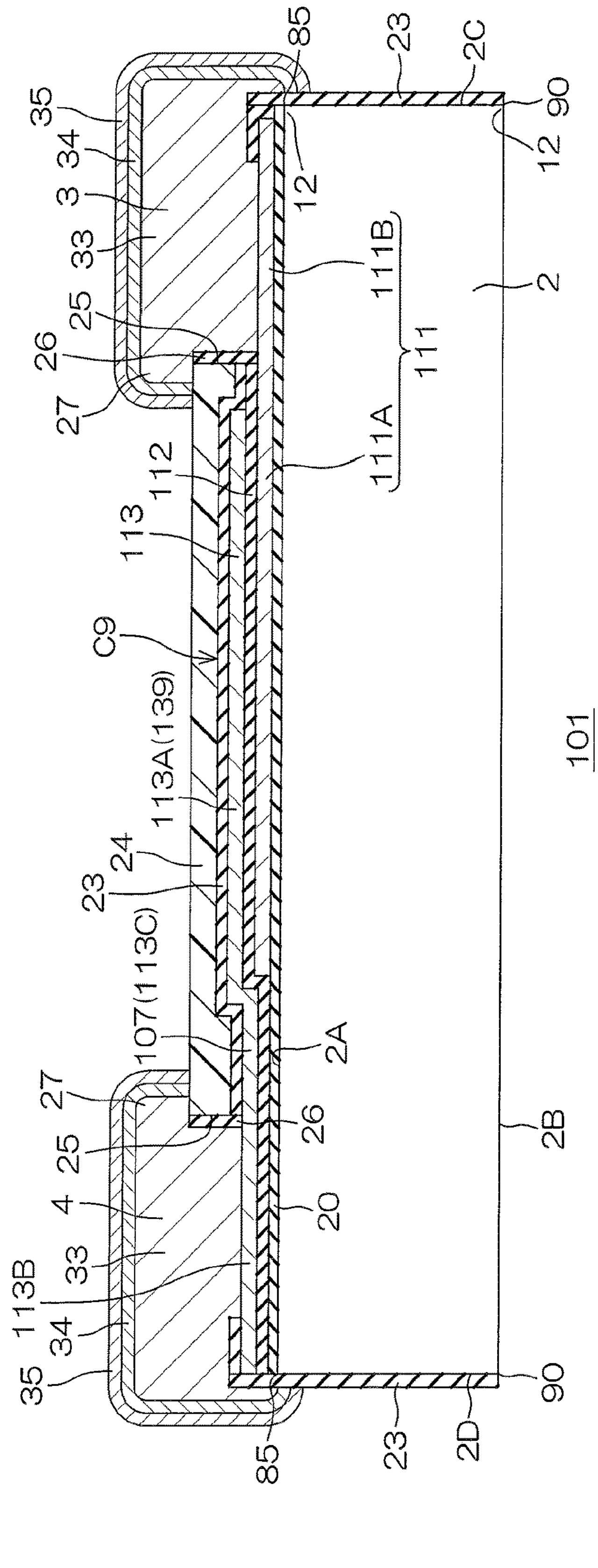

FIG. 22 is a sectional view taken along section line XXII-XXII in FIG. 21.

Figure 23A:
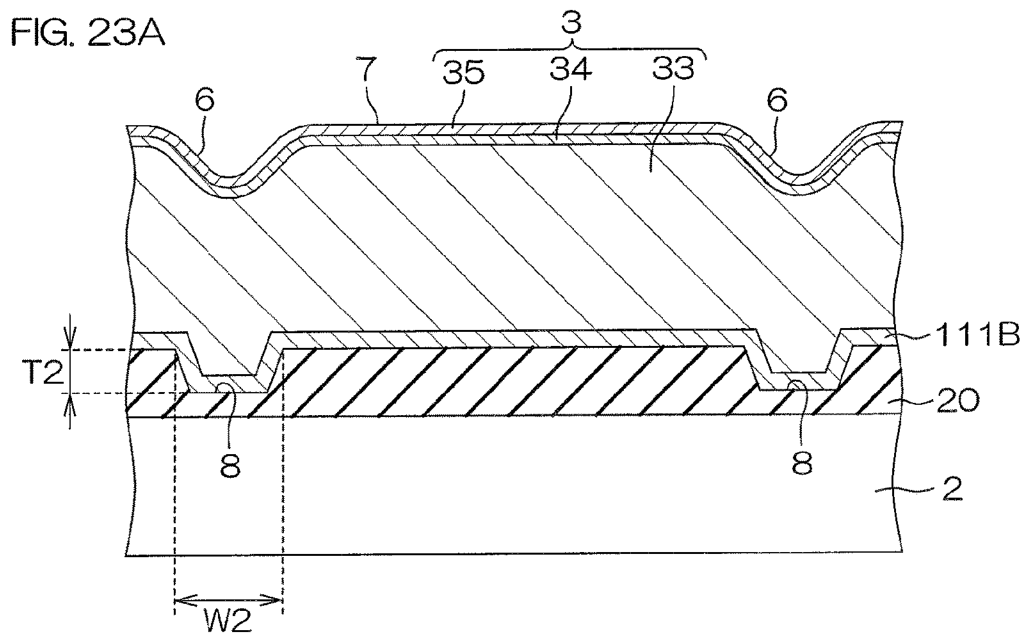

FIG. 23A is a sectional view taken along section line XXIIIa-XXIIIa in FIG. 21.

Figure 23B:
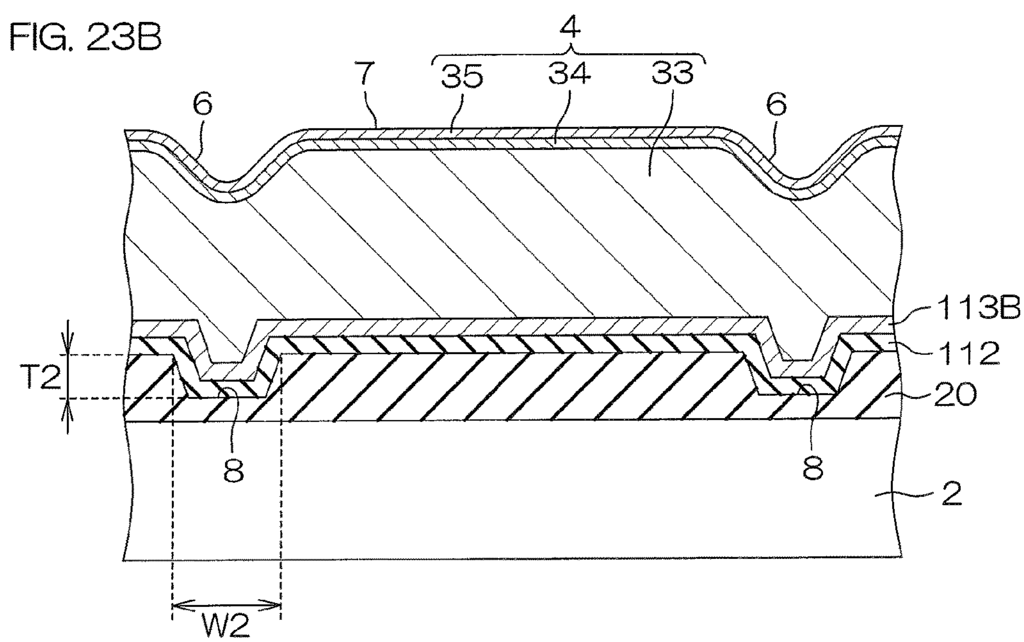

FIG. 23B is a sectional view taken along section line XXIIIb-XXIIIb in FIG. 21.

Figure 24:
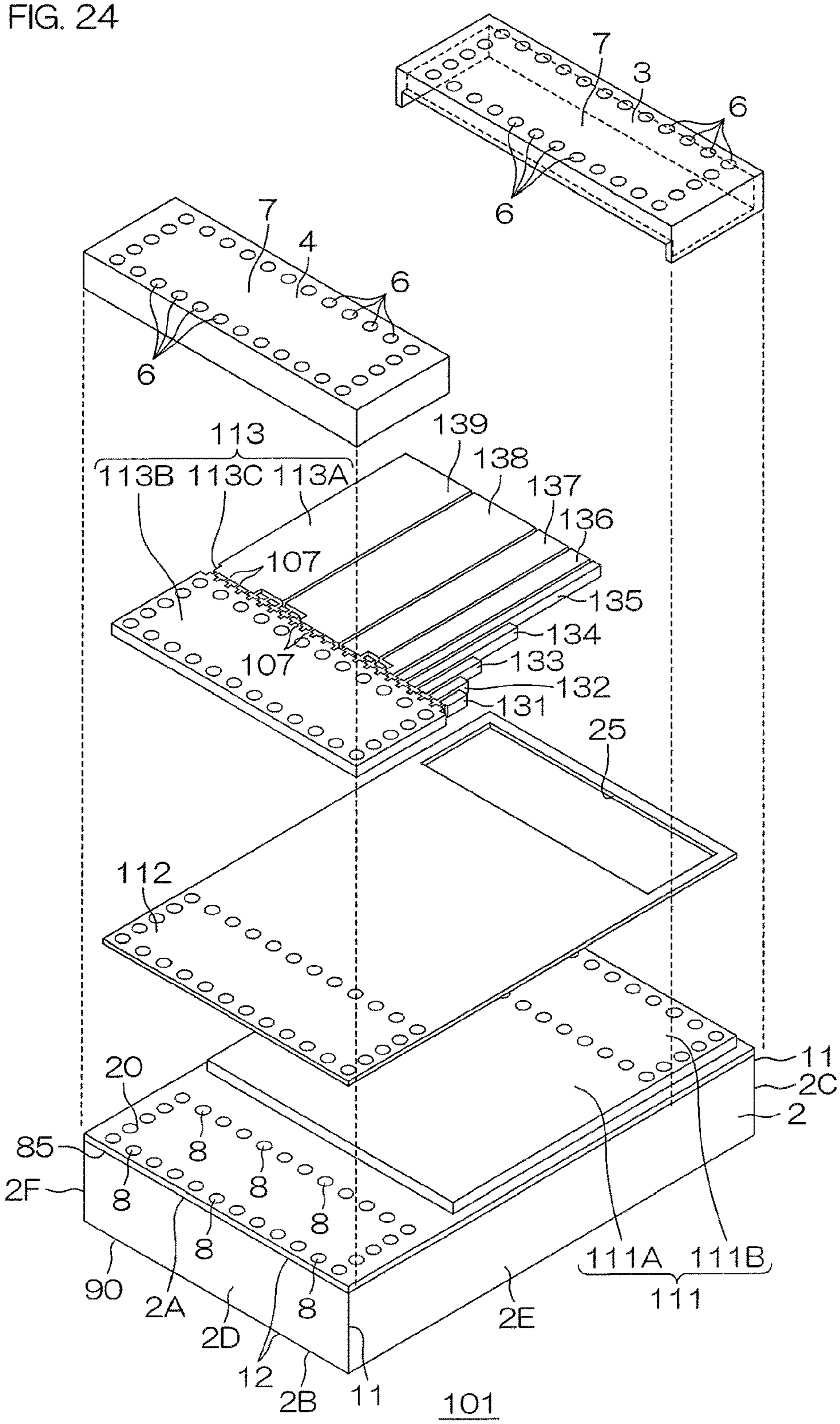

FIG. 24 is an exploded perspective view which shows an arrangement of a portion of the chip part in a separated manner.

Figure 25:
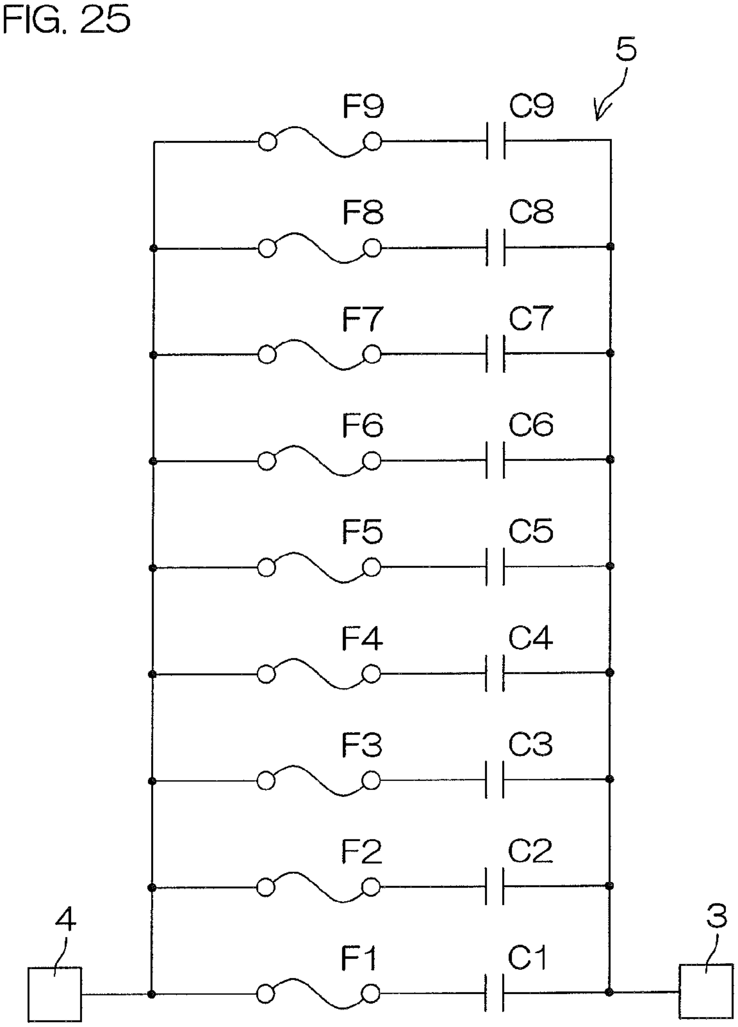

FIG. 25 is a circuit diagram which shows an electrical arrangement of the interior of the chip part.

Figure 26:
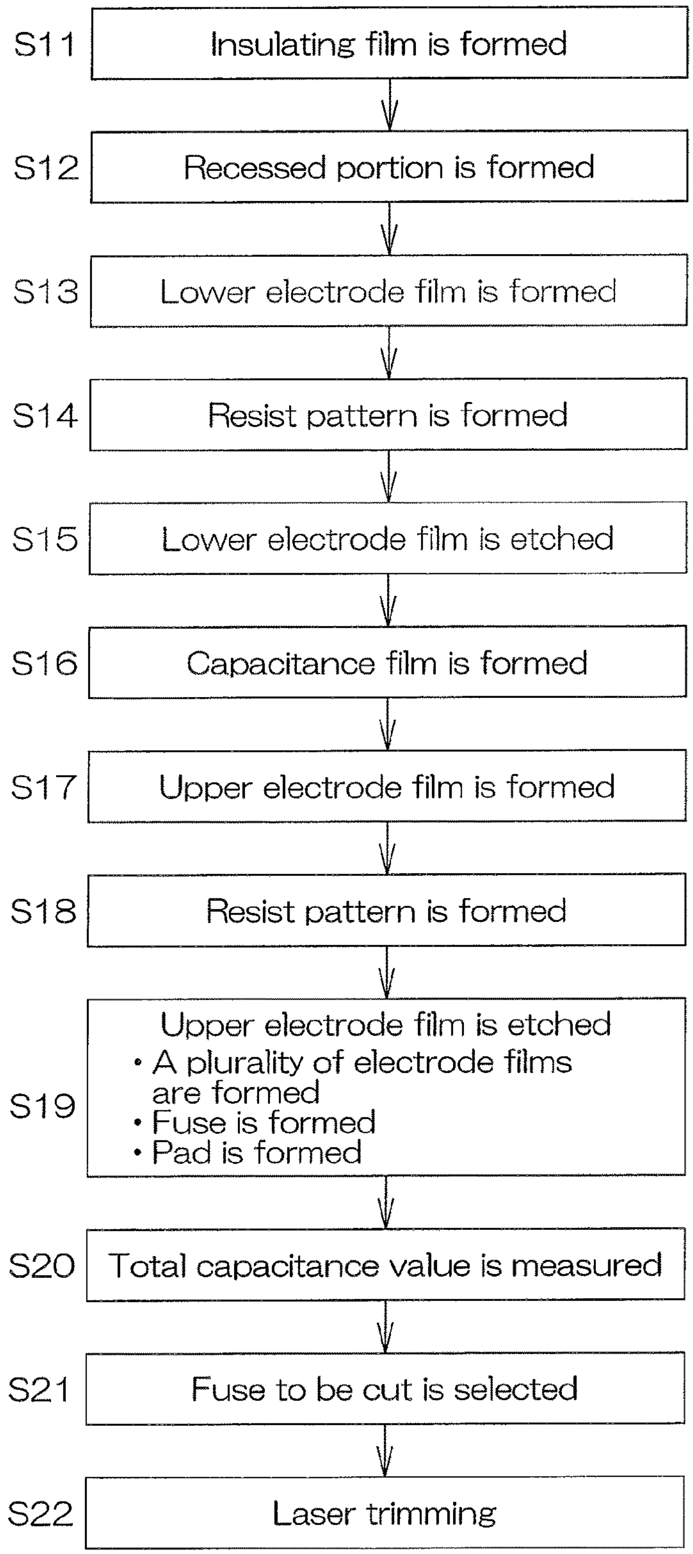

FIG. 26 is a flow chart which describes one example of steps of manufacturing the chip part shown in FIG. 21.

Figure 27:
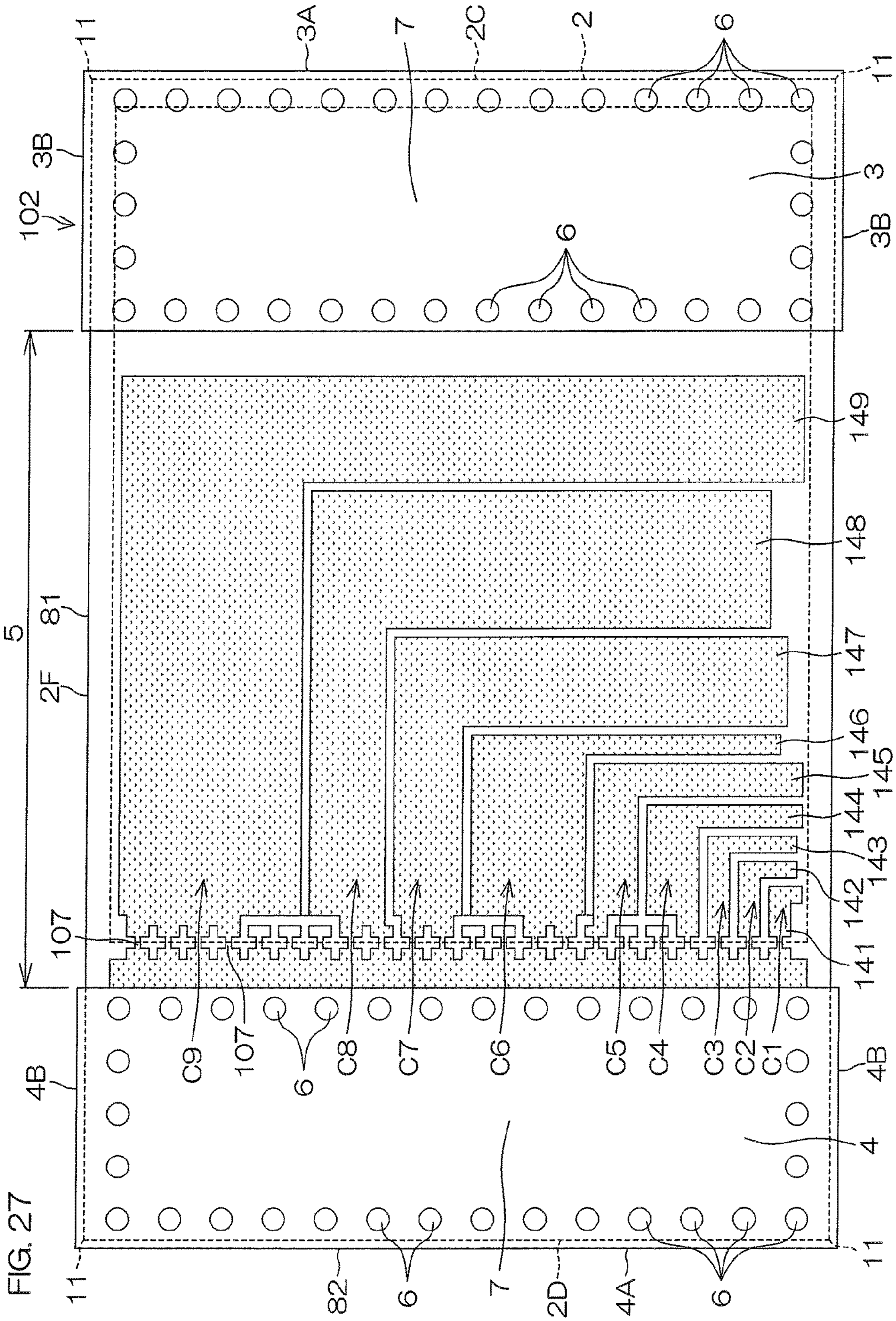

FIG. 27 is a plan view of a chip part according to Embodiment 3 of the present invention, or a view which shows a positional relationship between a connection electrode and a circuit element as well as an arrangement of the element in a plan view.

Figure 28:
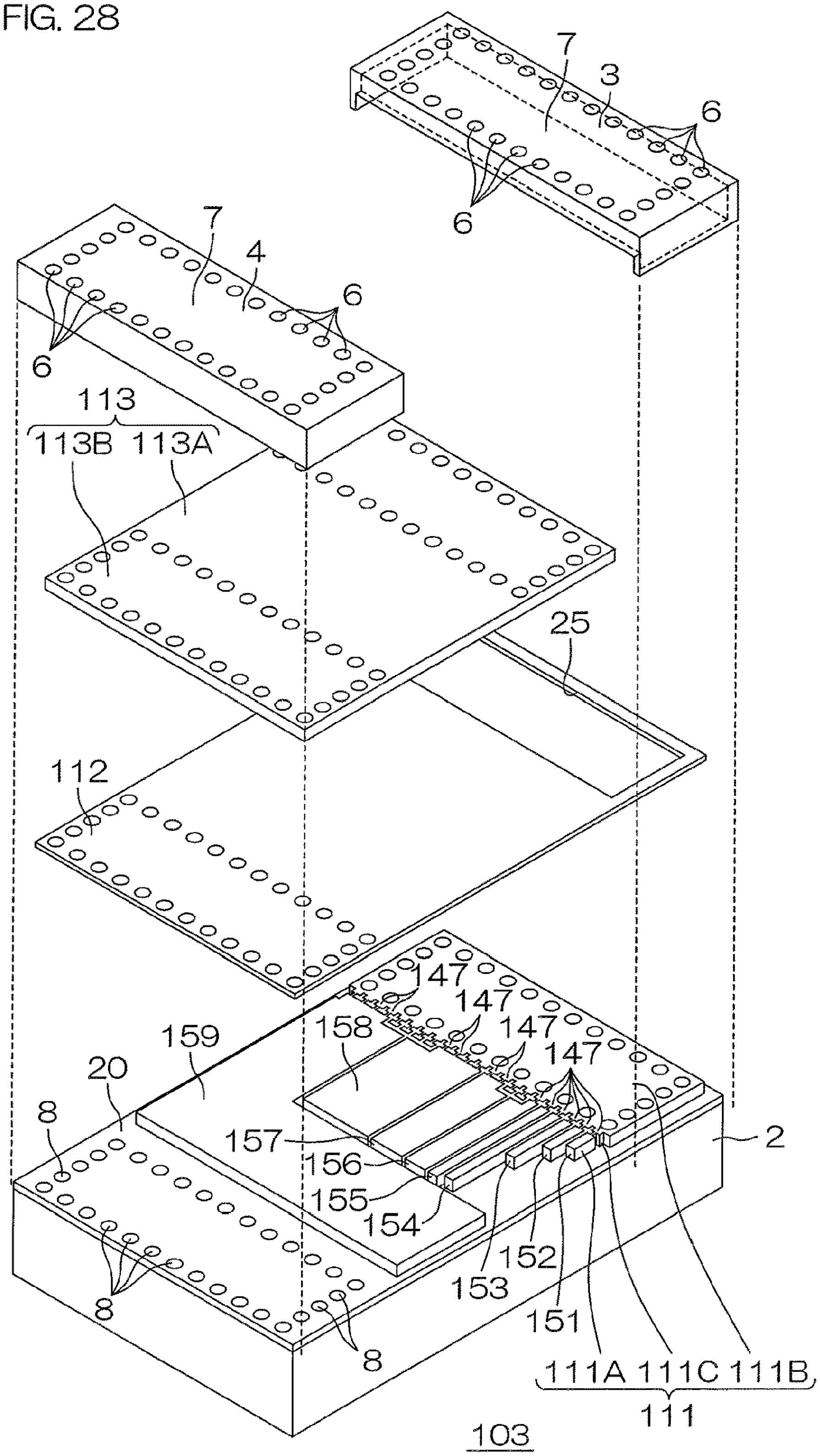

FIG. 28 is a plan view of a chip part according to Embodiment 4 of the present invention, or a view which shows a positional relationship between a connection electrode and a circuit element as well as an arrangement of the element in a plan view.

Figure 29:
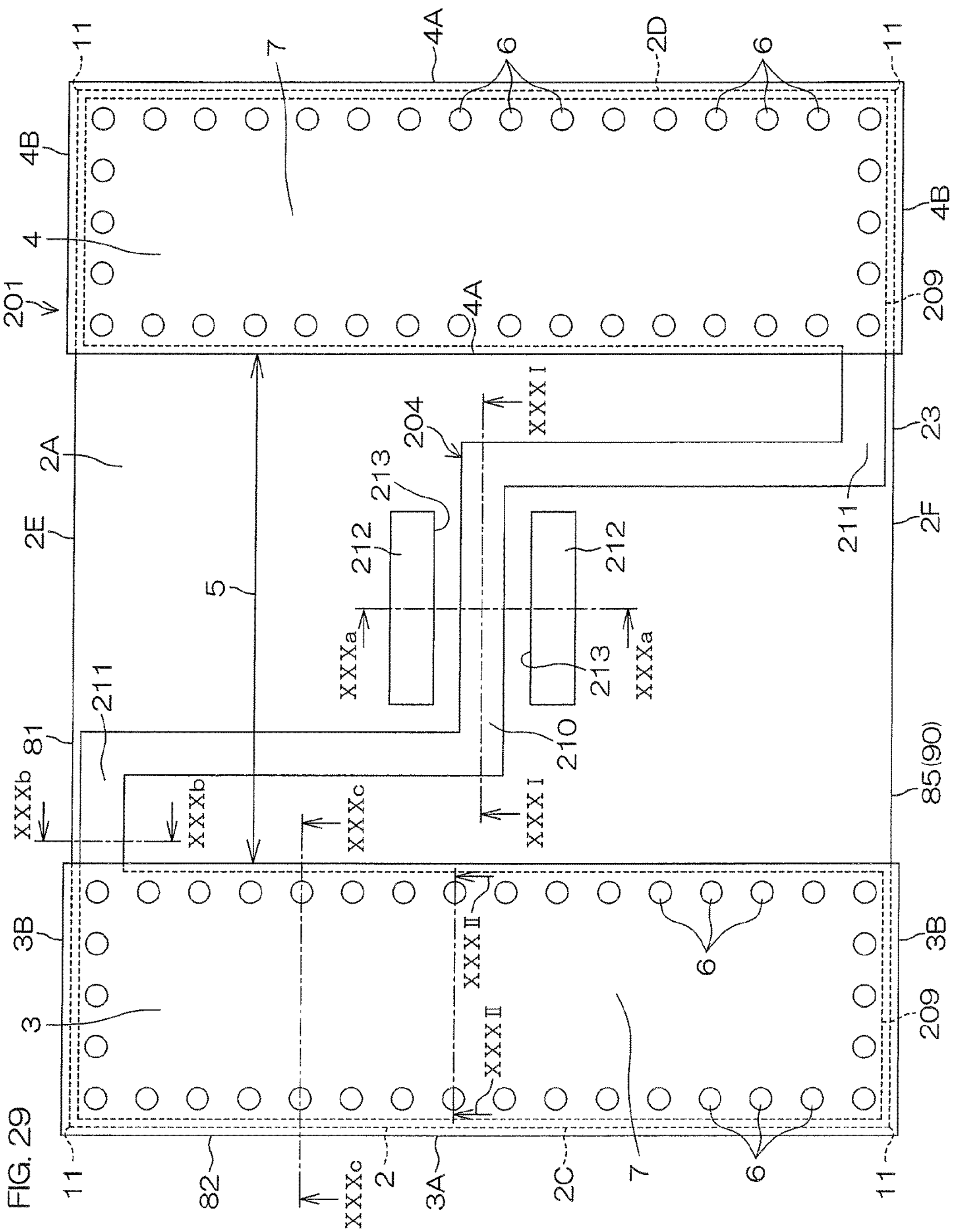

FIG. 29 is a plan view of a chip part according to Embodiment 5 of the present invention.

Figure 30:
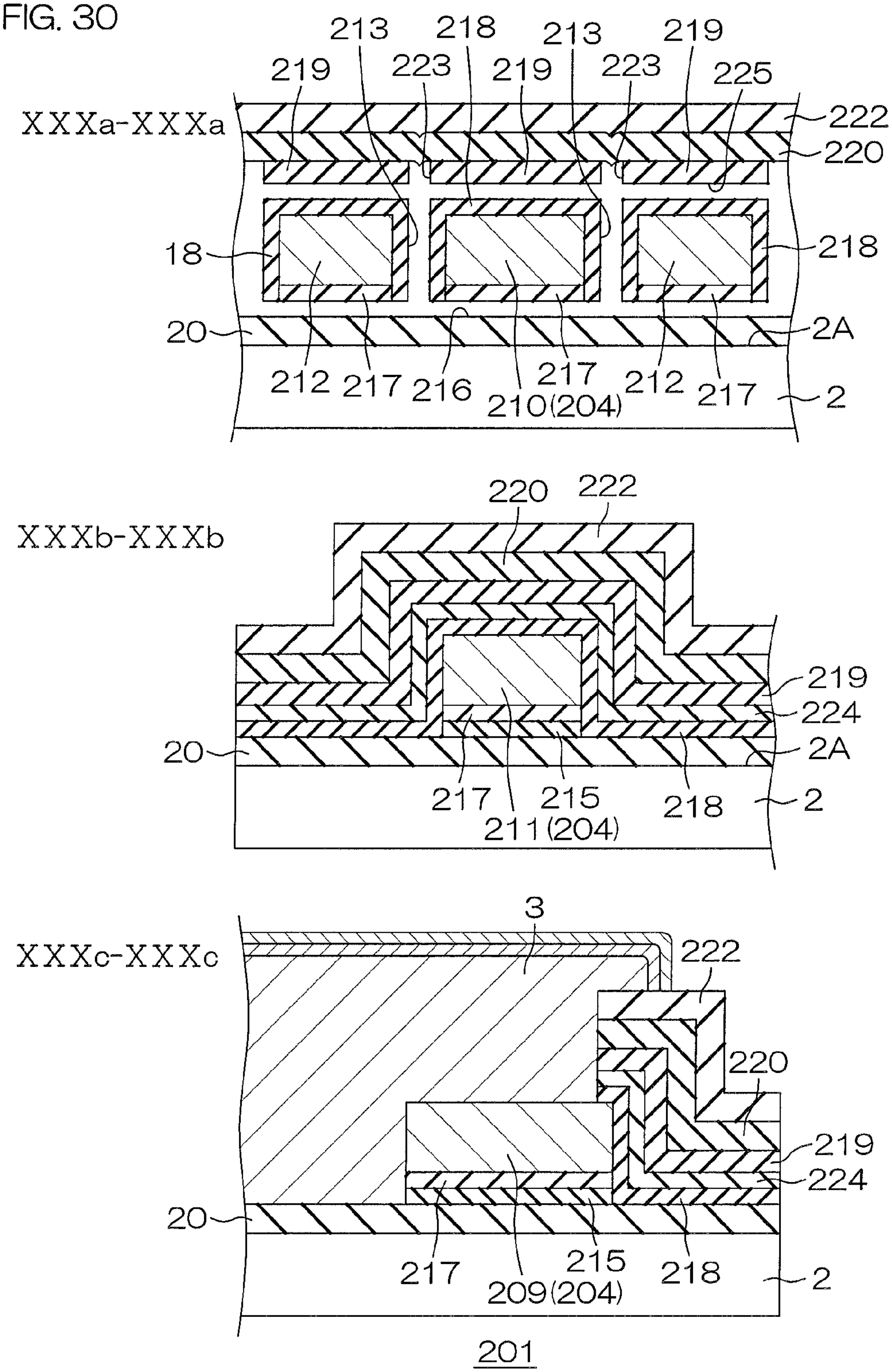

FIG. 30 covers each of sectional views taken along section line XXXa-XXXa, taken along section line XXXb-XXXb and taken along section line XXXc-XXXc of the chip part in FIG. 29.

Figure 31:
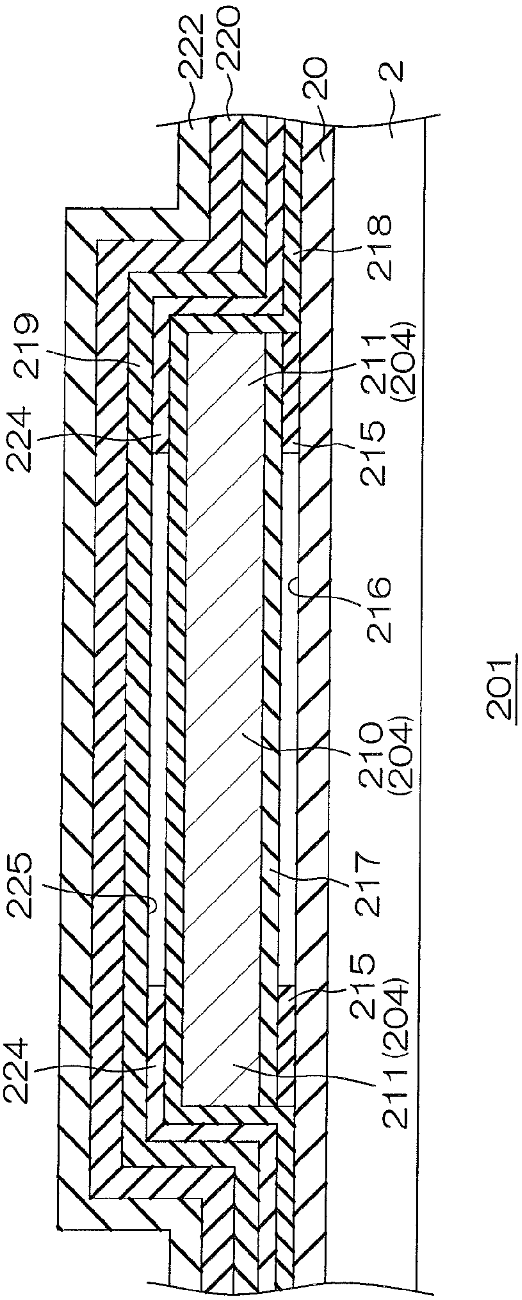

FIG. 31 is a sectional view taken along section line XXXI-XXXI of the chip part in FIG. 29.

Figure 32:
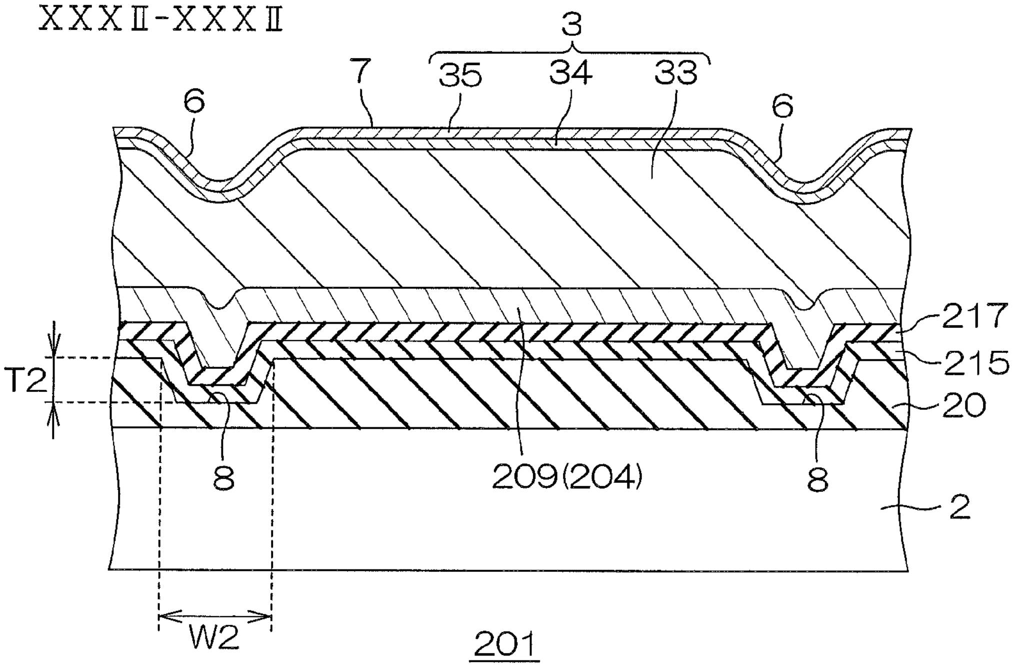

FIG. 32 is a sectional view taken along section line XXXII-XXXII of the chip part in FIG. 29.

Each of FIG. 33 to FIG. 39 is a sectional view which describes a portion of steps of manufacturing the chip part in FIG. 29.

Figure 40:
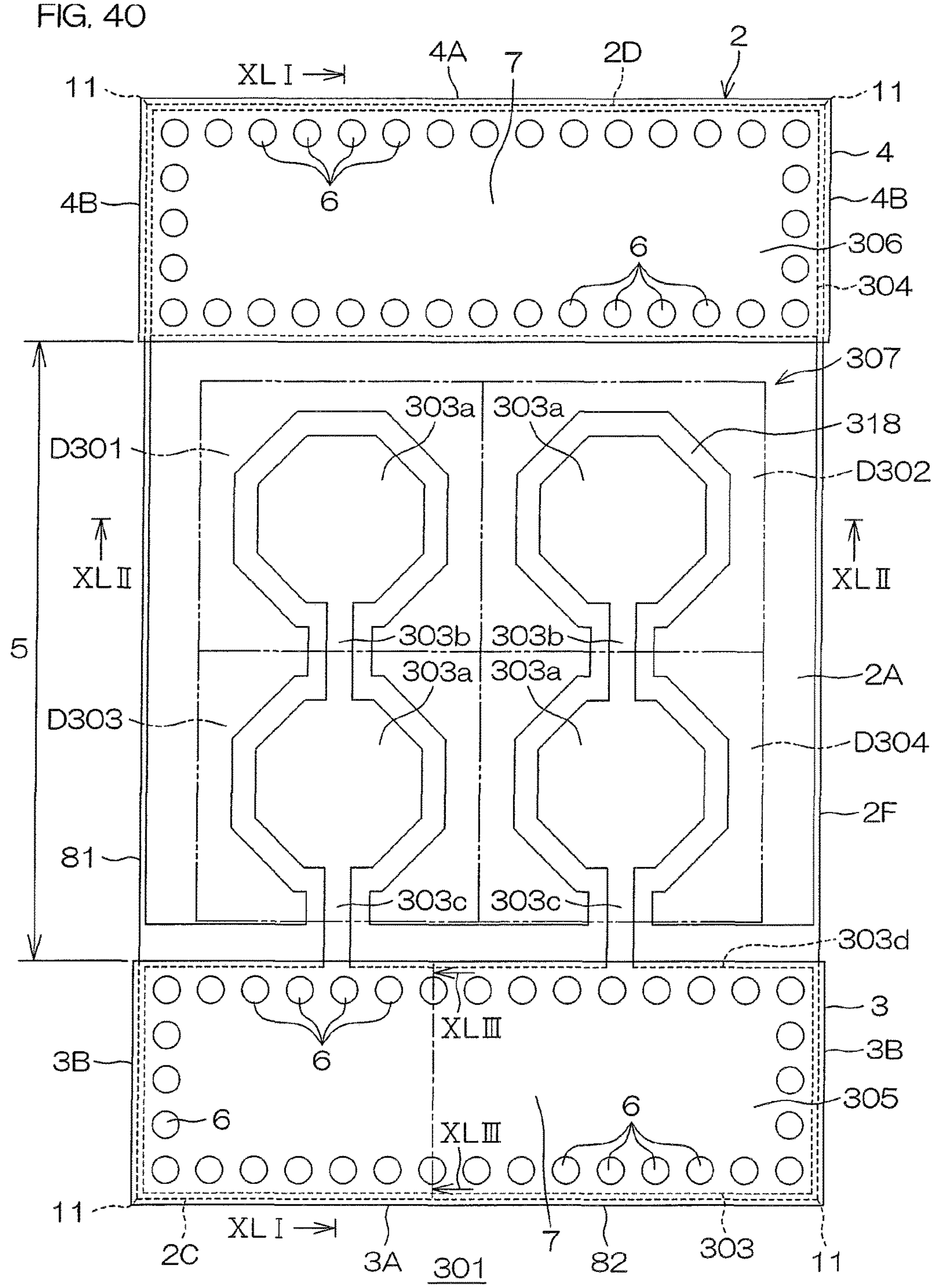

FIG. 40 is a plan view of a chip part according to Embodiment 6 of the present invention.

Figure 41:
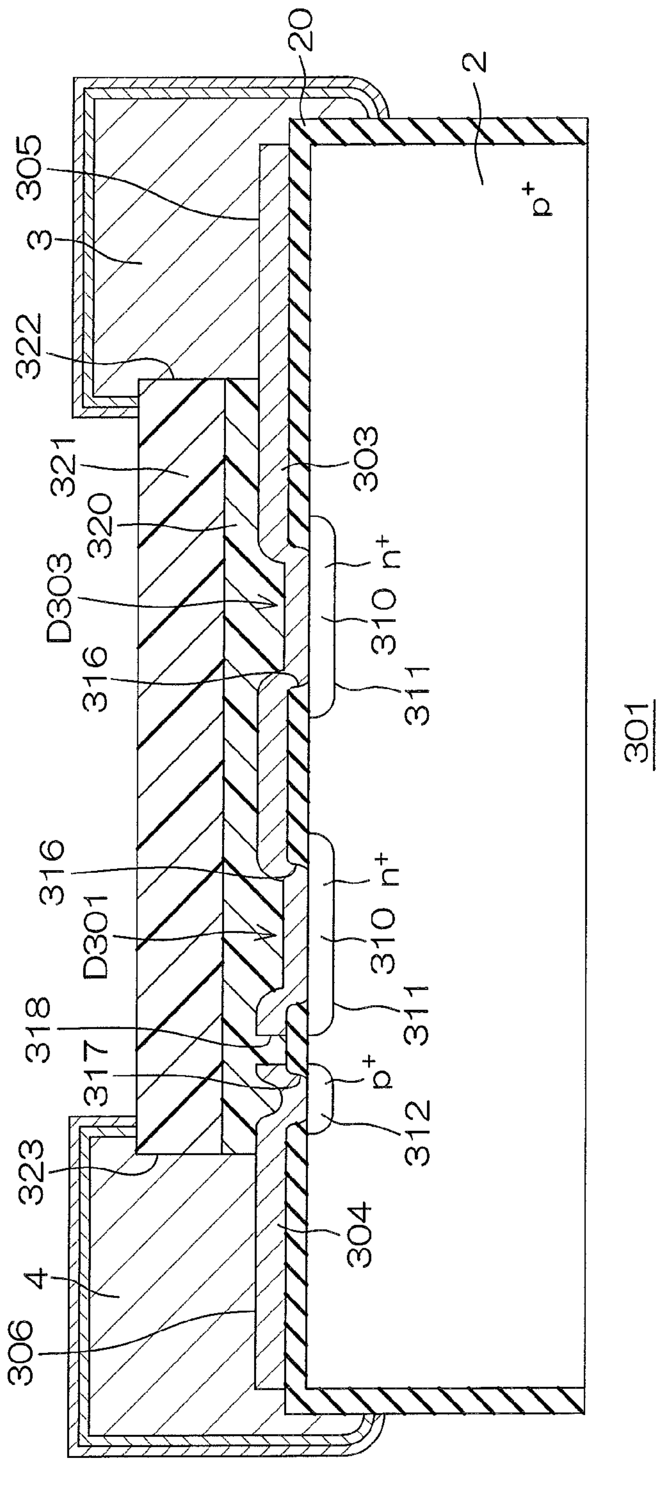

FIG. 41 is a sectional view taken along section line XLI-XLI in FIG. 40.

Figure 42:
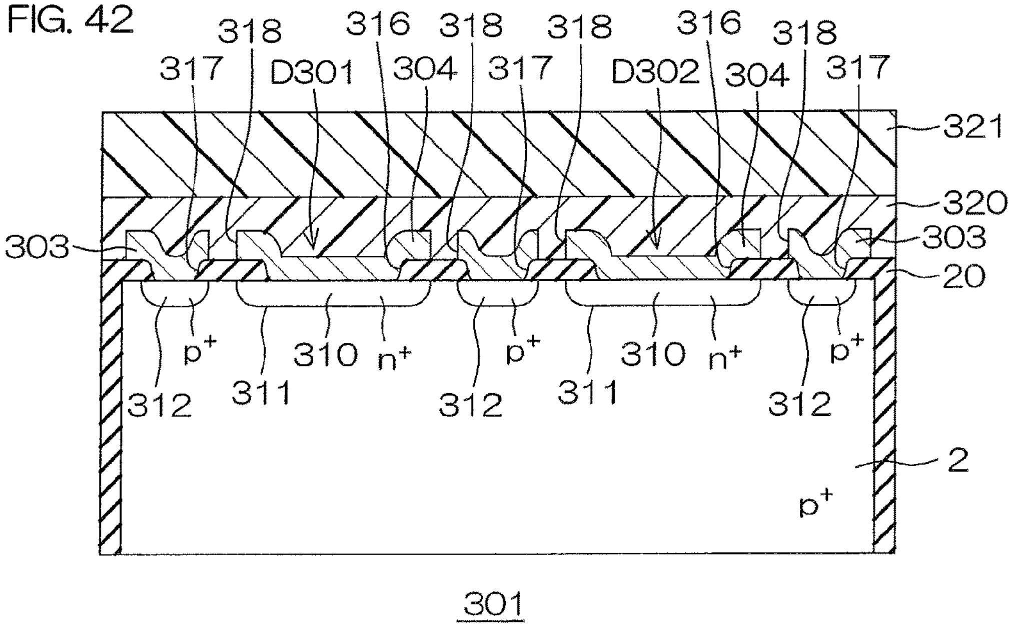

FIG. 42 is a sectional view taken along section line XLII-XLII in FIG. 40.

Figure 43:
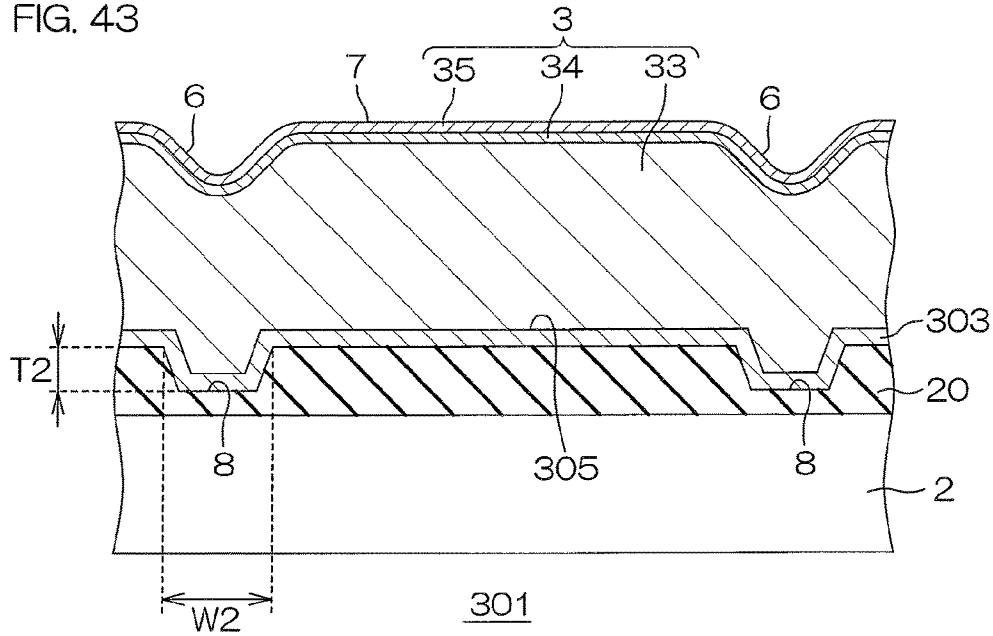

FIG. 43 is a sectional view taken along section line XLIII-XLIII in FIG. 40.

Figure 44:
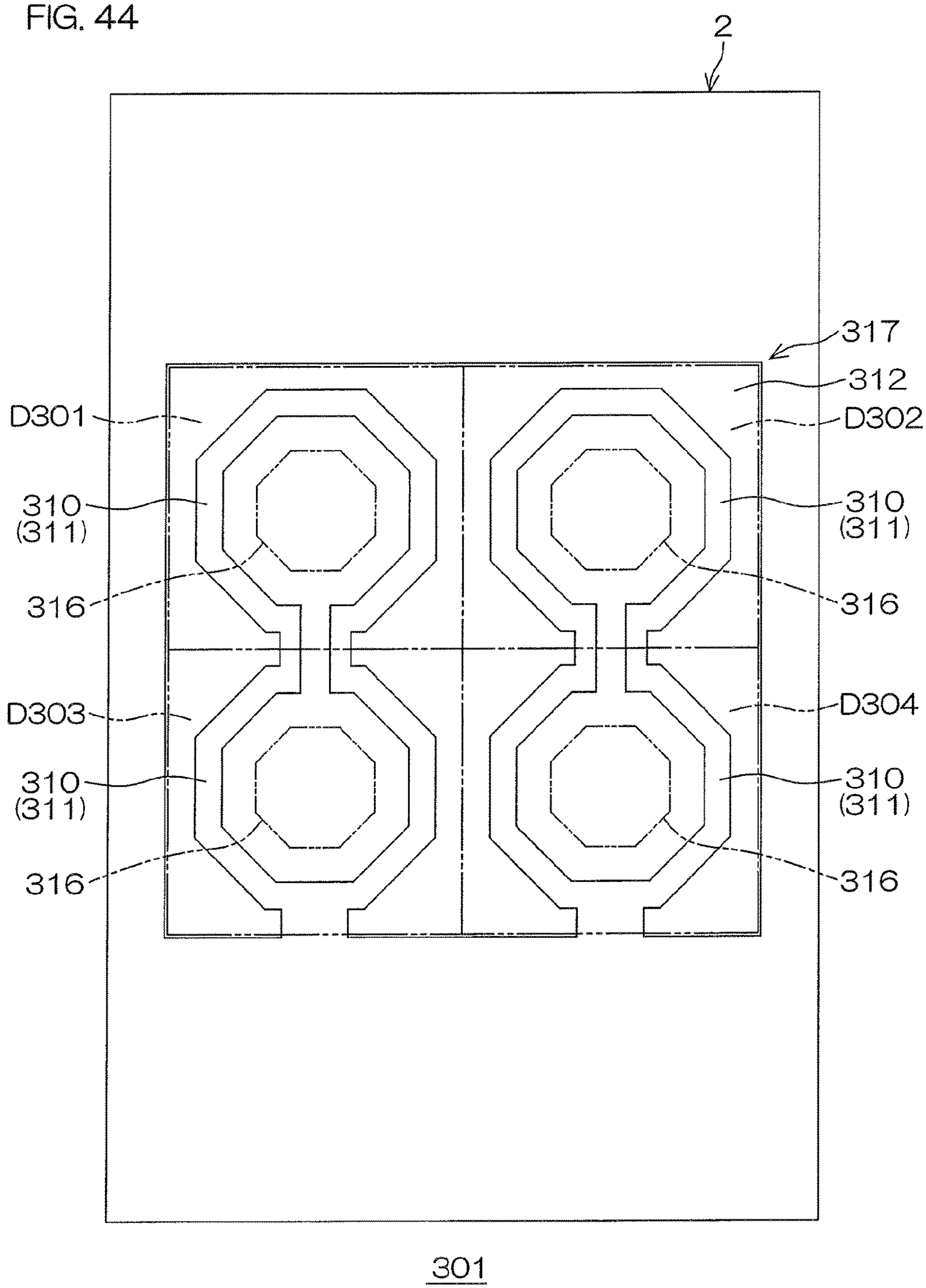

FIG. 44 is a plan view of the chip part shown in FIG. 40 in which a cathode electrode, an anode electrode and an arrangement formed thereon are removed therefrom to show a structure of a front surface of a substrate.

Figure 45:
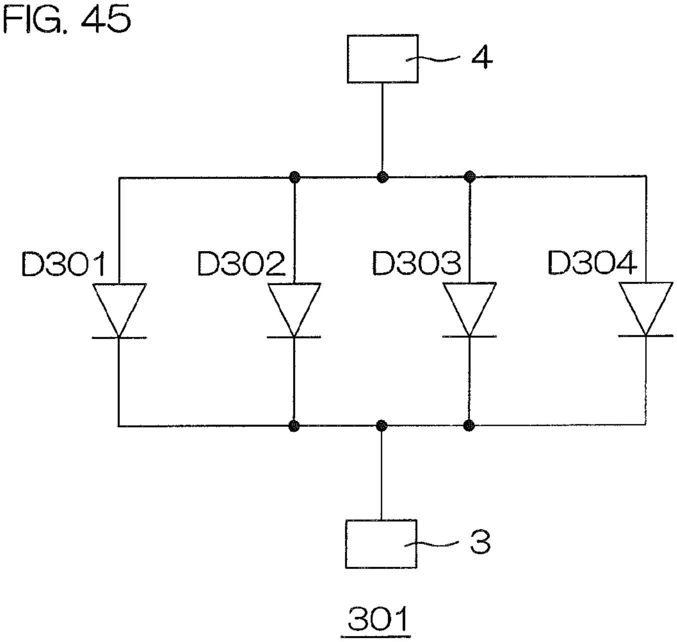

FIG. 45 is an electric circuit diagram which shows an electrical structure of the interior of the chip part shown in FIG. 40.

Figure 46:
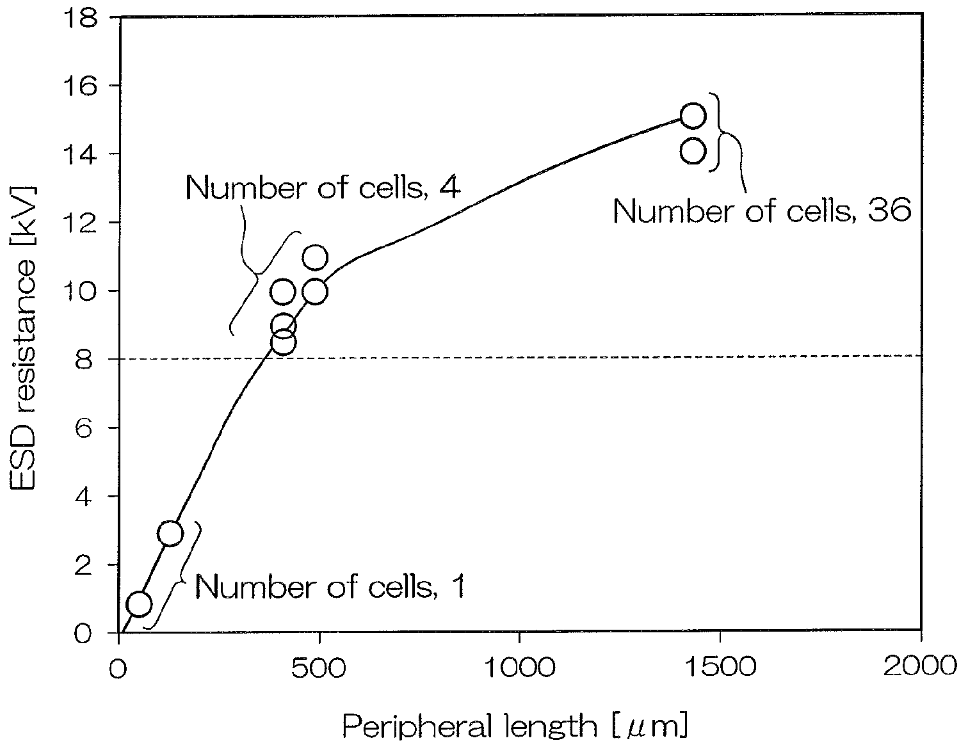

FIG. 46 shows an experimental result obtained by measuring ESD resistance of a plurality of samples, each of which is made different in total peripheral length (total extension) of a p-n junction region by setting in various ways the size of a diode cell and/or the number of the diode cells formed on a substrate equal in area.

Figure 47:
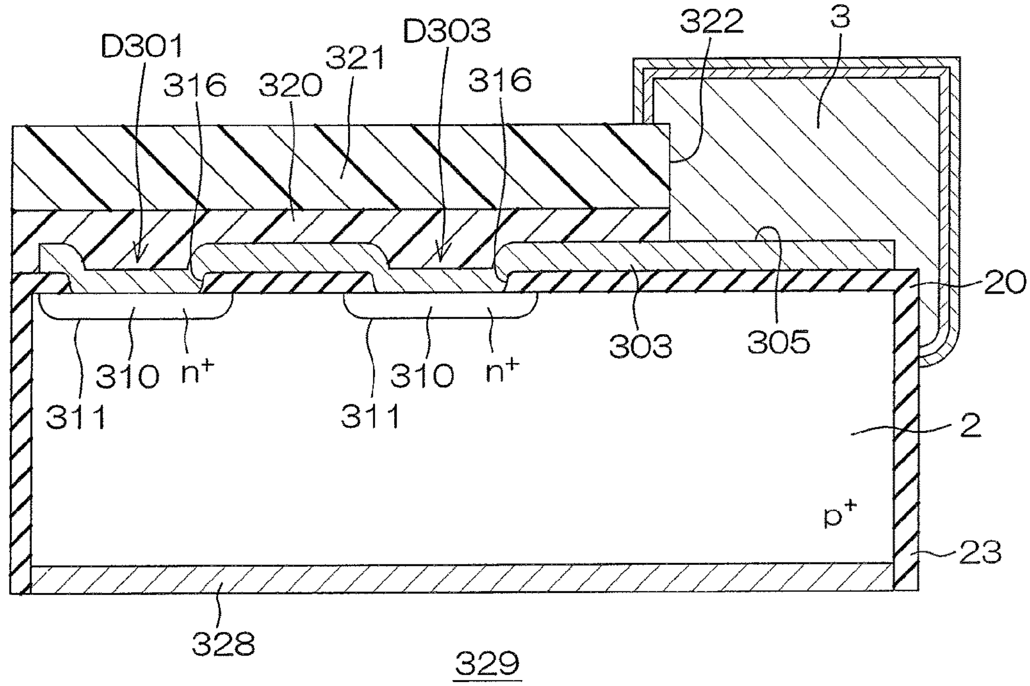

FIG. 47 is a sectional view of a chip part according to Embodiment 7 of the present invention.

Figure 48:
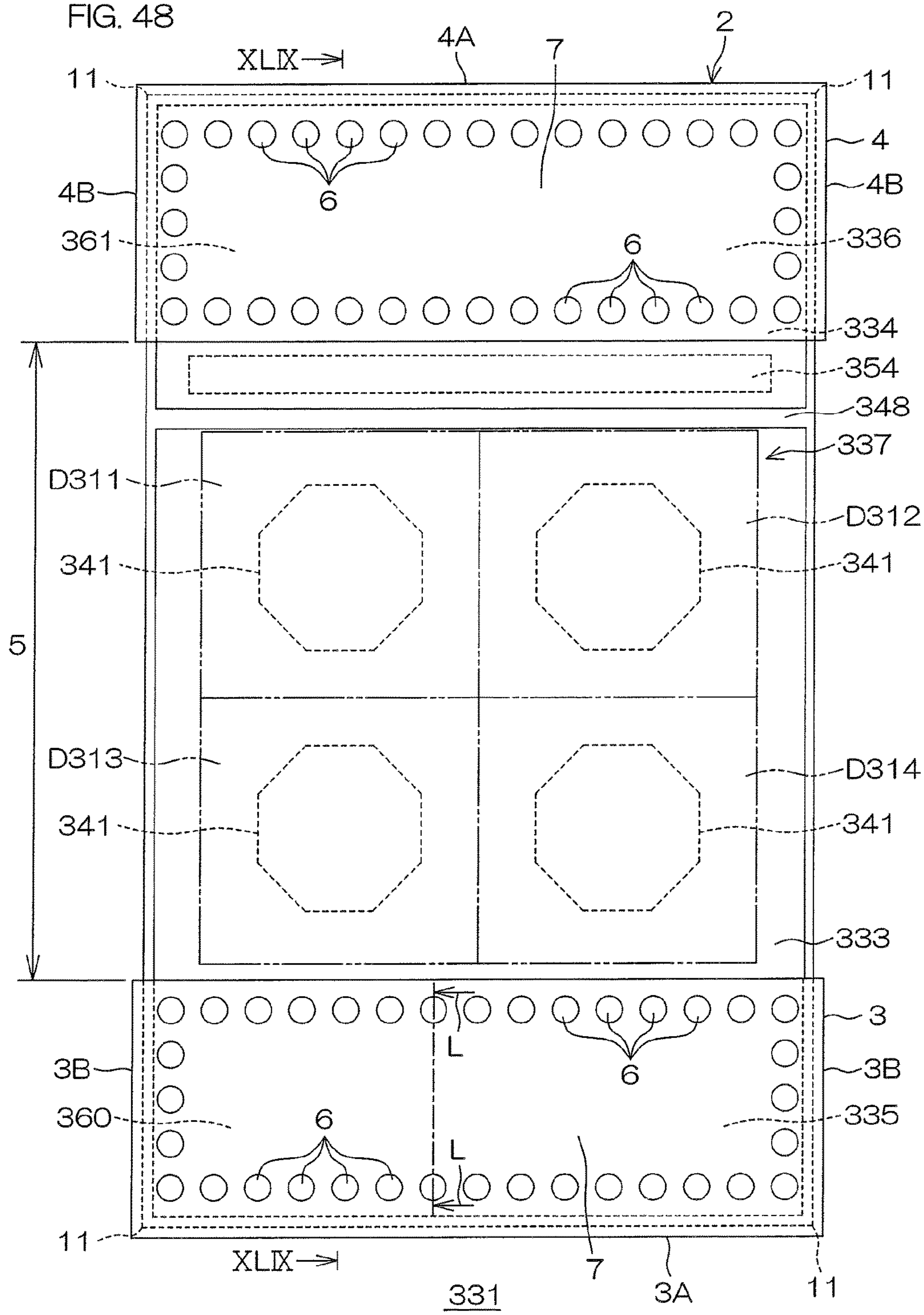

FIG. 48 is a plan view of a chip part according to Embodiment 8 of the present invention.

Figure 49:
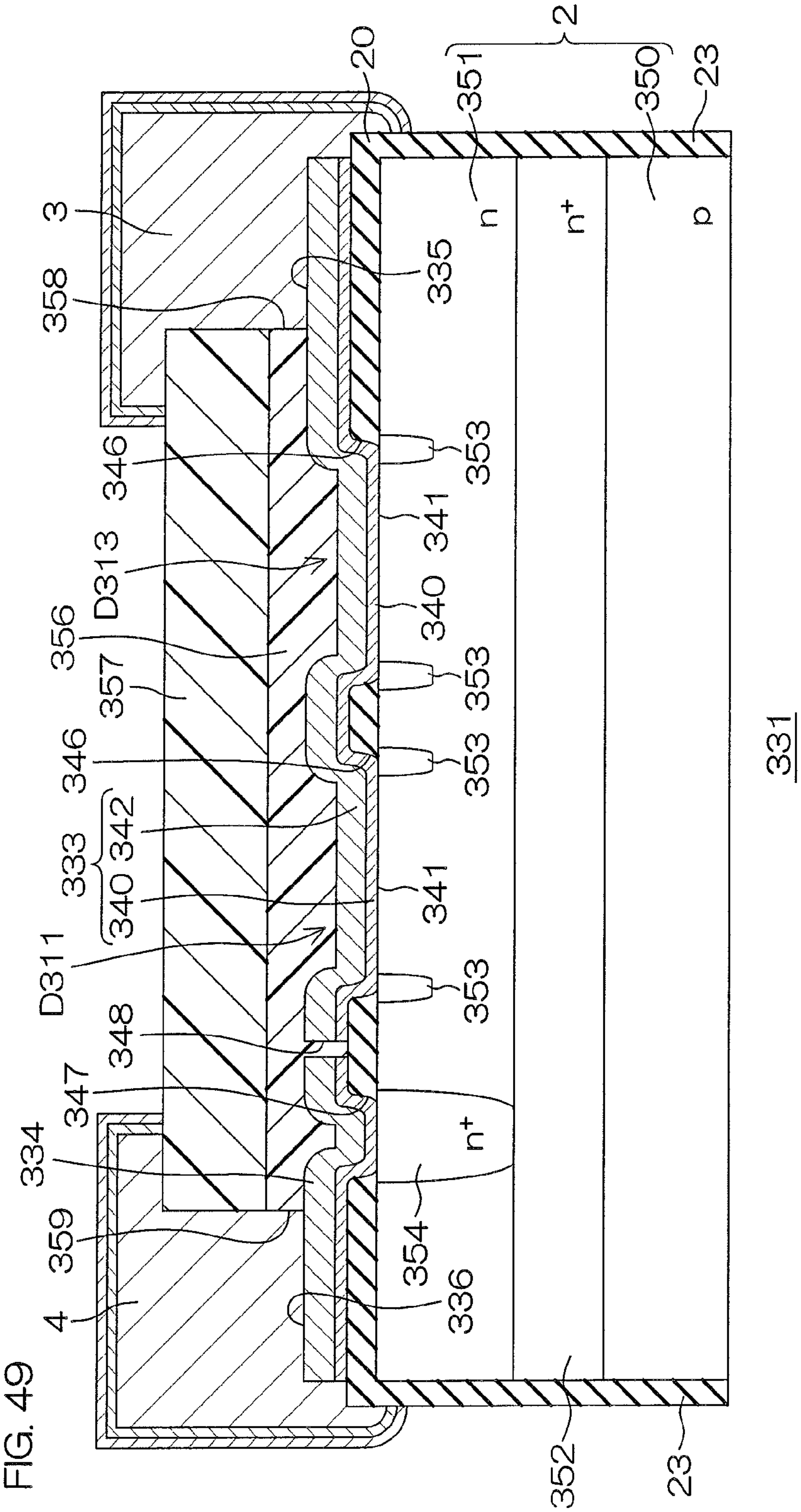

FIG. 49 is a sectional view taken along section line XLIX-XLIX in FIG. 48.

Figure 50:
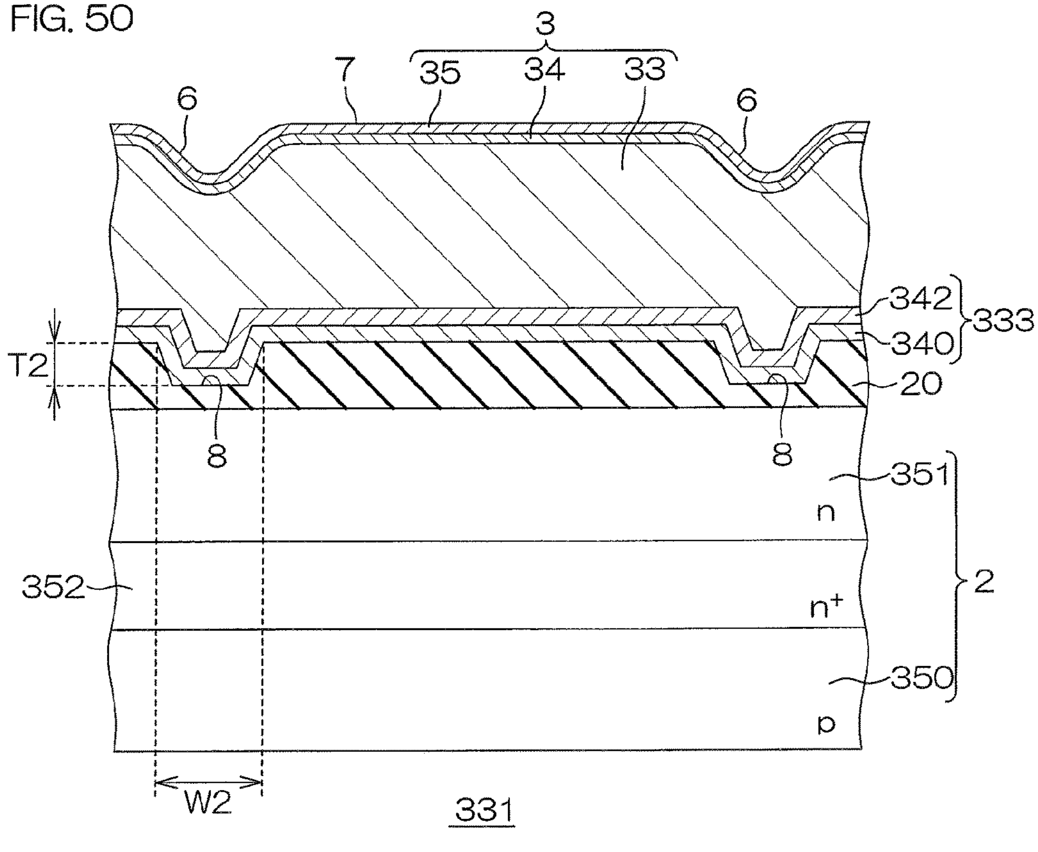

FIG. 50 is a sectional view taken along section line L-L in FIG. 48.

Figure 51:
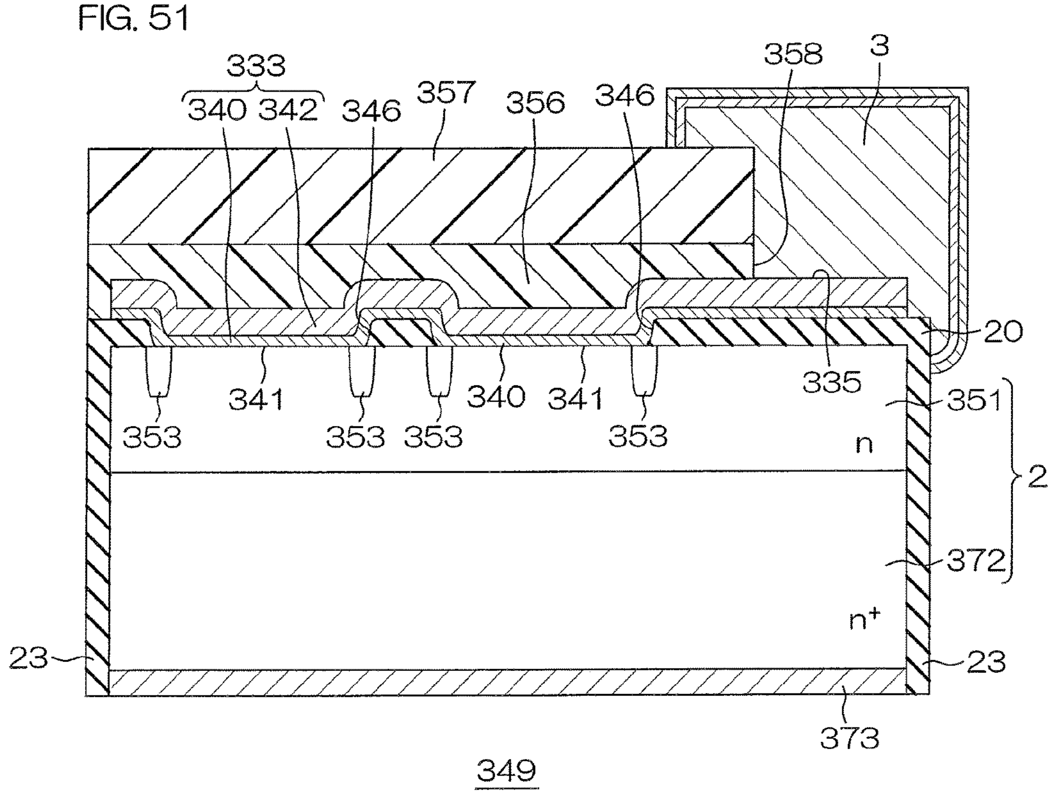

FIG. 51 is a sectional view of a chip part according to Embodiment 9 of the present invention.

Figure 52:
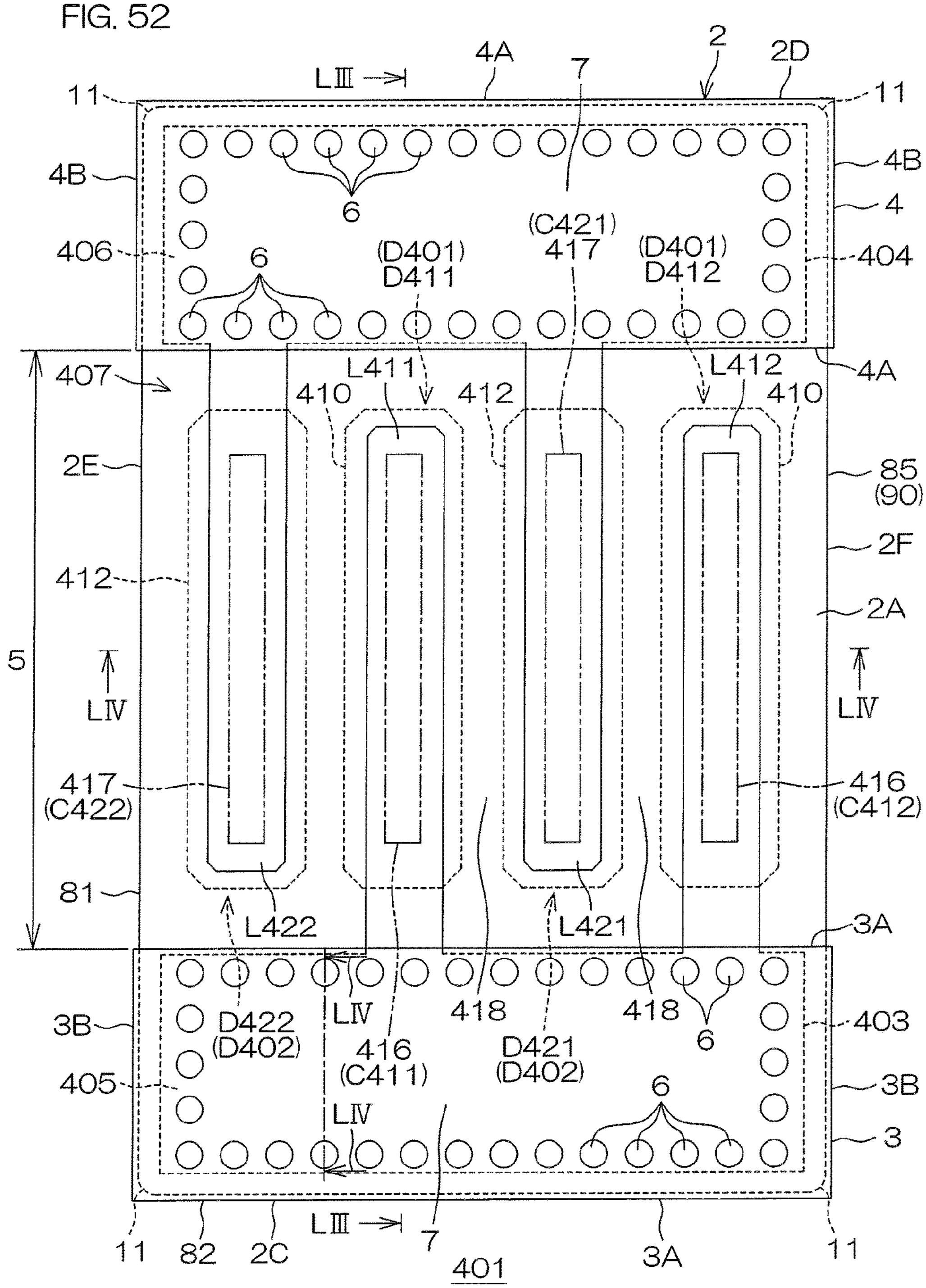

FIG. 52 is a plan view of a chip part according to Embodiment 10 of the present invention.

Figure 53:
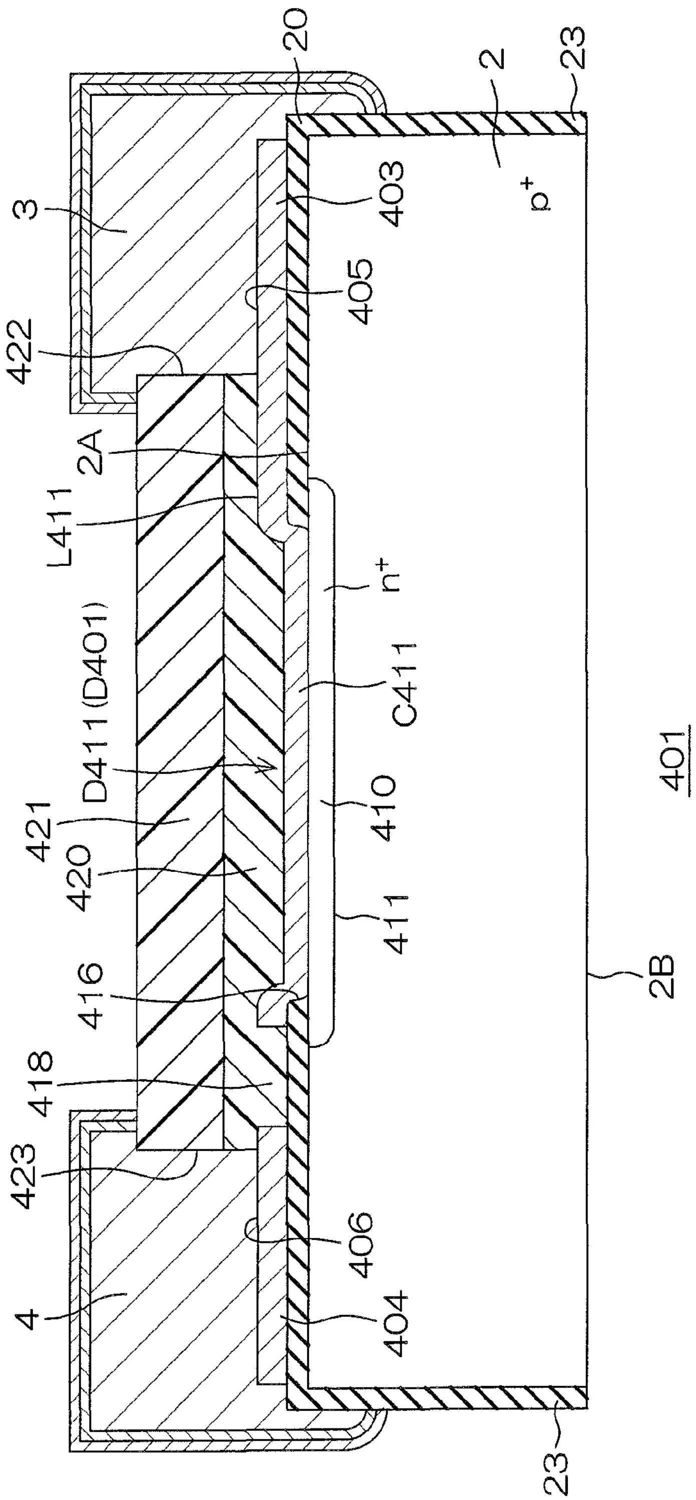

FIG. 53 is a sectional view of the chip part taken along section line LIII-LIII in FIG. 52.

Figure 54:
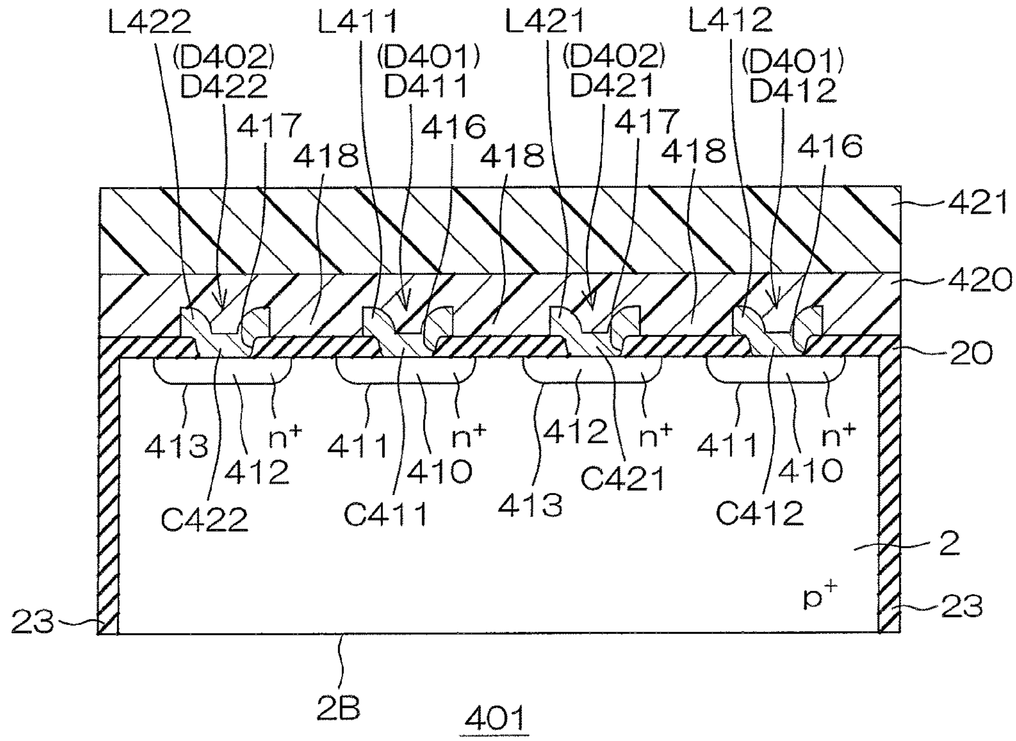

FIG. 54 is a sectional view of the chip part taken along section line LIV-LIV in FIG. 52.

Figure 55:
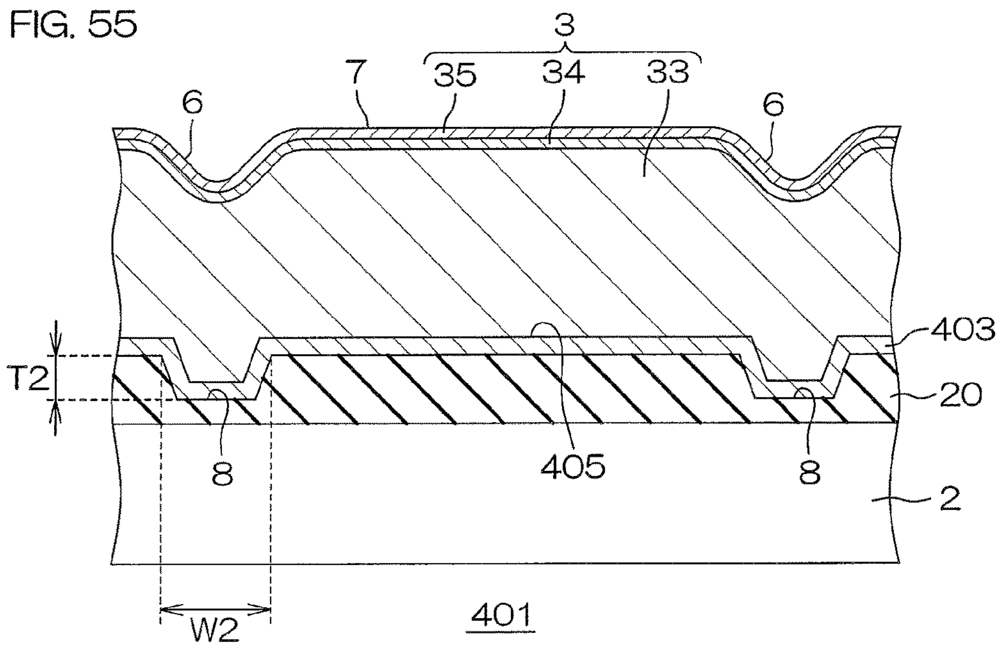

FIG. 55 is a sectional view of the chip part taken along section line LV-LV in FIG. 52.

Figure 56:
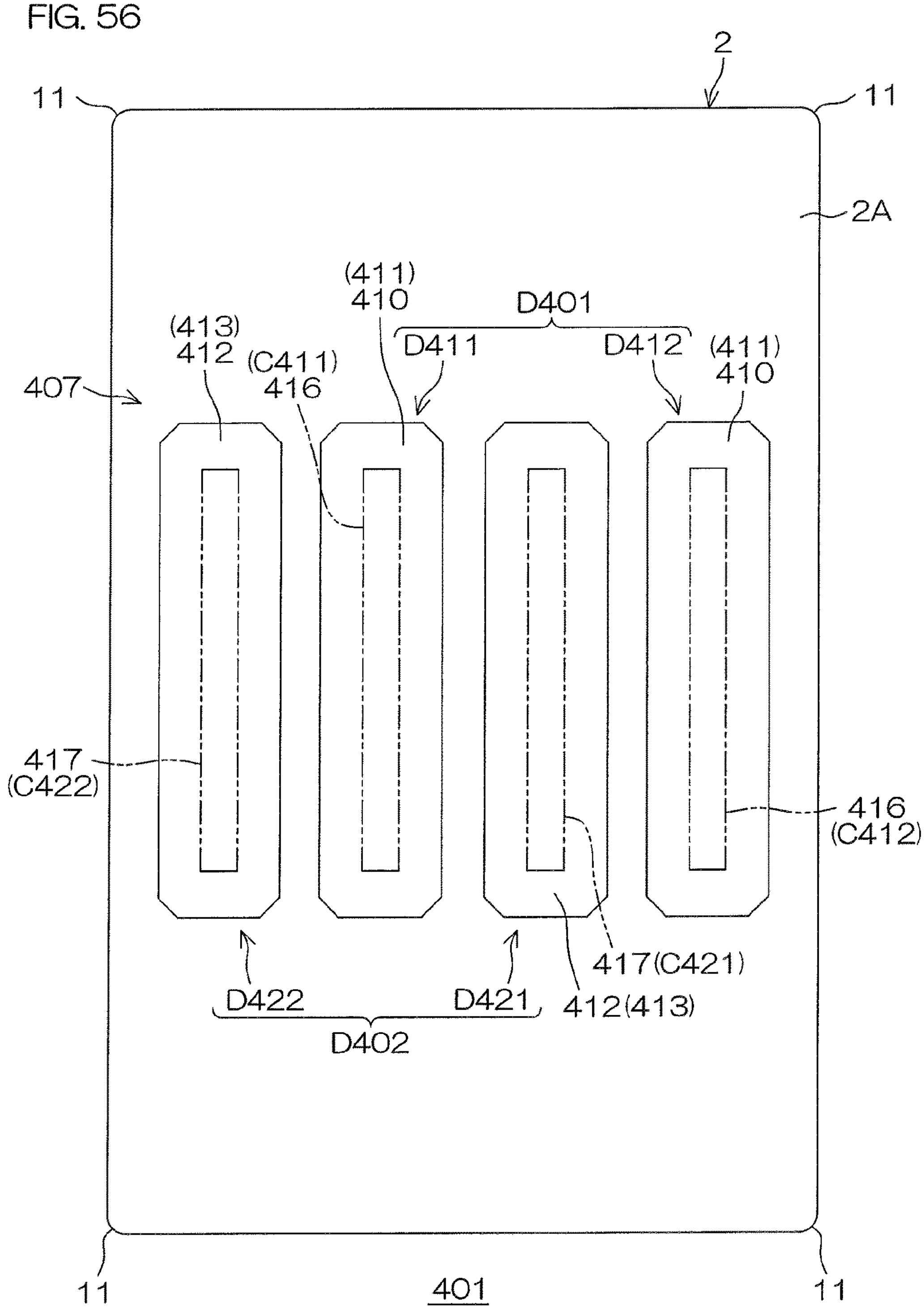

FIG. 56 is a plan view of the chip part shown in FIG. 52 in which a connection electrode and an arrangement formed thereon are removed therefrom to show a structure of a front surface of a substrate.

Figure 57:
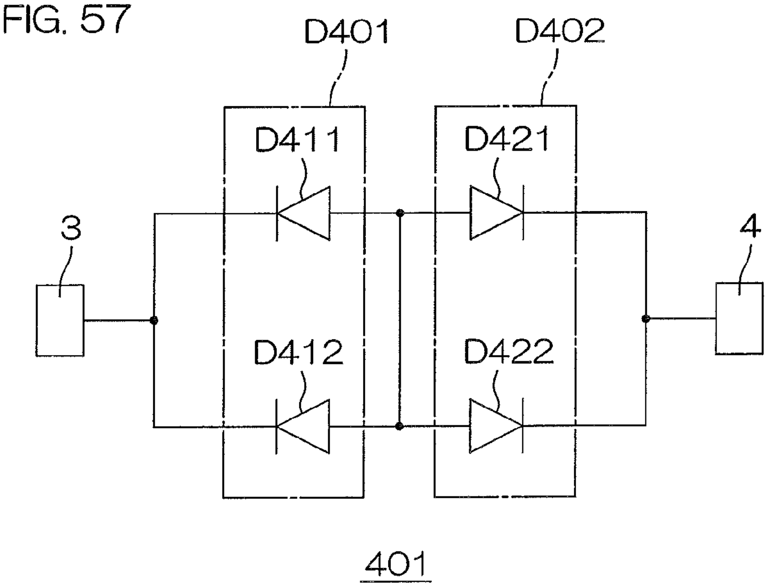

FIG. 57 is an electric circuit diagram which shows an electrical structure of the interior of the chip part shown in FIG. 52.

Figure 58A:
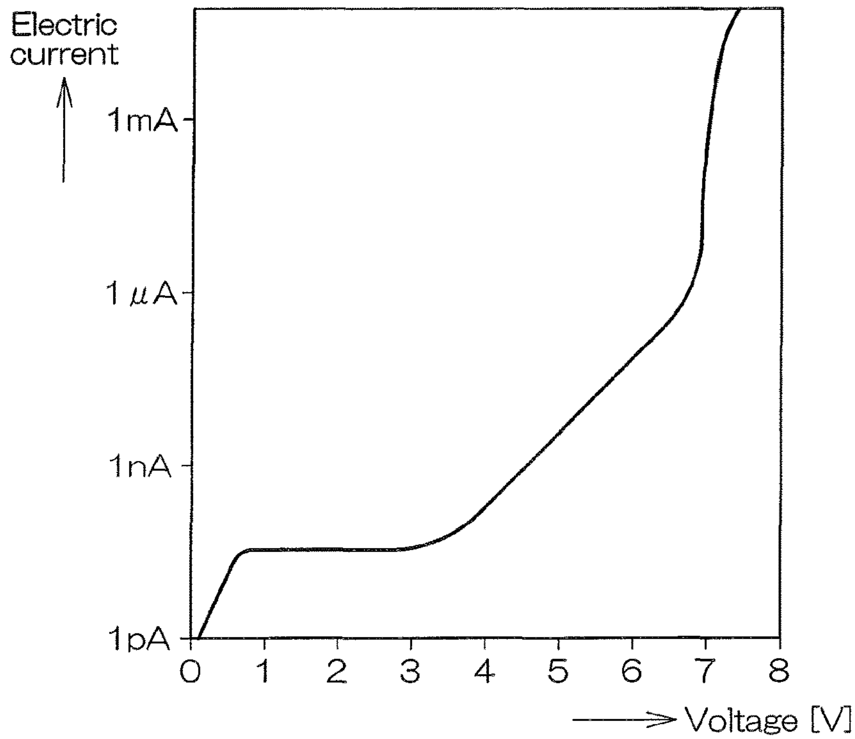

FIG. 58A is a graph which shows an experimental result obtained by measuring voltage-to-current characteristics of the chip part shown in FIG. 52 in each current direction.

Figure 58B:
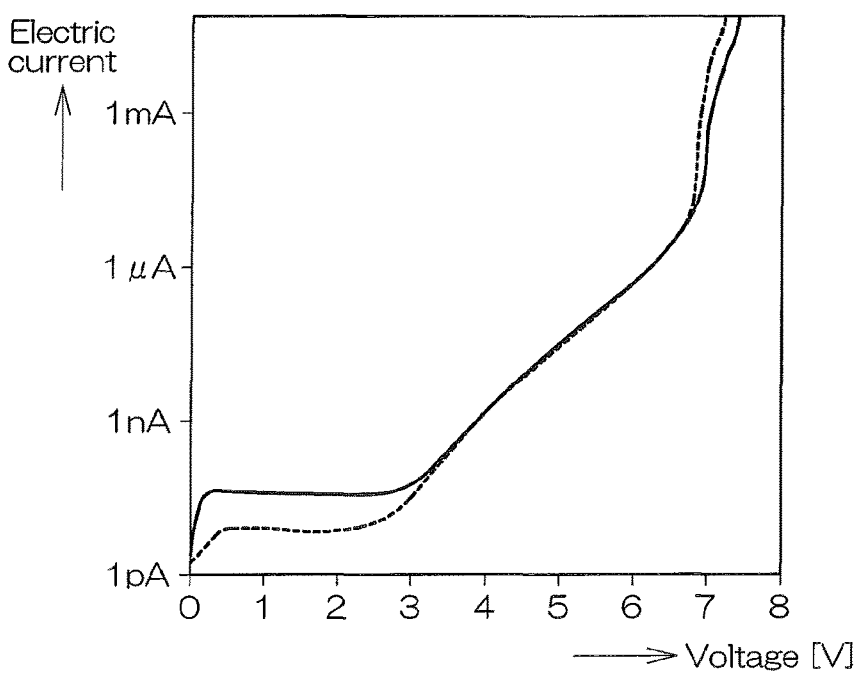

FIG. 58B is a graph which shows an experimental result obtained by measuring voltage-to-current characteristics of a bidirectional Zener diode chip in which a first connection electrode and a first diffusion region are arranged so as to be mutually asymmetrical with a second connection electrode and a second diffusion region in each current direction.

Figure 59:
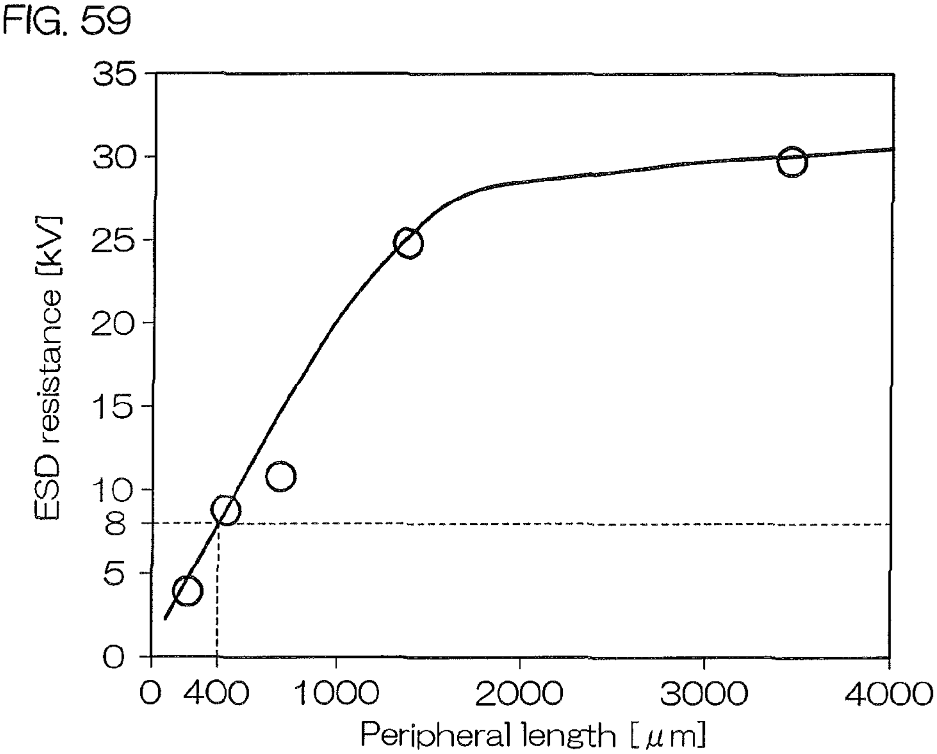

FIG. 59 is a graph which shows an experimental result obtained by measuring ESD resistance of a plurality of samples, each of which is made different in peripheral length of the respective p-n junction regions of a first Zener diode and a second Zener diode by setting in various ways the number of lead-out electrodes (diffusion regions) and/or a size of the diffusion region formed on a substrate equal in area.

Figure 60:
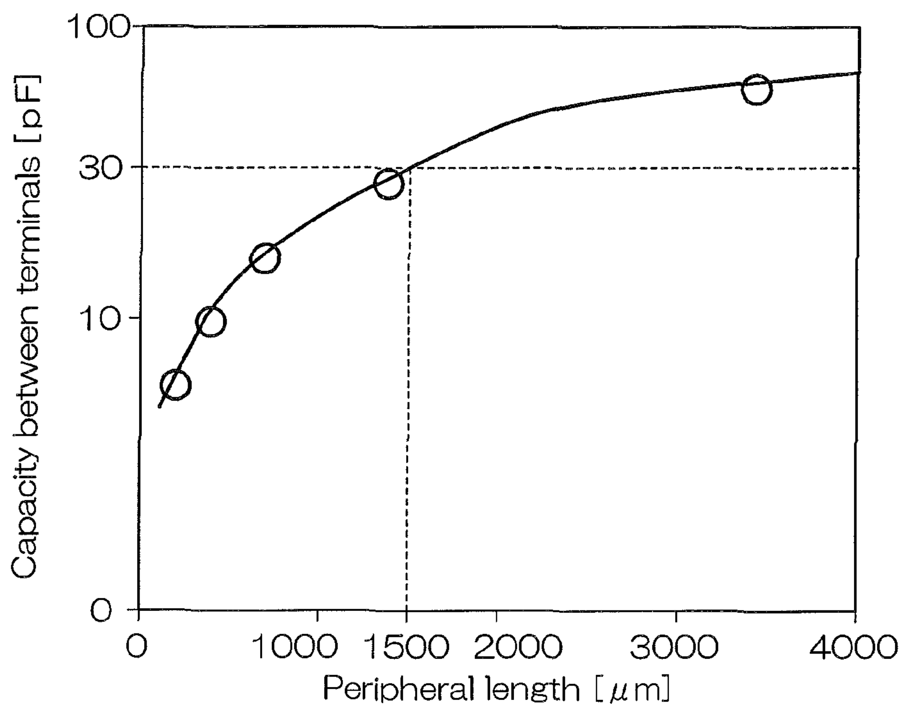

FIG. 60 is a graph which shows an experimental result obtained by measuring a capacity across terminals of a plurality of samples, each of which is made different in peripheral length of the respective p-n junction regions of the first Zener diode and the second Zener diode by setting in various ways the number of lead-out electrodes (diffusion regions) and/or a size of the diffusion region formed on the substrate equal in area.

Figure 61:
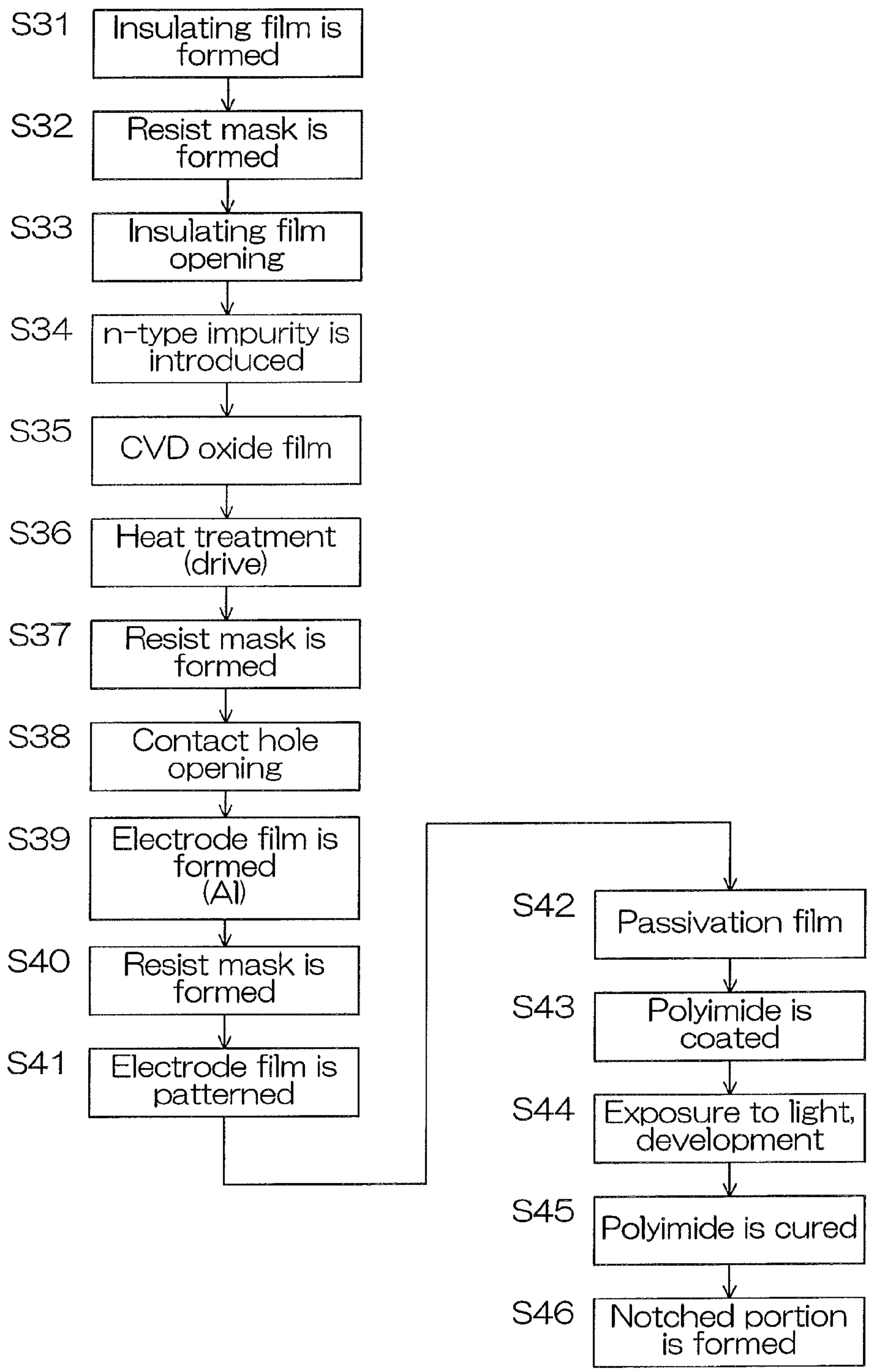

FIG. 61 is a flow chart which describes one example of steps of manufacturing the chip part 401 shown in FIG. 52.

Figure 62A:
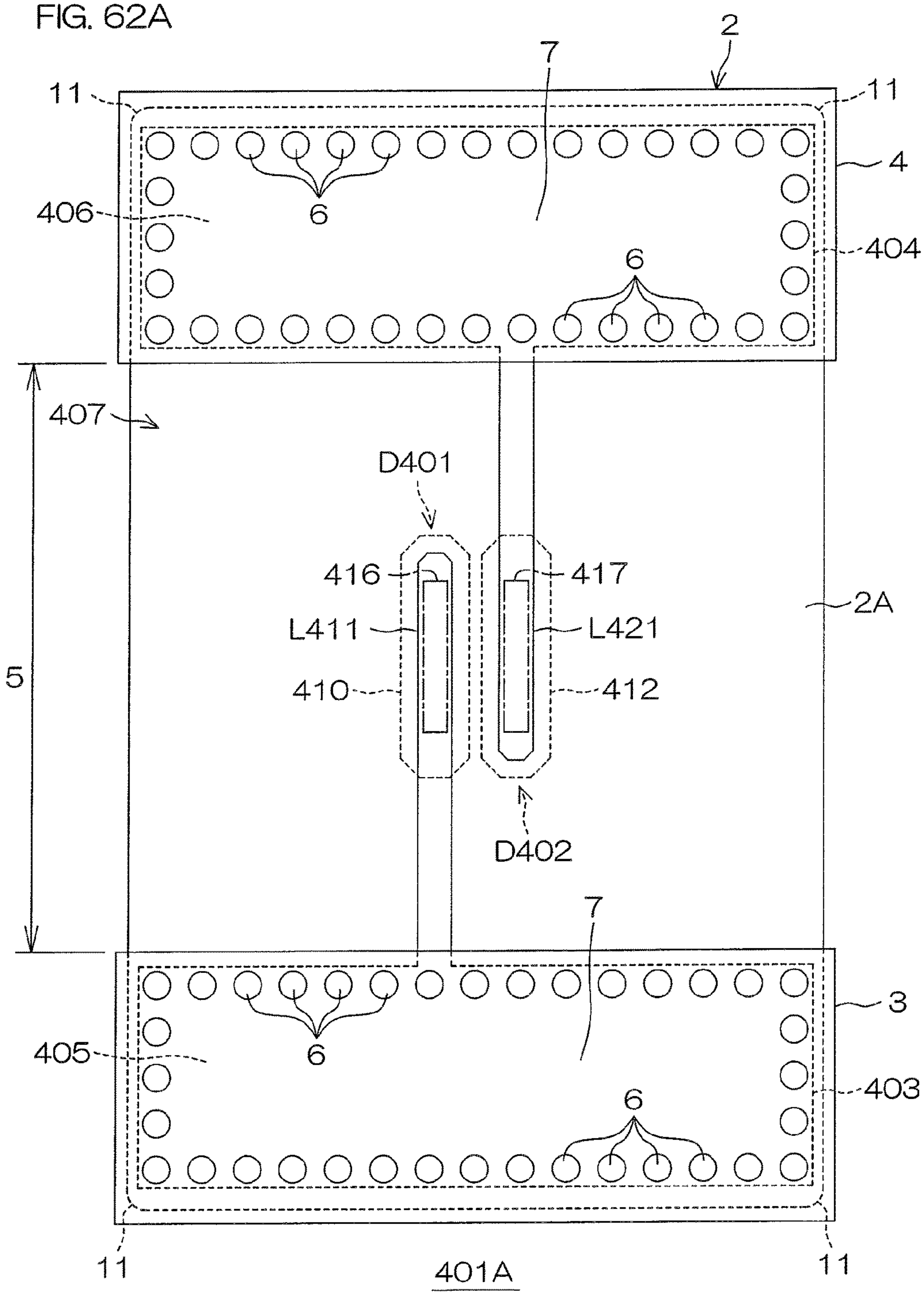

FIG. 62A is a plan view which shows modification example 1 of the chip part shown in FIG. 52.

Figure 62B:
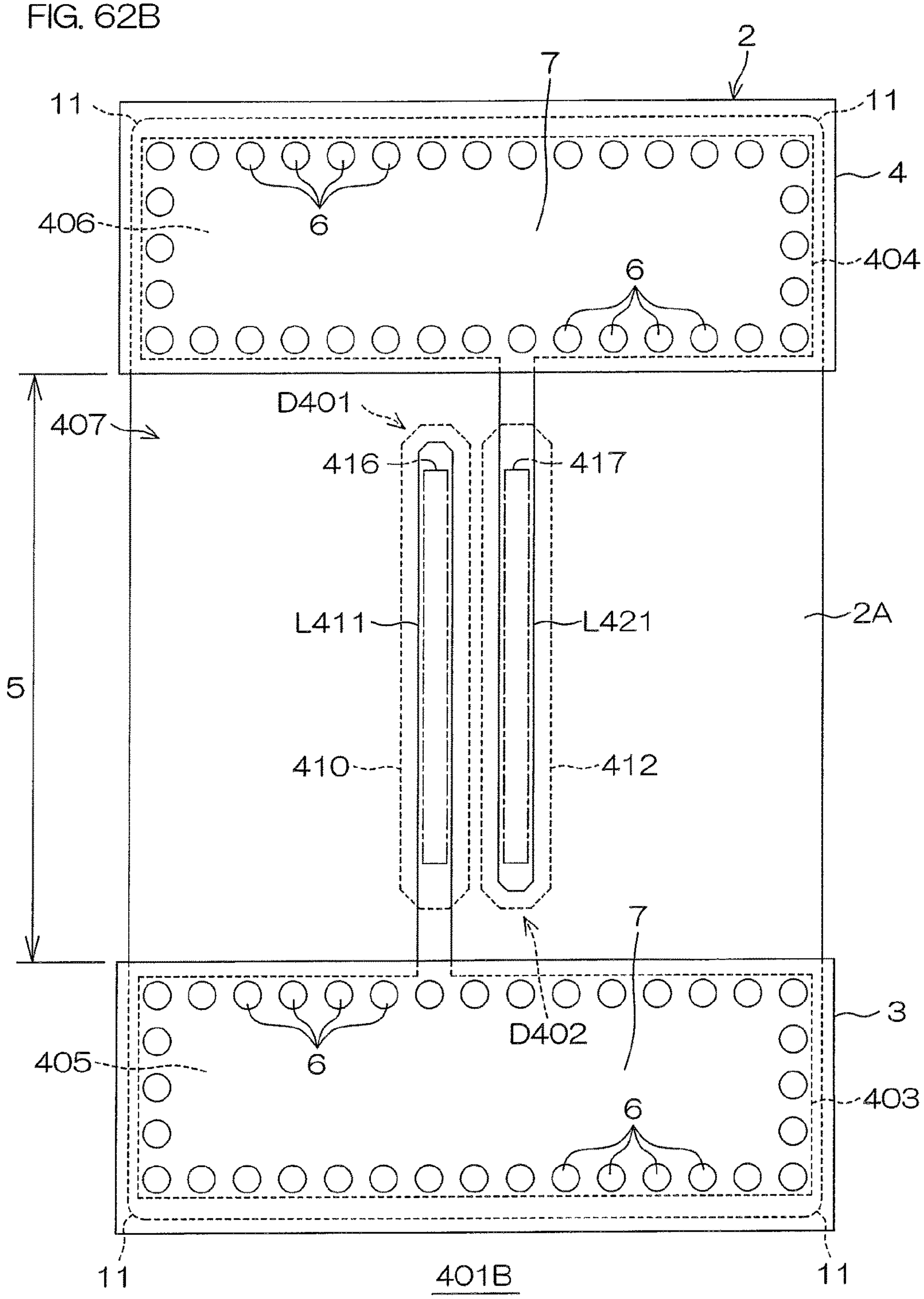

FIG. 62B is a plan view which shows modification example 2 of the chip part shown in FIG. 52.

Figure 62C:
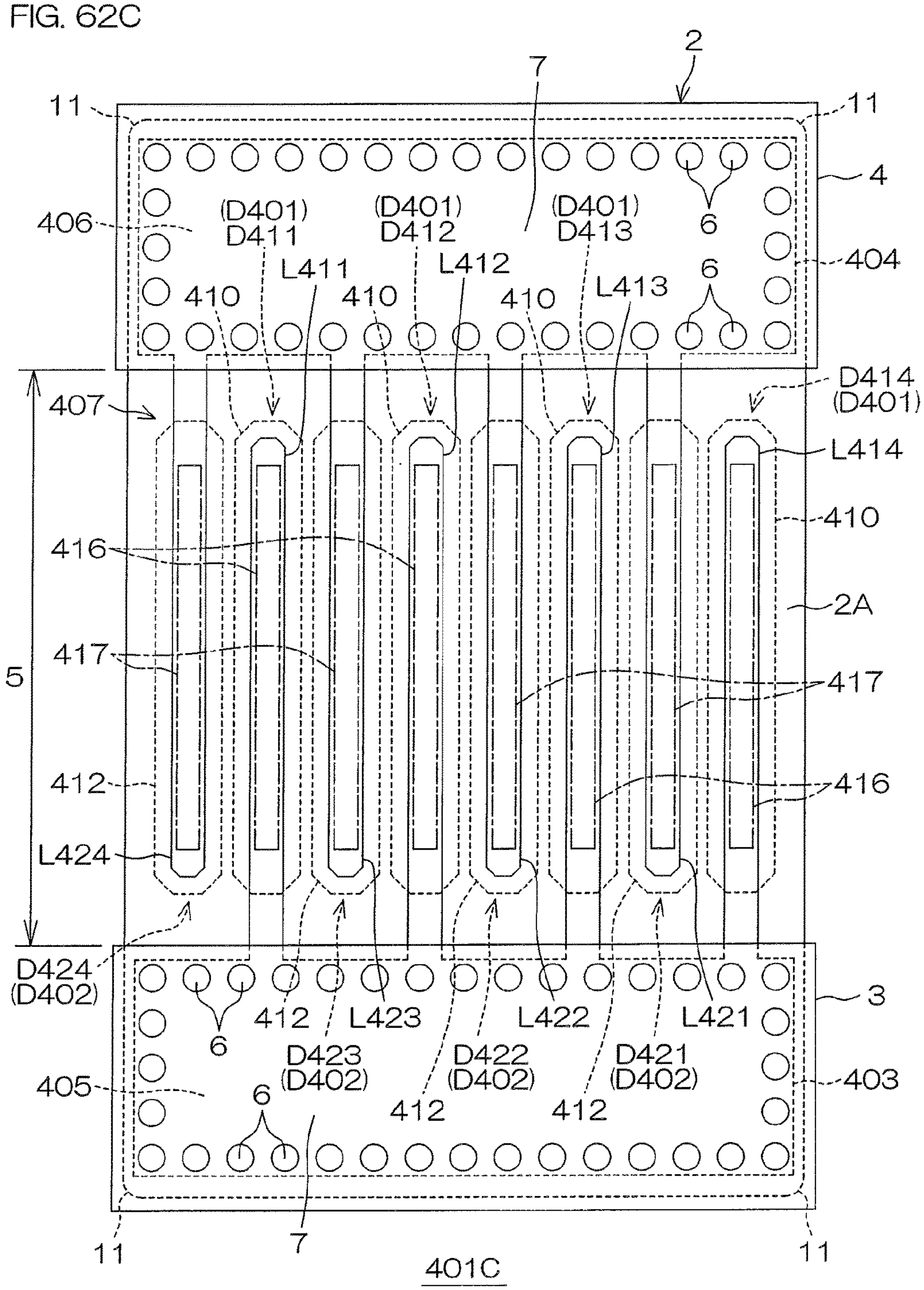

FIG. 62C is a plan view which shows modification example 3 of the chip part shown in FIG. 52.

Figure 62D:
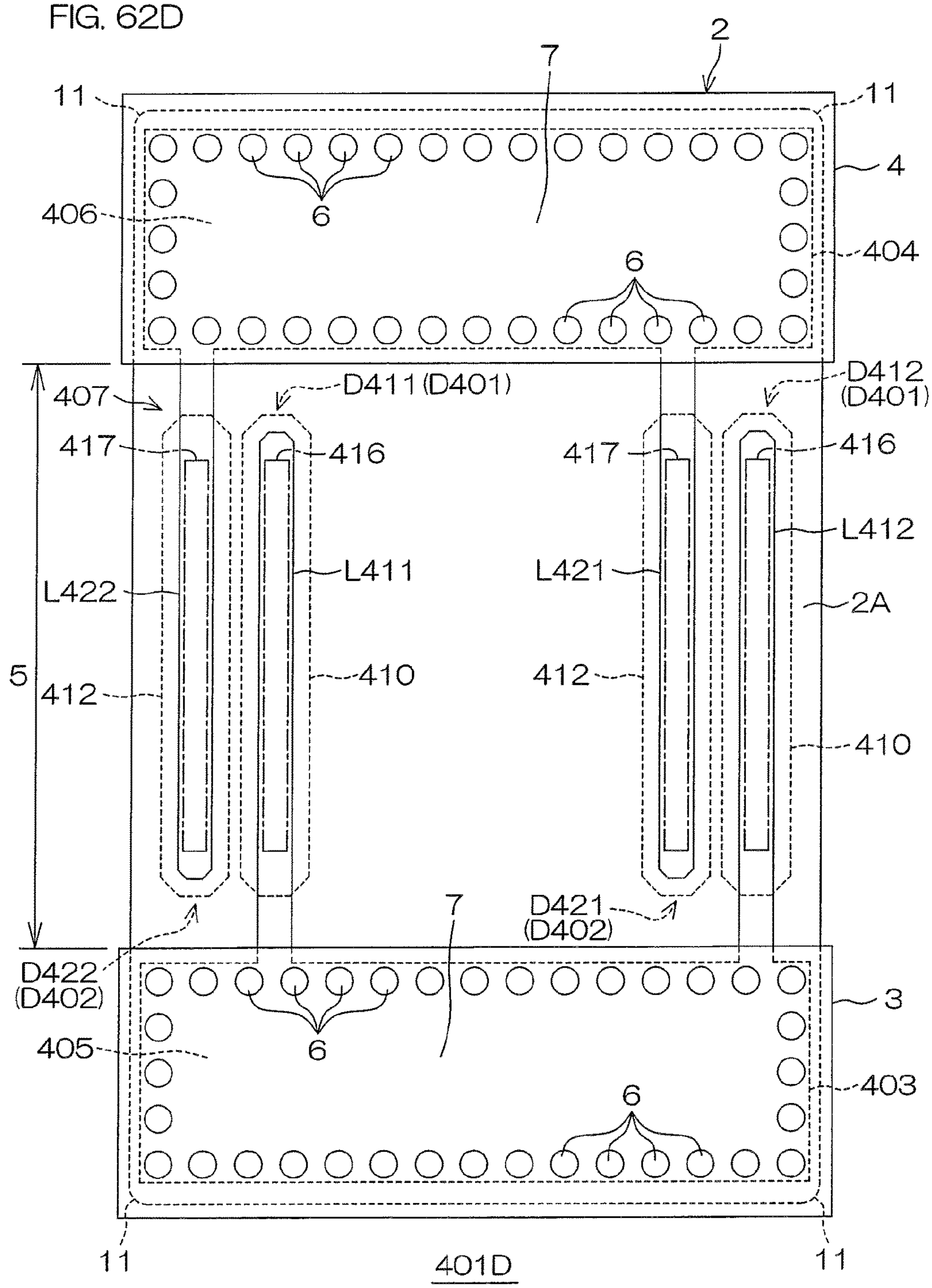

FIG. 62D is a plan view which shows modification example 4 of the chip part shown in FIG. 52.

Figure 62E:
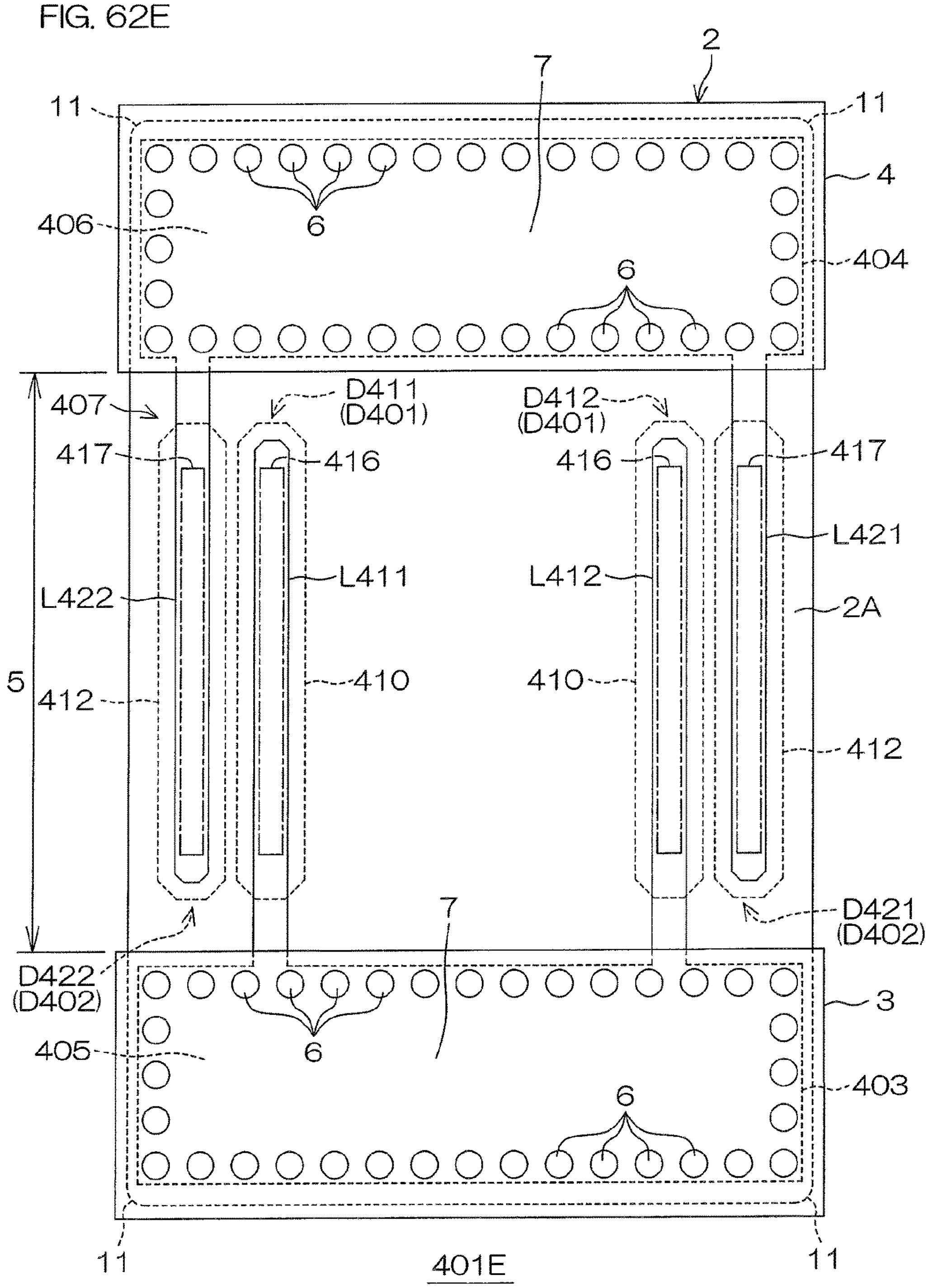

FIG. 62E is a plan view which shows modification example 5 of the chip part shown in FIG. 52.

Figure 62F:
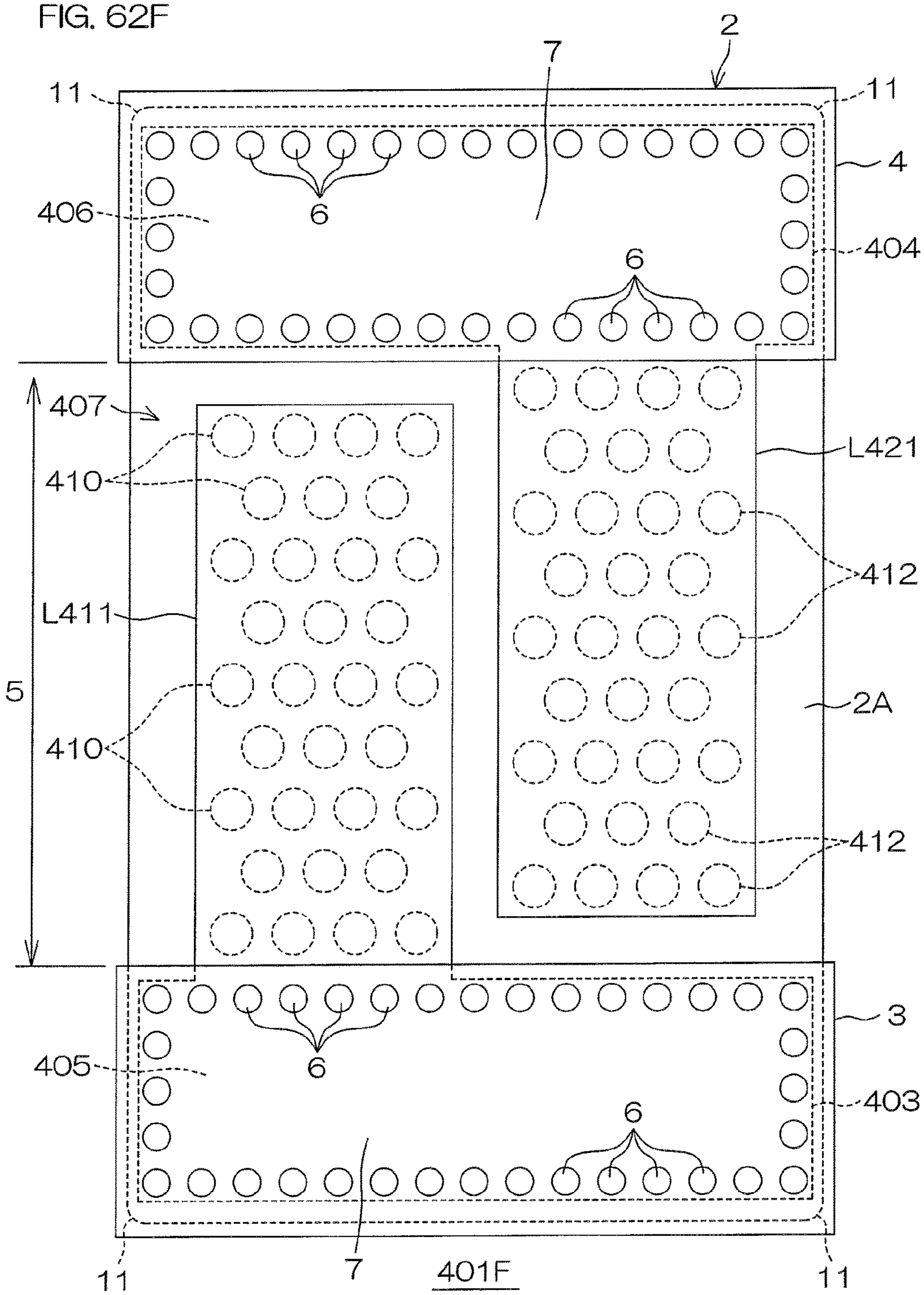

FIG. 62F is a plan view which shows modification example 6 of the chip part shown in FIG. 52.

Figure 63A:
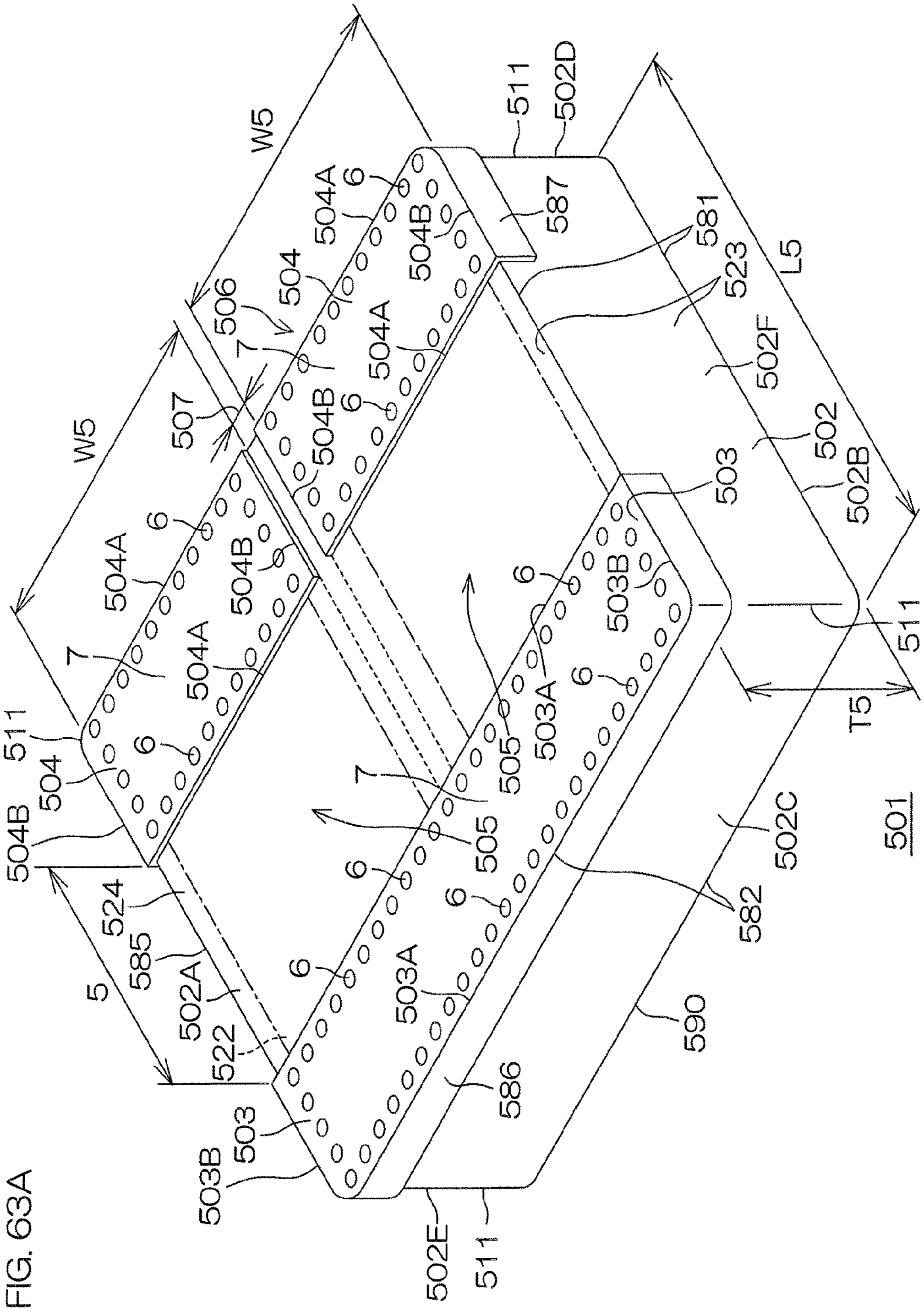

FIG. 63A is a schematic perspective view which shows a chip part of Embodiment 11 of the present invention.

Figure 63B:
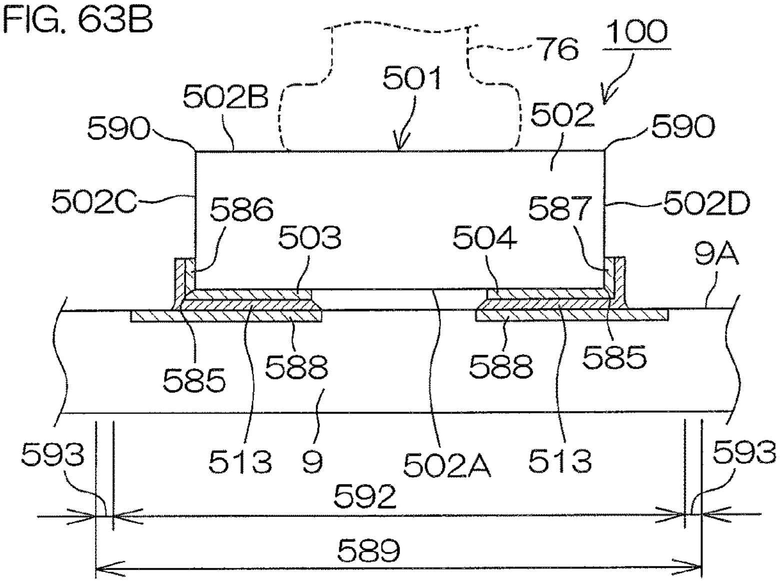

FIG. 63B is a schematic sectional view of a circuit assembly in a state that the chip part is mounted on a mounting substrate.

Figure 63C:
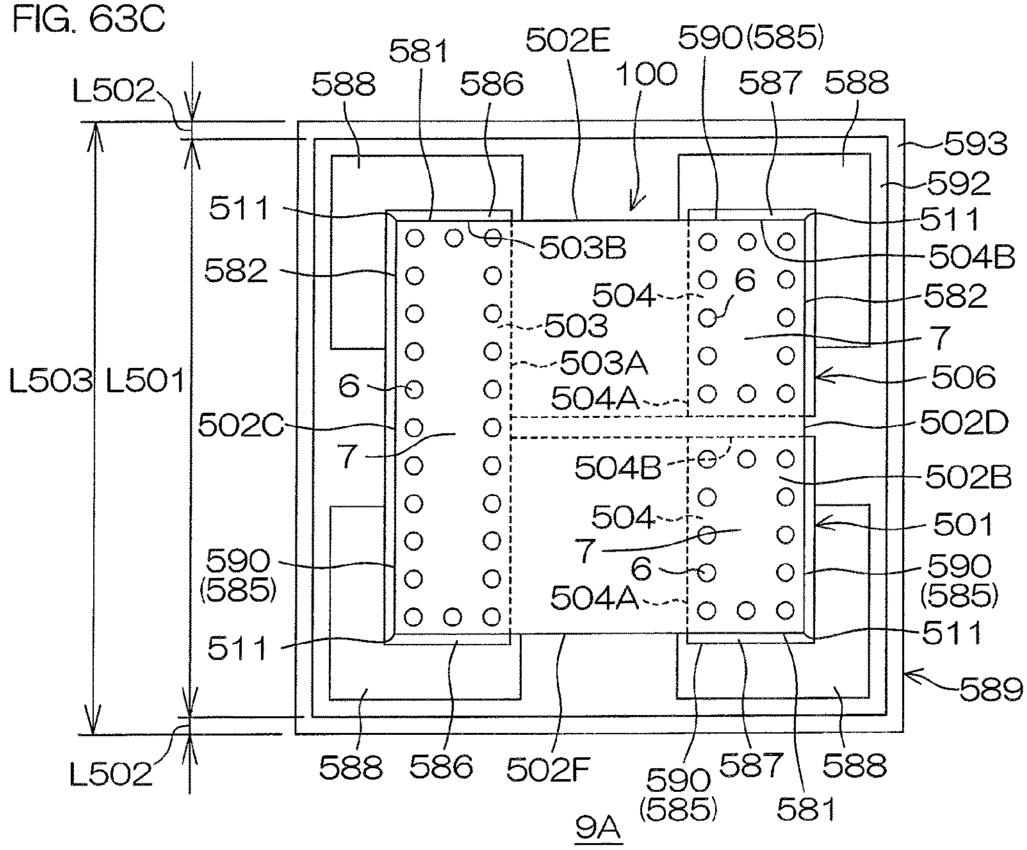

FIG. 63C is a schematic plan view when the circuit assembly is viewed from a rear surface side of the chip part.

Figure 63D:
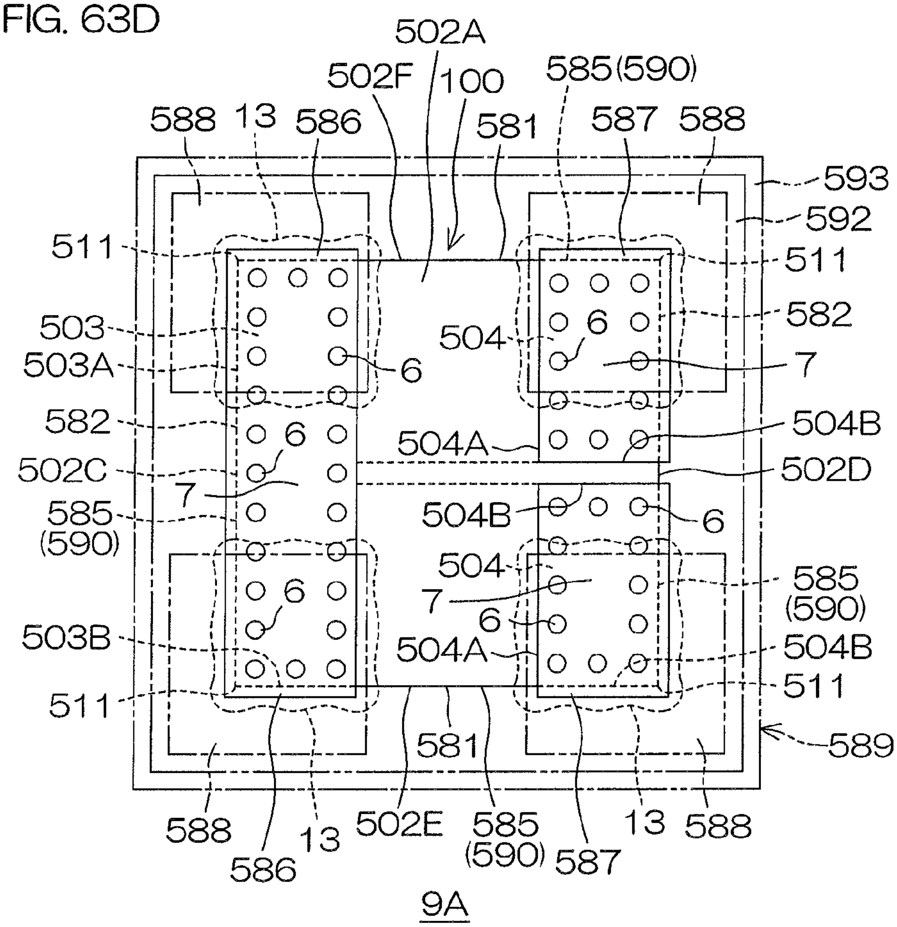

FIG. 63D is a schematic plan view when the circuit assembly is viewed from an element forming surface side of the chip part.

Figure 63E:
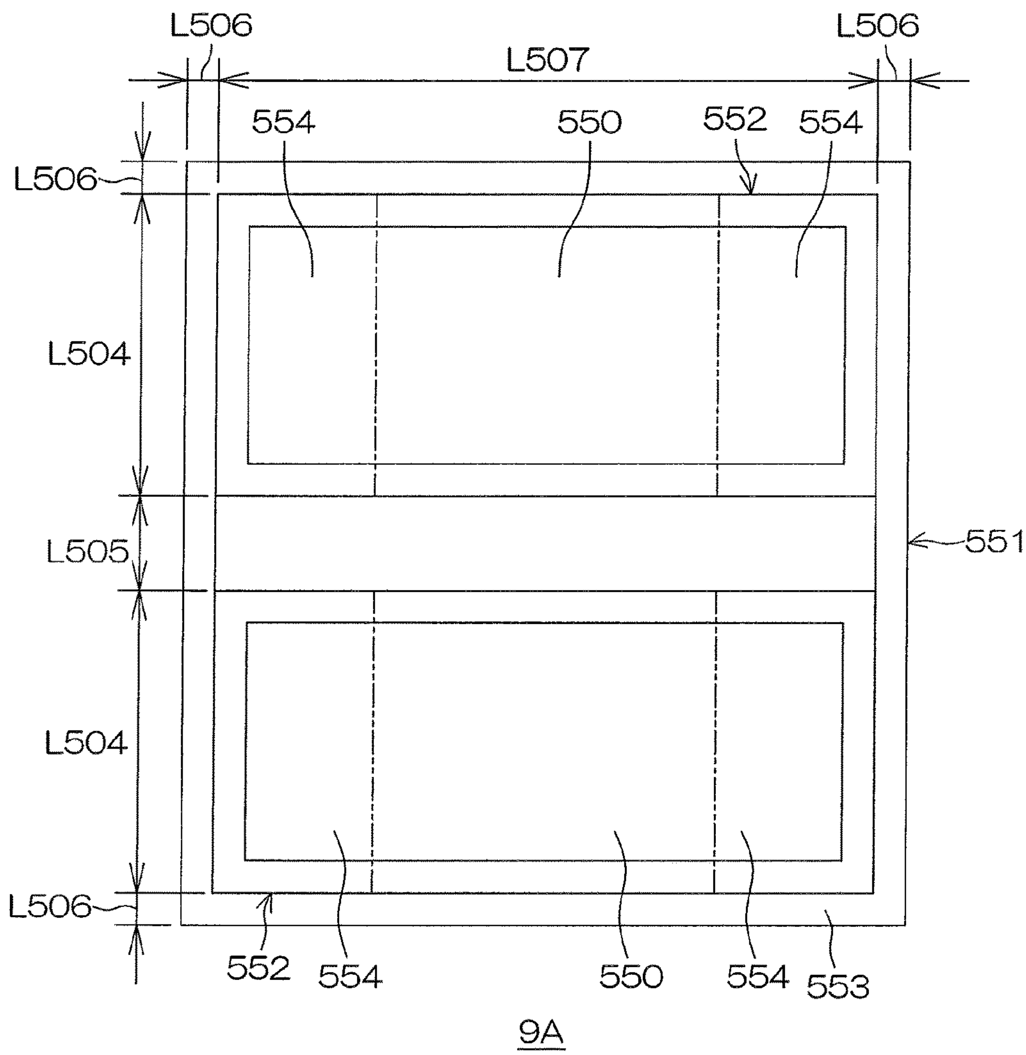

FIG. 63E is a view which shows a state that two single chips are mounted on a mounting substrate.

Figure 64:
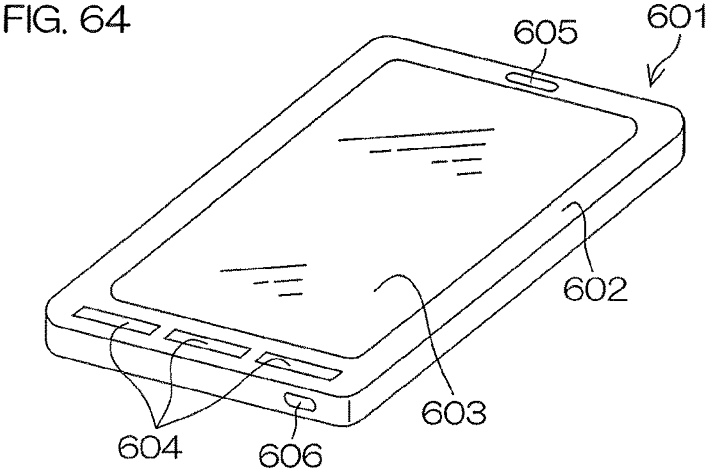

FIG. 64 is a perspective view which shows the outer appearance of a smartphone which is one example of an electronic device in which the chip part according to a preferred embodiment of the present invention is used.

Figure 65:
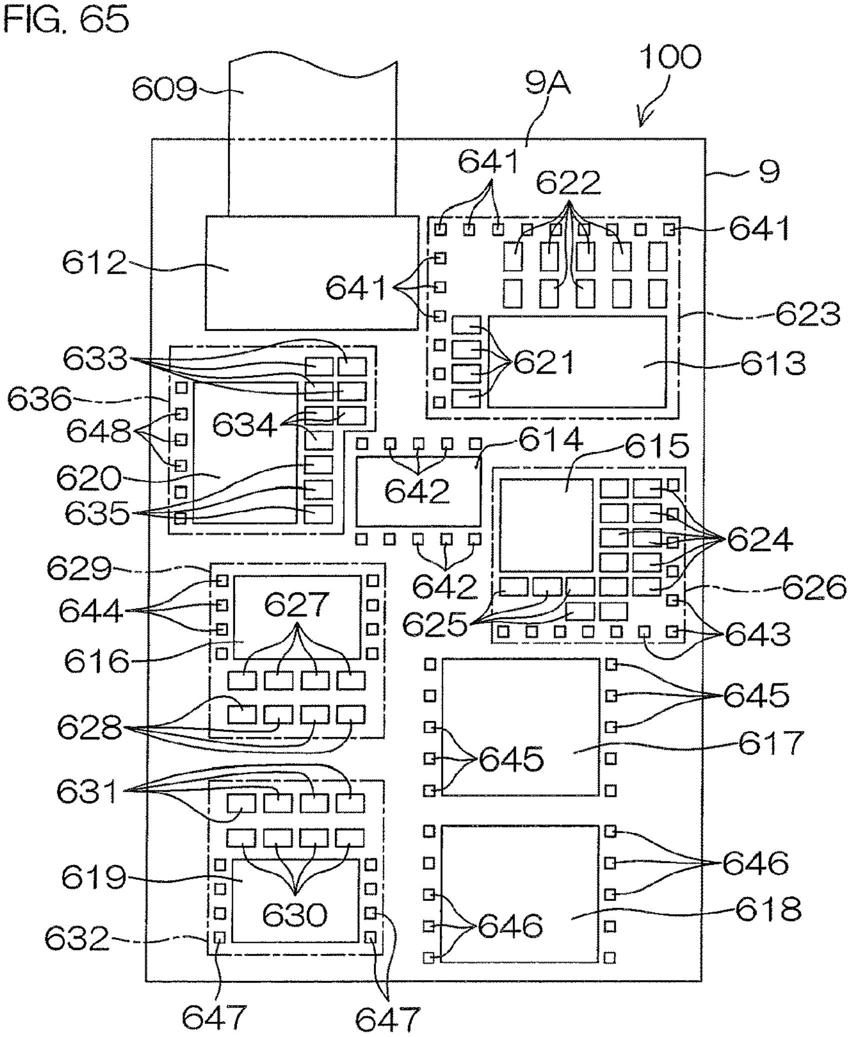

FIG. 65 is an illustrative plan view which shows an arrangement of a circuit assembly which is housed inside a housing of the smartphone.

Figure 66:
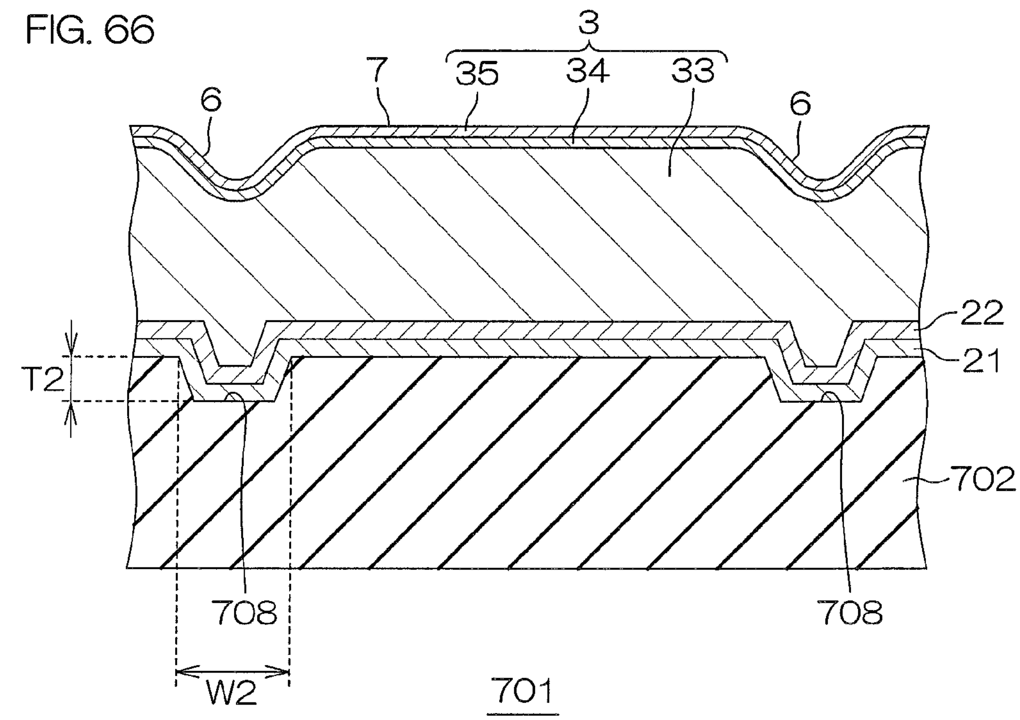

FIG. 66 is a schematic sectional view which shows a connection electrode of the chip part of the modification example.

Figure 67:
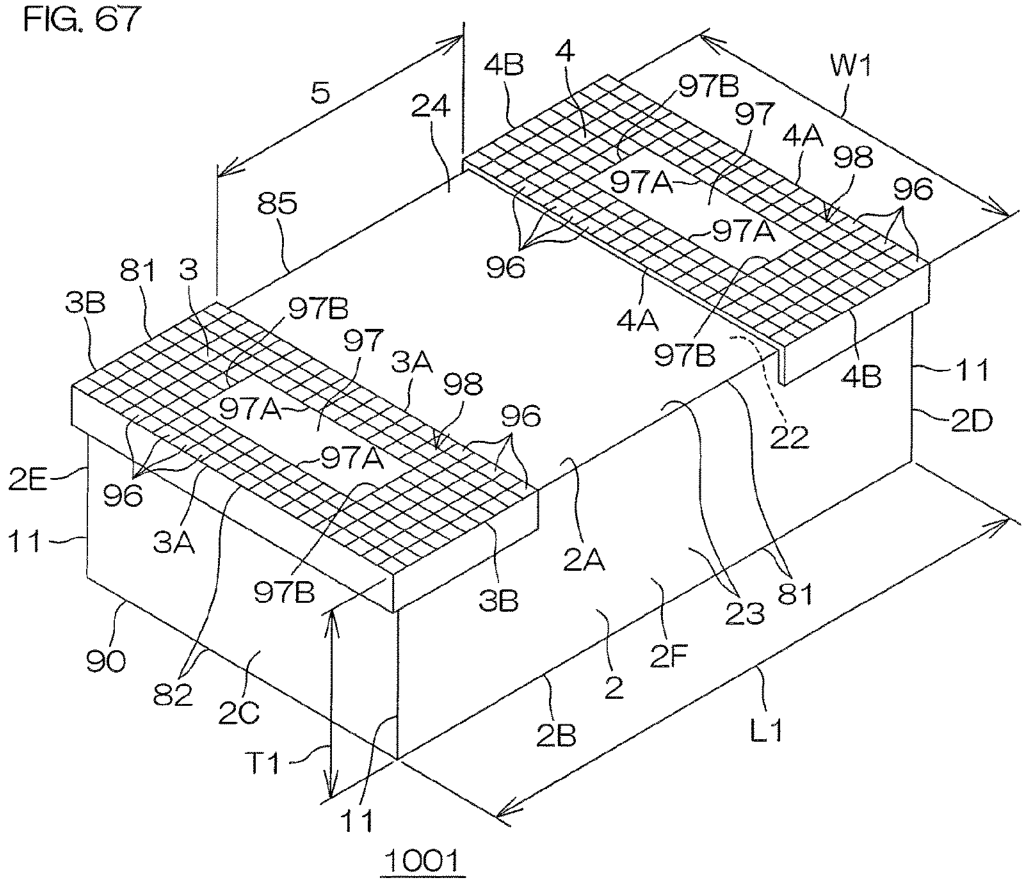

FIG. 67 is a schematic perspective view which shows a chip part of Reference Example 1.

Figure 68:
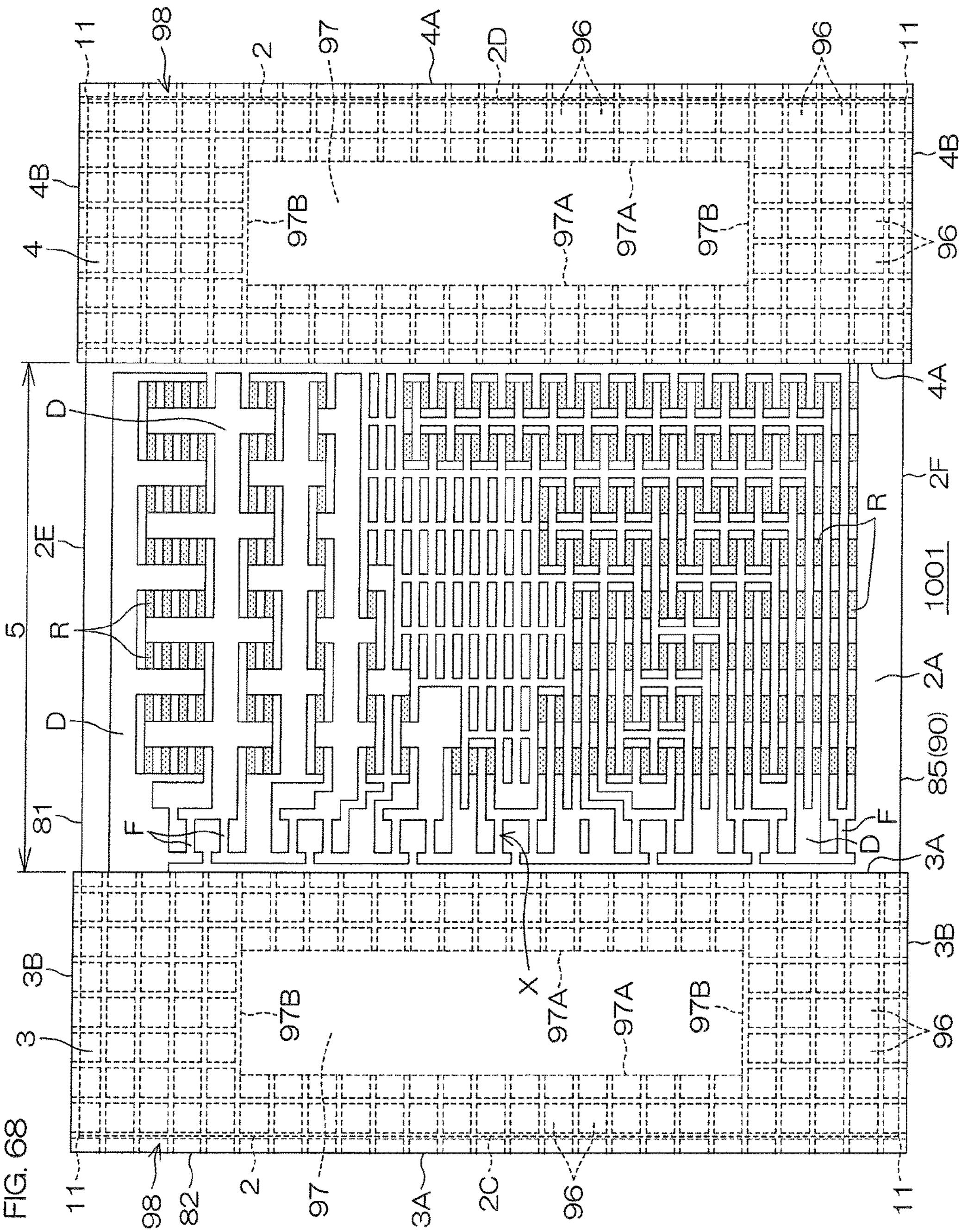

FIG. 68 is a plan view of the chip part shown in FIG. 67 or a view which shows a positional relationship between a connection electrode and a circuit element as well as an arrangement of the element in a plan view.

Figure 69A:
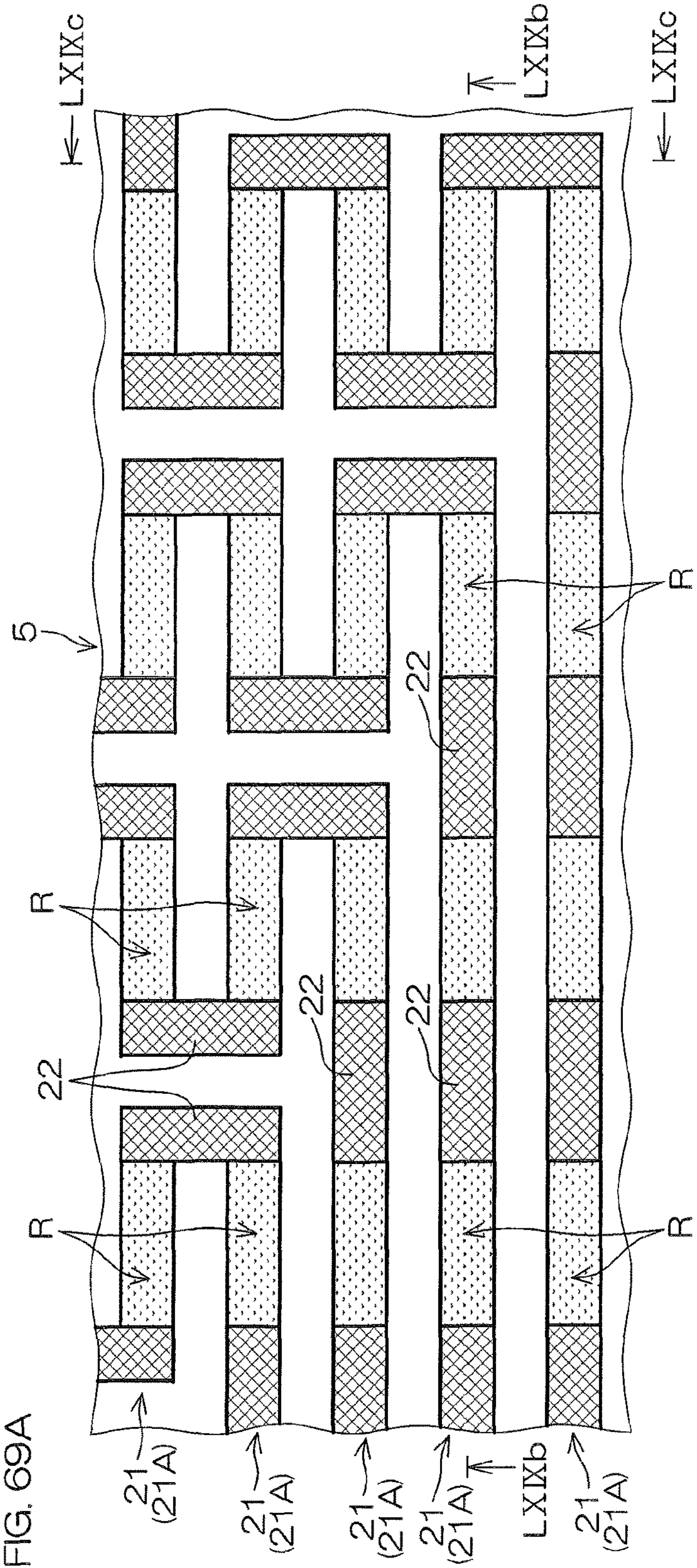

FIG. 69A is a plan view drawn by enlarging a portion of the element shown in FIG. 68.

Figure 69B:
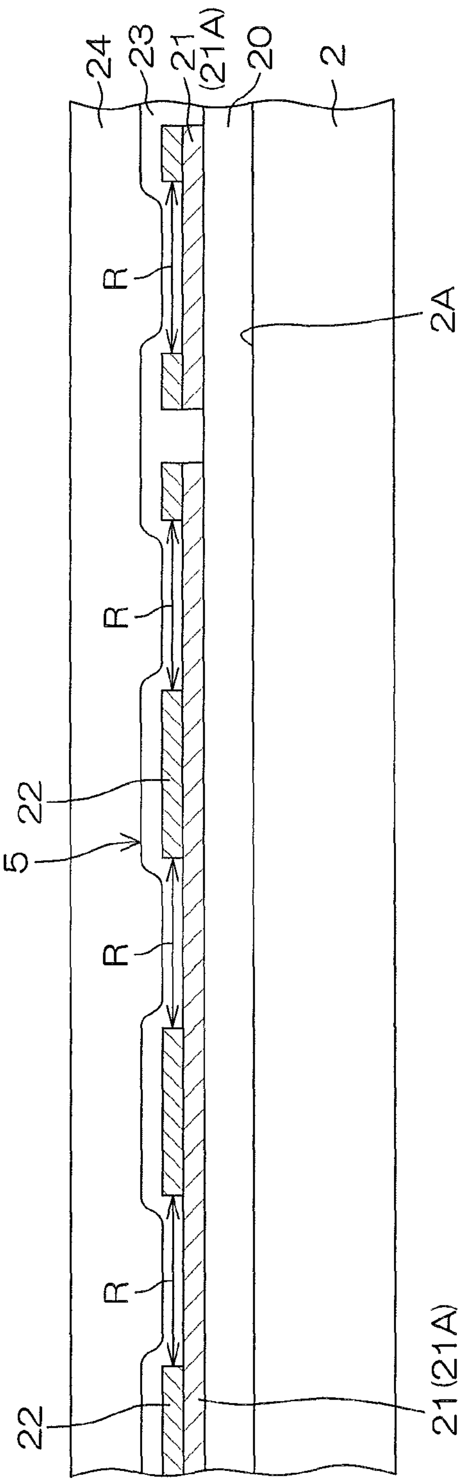

FIG. 69B is a sectional view taken along section line LXIXb-LXIXb in FIG. 69A.

Figure 69C:
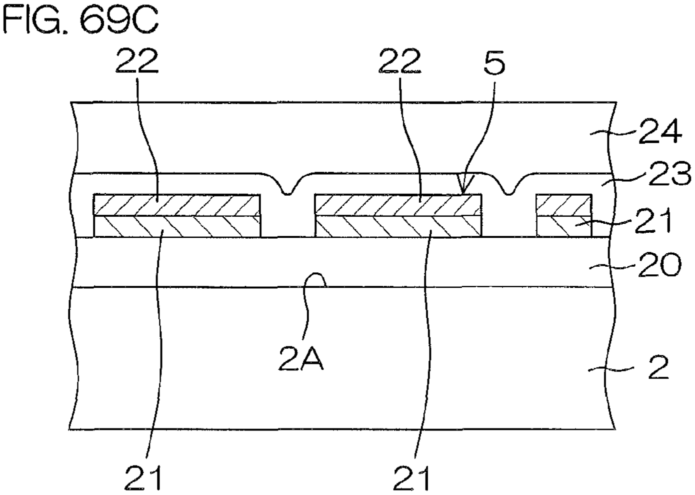

FIG. 69C is a sectional view taken along section line LXIXc-LXIXc in FIG. 69A.

Figure 70A:
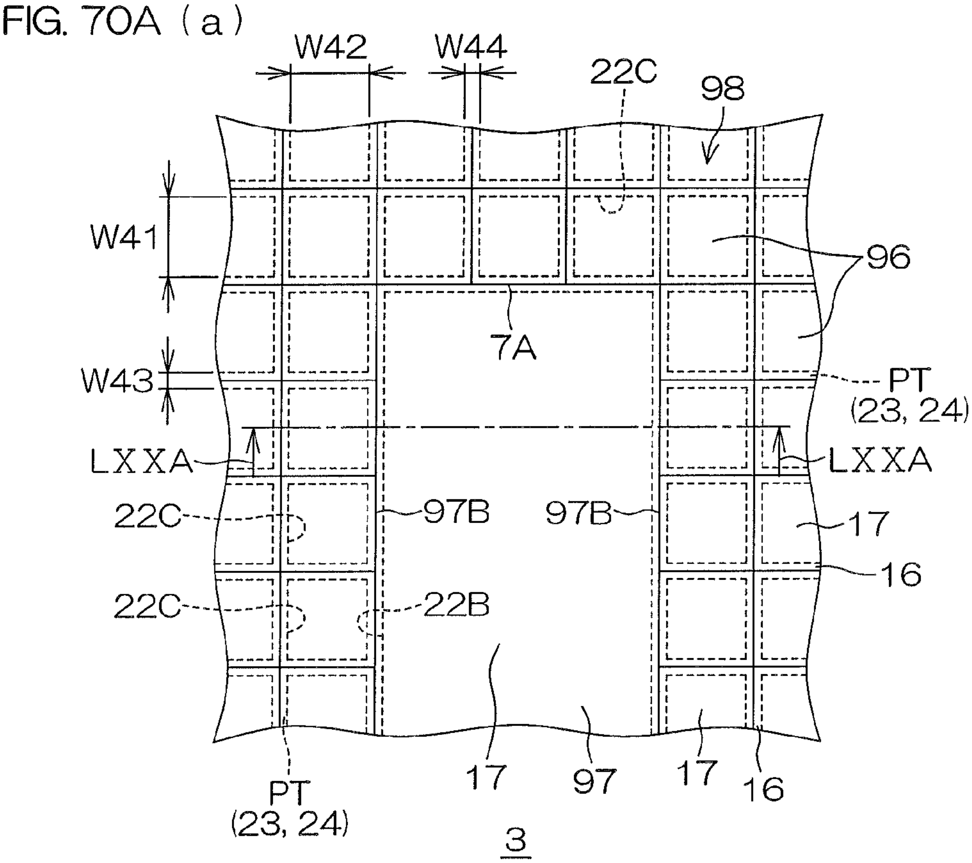
Figure 70A:
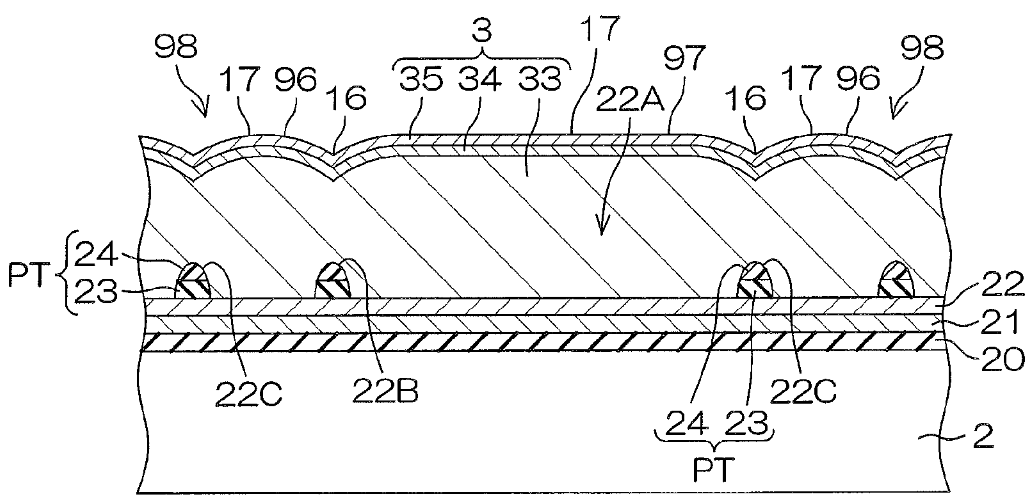

FIG. 70A(a) is a plan view which is drawn by enlarging a portion of the connection electrode shown in FIG. 68. FIG. 70A(b) is a sectional view taken along section line LXXA-LXXA in FIG. 70A(a).

Figure 70B:
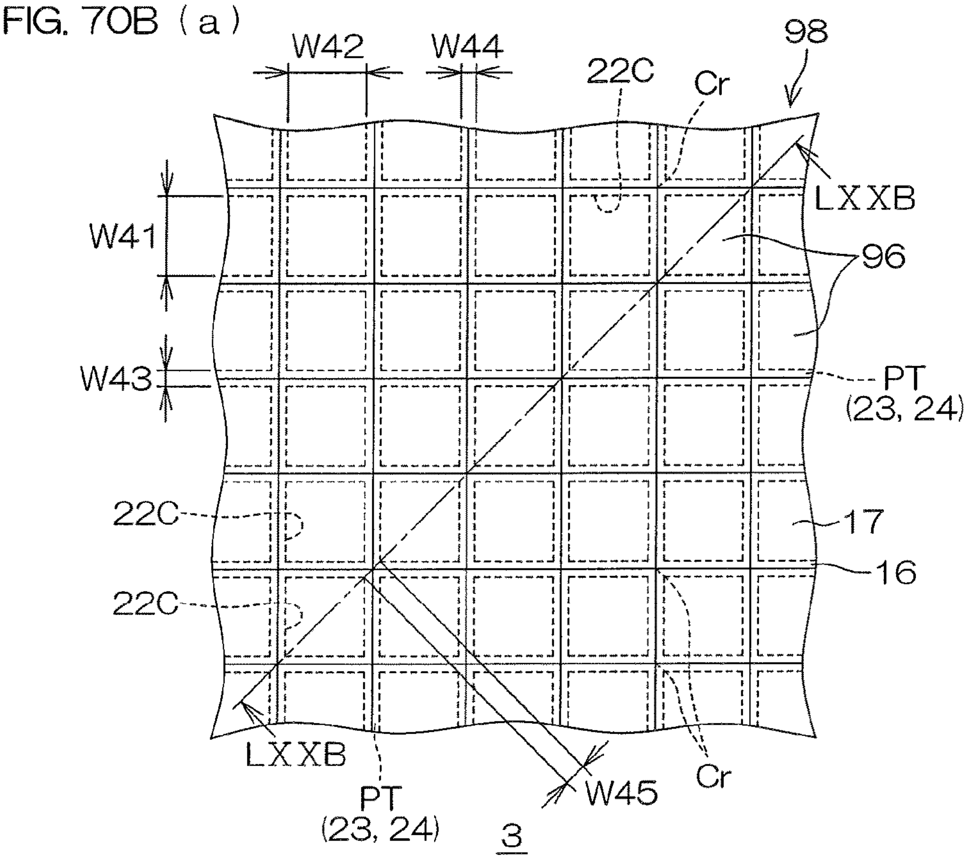
Figure 70B:
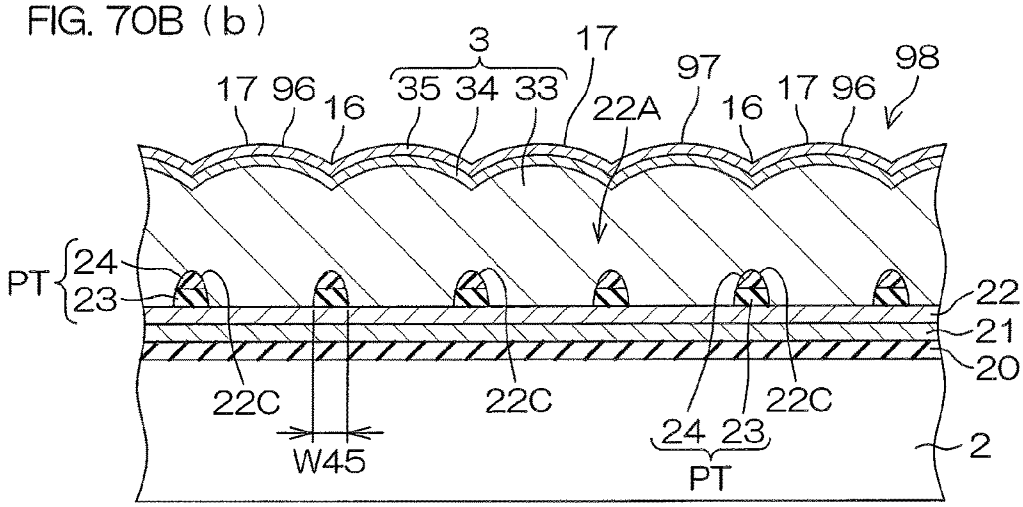

FIG. 70B(a) is a plan view drawn by enlarging a portion of the connection electrode shown in FIG. 68. FIG. 70B(b) is a sectional view taken along section line LXXB-LXXB in FIG. 70B(a).

Figure 71:
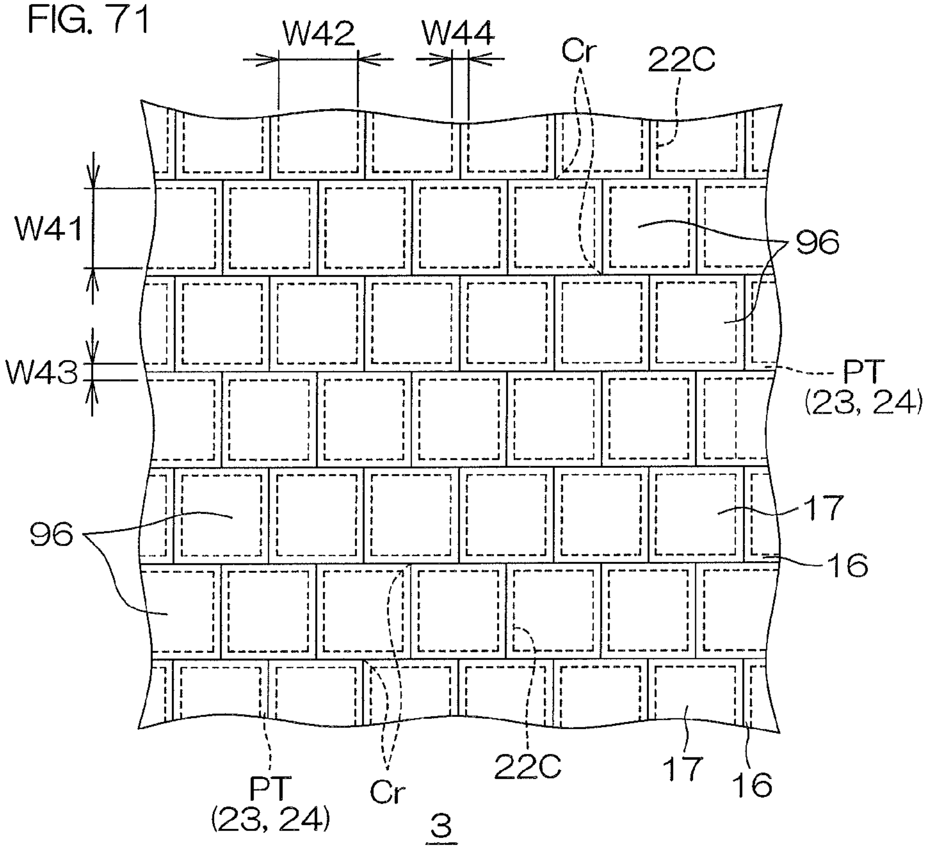

FIG. 71 is a plan view which is drawn by enlarging a portion of the modification example of the connection electrode shown in FIG. 70B.

Figure 72A:
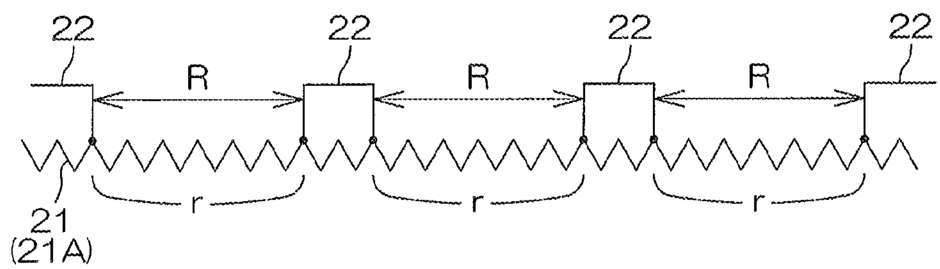
Figure 72B:
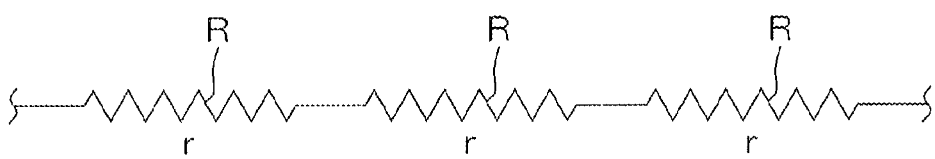
Figure 72C:
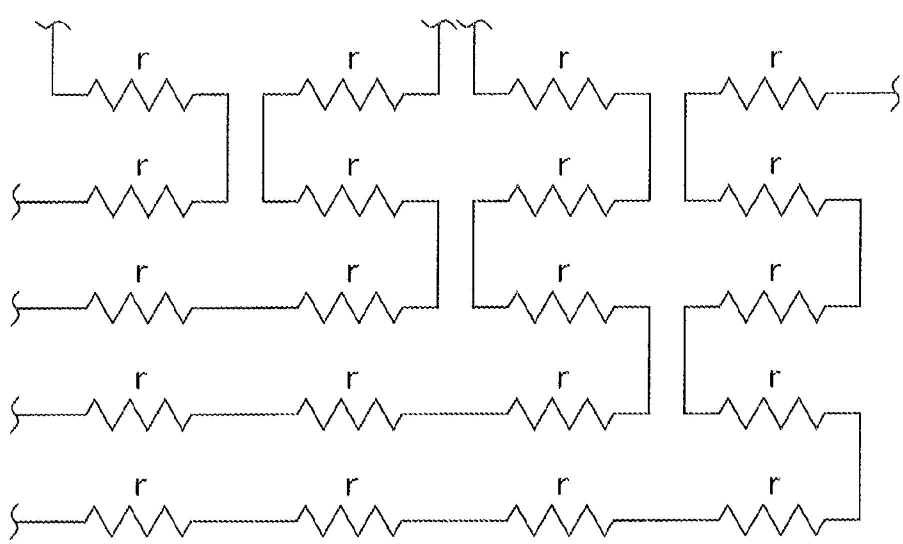

FIGS. 72A-72C are views which show electric characteristics of a resistor body film line and a wiring film by using circuit symbols and electric circuit diagrams.

Figure 73:
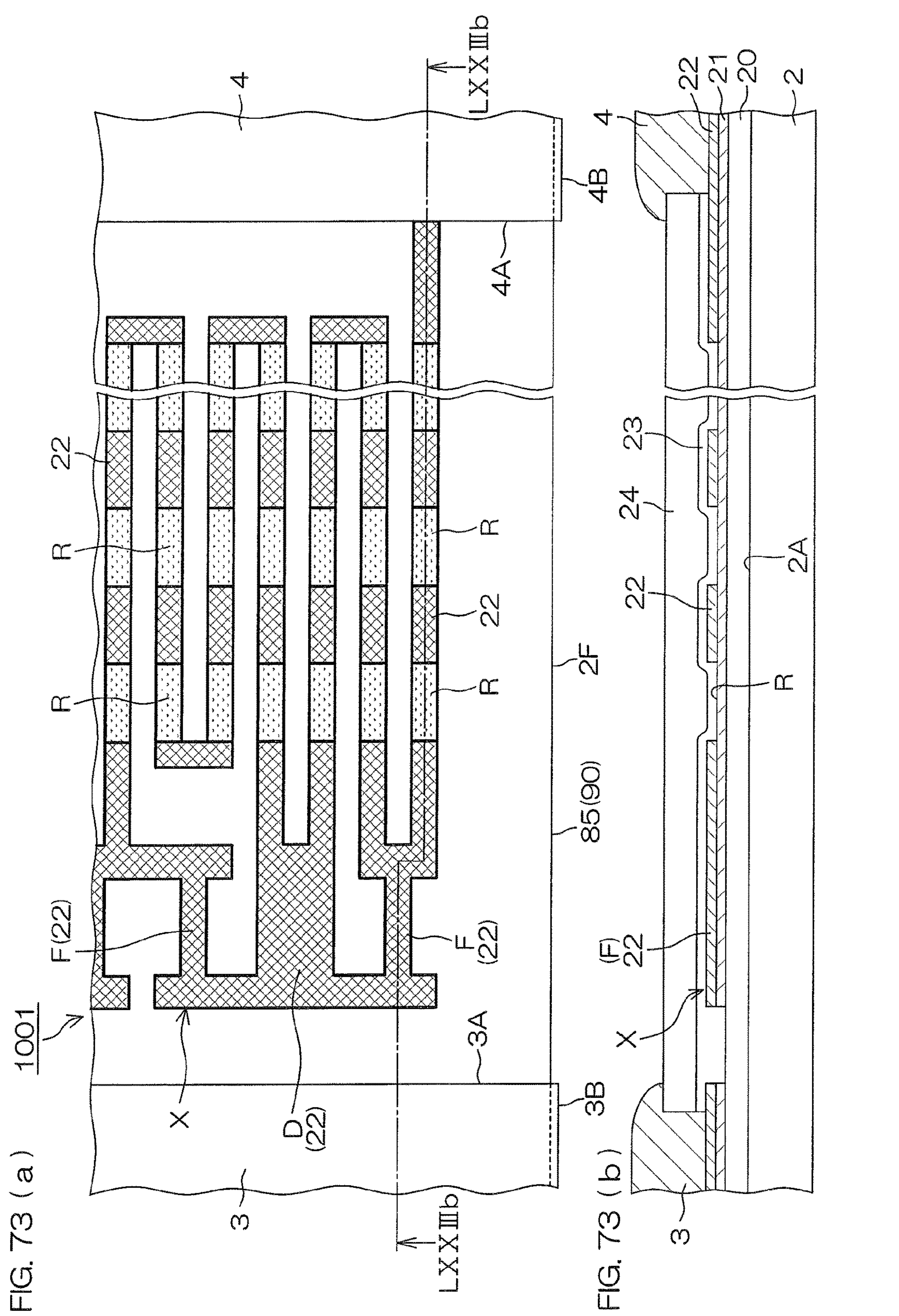

FIG. 73(*a*) is a partially enlarged plan view of a region including fuses drawn by enlarging a portion of the plan view of the chip part shown in FIG. 68. FIG. 73(*b*) is a sectional view taken along section line LXXIIIb-LXXIIIb in FIG. 73(*a*).

Figure 74:
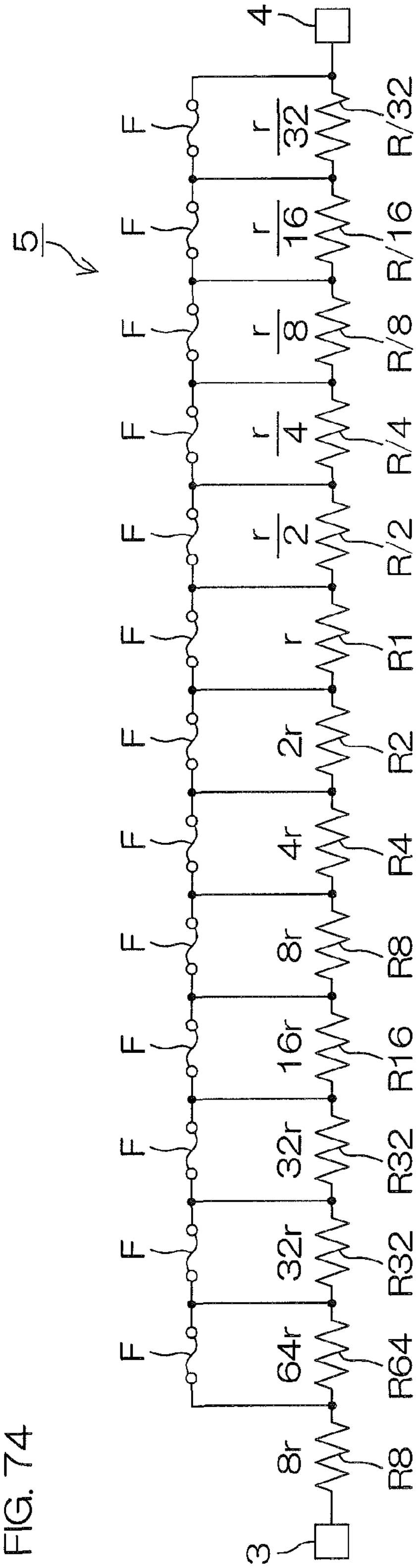

FIG. 74 is one electric circuit diagram which is arranged by the resistor body film line and the wiring film.

Figure 75:
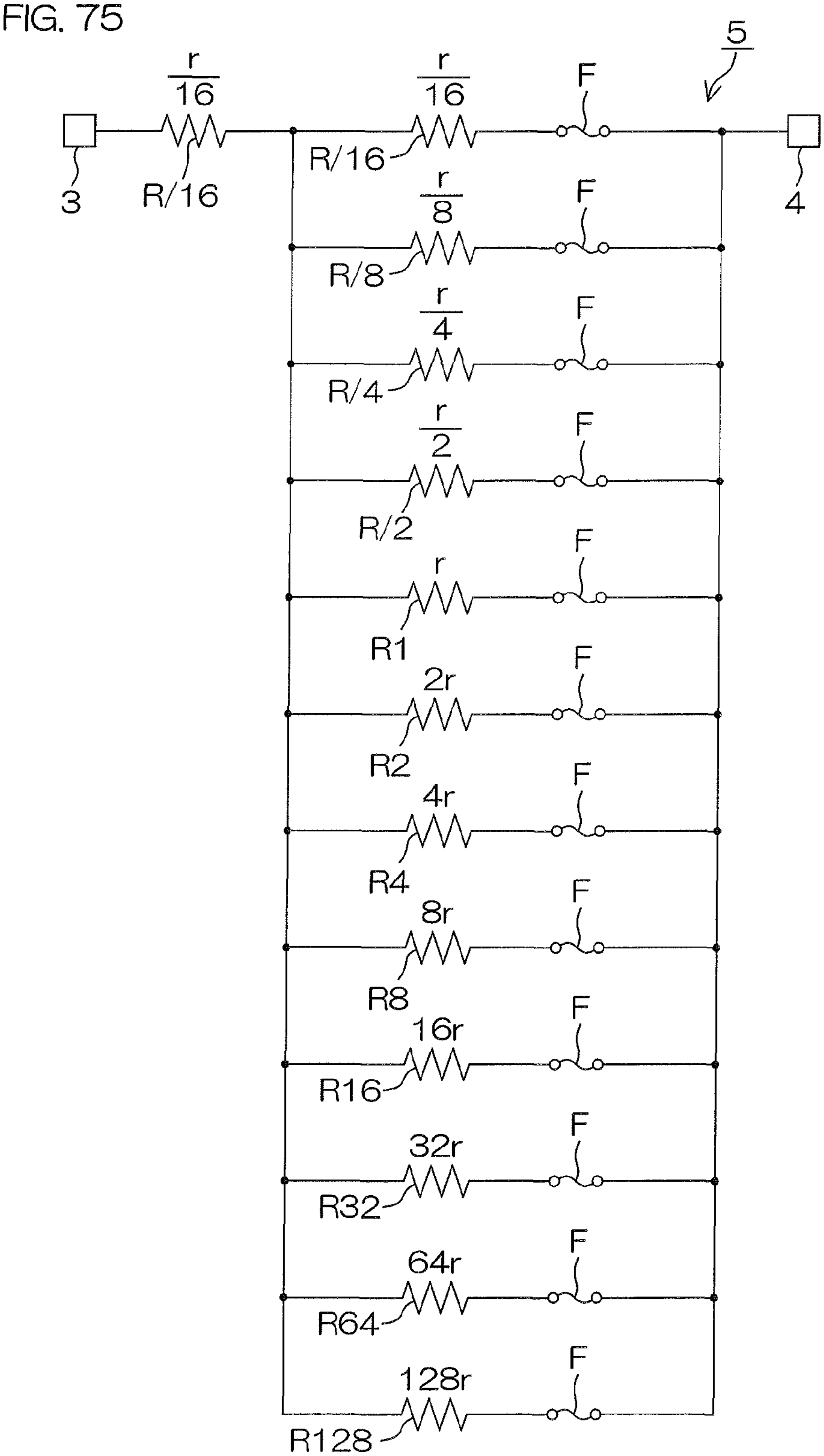

FIG. 75 is another electric circuit diagram which is arranged by the resistor body film line and the wiring film.

Figure 76:
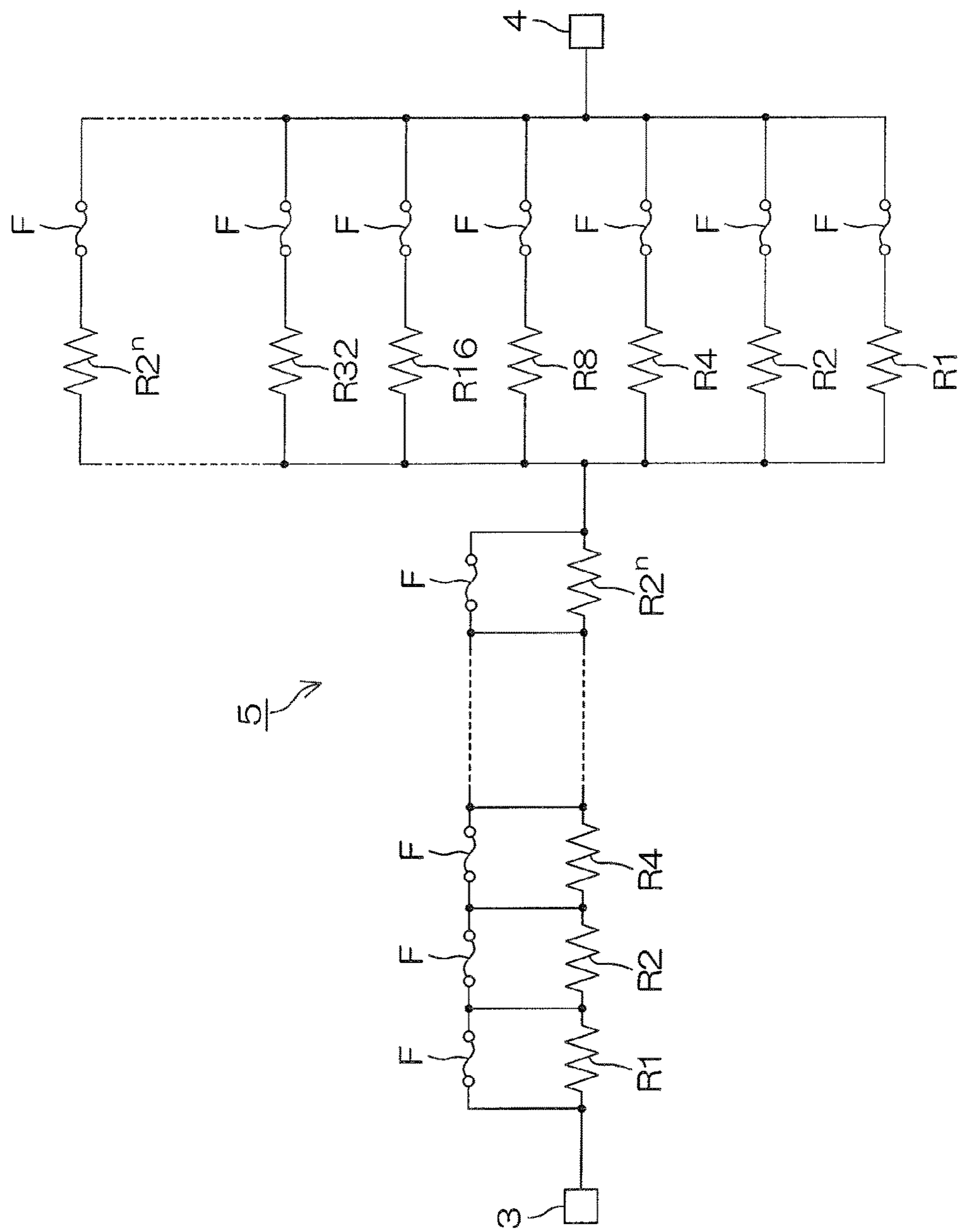

FIG. 76 is still another electric circuit diagram which is arranged by the resistor body film line and the wiring film.

Figure 77:
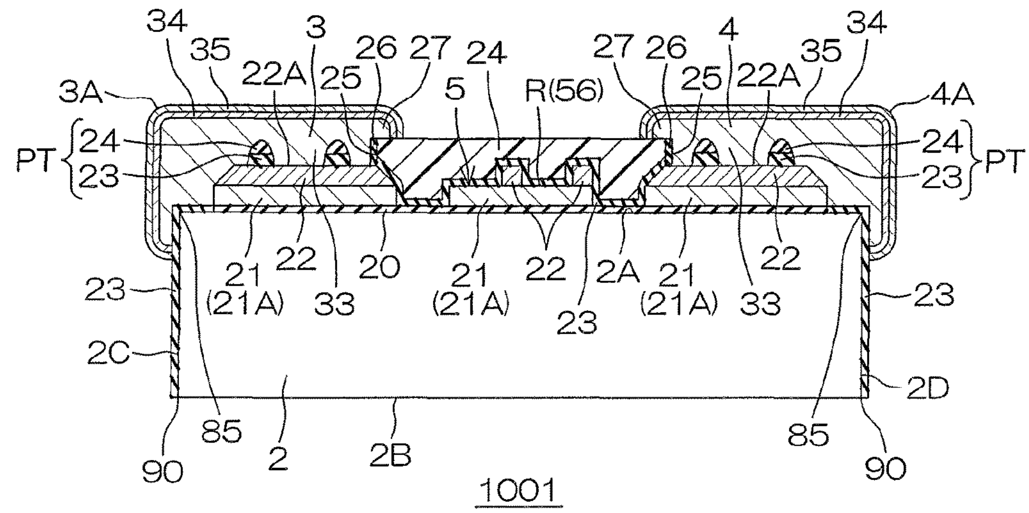

FIG. 77 is a schematic sectional view of the chip part.

Each of FIG. 78A to FIG. 78I is a sectional view which shows a method for manufacturing the chip part shown in FIG. 67.

Figure 78A:
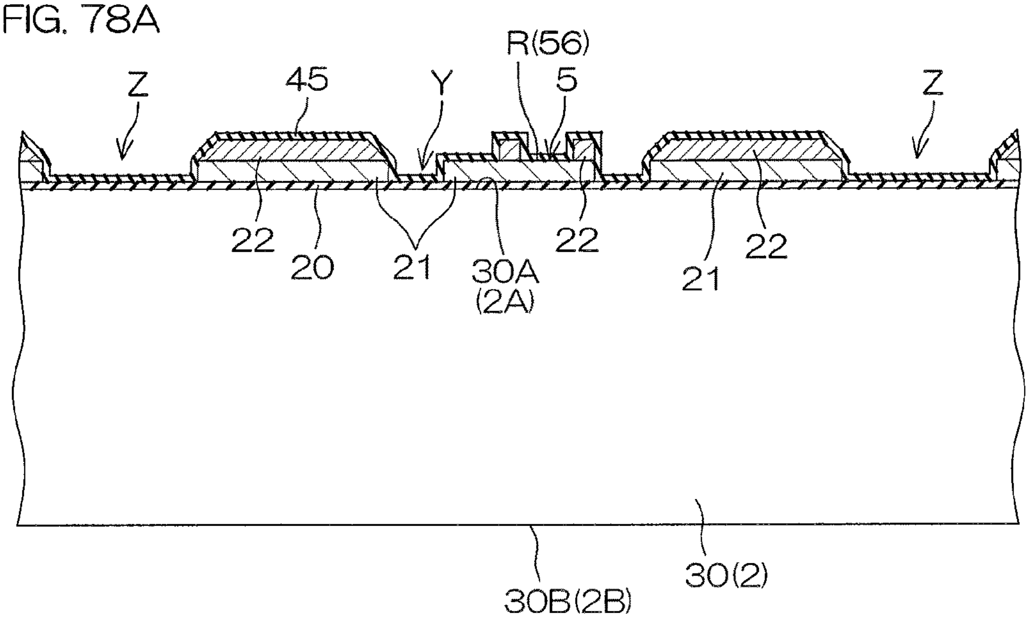
Figure 78B:
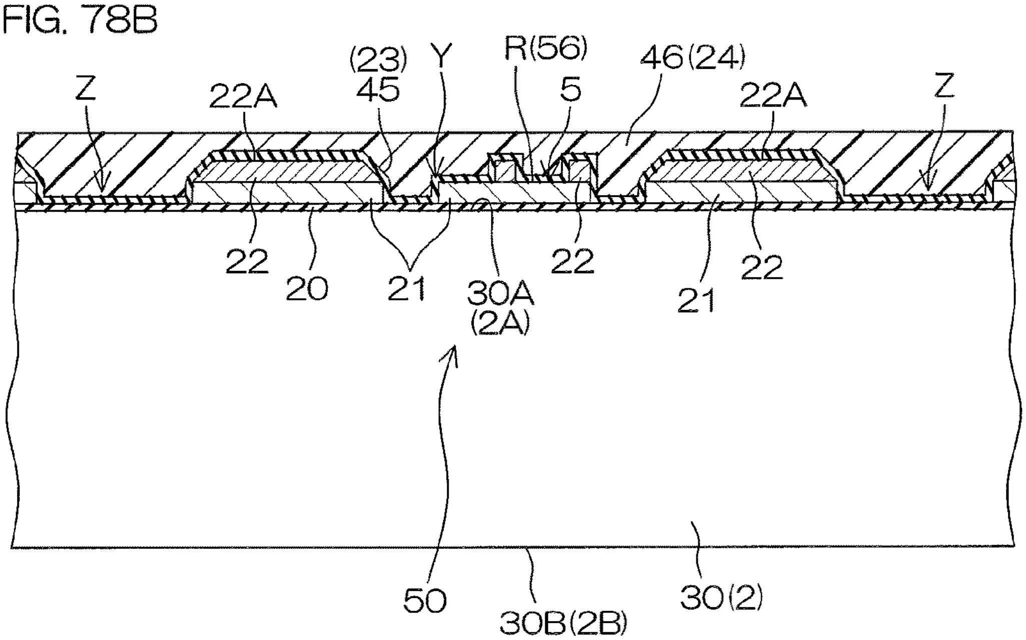
Figure 78C:
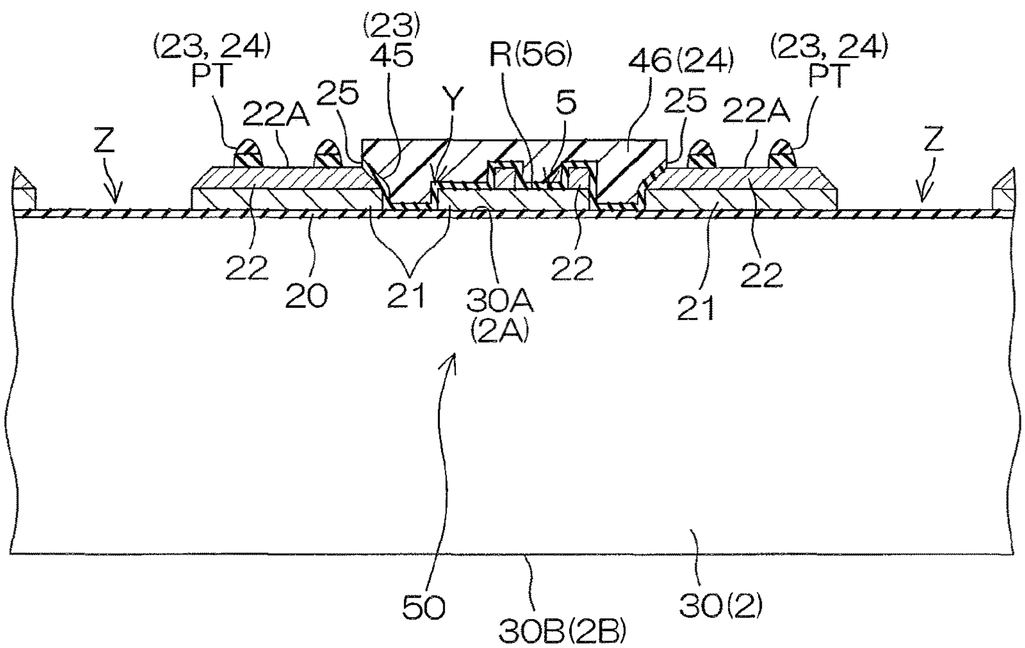
Figure 78D:
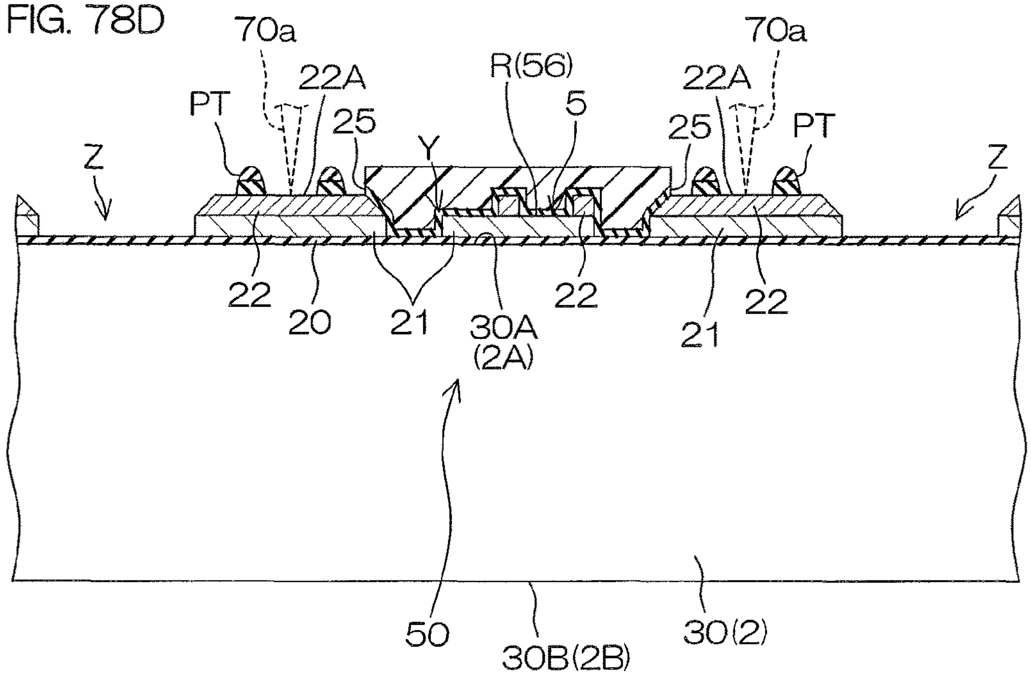
Figure 78E:
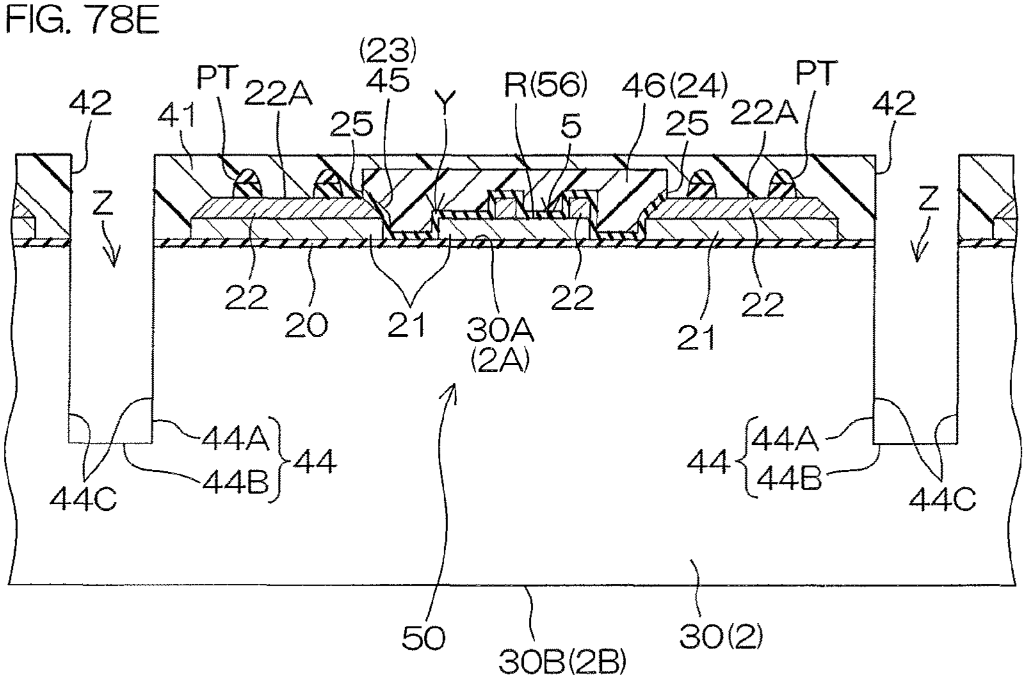
Figure 79:
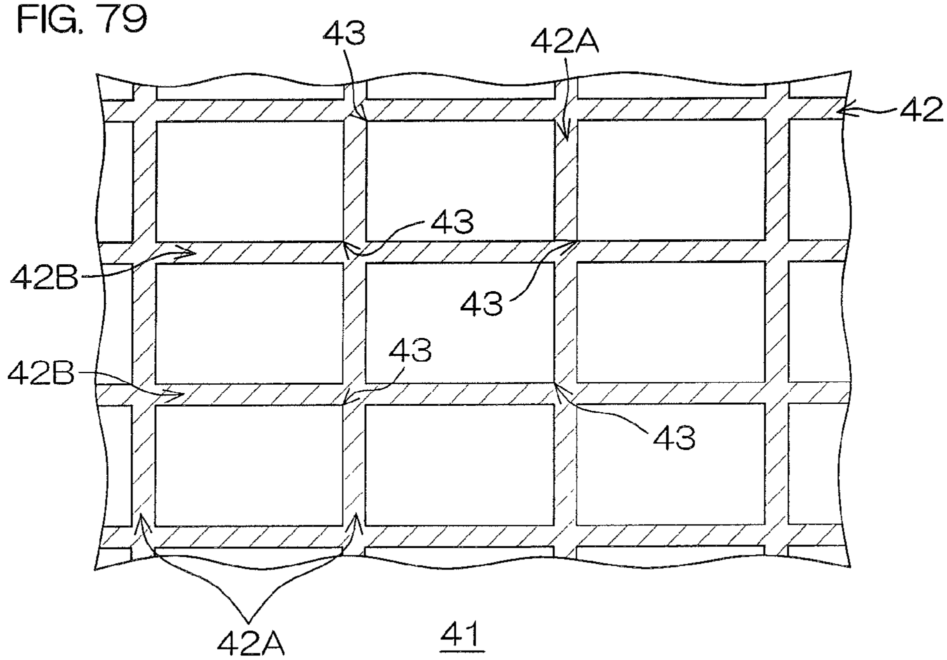

FIG. 79 is a schematic plan view which shows a portion of a resist pattern used for forming a groove in the step of FIG. 78E.

Figure 80:
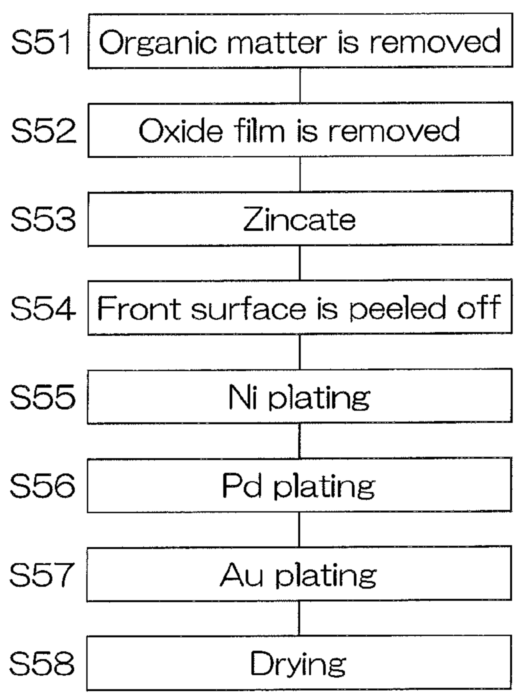

FIG. 80 is a flow chart which describes steps of manufacturing the connection electrode.

Each of FIG. 81A to FIG. 81D is a schematic sectional view which shows a step of recovering the chip part subsequent to the step of FIG. 78I.

Figure 82A:
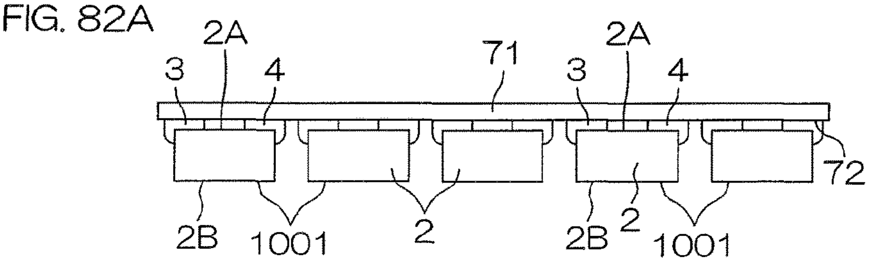
Figure 82B:
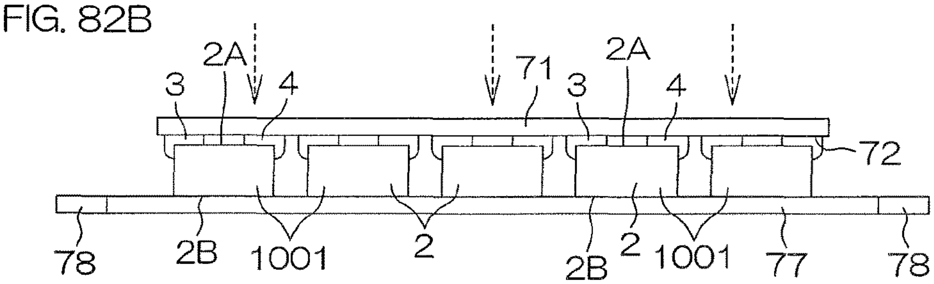
Figure 82C:
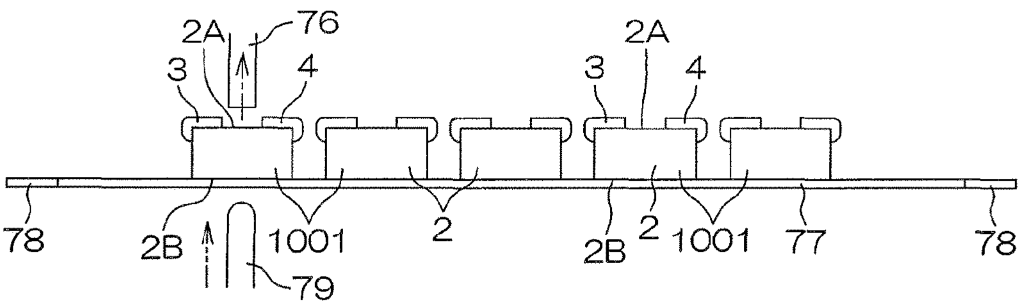

Each of FIG. 82A to FIG. 82C is a schematic sectional view which shows a step of recovering the chip part (the modification example) subsequent to the step of FIG. 78I.

Figure 83:
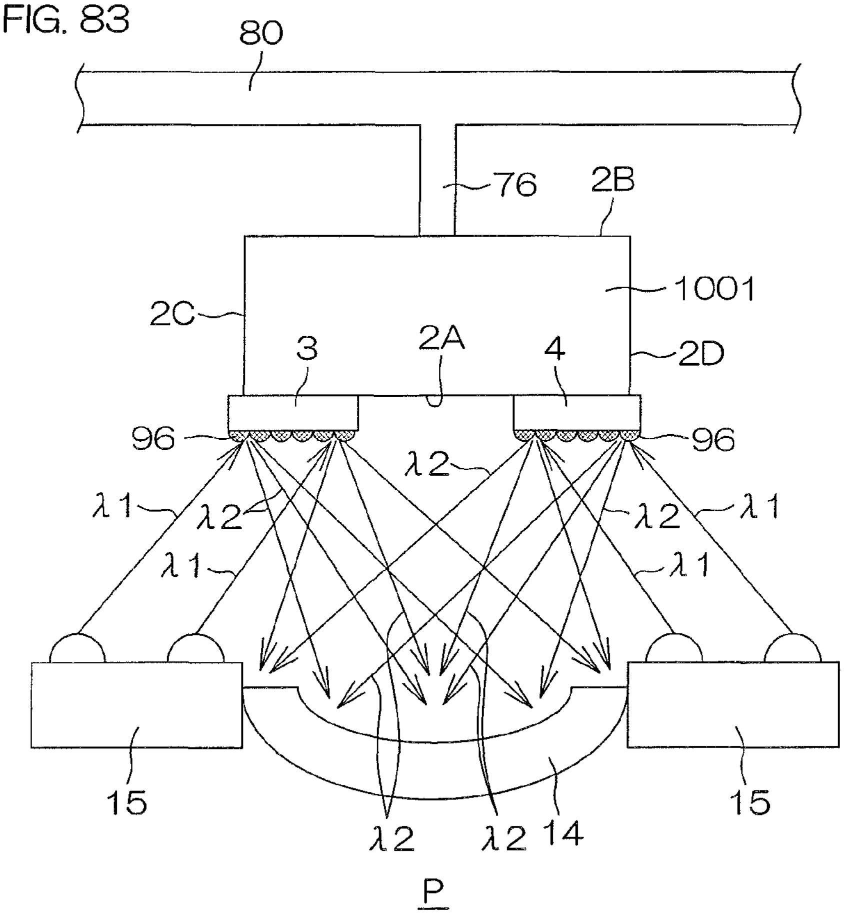

FIG. 83 is a view which describes a front-surface/rear-surface determination step of the chip part of Reference Example 1.

Figure 84:
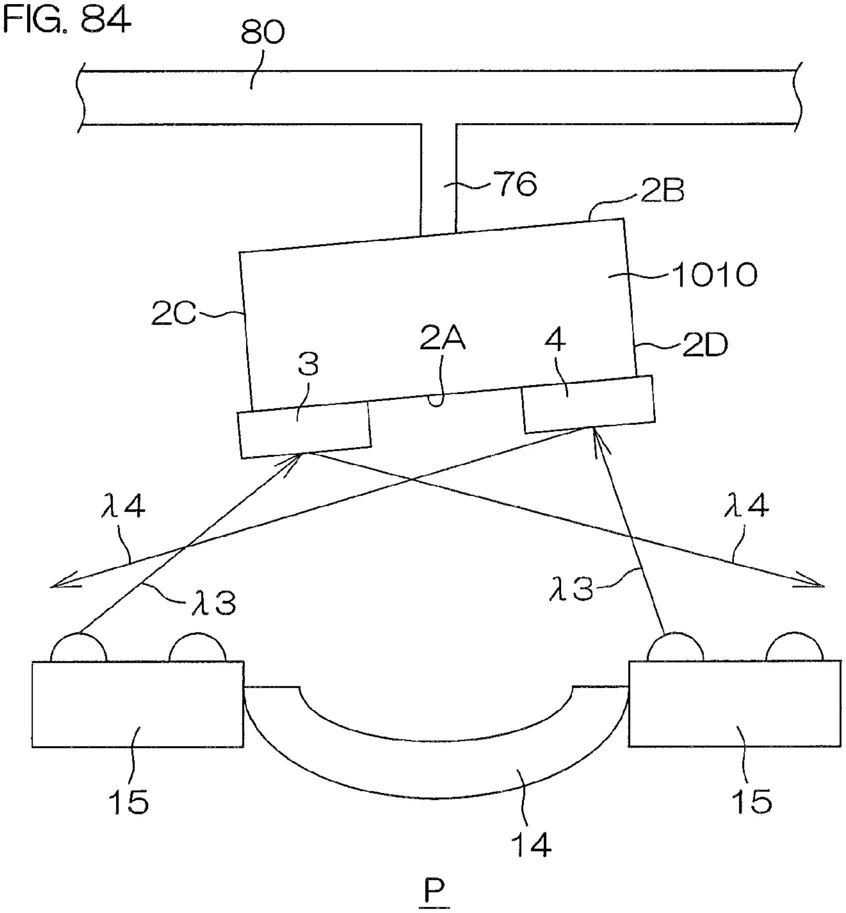

FIG. 84 is a view which describes a front-surface/rear-surface determination step of the chip part of the Reference Example 1.

Figure 85:
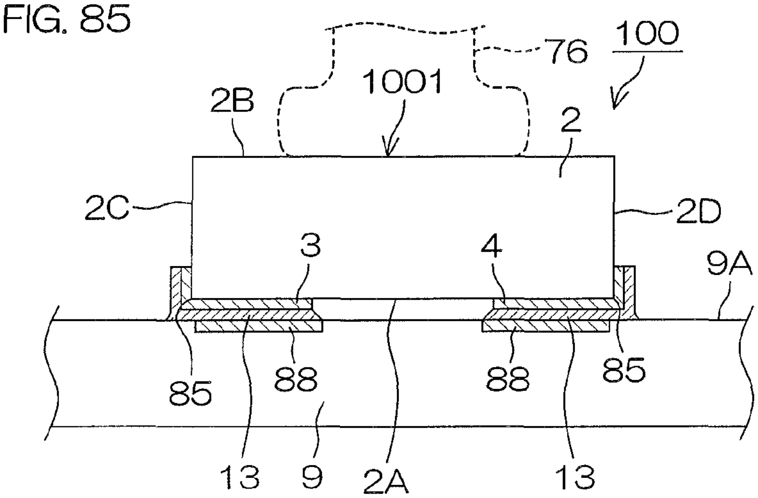

FIG. 85 is a schematic sectional view when the circuit assembly in a state that the chip part has been mounted on a mounting substrate is cut along the long direction of the chip part.

Figure 86:
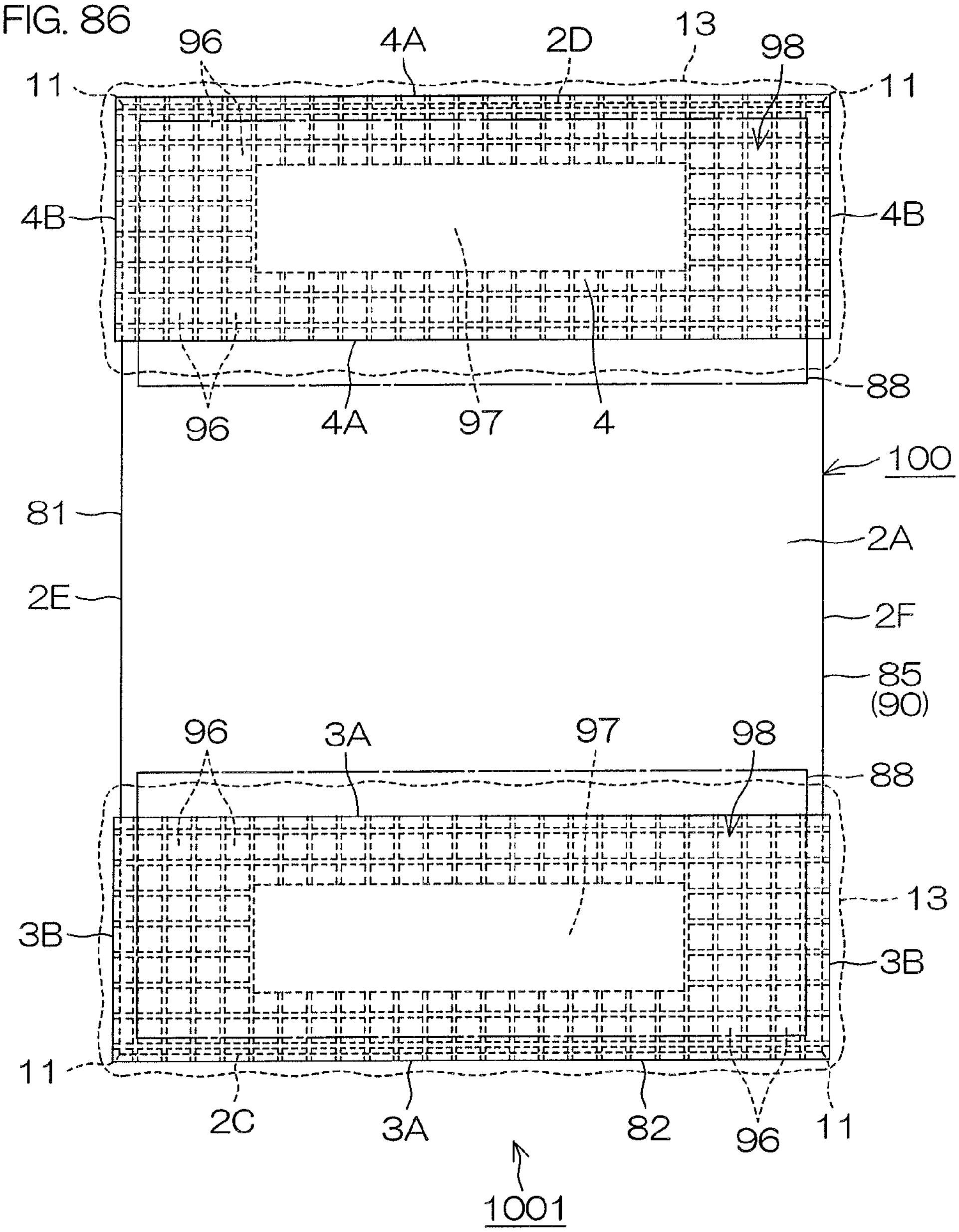

FIG. 86 is a schematic plan view when the chip part mounted on the mounting substrate is viewed from the element forming surface side.

Figure 87:
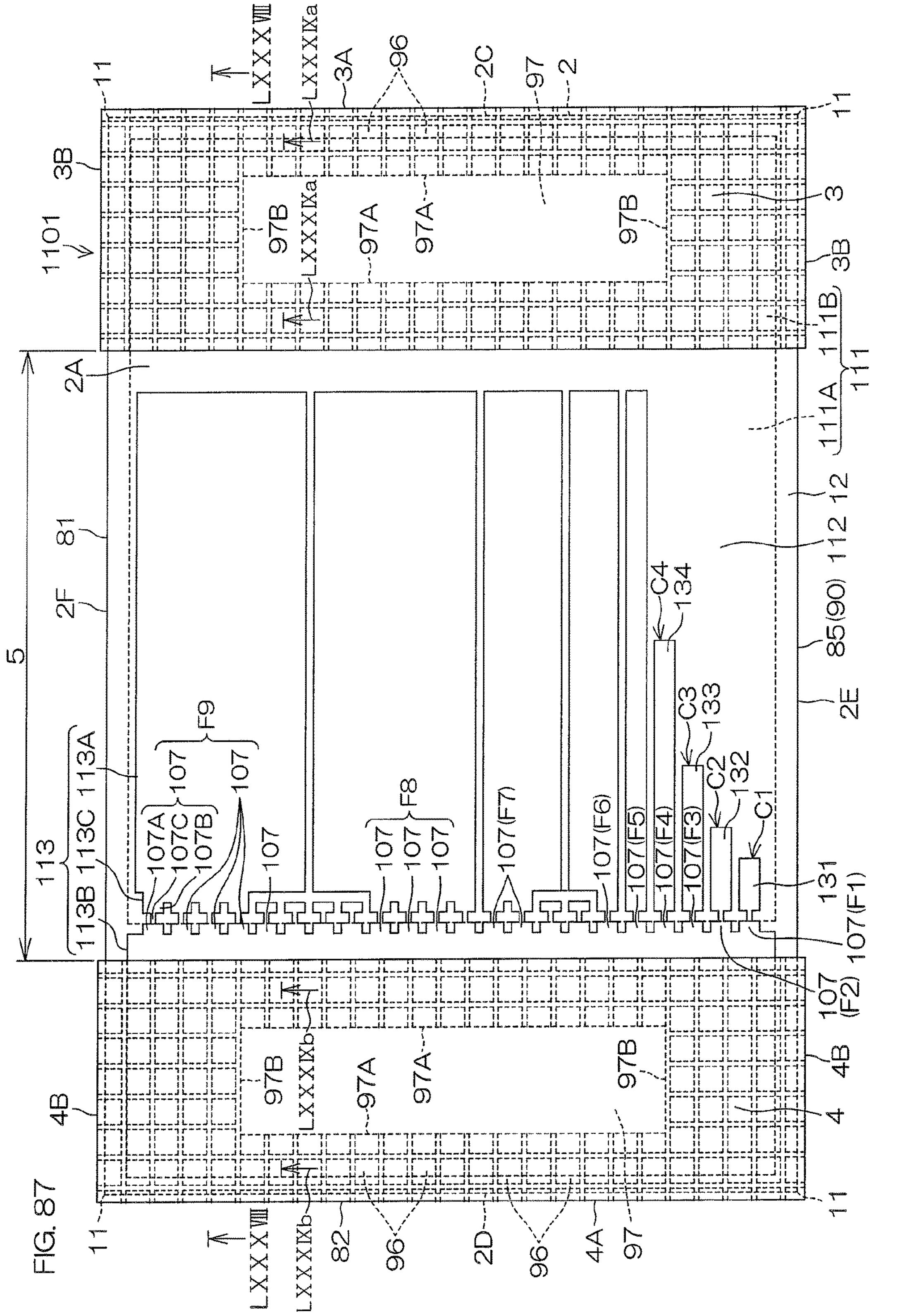

FIG. 87 is a plan view of a chip part of Reference Example 2 or a view which shows a positional relationship between a connection electrode and a circuit element as well as an arrangement of the element in a plan view.

Figure 88:
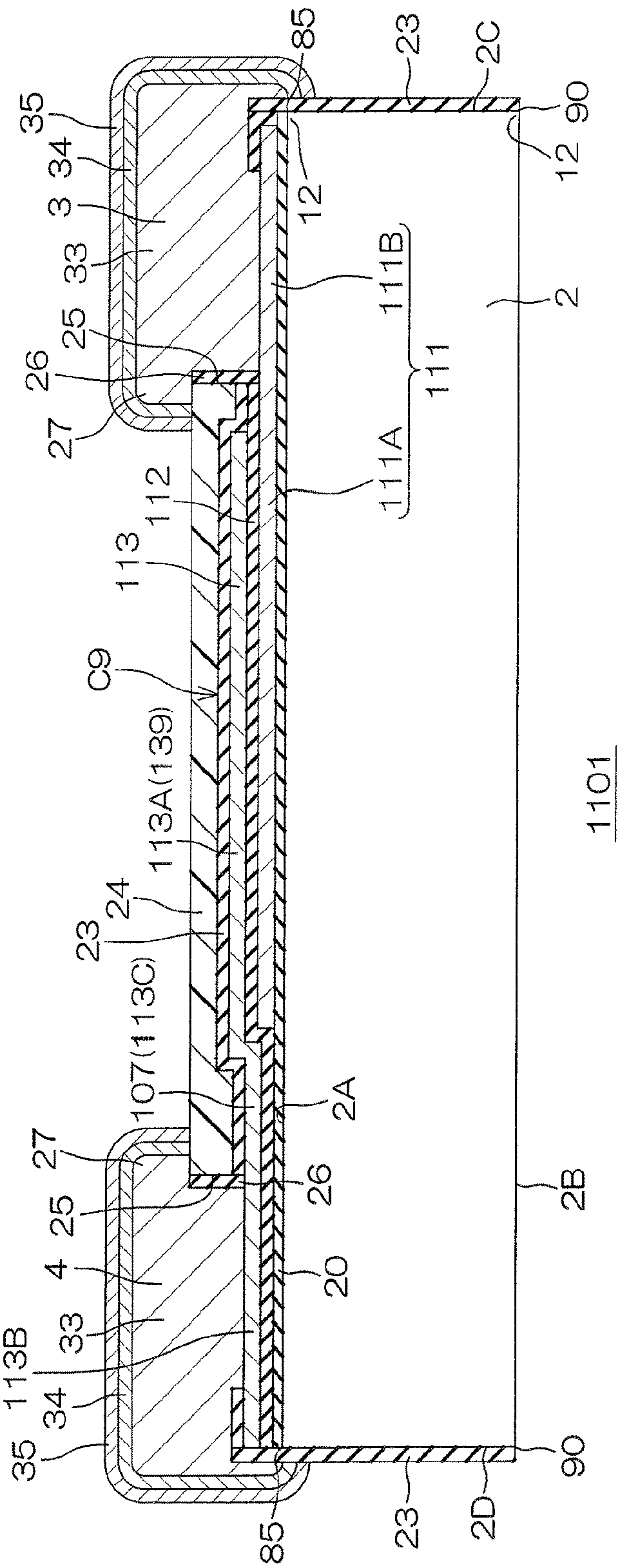

FIG. 88 is a sectional view taken along section line LXXXVIII-LXXXVIII in FIG. 87.

Figure 89A:
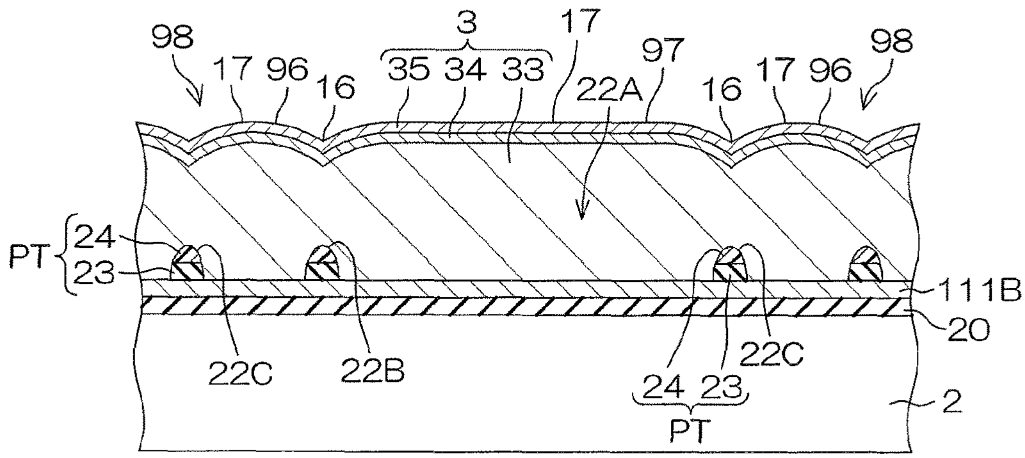

FIG. 89A is a sectional view taken along section line LXXXIXa-LXXXIXa in FIG. 87.

Figure 89B:
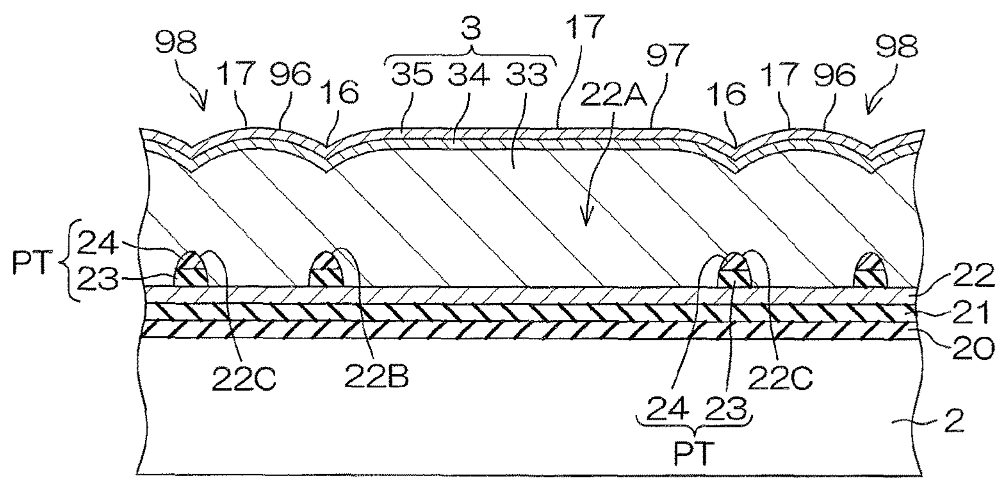

FIG. 89B is a sectional view taken along section line LXXXIXb-LXXXIXb in FIG. 87.

Figure 90:
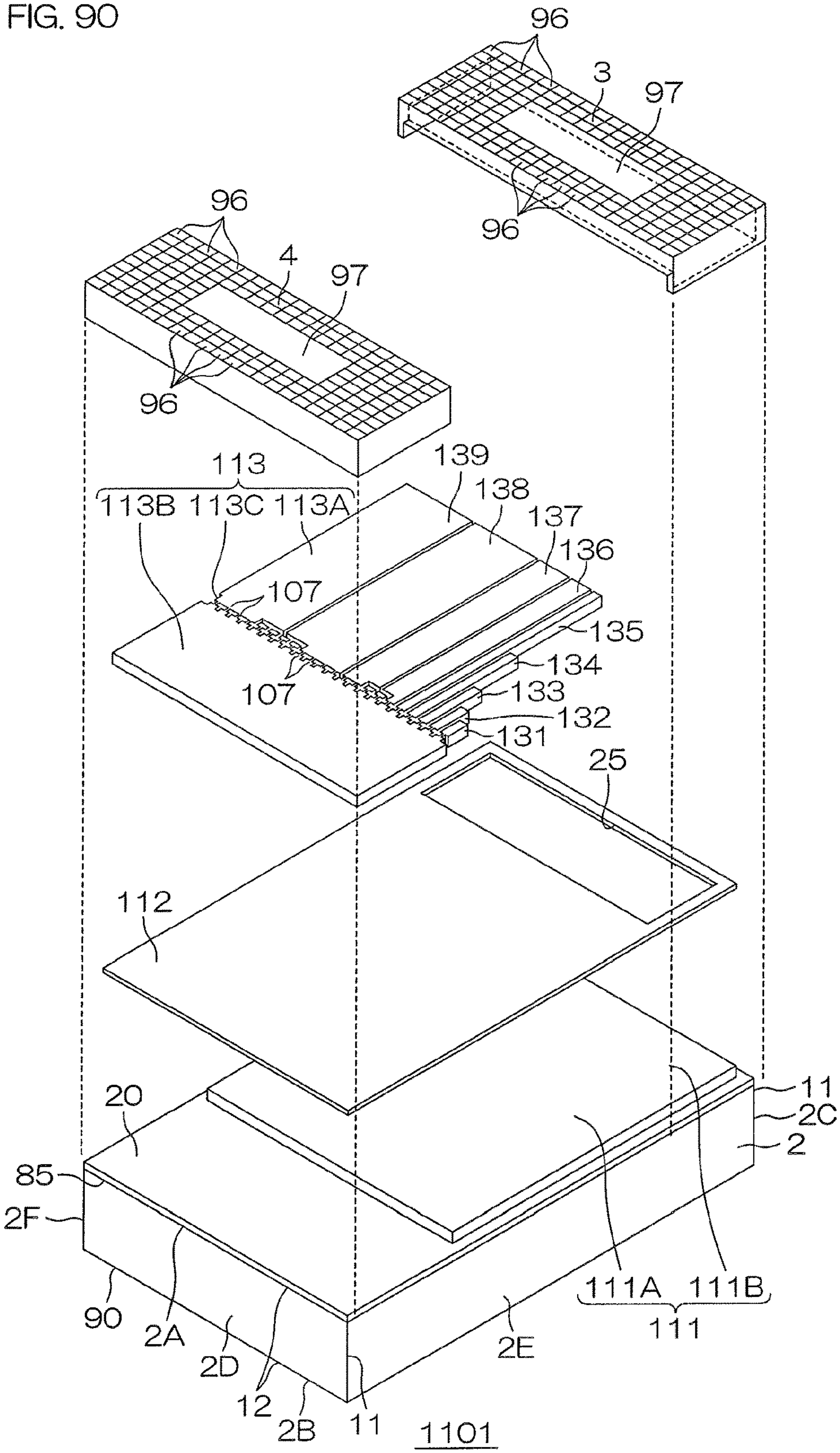

FIG. 90 is an exploded perspective view which shows an arrangement of a portion of the chip part separated.

Figure 91:
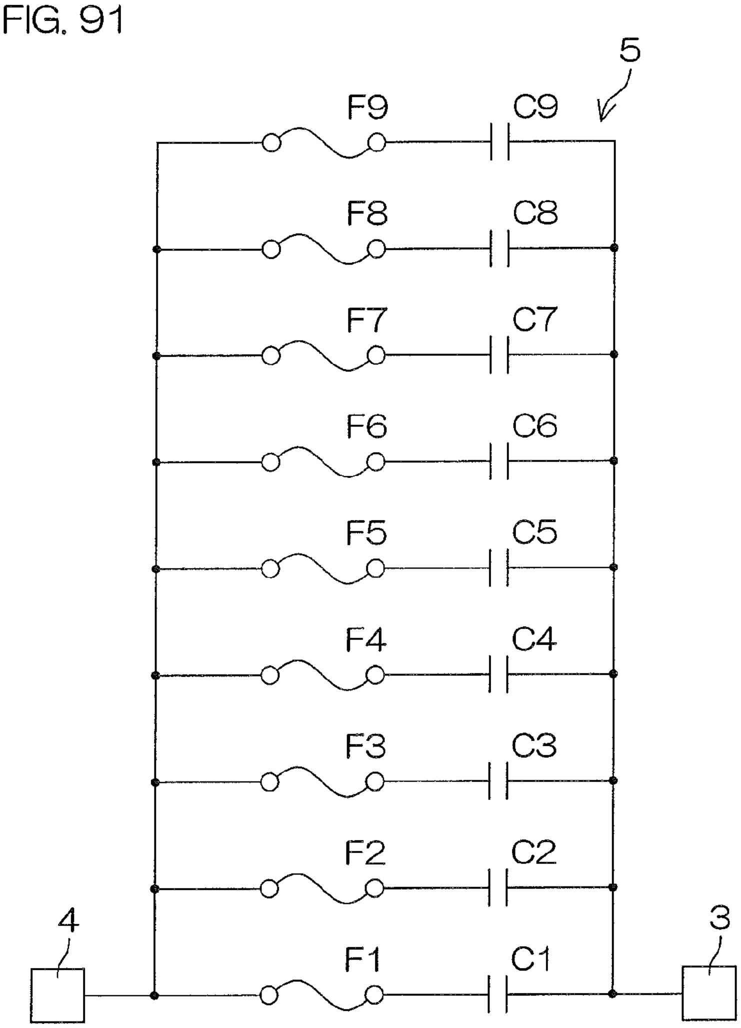

FIG. 91 is a circuit diagram which shows an electrical arrangement of the interior of the chip part.

Figure 92:
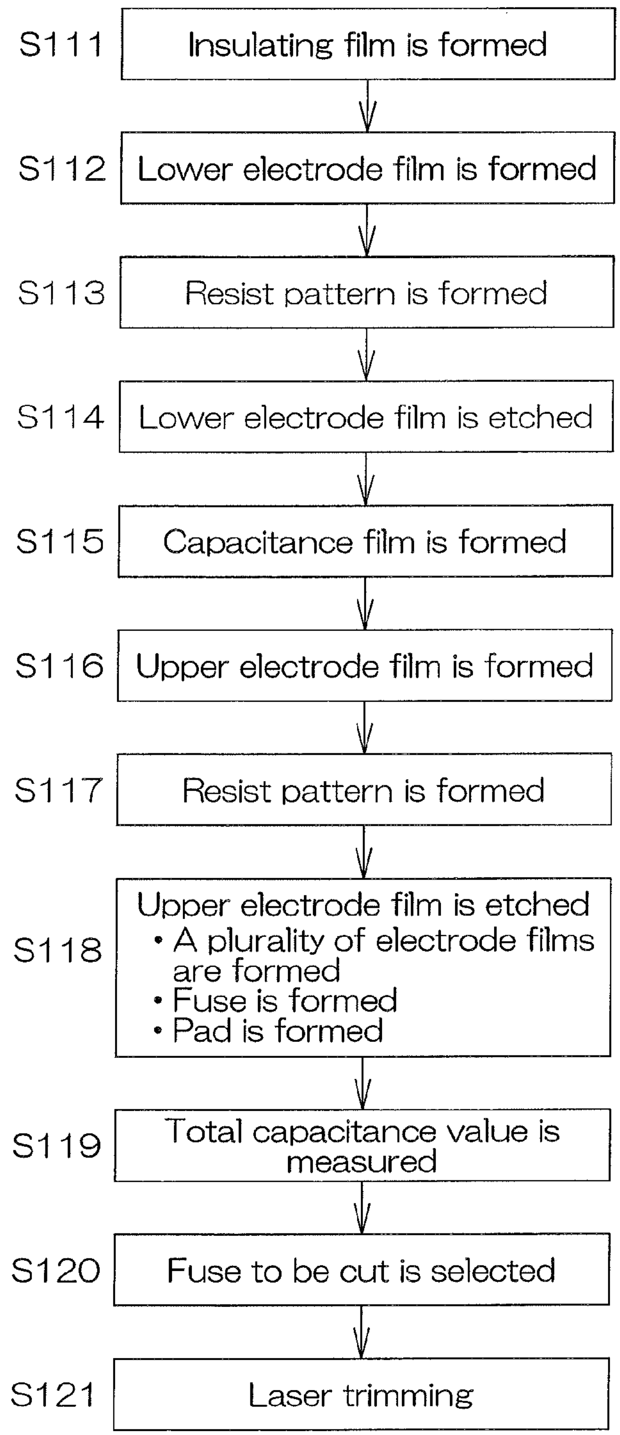

FIG. 92 is a flow chart which describes one example of steps of manufacturing the chip part shown in FIG. 87.

Figure 93:
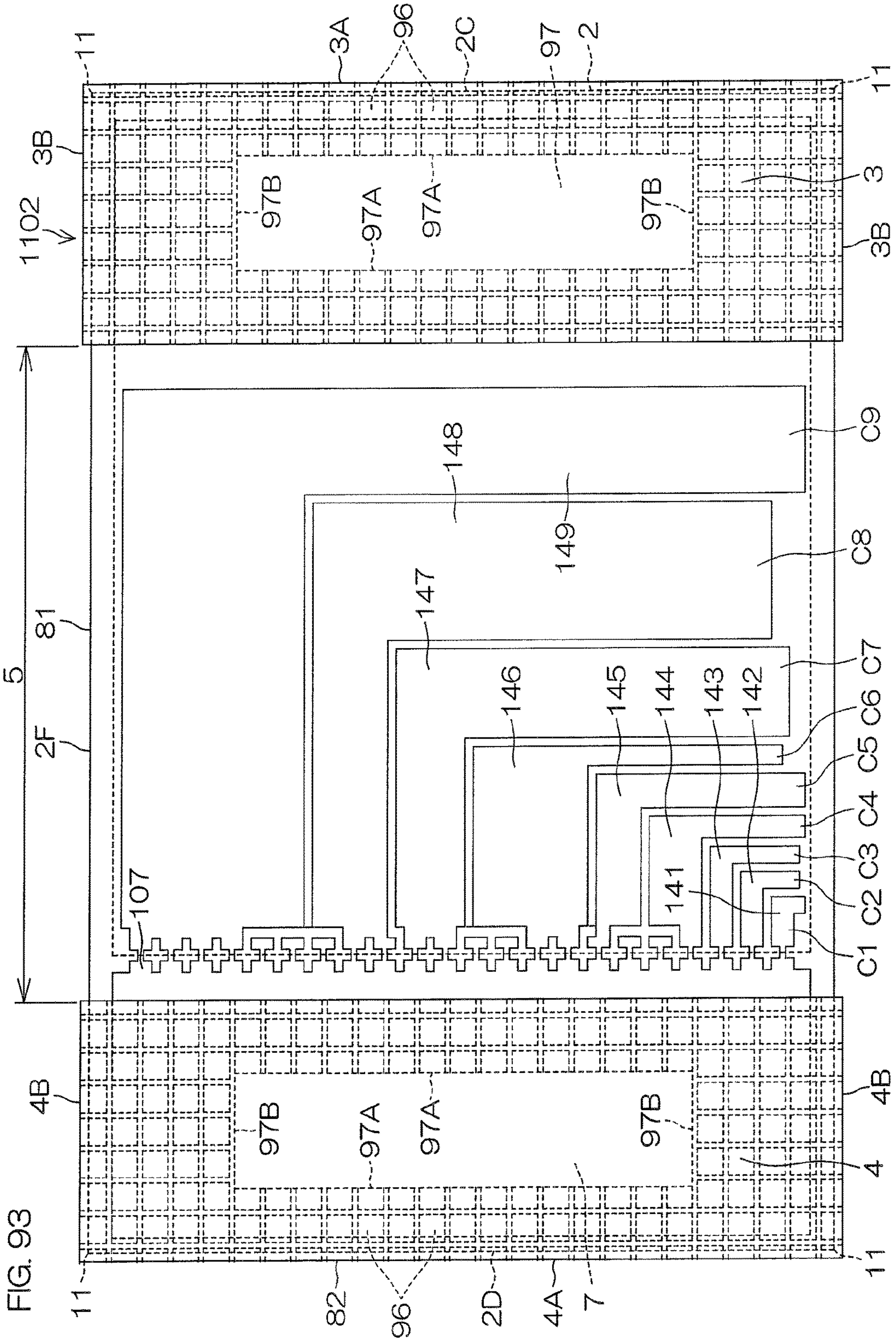

FIG. 93 is a plan view of a chip part of Reference Example 3 or a view which shows a positional relationship between a connection electrode and a circuit element as well as an arrangement of the element in a plan view.

Figure 94:
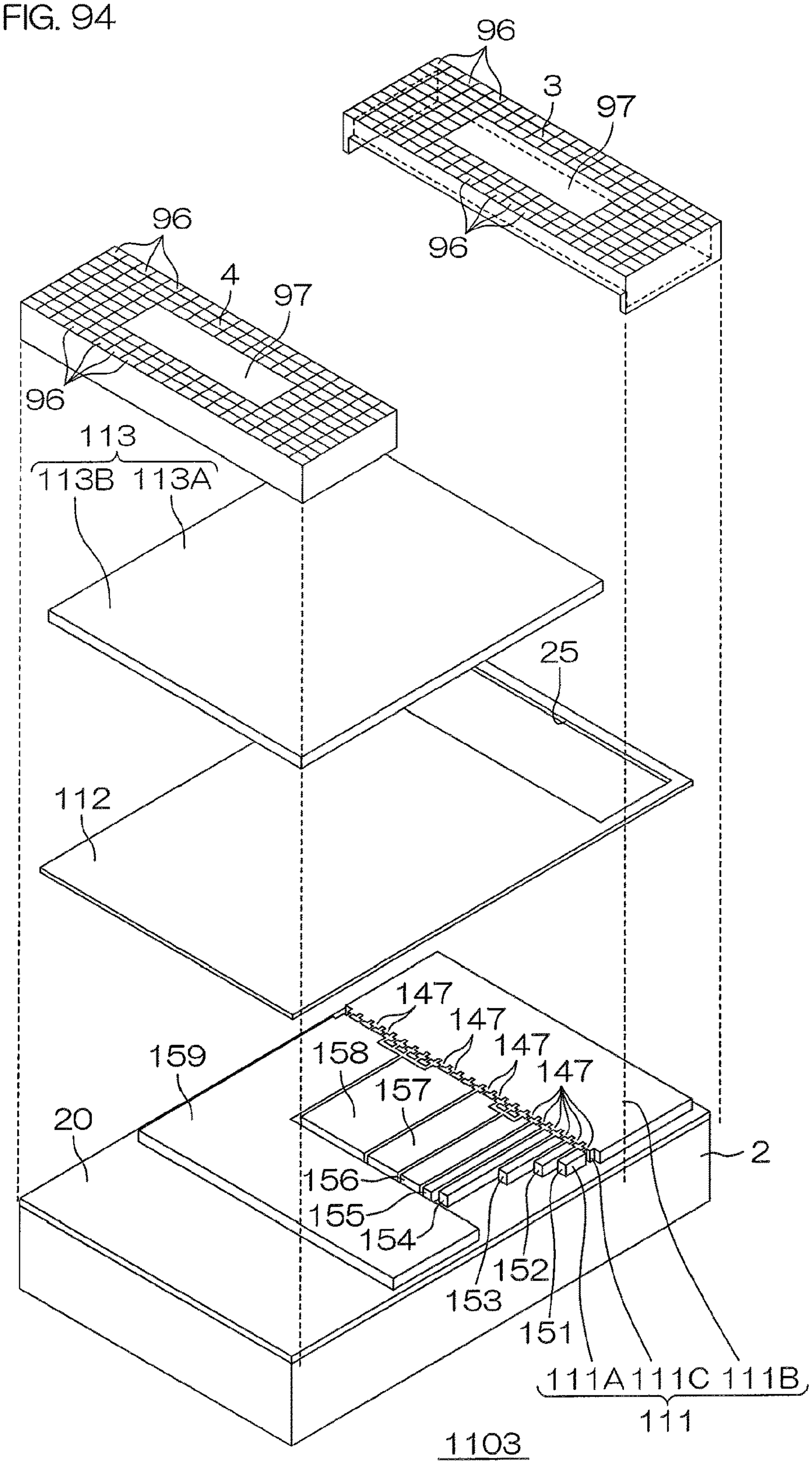

FIG. 94 is a plan view of a chip part of Reference Example 4 or a view which shows a positional relationship between a connection electrode and a circuit element as well as an arrangement of the element in a plan view.

Figure 95:
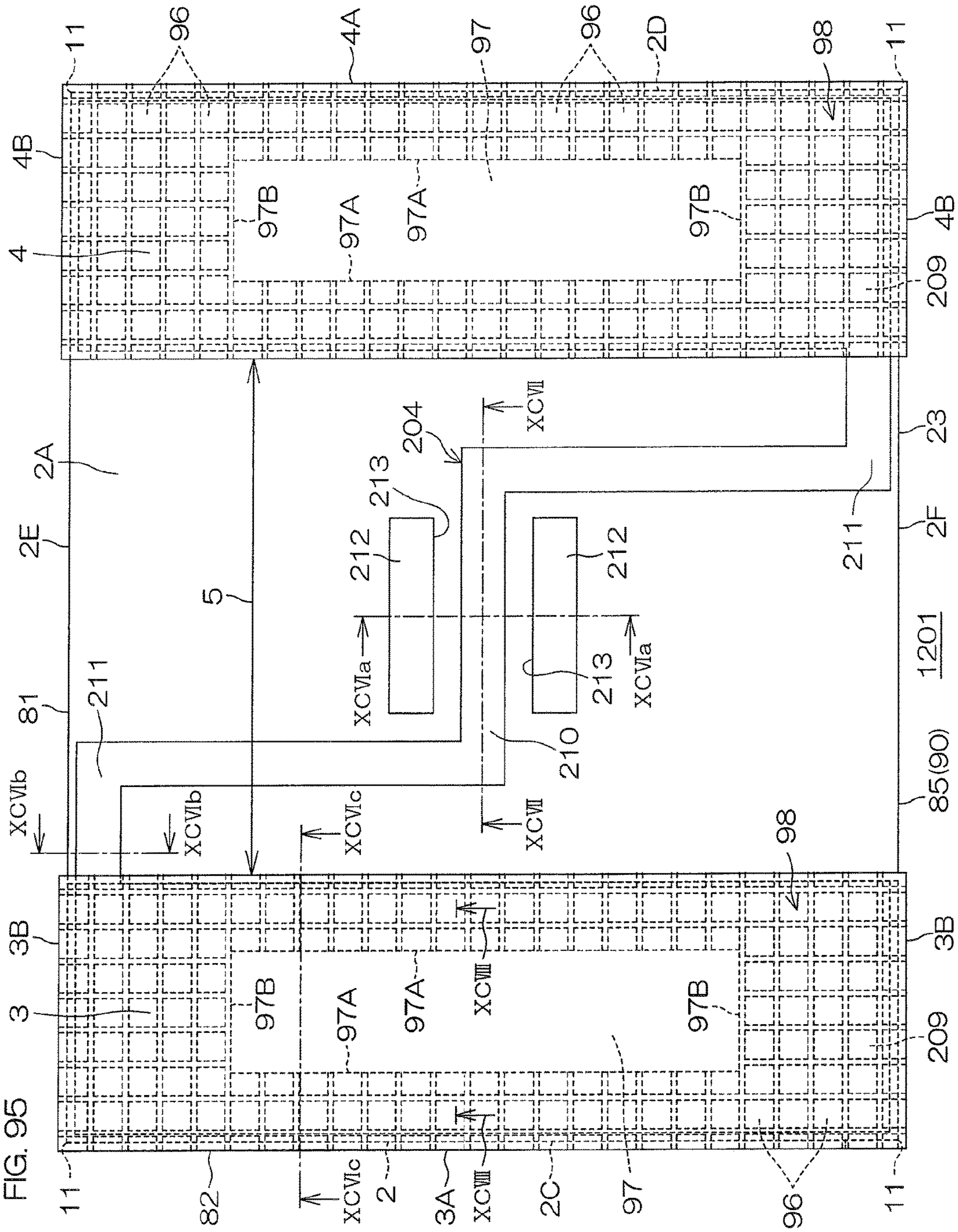

FIG. 95 is a plan view of a chip part of Reference Example 5.

Figure 96:
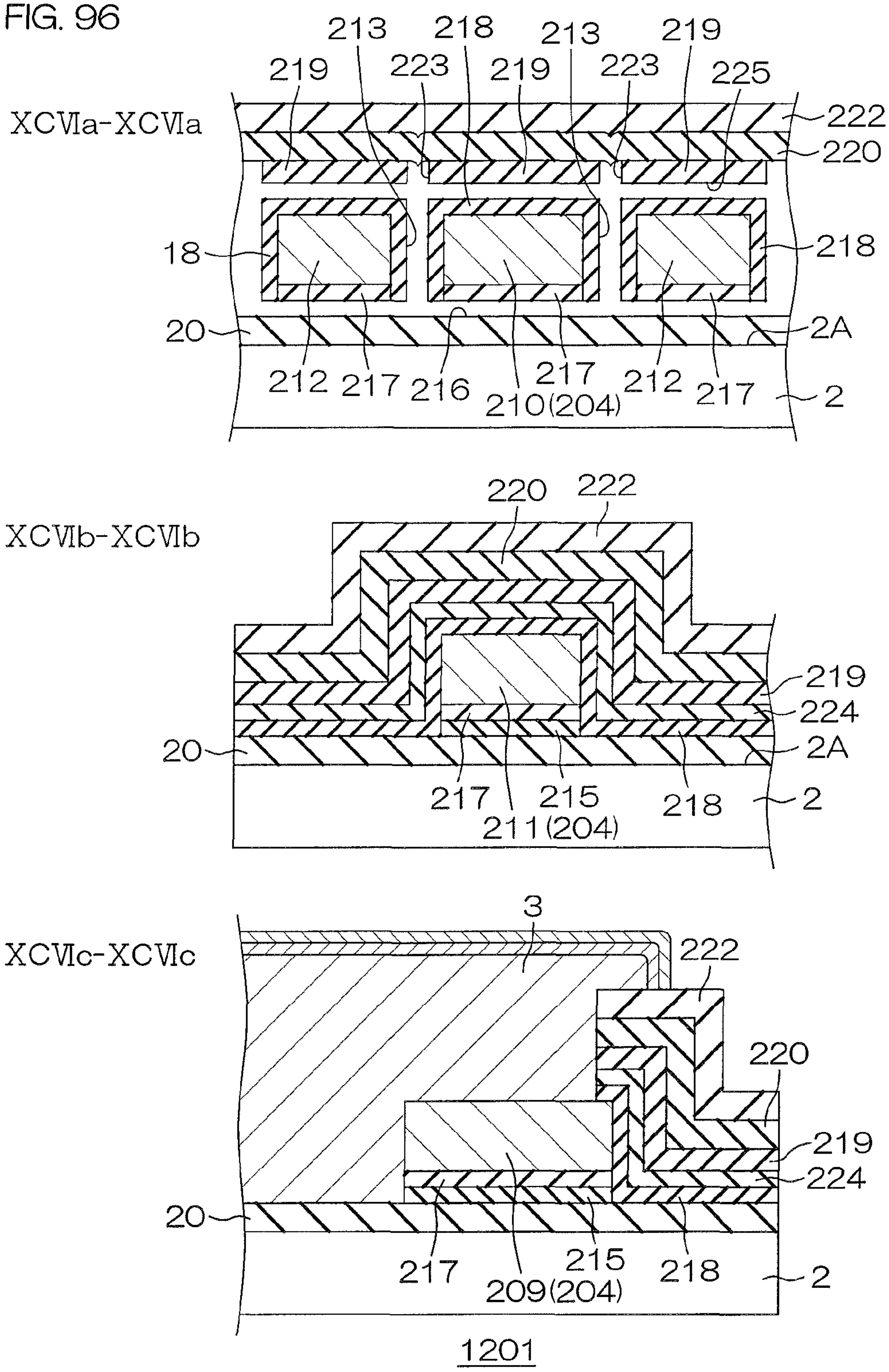

FIG. 96 covers sectional views taken along section line XCVIa-XCVIa of the chip part in FIG. 95, taken along section line XCVIb-XCVIb thereof and taken along section line XCVIc-XCVIc thereof.

Figure 97:
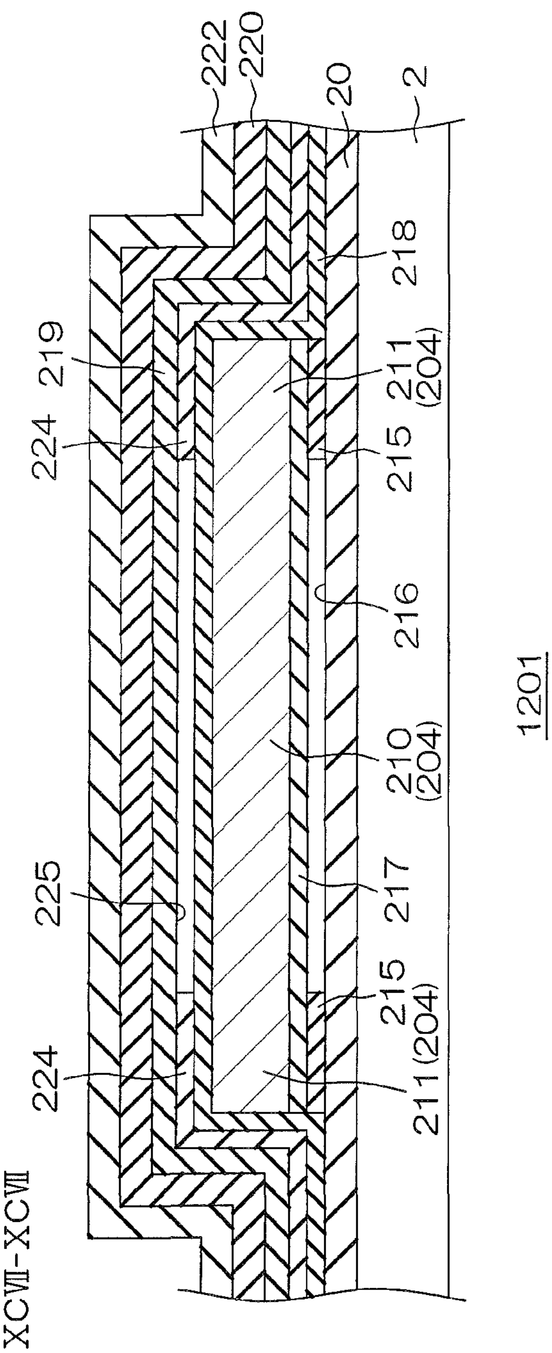

FIG. 97 is a sectional view taken along section line XCVII-XCVII of chip part in FIG. 95.

Figure 98:
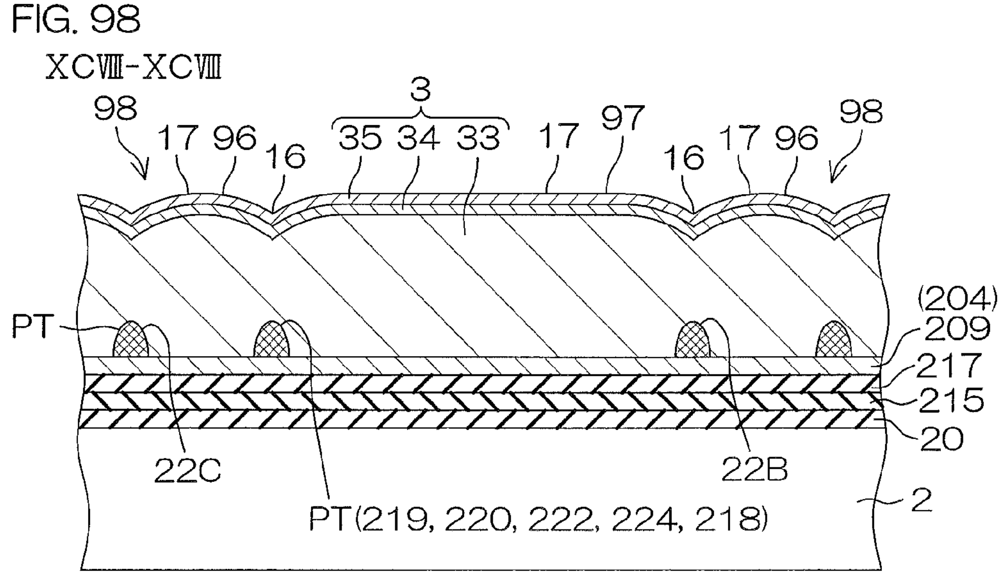

FIG. 98 is a sectional view taken along section line XCVIII-XCVIII of the chip part in FIG. 95.

Each of FIG. 99 to FIG. 105 is a sectional view which describes some of the steps of manufacturing the chip part shown in FIG. 95.

Figure 106:
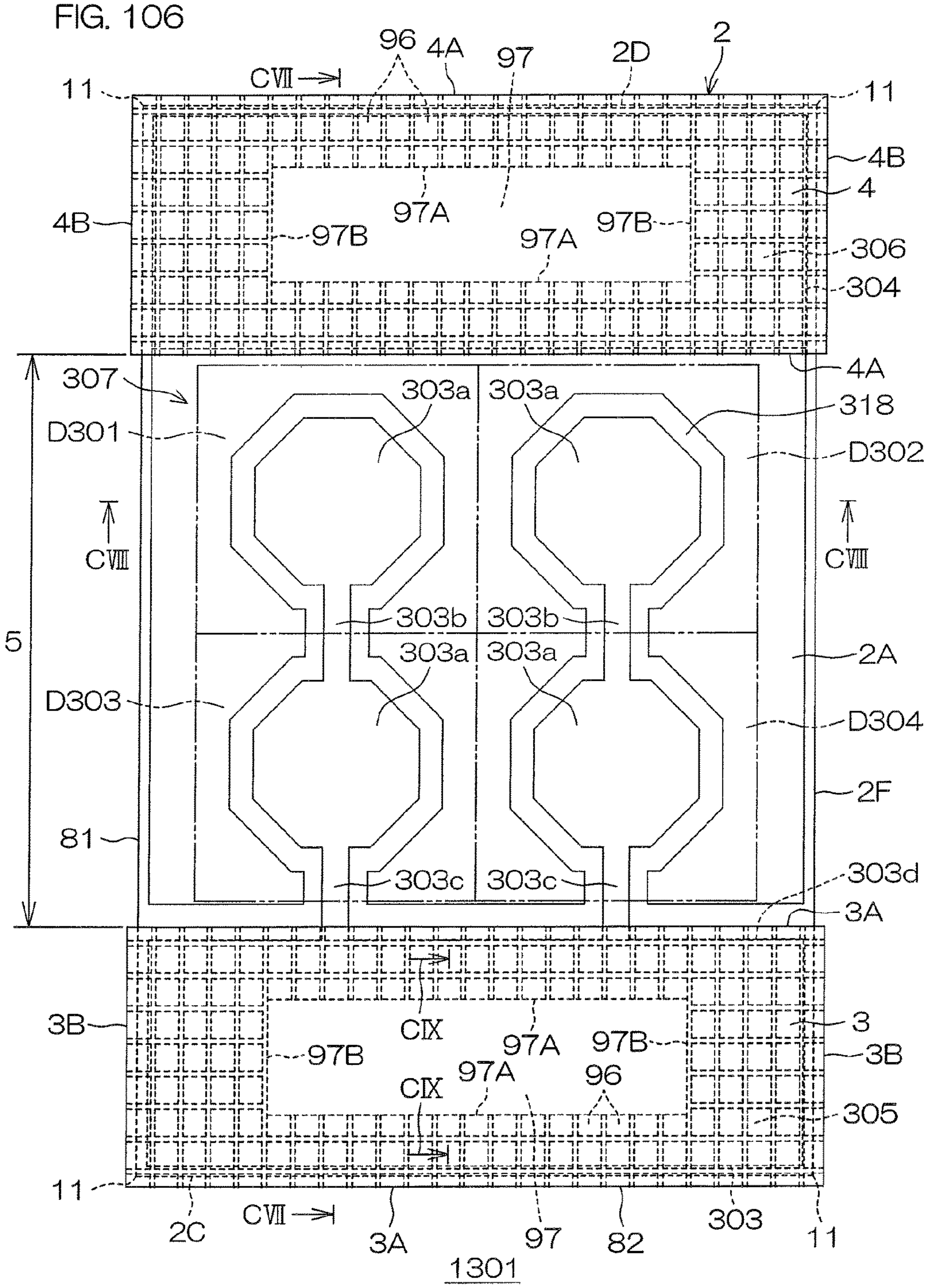

FIG. 106 is a plan view of a chip part of Reference Example 6.

Figure 107:
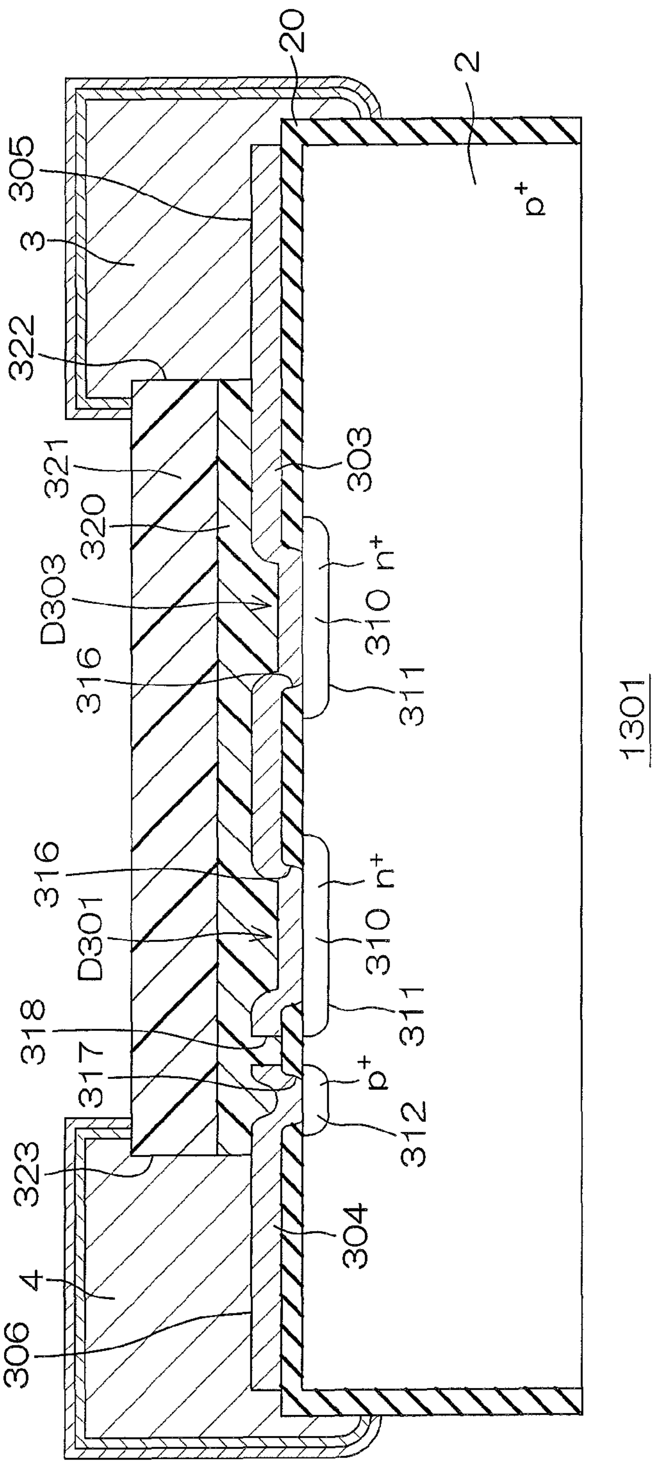

FIG. 107 is a sectional view taken along section line CVII-CVII in FIG. 106.

Figure 108:
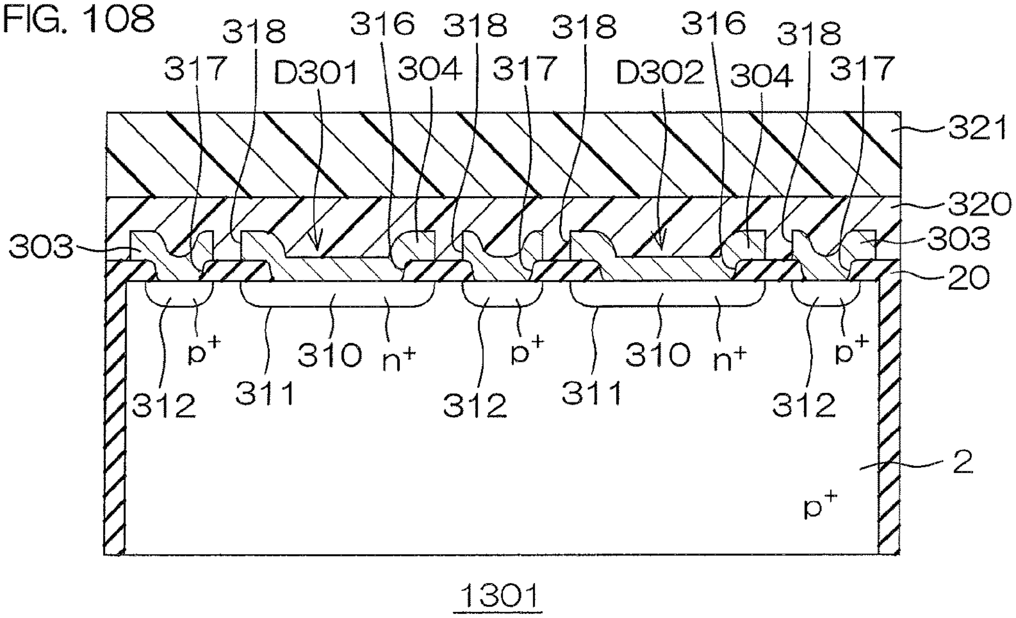

FIG. 108 is sectional view taken along section line CVIII-CVIII in FIG. 106.

Figure 109:
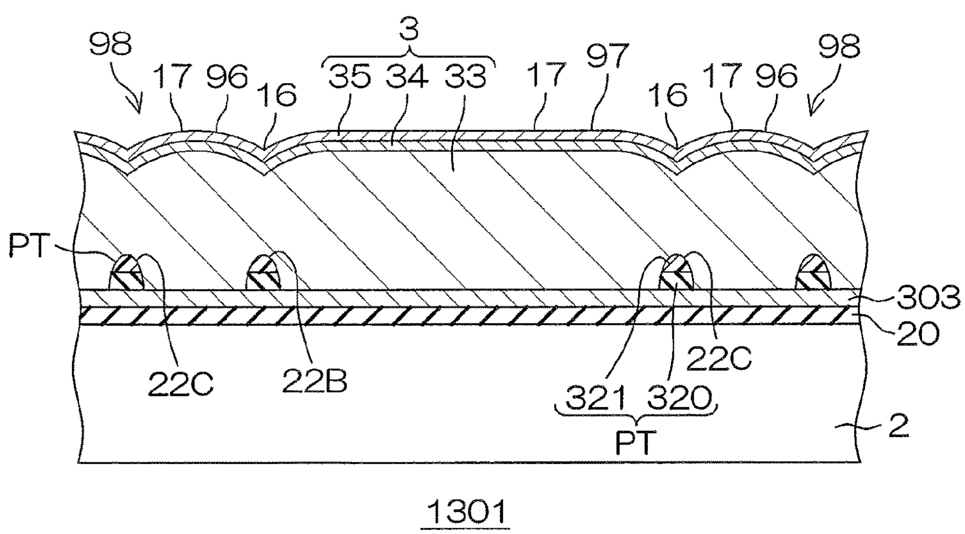

FIG. 109 is a sectional view taken along section line CIX-CIX in FIG. 106.

Figure 110:
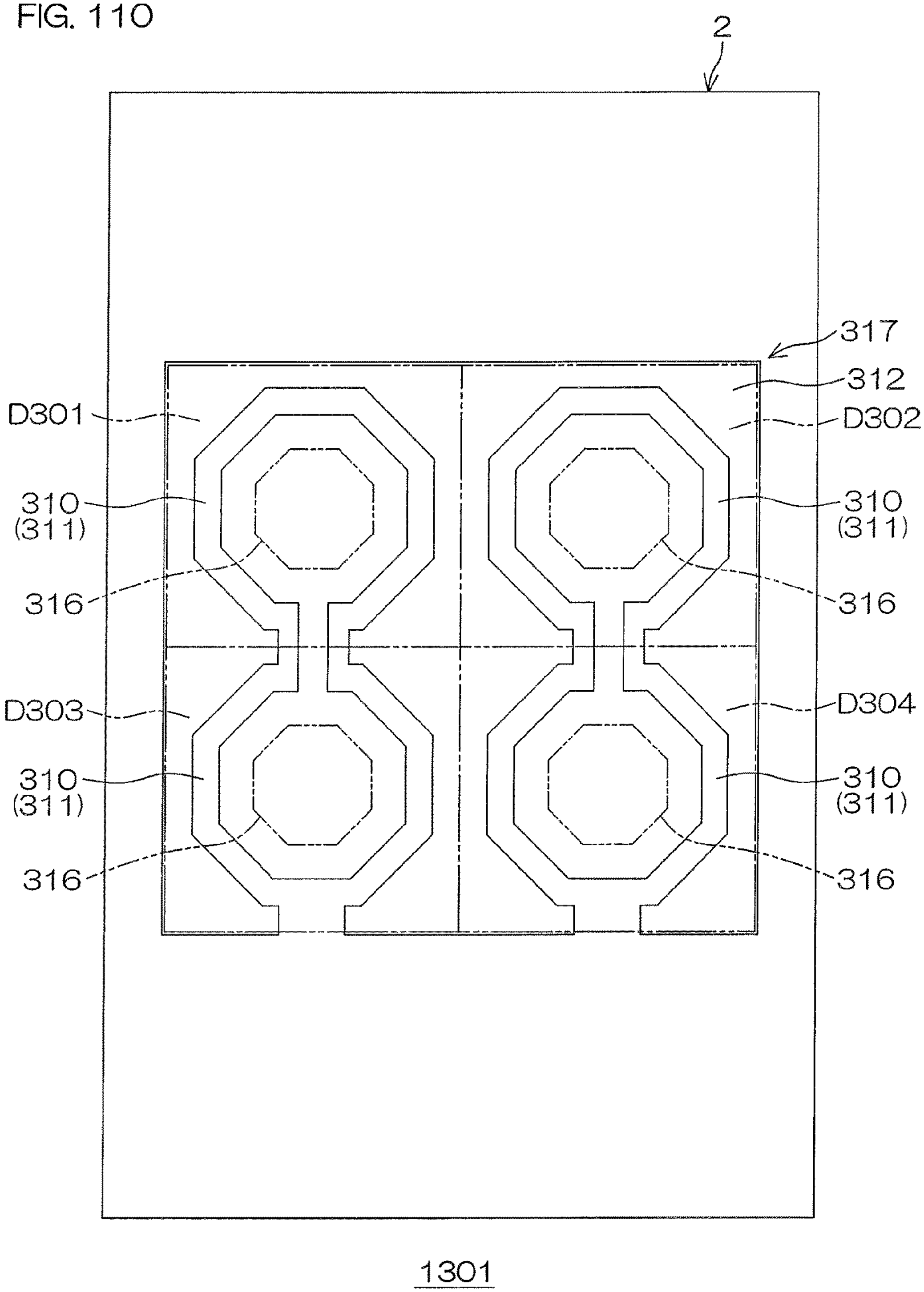

FIG. 110 is a plan view of the chip part shown in FIG. 106 in which a cathode electrode, an anode electrode and an arrangement formed thereon are removed therefrom to show a structure of a front surface of a substrate.

Figure 111:
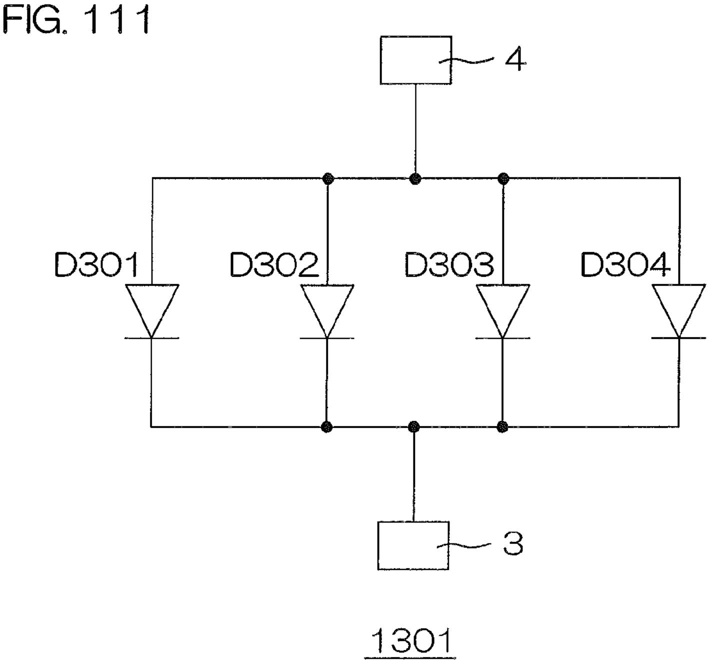

FIG. 111 is an electric circuit diagram which shows an electrical structure of the interior of the chip part shown in FIG. 106.

Figure 112:
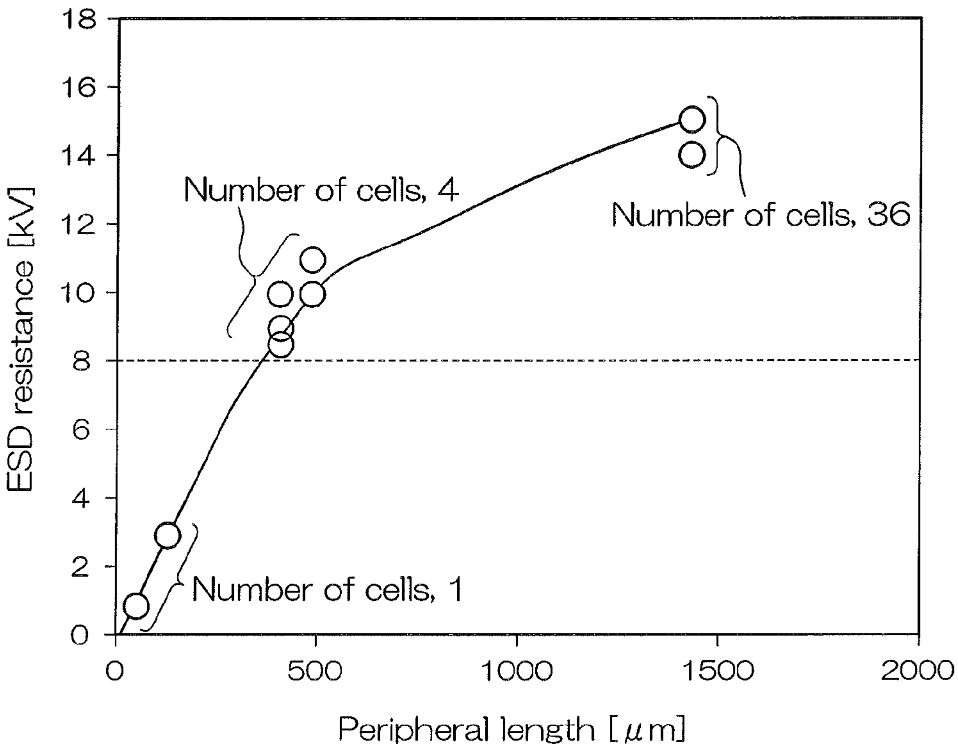

FIG. 112 shows an experimental result obtained by measuring ESD resistance of a plurality of samples, each of which is made different in total peripheral length (total extension) of a p-n junction region by setting in various ways a size of a diode cell and/or the number of the diode cells formed on a substrate equal in area.

Figure 113:
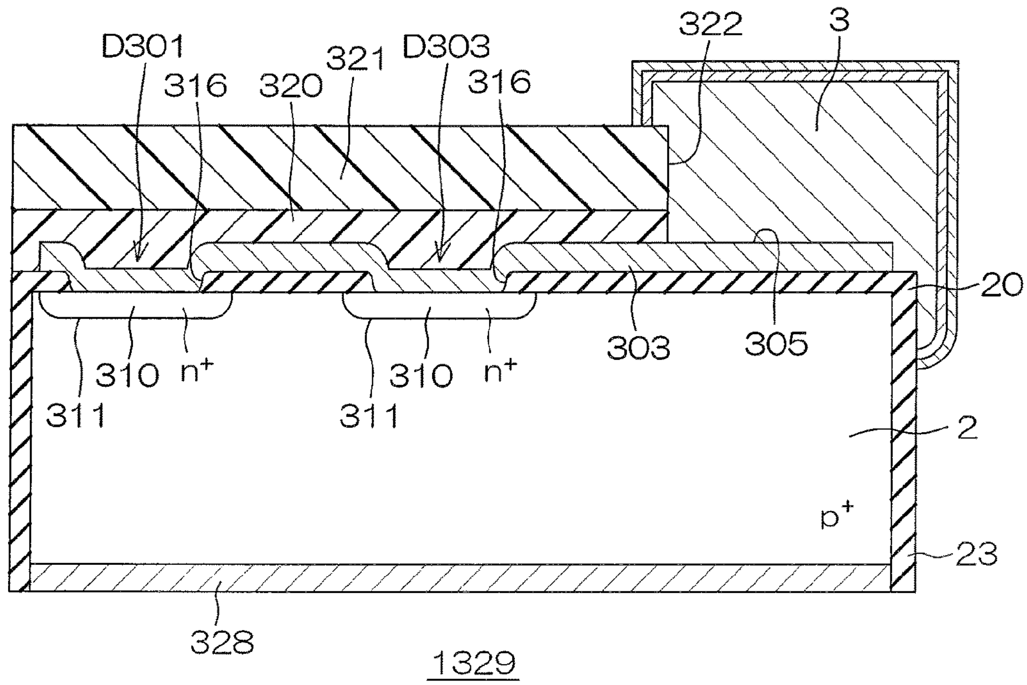

FIG. 113 is a sectional view of a chip part of Reference Example 7.

Figure 114:
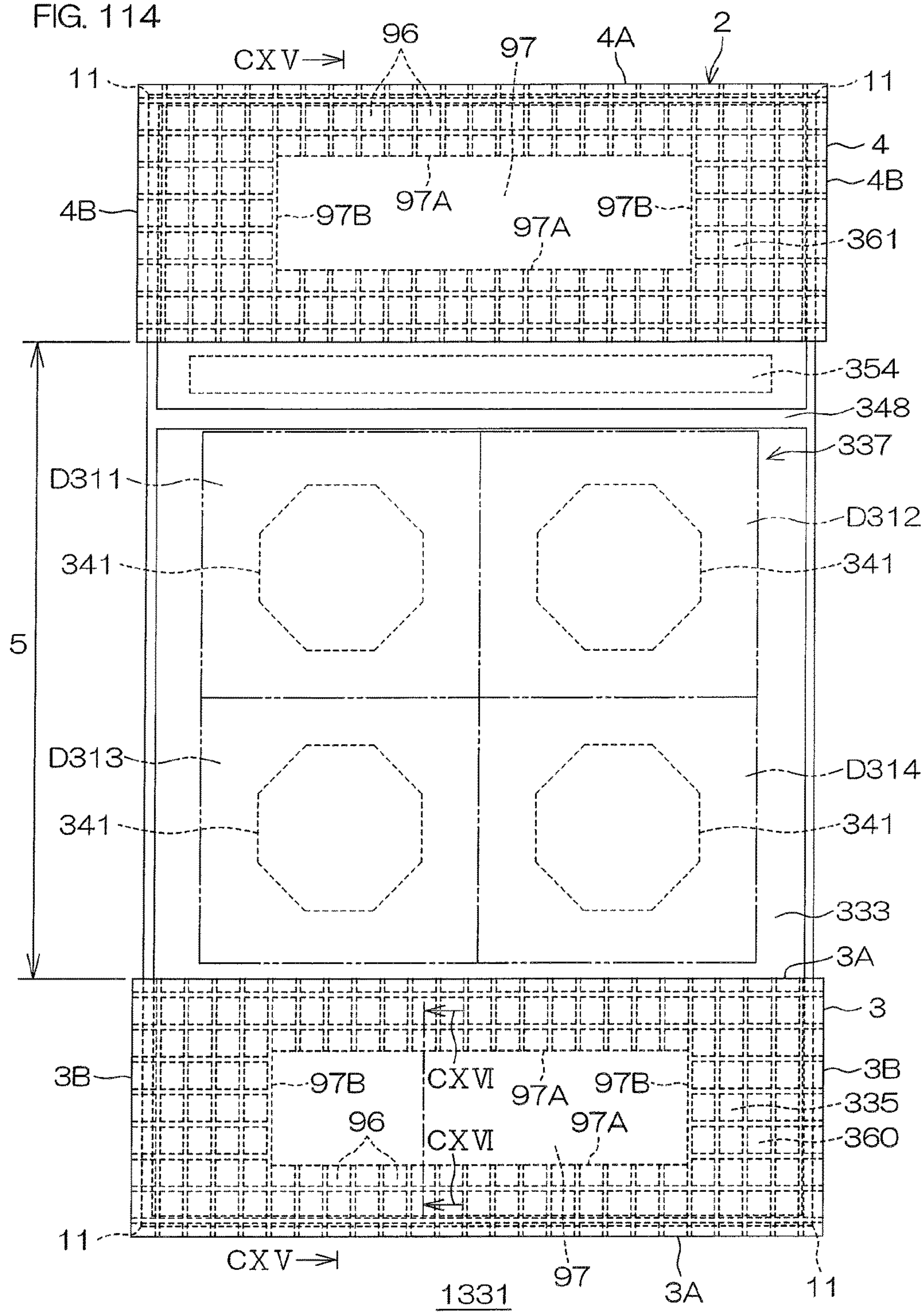

FIG. 114 is a plan view of a chip part of Reference Example 8.

Figure 115:
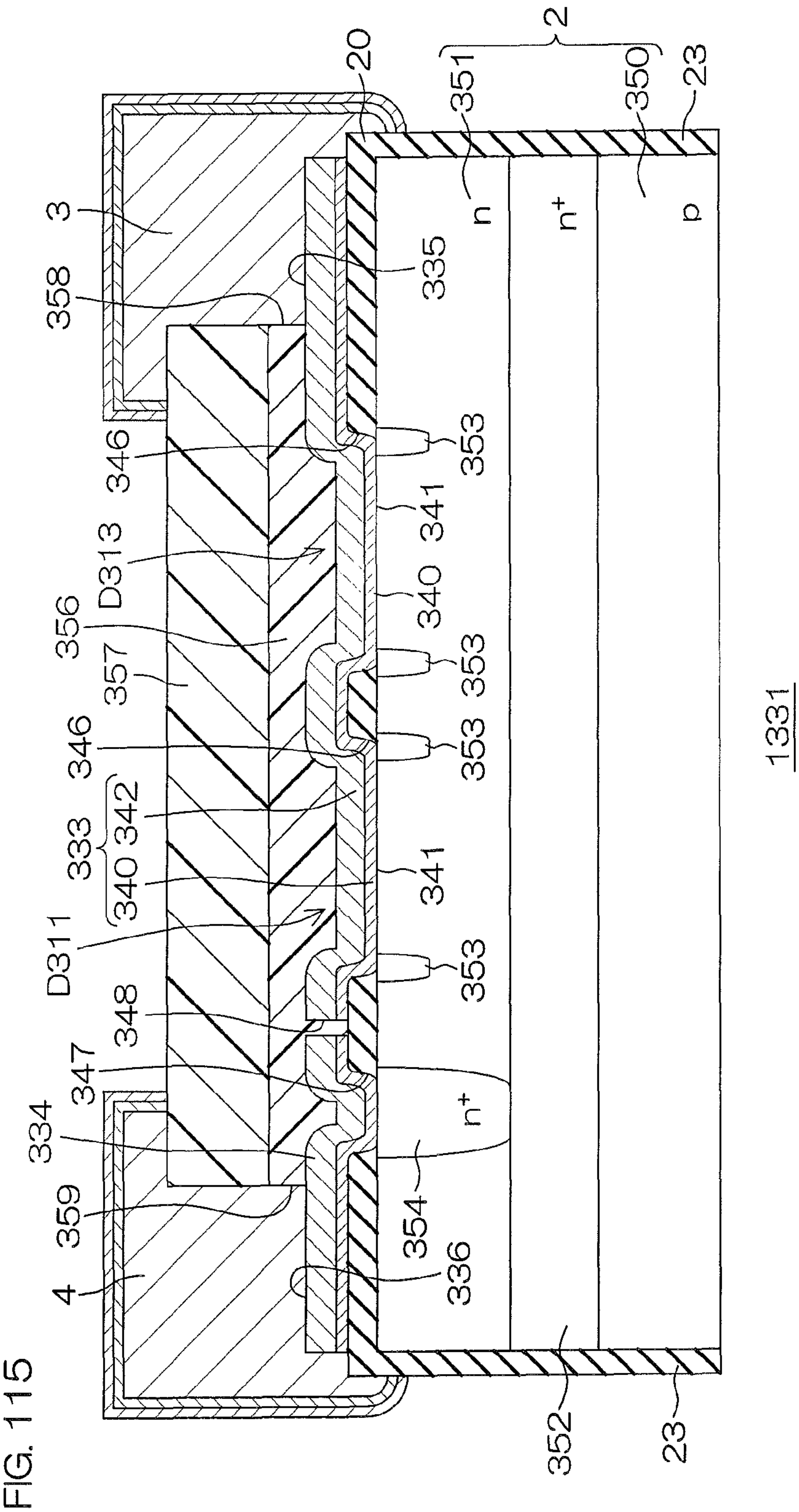

FIG. 115 is a sectional view taken along section line CXV-CXV in FIG. 114.

Figure 116:
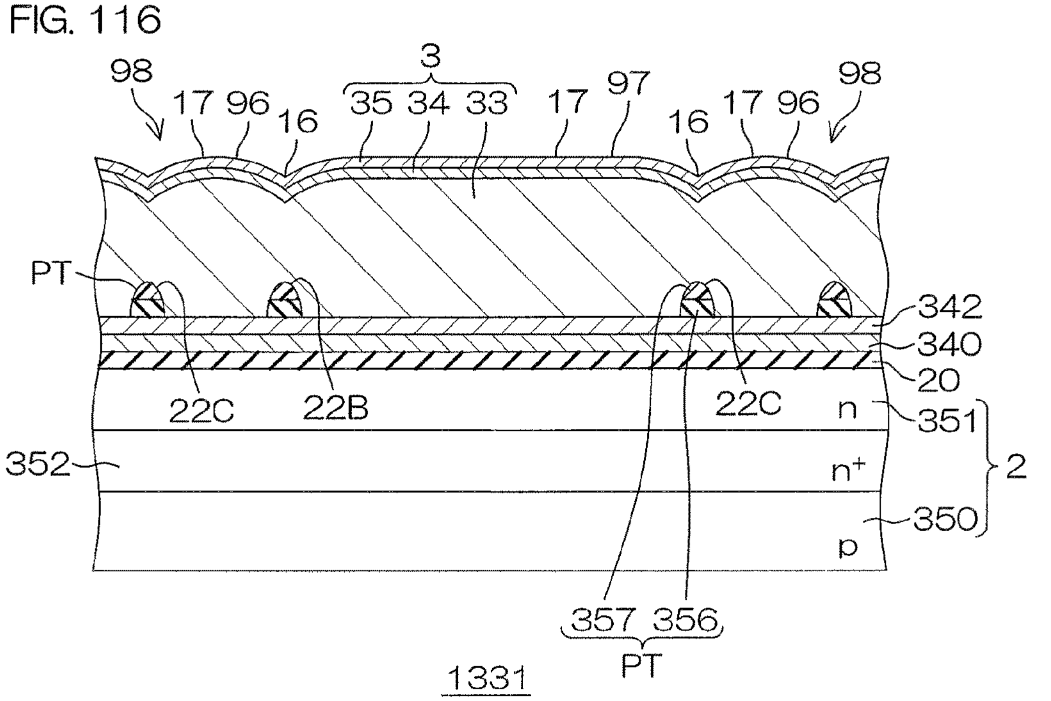

FIG. 116 is a sectional view taken along section line CXVI-CXVI in FIG. 114.

Figure 117:
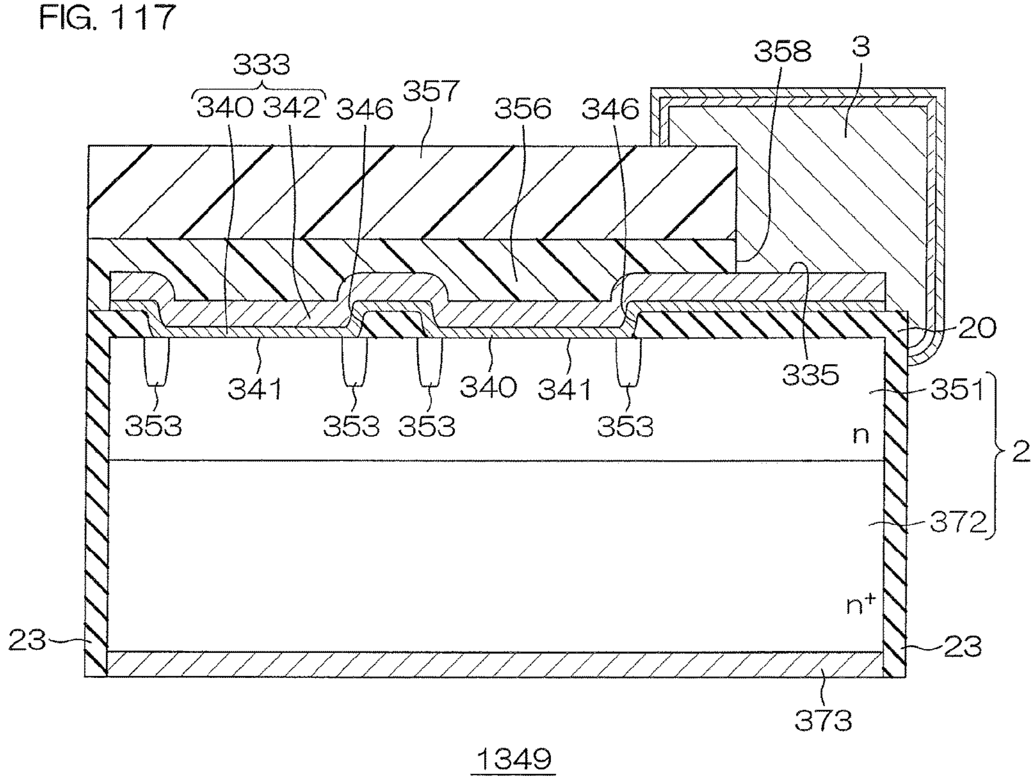

FIG. 117 is a sectional view of a chip part of Reference Example 9.

Figure 118:
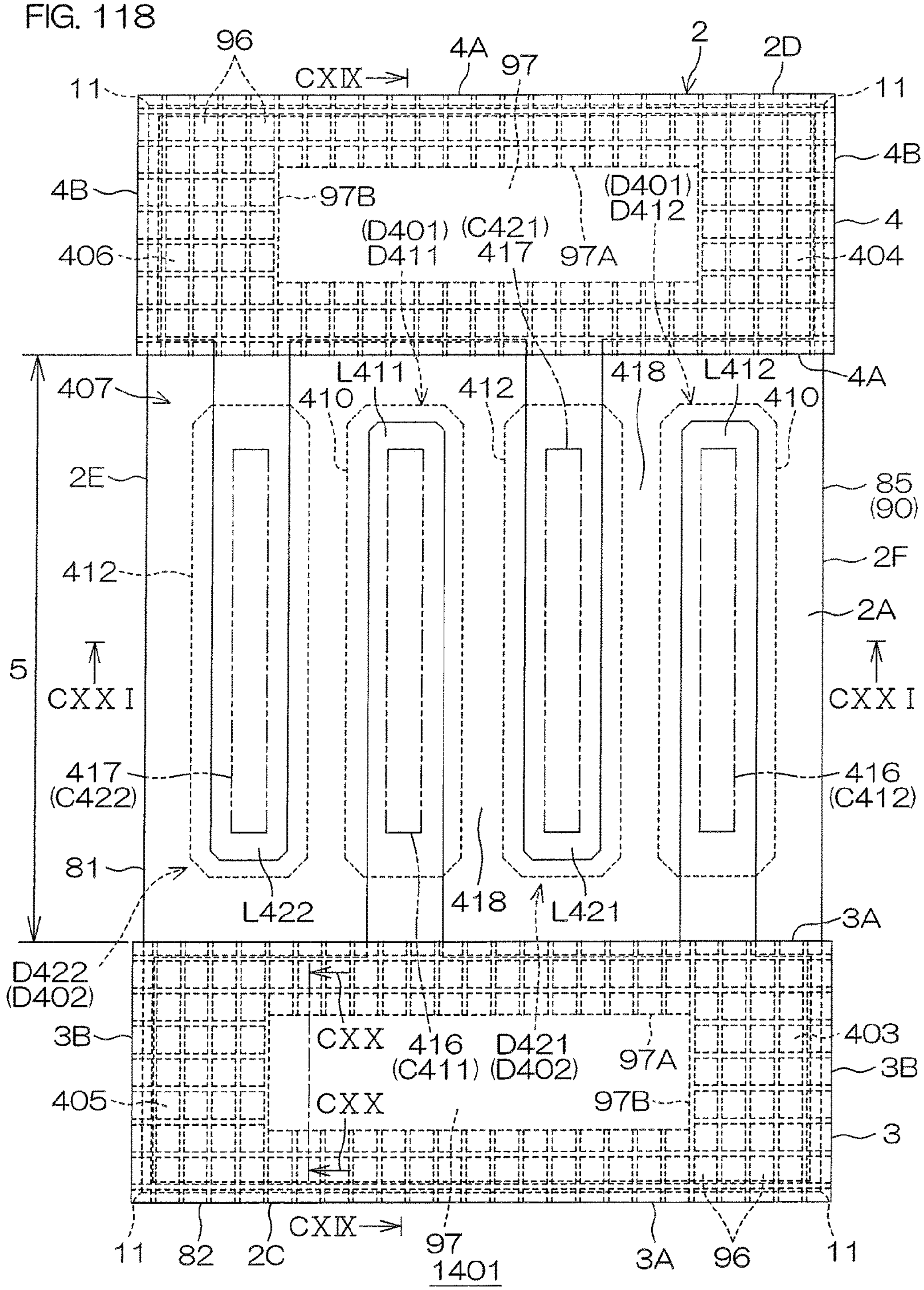

FIG. 118 is a plan view of a chip part of Reference Example 10.

Figure 119:
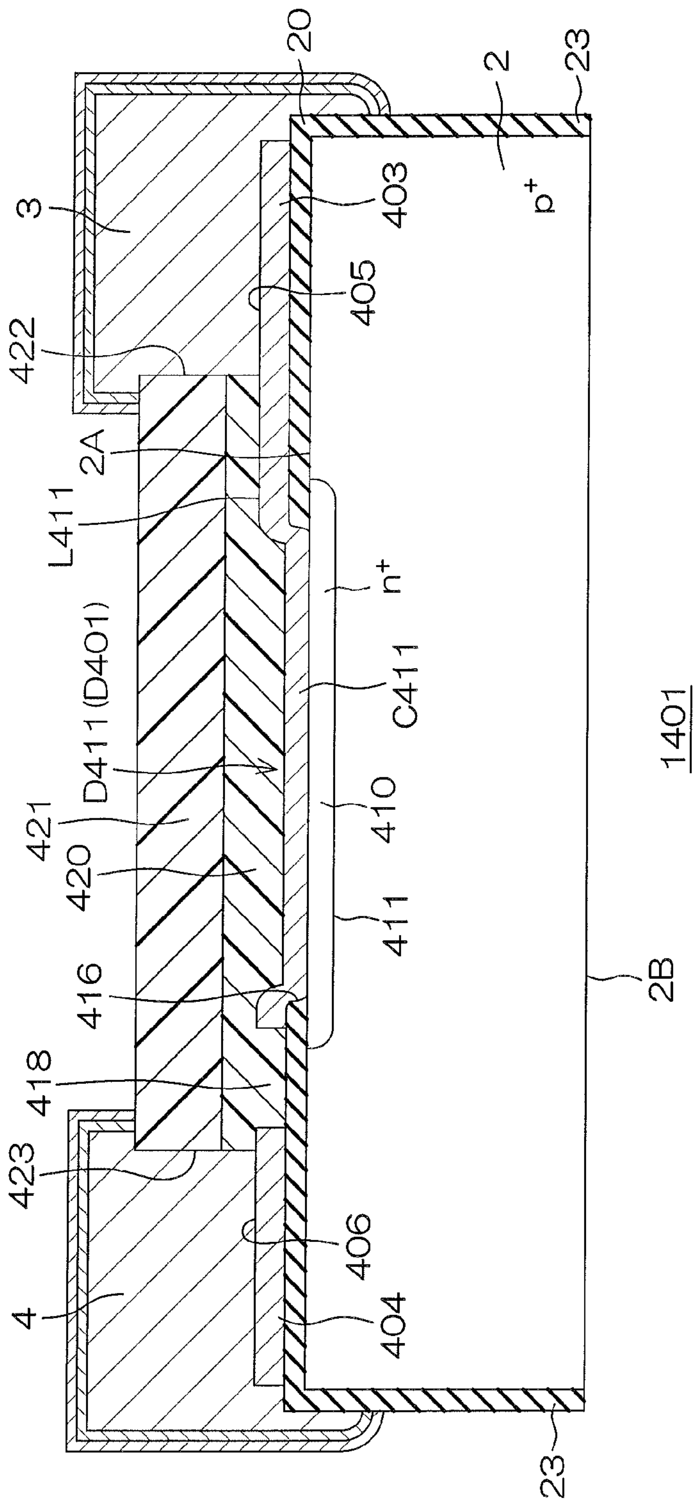

FIG. 119 is a sectional view taken along section line CXIX-CXIX in FIG. 118.

Figure 120:
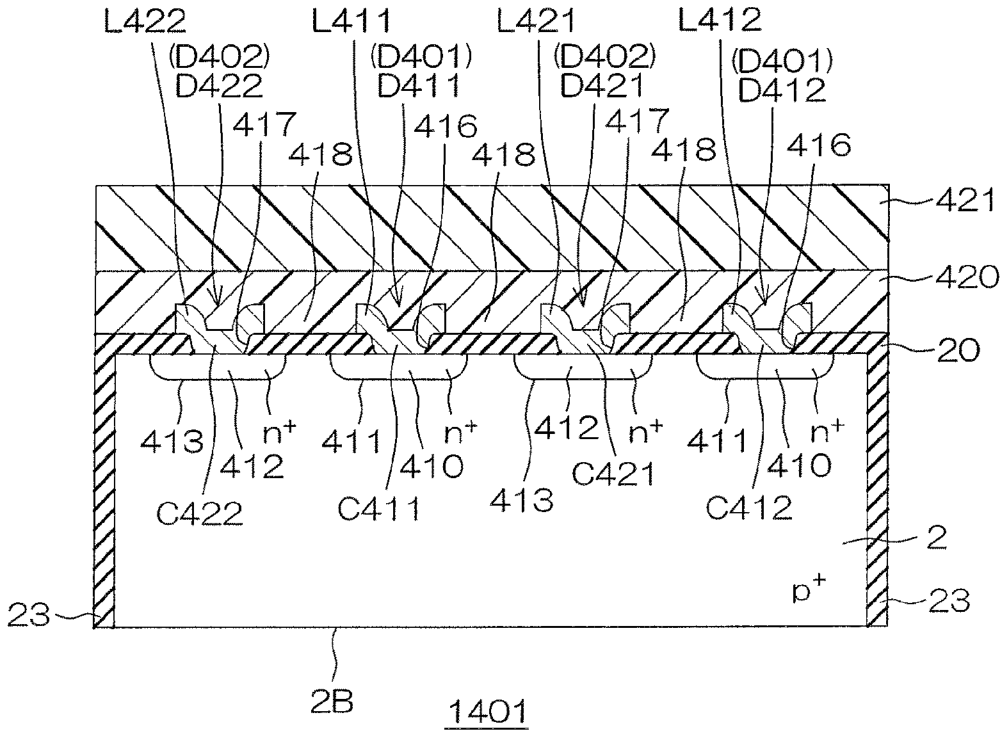

FIG. 120 is a sectional view taken along section line CXX-CXX in FIG. 118.

Figure 121:
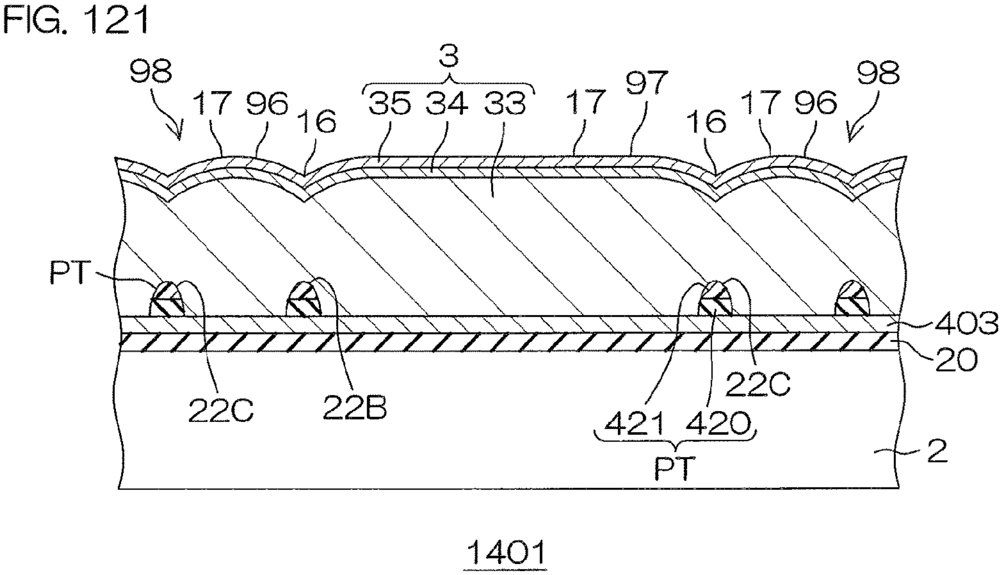

FIG. 121 is a sectional view taken along section line CXXI-CXXI in FIG. 118.

Figure 122:
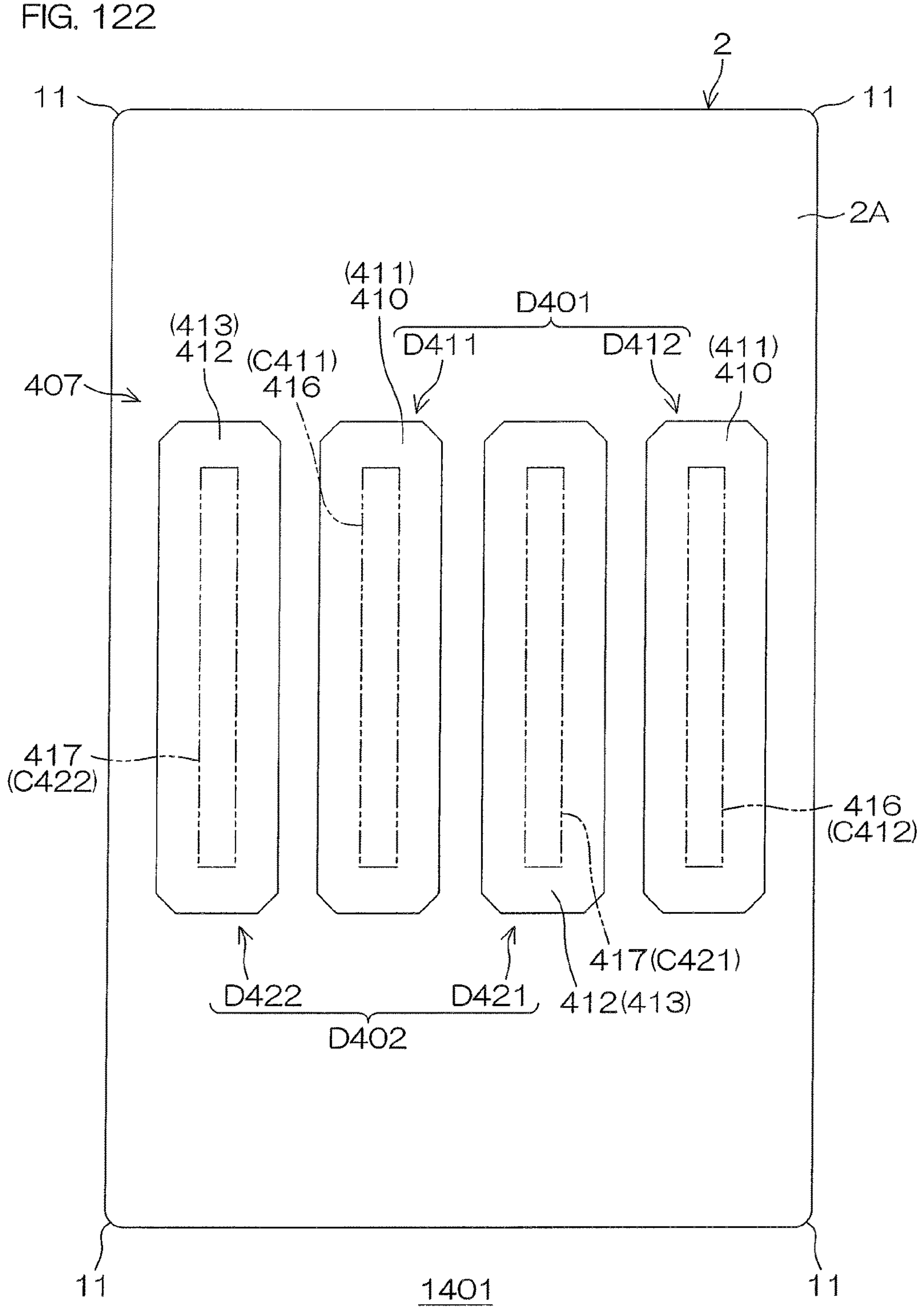

FIG. 122 is a plan view of the chip part shown in FIG. 118 in which a connection electrode and an arrangement formed thereon are removed therefrom to show a structure of the front surface of the substrate.

Figure 123:
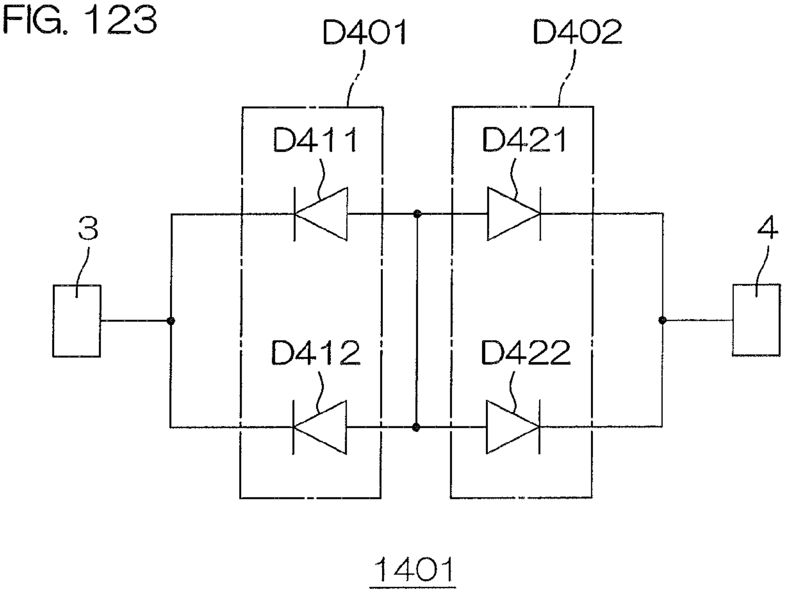

FIG. 123 is an electric circuit diagram which shows an electrical structure of the interior of the chip part shown in FIG. 118.

Figure 124A:
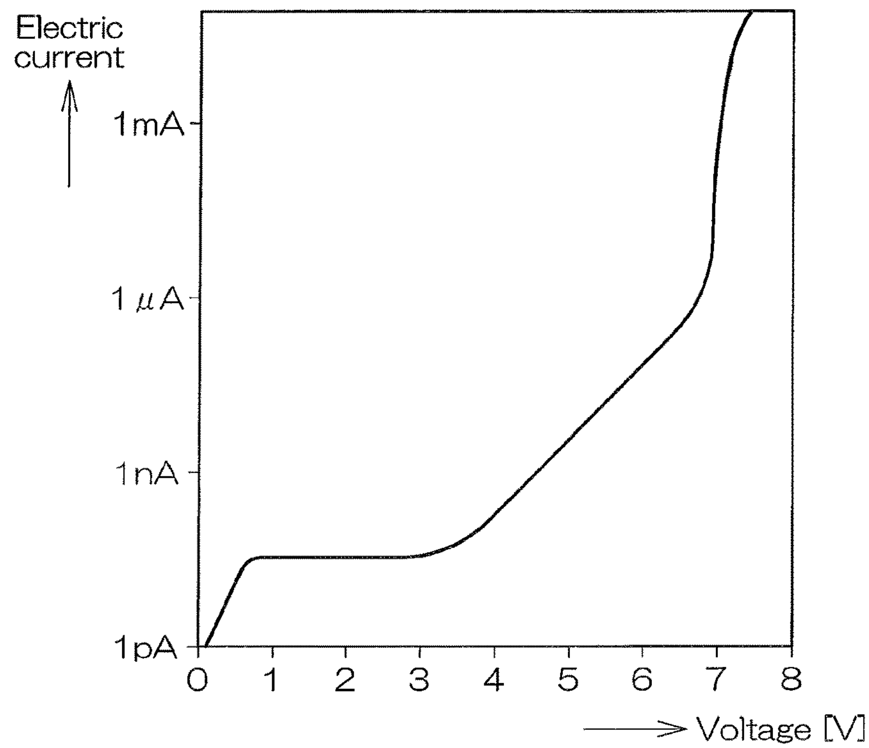

FIG. 124A is a graph which shows an experimental result obtained by measuring voltage-to-current characteristics of the chip part shown in FIG. 118 in each current direction.

Figure 124B:
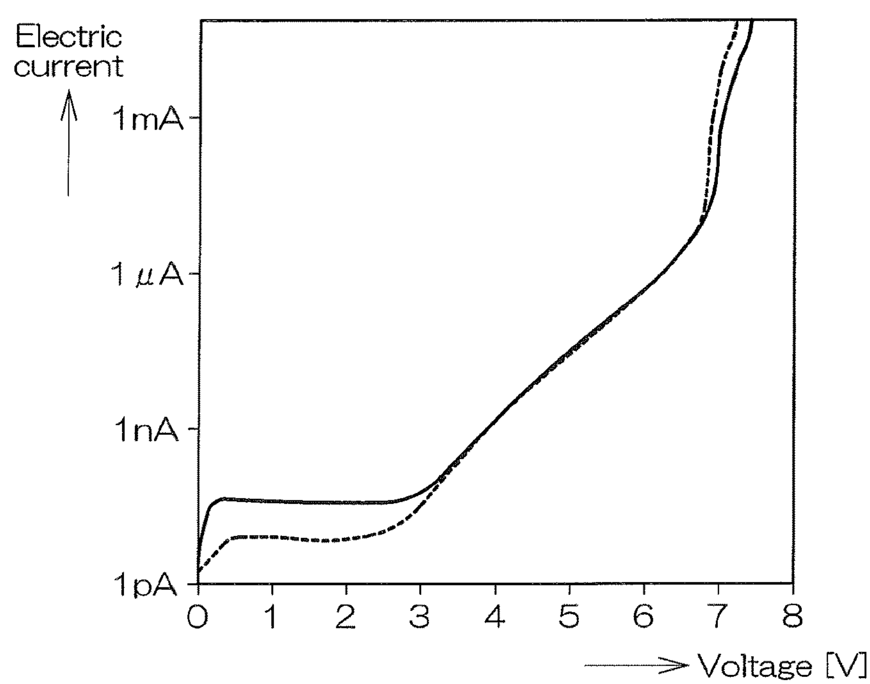

FIG. 124B is graph which shows an experimental result obtained by measuring voltage-to-current characteristics of a bidirectional Zener diode chip in which a first connection electrode and a first diffusion region are arranged so as to be asymmetrical with a second connection electrode and a second diffusion region in each current direction.

Figure 125:
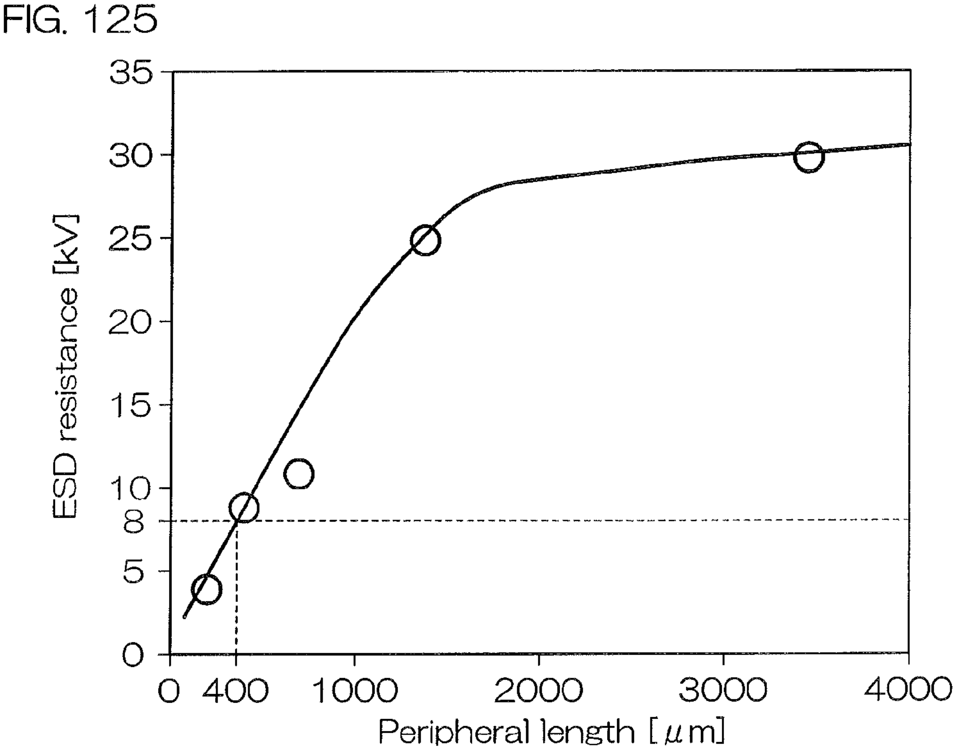

FIG. 125 is a graph which shows an experimental result obtained by measuring ESD resistance of a plurality of samples, each of which is made different in peripheral length of the respective p-n junction regions of a first Zener diode and of a second Zener diode by setting in various ways the number of lead-out electrodes (diffusion regions) and/or a size of the diffusion region formed on the substrate equal in area.

Figure 126:
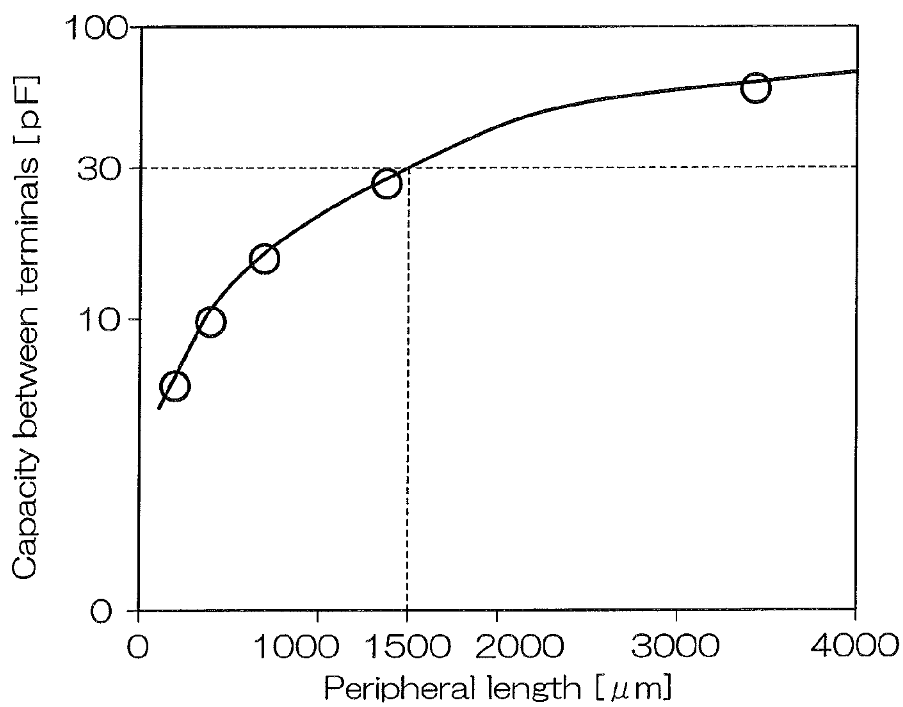

FIG. 126 is a graph which shows an experimental result obtained by measuring a capacity across terminals of a plurality of samples, each of which is made different in peripheral length of the respective p-n junction regions of the first Zener diode and of the second Zener diode by setting in various ways the number of lead-out electrodes (diffusion regions) and/or a size of the diffusion region formed on a substrate equal in area.

Figure 127:
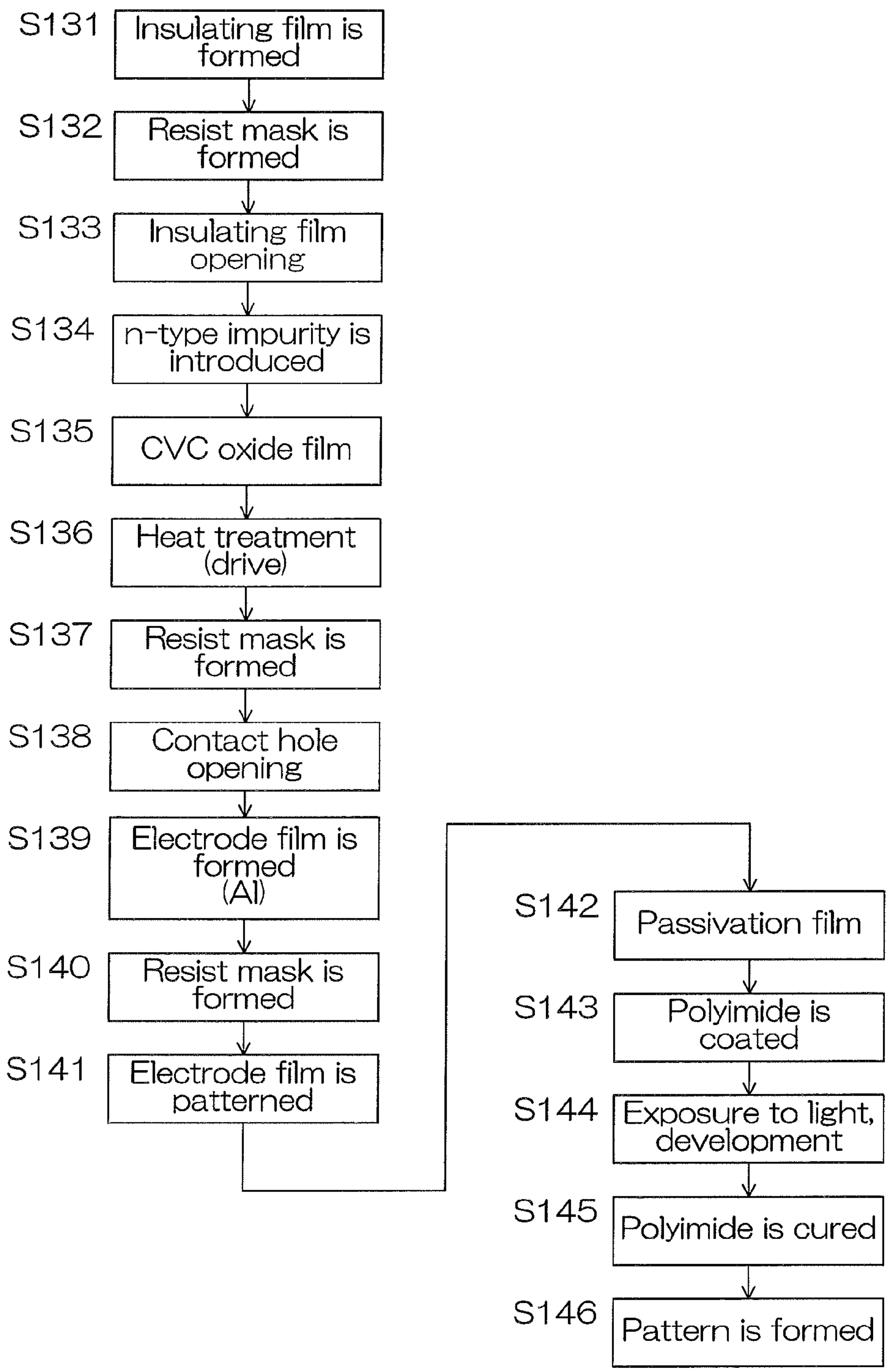

FIG. 127 is a flow chart which describes one example of steps of manufacturing the chip part shown in FIG. 118.

Figure 128A:
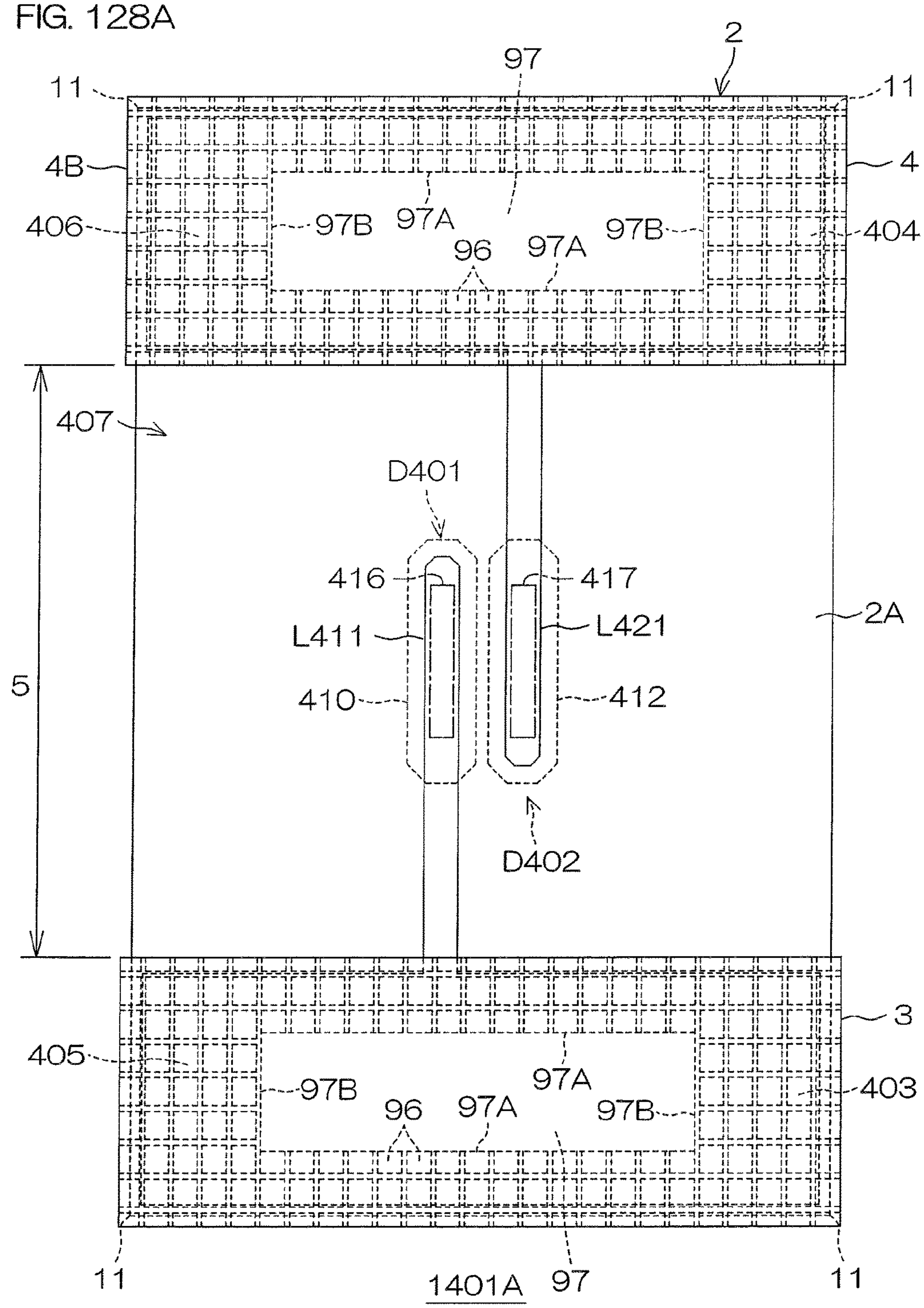

FIG. 128A is a plan view which shows modification example 1 of the chip part shown in FIG. 118.

Figure 128B:
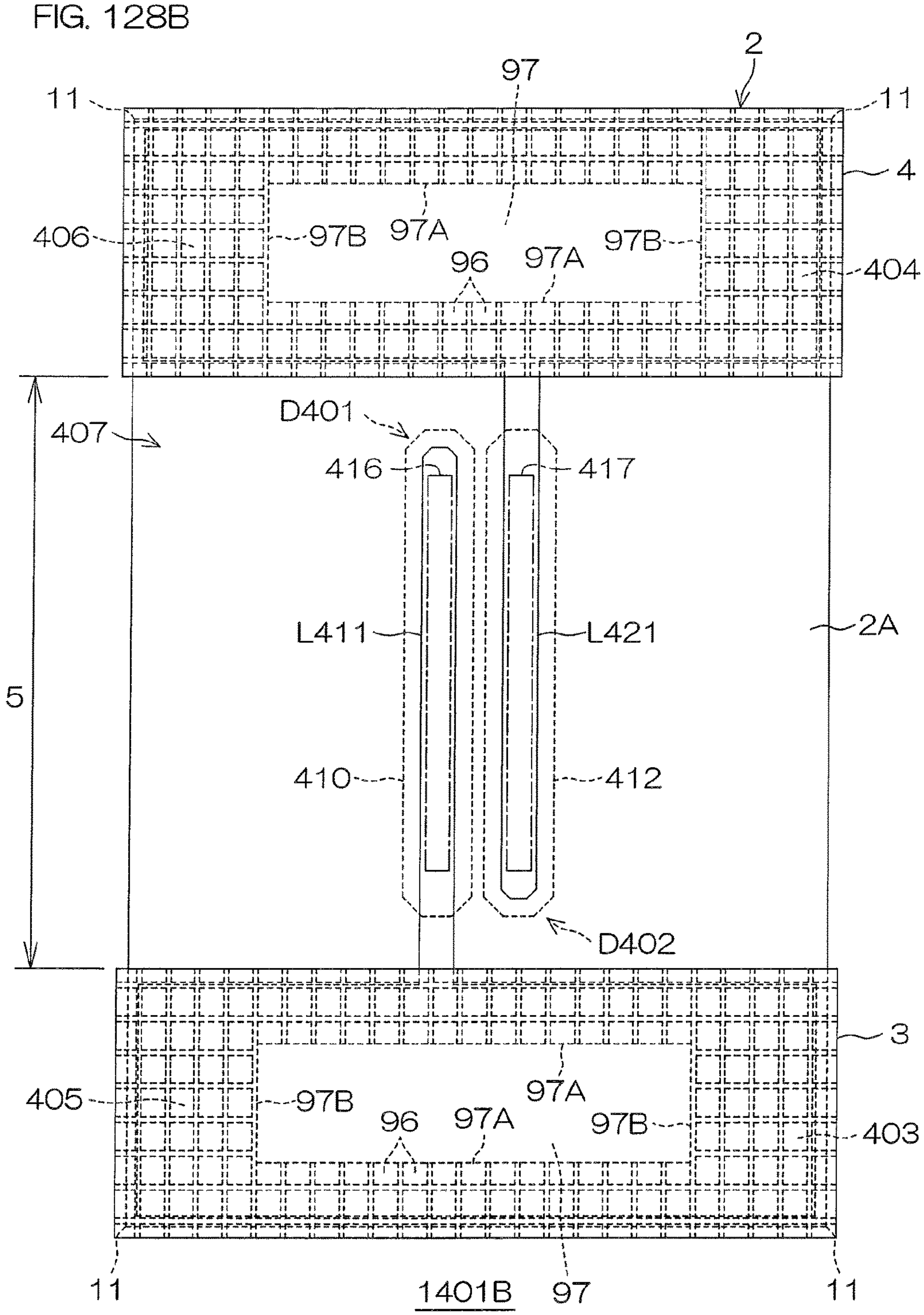

FIG. 128B is a plan view which shows modification example 2 of the chip part shown in FIG. 118.

Figure 128C:
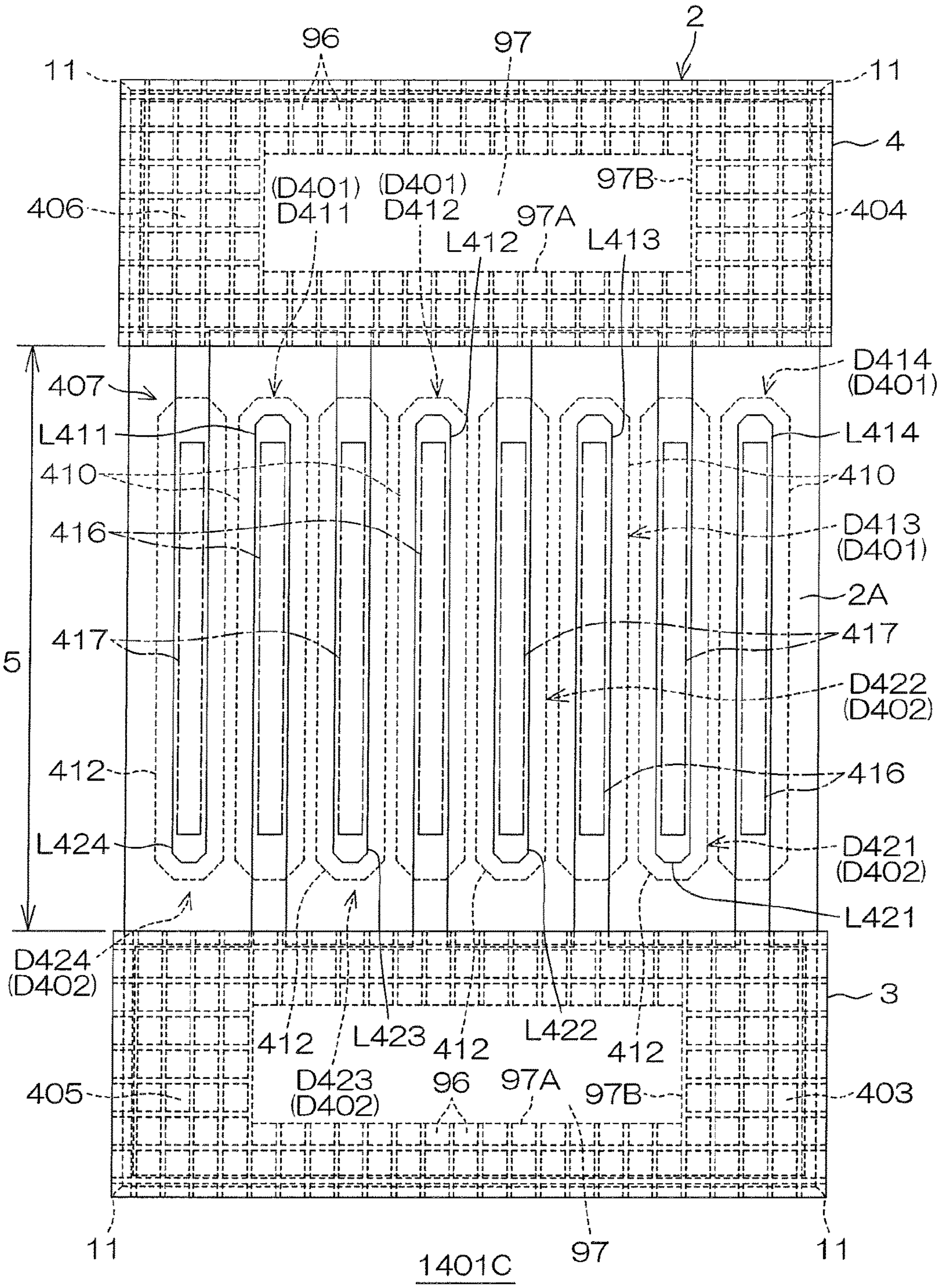

FIG. 128C is a plan view which shows modification example 3 of the chip part shown in FIG. 118.

Figure 128D:
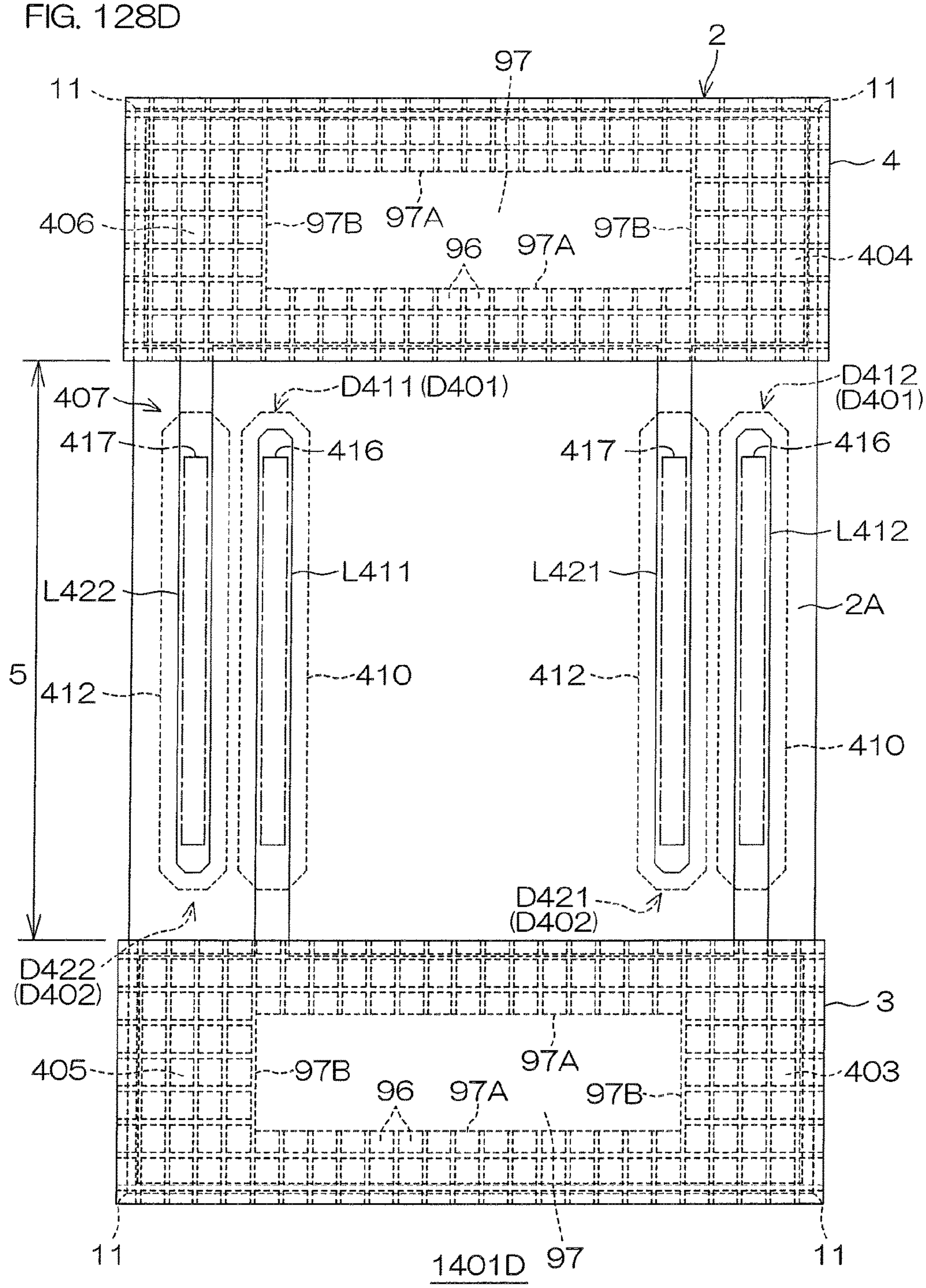

FIG. 128D is a plan view which shows modification example 4 of the chip part shown in FIG. 118.

Figure 128E:
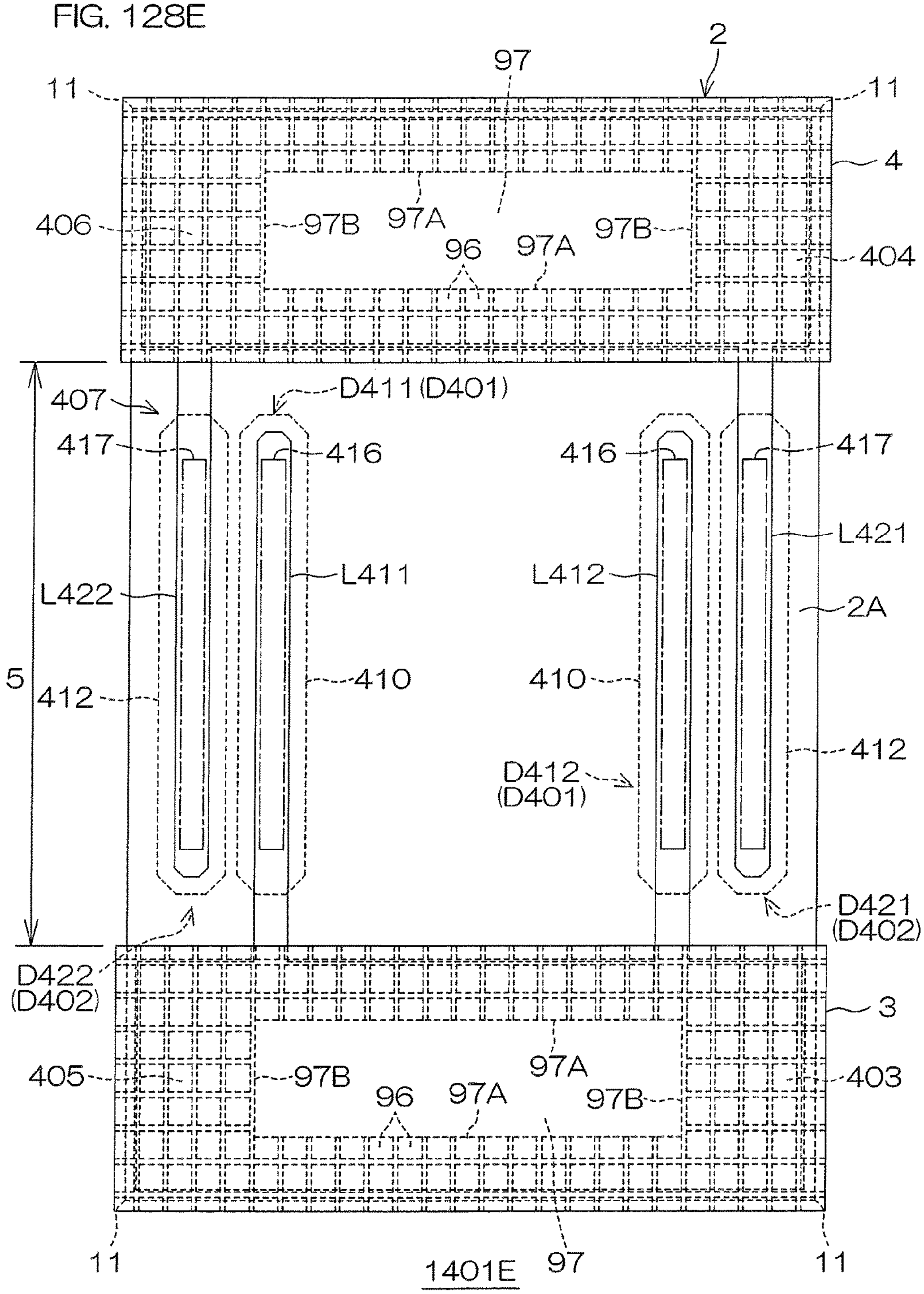

FIG. 128E is a plan view which shows modification example 5 of the chip part shown in FIG. 118.

Figure 128F:
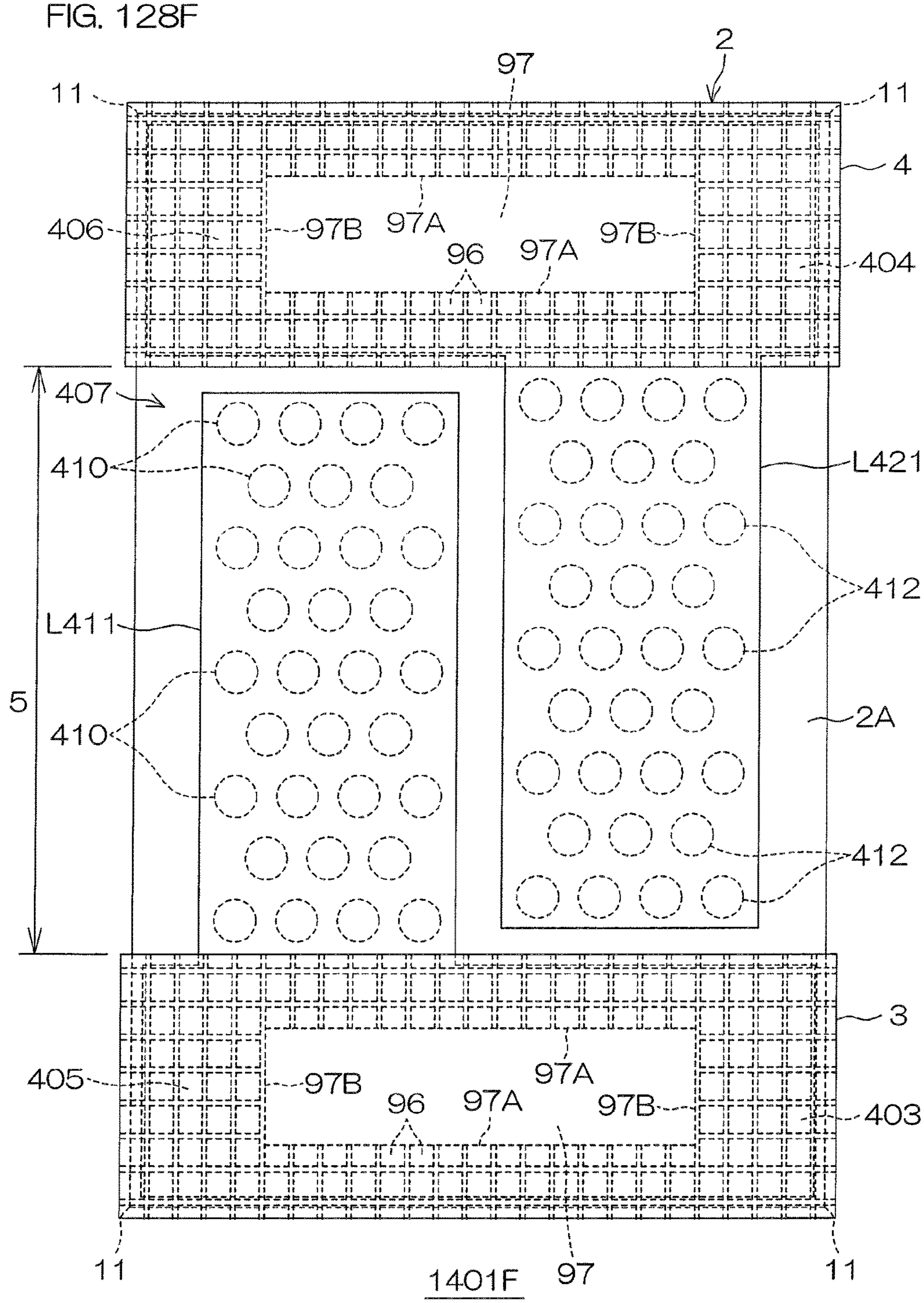

FIG. 128F is a plan view which shows modification example 6 of the chip part shown in FIG. 118.

Figure 129A:
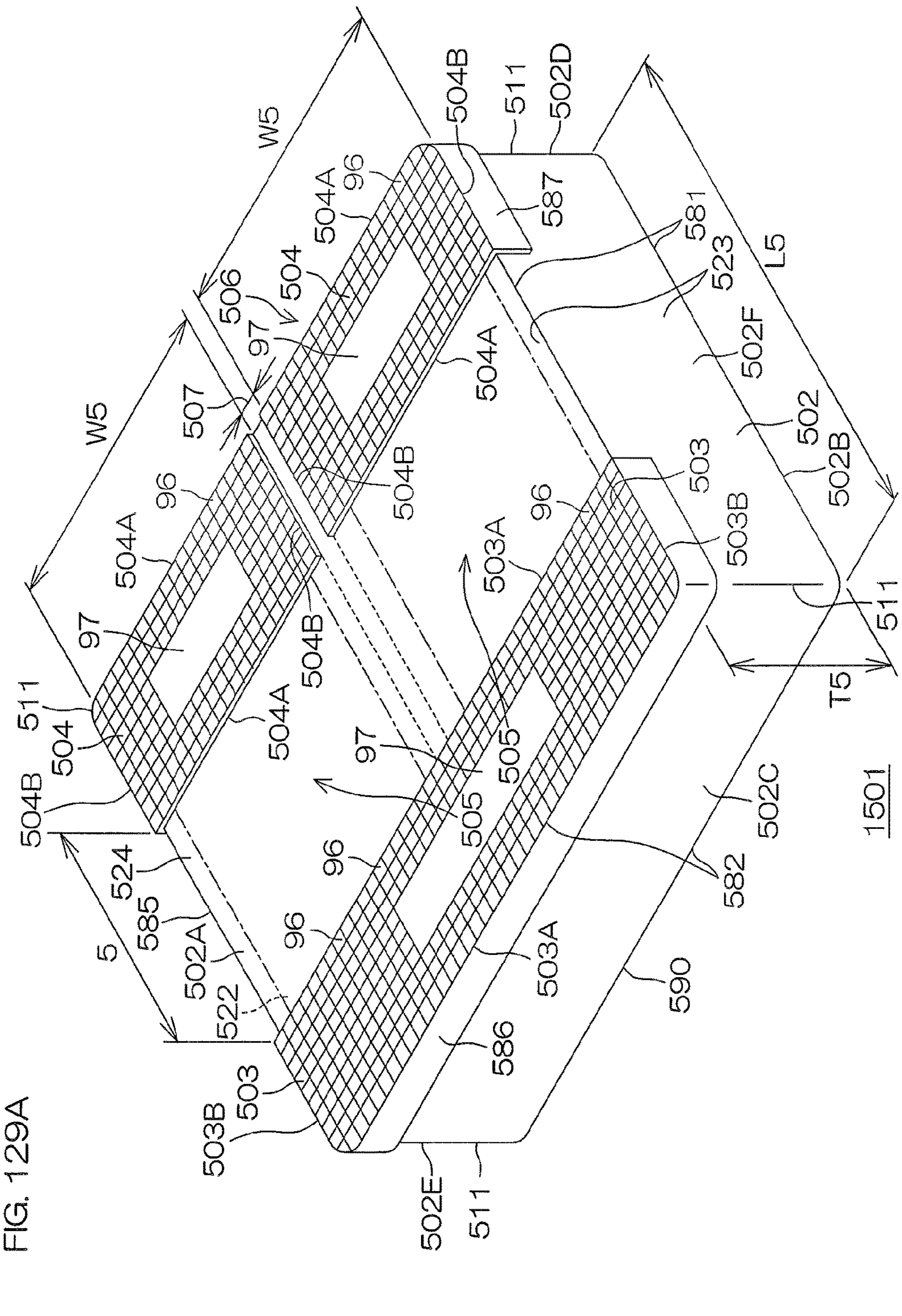

FIG. 129A is a schematic perspective view of a chip part of Reference Example 11.

Figure 129B:
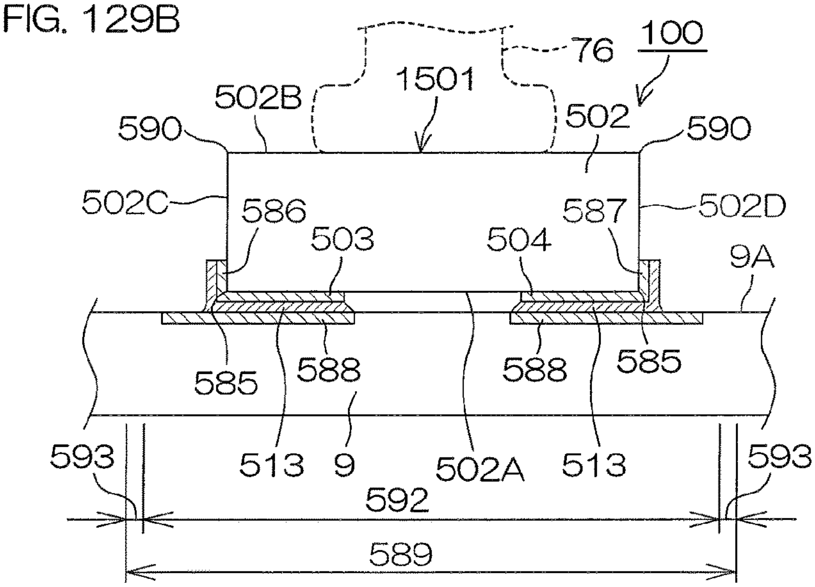

FIG. 129B is a schematic sectional view of a circuit assembly in a state that the composite chip is mounted on a mounting substrate.

Figure 129C:
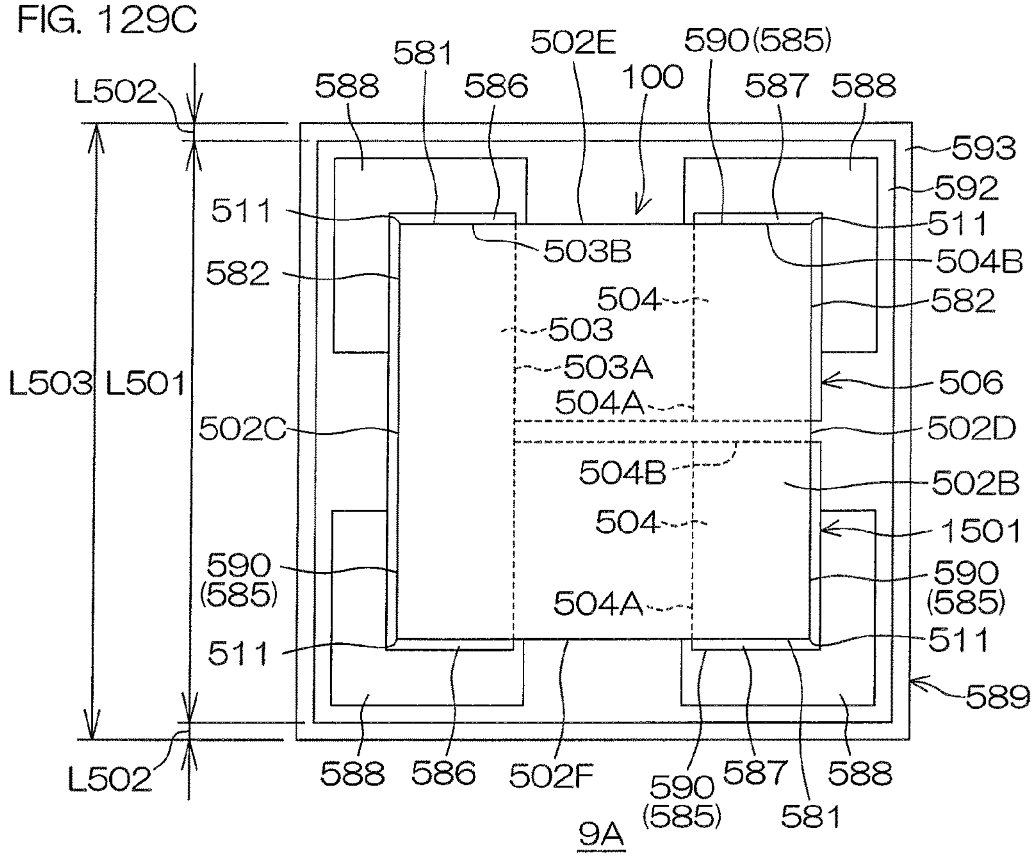

FIG. 129C is a schematic plan view when the circuit assembly is viewed from the rear surface side of the composite chip.

Figure 129D:
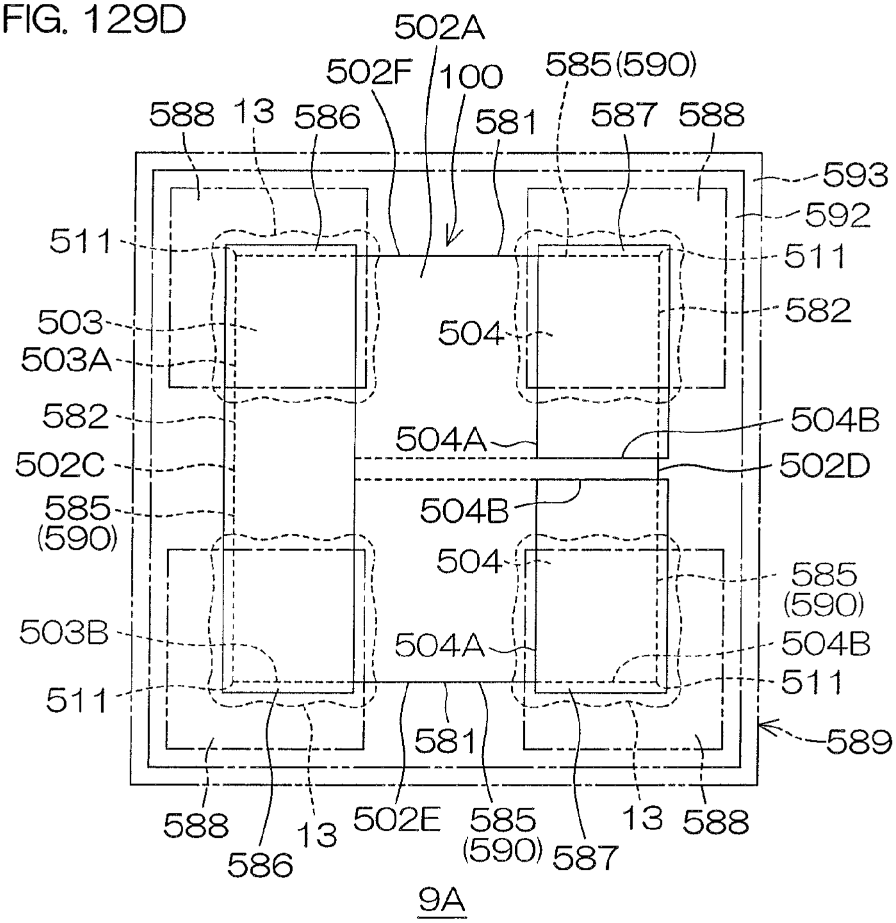

FIG. 129D is a schematic plan view when the circuit assembly is viewed from the element forming surface side of the composite chip.

Figure 129E:
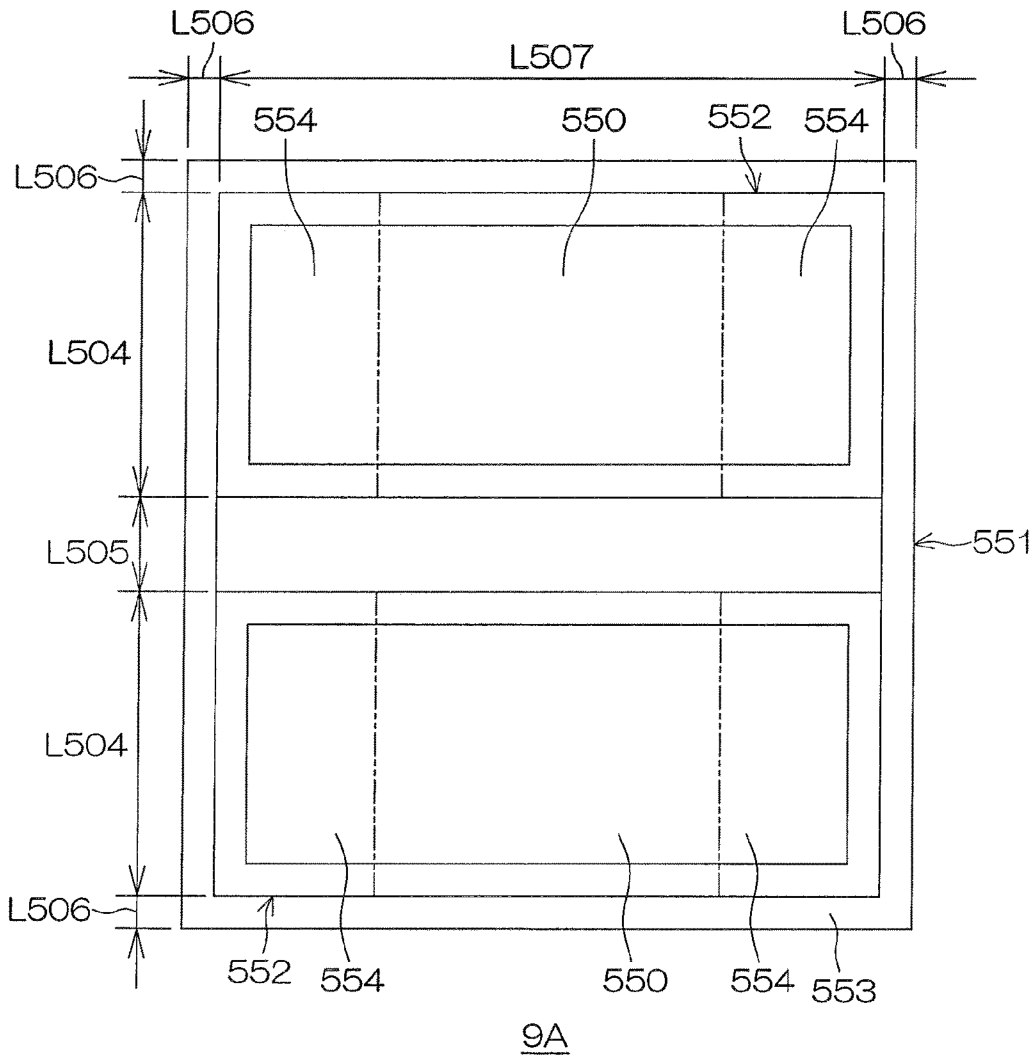

FIG. 129E is a view which shows a state that two single chips are mounted on the mounting substrate.

Figure 130:
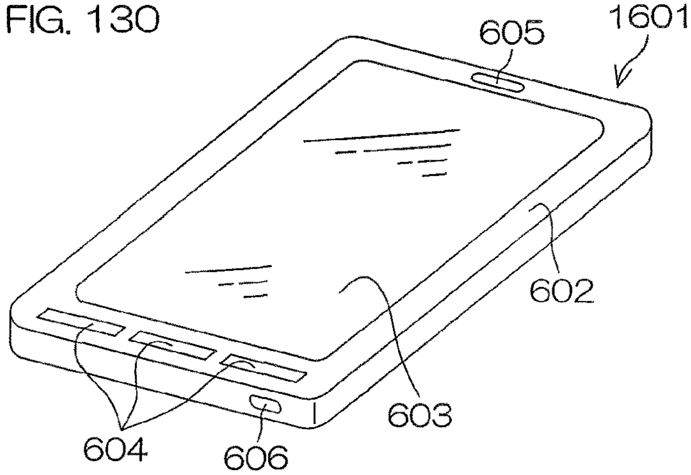

FIG. 130 is a perspective view which shows the external appearance of a smartphone which is an example of an electronic device using the chip part of the reference example.

Figure 131:
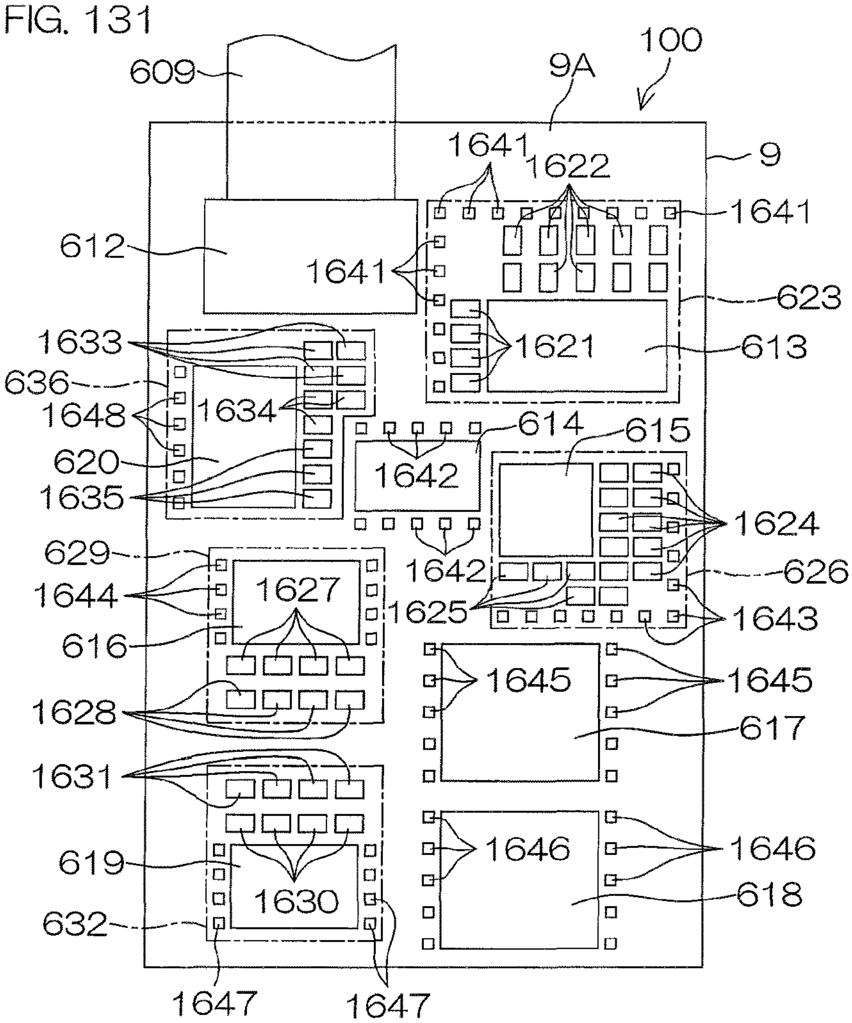

FIG. 131 is an illustrative plan view which shows an arrangement of the circuit assembly housed inside a housing of the smartphone.

DETAILED DESCRIPTION OF THE INVENTION

The chip part according to one preferred embodiment of the present invention includes a substrate, an electrode which is formed on the substrate and provided with a front surface having a plurality of recessed portions formed toward a thickness direction, and an element region which has a circuit element electrically connected to the electrode.

According to the arrangement, even if the chip part is suctioned in an inclined manner, light irradiated from a light source to the electrode is irregularly reflected by the recessed portions of the electrode formed on the frontmost surface of the chip part. Since the plurality of the recessed portions are formed on the electrode of the chip part, incident light from the light source can be reflected in all directions, even if the chip part is suctioned by the suction nozzle in an inclined manner. Therefore, irrespective of the way in which a part recognizing camera is disposed at a part detection position (a position at which the front-surface or rear-surface determination is made by the part recognizing camera), the part recognizing camera can be used to detect the electrode satisfactorily. Thereby, an automatic mounting machine reduces misrecognition due to a specification of the chip part and, therefore, is able to smoothly mount the chip part on a mounting substrate.

Moreover, only such processing will be sufficient that the recessed portions are formed on the electrode of the chip part. This processing is applicable to any chip part different in specification, therefore, the need for changing a condition (a specification) of the light source disposed in the peripheries of the part recognizing camera for each specification of the chip part is not necessary.

The plurality of the recessed portions may be formed so as to penetrate through the electrode toward the thickness direction of the electrode or they may be formed so as to be recessed toward the thickness direction of the electrode. With this arrangement, it becomes easy to cause irregular reflection of light from the light source.

With regard to the chip part, it is preferable that the electrode also includes a flat portion in which the recessed portions are not formed.

In the step of manufacturing the chip part, the circuit element formed at the element region is subjected to probing (electrical test). As described in the preferred embodiment of the present invention, the flat portion in which the recessed portions are not formed on the front surface of the electrode is provided, thus making it possible to suppress or prevent a probe from entering into the recessed portions. As a result, probing can be performed satisfactorily. It is also possible to secure a connection area when the chip part is mounted on the mounting substrate satisfactorily. The flat portion is not restricted to an internal portion of the electrode but may be formed at a peripheral portion of the front surface of the electrode (at a corner where the electrode is rectangular).

With regard to the chip part, it is preferable that the flat portion is formed at the internal portion of the electrode and the recessed portions are formed along the peripheral portion of the electrode.

According to this arrangement, since the flat portion in which the recessed portions are not formed is provided at the internal portion of the electrode, it is possible to restrict a position at which the probe is in contact with the electrode to the internal portion of the electrode on performance of probing. As a result, it is possible to effectively suppress or prevent the probe from entering into the recessed portions.

It is preferable that the chip part further includes an insulating film formed between the substrate and the electrode and the insulating film includes a base recessed portion formed so that the front surface is dug downward in the thickness direction at the same position as that at which the recessed portions of the electrode are formed in a plan view.

According to the arrangement, the recessed portions are inevitably formed on the front surface of the electrode formed on the insulating film by the base recessed portion formed on the insulating film. That is, without an additional step of forming the recessed portions on the front surface of the electrode separately, the base recessed portion is formed on the insulating film in advance and, thereafter, the base recessed portion is embedded with an electrode material under a predetermined condition, by which simultaneously with formation of the electrode, the base recessed portion formed on the insulating film can be used to form the recessed portions on the front surface of the electrode. Further, a requirement for avoiding, for example, short-circuiting across the substrate and the electrode can be met by interposing the insulating film between the electrode and the substrate.

The chip part may further include a wiring film which is interposed between the insulating film and the electrode to electrically connect the electrode with the circuit element.

With regard to the chip part, the electrode may be formed integrally with the front surface and side surfaces so as to cover an edge of the front surface of the substrate.

According to the arrangement, the electrode is formed on a side surface, in addition to the front surface of the substrate. Therefore, it is possible to increase an adhesion area when the chip part is soldered onto the mounting substrate. As a result, solder can be increased in adsorption amount in relation to the electrode, thus resulting in improvement in adhesion strength. Further, solder is adsorbed so as to flow around the side surfaces from the front surface of the substrate. Therefore, in a mounting state, the chip part can be held in two directions from the front surface and the side surfaces of the substrate. The chip part can thus be mounted in a stable manner.

With regard to the chip part, the substrate is formed in a rectangular shape in a plan view and the electrode may be formed so as to cover three directional edges of the substrate.

According to the arrangement, the chip part can be held from the front surface and the side surfaces of the substrate in three directions in a mounting state, by which the chip part can be mounted in a more stable manner.

With regard to the chip part, the electrode may include a pair of electrodes formed at an interval from each other, and the element region is formed between the pair of electrodes.

With regard to the chip part, the element region may include a plurality of element regions in which a plurality of circuit elements having a mutually different function are disposed on the substrate at an interval from each other, and the electrode includes a pair of electrodes which are formed on the front surface of the substrate so as to be individually connected to the plurality of element regions.

According to the arrangement, the chip part constitutes a composite chip part in which the plurality of circuit elements are disposed on the substrate which is in common. The composite chip part can be decreased in junction area (mounting area) in relation to the mounting substrate. Further, the composite chip part is made into an N-serially connected chip (N is a positive integer). Thereby, as compared with a case where a chip part having only one element is mounted N times, a chip part with the same function can be mounted in a single step. Still further, the chip part is greater in unit area than the single chip and, therefore, suction motions of a suction nozzle of the automatic mounting machine can be stabilized.

With regard to the chip part, the electrode may include an Ni layer, an Au layer and a Pd layer interposed between the Ni layer and the Au layer.

According to the arrangement, the Au layer is formed on the frontmost surface of the electrode which functions as an external connection electrode of the chip part. Therefore, excellent solder wettability and high reliability can be obtained when the chip part is mounted on the mounting substrate. Further, in the thus arranged electrode, the Au layer is made thin, by which even on occurrence of a penetrating hole (pinhole) on the Au layer, the Pd layer interposed between the Ni layer and the Au layer closes the penetrating hole. Thus, it is possible to prevent the Ni layer from being oxidized by exposure from the penetrating hole to the exterior.

With regard to the chip part, the circuit element may include any one of circuit elements such as a resistor, a capacitor, a fuse and a diode. The diode includes, for example, a pn diode, a Schottky diode and a Zener diode.

With regard to the chip part, the substrate may be made of an insulating material and a base recessed portion at which the substrate is dug down in the thickness direction may be formed on the front surface of the substrate at the same position as that at which the recessed portions of the electrode are formed in a plan view.

With this arrangement, there is no need for forming the insulating film and, therefore, where the substrate is made of an insulating material, steps of manufacturing the chip part can be made simple. In this case, the circuit element may include a resistor, a capacitor and a fuse.

The chip part may be used in a circuit assembly including, for example, a mounting substrate and others. In this case, the circuit assembly includes the chip part and a mounting substrate which has a land solder-bonded to the electrode on a mounting surface which faces the front surface of the substrate.

The circuit assembly may be used in an electronic device, for example. In this case, the electronic device includes the circuit assembly and a housing which houses the circuit assembly.

A method for manufacturing the chip part according to the one preferred embodiment of the present invention includes a step which forms an insulating film on a substrate, a step which forms a plurality of base recessed portions by selectively digging down the front surface of the insulating film in the thickness direction, and a step which forms an electrode by embedding the plurality of base recessed portions by an electrode material in such a manner that recessed portions are formed at positions of the plurality of base recessed portions on the front surface thereof.

According to the method, the recessed portions can be formed on the front surface of the electrode which is formed on the substrate. Therefore, it is possible to provide the chip part which realizes effects similar to those of the previously described chip part.

In the method for manufacturing the chip part, the step of forming the plurality of base recessed portions may include a step which forms the plurality of base recessed portions along a peripheral portion in a region in which the electrode is formed.

According to the method, the recessed portions are formed at a peripheral portion of the electrode and a flat portion is formed in which the recessed portions are not formed in the internal portion of the electrode. Therefore, even where probing is performed in a subsequent step, it is possible to restrict a position at which the probe is in contact with the electrode to the internal portion of the electrode. It is therefore possible to effectively suppress or prevent the probe from entering into the recessed portions. As a result, it is possible to perform the probing satisfactorily and also to secure a connection area satisfactorily when the chip part is mounted on the mounting substrate.

Mode for Carrying Out the Invention

Hereinafter, with reference to attached drawings, a detailed description will be given of modes according to the embodiments of the present invention and the reference examples (Reference Example 1 to Reference Example 11).

<Resistor Portion>

FIG. 1 is a schematic perspective view of a chip part 1 of Embodiment 1 of the present invention.

The chip part 1 is a minute chip part and has a rectangular parallelepiped shape as shown in FIG. 1. The planar shape of the chip part 1 may be a rectangle (0603 chip) with two orthogonal sides (long side 81, short side 82) respectively being 0.6 mm or less and 0.3 mm or less, or a rectangle (0404 chip) respectively being 0.4 mm or less and 0.2 mm or less. With regard to dimensions, the chip part 1 is preferably formed in a rectangular shape (03015 chip) with a length L1 (length of the long side 81) of approximately 0.3 mm, a width W1 (length of the short side 82) of approximately 0.15 mm and a thickness T1 of approximately 0.1 mm.

The chip part 1 is mainly provided with a substrate 2 which constitutes a main body of the chip part 1, a first connection electrode 3 and a second connection electrode 4 which act as an externally connected electrode and an element region 5 in which a circuit element externally connected by the first connection electrode 3 and the second connection electrode 4 is selectively formed.

The substrate 2 is formed in the shape of a substantially rectangular parallelepiped chip. With the substrate 2, one surface which constitutes the upper surface in FIG. 1 is an element forming surface 2A. The element forming surface 2A is the surface of the substrate 2 on which a circuit element is formed and has a substantially oblong shape. The surface at the opposite side of the element forming surface 2A in the thickness direction of the substrate 2 is a rear surface 2B. The element forming surface 2A and the rear surface 2B are substantially the same in dimension and shape and are parallel to each other. A rectangular edge defined by the pair of long sides 81 and the pair of short sides 82 at the element forming surface 2A shall be referred to as a peripheral edge portion 85, and a rectangular edge defined by the pair of long sides 81 and the pair of short sides 82 at the rear surface 2B shall be referred to as a peripheral edge portion 90. When viewed from the direction of a normal orthogonal to the element forming surface 2A (the rear surface 2B), the peripheral edge portion 85 and the peripheral edge portion 90 overlap each other.

As surfaces other than the element forming surface 2A and the rear surface 2B, the substrate 2 has a plurality of side surfaces (a side surface 2C, a side surface 2D, a side surface 2E and a side surface 2F). The plurality of side surfaces extend so as to intersect (specifically, so as to be orthogonal to) each of the element forming surface 2A and the rear surface 2B, and join the element forming surface 2A and the rear surface 2B.

The side surface 2C is constructed between the short sides 82 at one side in the long direction (the front left side in FIG. 1) of the element forming surface 2A and the rear surface 2B, and the side surface 2D is constructed between the short sides 82 at the other side in the long direction (the inner right side in FIG. 1) of the element forming surface 2A and the rear surface 2B. The side surface 2C and the side surface 2D are the respective end surfaces of the substrate 2 in the long direction. The side surface 2E is constructed between the long sides 81 at one side in the short direction (the inner left side in FIG. 1) of the element forming surface 2A and the rear surface 2B, and the side surface 2F is constructed between the long sides 81 at the other side in the short direction (the front right side in FIG. 1) of the element forming surface 2A and the rear surface 2B. The side surface 2E and the side surface 2F are the respective end surfaces of the substrate 2 in the short direction. The side surface 2C and the side surface 2D respectively intersect (specifically, are orthogonal to) the side surface 2E and the side surface 2F. Mutually adjacent surfaces among the element forming surface 2A to the side surface 2E thus form a right angle.

With the substrate 2, the respective entireties of the element forming surface 2A and the side surfaces 2C to 2E are covered by a passivation film 23. Therefore, to be exact, in FIG. 1, the respective entireties of the element forming surface 2A and the side surfaces 2C to 2E are positioned at the inner sides (rear sides) of the passivation film 23 and not exposed to the exterior. The chip part 1 further has a resin film 24. The resin film 24 covers the entirety (the peripheral edge portion 85 and a region at the inner side thereof) of the passivation film 23 on the element forming surface 2A. The passivation film 23 and the resin film 24 will be described later in detail.

Each of the first connection electrode 3 and the second connection electrode 4 is formed integrally on the element forming surface 2A of the substrate 2 so as to extend from the element forming surface 2A to the corresponding side surfaces 2C to 2E and thereby cover the peripheral edge portion 85. Each of the first connection electrode 3 and the second connection electrode 4 is formed so as to be exposed to the frontmost surface of the chip part 1. The first connection electrode 3 and the second connection electrode 4 are disposed at an interval from each other, in the long direction of the element forming surface 2A. At this arrangement position, the first connection electrode 3 is formed to integrally cover the three side surfaces 2C, 2E, 2F along one short side 82 (the short side 82 at the side surface 2C side) of the chip part 1 and the pair of long sides 81 at the respective sides thereof. On the other hand, the second connection electrode 4 is formed to integrally cover the three side surfaces 2D, 2E, 2F along the other short side 82 (the short side 82 at the side surface 2D side) of the chip part 1 and the pair of long sides 81 at the respective sides thereof. Respective corner portions 11 at which the side surfaces intersect with each other at the respective end portions in the long direction of the substrate 2 are thereby covered respectively by the first connection electrode 3 and the second connection electrode 4. The first connection electrode 3 and the second connection electrode 4 are substantially the same in dimension and shape in a plan view from the direction of a normal orthogonal to the element forming surface 2A (the rear surface 2B).

The first connection electrode 3 has a pair of long sides 3A and a pair of short sides 3B which constitute four sides in a plan view. The long side 3A is orthogonal to the short side 3B in a plan view. In a plan view in the direction of the normal orthogonal to the element forming surface 2A (rear surface 2B), a plurality of recessed portions 6 are formed on the front surface of the first connection electrode 3.

The plurality of recessed portions 6 are formed at the peripheral portion of the first connection electrode 3, at an interval from each other. More specifically, the plurality of recessed portions 6 are formed at regions along the long sides 3A and the short sides 3B of the first connection electrode 3, at an interval from each other. Each of the recessed portions 6 is formed, for example, substantially in a circular shape in a plan view. The recessed portion 6 is 2 μm to 30 μm in width (outer diameter) and 2 μm to 20 μm in depth (a position of a bottom portion of the recessed portion 6 in relation to the front surface of the first connection electrode 3). Each of the recessed portions 6 may be formed in a tetragonal shape in a plan view, in addition to a circular shape in a plan view. A flat portion 7 free of the recessed portions 6 is formed at an internal portion of the first connection electrode 3 surrounded by the plurality of recessed portions 6.

The flat portion 7 is formed so as to assume a substantially oblong shape at the internal portion of the first connection electrode 3. In the step of manufacturing the chip part 1, the circuit element which has been formed in the element region 5 is subjected to probing (electrical test). As described above, the flat portion 7 is provided on the front surface of the first connection electrode 3, by which a probe 70*a* (refer to FIG. 14E) can be suppressed or prevented from entering into the recessed portions 6 of the first connection electrode 3. As a result, it is possible to satisfactorily secure a contact region of the probe 70*a*. It is also possible to satisfactorily secure a connection area when the chip part 1 is mounted on the mounting substrate 9 (refer to FIG. 19).

The second connection electrode 4 has a pair of long sides 4A and a pair of short sides 4B which constitute four sides in a plan view. The long side 4A is orthogonal to the short side 4B in a plan view. The long side 3A and the long side 4A extend parallel with the short sides 82 of the substrate 2, while the short side 3B and the short side 4B extend parallel with the long sides 81 of the substrate 2. Further, the chip part 1 is not provided with an electrode on the rear surface 2B. A plurality of recessed portions 6 and a flat portion 7 are formed also on the front surface of the second connection electrode 4 in an arrangement similar to that of the first connection electrode 3. The plurality of recessed portions 6 and the flat portion 7 which have been formed in the second connection electrode 4 are similar in arrangement to the plurality of recessed portions 6 and the flat portion 7 which have been formed in the first connection electrode 3. Therefore, a description thereof is omitted here.

A circuit element is formed in the element region 5. The circuit element is formed in a region between the first connection electrode 3 and the second connection electrode 4 on the element forming surface 2A of the substrate 2 and covered from above by the passivation film 23 and the resin film 24.

Figure 2:
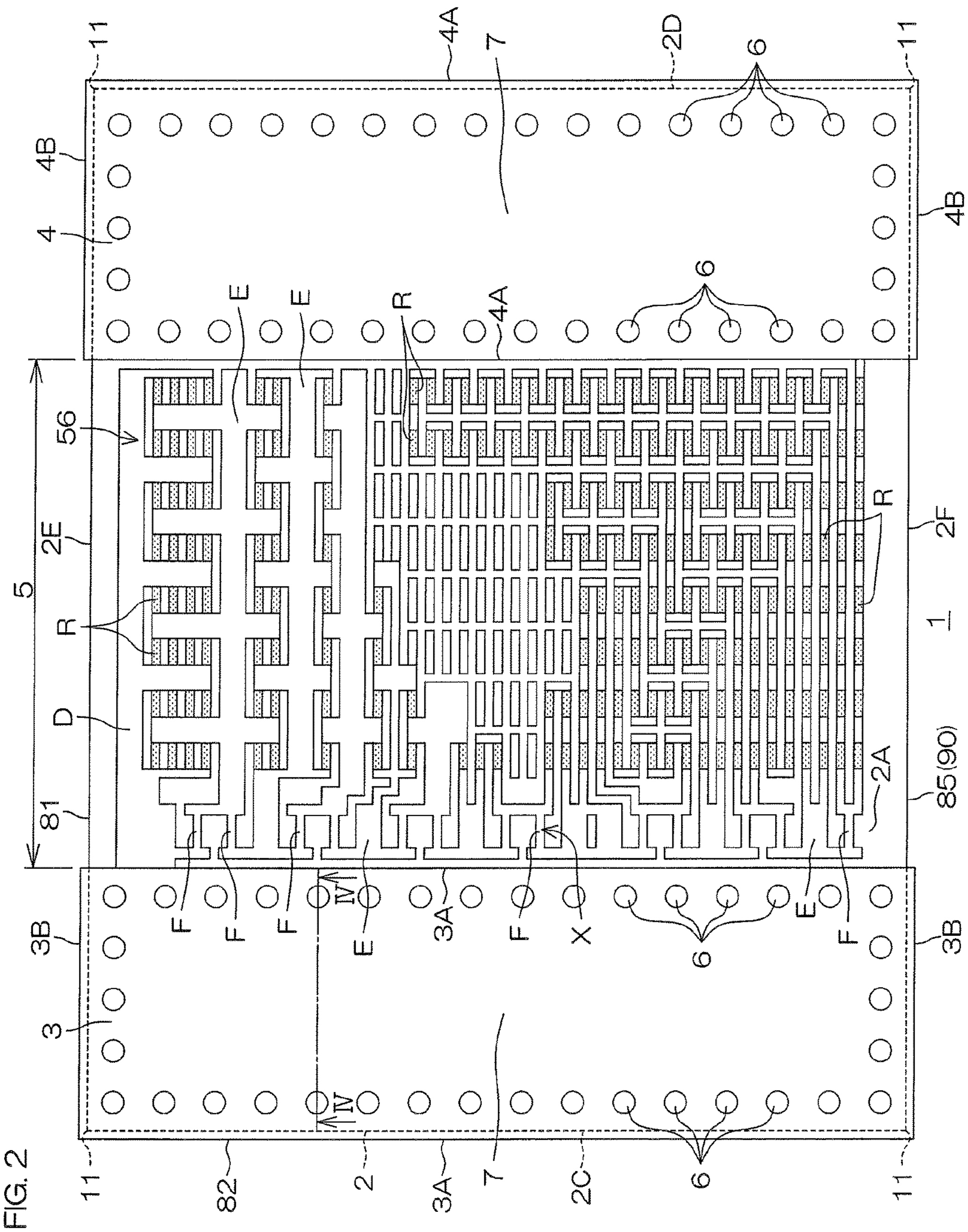
FIG. 2 is a plan view of the chip part shown in FIG. 1 or a view which shows a positional relationship between a connection electrode and a circuit element as well as an arrangement of the element in a plan view.

FIG. 2 is a plan view of the chip part 1 in FIG. 1 which shows a positional relationship between the first connection electrode 3, the second connection electrode 4 and the circuit element (resistor portion 56) as well as an arrangement of the circuit element (resistor portion 56) in a plan view.

With reference to FIG. 2, in the present preferred embodiment, a resistor portion 56 is formed as a circuit element. The resistor portion 56 is arranged by a resistor circuit network in which a plurality of (unit) resistor bodies R, each of which has an equal resistance value, are aligned in a matrix form on the element forming surface 2A. The resistor body R is made of TiN (titanium nitride), TiON (titanium oxide nitride) or TiSiON. The resistor portion 56 is electrically connected to a wiring film 22 to be described below and electrically connected to the first connection electrode 3 and the second connection electrode 4 via the wiring film 22. The resistor portion 56 is thus formed on the substrate 2 and is connected between the first connection electrode 3 and the second connection electrode 4.

More specifically, the resistor portion 56 is provided with a total of 352 resistor bodies R arranged from 8 resistor bodies R aligned along a row direction (in the long direction of the substrate 2) and 44 resistor bodies R aligned along a column direction (in the width direction of the substrate 2). These resistor bodies R are a plurality of element components which constitute a resistor circuit network of the resistor portion 56.

The plurality of resistor bodies R are electrically connected in individual groups of 1 to 64, thereby forming a plurality of types of resistor circuits. Each of the thus formed plurality of types of resistor circuits is connected by a conductor film E (a wiring film composed of a conductor) in a predetermined mode. Further, on the element forming surface 2A of the substrate 2, a plurality of fuses F are provided that are capable of being cut (fused) to electrically incorporate a resistor circuit into the resistor portion 56 or electrically separate the resistor circuit from the resistor portion 56. The plurality of fuses F and the conductor films E are aligned along the inner side of the first connection electrode 3 so that the positioning regions thereof are rectilinear. More specifically, the plurality of fuses F and the conductor films E are disposed adjacently and the direction of alignment thereof is rectilinear. The plurality of fuses F connect each of the plurality of types of resistor circuits (each of the plurality of resistor bodies R of respective resistor circuits) to the first connection electrode 3 so as to enable cutting (enabling disconnection).

Figure 3A:
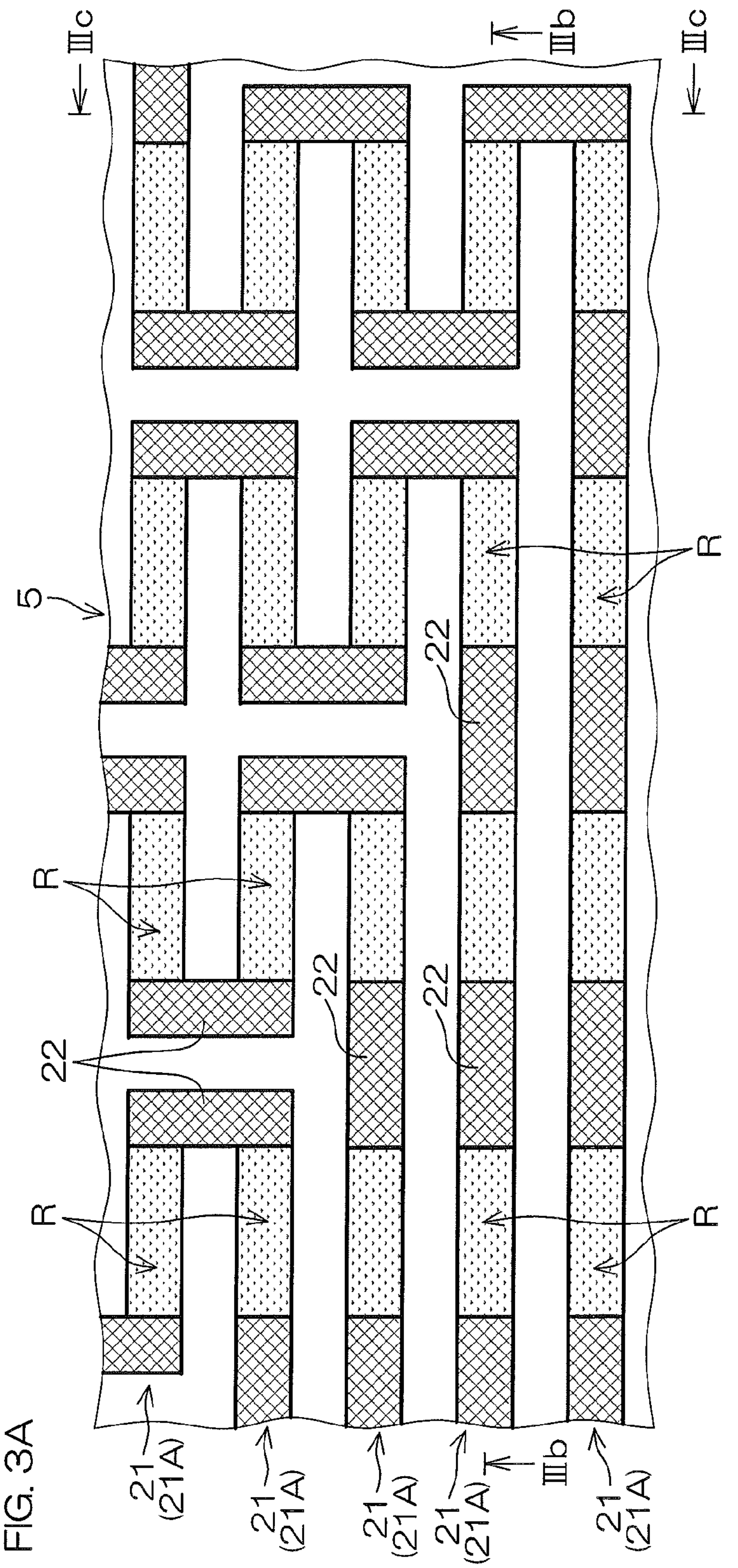
FIG. 3A is a partially enlarged plan view of the element shown in FIG. 2.
Figure 3B:
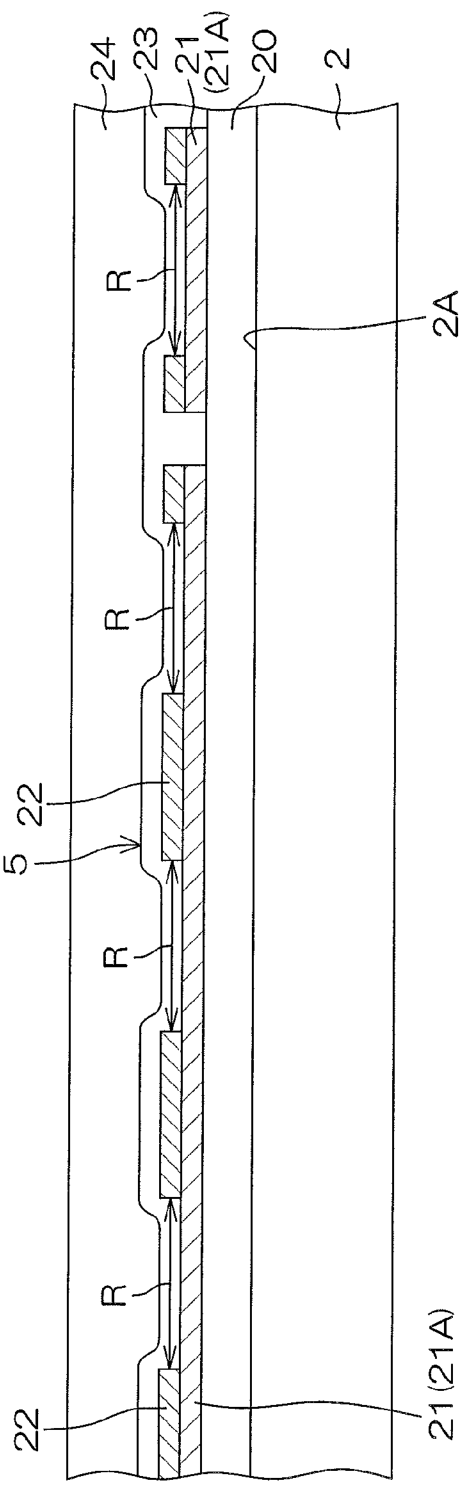
FIG. 3B is a sectional view taken along section line IIIb-IIIb in FIG. 3A.
Figure 3C:
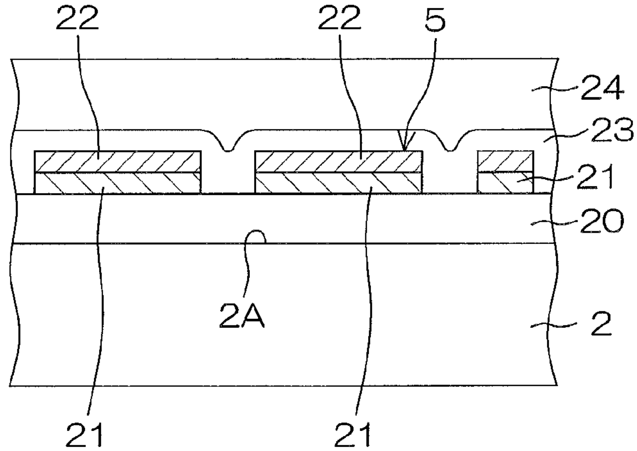
FIG. 3C is a sectional view taken along section line IIc-IIc in FIG. 3A.
Figure 4:
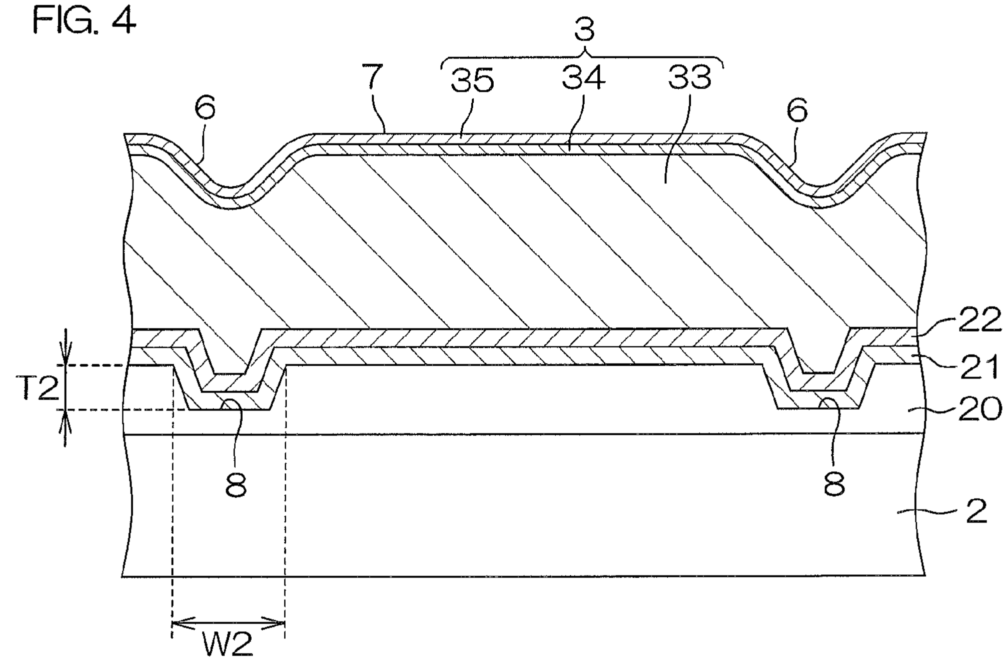
FIG. 4 is a sectional view taken along section line IV-IV in FIG. 2.

FIG. 3A is a partially enlarged plan view of the resistor portion 56 shown in FIG. 2. FIG. 3B is a sectional view taken along section line IIIb-IIIb in FIG. 3A. FIG. 3C is a sectional view taken along section line IIIc-IIIc in FIG. 3A. FIG. 4 is a sectional view taken along section line IV-IV in FIG. 2.

With reference to FIG. 3A to FIG. 3C, a description will be given of an arrangement of the resistor portion 56 (resistor body R) and, thereafter, a description will be given of an arrangement of the first connection electrode 3 and the second connection electrode 4 of the chip part 1.

Other than the wiring film 22, the passivation film 23 and the resin film 24, the chip part 1 also includes an insulating film 20 and a resistor body film 21 (refer to FIG. 3B and FIG. 3C). The insulating film 20, the resistor body film 21, the wiring film 22, the passivation film 23 and the resin film 24 are formed on the substrate 2 (element forming surface 2A).

The insulating film 20 contains, for example, Sift (silicon oxide). The insulating film 20 covers the entirety of the element forming surface 2A of the substrate 2. The insulating film 20 is 0.1 μm to 5 μm in thickness. In the present preferred embodiment, a description will be given of an example where the insulating film 20 is made of a single layer. However, an insulating film made of a plurality of layers may be formed. Further, the insulating film 20 is not limited to the previously described thickness and may be formed thicker.

The resistor body film 21 is formed on the insulating film 20. The resistor body film 21 is formed of TiN, TiON or TiSiON. The thickness of the resistor body film 21 is approximately 2000 Å, for example. The resistor body film 21 is arranged as a plurality of resistor body films (hereinafter, referred to as "resistor body film lines 21A") extending parallel and rectilinearly between the first connection electrode 3 and the second connection electrode 4, and there are cases where a resistor body film line 21A is cut at a predetermined position in the line direction (refer to FIG. 3A).

The wiring film 22 is laminated on the resistor body film line 21A. The wiring film 22 is made of Al (aluminum) or an alloy (AlCu alloy) of aluminum and Cu (copper). The thickness of each wiring film 22 is approximately 8000 Å. The wiring film 22 is laminated on the resistor body film line 21A at a fixed interval R in the line direction and is in contact with the resistor body film line 21A.

Figure 5A:
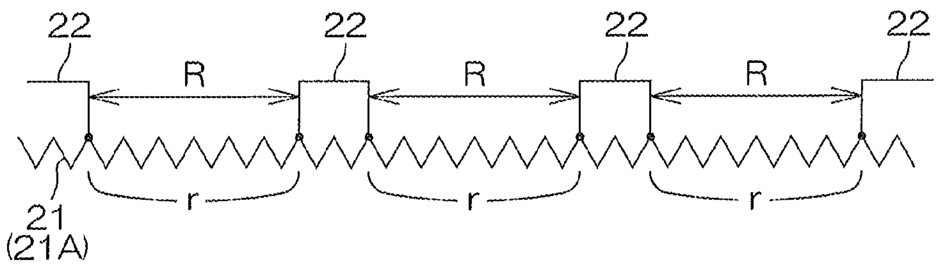
FIGS. 5A-5C are drawings, each of which shows electric characteristics of a resistor body film line and a wiring film indicated by using circuit symbols and an electric circuit diagram.
Figure 5B:
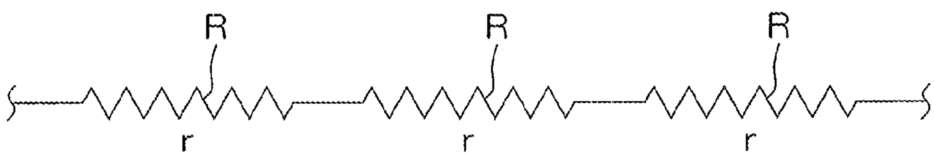
Figure 5C:
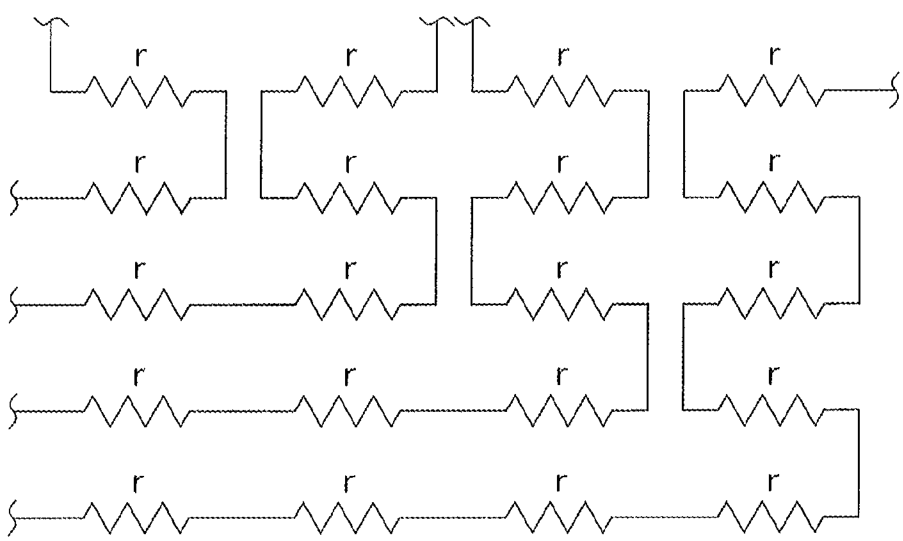

The electrical features of the resistor body film line 21A and the wiring film 22 of this arrangement are indicated by circuit symbols in FIGS. 5A-5C. That is, as shown in FIG. 5A, each of resistor body film line 21A portions in a region of the predetermined interval R forms a single resistor body R with a fixed resistance value r.

In each region at which the wiring film 22 is laminated, the wiring film 22 electrically connects mutually adjacent resistor bodies R, so that the resistor body film line 21A is short-circuited by the wiring film 22. A resistor circuit, made up of serial connections of resistor bodies R with a resistance value r is, thus, formed as shown in FIG. 5B.

Further, adjacent resistor body film lines 21A are connected to each other by the resistor body film 21 and the wiring film 22, and the resistor circuit network of the resistor portion 56 shown in FIG. 3A thus constitutes the resistor circuits (made up of the unit resistor portions of the previously described resistor bodies R) shown in FIG. 5C. The resistor body film 21 and the wiring films 22 thus constitute the resistor bodies R and the resistor circuits (that is, the resistor portion 56). Each resistor body R includes a resistor body film line 21A (resistor body film 21) and a plurality of wiring films 22 laminated on the resistor body film line 21A at the fixed interval in the line direction, and the resistor body film line 21A of the fixed interval R portion on which the wiring film 22 is not laminated constitutes a single resistor body R. The resistor body film lines 21A at the portions constituting the resistor bodies R are all equal in shape and dimension. The multiple resistor bodies R aligned in a matrix form on the substrate 2 are thus equal in resistance value.

Still further, the wiring films 22 laminated on the resistor body film lines 21A form the resistor bodies R and also serve the role of conductor films E that connect a plurality of resistor bodies R to arrange a resistor circuit (refer to FIG. 2).

With reference to FIG. 4, a detailed description will be given of a region in which the first connection electrode 3 of the chip part 1 is formed. In FIG. 4, a region in which the second connection electrode 4 has been formed is similar in arrangement to the region in which the first connection electrode 3 has been formed, and illustration thereof is omitted here.

The first connection electrode 3 has a laminated structure made up of an Ni layer 33, a Pd layer 34 and an Au layer 35. In the region on which the first connection electrode 3 is formed, as described previously, the insulating film 20 is formed on the substrate 2. The insulating film 20 is provided with a plurality of base recessed portions 8 at a position corresponding to the region on which recessed portions 6 of the first connection electrode 3 are formed.

The plurality of base recessed portions 8 are formed so as to dig down the insulating film 20 toward the thickness direction, and the bottom surface thereof is positioned at a middle portion of the insulating film 20 in the thickness direction (that is, between the front surface of the substrate 2 and the front surface of the insulating film 20). Each of the base recessed portions 8 is provided with, for example, a circular opening in a plan view and a bottom surface smaller in area than the opening. And, the side surfaces of each base recessed portion 8 are constructed at an opening end of the opening and on the bottom surface. That is, each of the base recessed portions 8 is formed in a tapered shape in which an opening width thereof is gradually decreased from the opening end to the bottom surface in a sectional view.

The shape of each of the base recessed portions 8 is not limited to the tapered shape in a sectional view. The base recessed portion 8 may be formed so that a side surface of the base recessed portion 8 is at a right angle in relation to the front surface of the insulating film 20 (that is, the opening area of the base recessed portion 8 is equal to the bottom surface area). The bottom surface of the base recessed portion 8 may be parallel with the front surface of the insulating film 20. Further, the base recessed portion 8 may be formed so as to give a smooth curve from the side surface in the thickness direction.

Each of the base recessed portions 8 is from 2 μm to 20 μm (in the present preferred embodiment, 4 μm) in opening width W2 (outer diameter of the base recessed portion 8) and from 0.4 μm to 5 μm the present preferred embodiment, 0.8 μm) in depth T2 (a position of the bottom surface of each base recessed portion 8 in relation to the front surface of the first connection electrode 3). In addition, individual numerical values indicating the opening width W2 and the depth T2 of each base recessed portion 8 are only examples and these values may be changed whenever necessary in accordance with a size and a depth of the recessed portion 6 to be formed on the first connection electrode 3 and the second connection electrode 4.

The resistor body film 21 formed on the insulating film 20 and the wiring film 22 formed on the resistor body film 21 are formed respectively so as to enter below the first connection electrode 3 (a region directly below) and connected to the first connection electrode 3. More specifically, the resistor body film 21 and the wiring film 22 are formed along the side surfaces and the bottom surface of the base recessed portion 8 as well as along the front surface of the insulating film 20 in such a manner that one front surface (front surface) and the other front surface (rear surface) enter into a recessed space defined by the side surfaces and the bottom surface of the base recessed portion 8. Thereby, in the region in which the base recessed portions 8 are formed, a recessed space is further defined by the resistor body film 21 and the wiring film 22.

Then, the first connection electrode 3 is formed on the wiring film 22 in such a manner that the recessed space defined by the resistor body film 21 and the wiring film 22 is further refilled. Thereby, the recessed portion 6 is formed on the first connection electrode 3 at a position corresponding to the region in which the base recessed portion 8 is formed. That is, the recessed portion 6 is a portion at which the front surface of the first connection electrode 3 is smoothly recessed toward the thickness direction of the chip part 1, and the bottom portion thereof does not reach the element forming surface 2A.

Figure 6:
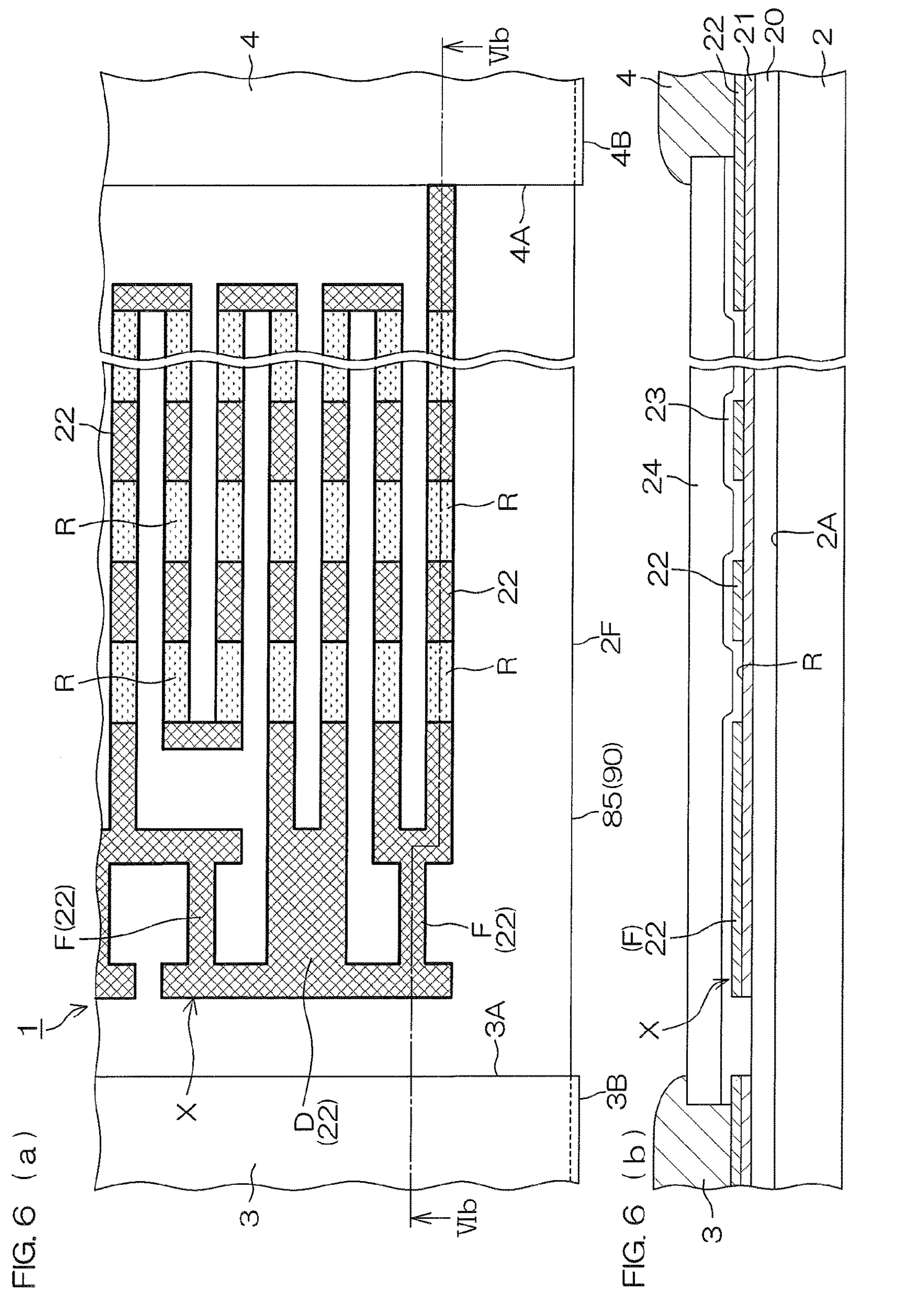
FIG. 6(*a*) is a partially enlarged plan view of a region including a fuse drawn by enlarging a portion of the plan view of the chip part shown in FIG. 2, and FIG. 6(*b*) is a sectional view taken along section line VIb-VIb in FIG. 6(*a*).

FIG. 6(*a*) is a partially enlarged plan view of a region which includes the fuses F drawn by enlarging a portion of the plan view of the chip part 1 shown in FIG. 2. FIG. 6(*b*) is a sectional view taken along section line VIb-VIb in FIG. 6(*a*).

As shown in FIGS. 6(*a*) and (*b*), the fuses F and the conductor films E are also formed by the wiring films 22 which are laminated on the resistor body film 21 that forms the resistor bodies R. That is, the fuses F and the conductor films E are made of Al or an AlCu alloy which is the same metal material as that of the wiring film 22 at the same layer as the wiring films 22, which are laminated on the resistor body film lines 21A that form the resistor bodies R. As described above, the wiring films 22 are also used as the conductor films E that electrically connect a plurality of resistor bodies R to form a resistor circuit.

That is, at the same layer laminated on the resistor body film 21, the wiring films for forming the resistor bodies R, the fuses F, the conductor films E, and the wiring films for connecting the resistor portion 56 to the first connection electrode 3 and the second connection electrode 4 are formed as the wiring film 22 using the same metal material (Al or an AlCu alloy). The fuses F differ (are distinguished) from the wiring films 22 because the fuses F are formed narrowly to enable easy cutting and also because the fuses F are disposed so that other circuit components are not present in the peripheries thereof.

Here, a region of the wiring film 22 in which the fuses F are disposed shall be referred to as a trimming region X (refer to FIG. 2 and FIG. 6(*a*)). The trimming region X is a rectilinear region along the inner side of the first connection electrode 3, and not only the fuses F but also the conductor films E are disposed in the trimming region X. The resistor body film 21 is also formed below the wiring films 22 in the trimming region X (refer to FIG. 6(*b*)). The fuses F are wirings that are greater in interwiring distance (further separated from the peripheries) than portions of the wiring films 22 other than the trimming region X.

The fuse F may refer not only to a portion of the wiring films 22 but also to an assembly (fuse element) of a portion of a resistor body R (resistor body film 21) and a portion of the wiring film 22 on the resistor body film 21.

Further, although only a case where the same layer is used for the fuse F as that used for the conductor films E has been described, the conductor films E may have another conductor film laminated further thereon to decrease an overall resistance value of the conductor films E. Even in this case, the fusing property of the fuses F is not degraded as long as a conductor film is not laminated on the fuses F.

Figure 7:
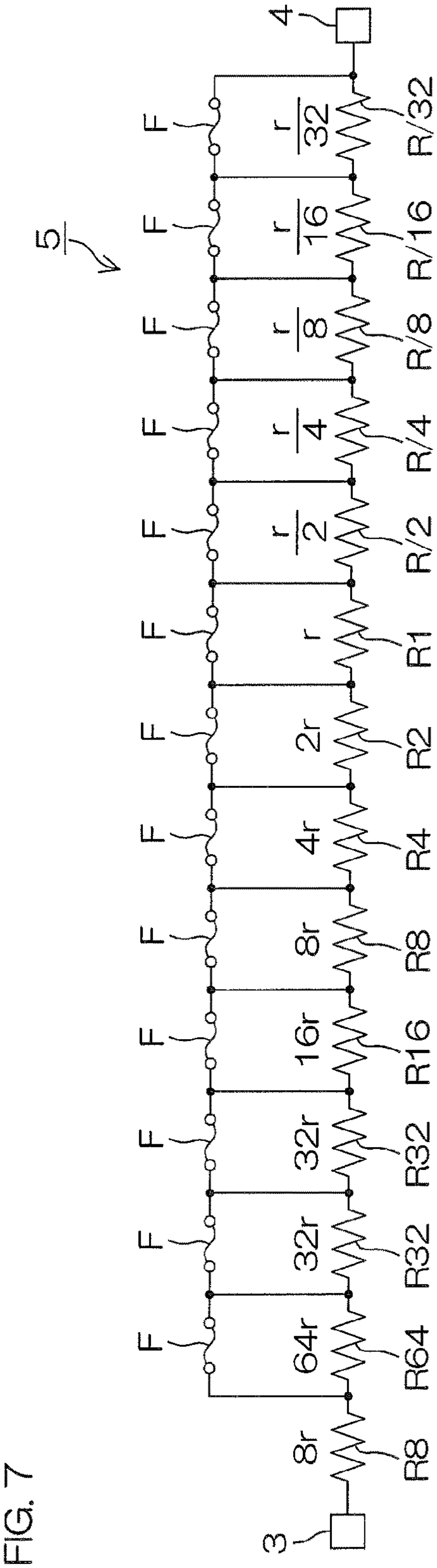
FIG. 7 is one electric circuit diagram which is arranged by the resistor body film line and the wiring film.

FIG. 7 is an electric circuit diagram arranged by the resistor body film line 21A and the wiring films 22.

Referring to FIG. 7, the resistor portion 56 is arranged by serially connecting a reference resistor circuit R8, a resistor circuit R64, two resistor circuits R32, a resistor circuit R16, a resistor circuit R8, a resistor circuit R4, a resistor circuit R2, a resistor circuit R1, a resistor circuit R/2, a resistor circuit R/4, a resistor circuit R/8, a resistor circuit R/16 and a resistor circuit R/32 in that order from the first connection electrode 3. The reference resistor circuit R8 and each of the resistor circuits R64 to R2 are arranged by serially connecting the same number of resistor bodies R as the number at the end of its symbol ("64" in the case of R64). The resistor circuit R1 is arranged by a single resistor body R. Each of the resistor circuits R/2 to R/32 is arranged by connecting the same number of resistor bodies R as the number at the end of its symbol ("32" in the case of R/32) in parallel. The meaning of the number at the end of the symbol of the resistor circuit is the same in FIG. 8 and FIG. 9 to be described below.

Then, one fuse F is connected in parallel to each of the resistor circuits R64 to the resistor circuit R/32, other than the reference resistor circuit R8. The fuses F are mutually connected in series directly or via the conductor films E (refer to FIG. 6(*a*)).

In a state where none of the fuses F is fused as shown in FIG. 7, the resistor portion 56 constitutes a resistor circuit of the reference resistor circuit R8 formed by the serial connection of the 8 resistor bodies R provided between the first connection electrode 3 and the second connection electrode 4. For example, if the resistance value r of a single resistor body R is r=8Ω, the chip part 1 is arranged, with the first connection electrode 3 and the second connection electrode 4 being connected by the resistor circuit (reference resistor circuit R8) of 8r=64Ω.

Further, in the state where none of the fuses F is fused, the plurality of types of resistor circuits, other than the reference resistor circuit R8, are put in short-circuited states. That is, although 13 resistor circuits R64 to R/32 of 12 types are connected in series to the reference resistor circuit R8, each resistor circuit is short circuited by the fuse F that is connected in parallel and thus, electrically, the respective resistor circuits are not incorporated in the resistor portion 56.

With the chip part 1 according to the present preferred embodiment, a fuse F is selectively fused, for example, by laser light in accordance with the required resistance value. The resistor circuit with which the fuse F connected in parallel is fused is thereby incorporated into the resistor portion 56. An overall resistance value of the resistor portion 56 can thus be set to a resistance value obtained by serially connecting and incorporating the resistor circuits corresponding to the fused fuses F.

In particular, the plurality of types of resistor circuits include the plurality of types of serial resistor circuits, with which the resistor bodies R having an equal resistance value are connected in series, with the number of resistor bodies R being increased in geometric progression with a geometric ratio of 2 as 1, 2, 4, 8, 16, 32, . . . , and the plurality of types of parallel resistor circuits, with which the resistor bodies R having an equal resistance value are connected in parallel, with the number of resistor bodies R being increased in geometric progression with a geometric ratio of 2 as 2, 4, 8, 16, . . . . Therefore, by selectively fusing the fuses F (including the fuse elements), the overall resistance value of the resistor portion 56 can be adjusted finely and digitally to an arbitrary resistance value, thus making it possible to generate a resistance of a desired value in the chip part 1.

Figure 8:
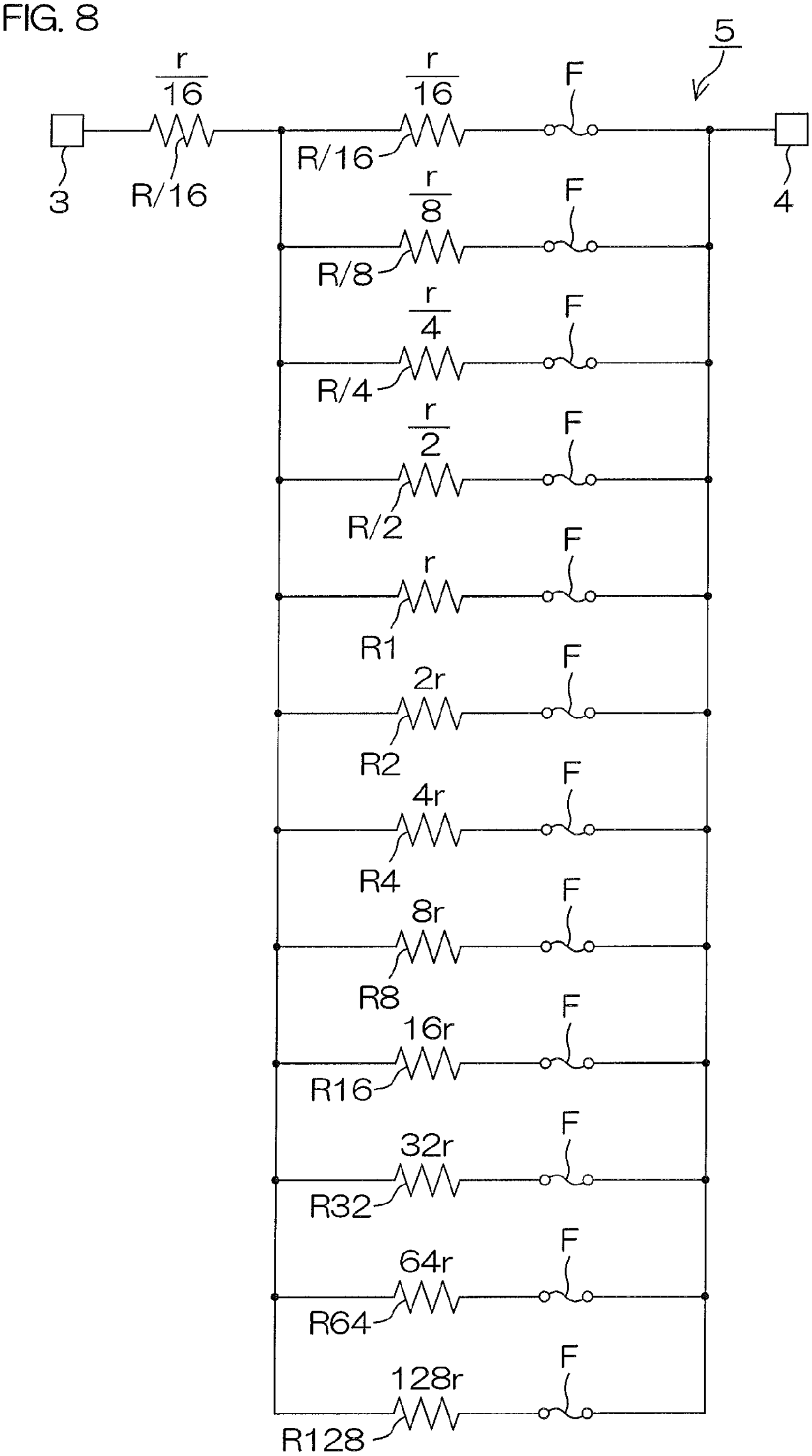
FIG. 8 is another electric circuit diagram which is arranged by the resistor body film line and the wiring film.

FIG. 8 is another electric circuit diagram arranged by the resistor body film lines 21A and the wiring films 22.

Instead of arranging the resistor portion 56 by serially connecting the reference resistor circuit R8 and the resistor circuit R64 to the resistor circuit R/32 as shown in FIG. 7, the resistor portion 56 may be arranged as shown in FIG. 8. Specifically, the resistor portion 56 may be arranged, between the first connection electrode 3 and the second connection electrode 4, as a serial connection circuit of the reference resistor circuit R/16 with the parallel connection circuit of the 12 types of resistor circuits R/16, R/8, R/4, R/2, R1, R2, R4, R8, R16, R32, R64, and R128.

In this case, a fuse F is serially connected to each of the 12 types of resistor circuits other than the reference resistor circuit R/16. In the state where none of the fuses F is fused, the respective resistor circuits are electrically incorporated in the resistor portion 56. By selectively fusing a fuse F, for example, by laser light in accordance with the required resistance value, the resistor circuit corresponding to the fused fuse F (the resistor circuit connected in series to the fuse F) is electrically separated from the resistor portion 56, and the overall resistance value of the chip part 1 can thereby be adjusted.

Figure 9:
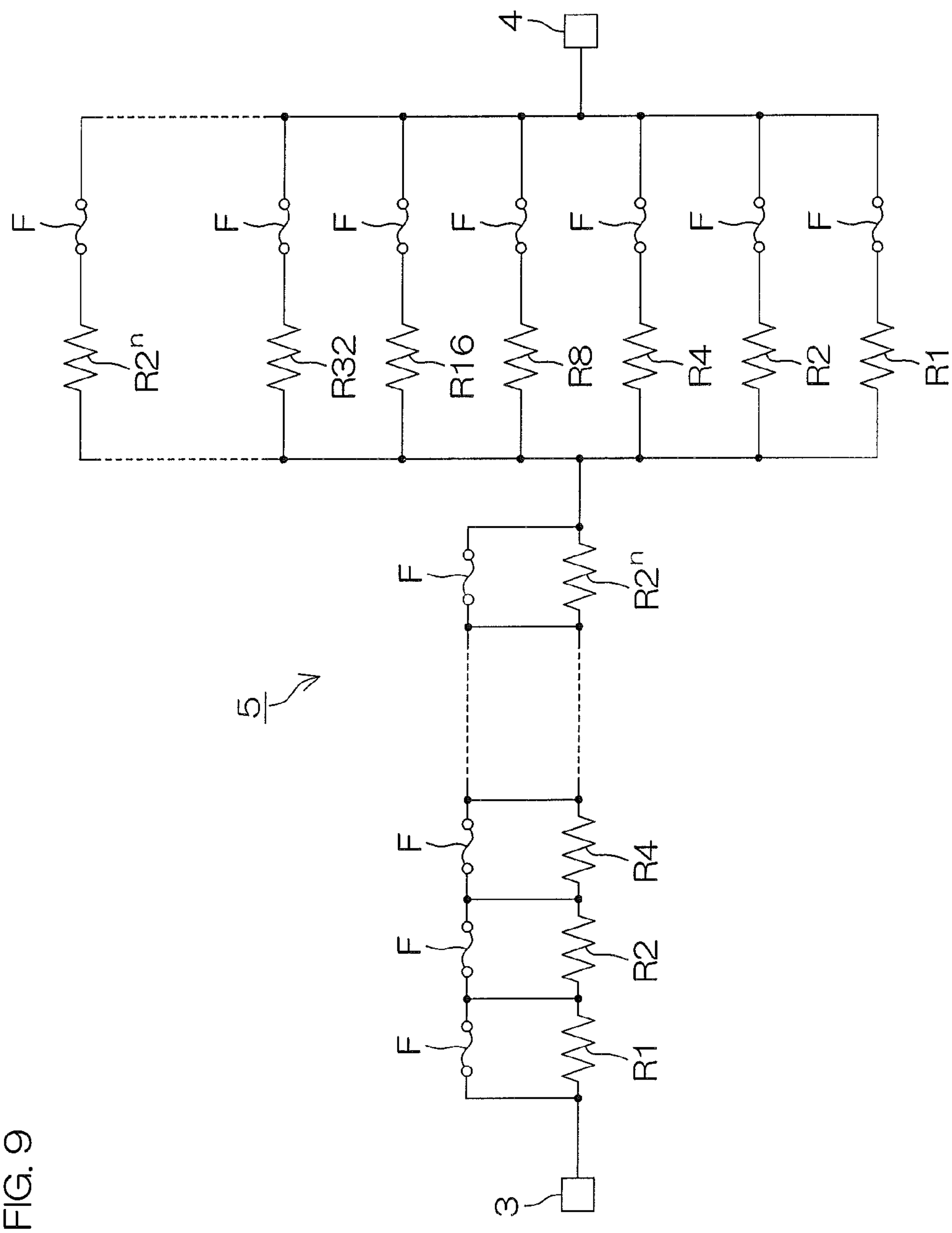
FIG. 9 is still another electric circuit diagram which is arranged by the resistor body film line and the wiring film.

FIG. 9 is still another electric circuit diagram arranged by the resistor body film lines 21A and the wiring films 22.

The resistor portion 56 shown in FIG. 9 is characterized in that it has the circuit arrangement where a serial connection of a plurality of types of resistor circuits and a parallel connection of a plurality of types of resistor circuits are connected in series. As with the previous embodiment, with the plurality of types of resistor circuits connected in series, a fuse F is connected in parallel to each resistor circuit, and all the plurality of types of resistor circuits that have been connected in series are put in short-circuited states by the fuses F. Therefore, when a fuse F is fused, the resistor circuit that has been short-circuited by the fused fuse F is electrically incorporated into the resistor portion 56.

On the other hand, a fuse F is connected in series to each of the plurality of types of resistor circuits that are connected in parallel. Therefore, by fusing a fuse F, the resistor circuit connected in series to the fused fuse F can be electrically disconnected from the parallel connection of the resistor circuits.

With this arrangement, for example, by forming a low resistor portion of 1 kΩ or less at the parallel connection side and forming a resistor circuit of 1 kΩ or more at the serial connection side, resistor circuits of a wide range, from a low resistor portion of several Ω to a high resistor portion of several MΩ can be formed using resistor networks arranged with the same basic design. That is, with the chip part 1, a plurality of types of resistance values can be accommodated easily and rapidly by selecting and cutting one or a plurality of fuses F. In other words, chip parts 1 of various resistance values can be realized with a common design in combination of a plurality of resistor bodies R that differ in resistance value.

With the chip part 1, a connection state of the plurality of resistor bodies R (resistor circuits) in the trimming region X can be changed as described above.

Next, the chip part 1 will be described in further detail with reference to FIG. 10.

Figure 10:
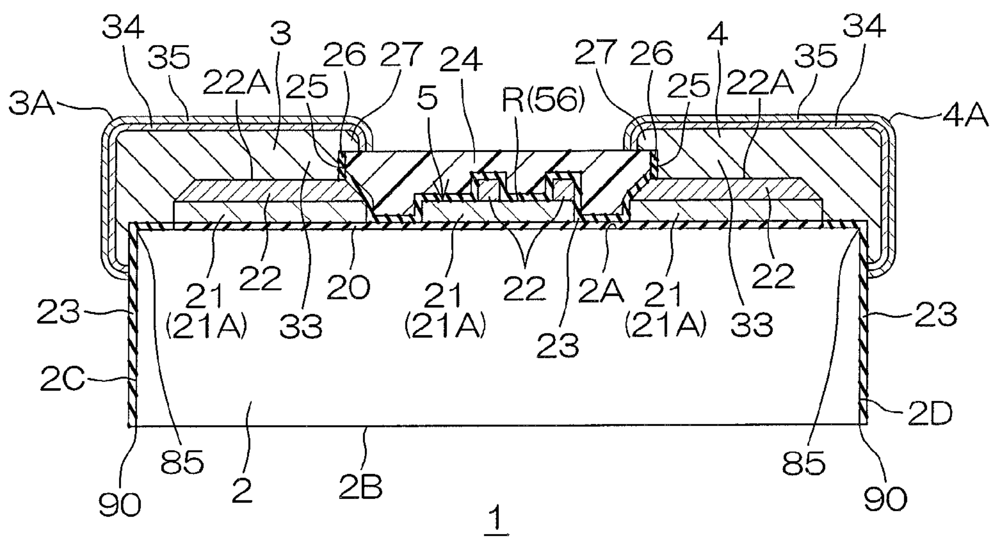
FIG. 10 is a schematic sectional view of the chip part.

FIG. 10 is a schematic sectional view of the chip part 1. For the sake of description, in FIG. 10, the previously described resistor portion 56, the insulating film 20, and an arrangement of recessed portions 6 formed on the first connection electrode 3 and the second connection electrode 4 are illustrated in a simplified form, and hatching is applied to individual components other than the substrate 2.

Here, the passivation film 23 and the resin film 24 will be described.

The passivation film 23 is made of, for example, SiN (silicon nitride) and the thickness thereof is 1000 Å to 5000 Å (approximately 3000 Å here). The passivation film 23 is provided substantially across the respective entireties of the element forming surface 2A and the side surfaces 2C to 2E. The passivation film 23 on the element forming surface 2A covers the resistor body film 21 and the respective wiring films 22 on the resistor body film 21 (that is, the resistor portion 56) from the front surface (upper side in FIG. 10) and covers the upper surfaces of the respective resistor bodies R in the resistor portion 56. The passivation film 23 thus covers the wiring films 22 in the previously described trimming region X as well (refer to FIG. 6(*b*)). The passivation film 23 is in contact with the resistor portion 56 (the wiring films 22 and the resistor body film 21) and also in contact with the insulating film 20 in regions other than the resistor body film 21. The passivation film 23 on the element forming surface 2A thus functions as a protective film that covers the entirety of the element forming surface 2A to protect the resistor portion 56 and the insulating film 20. Further, at the element forming surface 2A, the passivation film 23 prevents short-circuiting across the resistor bodies R (short-circuiting across adjacent resistor body film lines 21A) at portions other than the wiring film 22.

On the other hand, the passivation film 23 provided on the respective side surfaces 2C to 2E is interposed between the side surface portions of the first connection electrode 3 and the second connection electrode 4 and the side surfaces 2C to 2E of the substrate 2, thereby functioning as a protective layer that protects the respective side surfaces 2C to 2E. Thereby, a requirement for avoiding short-circuiting of the substrate 2 and the first connection electrode 3 or the second connection electrode 4, can be met. The passivation film 23 is an extremely thin film and, therefore, in the present preferred embodiment, the passivation film 23 covering each of the side surfaces 2C to 2E will be regarded as a portion of the substrate 2. The passivation film 23 covering each of the side surfaces 2C to 2E will thus be regarded to be each of the side surface 2C to 2E itself.

The resin film 24 protects the element forming surface 2A of the chip part 1 together with the passivation film 23 and is made of a resin such as polyimide. The thickness of the resin film 24 is approximately 5 μm.

The resin film 24 covers the entirety of a front surface of the passivation film 23 on the element forming surface 2A (including the resistor body film 21 and the wiring films 22 covered by the passivation film 23).

In the resin film 24, each one of notched portions 25 is formed to expose peripheral edge portions of the wiring films 22 that face side surface portions of the first connection electrode 3 and the second connection electrode 4. Each of the notched portions 25 penetrates continuously through both the resin film 24 and the passivation film 23 in the thickness direction. The notched portions 25 are thus formed not only in the resin film 24 but also in the passivation film 23. Thereby, with each of the wiring films 22, only an inner peripheral edge portion close to the resistor portion 56 is selectively covered by the resin film 24, while the other peripheral edge portion along the peripheral edge portion 85 of the substrate 2 is selectively exposed via the notched portion 25. The front surfaces of the wiring films 22 exposed at the individual notched portions 25 are pad regions 22A for external connection.

Further, on the element forming surface 2A, the wiring film 22 exposed from the notched portion 25 is positioned inwardly from the peripheral edge portion 85 of the substrate 2 across a predetermined interval (for example of 3 μm to 6 μm). Still further, an insulating film 26 is formed on an entirety of a side surface of the notched portion 25 from one short side 82 of the chip part 1 to the other short side 82.

Of the two notched portions 25, one notched portion 25 is completely filled by the first connection electrode 3 and the other notched portion 25 is completely filled by the second connection electrode 4. As mentioned previously, the first connection electrode 3 and the second connection electrode 4 are formed to cover the side surfaces 2C to 2E, in addition to the element forming surface 2A. Further, each of the first connection electrode 3 and the second connection electrode 4 is formed to project from the resin film 24 and has a lead-out portion 27 leading out to an inner side (resistor portion 56 side) of the substrate 2 along a front surface of the resin film 24.

Here, each of the first connection electrode 3 and the second connection electrode 4 has an Ni layer 33, a Pd layer 34 and an Au layer 35 in this order from the element forming surface 2A side and side surface 2C to 2E sides. That is, each of the first connection electrode 3 and the second connection electrode 4 has a laminated structure constituted of the Ni layer 33, the Pd layer 34 and the Au layer 35 not only in a region on the element forming surface 2A but also in regions on the side surfaces 2C to 2E. Therefore, in each of the first connection electrode 3 and the second connection electrode 4, the Pd layer 34 is interposed between the Ni layer 33 and the Au layer 35. In each of the first connection electrode 3 and the second connection electrode 4, the Ni layer 33 takes up most of each connection electrode, and the Pd layer 34 and the Au layer 35 are formed significantly thinner than the Ni layer 33. The Ni layer 33 serves the role of relaying between the Al of the wiring film 22 in the pad region 22A in each notched portion 25 and the solder, when the chip part 1 is mounted on the mounting substrate.

As described above, with the first connection electrode 3 and the second connection electrode 4, a front surface of the Ni layer 33 is covered by the Au layer 35, and the Ni layer 33 can thus be prevented from becoming oxidized. Also, with the first connection electrode 3 and the second connection electrode 4, even if a penetrating hole (pinhole) forms in the Au layer 35 due to thinning of the Au layer 35, the Pd layer 34 interposed between the Ni layer 33 and the Au layer 35 closes the penetrating hole, and the Ni layer 33 can thus be prevented from being exposed to the exterior through the penetrating hole and becoming oxidized.

With each of the first connection electrode 3 and the second connection electrode 4, the Au layer 35 is exposed at the frontmost surface. The first connection electrode 3 is electrically connected, via one notched portion 25, to the wiring film 22 in the pad region 22A in the notched portion 25. The second connection electrode 4 is electrically connected, via the other notched portion 25, to the wiring film 22 in the pad region 22A in the notched portion 25. With each of the first connection electrode 3 and the second connection electrode 4, the Ni layer 33 is connected to the pad region 22A. Each of the first connection electrode 3 and the second connection electrode 4 is thereby electrically connected to the resistor portion 56. Here, the wiring film 22 forms wirings that are respectively connected to groups of resistor bodies R (resistor portion 56), the first connection electrode 3 and the second connection electrode 4.

The resin film 24 and the passivation film 23, in which the notched portions 25 are formed, thus cover the element forming surface 2A in a state where the first connection electrode 3 and the second connection electrode 4 are exposed through the notched portions 25. Electrical connection between the chip part 1 and the mounting substrate can thus be achieved via the first connection electrode 3 and the second connection electrode 4 that protrude (project) from the notched portions 25 at the front surface of the resin film 24.

Next, with reference to FIG. 11A to FIG. 20, a detailed description will be given of a method for manufacturing the chip part 1 and a step of mounting the chip part 1 on the mounting substrate 9.

Each of FIG. 11A to FIG. 11I is an illustrative sectional view of a method for manufacturing the chip part 1 shown in FIG. 1.

First, as shown in FIG. 11A, a substrate 30, which is the base of the substrate 2, is prepared. Here, a front surface 30A of the substrate 30 is the element forming surface 2A of the substrate 2, and a rear surface 30B of the substrate 30 is the rear surface 2B of the substrate 2.

The front surface 30A of the substrate 30 is then thermally oxidized to form an insulating film 20, made of $SiO_2$, etc., on the front surface 30A. After formation of the insulating film 20, a plurality of base recessed portions 8 for forming the recessed portions 6 in the first connection electrode 3 and the second connection electrode 4, are formed on the insulating film 20. Steps of forming the recessed portions 6 in the first connection electrode 3 and the second connection electrode 4 will be described in detail in FIG. 14A to FIG. 14E.

After formation of the insulating film 20, the resistor portion 56 (the resistor body R and the wiring film 22 connected to the resistor body R) is formed on the insulating film 20. Specifically, first, the resistor body film 21 of TiN, TiON or TiSiON is formed by sputtering on the entire surface of the insulating film 20 and further, the wiring film 22 of aluminum (Al) is laminated on the resistor body film 21 so as to contact the resistor body film 21. Thereafter, a photolithography process is used and, for example, RIE (reactive ion etching) or other form of dry etching is performed to selectively remove and pattern the resistor body film 21 and the wiring film 22 to obtain an arrangement where, as shown in FIG. 3A, the resistor body film lines 21A of fixed width on which the resistor body film 21 has been laminated, are aligned at fixed intervals in the column direction in a plan view.

In this process, regions in which the resistor body film lines 21A and the wiring film 22 are cut at portions are also formed, and the fuses F and the conductor films E are formed in the previously described trimming region X (refer to FIG. 2). The wiring film 22 laminated on the resistor body film lines 21A is then removed selectively, for example, by wet etching. As a result, the resistor portion 56 of the arrangement in which the wiring films 22 are laminated at the fixed intervals R on the resistor body film lines 21A, is obtained. In this process, the resistance value of the entirety of the resistor portion 56 may be measured to confirm whether or not the resistor body film 21 and the wiring film 22 have been formed to the targeted dimensions.

With reference to FIG. 11A, the resistor portion 56 is formed at multiple locations on the front surface 30A of the substrate 30 in accordance with the number of chip parts 1 formed on the single substrate 30. If a single region of the substrate 30 in which the resistor portion 56 (the previously described resistor portion 56) has been formed is referred to as a chip part region Y, a plurality of chip part regions Y (that is, the resistor portion 56), each having the resistor portion 56, are formed (set) on the front surface 30A of the substrate 30. A single chip part region Y coincides with a single finished chip part 1 (refer to FIG. 10) in a plan view. On the front surface 30A of the substrate 30, a region between adjacent chip part regions Y will be referred to as a boundary region Z. The boundary region Z has a band shape and extends in a lattice in a plan view. A single chip part region Y is disposed in a single lattice defined by the boundary region Z. The width of the boundary region Z is 1 μm to 60 μm (for example, 20 μm) and is extremely narrow. Therefore, a large number of chip part regions Y can be secured on the substrate 30 to consequently enable mass production of the chip parts 1.

Next, as shown in FIG. 11A, an insulating film 45 made of SiN is formed on the entirety of the front surface 30A of the substrate 30 by a CVD (chemical vapor deposition) method. The insulating film 45 contacts and covers all of the insulating film 20 and the resistor portions 56 (the resistor body film 21 and the wiring films 22) on the insulating film 20. The insulating film 45 thus also covers the wiring films 22 in the trimming region X (refer to FIG. 2). Further, the insulating film 45 is formed across the entirety of the front surface 30A of the substrate 30 and is thus formed to extend to regions other than the trimming region X on the front surface 30A. The insulating film 45 is, thus, a protective film that protects the entirety of the front surface 30A (including the resistor portions 56 on the front surface 30A).

Next, as shown in FIG. 11B, the insulating film 45 is removed selectively by etching using a mask 65. Openings 28 are thereby formed in portions of the insulating film 45, and the pad regions 22A are exposed in the openings 28. Two openings 28 are formed per single semi-finished product 50.

With each semi-finished product 50, after the two openings 28 have been formed in the insulating film 45, probes 70*a* of a resistance measuring apparatus (not shown) are put in contact with the pad regions 22A in the individual openings 28 to detect an overall resistance value of the resistor portion 56, laser light (not shown) is then irradiated onto an arbitrary fuse F (refer to FIG. 2) via the insulating film 45 to trim the wiring film 22 in the previously described trimming region X by the laser light and thereby fuse the corresponding fuse F. By thus fusing (trimming) the fuse F so that the required resistance value is attained, an overall resistance value of the semi-finished product 50 (in other words, the chip part 1) can be adjusted, as described above. In this process, the insulating film 45 serves as a cover film that covers the resistor portion 56 and, therefore, occurrence of a short circuit due to attachment of a fragment, etc., formed in the fusing process to the resistor portion 56 can be prevented. Also, the insulating film 45 covers the fuses F (the resistor body film 21) and, therefore, the energy of the laser light accumulates in the fuses F to enable the fuses F to be fused reliably. Thereafter, SiN is formed on the insulating film 45 by the CVD method to thicken the insulating film 45, as necessary. At the final stage, the insulating film 45 (in the state shown in FIG. 11C) has a thickness of 1000 Å to 5000 Å (approximately 3000 Å here). At this point, portions of the insulating film 45 enter inside the individual openings 28 to close the openings 28.

Next, as shown in FIG. 11C, a liquid of a photosensitive resin made of polyimide is spray-coated onto the substrate 30 from above the insulating film 45 to form a resin film 46 of the photosensitive resin. A front surface of the resin film 46 on the front surface 30A is formed flat along the front surface 30A. Next, heat treatment (curing) is performed on the resin film 46. The thickness of the resin film 46 is thereby subjected to thermal contraction, and the resin film 46 hardens and is made stable in film quality.

Next, as shown in FIG. 11D, the resin film 46, the insulating film 45 and the insulating film 20 are patterned to selectively remove portions of these films coinciding with the notched portions 25. The notched portions 25 are thereby formed and the front surface 30A (the insulating film 20) is exposed in the boundary region Z.

Next, as shown in FIG. 11E, a resist pattern 41 is formed across the entirety of the front surface 30A of the substrate 30. An opening 42 is formed in the resist pattern 41.

FIG. 12 is a schematic plan view of a portion of the resist pattern 41 used for forming a groove 44 in the step of FIG. 11E.

With reference to FIG. 12, the opening 42 of the resist pattern 41 coincides with (corresponds to) a region (the hatched portion in FIG. 12, in other words, the boundary region Z) between outlines of mutually adjacent chip parts 1 in a plan view, in a case where multiple chip parts 1 (in other words, the previously described chip part regions Y) are disposed in a matrix form (that is also a lattice). The overall shape of the opening 42 is thus a lattice which has a plurality of mutually-orthogonal rectilinear portions 42A, 42B.

In the resist pattern 41, the mutually-orthogonal rectilinear portions 42A, 42B in the opening 42 are connected, while being maintained in mutually orthogonal states (without curving). Intersection portions 43 of the rectilinear portions 42A, 42B are thus pointed and form angles of substantially 90° in a plan view.

Referring to FIG. 11E, the substrate 30 is removed selectively by plasma etching using the resist pattern 41 as a mask. The material of the substrate 30 is thereby removed at positions across intervals from the wiring films 22 in the boundary region Z between mutually adjacent resistor portions 56 (chip part regions Y). Consequently, a groove 44 having a predetermined depth reaching a middle portion of the thickness of the substrate 30 from the front surface 30A of the substrate 30 is formed at a position (boundary region Z) coinciding with the opening 42 of the resist pattern 41 in a plan view. The groove 44 is defined by a pair of mutually facing side walls 44A and a bottom wall 44B joining lower ends of the pair of side walls 44A (ends at the rear surface 30B side of the substrate 30). The depth of the groove 44 on the basis of the front surface 30A of the substrate 30 is approximately 100 μm and the width of the groove 44 (interval between the mutually facing side walls 44A) is approximately 20 and is fixed across in the entire depth direction.

The overall shape of the groove 44 on the substrate 30 is a lattice which coincides with the opening 42 (refer to FIG. 11) of the resist pattern 41 in a plan view. At the front surface 30A of the substrate 30, rectangular frame portions (the boundary region Z) of the groove 44 surrounded by the chip part regions Y in which the individual resistor portions 56 are formed. In the substrate 30, each portion in which the resistor portion 56 has been formed is a semi-finished product 50 of the chip part 1. At the front surface 30A of the substrate 30, one semi-finished product 50 is positioned in each chip part region Y surrounded by the groove 44, and these semi-finished products 50 are aligned and disposed in a matrix form. By thus forming the groove 44, the substrate 30 is separated into the substrates 2 according to the plurality of chip part regions Y. After the groove 44 has been formed, the resist pattern 41 is removed.

Figure 11F:
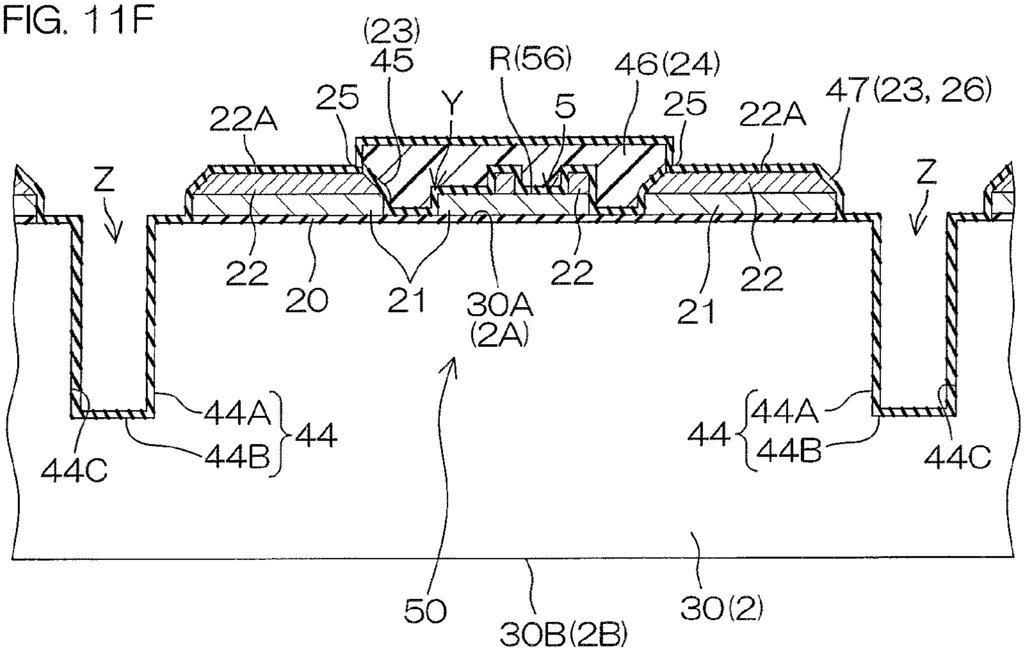

Next, as shown in FIG. 11F, an insulating film 47 made of SiN is formed on the entirety of the front surface 30A of the substrate 30 by the CVD method. In this process, the insulating film 47 is also formed on the entireties of inner peripheral surfaces of the groove 44 (defining surfaces 44C of the side walls 44A and an upper surface of the bottom wall 44B).

Figure 11G:
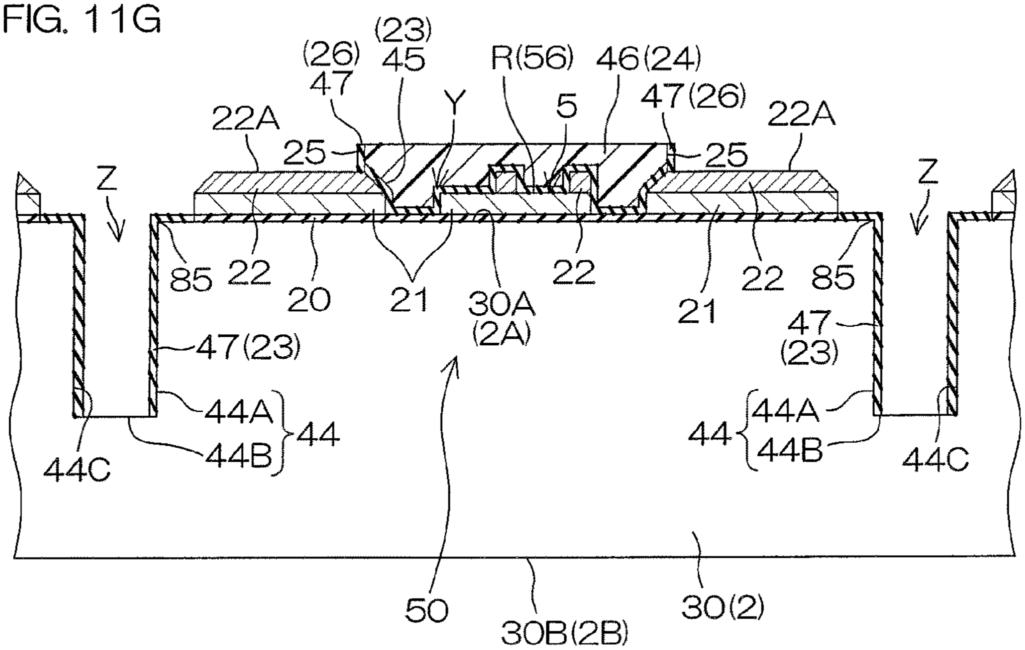

Next, the insulating film 47 is selectively etched as shown in FIG. 11G. Specifically, portions of the insulating film 47 that are parallel to the front surface 30A are selectively etched. The pad regions 22A of the wiring films 22 are thereby exposed and in the groove 44, the insulating film 47 on the bottom wall 44B is removed.

Figure 11H:
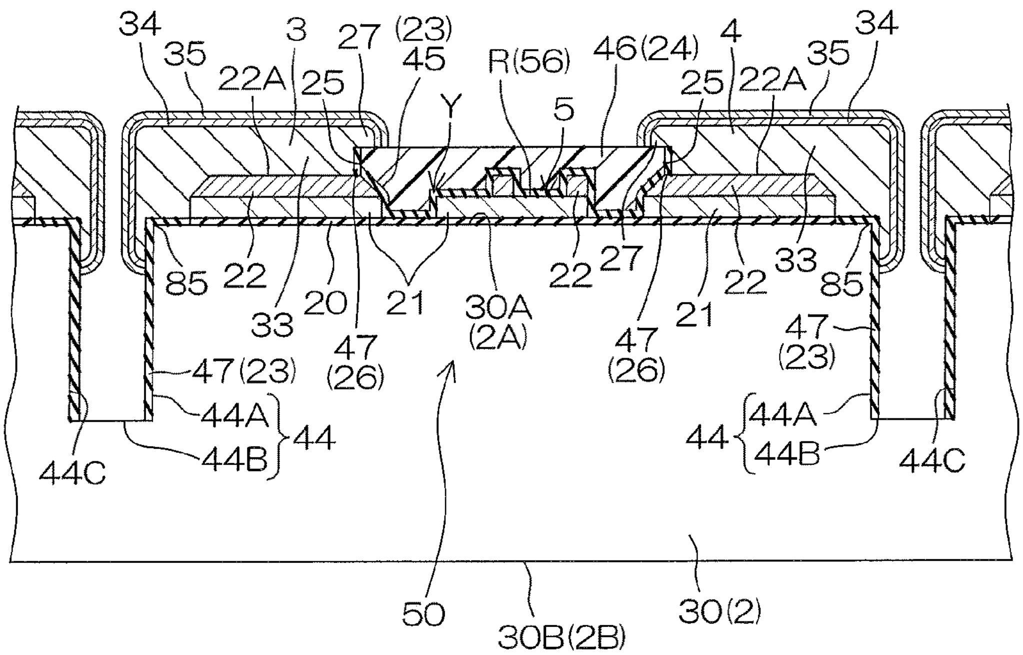
Figure 11:
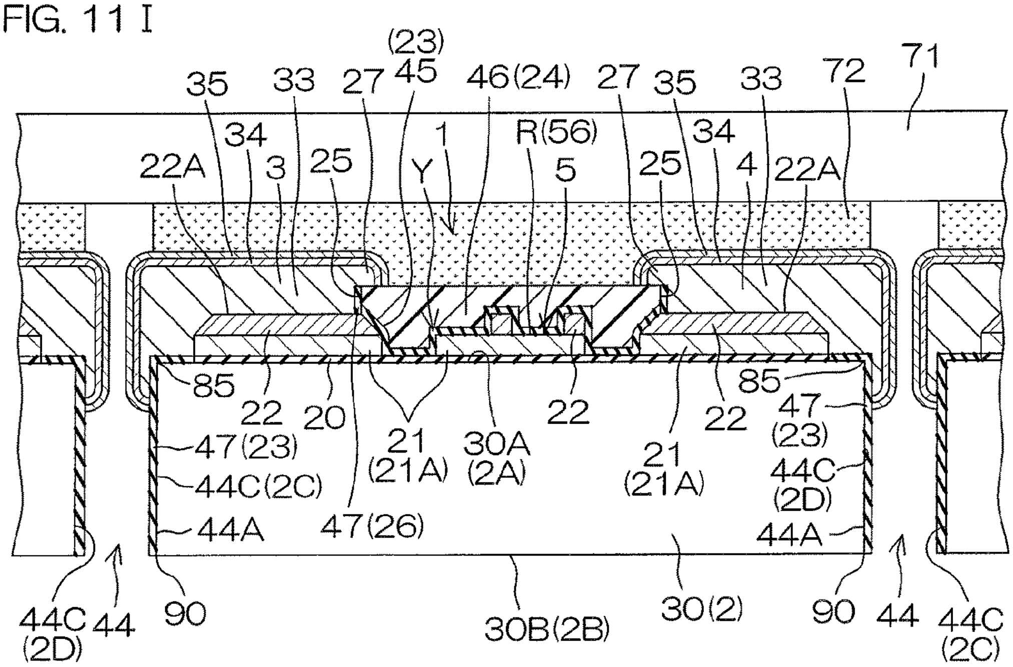

Next, by electroless plating, Ni, Pd and Au are grown by plating in that order from the wiring films 22 exposed from the respective notched portions 25. Plating is continued until each plated film grows in a lateral direction along the front surface 30A and covers the insulating film 47 on the side walls 44A of the groove 44. The first connection electrode 3 and the second connection electrode 4, made of the Ni/Pd/Au laminated films, are thereby formed as shown in FIG. 11H.

FIG. 13 is a diagram for describing a step of manufacturing the first connection electrode 3 and the second connection electrode 4.

Specifically, with reference to FIG. 13, first, a front surface of each pad region 22A is cleaned to remove (degrease) organic matter (including smut such as carbon stains and greasy dirt) on the front surface (Step S1). Next, an oxide film of the front surface is removed (Step S2). Next, zincate treatment is performed on the front surface to convert the Al (of the wiring film 22) at the front surface to Zn (Step S3). Next, the Zn on the front surface is peeled off by nitric acid, etc., so that fresh Al is exposed in the pad region 22A (Step S4).

Next, the pad region 22A is immersed in a plating solution to apply Ni plating on a front surface of the fresh Al in the pad region 22A. The Ni in the plating solution is thereby chemically reduced and deposited to form the Ni layer 33 on the front surface (Step S5).

Next, the Ni layer 33 is immersed in another plating solution to apply Pd plating on a front surface of the Ni layer 33. The Pd in the plating solution is thereby chemically reduced and deposited to form the Pd layer 34 on the front surface of the Ni layer 33 (Step S6).

Next, the Pd layer 34 is immersed in yet another plating solution to apply Au plating on a front surface of the Pd layer 34. The Au in the plating solution is thereby chemically reduced and deposited to form the Au layer 35 on the front surface of the Pd layer 34 (Step S7). The first connection electrode 3 and the second connection electrode 4 are thereby formed. And, when the first connection electrode 3 and the second connection electrode 4 that have been formed are dried (Step S8), the step of manufacturing the first connection electrode 3 and the second connection electrode 4 is completed. A step of washing the semi-finished product 50 with water is performed as necessary between consecutive steps. The zincate treatment may be performed a plurality of times.

FIG. 11H shows a state after the first connection electrode 3 and the second connection electrode 4 have been formed in each semi-finished product 50.

As described above, the first connection electrode 3 and the second connection electrode 4 are formed by electroless plating, and the Ni, Pd and Al, which are electrode materials, can be satisfactorily grown by plating even on the insulating film 47. Further, as compared with a case where the first connection electrode 3 and the second connection electrode 4 are formed by electrolytic plating, the number of steps of forming the first connection electrode 3 and the second connection electrode 4 (for example, a lithography step, a resist mask peeling step, etc., that are necessary in electrolytic plating) can be reduced to improve the productivity of the chip part 1. Still further, in the case of the electroless plating, the resist mask that is deemed to be necessary in electrolytic plating is unnecessary. Therefore, deviation of positions on formation of the first connection electrode 3 and the second connection electrode 4 due to positional deviation of the resist mask will not occur, thus making it possible to form the first connection electrode 3 and the second connection electrode 4 with improved positional accuracy and also improve the yield.

In addition, with this method, the wiring films 22 are exposed from the notched portions 25 and there is nothing that hinders plating growth from the wiring films 22 to the groove 44. The plating growth can thus be achieved rectilinearly from the wiring films 22 to the groove 44. Consequently, time taken to form the electrodes can be reduced.

After the first connection electrode 3 and the second connection electrode 4 have thus been formed, a conduction test is performed across the first connection electrode 3 and the second connection electrode 4 by using a probe 70*b* to be described below. Thereafter, the substrate 30 is ground from the rear surface 30B.

Specifically, after the groove 44 has been formed, an adhesive surface 72 of a thin plate-shaped supporting tape 71, made of PET (polyethylene terephthalate), is adhered onto the first connection electrode 3 and the second connection electrode 4 side (that is, the front surface 30A) of each semi-finished product 50, as shown in FIG. 11I. The individual semi-finished products 50 are thereby supported by the supporting tape 71. Here, for example, a laminated tape may be used as the supporting tape 71.

In the state where the individual semi-finished products 50 are supported by the supporting tape 71, the substrate 30 is ground from the rear surface 30B side. When the substrate 30 has been thinned by grinding until the upper surface of the bottom wall 44B (refer to FIG. 11H) of the groove 44 is reached, there are no longer portions that join mutually adjacent semi-finished products 50, and the substrate 30 is thus separated at the groove 44 as boundaries. And, the semi-finished products 50 are separated individually to become the finished products of the chip parts 1. That is, the substrate 30 is cut (divided) at the groove 44 (in other words, the boundary region Z) and the individual chip parts 1 are thereby cut out. The chip parts 1 may be cut out instead by etching the substrate 30 to the bottom wall 44B of the groove 44 from the rear surface 30B side.

With each finished chip part 1, each portion that has formed the defining surface 44C of the side walls 44A of the groove 44 becomes any one of the side surfaces 2C to 2E of the substrate 2, and the rear surface 30B becomes the rear surface 2B. That is, the step of forming the groove 44 by etching, as described above, (refer to FIG. 11E) is included in the step of forming the side surfaces 2C to 2E. Further, the insulating film 45 and a portion of the insulating film 47 become the passivation film 23, the resin film 46 becomes the resin film 24, and a portion of the insulating film 47 becomes the insulating film 26.

The plurality of chip part regions Y formed on the substrate 30 can thus be separated all at once into individual chip parts 1 (the individual chips of the plurality of chip parts 1 can be obtained at once) by forming the groove 44 and grinding the substrate 30 from the rear surface 30B side, as described above. The productivity of the chip parts 1 can thus be improved by reducing the time for manufacturing the plurality of chip parts 1.

The rear surface 2B of the substrate 2 of the finished chip part 1 may be mirror-finished by polishing or etching to refine the rear surface 2B.

Next, with reference to FIG. 14A to FIG. 14E, the step of manufacturing the recessed portions 6 of the first connection electrode 3 and the second connection electrode 4 of the chip part 1 will be described more specifically.

Each of FIG. 14A to FIG. 14E is a sectional view which more specifically describes the step of manufacturing the recessed portions 6 of the first connection electrode 3 and the second connection electrode 4 of the chip part 1. FIG. 14A to FIG. 14E all correspond to the sectional view of FIG. 4. And, the second connection electrode 4 is similar in arrangement to the first connection electrode 3 and, therefore, not illustrated here.

Figure 14A:
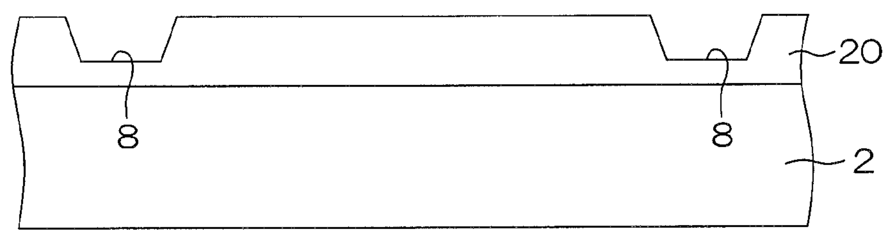

In order to form the recessed portions 6 on the first connection electrode 3, first, in FIG. 11A, after the insulating film 20 has been formed at the front surface 30A of the substrate 30, a plurality of base recessed portions 8 are formed on the insulating film 20. The base recessed portion 8 is formed at a position corresponding to a region at which the recessed portion 6 is to be formed on the first connection electrode 3. More specifically, a mask (not shown) which has an opening selectively in the region in which the base recessed portion 8 is to be formed is formed on the insulating film 20. Then, via the mask, the insulating film 20 is subjected to an etching process. Thereby, as shown in FIG. 14A, the base recessed portions 8 are formed. After formation of the base recessed portions 8, the mask is removed.

Figure 14B:
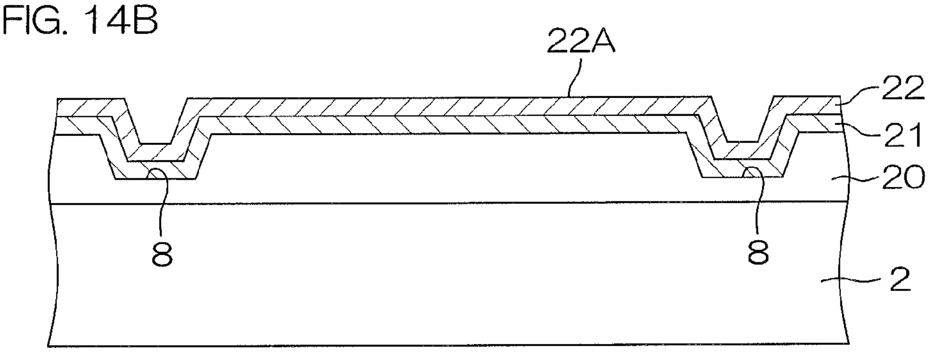

Next, as shown in FIG. 14B, the resistor body film 21 and the wiring films 22 formed in the step of FIG. 11A are formed along the front surface of the insulating film 20 so as to enter into a recessed space defined by side surfaces and the bottom surface of the base recessed portion 8 formed on the insulating film 20. Accordingly, the recessed space is further defined, by the resistor body film 21 and the wiring films 22 in the region in which the base recessed portion 8 has been formed.

Figure 14C:
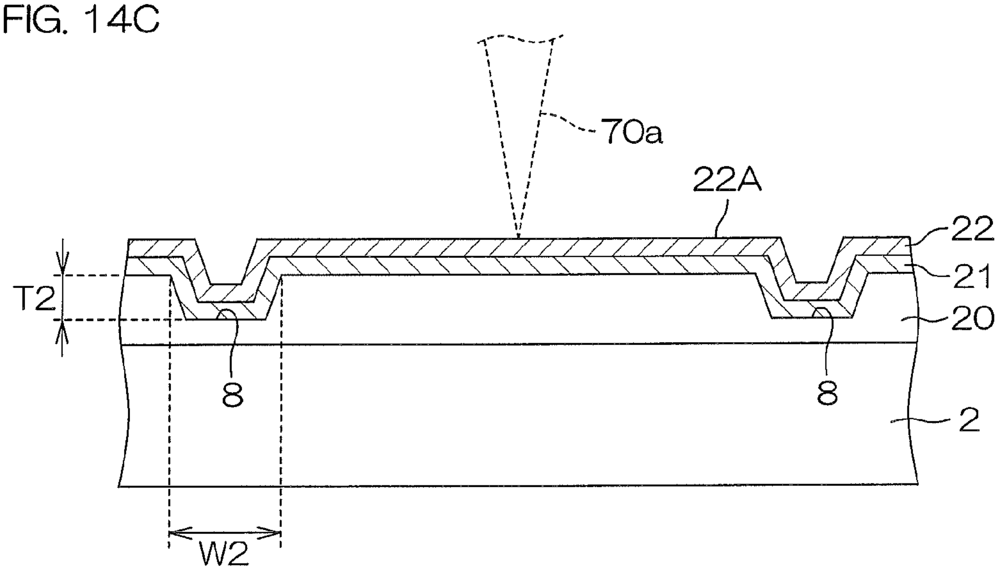

Next, as shown in FIG. 14C, after the step of forming the insulating film 45 and the opening 28 (refer to FIG. 11B), for example, the probe 70*a* of the resistance measuring apparatus (not shown) is brought into contact with the pad region 22A. In this process, a flat portion in which a groove (recessed space) is not formed is formed at the center of the pad region 22A. It is therefore possible to prevent the probe 70*a* from entering into the groove (recessed space). Thereby, a region in contact with the probe 70*a* can be secured satisfactorily to perform satisfactory measurement of a resistance value.

Figure 14D:
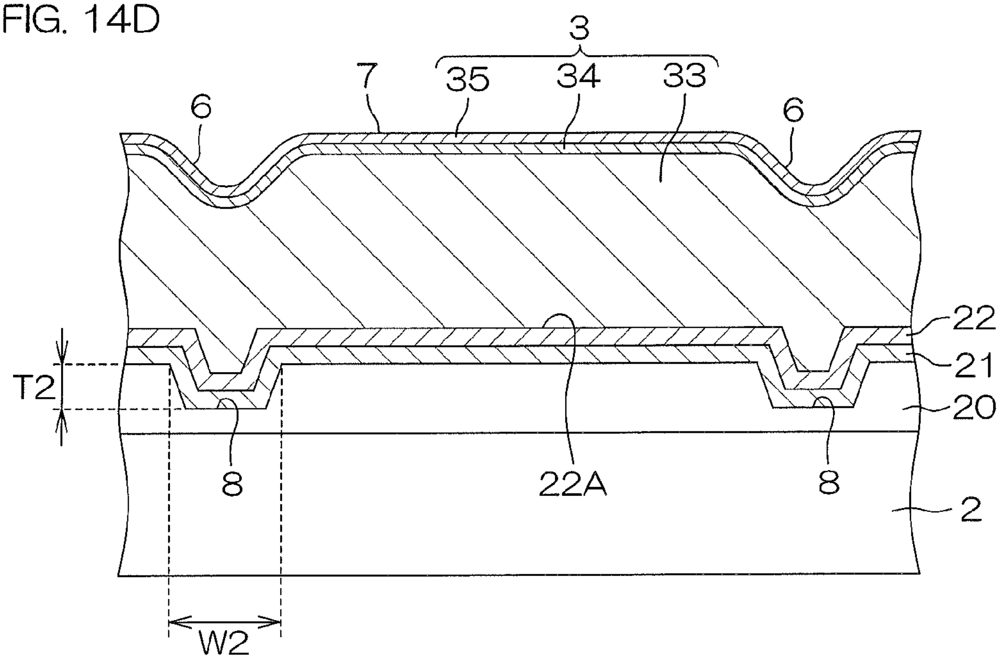

Next, as shown in FIG. 14D, after the steps of FIG. 11C to FIG. 11G, the first connection electrode 3 is formed by the manufacturing step of FIG. 13.

More specifically, when the Ni layer 33 is formed at the front surface of the pad region 22A, the Ni layer 33 is formed so as to refill the recessed space of the pad region 22A. In the process, at a position corresponding to the recessed space formed at the pad region 22A on the front surface of the Ni layer 33, a smooth recess which moves toward the thickness direction is formed. Then, the Pd layer 34 and the Au layer 35 are formed in this order along the front surface of the Ni layer 33. Thereby, as shown in FIG. 1 and FIG. 2, the first connection electrode 3 having the plurality of recessed portions 6 is formed at regions along the long sides 3A and the short sides 3B of the first connection electrode 3.

Figure 14E:
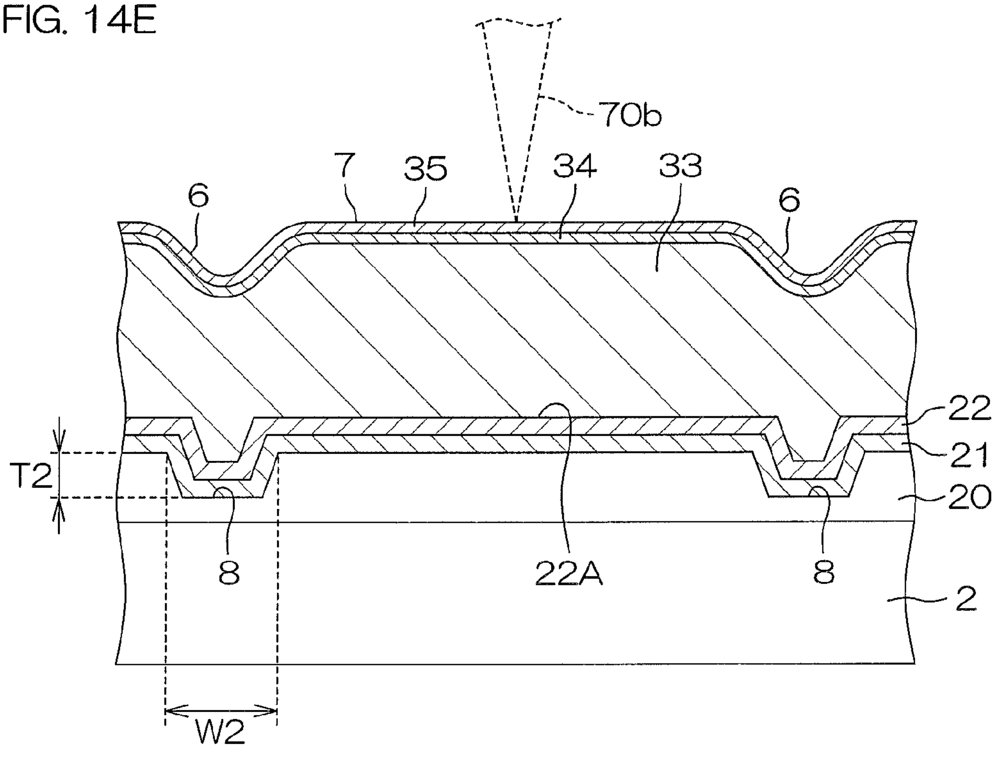

Next, as shown in FIG. 14E, a conduction test is performed across the first connection electrode 3 and the second connection electrode 4. The conduction test across the first connection electrode 3 and the second connection electrode 4 is performed, for example, according to a method similar to that described in FIG. 14C (FIG. 11B) by bringing the probe 70*b* of the resistance measuring apparatus (not shown) into contact with the first connection electrode 3 and the second connection electrode 4 to detect an overall resistance value of the resistor portion 56. In this process, at an internal portion of the first connection electrode 3, a flat portion 7 in which the recessed portion 6 is not formed is formed. Therefore, the probe 70*b* can be prevented from entering into the recessed portion 6. Thus, a region in contact with the probe 70*b* can be secured satisfactorily to perform the conduction test satisfactorily. Thereafter, the steps described in FIG. 11H to FIG. 11I are carried out.

Hereinafter, with reference to FIG. 15A to FIG. 15D, a detailed description will be given of a step of recovering the chip part 1.

Each of FIG. 15A to FIG. 15D is an illustrative sectional view which shows a step of recovering the chip part 1 subsequent to the step of FIG. 11I.

Figure 15A:
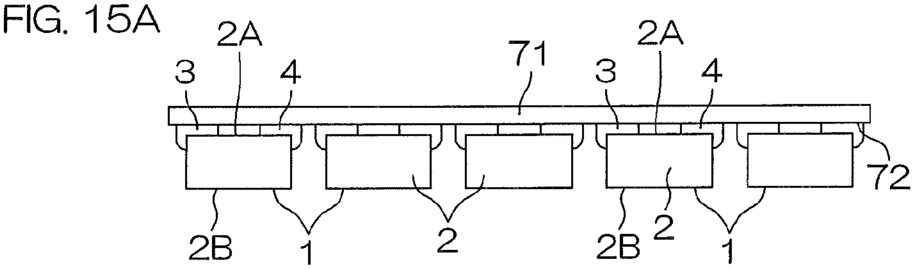
Figure 15B:
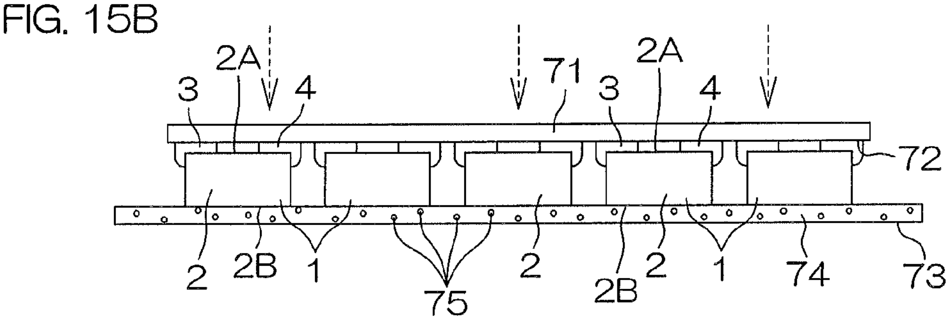

FIG. 15A shows a state where the plurality of chip parts 1 which have been separated into individual chips adhere continuously onto the supporting tape 71. In this state, as shown in FIG. 15B, a thermally foaming sheet 73 is adhered onto the rear surface 2B of the substrate 2 of each chip part 1. The thermally foaming sheet 73 contains a sheet main body 74 formed in a sheet shape and a large number of foaming particles 75 that are kneaded into the sheet main body 74.

Figure 15C:
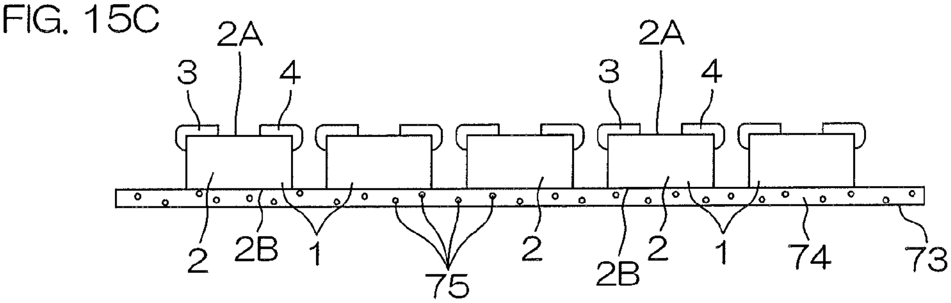

The adhesive force of the sheet main body 74 is greater than the adhesive force at the adhesive surface 72 of the supporting tape 71. Thus, after the thermally foaming sheet 73 has been adhered onto the rear surface 2B of the substrate 2 of each chip part 1, as shown in FIG. 15C, the supporting tape 71 is peeled off from each chip part 1 to transfer the chip part 1 to the thermally foaming sheet 73. In this process, if ultraviolet rays are irradiated onto the supporting tape 71 (refer to dotted arrows in FIG. 15B), the adhesive surface 72 is lowered in adhesive property and the supporting tape 71 can be easily peeled off from each of the chip parts 1.

Figure 15D:
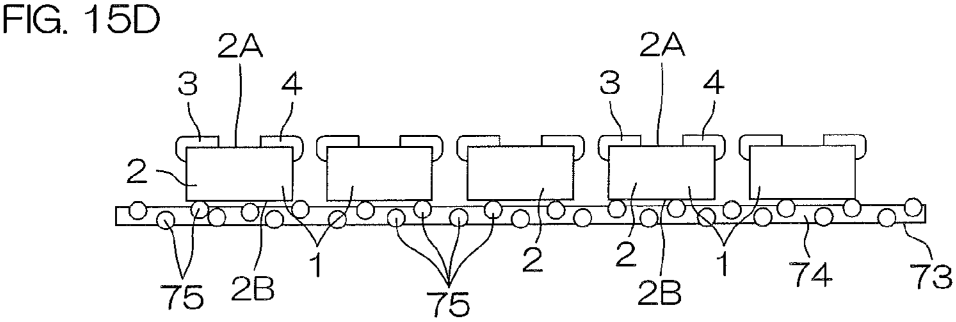

Next, the thermally foaming sheet 73 is heated. Thereby, as shown in FIG. 15D, in the thermally foaming sheet 73, the individual foaming particles 75 in the sheet main body 74 are made of foam and swell out from the front surface of the sheet main body 74. As a result, the thermally foaming sheet 73 is in contact with the rear surface 2B of the substrate 2 of each chip part 1 in a decreased area, and all the chip parts 1 peel off (fall off) naturally from the thermally foaming sheet 73. The chip parts 1 that have been thus recovered are housed in housing spaces formed on an embossed carrier tape (not shown). In this case, treatment time can be reduced, as compared with a case where the chip parts 1 are peeled off one by one from the supporting tape 71 or the thermally foaming sheet 73. As a matter of course, in the state where the plurality of chip parts 1 are adhered to the supporting tape 71 (refer to FIG. 15A), the chip parts 1 may be peeled off in a predetermined number directly from the supporting tape 71 without using the thermally foaming sheet 73. Thereafter, the embossed carrier tape in which the chip parts 1 have been housed is housed in an automatic mounting machine 80 (refer to FIG. 17 and FIG. 18). The chip parts 1 are suctioned and recovered individually through the suction nozzle 76 installed on the automatic mounting machine 80. The thus recovered chip parts 1 are subjected to a front-surface/rear-surface determination step by the part recognizing camera 14.

The step of recovering individual chip parts 1 can be performed by a different method shown in FIG. 16A to FIG. 16C.

Each of FIG. 16A to FIG. 16C is an illustrative sectional view which shows a step (modification example) of recovering the chip part 1 subsequent to the step of FIG. 11I.

In FIG. 16A, as with FIG. 15A, a state where the plurality of chip parts 1 which have been separated into individual chips adhere continuously to the supporting tape 71, is shown. In this state, as shown in FIG. 16B, a transfer tape 77 is adhered onto the rear surface 2B of the substrate 2 of each chip part 1. The transfer tape 77 has a stronger adhesive force than the adhesive surface 72 of the supporting tape 71. Thus, as shown in FIG. 16C, after the transfer tape 77 has been adhered onto each chip part 1, the supporting tape 71 is peeled off from each of the chip parts 1. In this process, as described previously, ultraviolet rays (refer to dotted arrows in FIG. 16B) may be irradiated onto the supporting tape 71 to reduce the adhesive property of the adhesive surface 72.

Frames 78 installed on an automatic mounting machine 80 are adhered to both ends of the transfer tape 77. The frames 78 at the both ends are able to move in a direction at which they can approach each other or separate from each other. When after the supporting tape 71 is peeled off from the individual chip parts 1, the frames 78 at the both ends are made to move in a direction at which they are spaced away from each other, the transfer tape 77 elongates and becomes thin. Thereby, the transfer tape 77 is decreased in adhesive force and the individual chip parts 1 can be easily peeled off from the transfer tape 77. When in this state, the suction nozzle 76 of the automatic mounting machine 80 is directed toward the element forming surface 2A side of the chip part 1, the chip part 1 is peeled off from the transfer tape 77 and suctioned through the suction nozzle 76 by a suction force generated by the automatic mounting machine 80 (suction nozzle 76). When in this process, a projection 79 shown in FIG. 16C pushed the chip part 1 to the suction nozzle 76 from the opposite side of the suction nozzle 76 via the transfer tape 77, the chip part 1 can be smoothly peeled off from the transfer tape 77. The chip part 1 that has thus been recovered is subjected to the front-surface/rear-surface determination step by the part recognizing camera 14.

FIG. 17 is a drawing which describes the front-surface/rear-surface determination step of the chip part 1 according to the one preferred embodiment of the present invention. FIG. 18 is a drawing which describes the front-surface/rear-surface determination step of the chip part 10 according to the reference example.

FIG. 17 and FIG. 18 show the respective states that the chip part 1 according to the one preferred embodiment of the present invention and the chip part 10 according to the reference example are suctioned by the suction nozzle 76. In addition, the chip part 10 according to the reference example here refers to a chip part in which the recessed portions 6 are not formed on the front surface of the first connection electrode 3 or the second connection electrode 4.

As shown in FIG. 17, the chip part 1 is in a state of being suctioned by the suction nozzle 76 and conveyed by the automatic mounting machine 80 up to the part detection position P at which the front surface or the rear surfaces of the chip part 1 is determined by the part recognizing camera 14. In this process, a substantially central portion in the long direction of the rear surface 2B is suctioned onto the suction nozzle 76. As described previously, the first connection electrode 3 and the second connection electrode 4 are provided only at one side of the chip part 1 (element forming surface 2A) and at ends of the element forming surface 2A side of the side surfaces 2C to 2E and, therefore, in the chip part 1, the rear surface 2B is a flat surface in which an electrode (unevenness) is not formed. Thereby, on movement of the suction nozzle 76 by which the chip part 1 is suctioned, the flat rear surface 2B can be suctioned by the suction nozzle 76. In other words, the flat rear surface 2B is able to increase a margin of a portion which can be suctioned by the suction nozzle 76. Thereby, the chip part 1 can be reliably suctioned by the suction nozzle 76 and also can be conveyed reliably up to the part detection position P (on the mounting substrate 9) which is detected by the part recognizing camera 14 so that the chip part 1 will not fall off from the suction nozzle 76 midway.

As shown in FIG. 17, when the chip part 1 reaches the part detection position P, light is irradiated obliquely from a light source 15 installed in the peripheries of the part recognizing camera 14 (for example, a light irradiator with a plurality of LEDs) to a surface on which the first connection electrode 3 and the second connection electrode 4 of the chip part 1 are formed (element forming surface 2A). The part recognizing camera 14 detects reflection light reflected by the first connection electrode 3 and the second connection electrode 4 of the chip part and also by portions in which the first connection electrode 3 and the second connection electrode 4 are not formed, thereby distinguishing a region in which the first connection electrode 3 and the second connection electrode 4 are formed from a region in which the first connection electrode 3 and the second connection electrode 4 are not formed on the basis of brightness to determine the surface is the front surface or the rear surface of the chip part 1.

The chip part 1 is not always suctioned in a horizontal posture by the suction nozzle 76 and may be suctioned from time to time in an inclined manner by the suction nozzle 76.

Here, as shown in FIG. 18, in the case of the chip part 10 according to the reference example, when light is irradiated onto the element forming surface 2A in an inclined manner from the light source 15 (refer to incident light λ3 in FIG. 18), the light is reflected by the first connection electrode 3 and the second connection electrode 4 to a region outside the region in which the part recognizing camera 14 is disposed (total reflection: refer to reflection light λ4 in FIG. 18) and may not be detected by the part recognizing camera 14. In this case, in image information obtained by the part recognizing camera 14, the first connection electrode 3 and the second connection electrode 4 of the chip part 10 will appear dark partially or entirely. Thus, the automatic mounting machine 80 misrecognizes the region at which the first connection electrode 3 and the second connection electrode 4 are formed as the region in which the first connection electrode 3 and the second connection electrode 4 is not formed, thereby stopping conveyance of the chip part 10 to the mounting substrate 9. Therefore, in the case of the chip part 10 according to the reference example, occurrence of the misrecognition prevents smooth mounting of the chip part.

In contrast, in the chip part 1 according to the one preferred embodiment of the present invention, as shown in FIG. 17, the plurality of recessed portions 6 are formed on the respective front surfaces of the first connection electrode 3 and the second connection electrode 4 which are formed on the frontmost surface of the chip part 1. Thus, even if the chip part 1 is suctioned in an inclined manner, light irradiated from the light source 15 to the first connection electrode 3 and the second connection electrode 4 (refer to incident light λ1 in FIG. 17) is irregularly reflected by the recessed portions 6 of the first connection electrode 3 and the second connection electrode 4 (refer to reflection light λ2 in FIG. 17). In the first connection electrode 3 and the second connection electrode 4, the plurality of recessed portions 6 are formed. Therefore, even if the chip part 1 is suctioned in an inclined manner by the suction nozzle 76 as in FIG. 18 described above, the incident light λ1 from the light source 15 can be reflected in all directions. As a result, irrespective of the way in which the part recognizing camera 14 is disposed at the part detection position P, the part recognizing camera 14 is able to satisfactorily detect the first connection electrode 3 and the second connection electrode 4 (chip part 1). Thereby, the automatic mounting machine 80 is able to reduce misrecognition due to a specification of the chip part 1 and able to smoothly mount the chip part 1 on the mounting substrate 9.

Moreover, such processing forms the recessed portions 6 on the first connection electrode 3 and the second connection electrode 4 of the chip part 1, and this is also applicable to a chip part different in specification. Thus, it is not necessary to change a condition (a specification) of the light source 15 which is disposed in the peripheries of the part recognizing camera 14 for each specification of the chip part.

The chip part 1 after the step is subsequently mounted on the mounting substrate 9, as shown in FIG. 19.

FIG. 19 is a schematic sectional view obtained when a circuit assembly 100 in a state that the chip part 1 has been mounted on the mounting substrate 9 is cut along the long direction of the chip part 1. FIG. 20 is a schematic plan view obtained when the chip part 1 in a state of being mounted on the mounting substrate 9 is viewed from the element forming surface 2A side.

As shown in FIG. 19, the chip part 1 is mounted on the mounting substrate 9. The chip part 1 and the mounting substrate 9 in this state constitute the circuit assembly 100. The upper surface of the mounting substrate 9 in FIG. 19 is a mounting surface 9A. A pair of (two) lands 88 which are connected to internal circuits (not shown) of the mounting substrate 9 are formed on the mounting surface 9A. Each of the lands 88 is, for example, made of Cu. A solder 13 is provided on each front surface of the lands 88 so as to project from the front surface.

The automatic mounting machine 80 makes the suction nozzle 76 to move to the mounting substrate 9, with the chip part 1 being suctioned, after the front-surface/rear-surface determination step. In this process, the element forming surface 2A of the chip part 1 and the mounting surface 9A of the mounting substrate 9 face each other. In this state, the suction nozzle 76 is made to move and pressed to the mounting substrate 9, and with regard to the chip part 1, the first connection electrode 3 is brought into contact with a solder 13 of one land 88, while the second connection electrode 4 is brought into contact with a solder 13 of the other land 88. Next, the solders 13 are heated to fuse the solders 13. Thereafter, the solders 13 are cooled and solidified, and the first connection electrode 3 is bonded to the one land 88 via the solder 13, and the second connection electrode 4 is bonded to the other land 88 via the solder 13. That is, these two lands 88 are solder-bonded respectively to the corresponding electrodes of the first connection electrode 3 and the second connection electrode 4. Thereby, the chip part 1 is completely mounted on the mounting substrate 9 (flip-chip bonding) and the circuit assembly 100 is completed. In this process, the Au layer 35 (gold plate) is formed on the frontmost surface of each of the first connection electrode 3 and the second connection electrode 4 which functions as an externally connected electrode of the chip part 1. Therefore, excellent solder wettability and high reliability can be achieved when the chip part 1 is mounted on the mounting substrate 9.

In the circuit assembly 100 which has been completed, the element forming surface 2A of the chip part 1 and the mounting surface 9A of the mounting substrate 9 extend parallel, while facing each other, with a clearance kept (refer to FIG. 20 as well). A dimension of the clearance corresponds to a total of the thickness of a projection portion from the element forming surface 2A and the thickness of the solder 13 in the first connection electrode 3 or the second connection electrode 4.

As shown in FIG. 19, in a sectional view, for example, a front surface portion on the element forming surface 2A and side surface portions on the side surfaces 2C, 2D are formed integrally so that the first connection electrode 3 and the second connection electrode 4 are formed in an L-letter shape. Therefore, as shown in FIG. 20, when the circuit assembly 100 (to be exact, a bonded portion between the chip part 1 and the mounting substrate 9) is viewed from the direction of a normal of the mounting surface 9A (element forming surface 2A) (the direction orthogonal to the surfaces), the solder 13 which bonds the first connection electrode 3 to one land 88 is adsorbed not only to the front surface portion of the first connection electrode 3 but also to the side surface portions. In a similar manner, the solder 13 which bonds the second connection electrode 4 to the other land 88 is adsorbed not only to the front surface portion of the second connection electrode 4 but also to the side surface portions.

As described above, in the chip part 1, the first connection electrode 3 is formed so as to cover integrally three side surfaces 2C, 2E, 2F of the substrate 2, while the second connection electrode 4 is formed so as to cover integrally three side surfaces 2D, 2E, 2F of the substrate 2. That is, electrodes are formed on the side surfaces 2C to 2E, in addition to the element forming surface 2A of the substrate 2 and, therefore, an adhesion area can be enlarged when the chip part 1 is soldered to the mounting substrate 9. As a result, it is possible to increase an adsorption amount of the solder 13 to the first connection electrode 3 and the second connection electrode 4. Thereby, the adhesion strength can be improved.

Further, as shown in FIG. 20, the solder 13 is adsorbed so as to enter from the element forming surface 2A of the substrate 2 around the side surfaces 2C to 2E. Therefore, in a mounting state, the first connection electrode 3 is held with the three side surfaces 2C, 2E, 2F by means of the solder 13, while the second connection electrode 4 is held with the three side surfaces 2D, 2E, 2F by means of the solder 13, thus making it possible to fix all the side surfaces 2C to 2E of the rectangular chip part 1 by means of the solders 13. Thereby, the chip part 1 can be made stable in mounting form.

As described above, according to the one preferred embodiment of the present invention, it is possible to provide the chip part 1 which is able to determine the front surface or the rear surfaces of the chip part 1 satisfactorily and which can be smoothly mounted on the mounting substrate 9 and also to provide the method for manufacturing thereof. It is also possible to provide the circuit assembly 100 which includes the chip part 1.

<Capacitor>

FIG. 21 is a plan view of a chip part 101 of Embodiment 2 or a drawing which shows a positional relationship between a first connection electrode, a second connection electrode and a circuit element as well as an arrangement of the element in a plan view. FIG. 22 is a sectional view taken along section line XXII-XXII in FIG. 21. FIG. 23A is a sectional view taken along section line XXIIIa-XXIIIa in FIG. 21. FIG. 23B is a sectional view taken along section line XXIIIb-XXIIIb in FIG. 21. FIG. 24 is an exploded perspective view which shows a portion of the arrangement of the chip part 101 separated.

The chip part 101 of Embodiment 2 is different from the chip part 1 of Embodiment 1 in that as circuit elements formed in an element region 5, capacitor components C1 to C9 are formed in place of the resistor portion 56. The chip part 101 is similar in other arrangements to the chip part 1 of Embodiment 1. In FIG. 21 to FIG. 25, the portions corresponding to the individual portions shown in FIG. 1 to FIG. 25 are given the same reference numerals, with a description thereof omitted.

With reference to FIG. 21, the plurality of capacitor components C1 to C9 are formed within the element region 5 on an element forming surface 2A of a substrate 2. The plurality of capacitor components C1 to C9 are a plurality of element components which constitute the circuit element (here, the capacitor) and connected between a first connection electrode 3 and a second connection electrode 4. More specifically, the plurality of capacitor components C to C9 are electrically connected via a plurality of fuse units 107 (corresponding to the fuses F) individually to the second connection electrode 4 so as to enable disconnection.

As shown in FIG. 22, an insulating film 20 is formed on the element forming surface 2A of the substrate 2 in an arrangement similar to that of Embodiment 1, and a lower electrode film 111 is formed on a front surface of the insulating film 20. The lower electrode film 111 spreads across substantially the entirety of the element region 5. Further, the lower electrode film 111 is formed to extend up to a region directly below the first connection electrode 3.

More specifically, the lower electrode film 111 is provided in the element region 5 with a capacitor electrode region 111A which functions as a lower electrode in common with the capacitor components C1 to C9 and a pad region 111B which leads out to an external electrode and is disposed directly below the first connection electrode 3. The capacitor electrode region 111A is positioned at the element region 5, and the pad region 111B is positioned directly below the first connection electrode 3 and in contact with the first connection electrode 3.

As shown in FIG. 23A, the pad region 111B (lower electrode film 111) is formed along the side surfaces and the bottom surface of a base recessed portion 8 and along the front surface of the insulating film 20 so as to enter into a recessed space defined by the side surfaces and the bottom surface of the base recessed portion 8 formed on the insulating film 20 in a region directly below the first connection electrode 3. Thereby, the recessed space is defined by the pad region 111B in a region at which the base recessed portion 8 is also formed. Then, the first connection electrode 3 is formed on the pad region 111B so that the recessed space defined by the pad region 111B is further refilled. Thereby, in the first connection electrode 3, recessed portions 6 are formed at a position corresponding to a region at which the base recessed portions 8 are formed, and a flat portion 7 in which the recessed portion 6 is not formed is formed at an internal portion of the first connection electrode 3 surrounded by the recessed portions 6.

Again, with reference to FIG. 22, in the element region 5, a capacitance film (dielectric film) 112 is formed so as to cover and contact the lower electrode film 111 (capacitor electrode region 111A). The capacitance film 112 is formed across the entirety of the capacitor electrode region 111A (element region 5). In the present preferred embodiment, the capacitance film 112 further covers the insulating film 20 outside the element region 5.

An upper electrode film 113 is formed on the capacitance film 112. The upper electrode film 113 is provided with a capacitor electrode region 113A which is positioned at the element region 5, a pad region 113B which is positioned directly below the second connection electrode 4 and in contact with the second connection electrode 4 and a fuse region 113C which is disposed between the capacitor electrode region 113A and the pad region 113B.

As shown in FIG. 23B, the capacitance film 112 and the pad region 113B (upper electrode film 113) are formed along the side surfaces and the bottom surface of the base recessed portion 8 and the front surface of the insulating film 20 so as to enter into the recessed space defined by the side surfaces and the bottom surface of the base recessed portion 8 formed on the insulating film 20 in a region directly below the second connection electrode 4. Thereby, the recessed space is defined further by the capacitance film 112 and the pad region 113B in a region at which the base recessed portion 8 is formed. Then, the second connection electrode 4 is formed on the pad region 113B so that the recessed space defined by the capacitance film 112 and the pad region 113B is further refilled. Thereby, on the second connection electrode 4, the recessed portions 6 are formed at a position corresponding to the region in which the base recessed portion 8 is formed, and a flat portion 7 in which the recessed portions 6 is not formed is formed in an internal portion of the first connection electrode 3 surrounded by the recessed portions 6.

Again, with reference to FIG. 22, in the capacitor electrode region 113A, the upper electrode film 113 is divided (separated) into a plurality of electrode film portions (upper electrode film portions) 131 to 139. In the present preferred embodiment, each of the electrode film portions 131 to 139 is formed in a rectangular shape and extends in a band shape from the fuse region 113C to the first connection electrode 3. The plurality of electrode film portions 131 to 139 face the lower electrode film 111 across the capacitance film 112 over a plurality of types of facing areas (while being in contact with the capacitance film 112). More specifically, the facing areas of the electrode film portions 131 to 139 in relation to the lower electrode film 111 may be set to be 1:2:4:8:16:32:64:128:128. That is, the plurality of electrode film portions 131 to 139 include the plurality of electrode film portions different in facing area and, more specifically, include the plurality of electrode film portions 131 to 138 (or 131 to 137, 139) having facing areas that are set to form a geometric progression with a common ratio of 2. Thereby, the plurality of capacitor components C1 to C9 arranged by the respective electrode film portions 131 to 139 and also by the lower electrode film 111 which faces across the capacitance film 112 include the plurality of capacitor components, each of which has a different capacitance value. If the ratio of facing areas of the electrode film portions 131 to 139 is as described above, the ratio of capacitance values of the capacitor components C1 to C9 is equal to the ratio of the facing area concerned and is 1:2:4:8:16:32:64:128:128. That is, the plurality of capacitor components C1 to C9 thus include the plurality of capacitor components C1 to C8 (or C1 to C7, C9) with capacitance values that are set to form a geometric progression with the common ratio of 2.

In the present preferred embodiment, the electrode film portions 131 to 135, each of which is formed in a band shape, are equal in width and have lengths with the ratio thereof being set to 1:2:4:8:16. Also, the electrode film portions 135, 136, 137, 138, 139, each of which is formed in a band shape, are equal in length and have widths with the ratio thereof being set to 1:2:4:8:8. The electrode film portions 135 to 139 are formed to extend across a range from an end edge at the second connection electrode 4 side of the element region 5 to an end edge of the first connection electrode 3 side, and the electrode film portions 131 to 134 are formed to be shorter than this range.

The pad region 113B is formed to be substantially similar in shape to the second connection electrode 4 and has a substantially rectangular planar shape. As shown in FIG. 22, the upper electrode film 113 in the pad region 113B is in contact with the second connection electrode 4.

The fuse region 113C is disposed on the substrate 2 along one long side of the pad region 113B (the long side at the inner side in relation to the peripheral edge of the substrate 2). The fuse region 113C includes the plurality of fuse units 107 that are aligned along the one long side of the pad region 113B.

The fuse unit 107 is formed integrally with the pad region 113B of the upper electrode film 113 by using the same material thereof. The plurality of electrode film portions 131 to 139 are each formed integrally with one or the plurality of fuse units 107 and connected via the fuse units 107 to the pad region 113B, and electrically connected via the pad region 113B to the second connection electrode 4. As shown in FIG. 21, each of the electrode film portions 131 to 136 with a comparatively small area is connected via a single fuse unit 107 to the pad region 113B, while each of the electrode film portions 137 to 139 with a comparatively large area is connected via a plurality of fuse units 107 to the pad region 113B. It is not necessary for all the fuse units 107 to be used, and in the present preferred embodiment, some of the fuse units 107 are not used.

The fuse unit 107 includes a first wide portion 107A arranged to be connected to the pad region 113B, a second wide portion 107B arranged to be connected to the electrode film portions 131 to 139, and a narrow portion 107C connecting between the first wide portion 107A and the second wide portion 107B. The narrow portion 107C is arranged so as to be cut (fused) by laser light. Thereby, unnecessary electrode film portions among the electrode film portions 131 to 139 can be electrically disconnected from the first connection electrode 3 and the second connection electrode 4 by cutting the fuse unit 107.

Although omitted from illustration in FIG. 21 and FIG. 24, the front surface of the chip part 101 that includes a front surface of the upper electrode film 113 is covered by the passivation film 23 as shown in FIG. 22. The passivation film 23 is made of, for example, a nitride film and formed not only to cover the upper surface of the chip part 101 but also to extend to the side surfaces 2C to 2E of the substrate 2 to cover the entireties of the side surfaces 2C to 2E. At the side surfaces 2C to 2E, the passivation film 23 is interposed between the substrate 2 and the first connection electrode 3 or the second connection electrode 4. Further, the resin film 24 is formed on the passivation film 23. The resin film 24 covers the element forming surface 2A.

The passivation film 23 and the resin film 24 are protective films that protect the front surface of the chip part 101. In these films, the notched portions 25 are individually formed in regions corresponding to the first connection electrode 3 and the second connection electrode 4. The notched portions 25 penetrate through the passivation film 23 and the resin film 24. Further, in the present preferred embodiment, the notched portion 25 corresponding to the first connection electrode 3 also penetrates through the capacitance film 112.

The first connection electrode 3 and the second connection electrode 4 are respectively embedded in the notched portions 25. Thereby, the first connection electrode 3 is bonded to the pad region 111B of the lower electrode film 111, while the second connection electrode 4 is bonded to the pad region 113B of the upper electrode film 113. Each of the first connection electrode 3 and the second connection electrode 4 projects from the front surface of the resin film 24 and also has a lead-out portion 27 leading out to an inner side (element region 5 side) of the substrate 2 along a front surface of the resin film 24. Thereby, the chip part 101 can be flip-chip bonded to the mounting substrate.

FIG. 25 is a circuit diagram which shows an electrical arrangement of the interior of the chip part 101. The plurality of capacitor components C1 to C9 are connected in parallel between the first connection electrode 3 and the second connection electrode 4. Fuses F1 to F9, each of which is arranged from one or a plurality of fuse units 107, are interposed in series between each of the capacitor components C1 to C9 and the second connection electrode 4.

When all the fuses F1 to F9 are connected, the capacitance value of the chip part 101 is equal to a total of the capacitance values of the capacitor components C1 to C9. When one or two or more fuses selected from the plurality of fuses F1 to F9 are cut, each of the capacitor components corresponding to the thus cut fuse is disconnected and the capacitance value of the chip part 101 is decreased only by the capacitance value of the thus disconnected capacitor component.

Therefore, measuring a capacitance value across the pad regions 111B and the 113B (a total capacitance value of the capacitor components C1 to C9) and, thereafter, using laser light to fuse one or a plurality of fuses selected appropriately from the fuses F1 to F9 according to a desired capacitance value, thus makes it possible to perform adjustment (laser trimming) to a desired capacitance value. In particular, if capacitance values of the capacitor components C1 to C8 are set to form a geometric progression with a common ratio of 2, it is possible to make fine adjustment to a target capacitance value at a precision corresponding to the capacitance value of the capacitor component C1, which is the smallest capacitance value (a value of the first term of the geometric progression).

For example, the capacitance values of the capacitor components C1 to C9 may be set as follows.

C1=0.03125 pF

C2=0.0625 pF

C3=0.125 pF

C4=0.25 pF

C5=0.5 pF

C6=1 pF

C7=2 pF

C8=4 pF

C9=4 pF

In this case, the capacitance value of the chip part 101 can be finely adjusted at a minimum adjustment precision of 0.03125 pF. Further, the fuse to be cut is selected appropriately from the fuses F1 to F9 to provide the chip part 101 with an arbitrary capacitance value between 10 pF to 18 pF.

FIG. 26 is a flow chart which describes one example of the steps of manufacturing the chip part 101 shown in FIG. 21.

The steps of manufacturing the chip part 101 are the same as the steps of manufacturing the chip part 1 after formation of the resistor portion 56 in Embodiment 1. That is, the chip part 101 can be obtained by performing a step of forming the capacitor components C1 to C9 in place of the step of forming the resistor portion 56 in Embodiment 1. Hereinafter, a detailed description will be given of a difference from the manufacturing step of Embodiment 1.

That is, where the capacitor components C1 to C9 and the fuse unit 107 are formed in the chip part 101, first, an insulating film 20 is formed on a front surface of the previously described substrate 30 (substrate 2) by a thermal oxidation method and/or a CVD method (Step S11). Next, a base recessed portion 8 is formed at a position corresponding to a region of the insulating film 20 where recessed portions 6 of the first connection electrode 3 and the second connection electrode 4 are to be formed (Step S12). More specifically, a mask having openings selectively in the region at which the base recessed portion 8 is to be formed is formed on the insulating film 20. Then, the insulating film 20 is subjected to etching via the mask. Thereby, the base recessed portion 8 is formed on the insulating film 20.

Next, the lower electrode film 111 made of an aluminum film is formed across the entire front surface of the insulating film 20, for example, by a sputtering method (Step S13). Next, a resist pattern corresponding to the final shape of the lower electrode film 111 is formed on a front surface of the lower electrode film by photolithography (Step S14). The lower electrode film is etched by using the resist pattern as a mask to obtain the lower electrode film 111 of the pattern shown in FIG. 22 (Step S15). Etching of the lower electrode film 111 may be performed, for example, by reactive ion etching.

Next, the capacitance film 112 constituted of a silicon nitride film, etc., is formed on the lower electrode film 111, for example, by a plasma CVD method (Step S16). In the region at which the lower electrode film 111 is not formed, the capacitance film 112 is to be formed on the front surface of the insulating film 20. Next, an upper electrode film 113 is formed on the capacitance film 112 (Step S17). The upper electrode film 113 is made of, for example, an aluminum film and may be formed by the sputtering method.

Next, a resist pattern corresponding to the final shape of the upper electrode film 113 is formed on the front surface of the upper electrode film 113 by photolithography (Step S18). The upper electrode film 113 is patterned to the final shape (refer to FIG. 21 and others) by etching using the resist pattern as a mask (Step S19). Thereby, the upper electrode film 113 is shaped to a pattern having a portion divided into the plurality of electrode film portions 131 to 139 in the capacitor electrode region 113A, having the plurality of fuse units 107 in the fuse region 113C and having the pad region 113B connected to the fuse units 107. The etching for patterning the upper electrode film 113 may be performed by wet etching using an etching liquid such as phosphoric acid or by reactive ion etching.

The capacitor components C1 to C9 and the fuse units 107 in the chip part 101 are formed by the above. Next, an insulating film 45 is formed as a cover film by the same process as that shown in FIG. 11A. Next, a probe 70*a* is pressed to the pad region 113B of the upper electrode film 113 and the pad region 111B of the lower electrode film 111 to measure a total capacitance value of the plurality of capacitor components C1 to C9 (Step S20). In this process, the probe 70*a* is in contact with the pad region 111B and the pad region 113B. A flat portion in which a groove (recessed space) is not formed is formed in the pad region 111B and the pad region 113B. Therefore, an inspection probe can be prevented from entering into the groove (recessed space). Thereby, the inspection probe is secured for a contact region satisfactorily, thus making it possible to measure satisfactorily the total capacitance value of the plurality of capacitor components C1 to C9. On the basis of the thus measured total capacitance value, the capacitor components C1 to C9 to be disconnected, that is, the fuses F to be cut are selected according to the capacitance value of a target chip part 101 (Step S21).

That is, each fuse unit 107 which constitutes a fuse selected in accordance with the measurement result of the total capacitance value is irradiated with laser light to fuse the narrow portion 107C (refer to FIG. 21) of the fuse unit 107 (Step S22). Thereby, a corresponding capacitor component is disconnected from the pad region 113B. When laser light is irradiated at the fuse unit 107, the energy of the laser light is accumulated in the vicinity of the fuse unit 107 by the action of the insulating film 45, which is a cover film, and the fuse unit 107 is thereby fused. Thus, the capacitance value of the chip part 101 can be set to a target capacitance value reliably.

Thereafter, the same steps as those of the chip part 1 are performed in accordance with the steps of FIG. 11C to FIG. 11I.

As described above, even where the capacitors are formed in the element region 5, there can be obtained the same effects as those of Embodiment 1.

FIG. 27 is a plan view of a chip part 102 of Embodiment 3 of the present invention or a drawing which shows a positional relationship between a first connection electrode, a second connection electrode and a circuit element as well as an arrangement of the element in a plan view.

In Embodiment 2, the capacitor electrode region 113A of the upper electrode film 113 is divided into the electrode film portions 131 to 139, each of which is formed in a band shape. In this case, as shown in FIG. 21, a region which cannot be used as a capacitor component will develop inside the element region 5, by which it is impossible to effectively use a limited region on the small substrate 2.

Therefore, in the embodiment shown in FIG. 27, a plurality of electrode film portions 131 to 139 are divided into electrode film portions 141 to 149, each of which is formed in an L-letter shape. Thereby, for example, the electrode film portion 149 arranged as shown in FIG. 27 is able to face a lower electrode film 111 in an area which is 1.5 times greater than that of the electrode film portion 139 arranged in FIG. 21. Thereby, in Embodiment 2 of FIG. 21, on the assumption that the capacitor components C9 corresponding to the electrode film portion 139 is to have a capacitance of 4 pF, the electrode film portion 149 of the present preferred embodiment can be used to give a capacitance of 6 pF to the capacitor component C9. Thereby, it is possible to effectively use the interior of the element region 5 and to set a wider capacitance value of the chip part 102.

The step of manufacturing the chip part 102 of the present preferred embodiment is substantially similar to that described in FIG. 26. However, when the upper electrode film 113 is patterned (Steps S18, S19), the capacitor electrode region 113A is divided into the plurality of electrode film portions 141 to 149, and each one of the electrode film portions is formed in such a shape shown in FIG. 27.

As described so far, the arrangement of Embodiment 3 is also able to provide the same effects as those described in Embodiment 1.

FIG. 28 is a plan view of a chip part 103 of Embodiment 4 of the present invention or a drawing which shows a positional relationship between a first connection electrode, a second connection electrode and a circuit element as well as an arrangement of the element in a plan view.

In Embodiment 2 which has been described previously, the lower electrode film 111 is provided with the capacitor electrode region 111A constituted of a continuous pattern covering substantially its entirety of the element region 5. And, the capacitor electrode region 113A of the upper electrode film 113 is divided into the plurality of electrode film portions 131 to 139 (refer to FIG. 21, etc.).

In contrast, in Embodiment 4, a capacitor electrode region 113A and a pad region 113B of an upper electrode film 113 are formed in a continuous film pattern which continues substantially in its entirety of an element region 5, while the capacitor electrode region 111A of a lower electrode film 111 is divided into a plurality of electrode film portions 151 to 159. The electrode film portions 151 to 159 may be formed so as to be similar in shape and area ratio to the electrode film portions 131 to 139 of Embodiment 2 or formed so as to be similar in shape and area ratio to the electrode film portions 141 to 149 of Embodiment 3.

In the present preferred embodiment, an example that at least any one of the electrode film portions 151 to 159 (in FIG. 28, the electrode film portion 159) is formed in an L-letter shape in the capacitor electrode region 111A, is shown. Therefore, a plurality of capacitor components are arranged by the electrode film portions 151 to 159, the capacitance film 112 and the upper electrode film 113. At least, some of the plurality of capacitor components constitute a group of capacitor components different in capacitance value (for example, individual capacitance values are set so as to give a geometric progression). The electrode film portions 151 to 159 respectively arrange the capacitor components C1 to C9. The electrode film portion 159 of FIG. 28 is folded in an L-letter shape and formed in its entirety of the element region 5. Therefore, the capacitance value of the capacitor component C9 can be made greater than the capacitance value of the capacitor component C8, for example, two times thereof. Thereby, unlike Embodiment 2 in which the capacitor components C8 and C9 are equal in capacitance value (refer to FIG. 21), capacitance values of all the capacitor components C1 to C9 can be set so as to give a geometric progression.

The lower electrode film 111 is further provided with a fuse region 111C between the capacitor electrode region 111A and the pad region 111B. As with the fuse units 107 of Embodiment 2, a plurality of fuse units 147 are aligned in a row along the pad region 111B in the fuse region 111C. Each of the electrode film portions 151 to 159 is connected to the pad region 111B via one or the plurality of fuse units 147.

In the arrangement as well, the electrode film portions 151 to 159 face the upper electrode film 113 at a mutually different facing area and they can be disconnected individually by cutting the fuse units 147. Thus, the same effects as those of Embodiment 2 can be obtained. In particular, at least, some of the plurality of electrode film portions 151 to 159 are formed so as to face the upper electrode film 113 at a facing area set so as to form a geometric progression with a common ratio of 2. It is thereby possible to provide a chip part adjusted to a predetermined capacitance value at high precision, as in the case of Embodiment 2.

The steps of manufacturing the chip part 103 of the present preferred embodiment are substantially similar to the steps shown in FIG. 26. However, when the lower electrode film 111 is patterned (Steps S13, S14), the capacitor electrode region 111A is divided into the electrode film portions 151 to 159 and also the plurality of fuse units 147 are to be formed in the fuse region 111C. Further, when the upper electrode film 113 is patterned (Steps S18, S19), the plurality of electrode film portions are not formed or the fuse units are not formed either. However, the upper electrode film 113 is patterned so as not to overlap each of the fuse units 147 in a plan view. Further, in laser trimming (Step S22), laser light is used to cut the fuse units 147 formed on the lower electrode film 111. On laser trimming, the lower electrode film 111 is covered by the capacitance film 112 and, therefore, the capacitance film 112 can be used as a cover film for accumulating the energy of the laser light. Thus, a step of forming the insulating film 45 as a cover film directly before the laser trimming may be omitted. Since the upper electrode film 113 does not overlap each of the fuse units 147 in a plan view, the upper electrode film 113 will not be cut by the laser trimming.

As described so far, the arrangement of Embodiment 4 is also able to provide the same effects as those of Embodiment 1.

<Fuse>

FIG. 29 is a plan view of a chip part 201 of Embodiment 5 of the present invention.

The chip part 201 of Embodiment 5 is different from the chip part 1 of Embodiment 1 in that as a circuit element formed on an element region 5, a fuse component 204 is formed in place of the resistor portion 56. The chip part 201 is similar in other arrangements to the chip part 1 of Embodiment 1. In FIG. 29, the portions corresponding to the individual portions shown in FIG. 1 to FIG. 28 are given the same reference numerals, with a description thereof omitted.

The fuse component 204 includes in an integrated manner a pair of pad regions 209 disposed below each of the first connection electrode 3 and the second connection electrode 4, a soluble portion 210 disposed between a pair of pad regions 209, and a pair of wiring portions 211 connecting the soluble portion 210 to each of the pad regions 209. In the present preferred embodiment, the fuse component 204 is made of an AlCu alloy but may be made of other metal materials.

Each of the pad regions 209 is formed in a rectangular shape which is by one size smaller than the first connection electrode 3 and the second connection electrode 4 in a plan view so that an entirety thereof can be housed in an internal region of the first connection electrode 3 or the second connection electrode 4.

The soluble portion 210 is formed so as to give a line extending along the long direction of the substrate 2, and each of the wiring portions 211 is connected to both ends of the soluble portion 210. In the present preferred embodiment, the soluble portion 210 is rectilinear along the long direction of the substrate 2 but may be formed in a curved shape such as an S-letter shape. Further, in the present preferred embodiment, the soluble portion 210 is formed substantially equal in width to the wiring portion 211. However, in order to fuse the soluble portion 210 more easily, the soluble portion 110 may be formed narrower than the wiring portion 211.

Then, at both sides of the soluble portion 210 in the width direction orthogonal to the long direction, a pair of dummy metals 212 are disposed as a wall portion. The pair of dummy metals 212 are made of the same metal material (an AlCu alloy in the present preferred embodiment) as that of the fuse component 204. Further, the pair of dummy metals 212 also extend so as to form a line (rectilinearly) along the line-shaped soluble portion 210 and disposed, with a side clearance 213 kept, in relation to the soluble portion 210. In the present preferred embodiment, the line-shaped soluble portion 210 and the pair of dummy metals 212 are both formed along the long direction of the substrate 2. Thereby, as compared with a case where they are formed along the width direction of the substrate 2, it is possible to form the soluble portion 210 and the pair of dummy metals 212 which are relatively long in a region of the substrate 2 which is dimensionally restricted. Thus, the side clearance 213 can be formed over a relatively long distance to increase a region which accumulates heat of the soluble portion 210.

Each one of the wiring portions 211 is disposed at one side of the substrate 2 and also at the opposite side in the width direction thereof in relation to the soluble portion 210. In the present preferred embodiment, each of the wiring portions 211 is formed in a claw shape (L-letter shape) having a portion extending perpendicularly from an end of the soluble portion 210 to a long side 85 of the substrate 2 and a portion extending parallel to the long side 85, and the portion parallel to the long side 85 is connected to the pad region 209.

FIG. 30 covers a sectional view of the chip part in FIG. 29 taken along section line XXXa-XXXa, that taken along section line XXXb-XXXb, and that taken along section line XXXc-XXXc. The sectional view taken along section line XXXa-XXXa shows a structure of the soluble portion 210 and that of the dummy metal 212, the sectional view taken along section line XXXb-XXXb shows a structure of the wiring portion 211, and the sectional view taken along section line XXXc-XXXc shows a structure of the pad region 209. FIG. 31 is a sectional view of the chip part in FIG. 29 taken along section line XXXI-XXXI. FIG. 32 is a sectional view of the chip part in FIG. 29 taken along section line XXXII-XXXII.

An insulating film 20 similar in arrangement to that of Embodiment 1 is formed on a front surface of the substrate 2 which includes the element forming surface 2A. The fuse component 204 is formed via a nitride film 215 on the insulating film 20. The nitride film 215 is made of silicon nitride (SiN) and has the thickness of 8000 Å or less. The nitride film 215 is formed selectively in a region below a portion other than the soluble portion 210 of the fuse component 204 (in the present preferred embodiment, the pad region 209 and the wiring portion 211) so as to be removed from below the soluble portion 210 in a region below the fuse component 204.

As described above, the portion other than the soluble portion 210 is selectively supported from below by a supporting film made of the nitride film 215 and, therefore, the soluble portion 210 is supported at both sides in a state of being raised from the substrate 2 by portions connected to the both ends thereof (in the present preferred embodiment, the wiring portions 211). Thereby, the soluble portion 210 is disposed, with a lower clearance 216 kept, in relation to the substrate 2 covered by the insulating film 20. Further, the dummy metal 212 at the side of the soluble portion 210 is also disposed, with the lower clearance 216 kept, in relation to the substrate 2. Here, as shown in the cross section taken along section line XXXa-XXXa in FIG. 30, a side clearance 213 between the soluble portion 210 and the dummy metal 212 is formed to give 0.6 μm or less, with consideration given to the thickness of a covering oxide film 218 to be described below.

In the present preferred embodiment, the lower surfaces of the fuse component 204 and the dummy metal 212 are covered with a base oxide film 217, and the covering oxide film 218 is also formed so as to cover the entirety of the fuse component 204. The fuse component 204 is completely covered by the base oxide film 217 and the covering oxide film 218, by which the soluble portion 210 can be reliably insulated from the peripheries thereof.

The covering oxide film 218 is formed across the entirety of the element forming surface 2A of the substrate 2. As shown in FIG. 30, the covering oxide film 218 is fixed on the insulating film 20 in a region other than regions in which the fuse component 204 and the dummy metal 212 are formed. The dummy metal 212 is covered by the covering oxide film 218 and thereby supported in a state of being raised from the substrate 2 by a portion fixed to the insulating film 20 of the covering oxide film 218.

Then, a laminated film constituted of an oxide film 219, a nitride film 220 and a surface protective film 222 is formed as an example of a ceiling portion so as to cover the soluble portion 210 and the dummy metal 212. The oxide film 219 is made of silicon oxide ($SiO_2$) and has the thickness of, for example, 10000 Å or less. The nitride film 220 is made of silicon nitride (SiN) and has the thickness of, for example, 11000 Å to 13000 Å. The surface protective film 22 is made of polyimide and has the thickness of, for example, 20000 Å to 100000 Å.

Laminated films 219, 220, 222 are formed above the soluble portion 210 and the dummy metal 212 so as to extend from the dummy metal 212 via the soluble portion 210 as shown in the cross section taken along section line XXXa-XXXa in FIG. 30. Thereby, the side clearance 213 between the soluble portion 210 and the dummy metal 212 is closed above thereof by the laminated films 219, 220, 222. Further, of the laminated films 219, 220, 222, the oxide film 219 is selectively removed at a portion facing the side clearance 213. Thereby, the oxide film 219 is provided with a clearance 223 which has the same pattern as the side clearance 213.

The nitride film 224 is interposed between the laminated films 219, 220, 222 and the covering oxide film 218. The nitride film 224 is selectively removed from regions above the soluble portion 210 and the dummy metal 212. Thereby, the laminated films 219, 220, 222 are disposed, with an upper clearance 225 kept, in relation to the soluble portion 210 covered by the covering oxide film 218.

As shown in the cross section taken along section line XXXc-XXXc in FIG. 30, each of the first connection electrode 3 and the second connection electrode 4 penetrates through the laminated films 219, 220, 222, the nitride film 224 and the covering oxide film 218, and the lower surface thereof is connected to the pad region 209.

As shown in FIG. 32, a plurality of base recessed portions 8 are formed on the insulating film 20 in an arrangement similar to that of Embodiment 1.

The nitride film 215 formed on the insulating film 20 as well as the base oxide film 217 formed on the nitride film 215 are respectively formed so as to enter below the first connection electrode 3. More specifically, the nitride film

215 and the base oxide film 217 are formed along side surfaces and a bottom surface of the base recessed portion 8 and also along a front surface of the insulating film 20 so as to enter into a recessed space defined by the side surfaces and the bottom surface of the base recessed portion 8. Thereby, the recessed space is defined also in a region at which the base recessed portion 8 is formed by the nitride film 215 and the base oxide film 217. Then, a pad region 209 (fuse component 204) is formed on the front surface of the base oxide film 217.

The pad region 209 is formed on the base oxide film 217 so as to further refill the recessed space defined by the nitride film 215 and base oxide film 217. The pad region 209 is shaped so that a position corresponding to the region in which the base recessed portion 8 has been formed will be recessed, thereby defining additionally a recessed space. The first connection electrode 3 is formed along the front surface of the thus formed pad region 209. Accordingly, in the first connection electrode 3, the recessed portion 6 is formed at a position corresponding to the region in which the base recessed portion 8 has been formed.

As described so far, according to the chip part 201, as apparent from the cross section taken along section line XXXa-XXXa in FIG. 30, clearances 213, 216, 225 are formed at both sides of the soluble portion 210 and across its entirety in all direction above and below. Therefore, it is possible to effectively accumulate heat generated in the soluble portion 210 in the peripheries (clearances 213, 216, 225). Therefore, when an excess current flows between the first connection electrode 3 and the second connection electrode 4 of the chip part 201, the fuse component 204 can be reliably fused at the soluble portion 210.

Further, the soluble portion 210 is surrounded in its entirety in all directions by the clearances 213, 216, 225, thus making it possible to secure a space which can cope with movement and bending of the soluble portion 210.

Further, as the substrate 2, a high resistor silicon substrate having a resistance value of 100 Ω·cm or more, is adopted. Thus, even if the insulating film 20 is broken on fusing of the soluble portion 210, it is possible to prevent a leak current from flowing via the substrate 2 exposed at a broken site thereof.

The chip part 201 can be obtained by performing a step of forming the fuse component 204 shown in FIG. 33 to FIG. 39, in place of the step of forming the resistor portion 56 in Embodiment 1. Hereinafter, with reference to FIG. 33 to FIG. 39, a detailed description will be given of a difference from the manufacturing step of Embodiment 1.

Each of FIG. 33 to FIG. 39 is a sectional view which describes a part of the manufacturing steps of the chip part 201 shown in FIG. 29 in accordance with the steps, showing the same sectional view as FIG. 30 which is taken along section line XXXa-XXXa, that taken along section line XXXb-XXXb and that taken along section line XXXc-XXXc.

Figure 33:
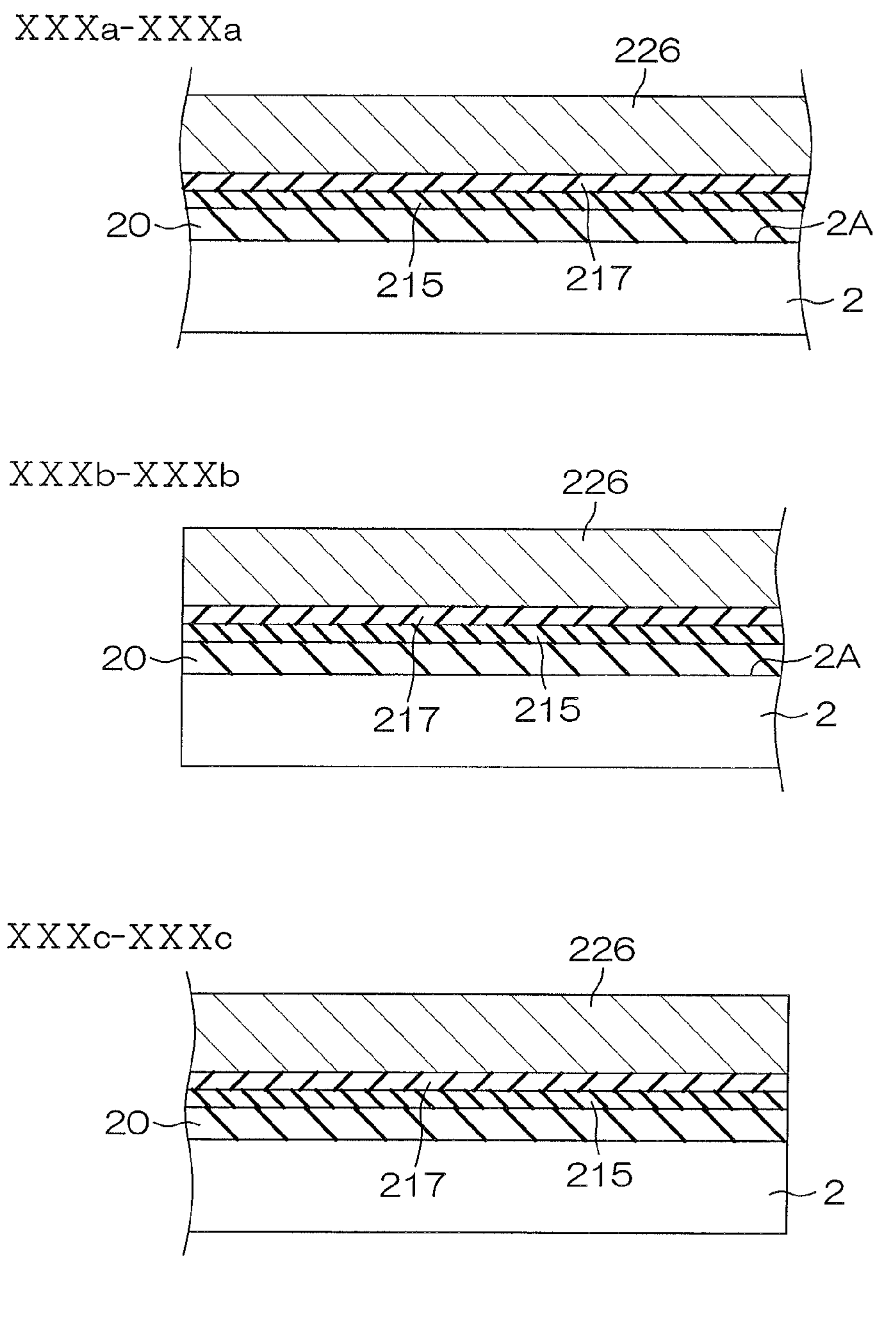

In manufacturing of the chip part 201, first, as shown in FIG. 33, in the same step as the step of Embodiment 1, an insulating film 20 which has the base recessed portion 8 is formed. Next, for example, a CVD method is performed to deposit silicon nitride (SiN) on the insulating film 20, thereby forming a nitride film 215 as a sacrifice layer. The nitride film 215 is set so as to give the thickness which enables side etching in a subsequent etching step (refer to FIG. 36). And, the thickness is, for example, 8000 Å or less.

Next, for example, a CVD method is performed to deposit USG (un-doped silicate glass) on the nitride film 215, thereby forming a base oxide film 217. The base oxide film 217 is set so as to give the thickness which will not disappear by two subsequent etching steps (refer to FIG. 36 and FIG. 38), and the thickness is, for example, 7000 Å to 9000 Å. However, the base oxide film 217 may be omitted and a fuse component material film 226 to be described below may be directly deposited on the nitride film 215.

Next, for example, a sputtering method is performed to deposit an AlCu alloy on the base oxide film 217, thereby forming a fuse component material film 226. The thickness of the fuse component material film 226 is, for example, 4000 Å to 6000 Å.

Figure 34:
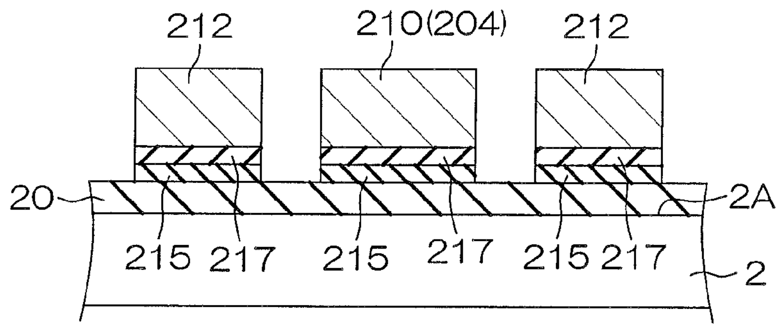
Figure 34:
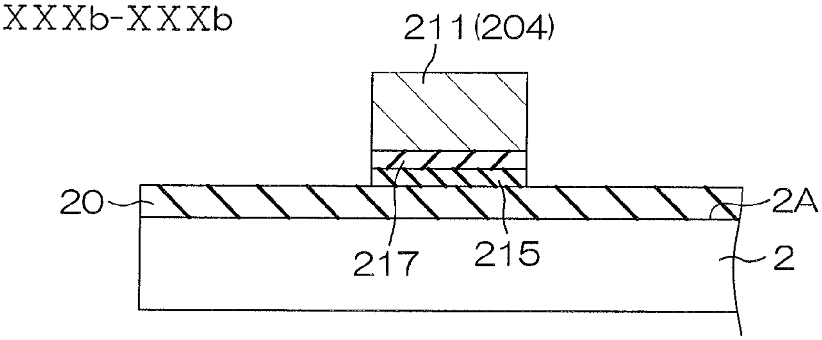
Figure 34:
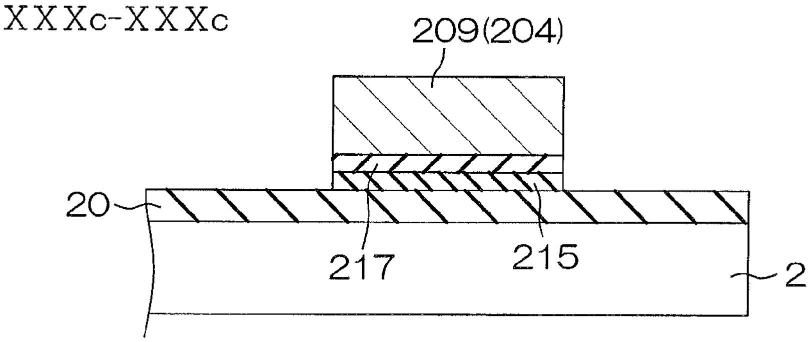

Next, as shown in FIG. 34, a mask (not shown) which covers selectively a region in which the fuse component 204 and the dummy metal 212 are to be formed is formed on the fuse component material film 226, and dry etching which uses the mask is performed to selectively remove the fuse component material film 226. Thereby, the fuse components 204 (the pad region 209, the soluble portion 210 and the wiring portion 211) and the dummy metal 212 are formed at the same time. Next, the dry etching which uses the mask for forming the fuse components 204 is performed to selectively remove the base oxide film 217 and the nitride film 215 except for regions below the fuse component 204 and the dummy metal 212.

Figure 35:
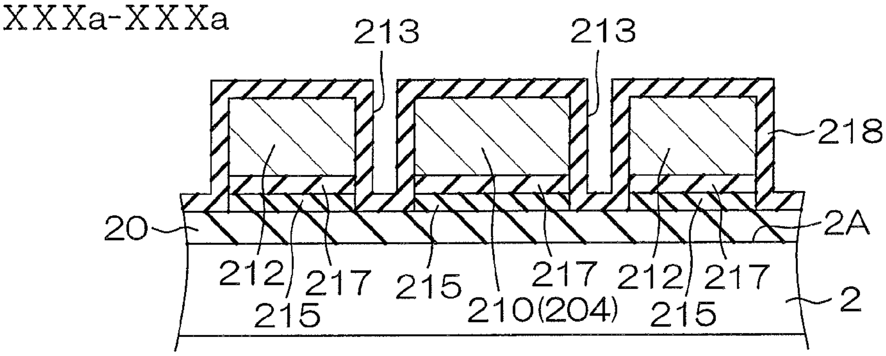
Figure 35:
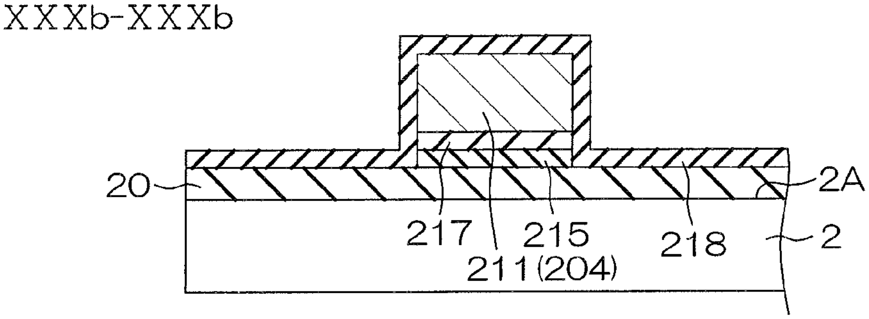
Figure 35:
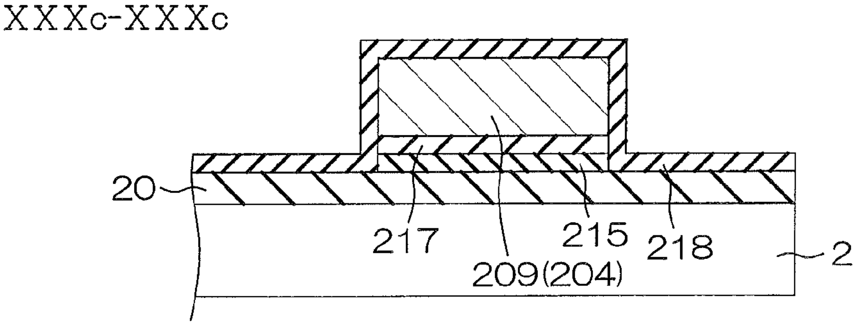

Next, as shown in FIG. 35, for example, a CVD method is performed to deposit USG on the substrate 2, thereby forming a covering oxide film 218. The covering oxide film 218 is such that one front surface thereof and the other front surface thereof are formed along the upper surface and the side surfaces of the fuse component 204 and those of the dummy metal 212 so that a side clearance 213 is formed between the fuse component 204 (soluble portion 210) and the dummy metal 212 which are mutually adjacent. In this process, the covering oxide film 218 is set so as to give the thickness which will not disappear by two subsequent etching steps (refer to FIG. 36 and FIG. 38) and also set so as to give the dimension in which the side clearance 213 will not be buried by a subsequent deposition step of the nitride film 224 (refer to FIG. 37). In the present preferred embodiment, the thickness is set, for example, at 7000 Å to 9000 Å so that the side clearance 213 becomes 0.6 μm or less.

Figure 36:
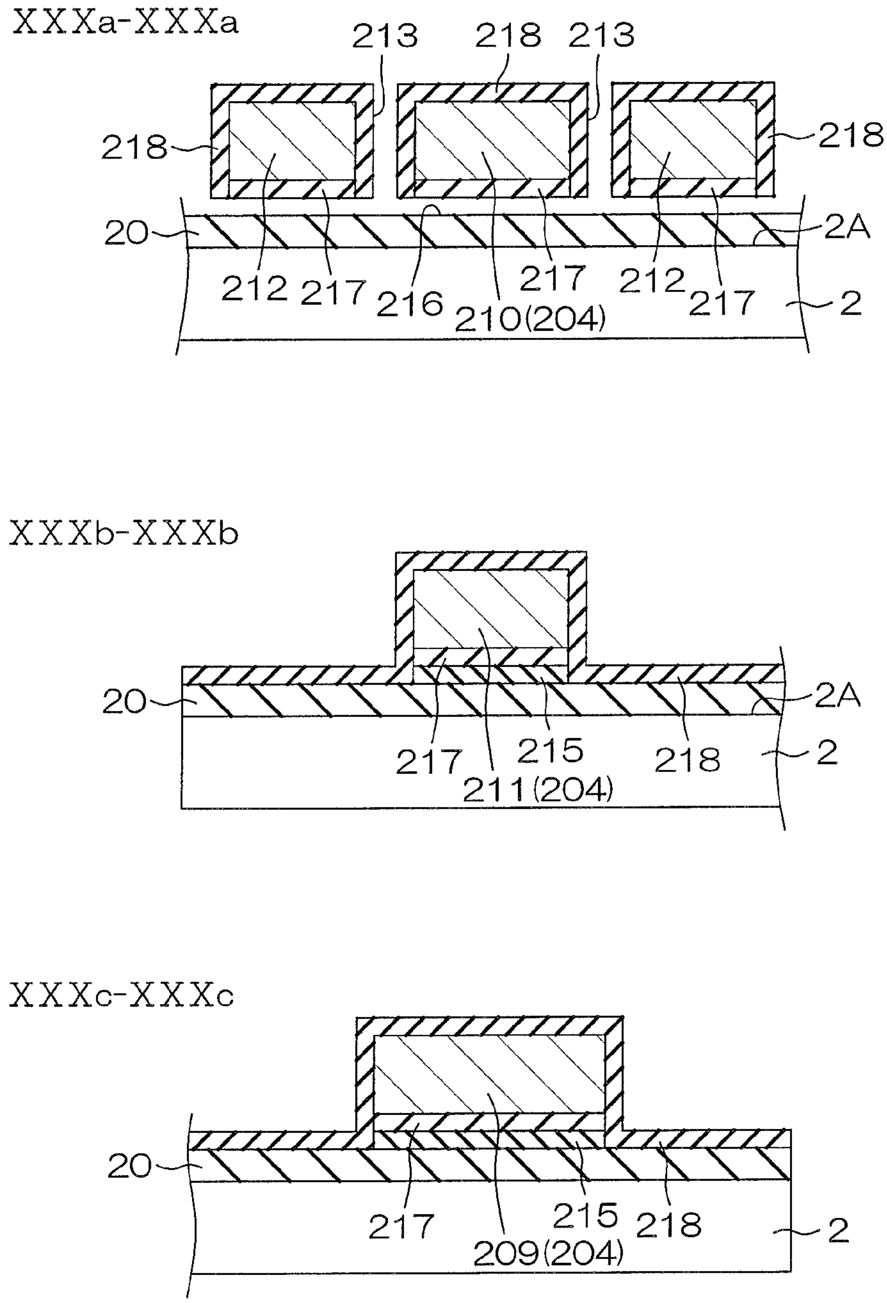

Next, as shown in FIG. 36, an etching gas or an etching liquid which is relatively greater in etching rate for, for example, silicon nitride (SiN) than for silicon oxide ($SiO_2$), is used to selectively remove the nitride film 215 in a region below the fuse component 204 and the dummy metal 212. In the present preferred embodiment, after removal of the covering oxide film 218 of the side clearance 213, dry etching with the use of a fluorine-based gas is performed to remove the nitride film 215 from the bottom surface of the side clearance 213 by means of isotropic etching (side etching). Thereby, a lower clearance 216 is formed in lower regions of the fuse component 204 and the dummy metal 212. And, the fuse component 204 and the dummy metal 212 are in a state of being raised from the substrate 2.

Figure 37:
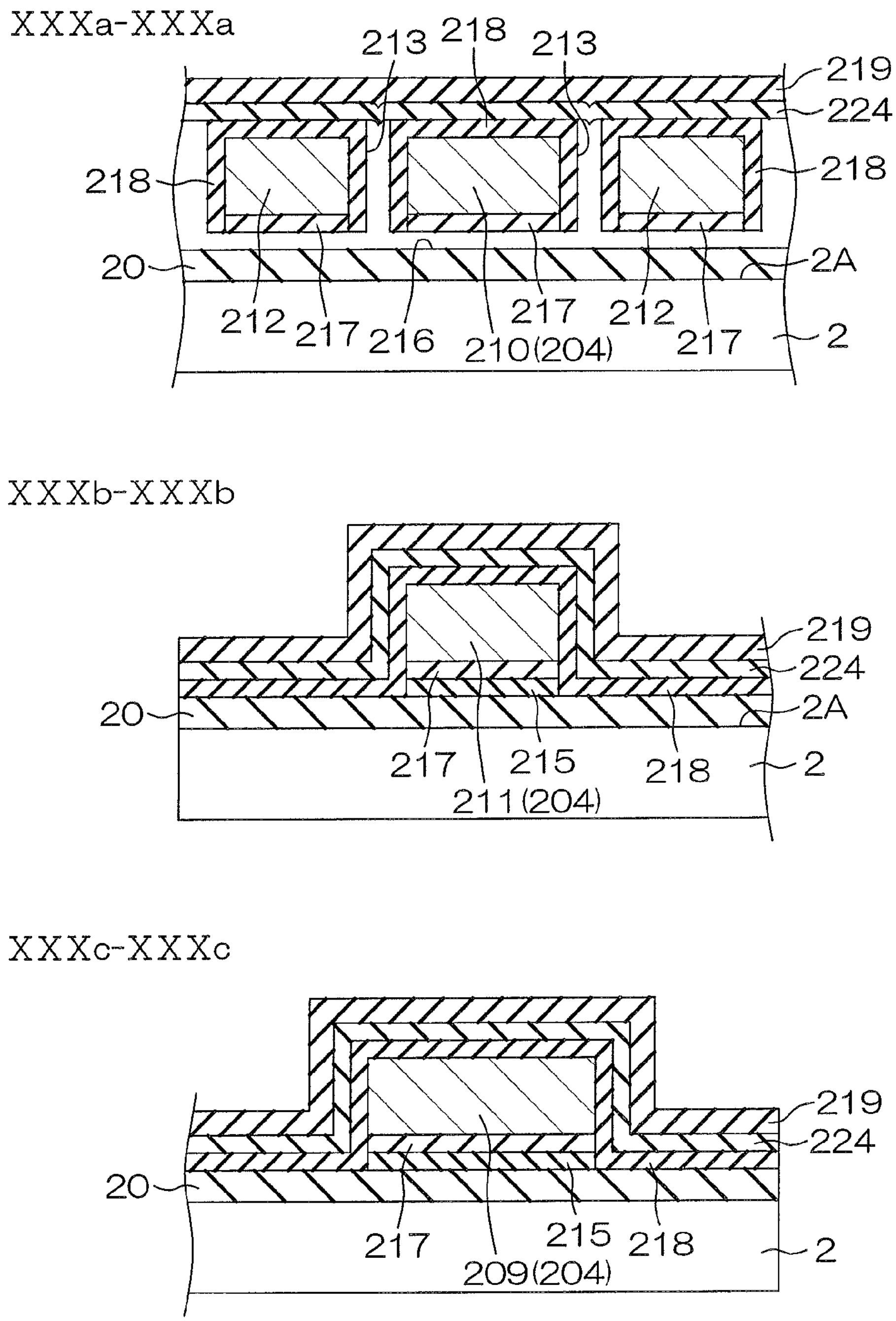

Next, as shown in FIG. 37, for example, a CVD method is performed to deposit silicon nitride (SiN) and USG on the substrate 2 in this order, thereby forming a nitride film 224 and an oxide film 219 as a sacrifice layer. At this time, the side clearance 213 is 0.6 μm or less and, therefore, the nitride film 224 and the oxide film 219 are formed by extending between a pair of dummy metal 212 so as to cover the soluble portion 210.

Figure 38:
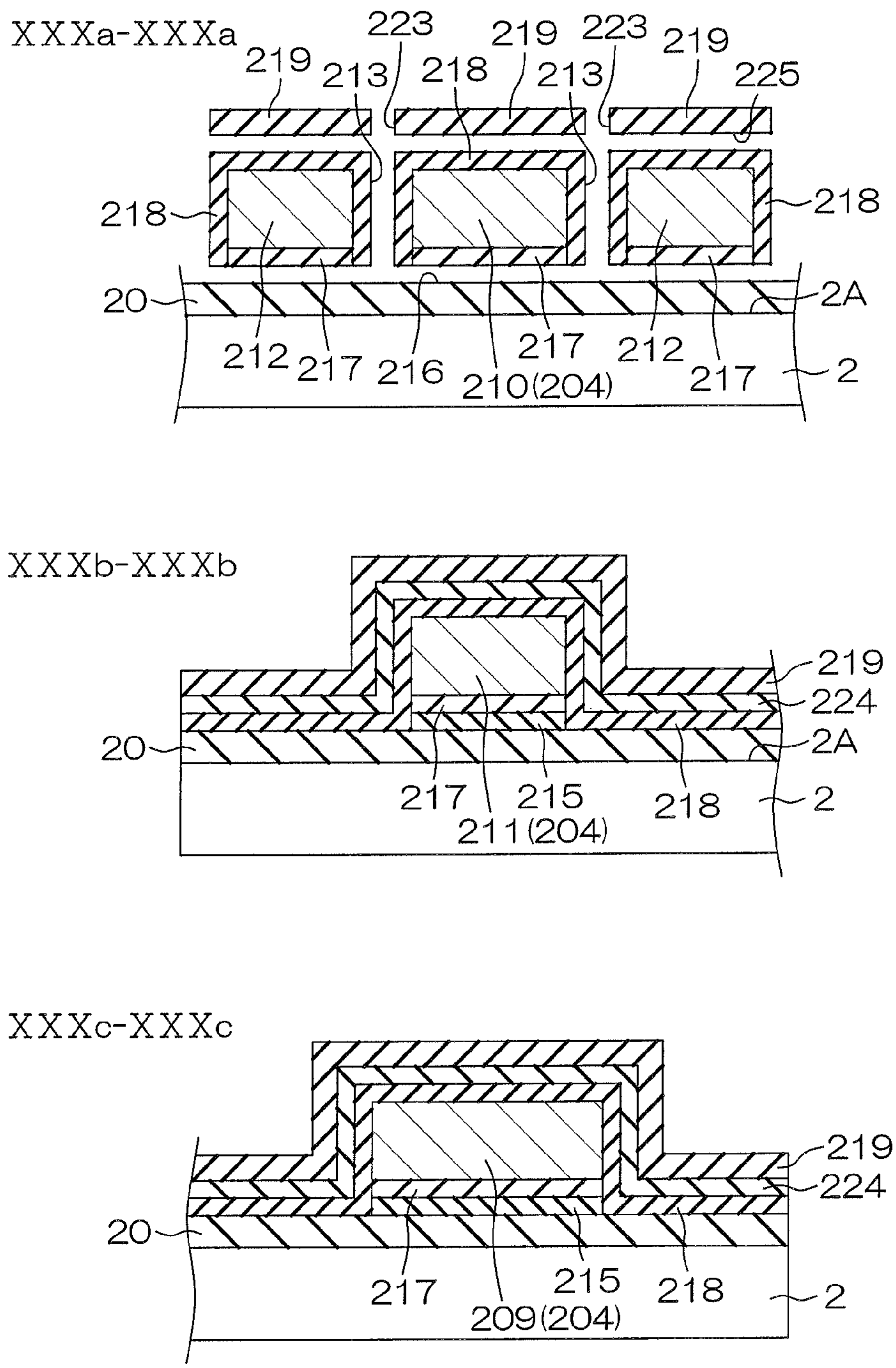

Next, as shown in FIG. 38, an etching gas or an etching liquid which is relatively greater in etching rate for, for example, silicon nitride (SiN), than for silicon oxide ($SiO_2$), is used to selectively remove the nitride film 224 at the upper regions of the fuse component 204 and the dummy metal 212. In the present preferred embodiment, after formation of a clearance 223 with the same pattern as that of the side clearance 213 on the oxide film 219, dry etching with the use of a fluorine-based gas is performed to remove the nitride film 224 from the bottom surface of the clearance 223 by means of isotropic etching (side etching). Thereby, an upper clearance 225 is formed at the upper regions of the fuse component 204 and the dummy metal 212.

Figure 39:
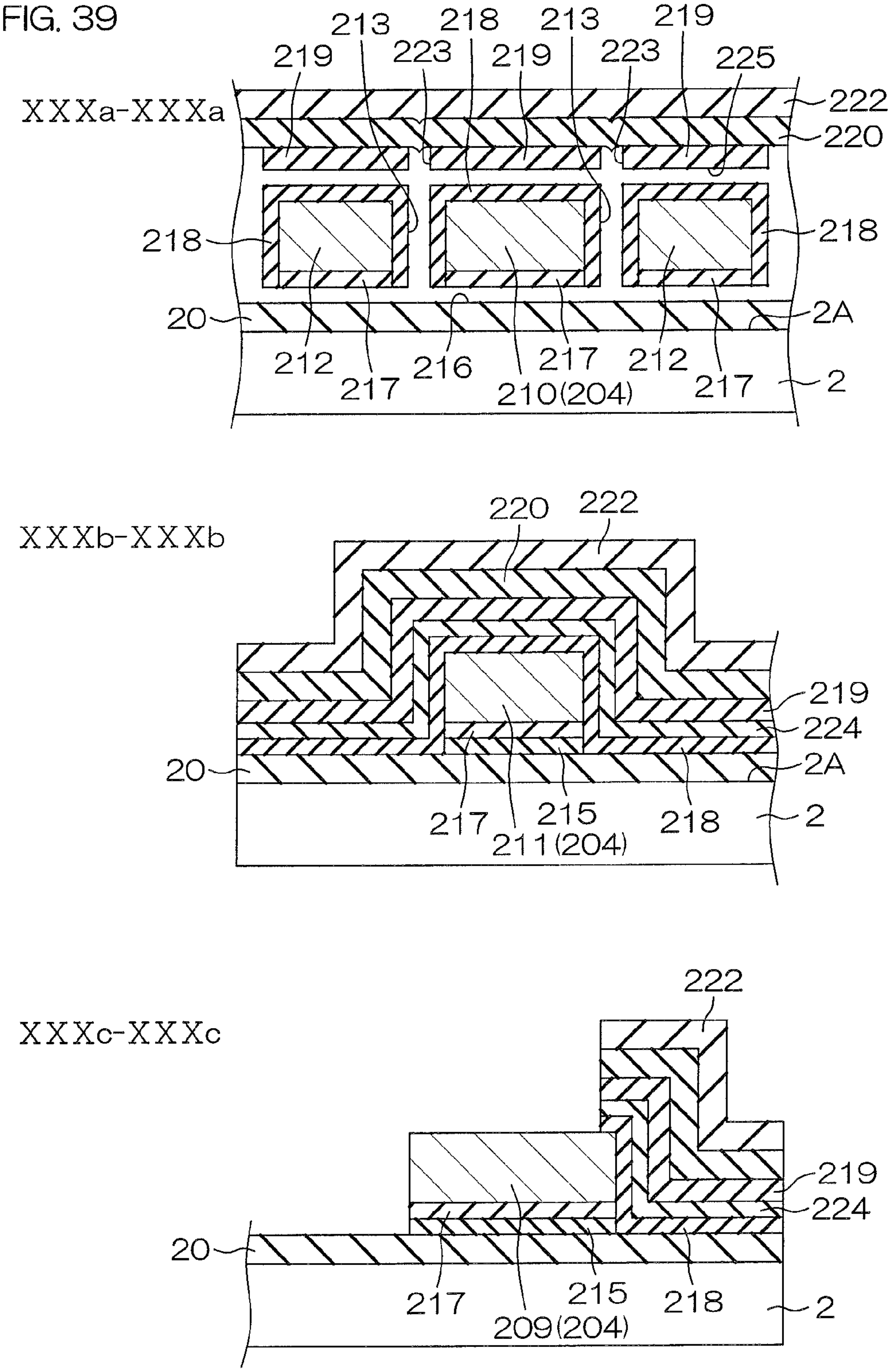

Next, as shown in FIG. 39, for example, a CVD method is used to deposit silicon nitride (SiN) on the oxide film 219, thereby forming a nitride film 220. Next, polyimide is coated on the nitride film 220 to cure the polyimide, thereby forming a surface protective film 222. Next, laminated films 218, 224, 219, 220, 222 on the pad region 209 of the fuse component 204 are selectively removed by etching.

Thereafter, the pad region 209 is subjected to plating to form the first connection electrode 3 and the second connection electrode 4 at the same time. The chip part 201 is obtained after the steps so far described.

As described above, according to the method for manufacturing the chip part 201, a difference in etching rate between the nitride film 215, the base oxide film 217 and the covering oxide film 218 is used to easily etch the nitride film 215 at the lower regions of the fuse component 204 and the dummy metal 212 by means of isotropic etching (refer to FIG. 36). In a similar manner, a difference in etching rate is used to easily etch the nitride film 224 at the upper regions of the fuse component 204 and the dummy metal 212 (refer to FIG. 38). Further, the fuse component 204 and the dummy metal 212 are made of the same material of an AlCu alloy. Thus, as shown in FIG. 34, they can be formed in the same step.

It is therefore possible to manufacture efficiently the chip part 201 which is able to fuse reliably the fuse component 204 at the soluble portion 210 when an excess current flows.

As described so far, even where the fuse component 204 is formed in the element region 5, the same effects as those described in Embodiment 1 can be obtained.

<Diode>

FIG. 40 is a plan view of a chip part of Embodiment 6 of the present invention. FIG. 41 is a sectional view taken along section line XLI-XLI in FIG. 40. FIG. 42 is a sectional view taken along section line XLII-XLII in FIG. 40. FIG. 43 is a sectional view taken along section line XLIII-XLIII in FIG. 40.

A chip part 301 of Embodiment 6 is different from the chip part 1 of Embodiment 1 in that as a circuit element to be formed in an element region 5, diode cells D301 to D304 are formed in place of the resistor portion 56. The chip part 301 is similar in other arrangements to the chip part 1 of Embodiment 1. In FIG. 40 to FIG. 43, the portions corresponding to the individual portions shown in FIG. 1 to FIG. 39 are given the same reference numerals, with a description thereof omitted.

The chip part 301 includes a substrate 2, a plurality of diode cells D301 to D304 formed on the substrate 2, and a cathode electrode 303 and an anode electrode 304, each of which connects the plurality of diode cells D301 to D304 in parallel. In the same arrangement as that of Embodiment 1, a first connection electrode 3 is connected to the cathode electrode 303 and also in the same arrangement as that of Embodiment 1, a second connection electrode 4 is connected to the anode electrode 304.

The substrate 2 is a $p^+$-type semiconductor substrate (for example, a silicon substrate) in the present preferred embodiment. A cathode pad 305 for connecting with the cathode electrode 303 and an anode pad 306 for connecting with the anode electrode 304 are disposed at both ends of the substrate 2. A diode cell region 307 is installed between the pads 305 and 306 (that is, an element region 5).

In the present preferred embodiment, the diode cell region 307 is formed in a rectangular shape. The plurality of diode cells D301 to D304 are disposed in the interior of the diode cell region 307. In the present preferred embodiment, four of the diode cells D301 to D304 are installed, and they are aligned in a matrix form two-dimensionally along the long direction and the short direction of the substrate 2, at an equal interval.

FIG. 44 is a plan view which shows a structure of a front surface of the substrate 2 in which the cathode electrode 303, the anode electrode 304 and an arrangement formed thereon are removed from the chip part 301 shown in FIG. 40.

An $n^+$-type region 310 is formed in a surface layer region of the substrate 2 inside each region of the diode cells D301 to D304. The $n^+$-type region 310 is separated for each of the individual diode cells. Thereby, each of the diode cells D301 to D304 is provided with a p-n junction region 311 which is separated for each of the diode cells.

In the present preferred embodiment, the plurality of diode cells D301 to D304 are formed so as to be each equal in size and shape and, specifically, they are formed in a rectangular shape. The $n^+$-type region 310 which is in a polygonal shape is formed in the interior of each rectangular region of the diode cells. In the present preferred embodiment, the $n^+$-type region 310 is formed in an octagonal shape and provided with four sides respectively along four sides which constitute each rectangular region of the diode cells D301 to D304 and also provided with four sides respectively facing four corners in each rectangular region of the diode cells D301 to D304. In the surface layer region of the substrate 2, a $p^+$-type region 312 is also formed separated from the $n^+$-type region 310, at a predetermined interval. The $p^+$-type region 312 is formed in such a pattern that avoids a region in which the cathode electrode 303 is disposed in the interior of the diode cell region 307.

As shown in FIG. 41 to FIG. 43, in the same arrangement as that of Embodiment 1, an insulating film 20 is formed on the front surface of the substrate 2. On the insulating film 20, a contact hole 316 through which the front surface of the $n^+$-type region 310 of each of the diode cells D301 to D304 is exposed and a contact hole 317 through which the $p^+$-type region 312 is exposed, are formed. The cathode electrode 303 and the anode electrode 304 are formed on a front surface of the insulating film 20. The cathode electrode 303 enters from the front surface of the insulating film 20 into the contact hole 316 to provide an ohmic contact between the $n^+$-type regions 310 of the diode cells D301 to D304 in the interior of the contact hole 316. The anode electrode 304 extends from the front surface of the insulating film 20 to the interior of the contact hole 317 to provide an ohmic contact in the interior of the contact hole 317 in relation to the $p^+$-type region 312. In the present preferred embodiment, the cathode electrode 303 and the anode electrode 304 are constituted of an electrode film made of the same material.

As the electrode film, a Ti/Al laminated film composed of a Ti film as a lower layer and an Al film as an upper layer or an AlCu film may be used. Further, an AlSi film can be used as the electrode film. Use of the AlSi film enables to provide an ohmic contact between the anode electrode 304 and the substrate 2, without installing the $p^+$-type region 312 on the front surface of the substrate 2. It is therefore possible to omit a step of forming the $p^+$-type region 312.

With reference to FIG. 43, the cathode pad 305 (cathode electrode 303) is formed along side surfaces and a bottom surface of the base recessed portion 8 and also along the front surface of the insulating film 20 so as to enter into a recessed space defined by the side surfaces and the bottom surface of the base recessed portion 8 formed on the insulating film 20 in a region directly below the first connection electrode 3. Thereby, the recessed space is defined by the cathode pad 305 (cathode electrode 303) also in the region at which the base recessed portion 8 has been formed. Then, the first connection electrode 3 is formed on the cathode pad 305 (cathode electrode 303) so as to refill further the recessed space defined by the cathode pad 305 (cathode electrode 303). Thereby, on the first connection electrode 3, a recessed portion 6 is formed at a position corresponding to the region in which the base recessed portion 8 has been formed, and a flat portion 7 in which the recessed portion 6 is not formed is formed at an internal portion of the first connection electrode 3 surrounded by the recessed portions 6.

The second connection electrode 4 is similar in arrangement to the previously described first connection electrode 3. Therefore, an illustration and a description are omitted.

The cathode electrode 303 is separated from the anode electrode 304 by a slit 318. In the present preferred embodiment, the slit 318 is formed in a frame shape (that is, an octagonal frame shape) coinciding with a planar shape of the $n^+$-type region 310 so as to rim the $n^+$-type region 310 of each of the diode cells D301 to D304. Accordingly, the cathode electrode 303 is provided with a cell bonding portion 303*a* in a planar shape (that is, an octagonal shape) coinciding with the shape of the $n^+$-type region 310 in a region of each of the diode cells D301 to D304. And, the cell bonding portions 303*a* are communicatively connected by a rectilinear bridging portion 303*b* and also connected via another rectilinear bridging portion 303*c* to a large rectangular external connection portion 303*d* formed directly below the cathode pad 305. On the other hand, the anode electrode 304 is formed on the front surface of the insulating film 20 so as to surround the cathode electrode 303, while keeping an interval which corresponds to the slit 318 that is substantially constant in width. And, the anode electrode 304 is formed integrally by extending to a rectangular region directly below the anode pad 306.

The cathode electrode 303 and the anode electrode 304 are covered, for example, by a passivation film 320 made of a nitride film (not illustrated in FIG. 40). And, a resin film 321 such as polyimide is formed on the passivation film 320. On the passivation film 320 and the resin film 321, notched portions 322, 323 through which peripheral edge portions facing the side surface portions of the first connection electrode 3 and the second connection electrode 4 are exposed, are formed. Then, the first connection electrode 3 and the second connection electrode 4 are connected to the corresponding pads 305, 306.

At each of the diode cells D301 to D304, a p-n junction region 311 is formed between the substrate 2 and the $n^+$-type region 310 and, therefore, the p-n junction diode is formed each thereon. Then, the $n^+$-type region 310 of each of the plurality of the diode cells D301 to D304 is connected in common to the cathode electrode 303, and the substrate 2 which is a common p-type ($p^+$-type) region of each of the diode cells D301 to D304 is connected in common to the anode electrode 304 via the $p^+$-type region 312. Thereby, the plurality of diode cells D301 to D304 formed on the substrate 2 are all connected in parallel.

FIG. 45 is an electric circuit diagram which shows an electrical structure inside the chip part.

The p-n junction diodes arranged respectively by the diode cells D301 to D304 are connected in common to its cathode side by the cathode electrode 303 (the first connection electrode 3) and connected in common to its anode side by the anode electrode 304 (the second connection electrode 4). Thereby, they are all connected in parallel and accordingly function as one diode as a whole.

According to the arrangement of the present preferred embodiment, the chip part 301 has the plurality of diode cells D301 to D304, and each of the diode cells D301 to D304 has a p-n junction region 311. The p-n junction region 311 is separated for each of the diode cells D301 to D304. Therefore, the chip part 301 is longer in peripheral length of the p-n junction region 311, that is, longer in total peripheral length (total extension) of the $n^+$-type regions 310 of the substrate 2. Thereby, it is possible to avoid concentration of electrical fields in the vicinity of the p-n junction region 311 and disperse the concentration thereof, resulting in improvement in ESD resistance. That is, even on downsizing of the chip part 301, the p-n junction regions 311 can be increased in total peripheral length to downsize the chip part 301 and secure the ESD resistance at the same time.

FIG. 46 shows an experimental result obtained by measuring ESD resistance of a plurality of samples made different in total peripheral length (total extension) of the p-n junction regions by setting in various ways a size of the diode cell and/or the number of the diode cells formed on a semiconductor substrate equal in area. The experimental result shows that the longer the peripheral length of the p-n junction region is, the greater, the ESD resistance becomes. Where four or more of the diode cells are formed on the semiconductor substrate, the ESD resistance exceeding 8 kilovolts can be realized.

The chip part 301 can be obtained by performing the step of forming the diode cells D301 to D304 in place of the step of forming the resistor portion 56 in Embodiment 1. Hereinafter, a detailed description will be given of a difference from the manufacturing step of Embodiment 1.

That is, first, an insulating film 20 is formed on the front surface of the substrate 2 ($p^+$-type semiconductor substrate) by a step similar to the step of Embodiment 1, and a resist mask is formed on the insulating film. Ion implantation or diffusion of an n-type impurity (for example, phosphorus) via the resist mask is performed to form the $n^+$-type region 310. Further, another resist mask having an opening which coincides with the $p^+$-type region 312 is formed, and ion implantation or diffusion of a p-type impurity (for example, arsenic) via the resist mask is performed to form the $p^+$-type region 312. The resist mask is peeled off and the insulating film 20 is increased in thickness (for example, CVD is performed to increase the thickness of the film), whenever necessary. Thereafter, base recessed portions 8 for forming the recessed portions 6 in the first connection electrode 3 and the second connection electrode 4 and still another resist mask which has openings coinciding with the contact holes 316, 317, are formed on the insulating film 20. Etching via the resist mask is performed to form the base recessed portions 8 and the contact holes 316, 317 on the insulating film 20.

Next, for example, sputtering is performed to form an electrode film which constitutes the cathode electrode 303 and the anode electrode 304 on the insulating film 20. Then, a resist film having an opening pattern corresponding to the slit 318 is formed on the electrode film, and etching via the resist film is performed to form the slit 318 on the electrode film. Thereby, the electrode film is separated into the cathode electrode 303 and the anode electrode 304.

Next, after the resist film has been peeled off, for example, a CVD method is performed to form the passivation film 320 such as a nitride film, and polyimide, etc., are coated thereon to form the resin film 321. And, etching by the use of photolithography is given to the passivation film 320 and the resin film 321 to form notched portions 322, 323. Thereafter, through steps similar to those described in Embodiment 1, the chip part 301 having the first connection electrode 3 and the second connection electrode 4 is formed.

FIG. 47 is a sectional view of a chip part 329 of Embodiment 7 of the present invention. In FIG. 47, the portions corresponding to the individual portions shown in FIG. 1 to FIG. 46 are given the same reference numerals.

The chip part 329 is such that a cathode electrode 303 is disposed on a front surface of a substrate 2 and an anode electrode 328 is disposed on a rear surface of the substrate 2. Therefore, in the present preferred embodiment, it is not necessary to install an anode pad 306 on a front surface side (cathode electrode 303 side) of the substrate 2. Accordingly, the substrate 2 can be decreased in size and diode cells D301 to D304 can be increased in number. The cathode electrode 303 is formed so as to cover substantially the entirety of the front surface of the substrate 2, providing an ohmic contact between individual $n^+$-type regions 310 of the diode cells D301 to D304. The anode electrode 328 provides an ohmic contact in relation to a rear surface of the substrate 2. The anode electrode 328 may be formed with gold, for example.

FIG. 48 is a plan view of a chip part 331 of Embodiment 8 of the present invention. FIG. 49 is a sectional view taken along section line XLIX-XLIX in FIG. 48. FIG. 50 is sectional view taken along section line L-L in FIG. 48.

The chip part 331 is provided with a substrate 2, a cathode electrode 333 and an anode electrode 334 formed on the substrate 2, and a plurality of diode cells D311 to D314 connected in parallel between the cathode electrode 333 and the anode electrode 334. The substrate 2 is formed substantially in a rectangular shape in a plan view, and a cathode pad 335 and an anode pad 336 are respectively disposed at both ends of the substrate 2 in the long direction. A rectangular diode cell region 337 is set between the cathode pad 335 and the anode pad 336 (that is, an element region 5). The plurality of diode cells D311 to D314 are aligned two-dimensionally in the interior of the diode cell region 337. In the present preferred embodiment, the plurality of diode cells D311 to D314 are aligned in a matrix form along the long direction and the short direction of the substrate 2, at an equal interval.

Each of the diode cells D311 to D314 is constituted of a rectangular region and provided with a Schottky junction region 341 which is a polygonal shape in a plan view (in the present preferred embodiment, an octagonal shape) in the interior of the rectangular region. A Schottky metal 340 is disposed so as to be in contact with each of the Schottky junction regions 341. That is, the Schottky metal 340 forms a Schottky junction with the substrate 2 in the Schottky junction region 341.

In the present preferred embodiment, the substrate 2 is provided with a p-type silicon substrate 350 and an n-type epitaxial layer 351 which is formed thereon by epitaxial growth. As shown in FIG. 49, the substrate 2 may be provided with an $n^+$-type embedded layer 352 formed by introducing an n-type impurity (for example, arsenic) formed on a front surface of a p-type silicon substrate 350. The Schottky junction region 341 is set on a front surface of the n-type epitaxial layer 351, and the Schottky metal 340 is jointed to the front surface of the n-type epitaxial layer 351 to form a Schottky junction. A guard ring 353 for suppressing leakage of a contact edge is formed in the peripheries of the Schottky junction region 341.

The Schottky metal 340 may be made of, for example, Ti or TiN, and a metal film 342 such as an AiSi alloy is laminated on the Schottky metal 340 to constitute the cathode electrode 333. The Schottky metal 340 may be separated for each of the diode cells D311 to D314. However, in the present preferred embodiment, the Schottky metal 340 is formed so as to be commonly in contact with the Schottky junction region 341 of each of the plurality of diode cells D311 to D314.

An $n^+$-type well 354 which reaches the $n^+$-type embedded layer 352 from the front surface of the n-type epitaxial layer 351 is formed on the n-type epitaxial layer 351 in a region which avoids the Schottky junction region 341. Then, the anode electrode 334 is formed so as to provide an ohmic contact in relation to the front surface of the $n^+$-type well 354. The anode electrode 334 may be made of an electrode film which is similar in arrangement to the cathode electrode 333.

An insulating film 20 is formed on the front surface of the n-type epitaxial layer 351. A contact hole 346 corresponding to the Schottky junction region 341 and a contact hole 347 through which the $n^+$-type well 354 is exposed are formed on the insulating film 20. The cathode electrode 333 is formed so as to cover the insulating film 20 and reaches the interior of the contact hole 346, thereby providing a Schottky junction in the interior of the contact hole 346 in relation to the n-type epitaxial layer 351. On the other hand, the anode electrode 334 is formed on the insulating film 20 and extends in the interior of the contact hole 347, thereby providing an ohmic contact in the interior of the contact hole 347 in relation to the $n^+$-type well 354. The cathode electrode 333 is separated from the anode electrode 334 by the slit 348.

Further, as shown in FIG. 50, the insulating film 20 is provided with a plurality of base recessed portions 8 for forming the recessed portions 6 in the first connection electrode 3 and the second connection electrode 4 which are arranged as with Embodiment 1. The insulating film 20 is similar in arrangement to that of Embodiment 1 (Embodiment 6) and, therefore, a description thereof is omitted.

A passivation film 356 made of, for example, a nitride film is formed so as to cover the cathode electrode 333 and the anode electrode 334. Further, a resin film 357 such as polyimide is formed so as to cover the passivation film 356. A notched portion 358 which penetrates through the passivation film 356 and the resin film 357, thereby exposing a certain region of the front surface of the cathode electrode 333 which acts as a cathode pad 335, is formed. A notched portion 359 which penetrates through the passivation film 356 and the resin film 357, thereby exposing a certain region of the front surface of the anode electrode 334 which acts as an anode pad 336, is also formed. Then, in an arrangement similar to that of Embodiment 1, the first connection electrode 3 and the second connection electrode 4 are formed so as to be connected to pads 335, 336.

In this arrangement, the cathode electrode 333 is connected in common to the Schottky junction region 341 kept by each of the diode cells D311 to D314. Further, the anode electrode 334 is connected to the n-type epitaxial layer 351 via the $n^+$-type well 354 and the $n^+$-type embedded layer 352 and, therefore, connected in parallel to the Schottky junction region 341 formed in each of the plurality of diode cells D311 to D314. Thereby, a plurality of Schottky barrier diodes having the Schottky junction regions 341 of the plurality of diode cells D311 to D314 are connected in parallel between the cathode electrode 333 and the anode electrode 334.

As described so far, in the present preferred embodiment as well, each of the plurality of diode cells D311 to D314 is provided with a mutually separated Schottky junction region 341, thus resulting in an increase in total extension of the peripheral length of the Schottky junction regions 341 (peripheral length of the Schottky junction regions 341 on the front surface of the n-type epitaxial layer 351). Thereby, it is possible to suppress concentration of electrical fields and improve ESD resistance. That is, even where the chip part 331 is downsized, the Schottky junction regions 341 are increased in total peripheral length, thus making it possible to downsize the chip part 331 and also secure the ESD resistance at the same time.

FIG. 51 is a sectional view of a chip part 349 of Embodiment 9 of the present invention. In FIG. 51, the portions corresponding to the individual portions shown in FIG. 1 to FIG. 50 are given the same reference numerals, with a description thereof omitted.

The chip part 349 is such that a substrate 2 includes an $n^+$-type silicon substrate 372 and an n-type epitaxial layer 351 which is formed on a front surface of the $n^+$-type silicon substrate 372. Then, an anode electrode 373 is formed so as to provide an ohmic contact in relation to a rear surface of the substrate 2 (the front surface which is opposite to the front surface of the n-type epitaxial layer 351). No anode electrode is formed on the front surface of the n-type epitaxial layer 351, and only the cathode electrode 333 is formed so as to be connected in parallel to a Schottky junction region 341 formed on the n-type epitaxial layer 351.

With this arrangement, it is also possible to provide the operations and effects similar to those of Embodiment 8. In addition, no anode electrode is needed on the front surface of the n-type epitaxial layer 351. Thereby, it is possible to dispose a larger number of diode cells on the front surface of the n-type epitaxial layer 351. And, the Schottky junction regions 341 can be further increased in total extension of the peripheral length to improve the ESD resistance. Alternatively, the $n^+$-type silicon substrate 372 can be decreased in size to provide the chip diode which is further downsized and secured for the ESD resistance.

<Bidirectional Zener Diode>

FIG. 52 is a plan view of a chip part 401 of Embodiment 10 of the present invention. FIG. 53 is a sectional view taken along section line LIII-LIII in FIG. 52. FIG. 54 is a sectional view taken along section line LIV-LIV in FIG. 52. FIG. 55 is a sectional view taken along section line LV-LV in FIG. 52.

The chip part 401 of Embodiment 10 is different from the chip part 1 of Embodiment 1 in that as a circuit element formed in an element region 5, a first Zener diode D401 and a second Zener diode D402 are formed in place of the resistor portion 56. The chip part 401 is similar in other arrangements to the chip part 1 of Embodiment 1. In FIG. 52 to FIG. 55, the portions corresponding to the individual portions shown in FIG. 1 to FIG. 51 are given the same reference numerals, with a description thereof omitted.

The chip part 401 includes a substrate 2 (for example, a $p^+$-type silicon substrate), a first Zener diode D401 formed on the substrate 2, a second Zener diode D402 which is formed on the substrate 2 and connected to the first Zener diode D401 in a reverse serial manner, a first connection electrode 3 connected to the first Zener diode D401, and a second connection electrode 4 connected to the second Zener diode D402. The first Zener diode D401 is arranged with a plurality of Zener diodes D411, D412. The second Zener diode D402 is arranged with a plurality of Zener diodes D421, D422.

At both ends of an element forming surface 2A of Embodiment 10, the first connection electrode 3 connected to a first electrode film 403 and the second connection electrode 4 connected to a second electrode film 404, are disposed. A diode forming region 407 is installed on an element forming surface 2A between the first connection electrode 3 and the second connection electrode 4. In the present preferred embodiment, the diode forming region 407 is formed in a rectangular shape.

FIG. 56 is a plan view of the chip part 401 shown in FIG. 52 in which the first connection electrode 3, the second connection electrode 4 and an arrangement formed thereon are removed to show a structure of the front surface of the substrate 2 (the element forming surface 2A).

With reference to FIG. 52 and FIG. 56, a plurality of first $n^+$-type diffusion regions (hereinafter, referred to as "first diffusion regions 410"), each of which forms a p-n junction region 411 in relation to the substrate 2, are formed in a surface layer region of the substrate 2 ($p^+$-type semiconductor substrate). A plurality of second $n^+$-type diffusion regions (hereinafter, referred to as "second diffusion regions 412"), each of which forms a p-n junction region 413 in relation to the substrate 2, are also formed in the surface layer region of the substrate 2.

In the present preferred embodiment, each two of the first diffusion regions 410 and the second diffusion regions 412 are formed. These four diffusion regions 410, 412 are such that the first diffusion regions 410 and the second diffusion regions 412 are aligned alternately along the short direction of the substrate 2, at an equal interval. Further, the four diffusion regions 410, 412 are formed in the long direction which is a direction intersecting the short direction of the substrate 2 (in the present preferred embodiment, in a direction orthogonal thereto). In the present preferred embodiment, the first diffusion regions 410 and the second diffusion regions 412 are formed equal in size and also equal in shape. Specifically, each one of the first diffusion region 410 and the second diffusion region 412 is formed substantially in a rectangular shape longer in the long direction of the substrate 2 in a plan view, with four corners being cut.

Two Zener diodes D411, D412 are arranged by each of the first diffusion regions 410 and a vicinity of the first diffusion region 410 in the substrate 2, and a first Zener diode D401 is arranged by these two Zener diodes D411, D412. The first diffusion region 410 is separated for each of the Zener diodes D411, D412. Thereby, each of the Zener diodes D411, D412 is provided with the p-n junction region 411 separated for each Zener diode.

In a similar manner, two Zener diodes D421, D422 are arranged by each of the second diffusion regions 412 and a vicinity of the second diffusion region 412 in the substrate 2, and a second Zener diode D402 is arranged by the two Zener diodes D421, D422. The second diffusion region 412 is separated for each of the Zener diodes D421, D422. Thereby, each of the Zener diodes D421, D422 is provided with the p-n junction region 413 which is separated for each Zener diode.

As shown in FIG. 53 and FIG. 54, in the same arrangement as that of Embodiment 1, an insulating film 20 (not illustrated in FIG. 52) is formed on the element forming surface 2A of the substrate 2. On the insulating film 20, a first contact hole 416 through which the front surface of the first diffusion region 410 is exposed and a second contact hole 417 through which the front surface of the second diffusion region 412 is exposed, are individually formed. A first electrode film 403 and a second electrode film 404 are formed on the front surface of the insulating film 20.

The first electrode film 403 is provided with a lead-out electrode L411 connected to the first diffusion region 410 corresponding to the Zener diode D411, a lead-out electrode L412 connected to the first diffusion region 410 corresponding to the Zener diode D412, and a first pad 405 which is formed integrally with the lead-out electrodes L411, LA12 (first lead-out electrodes). The first pad 405 is formed in a rectangular shape at one end of the element forming surface 2A. The first connection electrode 3 is connected to the first pad 405. As described above, the first connection electrode 3 is connected in common to the lead-out electrodes L411, L412.

The second electrode film 404 is provided with a lead-out electrode L421 connected to the second diffusion region 412 corresponding to the Zener diode D421, a lead-out electrode L422 connected to the second diffusion region 412 corresponding to the Zener diode D422, and a second pad 406 formed integrally with the lead-out electrodes L421, L422 (the second lead-out electrodes). The second pad 406 is formed in a rectangular shape at one end of the element forming surface 2A. The second connection electrode 4 is connected to the second pad 406. As described above, the second connection electrode 4 is connected in common to the lead-out electrodes L421, L422.

The lead-out electrode L411 enters into the first contact hole 416 of the Zener diode D411 from the front surface of the insulating film 20, thereby providing an ohmic contact in the interior of the first contact hole 416 in relation to the first diffusion region 410 of the Zener diode D411. In the lead-out electrode L411, a portion which is bonded to the Zener diode D411 in the interior of the first contact hole 416 constitutes a bonding portion C411. In a similar manner, the lead-out electrode L412 enters into the first contact hole 416 of the Zener diode D412 from the front surface of the insulating film 20, thereby providing an ohmic contact in the interior of the first contact hole 416 in relation to the first diffusion region 410 of the Zener diode D412. In the lead-out electrode LA12, a portion which is bonded to the Zener diode D412 in the interior of the first contact hole 416 constitutes a bonding portion C412.

The lead-out electrode L421 enters into the second contact hole 417 of the Zener diode D421 from the front surface of the insulating film 20, providing an ohmic contact in the interior of the second contact hole 417 in relation to the second diffusion region 412 of the Zener diode D421. In the lead-out electrode L421, a portion which is bonded to the Zener diode D421 in the interior of the second contact hole 417 constitutes a bonding portion C421. In a similar manner, the lead-out electrode L422 enters into the second contact hole 417 of the Zener diode D422 from the front surface of the insulating film 20, providing an ohmic contact in the interior of the second contact hole 417 in relation to the second diffusion region 412 of the Zener diode D422. In the lead-out electrode L422, a portion which is bonded to the Zener diode D422 in the interior of the second contact hole 417 constitutes a bonding portion C422. In the present preferred embodiment, the first electrode film 403 and the second electrode film 404 are made of the same material. In the present preferred embodiment, an Al film is used as the electrode film.

With reference to FIG. 55, the first pad 405 (the first electrode film 403) is formed along side surfaces and a bottom surface of the base recessed portion 8 and also along a front surface of the insulating film 20 so as to enter into a recessed space defined by the side surfaces and the bottom surface of the base recessed portion 8 formed on the insulating film 20 in a region directly below the first connection electrode 3. Thereby, the recessed space is defined by the first pad 405 (the first electrode film 403) also in a region at which the base recessed portion 8 has been formed. Then, the first connection electrode 3 is formed on the first pad 405 (the first electrode film 403) so as to further refill the recessed space defined by the first pad 405 (the first electrode film 403). Thereby, in the first connection electrode 3, a recessed portion 6 is formed at a position corresponding to the region in which the base recessed portion 8 has been formed. And, a flat portion 7 in which the recessed portion 6 is not formed is formed at an internal portion of the first connection electrode 3 surrounded by the recessed portions 6.

The second connection electrode 4 is similar in arrangement to the first connection electrode 3 and, therefore, an illustration and a description thereof are omitted.

The first electrode film 403 is separated from the second electrode film 404 by a slit 418. The lead-out electrode L411 is formed in a rectilinear shape along a straight line passing over the first diffusion region 410 corresponding to the Zener diode D411 and reaching the first pad 405. In a similar manner, the lead-out electrode L412 is formed in a rectilinear shape along a straight line passing over the first diffusion region 410 corresponding to the Zener diode D412 and reaching the first pad 405. Each of the lead-out electrodes L411, L412 is uniform in width from the corresponding first diffusion region 410 to the first pad 405, and the width is greater than the width of each of the bonding portions C411, C412. The width of each of the bonding portions C411, C412 is defined by the length in a direction orthogonal to a direction at which the lead-out electrodes L411, L412 lead out. A leading end portion of each of the lead-out electrodes L411, L412 is shaped so as to coincide with a planar shape of the corresponding first diffusion region 410. The base end portions of the lead-out electrodes L411, L412 are connected to the first pad 405.

The lead-out electrode L421 is formed in a rectilinear shape along a straight line passing over the second diffusion region 412 corresponding to the Zener diode D421 and reaching the second pad 406. In a similar manner, the lead-out electrode L422 is formed in a rectilinear shape along a straight line passing over the second diffusion region 412 corresponding to the Zener diode D422 and reaching the second pad 406. Each of the lead-out electrodes L421, L422 is uniform in width from the corresponding second diffusion region 412 to the second pad 406, and the width thereof is greater than the width of each of the bonding portions C421, C422. The width of each of the bonding portions C421, C422 is defined by the length in a direction orthogonal to a direction at which the lead-out electrodes L421, L422 lead out. A leading end portion of each of the lead-out electrodes L421, L422 is shaped so as to coincide with a planar shape of the corresponding second diffusion region 412. The base end portions of the lead-out electrodes L421, L422 are connected to the second pad 406.

That is, each of the first connection electrode 3 and the second connection electrode 4 is formed in a comb-teeth-like shape in such a manner that the plurality of first lead-out electrodes L411, L412 will mate respectively with the plurality of second lead-out electrodes L421, L422. Further, the first connection electrode 3 and the first diffusion region 410 are arranged so as to be mutually symmetrical with the second connection electrode 4 and the second diffusion region 412 in a plan view. More specifically, the first connection electrode 3 and the first diffusion region 410 are arranged so as to be mutually point symmetrical with the second connection electrode 4 and the second diffusion region 412 in a plan view in relation to the gravity of the element forming surface 2A.

It may be deemed that the first connection electrode 3 and the first diffusion region 410 are arranged so as to be substantially line symmetrical with the second connection electrode 4 and the second diffusion region 412. Specifically, it is deemed that the second lead-out electrode L422 at one long side of the substrate 2 is substantially at the same position with the first lead-out electrode L411 adjacent thereto and also deemed that the first lead-out electrode L412 at the other long side of the substrate 2 is substantially at the same position with the second lead-out electrode L421 adjacent thereto. Thus, it can be deemed that the first connection electrode 3 and the first diffusion region 410 are arranged so as to be line symmetrical with the second connection electrode 4 and the second diffusion region 412 in relation to a straight line which is parallel in the short direction of the element forming surface 2A and passes through the center thereof in the long direction in a plan view. The slit 418 is formed so as to rim the lead-out electrodes L411, L412, L421, L422.

The first electrode film 403 and the second electrode film 404 are covered with a passivation film 420 made of a nitride film, for example (not illustrated in FIG. 52), and a resin film 421 such as polyimide is also formed on the passivation film 420. On the passivation film 420 and the resin film 421, notched portions 422, 423 for exposing peripheral edge portions which face side surface portions of the first connection electrode 3 and the second connection electrode 4, are formed. Then, the first connection electrode 3 and the second connection electrode 4 are connected to the corresponding pads 405, 406.

The passivation film 420 and the resin film 421 constitute protective films, thereby suppressing or preventing water from entering into the first lead-out electrodes L411, L412, the second lead-out electrodes L421, L422 and the p-n junction regions 411, 413. They also absorb an external shock and others, thereby contributing to improvement in durability of the chip part 401.

The first diffusion regions 410 of the plurality of Zener diodes D411, D412 which constitute the first Zener diode D401 are connected in common to the first connection electrode 3 and also connected to the substrate 2 which is a common p-type region of each of the Zener diodes D411, D412. Thereby, the plurality of Zener diodes D411, D412 which constitute the first Zener diode D401 are connected in parallel. On the other hand, the second diffusion regions 412 of the plurality of Zener diodes D421, D422 which constitute the second Zener diode D402 are connected to the second connection electrode 4 and also connected to the substrate 2 which is a common p-type region of the Zener diodes D421, D422. Thereby, the plurality of Zener diodes D421, D422 which constitute the second Zener diode D402 are connected in parallel. Then, parallel circuits of the Zener diodes D421, D422 are connected to parallel circuits of the Zener diodes D411, D412 by a reverse serial connection, and a reverse series circuit thereof constitutes a bidirectional Zener diode.

FIG. 57 is an electric circuit diagram which shows an electrical structure of the interior of the chip part 401 in FIG. 52. Cathodes of the plurality of Zener diodes D411, D412 which constitute the first Zener diode D401 are connected in common to the first connection electrode 3, and anodes thereof are connected in common to anodes of the plurality of Zener diodes D421, D422 which constitute the second Zener diode D402. Then, cathodes of the plurality of Zener diodes D421, D422 are connected in common to the second connection electrode 4. Thereby, they function as one bidirectional Zener diode as a whole.

According to the present preferred embodiment, the first connection electrode 3 and the first diffusion region 410 are arranged so as to be mutually symmetrical with the second connection electrode 4 and the second diffusion region 412, thereby making substantially equal their characteristics in individual current directions.

FIG. 58B is a graph which shows that an experimental result obtained by measuring voltage-to-current characteristics in individual current directions for a bidirectional Zener diode chip in which a first connection electrode and a first diffusion region are arranged so as to be mutually asymmetrical with a second connection electrode and a second diffusion region.

In FIG. 58B, the solid line indicates voltage-to-current characteristics in a case where voltage is applied to the bidirectional Zener diode, with one electrode given as a positive electrode and the other electrode given as a negative electrode, and the dotted line indicates voltage-to-current characteristics in a case where voltage is applied to the bidirectional Zener diode, with the one electrode given as a negative electrode and the other electrode given as a positive electrode. The experimental result shows that in the bidirectional Zener diode where the first connection electrode and the first diffusion region are arranged so as to be asymmetrical with the second connection electrode and the second diffusion region, the voltage-to-current characteristics in individual current directions are not made equal.

FIG. 58A is a graph which shows an experimental result obtained by measuring voltage-to-current characteristics of the chip part 401 shown in FIG. 52 in individual current directions.

In the bidirectional Zener diode of the present preferred embodiment, the voltage-to-current characteristics in a case where voltage is applied, with the first connection electrode 3 given as a positive electrode and with the second connection electrode 4 given as a negative electrode, and the voltage-to-current characteristics in a case where voltage is applied, with the second connection electrode 4 given as a positive electrode and with the first connection electrode 3 given as a negative electrode, are both such characteristics shown by the solid line in FIG. 58A. That is, in the bidirectional Zener diode of the present preferred embodiment, the voltage-to-current characteristics in individual current directions are made substantially equal.

According to the arrangement of the present preferred embodiment, the chip part 401 is provided with the first Zener diode D401 and the second Zener diode D402. The first Zener diode D401 is provided with the plurality of Zener diodes D411, D412 (the first diffusion region 410), and each of the Zener diodes D411, D412 is provided with a p-n junction region 411. The p-n junction region 411 is separated for each of the Zener diodes D411, D412. Therefore, "a peripheral length of the p-n junction region 411 of the first Zener diode D401," that is, a total peripheral length of the first diffusion region 410 of the substrate 2 (total extension) is made longer. Thereby, concentration of electrical fields in the vicinity of the p-n junction region 411 can be avoided to disperse the concentration, resulting in improvement in ESD resistance of the first Zener diode D401. That is, even where the chip part 401 is formed small, the p-n junction region 411 can be increased in total peripheral length, thus making it possible to downsize the chip part 401 and also secure the ESD resistance at the same time.

In a similar manner, the second Zener diode D402 is provided with the plurality of Zener diodes D421, D422 (the second diffusion region 412) and each of the Zener diodes D421, D422 is provided with a p-n junction region 413. The p-n junction region 413 is separated for each of the Zener diodes D421, D422. Therefore, "a peripheral length of the p-n junction region 413 of the second Zener diode D402," that is, a total peripheral length of the p-n junction regions 413 of the substrate 2 (total extension) is made longer. Thereby, concentration of electrical fields in the vicinity of the p-n junction region 413 can be avoided to disperse the concentration, thus resulting in improvement in the ESD resistance of the second Zener diode D402. That is, even where the chip part 401 is formed small, the p-n junction region 413 can be increased in total peripheral length, thus making it possible to downsize the chip part 401 and secure the ESD resistance at the same time.

In the present preferred embodiment, the peripheral length of the p-n junction region 411 of the first Zener diode D401 and the peripheral length of the p-n junction region 413 of the second Zener diode D402 are all formed so as to be 400 μm or more but 1500 μm or less. It is more preferable that each of the peripheral lengths is formed to be 500 μm or more but 1000 μm or less.

Since each of the peripheral lengths is formed to be 400 μm or more, as will be described by referring to FIG. 59, it is possible to realize a bidirectional Zener diode chip great in ESD resistance. Since each of the peripheral lengths is formed to be 1500 μm or less, as will be described by referring to FIG. 60, it is possible to realize a bidirectional Zener diode chip which is small in capacitance between the first connection electrode 3 and the second connection electrode 4 (capacity between terminals). More specifically, it is possible to realize a bidirectional Zener diode chip with the capacity between terminals of 30 [pF] or less. It is more preferable that each of the peripheral lengths is formed to be 500 μm or more but 1000 μm or less.

FIG. 59 is a graph which shows an experimental result obtained by measuring ESD resistance of a plurality of samples which are made different in peripheral length of the p-n junction region of each of the first Zener diode and the second Zener diode by setting in various ways the number of the lead-out electrodes (diffusion regions) and/or the size of the diffusion region formed on the substrate equal in area. However, with each of the samples, as with the previous embodiment, the first connection electrode and the first diffusion region are formed so as to be mutually symmetrical with the second connection electrode and the second diffusion region. Therefore, with each of the samples, the peripheral length of the p-n junction region 411 of the first Zener diode D401 is substantially equal to that of the p-n junction region 413 of the second Zener diode D402.

In FIG. 59, the horizontal axis indicates one of the peripheral length of the p-n junction region 411 of the first Zener diode D401 and the peripheral length of the p-n junction region 413 of the second Zener diode D402. From the experimental result, it is apparent that the longer the peripheral length of each of the p-n junction region 411 and the p-n junction region 413 is, the greater the ESD resistance becomes. Where the peripheral length of each of the p-n junction region 411 and the p-n junction region 413 is formed to be 400 μm or more, it is possible to realize a target value of the ESD resistance which is 8 kilovolts or more.

FIG. 60 is a graph which shows an experimental result obtained by measuring capacities between terminals of a plurality of samples made different in peripheral length of the p-n junction region of each of the first Zener diode and the second Zener diode by setting in various ways the number of the lead-out electrodes (diffusion regions) and/or a size of the diffusion region formed on the substrate equal in area. However, in each of the samples, as with the previous embodiment, the first connection electrode and the first diffusion region are formed so as to be mutually symmetrical with the second connection electrode and the second diffusion region.

In FIG. 60, the horizontal axis indicates one of the peripheral length of the junction region 411 of the first Zener diode D401 and the peripheral length of the p-n junction region 413 of the second Zener diode D402. The experimental result shows that the longer the peripheral length of each of the p-n junction region 411 and the p-n junction region 413 is, the greater the capacity between terminals becomes. Where the peripheral length of each of the p-n junction region 411 and the p-n junction region 413 is formed to be 1500 μm or less, it is possible to realize a target value of the capacity between terminals, which is 30 [pF] or lower.

Further, in the present preferred embodiment, the width of each of the lead-out electrodes L411, L412, L421, L422 is wider than the width of each of the bonding portions C411, C412, C421, C422 in a space from the bonding portions C411, C412, C421, C422 to the first pad 405. Thereby, an allowable current amount is increased to reduce electromigration, thus making it possible to cope with a heavy current more reliably. That is, it is possible to provide a bidirectional Zener diode chip which is small in size, great in ESD resistance and capable of coping with a heavy current reliably.

Further, the first connection electrode 3 and the second connection electrode 4 are both formed on the element forming surface 2A which is one front surface of the substrate 2. Therefore, as described in Embodiment 1, the element forming surface 2A is made to face the mounting substrate 9, the first connection electrode 3 and the second connection electrode 4 are bonded to the mounting substrate 9 by using the solder 13, thus making it possible to arrange a circuit assembly in which the chip part 401 is surface-mounted on the mounting substrate 9 (refer to FIG. 19). That is, the flip-chip bonding type chip part 401 can be provided, and a face-down bonding in which the element forming surface 2A faces a mounting surface of the mounting substrate 9 is performed to connect the chip part 401 to the mounting substrate 9 by wireless bonding. It is thereby possible to decrease a space occupied by the chip part 401 on the mounting substrate 9. In particular, the chip part 401 on the mounting substrate 9 can be reduced in height. Thereby, a space inside a housing of a small-size electronic device, etc., can be used effectively to mount the chip part 401 at high density and also realize downsizing.

Further, in the present preferred embodiment, the insulating film 20 is formed on the substrate 2, and the bonding portions C411, C412 of the lead-out electrodes L411, L412 are connected to the first diffusion regions 410 of the Zener diodes D411, D412 via the first contact holes 416 formed on the insulating film 20. Then, the first pad 405 is disposed on the insulating film 20 in a region outside the first contact hole 416. That is, the first pad 405 is installed at a position spaced away from directly above the p-n junction region 411.

In a similar manner, the bonding portions C421, C422 of the lead-out electrodes L421, L422 are connected to the second diffusion regions 412 of the Zener diodes D421, D422 via the second contact holes 417 formed on the insulating film 20. Then, the second pad 406 is disposed on the insulating film 20 in a region outside the second contact hole 417. The second pad 406 is also positioned so as to be spaced away from directly above the p-n junction region 413. It is thus possible to avoid a great impact applied to the p-n junction regions 411, 413 when the chip part 401 is mounted on the mounting substrate 9. Thereby, breakage of the p-n junction regions 411, 413 can be avoided to realize a bidirectional Zener diode chip excellent in durability to an external force. Further, such an arrangement can be made that the first connection electrode 3 or the second connection electrode 4 is not installed, the first pad 405 and the second pad 406 given as the respective external connection portions of the first connection electrode 3 and the second connection electrode 4 and, thereby, bonding wires are connected to the first pad 405 and the second pad 406. In this case as well, it is possible to avoid breakage of the p-n junction regions 411, 413 by the impact on wire bonding.

The chip part 401 can be obtained by performing a step of forming the first Zener diode D401 and the second Zener diode D402 in place of the step of forming the resistor portion 56 of Embodiment 1. Hereinafter, with reference to FIG. 61, a detailed description will be given of a difference from the manufacturing step of Embodiment 1.

FIG. 61 is a flow chart for describing one example of the steps of manufacturing the chip part 401 shown in FIG. 52.

First, a $p^+$-type semiconductor wafer as a base substrate of the substrate 2 is provided. The front surface of the semiconductor wafer is an element forming surface and corresponds to the element forming surface 2A of the substrate 2. A plurality of bidirectional Zener diode chip regions corresponding to the plurality of chip parts 401 are aligned and set on the element forming surface in a matrix form. A boundary region (corresponding to the rectilinear portions 42A and 42B in FIG. 12 of Embodiment 1) is provided between mutually adjacent bidirectional Zener diode chip regions. The boundary region is a band-shaped region having a substantially constant width and formed in a lattice by extending in two directions which are orthogonal to each other. After the semiconductor wafer has been subjected to necessary steps, the semiconductor wafer is cut off along the boundary region, thereby obtaining the plurality of chip parts 401.

One example of the steps performed for the semiconductor wafer is as follows.

First, an insulating film 20 is formed on an element forming surface of the semiconductor wafer by a step similar to that of Embodiment 1 (Step S31) and a resist mask is formed thereon (Step S32). Etching using the resist mask is performed to form base recessed portions 8 for forming recessed portions 6 of the first connection electrode 3 and the second connection electrode 4 and openings corresponding to the first diffusion region 410 and the second diffusion region 412 on the insulating film 20 (Step S33). Further, after the resist mask has been peeled off, an n-type impurity is introduced into a surface layer portion of the semiconductor wafer exposed from the openings formed on the insulating film 20 (Step S34). The n-type impurity may be introduced in a step of depositing phosphorus as an n-type impurity on the front surface (a so-called phosphorus deposition), or n-type impurity ions (for example, phosphorus ions) may be implanted. The phosphorus deposition is such treatment that a semiconductor wafer is conveyed into a diffusion furnace, a $POCl_3$ gas is made to flow inside a diffusion channel to effect heat treatment and phosphorus is deposited on a front surface of the semiconductor wafer exposed inside openings of the insulating film 20 by the heat treatment. After the insulating film 20 is increased in thickness whenever necessary (Step S35), the heat treatment (drive) is performed to activate impurity ions which have been introduced in the semiconductor wafer (Step S36). Thereby, a first diffusion region 410 and a second diffusion region 412 are formed on the surface layer portion of the semiconductor wafer.

Next, on the insulating film 20, still another resist mask having openings which coincide with the contact holes 416, 417 is formed (Step S37). Etching via this resist mask is performed to form the contact holes 416, 417 on the insulating film 20 (Step S38). Thereafter, the resist mask is peeled off.

Then, for example, sputtering is performed to form on the insulating film 20 an electrode film which constitutes the first connection electrode 3 and the second connection electrode 4 (Step S39). In the present preferred embodiment, the electrode film which is made of Al is formed. Then, another resist mask having an opening pattern corresponding to the slit 418 is formed on the electrode film (Step S40), and etching via this resist mask (for example, reactive ion etching) is performed to form the slit 418 on the electrode film (Step S41). Thereby, the electrode film is separated into the first electrode film 403 and the second electrode film 404.

Then, after the resist film has been peeled off, for example, a CVD method is performed to form a passivation film 420 such as a nitride film (Step S42), and polyimide, etc., are coated to form a resin film 421 (Step S43). For example, after photosensitivity-imparted polyimide is coated and exposed in a pattern corresponding to the notched portions 422, 423, a polyimide film thereof is developed (Step S44). Thereby, the resin film 421 having openings corresponding to the notched portions 422, 423 is formed. Thereafter, whenever necessary, heat treatment for curing the resin film is performed (Step S45). Then, dry etching (for example, reactive ion etching) which uses the resin film 421 as a mask is performed to form the notched portions 422, 423 on the passivation film 420 (Step S46). Thereafter, in accordance with the method described in Embodiment 1 (refer to FIG. 11E to FIG. 11I), the first connection electrode 3 and the second connection electrode 4 as external connection electrodes are formed so as to be connected to the first electrode film 403 and the second electrode film 404, and the semiconductor wafer is separated into individual chips. Thereby, it is possible to obtain the chip part 401 having the structure.

In the present preferred embodiment, since the substrate 2 is made of the p-type semiconductor substrate, it is possible to realize stable characteristics, without forming an epitaxial layer on the substrate 2. That is, an n-type semiconductor wafer is great in in-plane variation of resistivity. Thus, when the n-type semiconductor wafer is used, it is necessary that an epitaxial layer small in in-plane variation of resistivity is formed on the front surface thereof and an impurity diffusion layer is formed on the epitaxial layer to provide a p-n junction. This is because on formation of an ingot (for example, a silicon ingot) which is a base of the semiconductor wafer, a small segregation coefficient of the n-type impurities will cause a great difference in resistivity between the center of the wafer and the peripheral edge portion thereof. In contrast, a relatively great segregation coefficient of the p-type impurity results in a small in-plane variation of resistivity of the p-type semiconductor wafer. Therefore, use of the p-type semiconductor wafer enables to cut out a bidirectional Zener diode stable in characteristics at any place of the water without formation of an epitaxial layer. Thus, the $p^+$-type substrate 2 can be used to simplify the manufacturing steps and also reduce manufacturing costs.

Each of FIG. 62A to FIG. 62F is a plan view of a modification example of the chip part 401 shown in FIG. 52. Each of FIG. 62A to FIG. 62F is a plan view corresponding to FIG. 52. In FIG. 62A to FIG. 62F, the portions corresponding to individual portions shown in FIG. 62A to FIG. 62F are given the same reference numerals as those of FIG. 52.

A chip part 401A shown in FIG. 62A is provided with each one of a first diffusion region 410 and a second diffusion region 412. A first Zener diode D401 is arranged with one Zener diode corresponding to the first diffusion region 410. A second Zener diode D402 is arranged with one Zener diode corresponding to the second diffusion region 412. Each of the first diffusion region 410 and the second diffusion region 412 is formed substantially in a rectangular shape longer in a long direction of a substrate 2 and disposed, at an interval kept in a short direction of the substrate 2. The first diffusion region 410 and the second diffusion region 412 are formed to be relatively short in the long direction (shorter than ½ of an interval between a first pad 405 and a second pad 406). The interval between the first diffusion region 410 and the second diffusion region 412 is set to be shorter than the width of each of the diffusion regions 410, 412.

A first connection electrode 3 is provided with a single lead-out electrode L411 corresponding to the first diffusion region 410. In a similar manner, a second connection electrode 4 is provided with a single lead-out electrode L421 corresponding to the second diffusion region 412. Each of the first connection electrode 3 and the second connection electrode 4 is formed in a comb-teeth-like shape so that the lead-out electrode L411 mates with the lead-out electrode L421.

The first connection electrode 3 and the first diffusion region 410 are arranged so as to be mutually point symmetrical with the second connection electrode 4 and the second diffusion region 412 in a plan view in relation to the center of gravity of an element forming surface 2A. It can be deemed that the first connection electrode 3 and the first diffusion region 410 are arranged so as to be substantially line symmetrical with the second connection electrode 4 and the second diffusion region 412. That is, if the first lead-out electrode L411 and the second lead-out electrode L421 are deemed to be at the same position, it can be deemed that the first connection electrode 3 and the first diffusion region 410 are arranged so as to be line symmetrical with the second connection electrode 4 and the second diffusion region 412 in relation to a straight line which is parallel in the short direction of the element forming surface 2A and passes through the center thereof in the long direction in a plan view.

As with the chip part 401A shown in FIG. 62A, a chip part 401B shown in FIG. 62B is provided with each one of a first Zener diode D401 and a second Zener diode D402. In the chip part 401B shown in FIG. 62B, the length of each of a first diffusion region 410 and a second diffusion region 412 in the long direction and the length of each of the lead-out electrodes L411, L421 are formed to be longer than those in the chip part 401A shown in FIG. 62A (longer than ½ of an interval between a first pad 405 and a second pad 406).

A chip part 401C shown in FIG. 62C is provided with each four of first diffusion regions 410 and second diffusion regions 412. A total of eight first diffusion regions 410 and the second diffusion regions 412 are each formed in a rectangular shape longer in the long direction of a substrate 2. The first diffusion regions 410 and the second diffusion regions 412 are aligned alternately along the short direction of the substrate 2, at an equal interval. A first Zener diode D401 is arranged with four Zener diodes D411 to D414 which correspond respectively to the first diffusion regions 410. A second Zener diode D402 is arranged with four Zener diodes D421 to D424 which correspond respectively to the second diffusion regions 412.

In a first connection electrode 3, four lead-out electrodes L411 to L414 which correspond respectively to the first diffusion regions 410 are formed. In a second connection electrode 4, four lead-out electrodes L421 to L434 which correspond respectively to the second diffusion regions 412 are also formed. The first connection electrode 3 and the second connection electrode 4 are formed in a comb-teeth-like shape so that the lead-out electrodes L411 to LA14 mate respectively with the lead-out electrodes L421 to L424.

The first connection electrode 3 and the first diffusion region 410 are arranged so as to be mutually point symmetrical with the second connection electrode 4 and the second diffusion region 412 in a plan view in relation to the center of gravity of an element forming surface 2A. It can be deemed that the first connection electrode 3 and the first diffusion region 410 are arranged so as to be substantially line symmetrical with the second connection electrode 4 and the second diffusion region 412. That is, if the first lead-out electrodes L411 to L414 and the second lead-out electrodes L421 to L424, each of which is mutually adjacent (that is, L424 and L411, L423 and L412, L422 and L413, L421 and L414) are deemed to be at the same position, it can be deemed that the first connection electrode 3 and the first diffusion region 410 are arranged so as to be line symmetrical with the second connection electrode 4 and the second diffusion region 412 in a plan view in relation to a straight line which is parallel at the center of the element forming surface 2A in the short direction and also passing through the center thereof in the long direction.

As with the embodiment of FIG. 52, a chip part 401D shown in FIG. 62D is provided with two each of first diffusion regions 410 and second diffusion regions 412. A total of these four first diffusion regions 410 and the second diffusion regions 412 are formed each in a rectangular shape long in the long direction of a substrate 2. The first diffusion regions 410 and the second diffusion regions 412 are alternately aligned along the short direction of a substrate 2. A first Zener diode D401 is arranged with two Zener diodes D411, D412 respectively corresponding to the first diffusion regions 410. A second Zener diode D402 is arranged with two Zener diodes D421, D422 respectively corresponding to the second diffusion regions 412. A total of these four diodes are disposed so as to be arrayed in the order of D422, D411, D421 and D412 on an element forming surface 2A in the short side direction thereof.

The second diffusion region 412 corresponding to the Zener diode D422 and the first diffusion region 410 corresponding to the Zener diode D411 are disposed so as to be mutually adjacent to a portion close to one long side of the element forming surface 2A. The second diffusion region 412 corresponding to the Zener diode D421 and the first diffusion region 410 corresponding to the Zener diode D412 are disposed so as to be mutually adjacent to a portion close to the other long side of the element forming surface 2A. That is, the first diffusion region 410 corresponding to the Zener diode D411 and the second diffusion region 412 corresponding to the Zener diode D421 are disposed, at a great interval (an interval greater than the width of each of the diffusion regions 410, 412).

In a first connection electrode 3, two lead-out electrodes L411, L412 respectively corresponding to the first diffusion regions 410 are formed. In a second connection electrode 4, two lead-out electrodes L421, L422 respectively corresponding to the second diffusion regions 412 are also formed. The first connection electrode 3 and the second connection electrode 4 are formed in a comb-teeth-like shape in such a manner that the lead-out electrodes L411, L412 mate respectively with the lead-out electrodes L421, L422.

The first connection electrode 3 and the first diffusion region 410 are arranged so as to be mutually point symmetrical with the second connection electrode 4 and the second diffusion region 412 in a plan view in relation to the center of gravity of an element forming surface 2A. It can be deemed that the first connection electrode 3 and the first diffusion region 410 are arranged so as to be substantially line symmetrical with the second connection electrode 4 and the second diffusion region 412. That is, the second lead-out electrode L422 at one long side of a substrate 2 and the first lead-out electrode L411 adjacent thereto are deemed to be substantially at the same position, and the first lead-out electrode LA12 on the other long side of the substrate 2 and the second lead-out electrode L421 adjacent thereto are deemed to be substantially at the same position. Then, it can be deemed that the first connection electrode 3 and the first diffusion region 410 are arranged so as to be line symmetrical with the second connection electrode 4 and the second diffusion region 412 in relation to a straight line which is parallel in the short direction of the element forming surface 2A and passes through the center thereof in the long direction in a plan view.

A chip part 401E shown in FIG. 62E is provided with two each of first diffusion regions 410 and second diffusion regions 412. The first diffusion regions 410 and the second diffusion regions 412 are each formed substantially in a rectangular shape longer in the long direction of the first diffusion region 410. One of the second diffusion regions 412 is formed at a portion close to one long side of an element forming surface 2A, and the other of the second diffusion regions 412 is formed at a portion close to the other long side of the element forming surface 2A. The two first diffusion regions 410 are formed so as to be respectively adjacent to the second diffusion regions 412 in a region between these two second diffusion regions 412. That is, the two first diffusion regions 410 are disposed, at a great interval (an interval greater than the width of each of the diffusion regions 410, 412), and the second diffusion regions 412 are disposed one each in the exterior thereof.

A first Zener diode D401 is arranged with two Zener diodes D411, D412 which respectively correspond to the first diffusion regions 410. A second Zener diode D402 is arranged with two Zener diodes D421, 422 which respectively correspond to the second diffusion regions 412. In a first connection electrode 3, two lead-out electrodes L411, L412 which respectively correspond to the first diffusion regions 410 are formed. In a second connection electrode 4, two lead-out electrodes L421, L422 which respectively correspond to the second diffusion regions 412 are also formed.

It can be deemed that the first connection electrode 3 and the first diffusion region 410 are arranged so as to be substantially line symmetrical with the second connection electrode 4 and the second diffusion region 412. That is, the second lead-out electrode L422 on one long side of a substrate 2 and the first lead-out electrode L411 adjacent thereto are deemed to be substantially at the same position, and the second lead-out electrode L421 on the other long side of the substrate 2 and the first lead-out electrode L412 adjacent thereto are deemed to be substantially at the same position. Then, it can be deemed that the first connection electrode 3 and the first diffusion region 410 are arranged so as to be line symmetrical with the second connection electrode 4 and the second diffusion region 412 in a plan view in relation to a straight line which passes through the center of the element forming surface 2A in the long direction.

In the chip part 401E shown in FIG. 62E, the second lead-out electrode L422 at one long side of the substrate 2 and the first lead-out electrode L411 adjacent thereto are arranged so as to be mutually point symmetrical at the center of a predetermined point between them. The second lead-out electrode L421 at the other long side of the substrate 2 and the first lead-out electrode LA12 adjacent thereto are arranged so as to be mutually point symmetrical at the center of the predetermined point between them. As described above, where the first connection electrode 3 and the first diffusion region 410 are arranged in combination with a partially symmetrical structure with the second connection electrode 4 and the second diffusion region 412, it can be deemed that the first connection electrode 3 and the first diffusion region 410 are arranged so as to be substantially symmetrical with the second connection electrode 4 and the second diffusion region 412.

In a chip part 401F shown in FIG. 62F, a plurality of first diffusion regions 410 are discretely disposed in a surface layer region of a substrate 2 and a plurality of second diffusion regions 412 are also discretely disposed. Each of the first diffusion regions 410 and each of the second diffusion regions 412 are formed in a circular shape which is equal in size in a plan view. The plurality of first diffusion regions 410 are disposed in a region between the center of an element forming surface 2A in the width direction and one long side, and the plurality of second diffusion regions 412 are disposed in a region between the center of the element forming surface 2A in the width direction and the other long side. Then, a first connection electrode 3 is provided with a single lead-out electrode L411 connected in common to the plurality of first diffusion regions 410. In a similar manner, a second connection electrode 4 is provided with a single lead-out electrode L421 connected in common to the plurality of second diffusion regions 412. In this modification example as well, the first connection electrode 3 and the first diffusion region 410 are arranged so as to be mutually point symmetrical with the second connection electrode 4 and the second diffusion region 412 in a plan view in relation to the center of gravity of the element forming surface 2A.

The first diffusion region 410 and the second diffusion region 412 may be formed in any arbitrary shape of a triangle, a tetragon or any other polygons in a plan view. The region between the center of the element forming surface 2A in the width direction and one long side, the plurality of first diffusion regions 410 extending in the long direction of the element forming surface 2A are formed in the short direction of the element forming surface 2A, at an interval, and the plurality of first diffusion regions 410 may be connected in common to the lead-out electrode LA11. In this case, in the region between the center of the element forming surface 2A in the width direction and the other long side, the plurality of second diffusion regions 412 extending in the long direction of the element forming surface 2A are formed in the short direction of the element forming surface 2A, at an interval, and the plurality of second diffusion regions 412 are commonly connected to the lead-out electrode L421.

<Composite Chip Part>

FIG. 63A is a schematic perspective view which describes an arrangement of a chip part 501 of Embodiment 11 of the present invention.

The chip part 501 of Embodiment 11 is different from the chip part 1 of Embodiment 1 in that two circuit elements are formed on a single substrate 502 (that is, an element region 5 includes two element regions 505 on the single substrate 502). The other portions of the chip part 501 are similar in arrangement to those of the chip part 1 of Embodiment 1. In FIG. 63A, the portions corresponding to the individual portions shown in FIG. 1 to FIG. 62F are given the same reference numerals, with a description thereof omitted. Hereinafter, the chip part 501 is referred to as "the composite chip part 501."

As shown in FIG. 63A, the composite chip part 501 is a pair chip in which on the common substrate 502, two of the previously described circuit elements of Embodiment 1 to Embodiment 10 (such as resistor portion, capacitor, fuse, diode and Zener diode) are selectively loaded. The two circuit elements are adjacently disposed to each other so as to be symmetrical with a boundary region 507 thereof.

The composite chip part 501 is formed in a rectangular parallelepiped shape. A planar shape of the composite chip part 501 is a tetragon having a side along in a direction at which two circuit elements are arrayed (hereinafter referred to as a lateral direction of the substrate 502) (transverse side 582) and a side orthogonal to the transverse side 582 (longitudinal side 581). The composite chip part 501 has a planar dimension, for example, of 0303 size in combination of two circuit elements, each of which has a length L5 (length of the longitudinal side 581)=approximately 0.3 mm and a width W5=approximately 0.15 mm, that is, 03015 size. As a matter of course, the planar dimension of the composite chip part 501 shall not be limited thereto, and it may be, for example, 0404 size in combination of two elements, each of which has the length L5=approximately 0.4 mm, the width W5=approximately 0.2 mm, that is, 0402 size. Further, it is preferable that the thickness T5 of the composite chip part 501 is approximately 0.1 mm and the width of the boundary region 507 between mutually adjacent two circuit elements is approximately 0.03 mm.

The composite chip part 501 is obtained by procedures in which on a substrate (corresponding to the substrate 30 of Embodiment 1), many composite chip parts 501 are formed in a lattice, a groove (corresponding to the groove 44) is formed on the substrate and, thereafter, rear surface polishing (or the substrate is divided along the groove) is performed to separate the surface into individual composite chip parts 501.

Each of the two circuit elements is mainly provided with a substrate 502 which constitutes a main body of the composite chip part 501, a first connection electrode 503 and a second connection electrode 504 acting as an external connection electrode, and an element region 505 which is externally connected by the first connection electrode 503 and the second connection electrode 504. In the present preferred embodiment, the first connection electrode 503 is formed so as to extend via two circuit elements and acts as a common electrode of two circuit elements.

The substrate 502 is formed substantially in a rectangular parallelepiped chip shape. In the substrate 502, one front surface which constitutes an upper surface shown in FIG. 63A is an element forming surface 502A. The element forming surface 502A is a front surface on which elements are formed in the substrate 502 and formed substantially in an oblong shape. In the thickness direction of the substrate 502, a surface opposite to the element forming surface 502A is a rear surface 502B. The element forming surface 502A and the rear surface 502B are substantially equal in size and also equal in shape and parallel to each other. A tetragonal edge defined by the pair of longitudinal sides 581 and the pair of transverse sides 582 on the element forming surface 502A is referred to as a peripheral edge portion 585, while a tetragonal edge defined by the pair of longitudinal sides 581 and the pair of transverse sides 582 on the rear surface 502B is referred to as a peripheral edge portion 590. When viewed from the direction of a normal orthogonal to the element forming surface 502A (rear surface 502B), the peripheral edge portion 585 overlaps the peripheral edge portion 590 (refer to FIG. 63C, 63D described later). The substrate 502 is a substrate which may be thinned, for example, by grinding or polishing from the rear surface 502B side. The substrate 502 may be formed by using a semiconductor substrate represented by a silicon substrate, a glass substrate or a resin film.

The substrate 502 is provided with a plurality of side surfaces (side surface 502C, side surface 502D, side surface 502E and side surface 502F) as front surfaces other than the element forming surface 502A and the rear surface 502B. The plurality of side surfaces 502C to 502E extend so as to intersect (specifically so as to be orthogonal to) each of the element forming surface 502A and the rear surface 502B and join the element forming surface 502A and the rear surface 502B.

The side surface 502C is constructed between the transverse sides 582 of the element forming surface 502A and the rear surface 502B at one side (the front left side in FIG. 63A) in the longitudinal direction (hereinafter, in the longitudinal direction of the substrate 502) which is orthogonal to the lateral direction of the substrate 502. And, the side surface 502D is constructed between the transverse sides 582 of the element forming surface 502A and the rear surface 502B at the other side (the inner right side in FIG. 63A) in the longitudinal direction of the substrate 502. The side surface 502C and the side surface 502D are the respective end surfaces of the substrate 502 in the longitudinal direction.

The side surface 502E is constructed between the longitudinal sides 581 of the element forming surface 502A and the rear surface 502B at one side (the inner left side in FIG. 63A) in the lateral direction of the substrate 502. And, the side surface 502F is constructed between the longitudinal sides 581 of the element forming surface 502A and the rear surface 502B at the other side (the front right side in FIG. 63A) in the lateral direction of the substrate 502. The side surface 502E and the side surface 502F are the respective end surfaces of the substrate 502 in the lateral direction.

The side surface 502C and the side surface 502D respectively intersects (specifically orthogonal to) the side surface 502E and the side surface 502F. Mutually adjacent surfaces among the element forming surfaces 502A to side surfaces 502F thus form a right angle.

With the substrate 502, the respective entireties of the element forming surface 502A and the side surfaces 502C to 502E are covered by a passivation film 523. Therefore, to be exact, in FIG. 63A, the respective entireties of the element forming surface 502A and the side surfaces 502C to 502E are positioned at the inner side of the passivation film 523 (the rear side) and not exposed to the exterior. Further, the composite chip part 501 is provided with a resin film 524. The passivation film 523 is different from the resin film 524 in that the substrate 2 is given as the substrate 502. However, they are substantially similar in arrangement to the previously described passivation film 23 and the resin film 24 of Embodiment 1 to Embodiment 3, with a description thereof omitted.

The first connection electrode 503 and the second connection electrode 504 are provided respectively with the peripheral edge portions 586, 587 formed by extending from the element forming surface 502A and the side surfaces 502C to 502E so as to cover the peripheral edge portion 585 on the element forming surface 502A of the substrate 502. In the present preferred embodiment, the peripheral edge portions 586, 587 are formed so as to cover the individual corner portions 511 in which each of the side surfaces 502C to 502E of the substrate 502 intersects. Further, the substrate 502 is formed in a round shape by chamfering the individual corner portions 511 in a plan view and, thereby, structured to suppress chipping in a step of manufacturing the composite chip part 501 or on mounting thereof.

The first connection electrode 503 is provided with a pair of long sides 503A and a pair of short sides 503B which constitute four sides in a plan view. The long side 503A is orthogonal to the short side 503B in a plan view. The second connection electrode 504 is provided with a pair of long sides 504A and a pair of short sides 504B which constitute four sides in a plan view. The long side 504A is orthogonal to the short side 504B in a plan view. The long side 503A and the long side 504A extend parallel with the transverse sides 582 of the substrate 502, while the short side 503B and the short side 504B extend parallel with the longitudinal sides 581 of the substrate 502. Further, the composite chip part 501 is not provided with an electrode on the rear surface 502B of the substrate 502.

As with Embodiment 1 to Embodiment 11, a plurality of recessed portions 6 are formed on the front surface of each of the first connection electrode 503 and the second connection electrode 504.

The plurality of recessed portions 6 are formed at a peripheral portion of the first connection electrode 503, at an interval from each other. More specifically, the plurality of recessed portions 6 are formed in a region along the long sides 503A and the short sides 503B of the first connection electrode 503, at an interval from each other. Each of the recessed portions 6 is formed, for example, substantially in a circular shape in a plan view. A flat portion 7 in which the recessed portion 6 is not formed is formed at an internal portion of the first connection electrode 503 surrounded by the plurality of recessed portions 6.

The flat portion 7 is formed so as to be oblong along the long side 503A at the internal portion of the first connection electrode 503. In a step of manufacturing the chip part, a circuit element formed at the element region 505 is subjected to probing (electrical test). As described above, the flat portion 7 is provided on the front surface of the first connection electrode 503, thus making it possible to satisfactorily secure a contact region of a probe. Further, it is possible to satisfactorily secure a connection area when the mounting substrate 9 (refer to FIG. 19) is mounted.

Each of the second connection electrodes 504 is also provided with recessed portions 6 similar to those of the first connection electrode 503. The recessed portions 6 of the second connection electrodes 504 are similar in arrangement to the recessed portions 6 of the first connection electrode 503, with a description thereof omitted.

FIG. 63B is a schematic sectional view of a circuit assembly 100 in a state that the composite chip part 501 is mounted on a mounting substrate 9. FIG. 63C is a schematic plan view when the circuit assembly 100 is viewed from the rear surface 502B side of the composite chip part 501. FIG. 63D is a schematic plan view when the circuit assembly 100 is viewed from the element forming surface 502A of the composite chip part 501. In addition, only major portions are shown in FIG. 63B to FIG. 63D.

As shown in FIG. 63B to FIG. 63D, the composite chip part 501 is mounted on the mounting substrate 9. In this state, the circuit assembly 100 is arranged by the composite chip part 501 and the mounting substrate 9.

As shown in FIG. 63B, the upper surface of the mounting substrate 9 is a mounting surface 9A. A mounting region 589 for the composite chip part 501 is defined on the mounting surface 9A. In the present preferred embodiment, the mounting region 589 is, as shown in FIG. 63C and FIG. 63D, formed in a square shape in a plan view and includes a land region 592 in which lands 588 are disposed and a solder resist region 593 which surrounds the land region 592.

Where the composite chip part 501 is, for example, a pair chip which has two circuit elements, each of which is 03015 size, the land region 592 is formed in a tetragonal (square) shape with a planar size of 410 μm×410 μm. That is, one side of the land region 592 has the length L501=410 μm. On the other hand, the solder resist region 593 is formed in a rectangular annular shape, for example, with the width L502 of 25 μm so as to rim the land region 592.

The land 588 is disposed each one at four corners of the land region 592, that is, a total of four lands are disposed. In the present preferred embodiment, each of the lands 588 is provided at a position being spaced away from each of the sides which define the land region 592, at a fixed interval. For example, an interval from each side of the land region 592 to each of the lands 588 is 25 μm. Further, an interval of 80 μm is provided between the mutually adjacent lands 588. Each of the lands 588 is made of, for example, Cu and connected to an internal circuit (not shown) of the mounting substrate 9. As shown in FIG. 63B, a solder 13 is provided on each front surface of the lands 588 so as to project from the front surface.

Where the composite chip part 501 is mounted on the mounting substrate 9, as shown in FIG. 63B, the rear surface 502B of the composite chip part 501 is suctioned by a suction nozzle 76 of an automatic mounting machine 80 (refer to FIG. 17 and others), and the suction nozzle 76 is activated to convey the composite chip part 501. In this process, the suction nozzle 76 suctions substantially at the central part of the rear surface 502B in longitudinal direction of the substrate 502. As described previously, the first connection electrode 503 and the second connection electrode 504 are installed only at one side of the composite chip part 501 (element forming surface 502A) and at an end on the element forming surface 502A of each of the side surfaces 502C to 502E. Therefore, at the composite chip part 501, the rear surface 502B is a flat surface in which an electrode (unevenness) is not formed. Accordingly, where the composite chip part 501 is moved by being suctioned by the suction nozzle 76, the flat rear surface 502B can be suctioned by the suction nozzle 76. In other words, the flat rear surface 502B enables to increase a margin of a portion which can be suctioned by the suction nozzle 76. Thereby, the composite chip part 501 can be suctioned reliably by the suction nozzle 76 and the composite chip part 501 can be conveyed reliably from the suction nozzle 76 without falling off midway.

Further, the composite chip part 501 is a pair chip having two circuit elements in a pair. Thus, as compared with a case where, for example, a single chip which loads a single resistor or a single capacitor is mounted two times, a chip part having the same function can be mounted by one-time mounting operation. Still further, as compared with a single chip, a rear surface area per chip can be increased to an area covering two or more resistors or capacitors. Thus, suction motions of the suction nozzle 76 can be made stable.

Then, the suction nozzle 76 which has suctioned the composite chip part 501 is made to move to the mounting substrate 9. In this process, the element forming surface 502A of the composite chip part 501 faces the mounting surface 9A of the mounting substrate 9. In this state, the suction nozzle 76 is made to move and pressed onto the mounting substrate 9. In the composite chip part 501, the first connection electrode 503 and the second connection electrode 504 are brought into contact with the solder 13 of each land 588.

Next, the solder 13 is heated to melt the solder 13. Then, the solder 13 is cooled and solidified. The first connection electrode 503 and the second connection electrode 504 are bonded to the land 588 via the solder 13. That is, each of the lands 588 is solder-bonded to a corresponding electrode, which is the first connection electrode 503 or the second connection electrode 504. Thereby, the composite chip part 501 is completely mounted on the mounting substrate 9 (flip-chip bonding) and the circuit assembly 100 is completed.

In the circuit assembly 100 which has been completed, the element forming surface 502A of the composite chip part 501 faces the mounting surface 9A of the mounting substrate 9, with a clearance kept, and they extend parallel. The clearance has a dimension which corresponds to a total of the thickness of a portion projecting from the element forming surface 502A in the first connection electrode 503 or the second connection electrode 504 and the thickness of the solder 13.

In the circuit assembly 100, the respective peripheral edge portions 586, 587 of the first connection electrode 503 and the second connection electrode 504 are formed by extending from the element forming surface 502A of the substrate 502 and the side surfaces 502C to 502E (In FIG. 63B, only the side surfaces 502C, 502D are shown). Therefore, the composite chip part 501 can be increased in adhesion area when soldered onto the mounting substrate 9. As a result, the solder 13 can be adsorbed to the first connection electrode 503 and the second connection electrode 504 in an increased amount, thereby improving adhesion strength.

Further, in the mounting state, the chip part can be held at least in two directions from the element forming surface 502A of the substrate 502 and also from the side surfaces 502C to 502E. Therefore, the chip part 1 can be made stable in mounting form. Still further, the chip part 1 after being mounted to the mounting substrate 9 can be held at four points by using the four lands 588 and made stable in mounting form to a greater extent.

Further, the composite chip part 501 is a pair chip having two circuit elements, each of which is a 03015 size, and which is in a pair. Therefore, an area of the mounting region 589 for the composite chip part 501 can be reduced to a greater extent than a conventional case.

For example, in the present preferred embodiment, with reference to FIG. 63C, the following area of the mounting region 589 will be sufficient, that is, L503×L503=(L502+L501+L502)×(L502+L501+L502)=(25+410+25)×(25+410+25)=211600 $\mu m^2$.

On the other hand, as shown in FIG. 63E, where two single-chip parts 550, each of which has a conventionally-producible minimum size of a 0402 size, are mounted on the mounting surface 9A of the mounting substrate 9, there was a need for a mounting region 551 of 319000 $\mu m^2$. Thus, where the mounting region 589 of the present preferred embodiment is compared with the conventional mounting region 551 in terms of the area, it is apparent that, with the arrangement of the present preferred embodiment, it is possible to reduce the mounting area by approximately as much as 34%.

The mounting region 551 of FIG. 63E is calculated for an area on the basis of (L506+L504+L505+L504+L506)×(L506+L507+L506)=(25+250+30+250+25)×(25+500+25)=319000 $\mu m^2$ under the conditions, that is, the lateral width of mounting area 552 of each single chip part 550 at which the land 554 is disposed, L504=250 μm; the interval between mutually adjacent mounting areas 552, L505=30 μm; the width of the solder resist region which constitutes an outer circumference of the mounting region 551, L506=25 μm; and the length of the mounting area 552, L507=500 μm.

<Smartphone>

FIG. 64 is a perspective view which shows the outer appearance of a smartphone that is an example of the electronic device in which chip parts according to Embodiment 1 to Embodiment 11 are used. A smartphone 601 is arranged by housing electronic parts in the interior of a housing 602 which is formed in a flat rectangular parallelepiped shape. The housing 602 has a pair of oblong major surfaces at its front side and rear side, and the pair of major surfaces are joined by four side surfaces. A display surface of a display panel 603 constituted of a liquid crystal panel or an organic EL panel, etc., is exposed at one of the major surfaces of the housing 602. The display surface of the display panel 603 constitutes a touch panel and provides an input interface for a user.

The display panel 603 is formed in an oblong shape that occupies most of one major surface of the housing 602. Operation buttons 604 are disposed along one short side of the display panel 603. In the present preferred embodiment, a plurality (three) of operation buttons 604 are aligned along the short side of the display panel 603. The user can call and execute necessary functions by performing operation of the smartphone 601 by operating the operation buttons 604 and the touch panel.

A speaker 605 is disposed in the vicinity of the other short side of the display panel 603. The speaker 605 provides an earpiece for telephone functions and is also used as an acoustic conversion unit for reproducing music data, etc. On the other hand, close to the operation buttons 604, a microphone 606 is disposed at one of the side surfaces of the housing 602. The microphone 606 provides a mouthpiece for telephone functions and may also be used as a microphone for sound recording.

FIG. 65 is an illustrative plan view of an arrangement of the circuit assembly 100 housed in the interior of the housing 602. The circuit assembly 100 includes the mounting substrate 9 and circuit parts mounted on the mounting surface 9A of the mounting substrate 9. The plurality of circuit parts include a plurality of integrated circuit elements (IC) 612 to 620 and a plurality of chip parts. The plurality of ICs include a transmission processing IC 612, a one-segment TV receiving IC 613, a GPS receiving IC 614, an FM tuner IC 615, a power supply IC 616, a flash memory 617, a microcomputer 618, a power supply IC 619 and a baseband IC 620.

The plurality of chip parts include chip inductors 621, 625 and 635, chip resistors 622, 624 and 633, chip capacitors 627, 630 and 634, chip diodes 628, 631 and bidirectional Zener diode chips 641 to 648. These chip parts correspond to the chip parts described in Embodiment 1 to Embodiment 11 and mounted on the mounting surface 9A of the mounting substrate 9 by, for example, flip-chip bonding.

The bidirectional Zener diode chips 641 to 648 are provided for absorbing plus/minus surges, etc., on a signal input line to the one-segment TV receiving IC 613, the GPS receiving IC 614, the FM tuner IC 615, the power supply IC 616, the flash memory 617, the microcomputer 618, the power supply IC 619 and the baseband IC 620.

The transmission processing IC 612 incorporates therein an electronic circuit arranged to generate display control signals for the display panel 603 and to receive input signals from the touch panel on a front surface of the display panel 603. For connection with the display panel 603, the transmission processing IC 612 is connected to a flexible wiring 609.

The one-segment TV receiving IC 613 incorporates therein an electronic circuit that constitutes a receiver for receiving one-segment broadcast (terrestrial digital television broadcast targeted for reception by portable devices) radio waves. A plurality of chip inductors 621, a plurality of chip resistors 622, and a plurality of bidirectional Zener diode chips 641 are disposed in the vicinity of the one-segment TV receiving IC 613. The one-segment TV receiving IC 613, the chip inductors 621, the chip resistors 622 and the bidirectional Zener diode chips 641 constitute a one-segment broadcast receiving circuit 623. The chip inductors 621 and the chip resistors 622 individually have accurately adjusted inductances and resistor portions, thereby providing circuit constants of high precision to the one-segment broadcast receiving circuit 623.

The GPS receiving IC 614 incorporates therein an electronic circuit that receives radio waves from GPS satellites and outputs positional information of the smartphone 601. A plurality of bidirectional Zener diode chips 642 are disposed in the vicinity of the GPS receiving IC 614.

The FM tuner IC 615 constitutes an FM broadcast receiving circuit 626, together with a plurality of chip resistors 624 mounted on the mounting substrate 9, a plurality of chip inductors 625 and a plurality of bidirectional Zener diode chips 643 in the vicinity thereof. The chip resistors 624 and the chip inductors 625 individually have accurately adjusted resistance values and inductances, thereby providing circuit constants of high precision to the FM broadcast receiving circuit 626.

A plurality of chip capacitors 627, a plurality of chip diodes 628 and a plurality of bidirectional Zener diode chips 644 are mounted on the mounting surface 9A of the mounting substrate 9 in the vicinity of the power supply IC 616. The power supply IC 616 constitutes a power supply circuit 629, together with the chip capacitors 627, the chip diodes 628 and the bidirectional Zener diode chips 644.

The flash memory 617 is a storage device for recording operating system programs, data generated in the interior of the smartphone 601, and data and programs obtained from the exterior by communication functions. A plurality of bidirectional Zener diode chips 645 are disposed in the vicinity of the flash memory 617.

The microcomputer 618 is a computing processing circuit that incorporates therein a CPU, a ROM and a RAM and realizes a plurality of functions of the smartphone 601 by executing various computational processes. More specifically, computational processes for image processing and various application programs are realized by actions of the microcomputer 618. A plurality of bidirectional Zener diode chips 646 are disposed in the vicinity of the microcomputer 618.

A plurality of chip capacitors 630, a plurality of chip diodes 631 and a plurality of bidirectional Zener diode chips 647 are mounted on the mounting surface 9A of the mounting substrate 9 in the vicinity of the power supply IC 619. The power supply IC 619 constitutes a power supply circuit 632, together with the chip capacitors 630, the chip diodes 631 and the bidirectional Zener diode chips 647.

A plurality of chip resistors 633, a plurality of chip capacitors 634, a plurality of chip inductors 635 and a plurality of bidirectional Zener diode chips 648 are mounted on the mounting surface 9A of the mounting substrate 9 in the vicinity of the baseband IC 620. The baseband IC 620 constitutes a baseband communication circuit 636, together with the chip resistors 633, the chip capacitors 634, the chip inductors 635 and the plurality of bidirectional Zener diode chips 648. The baseband communication circuit 636 provides communication functions for telephone communication and data communication.

With the arrangement, electric power that is appropriately adjusted by the power supply circuits 629, 632 is supplied to the transmission processing IC 612, the GPS receiving IC 614, the one-segment broadcast receiving circuit 623, the FM broadcast receiving circuit 626, the baseband communication circuit 636, the flash memory 617 and the microcomputer 618. The microcomputer 618 performs computational processes in response to input signals input via the transmission processing IC 612 and outputs the display control signals from the transmission processing IC 612 on the display panel 603, thereby allowing the display panel 603 to make various displays.

When receiving of one-segment broadcast is commanded by operation of the touch panel or the operation buttons 604, the one-segment broadcast is received by actions of the one-segment broadcast receiving circuit 623. Computational processes for outputting received images to the display panel 603 and making the received audio signals be acoustically converted by the speaker 605 are executed by the microcomputer 618.

Also, when positional information of the smartphone 601 is required, the microcomputer 618 obtains the positional information output by the GPS receiving IC 614 and executes computational processes using the positional information.

Further, when an FM broadcast receiving command is input by operation of the touch panel or the operation buttons 604, the microcomputer 618 starts up the FM broadcast receiving circuit 626 and executes computational processes for outputting received audio signals from the speaker 605.

The flash memory 617 is used to store data obtained by communication and to store data prepared by computations by the microcomputer 618 and input from the touch panel. The microcomputer 618 writes data into the flash memory 617 or reads data from the flash memory 617, whenever necessary.

The telephone communication or data communication functions are realized by the baseband communication circuit 636. The microcomputer 618 controls the baseband communication circuit 636 to perform processing for sending and receiving audio signals or data.

Modification Examples

Although in Embodiment 1 to Embodiment 5, the insulating film 20 is formed on the front surface of the substrate 2, an arrangement shown in FIG. 66 may be adopted. FIG.

66 is a schematic sectional view which shows a first connection electrode 3 of a chip part 701 according to a modification example.

The chip part 701 of the modification example is different from the chip part 1 of Embodiment 1 in that an insulating substrate 702 made of an insulating material is formed, an insulating film 20 is not formed, and a base recessed portion 708 is formed on a front surface of the insulating substrate 702. In FIG. 66, for the sake of explanation, the chip part is shown as a modification example of Embodiment 1. However, the chip part is also applicable to each arrangement of Embodiment 2 to Embodiment 5. In FIG. 66, the portions corresponding to the individual portions shown in FIG. 1 to FIG. 65 are given the same reference numerals, with a description thereof omitted.

The insulating substrate 702 of the modification example is, for example, a ceramic-made substrate. A base recessed portion 708 in which the insulating substrate 702 is dug down in the thickness direction is formed on a front surface of the insulating substrate 702 at the same position as that at which recessed portions 6 of the first connection electrode 3 are formed in a plan view.

The base recessed portion 708 is similar in arrangement to the base recessed portion 8 of Embodiment 1. Each of a resistor body film 21 and a wiring film 22 is formed along side surfaces and a bottom surface of the base recessed portion 708 and a front surface of the insulating substrate 702 in such a manner that one front surface (front surface) and the other front surface (rear surface) enter into a recessed space defined by the side surfaces and the bottom surface of the base recessed portion 708. Thereby, in a region at which the base recessed portion 708 is additionally formed, the recessed space is defined by a resistor body film 21 and a wiring film 22.

Then, the first connection electrode 3 is formed on the wiring film 22 in such a manner that the recessed space defined by the resistor body film 21 and the wiring film 22 is further refilled. Thereby, the first connection electrode 3 is provided with the recessed portion 6 at a position corresponding to the region in which the base recessed portion 8 has been formed.

As described so far, according to the arrangement of the chip part 701, there is no need for forming the insulating film 20, and the base recessed portion 8 which is to be formed on the insulating film 20 can be formed directly in the insulating substrate 702. It is thus not necessary to execute a step of forming the insulating film 20 and possible to simplify the manufacturing step thereof. As a matter of course, in Embodiment 11, where any one of a resistor portion, a capacitor and a fuse is adopted as a circuit element formed at the composite chip part 501, the substrate 2 of the composite chip part may be used as the insulating substrate 702.

<Resistor Portion>

FIG. 67 is a schematic perspective view which shows a chip part 1001 according to Reference Example 1. In FIG. 67, the portions corresponding to the individual portions shown in FIG. 1 to FIG. 66 are given the same reference numerals.

The chip part 1001 is a minute chip part and has a rectangular parallelepiped shape as shown in FIG. 67. The planar shape of the chip part 1001 may be a rectangle (0603 chip) with the two orthogonal sides (long side 81 and short side 82) being 0.6 mm or less and 0.3 mm or less, respectively or a rectangle (0404 chip) with the two sides being 0.4 mm or less and 0.2 mm or less respectively. Preferably, with regard to dimensions, the chip part 1001 is a rectangle (03015 chip) which has a length L1 (length of the long side 81) of approximately 0.3 mm, a width W1 (length of the short side 82) of approximately 0.15 mm and a thickness T1 of approximately 0.1 mm.

The chip part 1001 is mainly provided with a substrate 2 which constitutes a main body of the chip part 1001, a first connection electrode 3 and a second connection electrode 4, each of which acts as an external connection electrode, and an element region 5 in which externally-connected circuit elements are selectively formed by the first connection electrode 3 and the second connection electrode 4.

The substrate 2 is formed in a chip shape which is a substantially rectangular parallelepiped. With the substrate 2, one front surface which constitutes the upper surface in FIG. 67 is an element forming surface 2A. The element forming surface 2A is a front surface in which circuit elements are formed in the substrate 2 and formed in a substantially oblong shape. A surface opposite to the element forming surface 2A in the thickness direction of the substrate 2 is a rear surface 2B. The element forming surface 2A and the rear surface 2B are substantially equal in size and in shape and also parallel to each other. A rectangular edge defined by a pair of long sides 81 and a pair of short sides 82 on the element forming surface 2A is referred to as a peripheral edge portion 85, and a rectangular edge defined by a pair of long sides 81 and a pair of short sides 82 on the rear surface 2B is referred to as a peripheral edge portion 90. When viewed from the direction of a normal orthogonal to the element forming surface 2A (rear surface 2B), the peripheral edge portion 85 and the peripheral edge portion 90 overlap each other.

The substrate 2 is provided with a plurality of side surfaces (side surface 2C, side surface 2D, side surface 2E and side surface 2F) as front surfaces other than the element forming surface 2A and the rear surface 2B. The plurality of side surfaces extend so as to intersect (specifically, so as to be orthogonal to) each of the element forming surface 2A and the rear surface 2B and join the element forming surface 2A and the rear surface 2B.

The side surface 2C is constructed between the short sides 82 of the element forming surface 2A and the rear surface 2B at one side in the long direction (the front left side in FIG. 67), and the side surface 2D is constructed between the short sides 82 of the element forming surface 2A and the rear surface 2B at the other side in the long direction (the inner right side in FIG. 67). The side surface 2C and the side surface 2D are the respective end surfaces of the substrate 2 in the long direction. The side surface 2E is constructed between the long sides 81 of the element forming surface 2A and the rear surface 2B at one side in the short direction (the inner left side in FIG. 67), and the side surface 2F is constructed between the long sides 81 of the element forming surface 2A and the rear surface 2B at the other side in the short direction (the front right side in FIG. 67). The side surface 2E and the side surface 2F are the respective end surfaces of the substrate 2 in the short direction. The side surface 2C and the side surface 2D respectively intersect (specifically, being orthogonal to) the side surface 2E and the side surface 2F. Mutually adjacent surfaces among the element forming surface 2A to the side surface 2E thus form a right angle.

With the substrate 2, the respective entireties of the element forming surface 2A and the side surfaces 2C to 2E are covered by a passivation film 23. Therefore, to be exact, the respective entireties of the element forming surface 2A and the side surfaces 2C to 2E in FIG. 67 are positioned at the inner sides (rear sides) of the passivation film 23 and not exposed to the exterior. Further, the chip part 1001 has a resin film 24. The resin film 24 covers the entirety (the peripheral edge portion 85 and a region at the inner side thereof) of the passivation film 23 on the element forming surface 2A. The passivation film 23 and the resin film 24 will be described in detail later.

The first connection electrode 3 and the second connection electrode 4 are formed integrally on the element forming surface 2A of the substrate 2 so as to extend from the element forming surface 2A to the corresponding side surfaces 2C to 2E and thereby cover the peripheral edge portion 85. Each of the first connection electrode 3 and the second connection electrode 4 is formed so as to be exposed to the frontmost surface of the chip part 1001. The first connection electrode 3 and the second connection electrode 4 are disposed in the long direction of the element forming surface 2A, at an interval from each other. At this arrangement position, the first connection electrode 3 is formed to integrally cover the three side surfaces 2C, 2E, 2F along one short side 82 (the short side 82 at one side surface 2C side) of the chip part 1001 and the pair of long sides 81 at the respective sides thereof. On the other hand, the second connection electrode 4 is formed to integrally cover the three side surfaces 2D, 2E, 2F along the other short side 82 (the short side 82 at the side surface 2D side) of the chip part 1001 and the pair of long sides 81 at the respective sides thereof. Respective corner portions 11 at which the side surfaces intersect with each other at the end portions in the long direction of the substrate 2 are thereby covered by the first connection electrode 3 or the second connection electrode 4. The first connection electrode 3 and the second connection electrode 4 are substantially the same in size and shape in a plan view in the previously described direction of the normal.

The first connection electrode 3 has a pair of long sides 3A and a pair of short sides 3B which constitute four sides in a plan view. The long side 3A is orthogonal to the short side 3B in a plan view.

The second connection electrode 4 has a pair of long sides 4A and a pair of short sides 4B which constitute four sides in a plan view. The long side 4A is orthogonal to the short side 4B in a plan view. The long sides 3A and the long sides 4A extend parallel with the short sides 82 of the substrate 2, and the short sides 3B and the short sides 4B extend parallel with the long sides 81 of the substrate 2. Also, the chip part 1001 does not have an electrode on the rear surface 2B.

As shown in FIG. 67, a flat portion 97 and a raised-portion forming portion 98 are formed on the front surface of each of the first connection electrode 3 and the second connection electrode 4 when viewed in the direction of the normal orthogonal to the element forming surface 2A (the rear surface 2B) in a plan view. The flat portion 97 is a portion in which the front surface of each of the first connection electrode 3 and the second connection electrode 4 is formed flat, and the raised-portion forming portion 98 is a portion in which a plurality of raised portions 96 are formed.

The flat portion 97 is formed at the internal portion of each of the first connection electrode 3 and the second connection electrode 4 and also formed in a substantially oblong shape in a plan view so as to extend along the long side 3A of the first connection electrode 3 and along the long side 4A of the second connection electrode 4 in the long direction. Each of the flat portions 97 has a pair of long sides 97A and a pair of short sides 97B which constitute four sides in a plan view and is greater in surface area than each of the raised portions 96. The surface area of the flat portion 97 can be changed in accordance with dimensions of the chip part 1001, whenever necessary. It is, however, preferable that the length of the long side 97A of the flat portion 97 is at least 60 μm or more and the length of the short side 97B is at least 40 μm or more. In a step of manufacturing the chip part 1001, circuit elements formed at the element region 5 are subjected to probing (electrical test). The flat portion 97 of the dimension makes it possible to effectively suppress or prevent a probe 70*a* (more specifically, a portion other than the leading end portion of the probe 70*a*, refer to FIG. 78D) from coming into contact with a raised portion 96 of the first connection electrode 3.

The raised-portion forming portions 98 are formed so as to surround the flat portion 97. In the raised-portion forming portion 98, the plurality of raised portions 96 are formed in such a pattern that they are aligned, at a fixed interval, in a matrix form in a row direction and in a column direction which are orthogonal to each other. It is preferable that each of the raised portions 96 is formed, for example, in a rectangular shape in a plan view and the dimensions thereof (area in a plan view) are, for example, 5 μm×5 μm to 20 μm×20 μm. As a matter of course, each of the raised portions 96 shall not be limited to a rectangular shape in a plan view but may be changed in its shape whenever necessary, within the range of the area.

A circuit element is formed in the element region 5. The circuit element is formed in a region between the first connection electrode 3 and the second connection electrode 4 on the element forming surface 2A of the substrate 2 and covered from above by the passivation film 23 and the resin film 24.

FIG. 68 is a plan view of the chip part 1001 shown in FIG. 67. This view shows a positional relationship between the first connection electrode 3, the second connection electrode 4 and the circuit element (the resistor portion 56) and an arrangement of the circuit element (the resistor portion 56) in a plan view.

With reference to FIG. 68, in the present reference example, as a circuit element, the resistor portion 56 is formed. The resistor portion 56 is constituted by a resistor circuit network in which a plurality of (unit) resistor bodies R, each equal in resistance value, are aligned in a matrix form on the element forming surface 2A. The resistor body R is made of TiN (titanium nitride), TiON (titanium oxide nitride) or TiSiON. The resistor portion 56 is electrically connected to a wiring film 22 to be described later and electrically connected via the wiring film 22 to the first connection electrode 3 and the second connection electrode 4. That is, the resistor portion 56 is formed on the substrate 2 and connected between the first connection electrode 3 and the second connection electrode 4.

More specifically, the resistor portion 56 is provided with a total of 352 resistor bodies R made up of 8 resistor bodies R aligned along the row direction (in the long direction of the substrate 2) and 44 resistor bodies R aligned along the column direction (in the width direction of the substrate 2). These resistor bodies R are the plurality of element components which constitute the resistor circuit network of the resistor portion 56.

The plurality of resistor bodies R are electrically connected in groups of predetermined numbers of 1 to 64 each to form a plurality of types of resistor circuits. The plurality of types of resistor circuits thus formed are connected in a predetermined mode by conductor films E (wiring films formed of a conductor). Further, on the element forming surface 2A of the substrate 2, a plurality of fuses F are provided that can be cut (fused) to electrically incorporate resistor circuits into the resistor portion 56 or electrically separate the resistor circuits from the resistor portion 56. The plurality of fuses F and the conductor films E are aligned along the inner side of the first connection electrode 3 so that the positioning regions thereof are rectilinear. More specifically, the plurality of fuses F and the conductor films E are disposed adjacently and the direction of alignment thereof is rectilinear. The plurality of fuses F connect each of the plurality of types of resistor circuits (the plurality of resistor bodies R for each resistor circuit) to the first connection electrode 3 so as to enable cutting (enabling disconnection).

FIG. 69A is a partially enlarged plan view of the resistor portion 56 in FIG. 68. FIG. 69B is a sectional view taken along section line LXIXb-LXIXb in FIG. 69A. FIG. 69C is a sectional view taken along section line LXIXc-LXIXc in FIG. 69A.

The chip part 1001 includes an insulating film 20 and a resistor body film 21 (refer to FIG. 69B and FIG. 69C) in addition to the wiring film 22, the passivation film 23 and the resin film 24. The insulating film 20, the resistor body film 21, the wiring film 22, the passivation film 23 and the resin film 24 are formed on the substrate 2 (element forming surface 2A).

The insulating film 20 includes an insulating material made of, for example, $SiO_2$ (silicon oxide). The insulating film 20 covers the entirety of the element forming surface 2A of the substrate 2. In the present reference example, a description will be given of an example that a single-layered insulating film 20 is formed. However, a multiple-layered insulating film may be formed.

The resistor body film 21 is formed on the insulating film 20. The resistor body film 21 is formed of TiN, TiON or TiSiON. The thickness of the resistor body film 21 is, for example, approximately 2000 Å. The resistor body film 21 constitutes a plurality of resistor body films (hereinafter, referred to as "resistor body film lines 21A") extending parallel and rectilinearly between the first connection electrode 3 and the second connection electrode 4. And, there are cases where a resistor body film line 21A is cut at predetermined positions in the line direction (refer to FIG. 69A).

The wiring film 22 is laminated on the resistor body film line 21A. The wiring film 22 is made of Al (aluminum) or an alloy (AlCu alloy) of aluminum and Cu (copper). The thickness of the wiring film 22 is approximately 8000 Å. The wiring films 22 are laminated on the resistor body film line 21A at fixed intervals in the line direction and in contact with the resistor body film lines 21A.

Next, with reference to FIG. 70A to FIG. 71, a detailed description will be given of an arrangement of the flat portion 97 formed each in the first connection electrode 3 and the second connection electrode 4 of the chip part 1001 and an arrangement of the raised-portion forming portion 98 (raised portions 96).

FIG. 70A(a) is a partially enlarged plan view of the first connection electrode 3 shown in FIG. 68 (a region in which the flat portion 97 is formed), and FIG. 70A(b) is a sectional view taken along section line LXXA-LXXA in FIG. 70A(a). FIG. 70B(a) is a partially enlarged plan view of the first connection electrode 3 (the raised-portion forming portion 98) shown in FIG. 68, and FIG. 70B(b) is a sectional view taken along section line LXXB-LXXB in FIG. 70B(a). In FIG. 70A and FIG. 70B, the region in which the second connection electrode 4 is formed is similar in arrangement to the region in which the first connection electrode 3 is formed and, therefore, an illustration thereof is omitted.

As shown in FIG. 70A(b) and FIG. 70B(b), in the region at which the first connection electrode 3 is formed, as described previously, the insulating film 20, the resistor body film 21 and the wiring film 22 are formed on the substrate 2 in that order. On a front surface of the wiring film 22, a pattern PT which selectively exposes the front surface of the wiring film 22 is formed.

The pattern PT is an insulation pattern, and, in the present reference example, includes the resin film 24 and the passivation film 23 interposed between the wiring film 22 and the resin film 24. The resin film 24 contains polyimide (photosensitive polyimide), and the passivation film 23 contains SiN (silicon nitride). The pattern PT is formed in a substantially circular-arc shape which smoothly connects a top portion formed on a front surface of the resin film 24 with a bottom portion composed of both ends of the passivation film 23 in a sectional view of each of FIG. 70A(b) and FIG. 70B(b).

The pattern PT is provided with a first opening 22B which exposes the front surface of the wiring film 22 at a relatively wide area and a plurality of second openings 22C which expose the front surface of the wiring film 22 at an area narrower than the first opening 22B.

The first opening 22B is formed in a region directly below the region at which the flat portion 97 of the first connection electrode 3 has been formed. More specifically, as shown in FIG. 70A(a), (b), the first opening 22B is formed along the regions directly below the long side 97A and the short side 97B of the flat portion 97 so as to be similar in shape to the flat portion 97. The length of a side of the first opening 22B corresponding to the long side 97A of the flat portion 97 is at least 60 μm or more, and the length of a side thereof corresponding to the short side 97B of the flat portion 97 is at least 40 μm or more.

On the other hand, as shown in FIG. 70B(a), (b), directly below the region at which a plurality of raised portions 96 are formed, the plurality of second openings 22C are formed so as to be exposed at fixed intervals in a matrix form in a row direction and in a column direction at which the front surfaces of the wiring films 22 are orthogonal to each other. The plurality of second openings 22C are formed so as to be similar in shape to the plurality of raised portions 96. A width W41 of the second opening 22C in the column direction is, for example, from 5 μm to 20 μm, and a width W42 of the second opening 22C in the row direction is, for example, from 5 μm to 20 μm. A width W43 between mutually adjacent second openings 22C in the column direction is, for example, from 5 μm to 10 μm, and a width W44 between mutually adjacent second openings 22C in the row direction is, for example, from 5 μm to 10 μm.

An uneven pad region 22A is formed by the pattern PT in which the first opening 22B and the second openings 22C are formed. The first connection electrode 3 is formed on the uneven pad region 22A so as to be electrically connected to the wiring films 22 by refilling the first opening 22B and the second openings 22C. The first connection electrode 3 has a laminated structure made up of an Ni layer 33, a Pd layer 34 and an Au layer 35.

As shown in FIG. 70A(b) and FIG. 70B(b), the first connection electrode 3 includes a thin film portion 16 formed so as to be recessed toward the thickness direction and a thick film portion 17 formed thick so as to be positioned further above the thin film portion 16. The thin film portion 16 is formed in a region directly above the pattern PT, and the thick film portion 17 is formed in a region above the wiring film 22 which is exposed from the pattern PT.

As shown in FIG. 70A(a) and (b), the flat portion 97 formed on the front surface of the first connection electrode 3 is composed of the thin film portion 16 and the thick film portion 17 of the first connection electrode 3. That is, on the front surface of the first connection electrode 3 formed so as to refill the first opening 22B, the front surface of the thick film portion 17 is formed so as to be parallel with the front surface of the wiring film 22 (the front surface of the substrate 2), thereby forming the flat portion 97. Then, the thin film portions 16 are formed so as to enclose the peripheries of the flat portion 97 (thick film portion 17), thereby defining the flat portion 97 and the raised-portion forming portion 98.

On the other hand, as shown in FIG. 70B(a), (b), the plurality of raised portions 96 formed on the front surface of the first connection electrode 3 are also made up of the thin film portion 16 and the thick film portion 17 of the first connection electrode 3. That is, on the front surface of the first connection electrode 3 formed so as to refill the second openings 22C, a substantially arc-shaped front surface in a sectional view in which the thin film portion 16 is given as a bottom portion and the thick film portion 17 is given as a top portion is formed, thereby forming the plurality of raised portions 96. The thin film portion 16 is formed in a net-like form so as to define the thick film portion 17 in a matrix form in the raised-portion forming portion 98, thereby providing a common thin film portion (bottom portion) in relation to each of the raised portions 96 mutually adjacent in the row direction and in the column direction.

The plurality of raised portions 96 formed on the first connection electrode 3 and the second connection electrode 4 may be arranged as shown in FIG. 71 in place of the arrangement shown in FIG. 70B. FIG. 71 is a partially enlarged plan view of a modification example of the first connection electrode 3 shown in FIG. 70B. In FIG. 71, the region at which the second connection electrode 4 has been formed is similar in arrangement to the region at which the first connection electrode 3 has been formed, with an illustration thereof omitted here.

The arrangement shown in FIG. 71 is different from the arrangement shown in FIG. 70B in that a plurality of raised portions 96, each of which includes a pattern in a raised-portion forming portion 98 in which the raised portions 96 are aligned in a staggered manner in a row direction and in a column direction which are orthogonal to each other, while deviating at their positions every other column in the row direction, are formed.

As shown in FIG. 70B(a) and (b), where the plurality of raised portions 96 are aligned in a matrix form in the raised-portion forming portion 98, a cross-shaped crossing portion Cr is formed between the second openings 22C which are mutually adjacent in a diagonal direction. A width W45 of the crossing portion Cr in the diagonal direction is formed so as to be wider than the width W43 and the width W44 between the second openings 22C which are mutually adjacent in the row direction and in the column direction.

The first connection electrode 3 is formed by being plate-deposited on the wiring film 22 so as to refill the first opening 22B and the second openings 22C (refer to FIG. 80). Plate-deposited electrode materials (that is, the Ni layer 33) move in the lateral direction from the mutually adjacent second openings 22C and overlap each other, thereby forming the thin film portion 16 on the crossing portion Cr. Thus, there is a time lag between a thin film portion 16 formed on the crossing portion Cr which is relatively wide and a thin film portion 16 formed at a relatively narrow portion other than the crossing portion Cr. As a result, depending on conditions of plate deposition (for example, speed, time and others of the plate deposition), the mutually adjacent electrode materials overlap each other on the relatively narrow portion other than the crossing portion Cr, while mutually adjacent electrode materials may not sufficiently overlap each other on the crossing portion Cr. Thus, there are possibilities that the thin film portion 16 formed on the crossing portion Cr may be formed closer to the front surface of the pattern PT (resin film 24) than other portions and the front surface of the pattern PT may be exposed from the first connection electrode 3.

Therefore, as shown in FIG. 71, a pattern PT having the second openings 22C is formed selectively in such a manner that the plurality of raised portions 96 are aligned in a staggered manner, thus making it possible to change the crossing portion Cr from a cross shape to a T-letter shape. That is, the number of the second openings 22C adjacent to the crossing portion Cr can be reduced from four to three, by which a distance between three second openings 22C mutually adjacent at the crossing portion Cr is made to coincide with the width W41 in the row direction and the width W42 in the column direction. Thereby, a time lag between the thin film portion 16 formed at the crossing portion Cr and the thin film portion 16 formed at the other portions can be removed. As a result, it is possible to prevent the thin film portion 16 formed at the crossing portion Cr from being formed closer to the front surface of the pattern PT than the thin film portion 16 formed at the other portions.

Where electrical features of the thus arranged resistor body film line 21A and wiring film 22 are shown by using circuit symbols, they are expressed as shown in FIGS. 72A-72C. That is, as shown in FIG. 72A, each of the resistor body film lines 21A in a region having a predetermined interval R constitutes a single resistor body R with a fixed resistance value r.

Then, in a region laminated by the wiring film 22, mutually adjacent resistor bodies R are electrically connected by the wiring film 22, and the resistor body film line 21A is short-circuited by the wiring film 22. Thereby, a resistor circuit which is serially connected by the resistor bodies R, each of which has a resistance value r shown in FIG. 72B, is formed.

Further, the mutually adjacent resistor body film lines 21A are connected by the resistor body film 21 and the wiring film 22 and, therefore, the resistor circuit network of the resistor portion 56 shown in FIG. 69A constitutes the resistor circuit shown in FIG. 72C (made up of the unit resistor portions of the previously described resistor bodies R). As described above, the resistor body film 21 and the wiring film 22 constitute the resistor bodies R and the resistor circuit (that is, the resistor portion 56). Then, each of the resistor bodies R includes the resistor body film line 21A (the resistor body film 21) and the plurality of wiring films 22 laminated on the resistor body film line 21A in the line direction at fixed intervals. The resistor body film line 21A in a portion of fixed intervals R which is not laminated by the wiring film 22 constitutes a single resistor body R. The resistor body film lines 21A in a portion which constitutes the resistor body R are all equal in shape and dimension. Accordingly, each of the plurality of resistor bodies R which are aligned on the substrate 2 in a matrix form is equal in resistance value.

Further, the wiring film 22 laminated on the resistor body film line 21A not only forms the resistor body R but also functions as a conductor film E for connecting the plurality of resistor bodies R to constitute a resistor circuit (refer to FIG. 68).

FIG. 73(*a*) is a partially enlarged plan view of a region including the fuse F drawn by enlarging a portion of the plan view of the chip part 1001 shown in FIG. 68. FIG. 73(*b*) is a sectional view taken along section line LXXIIIb-LXXIIIb in FIG. 73(*a*).

As shown in FIGS. 73(*a*) and (*b*), the fuses F and the conductor films E are also formed by the wiring films 22 which are laminated on the resistor body film 21 that forms the resistor bodies R. That is, the fuses F and the conductor films E are formed of Al or an AlCu alloy, which is the same metal material as that of the wiring films 22 on the same layer as the wiring films 22, which are laminated on the resistor body film lines 21A that form the resistor bodies R. As mentioned above, the wiring films 22 are also used as the conductor films E for electrically connecting a plural number of the resistor bodies R to constitute a resistor circuit.

That is, at the same layer laminated on the resistor body film 21, the wiring films for forming the resistor bodies R as well as the wiring films for connecting the fuses F, the conductor films E and the resistor portion 56 to the first connection electrode 3 and the second connection electrode 4 are formed as the wiring films 22 using the same metal material (Al or an AlCu alloy). The fuses F differ (are distinguished) from the wiring films 22 because the fuses F are made narrowly to enable easy cutting and also the fuses F are disposed so that other circuit components are not present in the peripheries thereof.

Here, a region of the wiring films 22 in which the fuses F are disposed shall be referred to as a trimming region X (refer to FIG. 68 and FIG. 73(*a*)). The trimming region X is a rectilinear region along the inner side of the first connection electrode 3, and not only the fuses F but also the conductor films E are disposed in the trimming region X. Also, the resistor body film 21 is formed below the wiring films 22 in the trimming region X (refer to FIG. 73(*b*)). Then, the fuses F are wirings that are greater in interwiring distance (further separated from the peripheries) than portions of the wiring films 22 other than the trimming region X.

The fuse F may refer not only to a portion of the wiring films 22 but may also refer to an assembly (fuse element) of a portion of the resistor body R (resistor body film 21) and a portion of the wiring film 22 on the resistor body film 21.

Also, although only a case where the same layer is used for the fuses F as that used in the conductor films E has been described, the conductor films E may have another conductor film laminated further thereon to decrease an overall resistance value of the conductor films E. Even in this case, the fusing property of the fuses F is not degraded as long as a conductor film is not laminated on the fuses F.

FIG. 74 is an electric circuit diagram which is arranged by the resistor body film line 21A and the wiring film 22.

Referring to FIG. 74, the resistor portion 56 is arranged by serially connecting a reference resistor circuit R8, a resistor circuit R64, two resistor circuits R32, a resistor circuit R16, a resistor circuit R8, a resistor circuit R4, a resistor circuit R2, a resistor circuit R1, a resistor circuit R/2, a resistor circuit R/4, a resistor circuit R/8 and a resistor circuit R/16 and a resistor circuit R/32 in that order from the first connection electrode 3. The reference resistor circuit R8 and each of the resistor circuits R64 to R2 are constituted by serially connecting the same number of resistor bodies R as the number at the end of its symbol ("64" in the case of R64). The resistor circuit R1 is constituted by a single resistor body R. Each of the resistor circuits R/2 to R/32 is constituted by connecting in parallel the same number of the resistor bodies R as the number at the end of its symbol ("32" in the case of R/32). The meaning of the number at the end of the symbol of the resistor circuit is the same in FIG. 75 and FIG. 76 to be described below.

One fuse F is connected in parallel to each of the resistor circuits R64 to the resistor circuit R/32 other than the reference resistor circuit R8. The fuses F are mutually connected in series directly or via the conductor films E (refer to FIG. 73(*a*)).

In a state that none of the fuses F is fused as shown in FIG. 74, the resistor portion 56 constitutes a resistor circuit of the reference resistor circuit R8 formed by the serial connection of the 8 resistor bodies R provided between the first connection electrode 3 and the second connection electrode 4. For example, if the resistance value r of a single resistor body R is given as r=8Ω, the chip part 1001 is arranged by the first connection electrode 3 and the second connection electrode 4 being connected by the resistor circuit (reference resistor circuit T8) of 8r=64Ω.

Also, in the state that none of the fuses F is fused, the plurality of types of resistor circuits other than the reference resistor circuit R8 are put in short-circuited states. That is, although 12 types of 13 resistor circuits R64 to R/32 are connected in series to the reference resistor circuit R8, each resistor circuit is short-circuited by the fuses F that are connected in parallel, and thus electrically, the individual resistor circuits are not incorporated into the resistor portion 56.

In the chip part 1001 of the present reference example, a fuse F is selectively fused, for example, by laser light in accordance with the required resistance value. The resistor circuit with which the fuse F connected in parallel is fused is thereby incorporated into the resistor portion 56. The overall resistance value of the resistor portion 56 can thus be set to be a resistance value resulting from serially connected and incorporated resistor circuits that correspond to the fused fuses F.

In particular, the plurality of types of resistor circuits include the plurality of types of serial resistor circuits to which the resistor bodies R having an equal resistance value are connected in series, with the number of resistor bodies R being increased in geometric progression with a common ratio of 2 as 1, 2, 4, 8, 16, 32, . . . and the plurality of types of parallel resistor circuits to which the resistor bodies R having an equal resistance value are connected in parallel, with the number of resistor bodies R being increased in geometric progression with a common ratio of 2 as 2, 4, 8, 16, . . . . Therefore, by selectively fusing the fuses F (including the previously described fuse elements), the overall resistance value of the resistor portion 56 can be adjusted finely and digitally to be an arbitrary resistance value, thereby a resistor portion with a desired value can be generated in the chip part 1001.

FIG. 75 is another electric circuit diagram which is arranged by the resistor body film line 21A and the wiring films 22.

Instead of arranging the resistor portion 56 by serially connecting the reference resistor circuit R8 and the resistor circuit R64 to the resistor circuit R/32 as shown in FIG. 74, the resistor portion 56 may be arranged as shown in FIG. 75. Specifically, the resistor portion 56 may be arranged, between the first connection electrode 3 and the second connection electrode 4, as a serial connection circuit of the reference resistor circuit R/16 with the parallel connection circuit of 12 types of resistor circuits R/16, R/8, R/4, R/2, R1, R2, R4, R8, R16, R32, R64, and R128.

In this case, a fuse F is serially connected to each of the 12 types of resistor circuits other than the reference resistor circuit R/16. In a state that none of the fuses F is fused, each of the resistor circuits is electrically incorporated in the resistor portion 56. By selectively fusing a fuse F, for example, by using laser light in accordance with the required resistance value, the resistor circuit corresponding to the fused fuse F (the resistor circuit connected in series to the fuse F) is electrically separated from the resistor portion 56 and the overall resistance value of the chip part 1001 can thereby be adjusted.

FIG. 76 is still another electric circuit diagram which is arranged by the resistor body film lines 21A and the wiring films 22.

A feature of the resistor portion 56 shown in FIG. 76 is that it has the circuit arrangement where a serial connection of a plurality of types of resistor circuits and a parallel connection of a plurality of types of resistor circuits are connected in series. As in the previous reference example, with the plurality of types of resistor circuits connected in series, a fuse F is connected in parallel to each resistor circuit and all of the plurality of types of resistor circuits that are connected in series are put in short-circuited states by the fuses F. Therefore, when a fuse F is fused, the resistor circuit which has been short-circuited by the fused fuse F is electrically incorporated in the resistor portion 56.

On the other hand, a fuse F is connected in series to each of the plurality of types of resistor circuits that are connected in parallel. Therefore, by fusing a fuse F, the resistor circuit connected in series to the fused fuse F can be electrically disconnected from the parallel connection of the resistor circuits.

With this arrangement, for example, by forming a low resistor portion of 1 kΩ or less at the parallel connection side and forming a resistor circuit of 1 kΩ or more at the serial connection side, resistor circuits of a wide range from a low resistor portion of several Ω to a high resistor portion of several MΩ can be formed using the resistor circuit networks arranged by the same basic design. That is, with the chip part 1001, a plurality of types of resistance values can be accommodated easily and rapidly by selecting and cutting one or the plurality of fuses F. In other words, the chip parts 1001 of various resistance values can be realized with a common design by combining a plurality of resistor bodies R that differ in resistance value.

With the chip part 1001, the connection states of the plurality of resistor bodies R (resistor circuits) in the trimming region X can be changed as described above.

Next, with reference to FIG. 77, a more detailed description will be given of the chip part 1001.

FIG. 77 is a schematic sectional view of the chip part 1001. For the sake of description, in FIG. 77, the resistor portion 56 as well as the raised portion 96 and the flat portion 97 formed in the first connection electrode 3 and the second connection electrode 4 are illustrated for the arrangement thereof in a simplified form, and hatching is also applied to individual components other than the substrate 2.

Here, a description will be given of the passivation film 23 and the resin film 24.

The passivation film 23 is formed on the wiring film 22 as a pattern PT in the arrangement described in FIG. 70A to FIG. 71 and also provided substantially across the respective entireties of the element forming surface 2A and the side surfaces 2C to 2E. The passivation film 23 is, for example, from 1 μm to 2 μm in thickness.

The passivation film 23 on the element forming surface 2A covers the resistor body film 21 and the respective wiring films 22 (that is, the resistor portion 56) on the resistor body film 21 from the front surface (the upper side in FIG. 77) and covers the upper surface of each of the resistor bodies R in the resistor portion 56. The passivation film 23 thus covers the wiring films 22 in the previously described trimming region X as well (refer to FIG. 73(*b*)). Further, the passivation film 23 is in contact with the resistor portion 56 (the wiring film 22 and the resistor body film 21) and also in contact with the insulating film 20 in a region other than the resistor body film 21. The passivation film 23 on the element forming surface 2A also functions as a protective film that covers the entirety of the element forming surface 2A to protect the resistor portion 56 and the insulating film 20. Also, at the element forming surface 2A, the passivation film 23 prevents short-circuiting across the resistor bodies R (short-circuiting across adjacent resistor body film lines 21A) at portions other than the wiring films 22.

On the other hand, the passivation film 23 provided on each of the side surfaces 2C to 2E is interposed between the side surface portions of the first connection electrode 3 and the second connection electrode 4 and the side surfaces 2C to 2E of the substrate 2, thereby functioning as a protective layer that protects each of the side surfaces 2C to 2E. A requirement for avoiding short-circuiting of the substrate 2 and the first connection electrode 3 or the second connection electrode 4 can thereby be met. The passivation film 23 is an extremely thin film and, therefore, in the present reference example, the passivation film 23 covering each of the side surfaces 2C to 2E is regarded to be a portion of the substrate 2. The passivation film 23 covering each of the side surfaces 2C to 2E is considered to be each of the side surfaces 2C to 2E itself.

The resin film 24 is formed on the wiring film 22 as a pattern PT for forming the raised portions 96 on the front surfaces of the first connection electrode 3 and the second connection electrode 4 and the resin film 24 also protects the element forming surface 2A of the chip part 1001, together with the passivation film 23. The resin film 24 is, for example, from 3 μm to 10 μm in thickness.

The resin film 24 covers the entirety of the front surface of the passivation film 23 on the element forming surface 2A (including the resistor body film 21 and the wiring film 22 covered by the passivation film 23).

In the resin film 24, notched portions 25 are formed one each to expose peripheral edge portions of the wiring films 22 that face the side surface portions of the first connection electrode 3 and the second connection electrode 4. Each of the notched portions 25 penetrates continuously through each of the resin film 24 and the passivation film 23 in the thickness direction. The notched portions 25 are thus formed not only in the resin film 24 but also in the passivation film 23. Thereby, with each wiring film 22, an inner peripheral edge portion close to the resistor portion 56 is selectively covered by the resin film 24, and the other peripheral edge portion along the peripheral edge portion 85 of the substrate 2 is selectively exposed via the notched portion 25.

The front surfaces of the wiring films 22 exposed at the first opening 22B and the second openings 22C as well as the individual notched portions 25 are uneven pad regions 22A for external connection. Also, on the element forming surface 2A, the wiring film 22 exposed from the notched portion 25 is disposed inwardly away from the peripheral edge portion 85 of the substrate 2, at a predetermined interval (for example, 3 μm to 6 μm). Also, an insulating film 26 is formed on an entirety of a side surface of each notched portion 25 from one short side 82 of the chip part 1001 to the other short side 82.

Of the two notched portions 25, one notched portion 25 is completely filled by the first connection electrode 3, and the other notched portion 25 is completely filled by the second connection electrode 4. As mentioned above, the first connection electrode 3 and the second connection electrode 4 are formed to cover the side surfaces 2C to 2E, in addition to the element forming surface 2A. Also, each of the first connection electrode 3 and the second connection electrode 4 is formed so as to project from the resin film 24 and has a lead-out portion 27 that leads out to an inner side (resistor portion 56 side) of the substrate 2 along the front surface of the resin film 24.

Here, each of the first connection electrode 3 and the second connection electrode 4 has an Ni layer 33, a Pd layer 34 and an Au layer 35 in that order from the element forming surface 2A side and the side surface 2C to 2E sides. That is, each of the first connection electrode 3 and the second connection electrode 4 has a laminated structure constituted of the Ni layer 33, the Pd layer 34 and the Au layer 35 not only in a region above the element forming surface 2A but also in regions above the side surfaces 2C to 2E. Therefore, in each of the first connection electrode 3 and the second connection electrode 4, the Pd layer 34 is interposed between the Ni layer 33 and the Au layer 35. In each of the first connection electrode 3 and the second connection electrode 4, the Ni layer 33 takes up most of each connection electrode, and the Pd layer 34 and the Au layer 35 are formed significantly thinner than the Ni layer 33. The Ni layer 33 serves the role of relaying between Al of the wiring film 22 at the pad region 22A in each notched portion 25 and the solder when the chip part 1001 is mounted on the mounting substrate.

As described above, with the first connection electrode 3 and the second connection electrode 4, a front surface of the Ni layer 33 is covered by the Au layer 35, and the Ni layer 33 can thus be prevented from becoming oxidized. Also, with the first connection electrode 3 and the second connection electrode 4, even if a penetrating hole (pinhole) is formed on the Au layer 35 due to thinning of the Au layer 35, the Pd layer 34 interposed between the Ni layer 33 and the Au layer 35 closes the penetrating hole, and the Ni layer 33 can thus be prevented from being exposed to the exterior through the penetrating hole and becoming oxidized.

With each of the first connection electrode 3 and the second connection electrode 4, the Au layer 35 is exposed on the frontmost surface. The first connection electrode 3 is electrically connected, via one notched portion 25, to the wiring film 22 at the pad region 22A in the notched portion 25. The second connection electrode 4 is electrically connected, via the other notched portion 25, to the wiring film 22 at the pad region 22A in the notched portion 25. With each of the first connection electrode 3 and the second connection electrode 4, the Ni layer 33 is connected to the pad region 22A. Each of the first connection electrode 3 and the second connection electrode 4 is thereby electrically connected to the resistor portion 56. Here, the wiring films 22 form wirings that are connected individually to an assembly of the resistor bodies R (resistor portion 56), the first connection electrode 3 and the second connection electrode 4.

The resin film 24 and the passivation film 23 in which the notched portions 25 have been formed thus cover the element forming surface 2A in a state that the first connection electrode 3 and the second connection electrode 4 are exposed through the notched portions 25. Electrical connection between the chip part 1001 and the mounting substrate can thus be achieved via the first connection electrode 3 and the second connection electrode 4 that protrude (project) from the notched portions 25 on the front surface of the resin film 24.

Next, with reference to FIG. 78A to FIG. 86, a detailed description will be given of a method for manufacturing the chip part 1001 and a step of mounting the chip part 1001 on the mounting substrate 9.

Each of FIG. 78A to FIG. 78I is an illustrative sectional view which shows the method for manufacturing the chip part 1001 shown in FIG. 67.

First, as shown in FIG. 78A, a substrate 30, which is a base of the substrate 2, is prepared. Here, a front surface 30A of the substrate 30 is the element forming surface 2A of the substrate 2, and a rear surface 30B of the substrate 30 is the rear surface 2B of the substrate 2.

Then, the front surface 30A of the substrate 30 is thermally oxidized to form an insulating film 20 made of $SiO_2$, etc., on the front surface 30A. Next, the resistor portion 56 (the resistor bodies R and the wiring films 22 connected to the resistor bodies R) is formed on the insulating film 20. Specifically, first, the resistor body film 21 of TiN, TiON or TiSiON is formed by sputtering on the entire surface of the insulating film 20 and, further, the wiring film 22 of aluminum (Al) is laminated on the resistor body film 21 so as to be in contact with the resistor body film 21. Thereafter, a photolithography process is used and, for example, RIE (reactive ion etching) or the other form of dry etching is performed to selectively remove and pattern the resistor body film 21 and the wiring film 22, thereby obtaining an arrangement where, as shown in FIG. 69A, the resistor body film lines 21A of fixed width at which the resistor body film 21 is laminated are aligned at fixed intervals in the column direction in a plan view.

In this process, regions in which the resistor body film lines 21A and the wiring film 22 have been cut at portions are also formed, and the fuses F and the conductor films E are formed in the trimming region X (refer to FIG. 68). The wiring film 22 laminated on the resistor body film lines 21A, for example, by wet etching is selectively removed. As a result, the resistor portion 56 with such an arrangement that the wiring film 22 is laminated on the resistor body film line 21A at the fixed intervals R can be obtained. In this process, a resistance value of the entirety of the resistor portion 56 may be measured to determine whether or not the resistor body film 21 and the wiring film 22 have been formed to targeted dimensions.

With reference to FIG. 78A, the resistor portions 56 are formed at multiple locations on the front surface 30A of the substrate 30 in accordance with the number of chip parts 1001 formed on the single substrate 30. If a single region of the substrate 30 in which a resistor portion 56 (the above mentioned resistor portion 56) is referred to as a chip part region Y, the plurality of chip part regions Y (that is, the resistor portions 56), each having the resistor portion 56, are formed (set) on the front surface 30A of the substrate 30. A single chip part region Y coincides with a single completed chip part 1001 (refer to FIG. 77) in a plan view. On the front surface 30A of the substrate 30, a region between adjacent chip part regions Y is referred to as a boundary region Z. The boundary region Z has a band shape and extends in a lattice in a plan view. A single chip part region Y is disposed in a single lattice defined by the boundary region Z. The boundary region Z is from 1 μm to 60 μm (for example, 20 μm) in width and extremely narrow and, therefore, a large number of the chip part regions Y can be secured on the substrate 30 to consequently enable mass production of the chip parts 1001.

Next, as shown in FIG. 78A, an insulating film 45 made of SiN is formed on the entirety of the front surface 30A of the substrate 30 by a CVD (chemical vapor deposition)

method. The insulating film 45 covers the respective entireties of the insulating film 20 and the resistor portion 56 (the resistor body film 21 and the wiring film 22) on the insulating film 20 and are in contact therewith. The insulating film 45 thus also covers the wiring films 22 in the trimming region X (refer to FIG. 68). Further, the insulating film 45 is formed across the entirety of the front surface 30A of the substrate 30 and is thus formed to extend to regions other than the trimming region X on the front surface 30A. The insulating film 45 is thus a protective film that protects the entirety of the front surface 30A (including the resistor portion 56 on the front surface 30A).

Next, as shown in FIG. 78B, a liquid of a photosensitive resin made of polyimide is spray-coated on the substrate 30 over the insulating film 45 to form a resin film 46 made of the photosensitive resin. The front surface of the resin film 46 on the front surface 30A is flat along the front surface 30A. Next, the resin film 46 is subjected to heat treatment (curing). Thereby, the thickness of the resin film 46 undergoes thermal contraction and the resin film 46 is cured, thereby making the film quality stable.

Next, as shown in FIG. 78C, the resin film 46, the insulating film 45 and the insulating film 20 are patterned to selectively remove the portions coinciding with the first opening 22B and the second openings 22C of these films and the portions coinciding with the notched portions 25.

More specifically, the resin film 46, the insulating film 45 and the insulating film 20 are patterned in such a pattern that the flat portion 97 and the raised-portion forming portion 98 are formed on the front surface of each of the first connection electrode 3 and the second connection electrode 4. In a region in which the flat portion 97 is formed, the first opening 22B which exposes the front surface of the wiring film 22 in an area wider than that of the second opening 22C is formed on the wiring film 22.

As shown in FIG. 70B, where the raised portions 96 are formed in a matrix form at the raised-portion forming portion 98 of each of the first connection electrode 3 and the second connection electrode 4, the resin film 46, the insulating film 45 and the insulating film 20 are patterned in such a pattern that on the wiring film 22, the plurality of second openings 22C are aligned at fixed intervals in a matrix form in the row direction and in the column direction which are orthogonal to each other.

Further, as shown in FIG. 71, where the raised portions 96 are formed in a staggered manner at the raised-portion forming portion 98 of each of the first connection electrode 3 and the second connection electrode 4, the resin film 46, the insulating film 45 and the insulating film 20 are patterned on the wiring film 22 in such a pattern that the plurality of second openings 22C are aligned in a staggered manner in the row direction and in the column direction which are orthogonal to each other, while deviating at their positions every other column in the row direction.

As described above, the resin film 24 and the insulating film 45 (passivation film 23), each of which has a predetermined pattern PT, are formed on the wiring films 22 (refer to FIG. 70A to FIG. 71) and the notched portions 25 are also formed. In this process, the resin film 24 and the insulating film 45 (passivation film 23) are exposed to light and melted. And, they are, as shown in FIG. 70A to FIG. 71, formed in an arc shape in a sectional view. At the same time, the front surface 30A (insulating film 20) is to be exposed in the boundary region Z.

Next, as shown in FIG. 78D, a probe 70*a* of a resistance measuring device (not shown) is brought into contact with the pad region 22A (the first opening 22B, refer to FIG. 70A(a)) to detect an overall resistance value of the resistor portion 56. Laser light (not shown) is then irradiated onto an arbitrary fuse F (refer to FIG. 68) via the insulating film 45 to trim the wiring film 22 in the previously described trimming region X by the laser light, thereby fusing the fuse F. By thus fusing the fuse F (trimming) so as to attain a required resistance value, as described above, the overall resistance value of the semi-finished product 50 (in other words, the chip part 1001) can be adjusted.

In this process, the first opening 22B is formed on the wiring film 22. Therefore, it is possible to effectively suppress contact of the pattern PT formed on the wiring film 22 with the probe 70*a* (specifically, portions other than the leading end portion of the probe 70*a*). Thus, the overall resistance value of the resistor portion 56 can be detected satisfactorily.

Also, the insulating film 45 serves as a cover film that covers the resistor portion 56, thus making it possible to prevent a short-circuit caused by attachment of a fragment, etc., to the resistor portion 56 in the fusing process. Further, the insulating film 45 covers the fuse F (resistor body film 21) and, therefore, the energy of the laser light can be accumulated in the fuse F to reliably fuse the fuses F.

Next, as shown in FIG. 78E, a resist pattern 41 is formed across the entirety of the front surface 30A of the substrate 30. The resist pattern 41 is provided with an opening 42.

FIG. 79 is a schematic plan view which shows a portion of the resist pattern 41 that is used for forming the groove 44 in the step of FIG. 78E.

With reference to FIG. 79, the opening 42 of the resist pattern 41 coincides with (corresponds to) a region (a hatched portion in FIG. 79, in other words, the boundary region Z) between outlines of mutually adjacent chip parts 1001 in a plan view in a case where multiple chip parts 1001 (in other words, the previously described chip part region Y) are disposed in a matrix form (that is also a lattice). The overall shape of the opening 42 is thus a lattice which has a plurality of mutually orthogonal rectilinear portions 42A and 42B.

In the resist pattern 41, the mutually orthogonal rectilinear portions 42A and 42B in the opening 42 are connected, while being maintained in a mutually orthogonal state (without curving). Intersection portions 43 of the rectilinear portions 42A and 42B are thus pointed so as to give substantially 90° in a plan view.

Referring to FIG. 78E, the substrate 30 is selectively removed by plasma etching using the resist pattern 41 as a mask. The material of the substrate 30 is thereby removed at positions across intervals from the wiring films 22 in the boundary region Z between mutually adjacent resistor portions 56 (chip part regions Y). As a result, a groove 44 having a predetermined depth reaching a middle portion of the thickness of the substrate 30 from the front surface 30A of the substrate 30 is formed at a position (the boundary region Z) coinciding with the opening 42 of the resist pattern 41 in a plan view. The groove 44 is defined by a pair of mutually facing side walls 44A and a bottom wall 44B joining the lower ends (ends at the rear surface 30B side of the substrate 30) of the pair of side walls 44A. The depth of the groove 44 on the basis of the front surface 30A of the substrate 30 is approximately 100 μm, and the width of the groove 44 (interval between the mutually facing side walls 44A) is approximately 20 μm and is fixed across in the entire depth direction.

The overall shape of the groove 44 in the substrate 30 is a lattice that coincides with the opening 42 of the resist pattern 41 in a plan view (refer to FIG. 78E). At the front surface 30A of the substrate 30, rectangular frame portions (the boundary region Z) of the groove 44 surrounds the chip part region Y in which the individual resistor portions 56 are formed. In the substrate 30, a portion in which the resistor portion 56 has been formed is a semi-finished product 50 of the chip part 1001. At the front surface 30A of the substrate 30, one semi-finished product 50 is positioned in each chip part region Y surrounded by the groove 44, and these semi-finished products 50 are arrayed and disposed in a matrix form. By thus forming the groove 44, the substrate 30 is separated into the substrates 2 according to the plurality of chip part regions Y. After the groove 44 has been formed, the resist pattern 41 is removed.

Figure 78F:
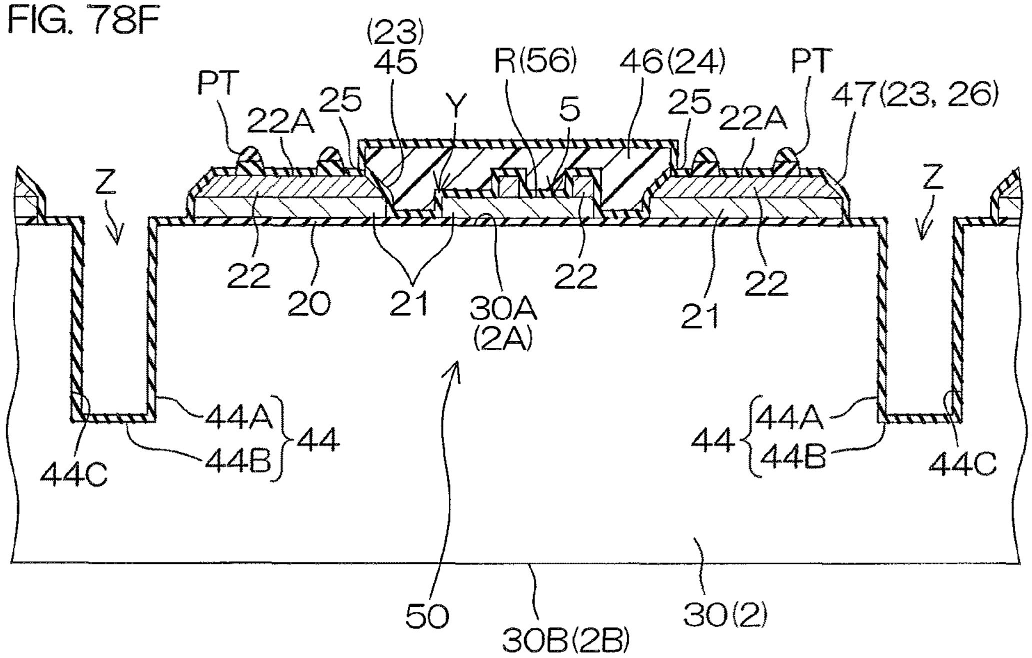

Next, as shown in FIG. 78F, an insulating film 47 made of SiN is formed on the entirety of the front surface 30A of the substrate 30 by the CVD method. In this process, the insulating film 47 is formed also on the entireties of inner peripheral surfaces of the groove 44 (defining surfaces 44C of the side walls 44A and an upper surface of the bottom wall 44B).

Figure 78G:
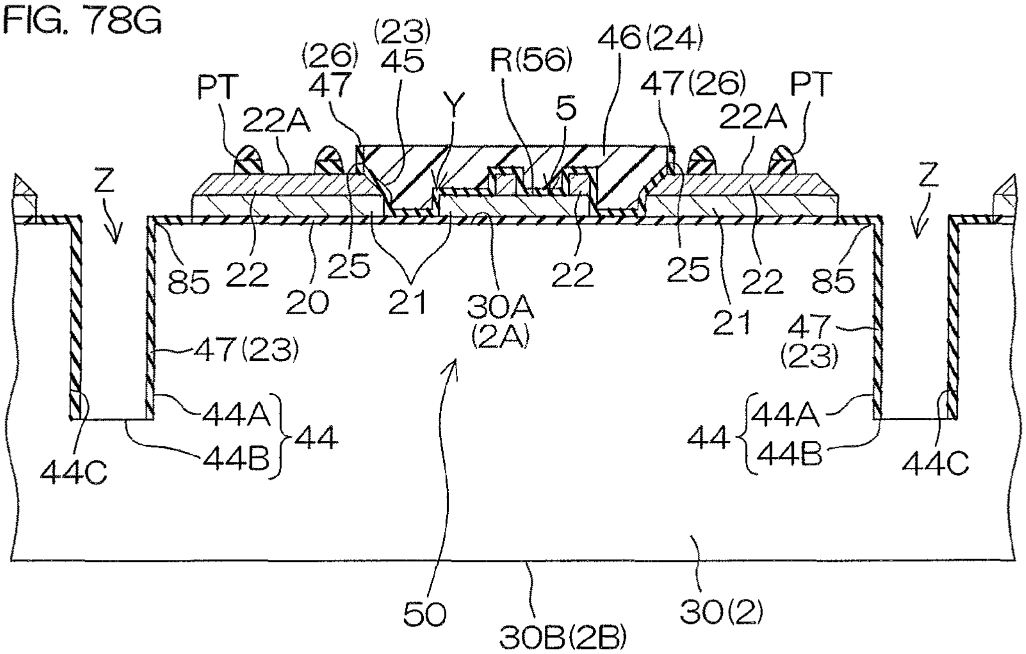

Next, as shown in FIG. 78G, the insulating film 47 is selectively etched. Specifically, portions that are parallel to the front surface 30A of the insulating film 47 are selectively etched. The uneven pad regions 22A of the wiring films 22 are thereby exposed and the insulating film 47 on the bottom wall 44B is removed in the groove 44.

Figure 78H:
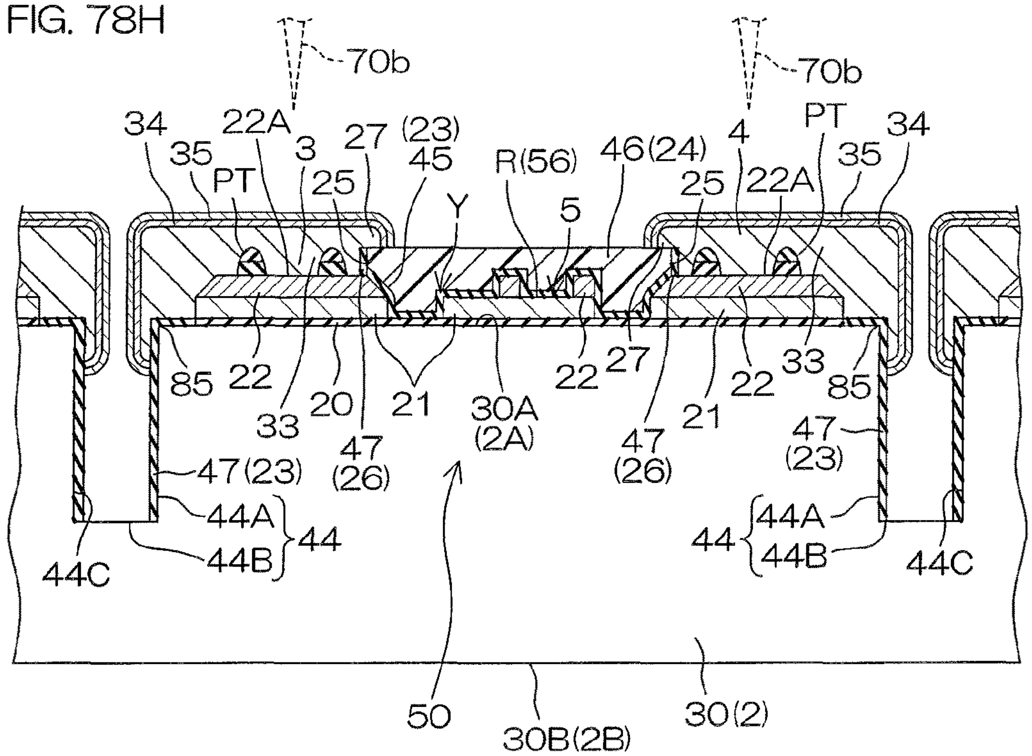
Figure 78:
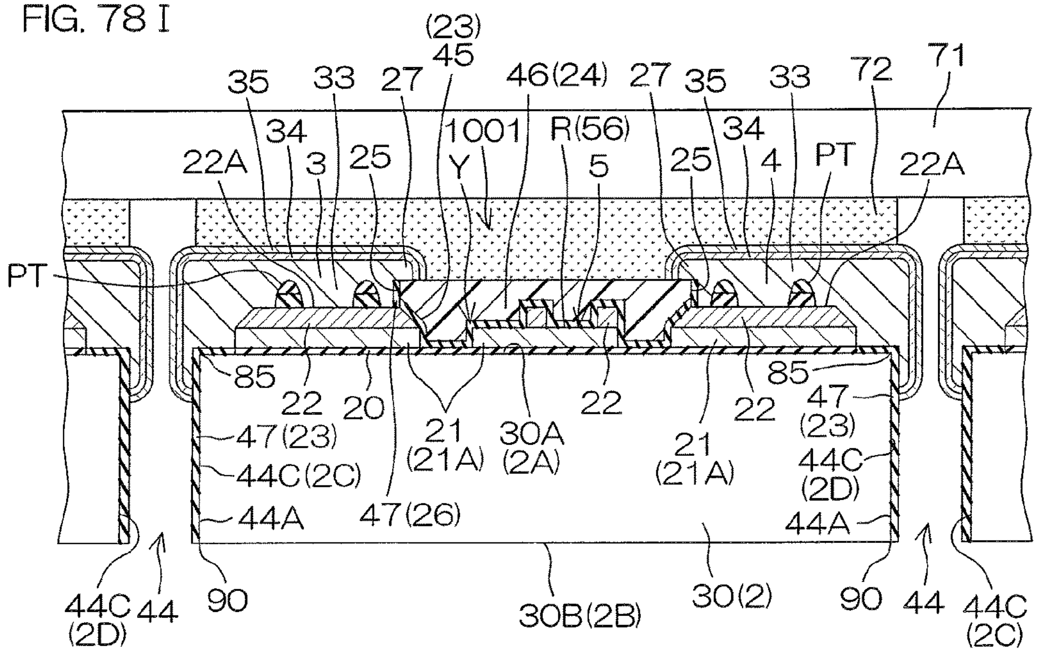

Next, by electroless plating, Ni, Pd and Au are grown by plating in that order from the wiring films 22 exposed from the individual notched portions 25. Plating is continued until each plated film grows in the lateral direction along the front surface 30A and covers the insulating film 47 on the side walls 44A on the groove 44. The first connection electrode 3 and the second connection electrode 4 made of the Ni/Pd/Au laminated film are thereby formed, as shown in FIG. 78H.

FIG. 80 is a flow chart which describes the steps of manufacturing the first connection electrode 3 and the second connection electrode 4.

Specifically, with reference to FIG. 80, first, a front surface of each of the pad region 22A is cleaned to remove (degrease) organic matters (including smuts such as stains of carbon, etc., and oil and fat dirt) on the front surface (Step S51). Next, an oxide film on the front surface is removed (Step S52). Next, zincate treatment is performed on the front surface to convert the Al of (the wiring film 22) at the front surface to Zn (Step S53). Next, the Zn on the front surface is peeled off by nitric acid, etc., so that fresh Al is exposed at the pad region 22A (Step S54).

Next, the pad region 22A is immersed in a plating solution to apply Ni plating on a front surface of the fresh Al in the pad region 22A. Ni in the plating solution is thereby chemically reduced and deposited to form an Ni layer 33 on the front surface (Step S55).

Next, the Ni layer 33 is immersed in another plating solution to apply Pd plating on a front surface of the Ni layer 33. The Pd in the plating solution is thereby chemically reduced and deposited to form a Pd layer 34 on the front surface of the Ni layer 33 (Step S56).

Next, the Pd layer 34 is immersed in yet another plating solution to apply Au plating on a front surface of the Pd layer 34. The Au in the plating solution is thereby chemically reduced and deposited to form an Au layer 35 on the front surface of the Pd layer 34 (Step S57). The first connection electrode 3 and the second connection electrode 4 are thereby formed, and when the first connection electrode 3 and the second connection electrode 4 that have been formed are dried (Step S58), the step of manufacturing the first connection electrode 3 and the second connection electrode 4 is completed. A step of washing the semi-finished product 50 with water is performed whenever necessary between consecutive steps. Further, the zincate treatment may be performed a plurality of times.

FIG. 78H shows a state after the first connection electrode 3 and the second connection electrode 4 have been formed in each semi-finished product 50.

As described above, the first connection electrode 3 and the second connection electrode 4 are formed by electroless plating, and the Ni, Pd and Al, which are electrode materials, can be satisfactorily grown by plating even on the insulating film 47. Also, in comparison with a case where the first connection electrode 3 and the second connection electrode 4 are formed by electrolytic plating, the number of steps of forming the first connection electrode 3 and the second connection electrode 4 (for example, a lithography step, a resist mask peeling step, etc., that are necessary in electrolytic plating) can be reduced to improve the productivity of the chip part 1001. Further, in the case of electroless plating, the resist mask that is deemed to be necessary in electrolytic plating is unnecessary and deviation of positions of formation of the first connection electrode 3 and the second connection electrode 4 due to positional deviation of the resist mask will not occur, thereby making it possible to improve the precision of formation positions of the first connection electrode 3 and the second connection electrode 4 and enhance the yield.

Still further, with this method, the wiring films 22 are exposed from the notched portions 25 and there is nothing that hinders growth by plating from the wiring films 22 to the groove 44. That is, since the resistor portion 56 is covered by the resin film 46, a region in which the resistor portion 56 has been formed is free of growth by plating. Therefore, growth by plating can be achieved rectilinearly from the wiring films 22 to the groove 44. As a result, it is possible to reduce time necessary for forming the electrodes.

After the first connection electrode 3 and the second connection electrode 4 have thus been formed, a conduction test is performed across the first connection electrode 3 and the second connection electrode 4. The conduction test across the first connection electrode 3 and the second connection electrode 4 detects an overall resistance value of the resistor portion 56 by putting a probe 70*b* of the resistance measuring device (not shown) into contact with the first connection electrode 3 and the second connection electrode 4, for example, according to a method similar to that described in FIG. 78D. In this process, the probe 70*b* is brought into contact with the flat portion 97 of each of the first connection electrode 3 and the second connection electrode 4. It is therefore possible to effectively suppress the probe 70*b* from being in contact with the raised portions 96 formed on the first connection electrode 3 and the second connection electrode 4. Thus, the region in contact with the first connection electrode 3 and the second connection electrode 4 can be secured satisfactorily to detect the overall resistance value of the resistor portion 56 satisfactorily. After the conduction test has been performed across the first connection electrode 3 and the second connection electrode 4, the substrate 30 is ground from the rear surface 30B.

Specifically, after formation of the groove 44, as shown in FIG. 78I, a thin plate-shaped supporting tape 71 made of PET (polyethylene terephthalate) having an adhesive surface 72 is adhered by way of the adhesive surface 72 onto the first connection electrode 3 and the second connection electrode 4 side (that is, the front surface 30A) of each semi-finished product 50. Each of the semi-finished products 50 is thereby supported by the supporting tape 71. For example, a laminated tape may be used as the supporting tape 71.

In a state that each of the semi-finished products 50 is supported by the supporting tape 71, the substrate 30 is ground from the rear surface 30B side. When the substrate 30 has been thinned by grinding until the upper surface of the bottom wall 44B (refer to FIG. 78H) of the groove 44 is reached, there are no longer portions that join mutually adjacent semi-finished products 50, and the substrate 30 is divided at the groove 44 as a boundary, and the semi-finished products 50 are separated individually to become the finished products of the chip parts 1001. That is, the substrate 30 is cut (divided) at the groove 44 (in other words, the boundary region Z) and the individual chip parts 1001 are cut out. The chip part 1001 may be cut out by etching the substrate 30 from the rear surface 30B side thereof to the bottom wall 44B of the groove 44.

With each finished chip part 1001, each portion that formed the defining surface 44C of the side walls 44A of the groove 44 becomes one of the side surfaces 2C to 2E of the substrate 2, and the rear surface 30B becomes the rear surface 2B. That is, the step of forming the groove 44 by etching (refer to FIG. 78E) as described above is included in the step of forming the side surfaces 2C to 2E. Also, the insulating film 45 and a portion of the insulating film 47 become the passivation film 23, and resin film 46 becomes the resin film 24, and a portion of the insulating film 47 becomes the insulating film 26.

As described above, the plurality of chip part regions Y formed on the substrate 30 can thus be divided all at once into individual chip parts 1001 (the individual chips of the plurality of chip parts 1001 can be obtained at once) by forming the groove 44 and then grinding the substrate 30 from the rear surface 30B side. The productivity of the chip parts 1001 can thus be improved by reduction of the time for manufacturing the plurality of chip parts 1001.

The rear surface 2B of the substrate 2 of the finished chip part 1001 may be mirror-finished by polishing or etching to refine the rear surface 2B.

Hereinafter, a detailed description will be given of a step of recovering the chip part 1001 by referring to FIG. 81A to FIG. 81D.

Each of FIG. 81A to FIG. 81D is an illustrative sectional view which shows the step of recovering the chip part 1001 performed subsequent to the step of FIG. 78I.

Figure 81A:
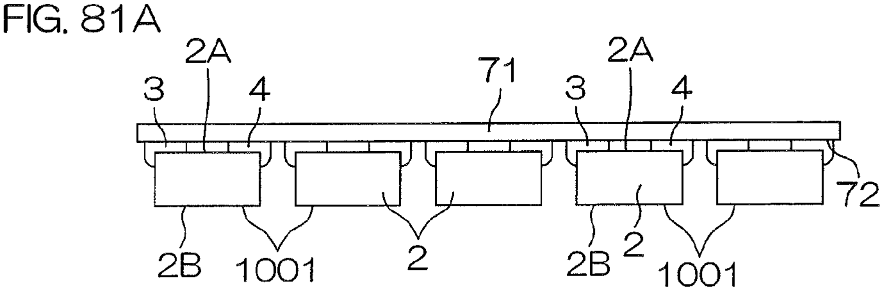
Figure 81B:
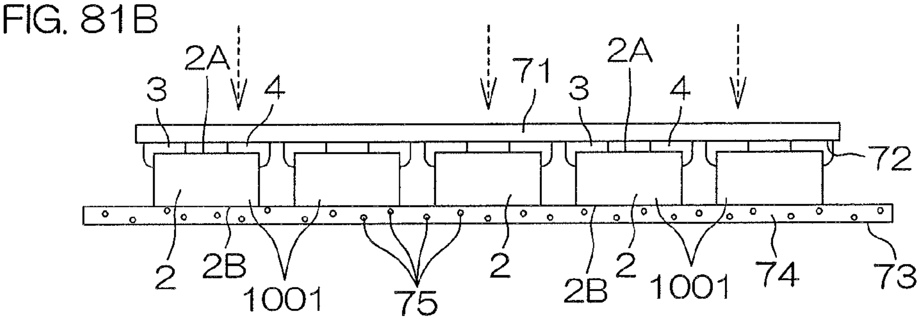

FIG. 81A shows a state that the plurality of chip parts 1001 which have been separated into individual chips continue to be adhered to the supporting tape 71. In this state, as shown in FIG. 81B, a thermally foaming sheet 73 is adhered onto the rear surface 2B of the substrate 2 of each chip part 1001. The thermally foaming sheet 73 includes a sheet-shaped sheet main body 74 and a large number of foaming particles 75 kneaded into the sheet main body 74.

Figure 81C:
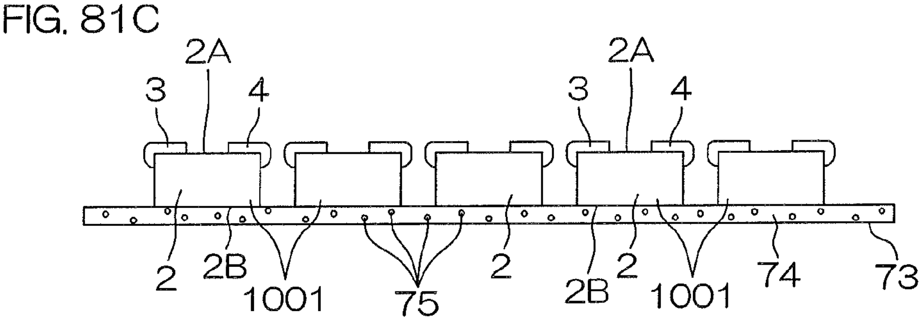

The adhesive force of the sheet main body 74 is stronger than the adhesive force at the adhesive surface 72 of the supporting tape 71. Thus, after the thermally foaming sheet 73 has been adhered onto the rear surface 2B of the substrate 2 of each chip part 1001, as shown in FIG. 81C, the supporting tape 71 is peeled off from each chip part 1001 to transfer the chip part 1001 to the thermally foaming sheet 73. If ultraviolet rays are irradiated onto the supporting tape 71 in this process (refer to the dotted arrows in FIG. 81B), the adhesive property of the adhesive surface 72 weakens and the supporting tape 71 can be peeled off easily from each chip part 1001.

Figure 81D:
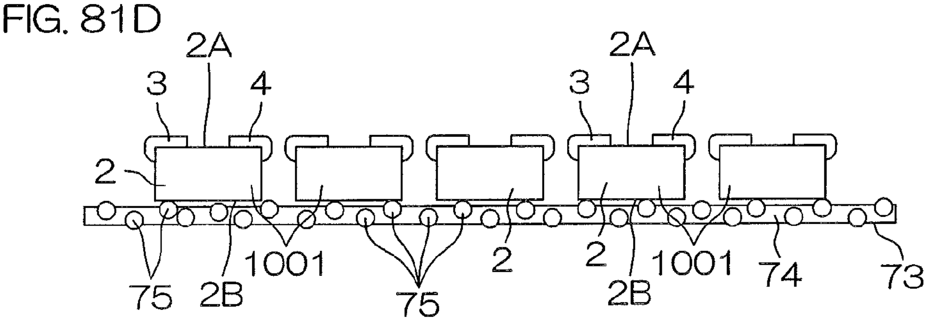

Next, the thermally foaming sheet 73 is heated. Thereby, as shown in FIG. 81D, in the thermally foaming sheet 73, individual foaming particles 75 in the sheet main body 74 are made to foam and swell out from the front surface of the sheet main body 74. As a result, the thermally foaming sheet 73 is in contact with the rear surface 2B of the substrate 2 of each chip part 1001 in a decreased area, and all the chip parts 1001 peel off (fall off) naturally from the thermally foaming sheet 73. The chip parts 1001 which have been thus recovered are housed in housing spaces formed in an embossed carrier tape (not shown). In this case, processing time can be reduced in comparison to a case where the chip parts 1001 are peeled off one by one from the supporting tape 71 or the thermally foaming sheet 73. As a matter of course, in a state that the plurality of chip parts 1001 are adhered to the supporting tape 71 (refer to FIG. 81A), the chip parts 1001 may be peeled off in a predetermined number directly from the supporting tape 71 without using the thermally foaming sheet 73. The embossed carrier tape in which the chip parts 1001 have been housed is thereafter housed in an automatic mounting machine 80, suctioned by a suction nozzle 76 installed on the automatic mounting machine 80 and individually recovered (refer to FIG. 83 and FIG. 84). The thus recovered chip part 1001 is subjected to the front-surface/rear-surface determination step by a part recognizing camera 14.

The step of recovering individual chip parts 1001 can be performed by another method shown in FIG. 82A to FIG. 82C.

Each of FIG. 82A to FIG. 82C is an illustrative sectional view which shows the step (modification example) of recovering the chip part 1001 subsequent to the step of FIG. 78I.

As with FIG. 81A, FIG. 82A shows a state that the plurality of chip parts 1001 which have been separated into individual chips continue to be adhered to the supporting tape 71. In this state, as shown in FIG. 82B, a transfer tape 77 is adhered onto the rear surface 2B of the substrate 2 of each chip part 1001. The transfer tape 77 is stronger in adhesive force than the adhesive surface 72 of the supporting tape 71. Thus, as shown in FIG. 82C, after the transfer tape 77 has been adhered onto each chip part 1001, the supporting tape 71 is peeled off from each of the chip parts 1001. In this instance, as mentioned above, ultraviolet rays may be irradiated to the supporting tape 71 (refer to the dotted arrows in FIG. 82B) for lower the adhesive property of the adhesive surface 72.

Frames 78 installed on the automatic mounting machine 80 are adhered to both ends of the transfer tape 77. The frames 78 at the both ends are able to move in a direction at which they come close to each other or in a direction at which they are spaced away from each other. When the frames 78 at both ends are made to move in a direction at which they are spaced away from each other after the supporting tape 71 has been peeled off from each of the chip parts 1001, the transfer tape 77 elongates and becomes thinner Thereby, the transfer tape 77 is lowered in adhesive force and each of the chip parts 1001 can be easily peeled off from the transfer tape 77. In this state, when the suction nozzle 76 of the automatic mounting machine 80 is pointed to the element forming surface 2A side of the chip part 1001, the chip part 1001 is peeled off from the transfer tape 77 by a suction force generated by the automatic mounting machine 80 (the suction nozzle 76) and suctioned by the suction nozzle 76. In this process, when the chip part 1001 is pushed up toward the suction nozzle 76 from a side opposite to the suction nozzle 76 via the transfer tape 77 by using a projection 79 shown in FIG. 82C, the chip part 1001 can be smoothly peeled off from the transfer tape 77. The thus recovered chip part 1001 is subjected to the front-surface/rear-surface determination step by the part recognizing camera 14.

FIG. 83 is a diagram which describes the front-surface/rear-surface determination step of the chip part 1001 according to Reference Example 1. FIG. 84 is a diagram which describes the front-surface/rear-surface determination step of the chip part 1010 according to the reference example.

FIG. 83 and FIG. 84 show the respective states that the chip part 1001 and the chip part 1010 according to the reference example are suctioned by the suction nozzle 76. The chip part 1010 according to the reference example is herein referred to as a chip part in which no raised portions 96 are formed on any front surface of the first connection electrode 3 or the second connection electrode 4.

As shown in FIG. 83, the chip part 1001 is in a state of being suctioned by the suction nozzle 76 conveyed by the automatic mounting machine 80 up to a part detection position P at which the front surface or the rear surface of the chip part 1001 is determined by the part recognizing camera 14. In this process, a substantially central portion in the long direction of the rear surface 2B is suctioned by the suction nozzle 76. As mentioned above, the first connection electrode 3 and the second connection electrode 4 are provided only on a surface at one side (element forming surface 2A) of the chip part 1001 and at end portions of the side surfaces 2C to 2E at the element forming surface 2A side. And, therefore, the rear surface 2B of the chip part 1001 is a flat surface free of electrodes (unevenness). Thus, the flat rear surface 2B can be suctioned by the suction nozzle 76, when the chip part 1001 is suctioned by the suction nozzle 76 and made to move. In other words, the flat rear surface 2B can be increased in a margin of the portion that is suctioned by the suction nozzle 76. The chip part 1001 can be reliably suctioned by the suction nozzle 76 and, therefore, the chip part 1001 can be conveyed reliably up to the part detection position P to be detected by the part recognizing camera 14. And, it can be mounted on the mounting substrate 9 without falling off from the suction nozzle 76 midway.

As shown in FIG. 83, when the chip part 1001 reaches the part detection position P, light is obliquely irradiated to the surface (the element forming surface 2A) in which the first connection electrode 3 and the second connection electrode 4 of the chip part 1001 are formed from a light source 15 (for example, a light irradiator equipped with a plurality of LEDs) around the part recognizing camera 14. The part recognizing camera 14 detects reflection light reflected by the first connection electrode 3 and the second connection electrode 4 of the chip part 1001 and a portion in which the first connection electrode 3 and the second connection electrode 4 are not formed and distinguishes contrast between a region where the first connection electrode 3 and the second connection electrode 4 are formed and a region where they are not formed, thereby determining whether the region is the front surface or the rear surface of the chip part 1001.

The chip part 1001 is not necessarily suctioned in a horizontal posture by the suction nozzle 76 and there is a case that it may be from time to time suctioned in an inclined manner by the suction nozzle 76.

Here, as shown in FIG. 84, in the case of the chip part 1010 according to the reference example, when light is irradiated in an inclined posture to the element forming surface 2A from the light source 15 (refer to incident light λ3 in FIG. 84), there is a case that the light is reflected by the first connection electrode 3 and the second connection electrode 4 to outside a region in which the part recognizing camera 14 is disposed (total reflection: refer to reflection light λ4 in FIG. 84) and may not be detected by the part recognizing camera 14. In this case, with regard to image information obtained by the part recognizing camera 14, the first connection electrode 3 and the second connection electrode 4 of the chip part 1010 according to the reference example will appear dark partially or entirely. Therefore, the automatic mounting machine 80 misrecognizes the region in which the first connection electrode 3 and the second connection electrode 4 have been formed as the region in which the first connection electrode 3 or the second connection electrode 4 is not formed, thereby stopping conveyance of the chip part 1010 according to the reference example to the mounting substrate 9. Thus, in the case of the chip part 1010 according to the reference example, misrecognition prevents smooth mounting of the chip part.

In contrast, in the chip part 1001, as shown in FIG. 83, the plurality of raised portions 96 are formed on the respective front surfaces of the first connection electrode 3 and the second connection electrode 4 formed on the frontmost surface of the chip part 1001. Thus, even if the chip part 1001 is suctioned in an inclined posture, light (refer to incident light 21 in FIG. 83) irradiated onto the first connection electrode 3 and the second connection electrode 4 from the light source 15 is irregularly reflected by the raised portions 96 of the first connection electrode 3 and the second connection electrode 4 (refer to reflection light λ2 in FIG. 83). In the first connection electrode 3 and the second connection electrode 4, the plurality of raised portions 96 are formed and, even if the chip part 1001 is suctioned by the suction nozzle 76 in an inclined posture as shown in FIG. 84, incident light λ1 from the light source 15 can be reflected in all directions. Therefore, irrespective of the way in which the part recognizing camera 14 is disposed in relation to the part detection position P, the part recognizing camera 14 can be used to detect the first connection electrode 3 and the second connection electrode 4 (the chip part 1001) satisfactorily. Thereby, the automatic mounting machine 80 is reduced in misrecognition due to a specification of the chip part 1001, thus making it possible to smoothly mount the chip part 1001 on the mounting substrate 9.

Further, only processing for forming the raised portions 96 in the first connection electrode 3 and the second connection electrode 4 of the chip part 1001 will be sufficient and, therefore, the processing is applicable to a chip part different in specification. It is thus not necessary to change a condition (a specification) of the light source 15 disposed around the part recognizing camera 14 for each specification of the chip part.

The chip part 1001 which has been subjected to the step is subsequently mounted on the mounting substrate 9, as shown in FIG. 85.

FIG. 85 is a schematic sectional view when the circuit assembly 100 in a state that the chip part 1001 has been mounted on the mounting substrate 9 is cut along the long direction of the chip part 1001. FIG. 86 is a schematic plan view in which the chip part 1001 in a state of being mounted on the mounting substrate 9 is viewed from the element forming surface 2A side.

As shown in FIG. 85, the chip part 1001 is mounted on the mounting substrate 9. The chip part 1001 and the mounting substrate 9 in this state constitute the circuit assembly 100. The upper surface of the mounting substrate 9 in FIG. 85 is the mounting surface 9A. A pair (two) of lands 88, each of which is connected to an internal circuit (not shown) of the mounting substrate 9, are formed on the mounting surface 9A. Each of the lands 88 is made of, for example, Cu. A solder 13 is provided on the front surface of each of the lands 88 so as to project from the front surface thereof.

After the front-surface/rear-surface determination step, the automatic mounting machine 80 makes the suction nozzle 76 to move to the mounting substrate 9 in a state that the chip part 1001 is suctioned. In this process, the element forming surface 2A of the chip part 1001 and the mounting surface 9A of the mounting substrate 9 face each other. In this state, the suction nozzle 76 is made to move and pressed to the mounting substrate 9. And in the chip part 1001, the first connection electrode 3 is brought into contact with the solder 13 of one land 88, while the second connection electrode 4 is brought into contact with the solder 13 of the other land 88. Then, the solder 13 is heated, by which the solder 13 is melted. Thereafter, when the solder 13 is cooled and solidified, the first connection electrode 3 is bonded to the one land 88 via the solder 13, and the second connection electrode 4 is bonded to the other land 88 via the solder 13. That is, these two lands 88 are solder-bonded respectively to the first connection electrode 3 and the second connection electrode 4. Thereby, the chip part 1001 is completely mounted (flip-chip bonding) on the mounting substrate 9, and the circuit assembly 100 is completed. In this process, an Au layer 35 (gold plate) is formed on the respective frontmost surfaces of the first connection electrode 3 and the second connection electrode 4, each of which functions as an external connection electrode of the chip part 1001. Therefore, when the chip part 1001 is mounted on the mounting substrate 9, excellent solder wettability and high reliability are obtained.

In the circuit assembly 100 which has been completed, the element forming surface 2A of the chip part 1001 and the mounting surface 9A of the mounting substrate 9 face each other, with a clearance kept, and also extend parallel (refer to FIG. 86 as well). The clearance corresponds dimensionally to a total of the thickness of a portion projecting from the element forming surface 2A and the thickness of the solder 13 in the first connection electrode 3 or the second connection electrode 4.

As shown in FIG. 85, in a sectional view, for example, each of the first connection electrode 3 and the second connection electrode 4 is formed in an L-letter shape by integrating a front surface portion on the element forming surface 2A with side surface portions on the side surfaces 2C, 2D. Therefore, as shown in FIG. 86, when the circuit assembly 100 (to be exact, a bonding portion between the chip part 1001 and the mounting substrate 9) is viewed in a direction (in a direction orthogonal to the surface) of a normal to the mounting surface 9A (the element forming surface 2A), the solder 13 which bonds the first connection electrode 3 to one land 88 is adsorbed not only on the front surface portion of the first connection electrode 3 but also on the side surface portion. In a similar manner, the solder 13 which bonds the second connection electrode 4 with the other land 88 is adsorbed not only on the front surface portion of the second connection electrode 4 but also on the side surface portion.

As described above, in the chip part 100, the first connection electrode 3 is formed so as to cover integrally the three side surfaces 2C, 2E and 2F of the substrate 2, and the second connection electrode 4 is formed so as to cover integrally the three side surfaces 2D, 2E and 2F of the substrate 2. That is, the electrodes are formed on the side surfaces 2C to 2E, in addition to the element forming surface 2A of the substrate 2, thus making it possible to increase an adhesion area when the chip part 1001 is solder-bonded to the mounting substrate 9. As a result, it is possible to increase an adsorption amount of the solder 13 onto the first connection electrode 3 and the second connection electrode 4. Thereby, the adhesion strength thereof can be improved.

Further, as shown in FIG. 86, the solder 13 is adsorbed so as to enter from the element forming surface 2A of the substrate 2 into the side surfaces 2C to 2E. Therefore, in a mounting state, the first connection electrode 3 is held by the solder 13 from the three side surfaces 2C, 2E and 2F, and the second connection electrode 4 is held by the solder 13 from the three side surfaces 2D, 2E and 2F, thus making it possible to fix all the side surfaces 2C to 2E of the rectangular-shaped chip part 1001 by the solders 13. Thereby, the chip part 1001 can be mounted in a stable manner.

As described above, according to Reference Example 1, it is possible to provide a chip part 1001 which can be satisfactorily determined for the front surface or the rear surface of the chip part 1001 and also mounted smoothly on the mounting substrate 9 and also to provide a method for manufacturing thereof. It is also possible to provide a circuit assembly 100 which includes the chip part 1001.

<Capacitor>

FIG. 87 is a plan view of a chip part 1101 according to Reference Example 2 and also a diagram which shows a positional relationship between a first connection electrode, a second connection electrode and a circuit element as well as an arrangement of the element in a plan view. FIG. 88 is a sectional view taken along section line LXXXVIII-LXXXVIII in FIG. 87. FIG. 89A is a sectional view taken along section line LXXXIXa-LXXXIXa in FIG. 87. FIG. 89B is a sectional view taken along section line LXXXIXb-LXXXIXb in FIG. 87. FIG. 90 is an exploded perspective view which shows an arrangement of a portion of the chip part 1101 separated.

The chip part 1101 according to Reference Example 2 is different from the chip part 1001 of Reference Example 1 in that as a circuit element formed in an element region 5, capacitor components C1 to C9 are formed in place of the resistor portion 56. The chip part 1101 is similar in other arrangements to the chip part 1001 of Reference Example 1. In FIG. 87 to FIG. 90, the portions corresponding to the individual portions shown in FIG. 1 to FIG. 86 are given the same reference numerals.

With reference to FIG. 87, on an element forming surface 2A of a substrate 2, the plurality of capacitor components C1 to C9 are formed within the element region 5. The plurality of capacitor components C1 to C9 are a plurality of element components which constitute the circuit elements (a capacitor in the present case) and are connected between a first connection electrode 3 and a second connection electrode 4. Specifically, each of the plurality of capacitor components C1 to C9 is electrically connected to the second connection electrode 4 via a plurality of fuse units 107 (corresponding to the fuses F) so as to enable disconnection.

As shown in FIG. 88, an insulating film 20 is formed on the element forming surface 2A of the substrate 2 and a lower electrode film 111 is formed on a front surface of the insulating film 20. The lower electrode film 111 spreads across substantially the entirety of the element region 5. Further, the lower electrode film 111 is formed to extend to a region directly below the first connection electrode 3.

More specifically, the lower electrode film 111 has, in the element region 5, a capacitor electrode region 111A functioning as a lower electrode in common to the capacitor components C1 to C9 and has a pad region 111B arranged to lead out to an external electrode and disposed directly below the first connection electrode 3. The capacitor electrode region 111A is positioned in the element region 5 and the pad region 111B is positioned directly below the first connection electrode 3 and in contact with the first connection electrode 3.

As shown in FIG. 89A, on the pad region 111B, in the arrangement similar to that described in Reference Example 1, a pattern PT which includes a resin film 24 and a passivation film 23 (refer to FIG. 70A to FIG. 71) is formed. Therefore, on the front surface of the first connection electrode 3 in Reference Example 2, raised portions 96 and a flat portion 97 which are similar to those of Reference Example 1 are formed.

With reference to FIG. 88, a capacitance film (dielectric film) 112 is formed so as to cover and be in contact with the lower electrode film 111 (capacitor electrode region 111A) in the element region 5. The capacitance film 112 is formed across the entirety of the capacitor electrode region 111A (element region 5). In the reference example, the capacitance film 112 further covers the insulating film 20 outside the element region 5.

An upper electrode film 113 is formed on the capacitance film 112. The upper electrode film 113 is provided with a capacitor electrode region 113A which is positioned in the element region 5, a pad region 113B which is positioned directly below the second connection electrode 4 and in contact with the second connection electrode 4, and a fuse region 113C which is disposed between the capacitor electrode region 113A and the pad region 113B.

As shown in FIG. 89B, on the pad region 113B, in an arrangement similar to that described in Reference Example 1, a pattern PT which includes the resin film 24 and the passivation film 23 (refer to FIG. 70A to FIG. 71) is formed. Therefore, on the front surface of the second connection electrode 4 in Reference Example 2, raised portions 96 and a flat portion 97 similar to those of Reference Example 1 are formed.

In the capacitor electrode region 113A, the upper electrode film 113 is divided (separated) into a plurality of electrode film portions (upper electrode film portions) 131 to 139. In the present reference example, each of the electrode film portions 131 to 139 is formed in a rectangular shape and extends in a band shape from the fuse region 113C toward the first connection electrode 3. The plurality of electrode film portions 131 to 139 face the lower electrode film 111 across the capacitance film 112 (while being in contact with the capacitance film 112) in a plurality of types of facing areas. More specifically, the facing areas of the electrode film portions 131 to 139 in relation to the lower electrode film 111 may be set to be 1:2:4:8:16:32:64:128:128. That is, the plurality of electrode film portions 131 to 139 include the plurality of electrode film portions different in facing area and, more specifically, include the plurality of electrode film portions 131 to 138 (or 131 to 137, and 139) having facing areas that are set to have a geometric progression with a common ratio of 2. The plurality of capacitor components C1 to C9 arranged respectively by the electrode film portions 131 to 139 and the facing lower electrode film 111 across the capacitance film 112 thus include the plurality of capacitor components mutually different in capacitance value. If the ratio of the facing areas of the electrode film portions 131 to 139 is as mentioned above, the ratio of the capacitance values of the capacitor components C1 to C9 is equal to the ratio of the facing areas and is 1:2:4:8:16:32:64:128:128. That is, the plurality of capacitor components C1 to C9 thus include the plurality of capacitor components C1 to C8 (or C1 to C7, C9) with capacitance values set to form the geometric progression with the common ratio of 2.

In the present reference example, the electrode film portions 131 to 135 are formed in a band shape which are equal in width and have the length of ratios that are set to be 1:2:4:8:16. The electrode film portions 135, 136, 137, 138 and 139 are also formed in a band shape which are equal in length and have the width of ratios that are set to be 1:2:4:8:8. The electrode film portions 135 to 139 are formed to extend across a range from an end edge at the second connection electrode 4 side to an end edge at the first connection electrode 3 side of the element region 5, and the electrode film portions 131 to 134 are formed to be shorter than the range.

The pad region 113B is formed to be substantially similar in shape to the second connection electrode 4 and has a substantially rectangular planar shape. As shown in FIG. 88, the upper electrode film 113 in the pad region 113B is in contact with the second connection electrode 4.

The fuse region 113C is disposed along one long side (the long side at the inner side in relation to the peripheral edge of the substrate 2) of the pad region 113B on the substrate 2. The fuse region 113C includes the plurality of fuse units 107 that are aligned along the one long side of the pad region 113B.

The fuse unit 107 is formed integrally with the pad region 113B of the upper electrode film 113 by using the same material thereof. The plurality of electrode film portions 131 to 139 are each formed integrally with one or a plurality of fuse units 107, connected to the pad region 113B via the fuse units 107 and electrically connected to the second connection electrode 4 via the pad region 113B. As shown in FIG. 87, each of the electrode film portions 131 to 136 of a relatively small area is connected to the pad region 113B via a single fuse unit 107, and each of the electrode film portions 137 to 139 of a relatively large area is connected to the pad region 113B via a plurality of fuse units 107. It is not necessary for all the fuse units 107 to be used, and in the present reference example, a portion of the fuse unit 107 is not used.

The fuse unit 107 includes first wide portions 107A arranged to be connected to the pad region 113B, second wide portions 107B arranged to be connected to the electrode film portions 131 to 139 and narrow portions 107C connecting the first wide portions 107A and the second wide portions 107B. The narrow portions 107C are arranged so as to be cut (fused) by laser light. Unnecessary electrode film portions among the electrode film portions 131 to 139 can thus be electrically disconnected from the first connection electrode 3 and the second connection electrode 4 by cutting the fuse units 107.

Although omitted from illustration in FIG. 87 and FIG. 90, as shown in FIG. 88, a front surface of the chip part 1101 that includes a front surface of the upper electrode film 113 is covered by the previously described passivation film 23. The passivation film 23 is made of, for example, a nitride film and is formed not only to cover the upper surface of the chip part 1101 but also to extend to the side surfaces 2C to 2E of the substrate 2 and cover the entireties of the side surfaces 2C to 2E. At the side surfaces 2C to 2E, the passivation film 23 is interposed between the substrate 2 and the first connection electrode 3 or the second connection electrode 4. Further, the resin film 24 is formed on the passivation film 23. The resin film 24 covers the element forming surface 2A.

The passivation film 23 and the resin film 24 are protective films that protect the front surface of the chip part 1101. In these films, the notched portions 25 are formed in the regions respectively corresponding to the first connection electrode 3 and the second connection electrode 4. The notched portions 25 penetrate through the passivation film 23 and the resin film 24. Further, in the present reference example, the notched portions 25 corresponding to the first connection electrode 3 also penetrate through the capacitance film 112.

The first connection electrode 3 and the second connection electrode 4 are respectively embedded in the notched portions 25. Thereby, the first connection electrode 3 is bonded to the pad region 111B of the lower electrode film 111, and the second connection electrode 4 is bonded to the pad region 113B of the upper electrode film 113. Each of the first connection electrode 3 and the second connection electrode 4 projects from the front surface of the resin film 24 and also has a lead-out portion 27 leading out to an inner side (element region 5 side) of the substrate 2 along a front surface of the resin film 24. The chip part 1101 can thereby be flip-chip bonded to a mounting substrate.

FIG. 91 is a circuit diagram of the electrical arrangement of the interior of the chip part 1101. The plurality of capacitor components C1 to C9 are connected in parallel between the first connection electrode 3 and the second connection electrode 4. Fuses F1 to F9, each arranged by one or a plurality of fuse units 107, are interposed in series between each of the capacitor components C1 to C9 and the second connection electrode 4.

When all the fuses F1 to F9 are connected, the capacitance value of the chip part 1101 is equal to the total of capacitance values of the capacitor components C1 to C9. When one or two or more fuses selected from the plurality of fuses F1 to F9 is or are cut, each capacitor component corresponding to the thus cut fuse is disconnected, and the capacitance value of the chip part 1101 decreases by just the capacitance value of the disconnected capacitor component or components.

Therefore, by measuring the capacitance value across the pad regions 111B, 113B (the total capacitance value of the capacitor components C1 to C9) and thereafter using laser light to fuse one or a plurality of fuses selected appropriately from the fuse F1 to F9 in accordance with a desired capacitance value, adjustment (laser trimming) to the desired capacitance value can be performed. In particular, if the capacitance values of the capacitor components C1 to C8 are set to form a geometric progression with a common ratio of 2, fine adjustment to a target capacitance value at a precision corresponding to the capacitance value of the capacitor component C1 which is the smallest capacitance value (a value of the first term in the geometric progression) is made possible.

For example, the capacitance values of the capacitor components C1 to C9 may be set as follows.

C1=0.03125 pF
C2=0.0625 pF
C3=0.125 pF
C4=0.25 pF
C5=0.5 pF
C6=1 pF
C7=2 pF
C8=4 pF
C9=4 pF

In this case, the capacitance of the chip part 1101 can be finely adjusted with minimum adjustment precision of 0.03125 pF. Also, fuses to be cut among the fuses F1 to F9 can be selected appropriately to provide the chip part 1101 with an arbitrary capacitance value between 10 pF to 18 pF.

FIG. 92 is a flow chart which describes one example of the steps of manufacturing the chip part 1101 shown in FIG. 87.

The steps of manufacturing the chip part 1101 are the same as the steps of manufacturing the chip part 1001 after formation of the resistor portion 56 in Reference Example 1. That is, the chip part 1101 can be obtained by performing a step of forming the capacitor components C1 to C9 in place of the step of forming the resistor portion 56 in Reference Example 1. Hereinafter, a detailed description will be given of a difference from the manufacturing steps of Reference Example 1.

That is, where the capacitor components C1 to C9 and the fuse units 107 are formed in the chip part 1101, first, the insulating film 20 is formed on a front surface of the previously described substrate 30 (substrate 2) by a thermal oxidation method and/or a CVD method (Step S111). Next, the lower electrode film 111 made of an aluminum film is formed, for example, by a sputtering method, across the entirety of the front surface of the insulating film 20 (Step S112). Next, a resist pattern corresponding to the final shape of the lower electrode film 111 is formed on the front surface of the lower electrode film by photolithography (Step S113). The lower electrode film is etched using the resist pattern as a mask to obtain the lower electrode film 111 of the pattern shown in FIG. 87, etc. (Step S114). The etching of the lower electrode film 111 may be performed, for example, by reactive ion etching.

Next, the capacitance film 112 constituted of a silicon nitride film, etc., is formed on the lower electrode film 111, for example, by a plasma CVD method (Step S115). In the region in which the lower electrode film 111 is not formed, the capacitance film 112 is formed on the front surface of the insulating film 20. Next, the upper electrode film 113 is formed on the capacitance film 112 (Step S116). The upper electrode film 113 is constituted, for example, of an aluminum film and may be formed by a sputtering method.

Next, a resist pattern corresponding to the final shape of the upper electrode film 113 is formed on the front surface of the upper electrode film 113 by photolithography (Step S117). The upper electrode film 113 is patterned to the final shape (refer to FIG. 87, etc.) by etching using the resist pattern as a mask (Step S118). The upper electrode film 113 is thereby shaped to the pattern having the portion divided into the plurality of electrode film portions 131 to 139 in the capacitor electrode region 113A, having the plurality of fuse units 107 in the fuse region 113C and having the pad region 113B connected to the fuse units 107. The etching for patterning the upper electrode film 113 may be performed by wet etching using an etching liquid such as phosphoric acid, etc., or may be performed by reactive ion etching. The capacitor components C1 to C9 and the fuse units 107 in the chip part 1101 are formed by the above.

Next, after the pattern PT has been formed on the pad region 111B of the upper electrode film 113 and on the pad region 113B of the lower electrode film 111 in the same steps as those of FIG. 78C to FIG. 78D, a probe 70*a* is pressed to each of the pad regions 111B, 113B, thereby measuring a total capacitance value of the plurality of capacitor components C1 to C9 (Step S119). In this process, a first opening 22B is formed in each of the pad region 111B and the pad region 113B. Thereby, a region in contact with the probe 70*a* can be satisfactorily secured to measure the total capacitance value of the plurality of capacitor components C1 to C9 satisfactorily. On the basis of the thus measured total capacitance value, the capacitor components C1 to C9 to be cut, that is, the fuses F to be cut, are selected according to the capacitance value of the target chip part 1101 (Step S120).

That is, laser light is irradiated onto the fuse unit 107 which constitutes the fuse selected according to measurement results of the total capacitance value to fuse the narrow portion 107C (refer to FIG. 87) of the fuse unit 107 (Step S121). Thereby, the corresponding capacitor component is disconnected from the pad region 113B. When the laser light is irradiated onto the fuse unit 107, the energy of the laser light is accumulated in the vicinity of the fuse unit 107 by the action of the insulating film 45 that is a cover film, and the fuse unit 107 is thereby fused. The capacitance value of the chip part 1101 can thereby be set to the target capacitance value reliably.

Thereafter, the same steps as those in the case of the chip part 1001 may be executed in accordance with the steps of FIG. 78E to FIG. 78I.

As described above, even in the case of formation of the capacitors in the element region 5, the same effects as those described in Reference Example 1 can be obtained.

FIG. 93 is a plan view of a chip part 1102 according to Reference Example 3 and a diagram which shows a positional relationship between a first connection electrode, a second connection electrode and a circuit element as well as an arrangement of the element in a plan view. In FIG. 93, the portions corresponding to the individual portions shown in FIG. 1 to FIG. 92 are given the same reference numerals.

In Reference Example 2, the capacitor electrode region 113A of the upper electrode film 113 is divided into the electrode film portions 131 to 139, each of which is formed in a band shape. In this case, as shown in FIG. 87, a region which cannot be used as capacitor components will develop within an element region 5, thus resulting in a failure of effective use of a limited region on the small substrate 2.

Therefore, in the reference example shown in FIG. 93, a plurality of electrode film portions 131 to 139 are divided into electrode film portions 141 to 149, each of which is formed in an L-letter shape. Thereby, for example, the electrode film portion 149 arranged as shown in FIG. 93 is able to face a lower electrode film 111 in an area which is 1.5 times greater than the electrode film portion 139 arranged as shown in FIG. 87. Thereby, if a capacitor component C9 corresponding to the electrode film portion 139 in Reference Example 2 of FIG. 87 has a capacitance of 4 pF, the electrode film portion 149 of the present reference example is used, by which the capacitor component C9 is able to have a capacitance of 6 pF. Thereby, the interior of the element region 5 can be effectively used to set the capacitance value of the chip part 1102 in a wider range.

The manufacturing step of the chip part 1102 is substantially the same as that shown in FIG. 92. However, when the upper electrode film 113 is patterned (Steps S117, S118), the capacitor electrode region 113A is divided into the plurality of electrode film portions 141 to 149, each of which is formed in a shape shown in FIG. 93.

As described so far, with the arrangement of Reference Example 3, it is also possible to exhibit the same effects as those described in Reference Example 1.

FIG. 94 is a plan view of a chip part 1103 according to Reference Example 4 or a diagram which shows a positional relationship between a first connection electrode, a second connection electrode and a circuit element as well as an arrangement of the element in a plan view. In FIG. 94, the portions corresponding to individual portions shown in FIG. 1 to FIG. 93 are given the same reference numerals.

In Reference Example 2, the lower electrode film 111 is provided with the capacitor electrode region 111A having a continuous pattern extending substantially across the entirety of the element region 5, and the capacitor electrode region 113A of the upper electrode film 113 is divided into the plurality of electrode film portions 131 to 139 (refer to FIG. 87, etc.).

In contrast, in Reference Example 4, while a capacitor electrode region 113A and a pad region 113B of an upper electrode film 113 are formed in a continuous film pattern which continues substantially across the entirety of an element region 5, a capacitor electrode region 111A of a lower electrode film 111 is divided into a plurality of electrode film portions 151 to 159. The electrode film portions 151 to 159 may be formed so as to be similar in shape and area ratio to the electrode film portions 131 to 139 of Reference Example 2 or may be formed so as to be similar in shape and area ratio to the electrode film portions 141 to 149 of Reference Example 3.

In the present reference example, such an example that at least any one of the electrode film portions 151 to 159 (the electrode film portion 159 in FIG. 94) is formed in an L-letter shape in the capacitor electrode region 111A, is shown. As described above, a plurality of capacitor components are arranged by the electrode film portions 151 to 159, a capacitance film 112 and the upper electrode film 113. At least, a portion of the plurality of capacitor components constitutes a group of capacitor components different in capacitance value (for example, each of the capacitance values is set to form a geometric progression). The electrode film portions 151 to 159 constitute respectively the capacitor components C1 to C9. The electrode film portion 159 in FIG. 94 is folded in an L-letter shape and formed across the entirety of the element region 5. Therefore, the capacitance value of the capacitor component C9 is made greater than the capacitance value of the capacitor component C8, for example, two times greater. Thereby, unlike Reference Example 2 in which the capacitor components C8, C9 are equal in capacitance value (refer to FIG. 87), all the capacitance values of the capacitor components C1 to C9 can be set so as to form a geometric progression.

The lower electrode film 111 is also provided with a fuse region 111C between the capacitor electrode region 111A and a pad region 111B. A plurality of fuse units 147 are aligned in a row along the pad region 111B in the fuse region 111C, as with the fuse unit 107 of Reference Example 2. Each of the electrode film portions 151 to 159 is connected to the pad region 111B via one or the plurality of fuse units 147.

In the arrangement, each of the electrode film portions 151 to 159 faces the upper electrode film 113 in a mutually different facing area, and the electrode film portions can be cut off individually by disconnecting fuse units 147. Therefore, effects similar to those of Reference Example 2 can be obtained. In particular, at least a portion of the plurality of electrode film portions 151 to 159 is formed so as to face the upper electrode film 113 in a facing area set to form a geometric progression with a common ratio of 2. Thereby, it is possible to provide a chip part adjusted to a predetermined capacitance value at high precision as with Reference Example 2.

The manufacturing step of the chip part 1103 is substantially similar to the step shown in FIG. 92. However, when the lower electrode film 111 is patterned (Steps S112, S113), the capacitor electrode region 111A is divided into the electrode film portions 151 to 159 and also the plurality of fuse units 147 are formed in the fuse region 111C. Also, when the upper electrode film 113 is patterned (Steps S117, S118), the plurality of electrode film portions are not formed or the fuse units are not formed. However, the upper electrode film 113 is patterned so as not to overlap each of the fuse units 147 in a plan view. Further, in laser trimming (Step S121), the fuse units 147 formed on the lower electrode film 111 are cut by laser light. On laser trimming, the lower electrode film 111 is covered by the capacitance film 112 and, therefore, the capacitance film 112 can be used as a cover film for accumulating the energy of the laser light. Therefore, a step of forming an insulating film 45 as a cover film directly before the laser trimming may be omitted. The upper electrode film 113 does not overlap each of the fuse units 147 in a plan view, and the upper electrode film 113 will not be cut by the laser trimming.

As described above, with the arrangement of Reference Example 4, it is also possible to obtain the effects similar to those described in Reference Example 1.

<Fuse>

FIG. 95 is a plan view of a chip part 1201 according to Reference Example 5.

The chip part 1201 of Reference Example 5 is different from the chip part 1001 of Reference Example 1 in that as a circuit element formed in an element region 5, a fuse component 204 is formed in place of the resistor portion 56. The chip part 1201 is similar in other arrangements to the chip part 1001 according to Reference Example 1. In FIG. 95, the portions corresponding to the individual portions shown in FIG. 1 to FIG. 94 are given the same reference numerals.

The fuse component 204 includes in an integrated manner a pair of pad regions 209 disposed below each of a first connection electrode 3 and a second connection electrode 4, a soluble portion 210 disposed between the pair of pad regions 209 and a pair of wiring portions 211 connecting the soluble portion 210 to each of the pad regions 209. In the present reference example, the fuse component 204 is constituted of an AlCu alloy but may be made of other metal materials.

Each of the pad regions 209 is formed in a rectangular shape to be slightly smaller than the first connection electrode 3 and the second connection electrode 4 in a plan view so that the entirety thereof can be housed in an inner side region of the first connection electrode 3 and that of the second connection electrode 4.

The soluble portion 210 is formed so as to give a line extending along the long direction of the substrate 2, with the both ends thereof connected to each wiring portion 211. In the present reference example, the soluble portion 210 is rectilinear along the long direction of the substrate 2. As a matter of course, but may be formed in a curved shape such as an S-letter shape. Further, in the present reference example, the soluble portion 210 is formed substantially in the same width as that of the wiring portion 211. However, the soluble portion 210 may be formed narrower than the wiring portion 211 so as to be easily fused.

Then, a pair of dummy metals 212 are disposed as a wall portion at both sides of the soluble portion 210 in the width direction which is orthogonal to the long direction. The pair of dummy metals 212 are constituted of the same metal material (an AlCu alloy in the present reference example) as that of the fuse component 204. The pair of dummy metals 212 also extend so as to form a line (rectilinearly) along the line-shaped soluble portion 210 and disposed, with a side clearance 213 kept, in relation to the soluble portion 210. In the present reference example, the line-shaped soluble portion 210 and the pair of dummy metals 212 are all formed along the long direction of the substrate 2. Therefore, in comparison to a case where they are formed along the width direction of the substrate 2, it is possible to form the soluble portion 210 and the pair of dummy metals 212 which are relatively long in a region on the dimensionally restricted substrate 2. Thereby, the side clearance 213 can be formed over a comparatively long distance, making it possible to increase a region in which heat of the soluble portion 210 is accumulated.

The pair of wiring portions 211 are such that one of them is disposed at one side of the soluble portion 210 in the width direction of the substrate 2 and the other of them is disposed at the opposite side thereof. In the present reference example, each of the wiring portions 211 is formed to assume a hook shape (L-letter shape) having a portion extending perpendicularly from an end of the of the soluble portion 210 to a long side 81 of the substrate 2 and a portion extending horizontally to the long side 81, and the portion horizontal to the long side 81 is connected to the pad region 209.

FIG. 96 covers a sectional view taken along section line XCVIa-XCVIa of the chip part in FIG. 95, that taken along section line XCVIb-XCVIb thereof and that taken along section line XCVIc-XCVIc thereof. The sectional view taken along section line XCVIa-XCVIa shows a structure of the soluble portion 210 and that of the dummy metal 212, the sectional view taken along section line XCVIb-XCVIb shows a structure of the wiring portion 211 and the sectional view taken along section line XCVIc-XCVIc shows a structure of the pad region 209. FIG. 97 is a sectional view taken along section line XCVII-XCVII of the chip part in FIG. 95. FIG. 98 is a sectional view taken along section line XCVIII-XCVIII of the chip part in FIG. 95.

An insulating film 20 is formed on a front surface including the element forming surface 2A of the substrate 2. A fuse component 204 is formed on the insulating film 20 via a nitride film 215. The nitride film 215 is constituted of silicon nitride (SiN) and has the thickness of, for example, 8000 Å or less. The nitride film 215 is selectively formed in a region below portions other than the soluble portion 210 of the fuse component 204 (the pad region 209 and the wiring portion 211 in the present reference example) so as to be removed from below the soluble portion 210 in a region below the fuse component 204.

As described above, the portions other than the soluble portion 210 are selectively supported from below by a supporting film constituted of the nitride film 215 and, therefore, the soluble portion 210 is supported at both sides in a state of being raised in relation to the substrate 2 by portions connected to the both ends thereof (the wiring portion 211 in the present reference example). Thereby, the soluble portion 210 is disposed in relation to the substrate 2 covered by the insulating film 20, with a lower clearance 216 kept. The dummy metal 212 on the side of the soluble portion 210 is also similarly disposed in relation to the substrate 2, with the lower clearance 216 kept. Here, as shown in the cross section taken along section line XCVIa-XCVIa in FIG. 96, a side clearance 213 between the soluble portion 210 and the dummy metal 212 is set to be 0.6 μm or less, with consideration given to the thickness of a covering oxide film 218 to be described later.

In the present reference example, the lower surface of the fuse component 204 and that of the dummy metal 212 are covered by a base oxide film 217, and the covering oxide film 218 is formed so as to cover the entirety of the fuse component 204. The fuse component 204 is completely covered by the base oxide film 217 and the covering oxide film 218, by which the soluble portion 210 can be reliably insulated from the peripheries thereof.

The covering oxide film 218 is formed across the entirety of the element forming surface 2A of the substrate 2 and, as shown in FIG. 96, fixed onto the insulating film 20 in a region other than the region where the fuse component 204 and the dummy metal 212 are formed. The dummy metal 212 is covered by the covering oxide film 218 and thereby supported in a state of being raised in relation to the substrate 2 by a portion fixed to the insulating film 20 of the covering oxide film 218.

Then, laminated films such as an oxide film 219, a nitride film 220 and a resin film 222 are formed as an example of a ceiling portion so as to cover the soluble portion 210 and the dummy metal 212. The oxide film 219 is constituted of silicon oxide ($SiO_2$) and has the thickness of, for example, 10000 Å or less. The nitride film 220 is constituted of silicon nitride (SiN) and has the thickness of, for example, 11000 Å to 13000 Å. The resin film 222 is constituted of polyimide and has the thickness of, for example, 20000 Å to 100000 Å.

The laminated films 219, 220, 222 are formed above the soluble portion 210 and the dummy metals 212 so as to extend between the dummy metals 212 via the soluble portion 210, as shown in the cross section taken along section line XCVIa-XCVIa in FIG. 96. Thereby, the side clearance 213 between the soluble portion 210 and the dummy metal 212 is closed above by the laminated films 219, 220, 222. Further, with the laminated films 219, 220, 222, an oxide film 219 is selectively removed for its portion facing the side clearance 213. Thereby, a clearance 223 having the same pattern as that of the side clearance 213 is formed on the oxide film 219.

A nitride film 224 is interposed between the laminated films 219, 220, 222 and the covering oxide film 218. The nitride film 224 is selectively removed from a region above the soluble portion 210 and the dummy metal 212. Thereby, the laminated films 219, 220, 222 are disposed in relation to the soluble portion 210 covered by the covering oxide film 218, with an upper clearance 225 kept.

As shown in the cross section taken along section line XCVIc-XCVIc in FIG. 96, each of the first connection electrode 3 and the second connection electrode 4 penetrates through the laminated films 219, 220, 222, the nitride film 224 and the covering oxide film 218, and the lower surface of each of them is connected to the pad region 209.

As shown in FIG. 98, a pattern PT (refer to a cross-hatched portion in FIG. 98) is formed on the pair of pad regions 209 in an arrangement similar to that described in Reference Example 1 (refer to FIG. 70A to FIG. 71). The pattern PT according to Reference Example 5 has an arrangement in which the laminated films 219, 220, 222, the nitride film 224 and the covering oxide film 218 are laminated Therefore, raised portions 96 and a flat portion 97 similar to those described in Reference Example 1 are formed on a front surface of the first connection electrode 3 (second connection electrode 4) in Reference Example 5.

As described above, according to the chip part 1201, as shown in the cross section taken along section line XCVIa-XCVIa in FIG. 96, the clearances 213, 216, 225 are formed in all directions, at both sides of the soluble portion 210, above and below. Therefore, it is possible to accumulate heat generated at the soluble portion 210 efficiently in the peripheries (the clearances 213, 216, 225). Thus, when an excess current flows across the first connection electrode 3 and the second connection electrode 4 of the chip part 1201, the fuse component 204 can be reliably fused at the soluble portion 210.

Further, the entirety of the soluble portion 210 is surrounded in its entirety in all directions by the clearances 213, 216, 225, by which a space for coping with movement and bending of the soluble portion 210 can be secured.

Still further, a high resistance silicon substrate having a resistance value of 100 Ω·cm or higher is adopted as the substrate 2. Thus, even if the insulating film 20 is broken on fusing of the soluble portion 210, it is possible to prevent a leak current from flowing via the substrate 2 exposed at a broken site thereof.

The chip part 1201 can be obtained by performing the step of forming the fuse component 204 shown in FIG. 99 to FIG. 105, in place of the step of forming the resistor portion 56 of Reference Example 1. Hereinafter, with reference to FIG. 99 to FIG. 105, a detailed description will be given of a difference from the manufacturing step described in Reference Example 1.

Each of FIG. 99 to FIG. 105 is a sectional view for describing some of the steps of manufacturing the chip part 1201 shown in FIG. 95 in the order of steps. These include a sectional view taken along section line XCVIa-XCVIa, a sectional view taken along section line XCVIb-XCVIb and a sectional view taken along section line XCVIc-XCVIc, as shown in FIG. 96.

Figure 99:
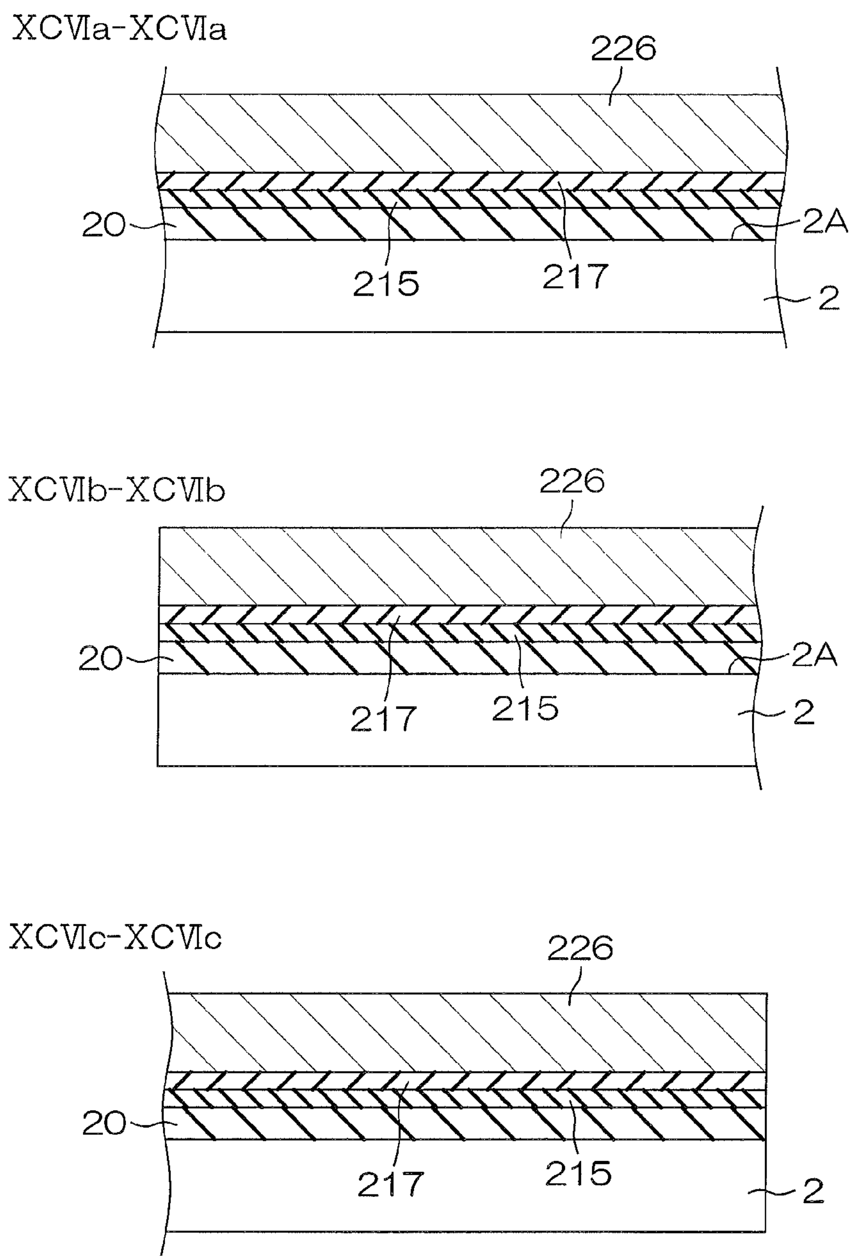

For manufacturing of the chip part 1201, first, as shown in FIG. 99, an insulating film 20 is formed. Next, for example, a CVD method is employed to deposit silicon nitride (SiN) on the insulating film 20, and a nitride film 215 is formed as a sacrifice layer. The nitride film 215 is set for the thickness which allows side etching in a subsequent etching step (refer to FIG. 102), for example, 8000 Å or less.

Next, for example, a CVD method is employed to deposit USG (un-doped silicate glass) on the nitride film 215, thereby forming a base oxide film 217. The base oxide film 217 is set for the thickness so that the film will not disappear by two subsequent etching steps (refer to FIG. 102 and FIG. 104) and, for example, 7000 Å to 9000 Å. However, the base oxide film 217 may be omitted to directly deposit a fuse component material film 226 to be described later on the nitride film 215.

Next, for example, a sputtering method is employed to deposit an AlCu alloy on the base oxide film 217, thereby forming a fuse component material film 226. The thickness of the fuse component material film 226 is, for example, 4000 Å to 6000 Å.

Figure 100:
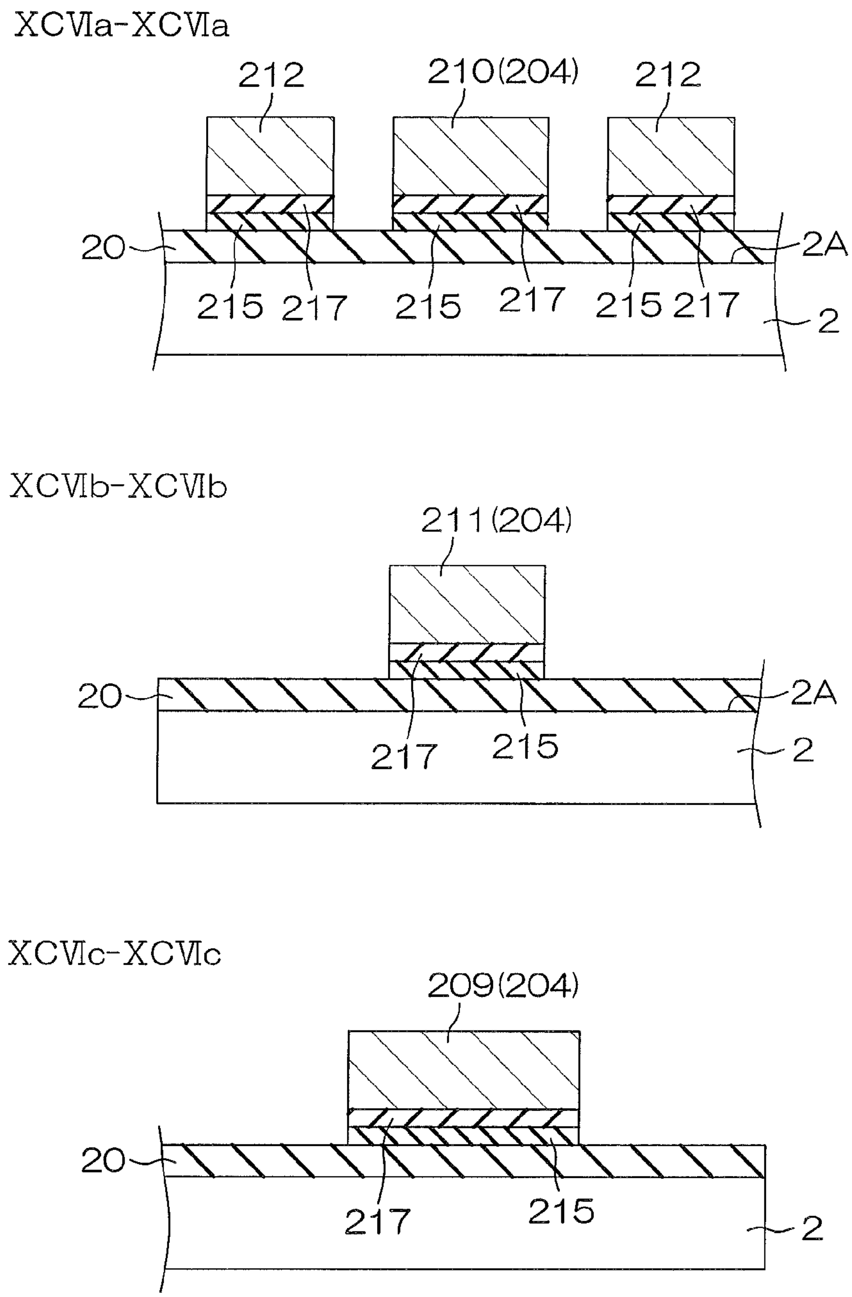

Next, as shown in FIG. 100, a mask (not shown) which selectively covers a region in which the fuse component 204 and the dummy metal 212 are to be formed is formed on the fuse component material film 226. The fuse component material film 226 is selectively removed by dry etching using the mask. Thereby, the fuse component 204 (the pad region 209, the soluble portion 210 and the wiring portion 211) as well as the dummy metals 212 are formed at the same time. Next, the base oxide film 217 and the nitride film 215 other than the regions below the fuse component 204 and the dummy metal 212 are selectively removed by dry etching using the mask used in formation of the fuse component 204.

Figure 101:
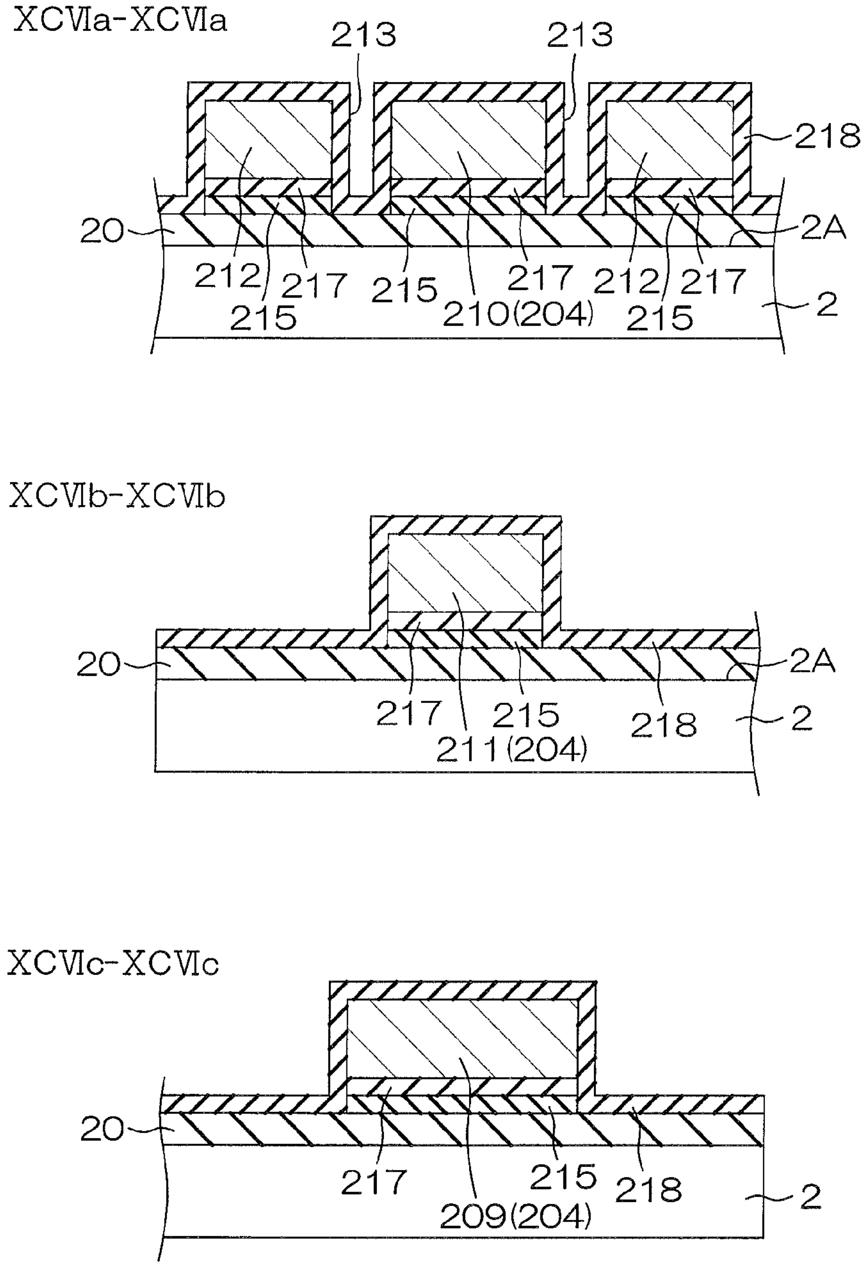

Next, as shown in FIG. 101, for example, a CVD method is employed to deposit USD on the substrate 2 to form a covering oxide film 218. The covering oxide film 218 is formed in such a manner that one front surface thereof and the other front surface thereof run along the upper surface and the side surfaces of the fuse component 204 and the dummy metal 212 for providing the side clearance 213 between the fuse component 204 (soluble portion 210) and the dummy metal 212 which are mutually adjacent. In this process, the covering oxide film 218 is set for the thickness so that the film will not disappear by two subsequent etching steps (refer to FIG. 102 and FIG. 104) and also the side clearance 213 will not be filled in a subsequent step of deposition of the nitride film 224 (refer to FIG. 103). In the present reference example, the covering oxide film 218 is set for the thickness of, for example, 7000 Å to 9000 Å so that the side clearance 213 becomes 0.6 μm or less.

Figure 102:
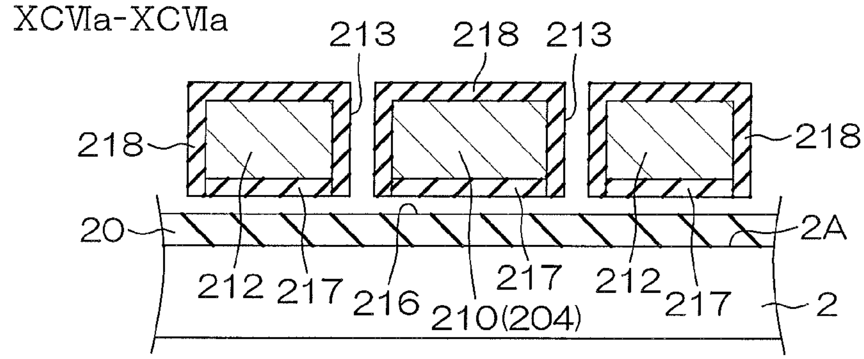
Figure 102:
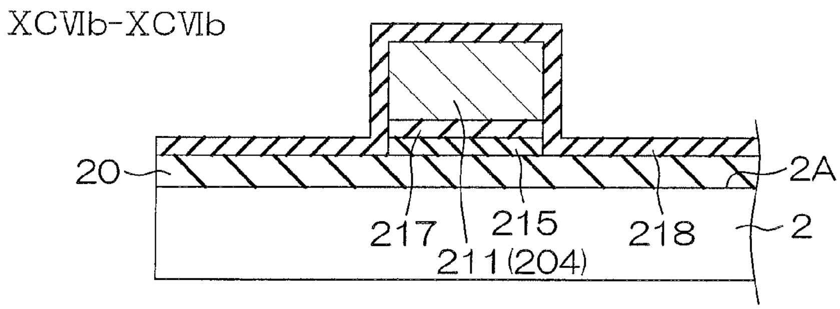
Figure 102:
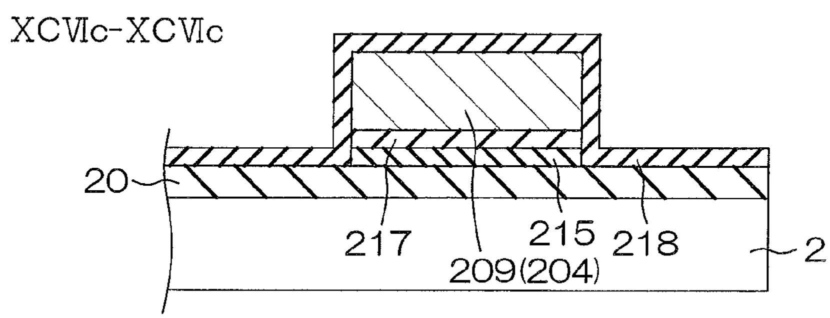

Next, as shown in FIG. 102, the nitride film 215 in a region below the fuse component 204 and the dummy metal 212 is selectively removed by using an etching gas or an etching liquid that has an etching rate relatively greater, for example, for silicon nitride (SiN) than for silicon oxide ($SiO_2$). In the present reference example, after removal of the covering oxide film 218 in the side clearance 213, the nitride film 215 is subjected to isotropic etching (side etching) and removed from a bottom portion of the side clearance 213 by dry etching using a fluorine based gas. Thereby, a lower clearance 216 is formed in a region below the fuse component 204 and the dummy metal 212, and the fuse component 204 and the dummy metal 212 are in a state of being raised in relation to the substrate 2.

Figure 103:
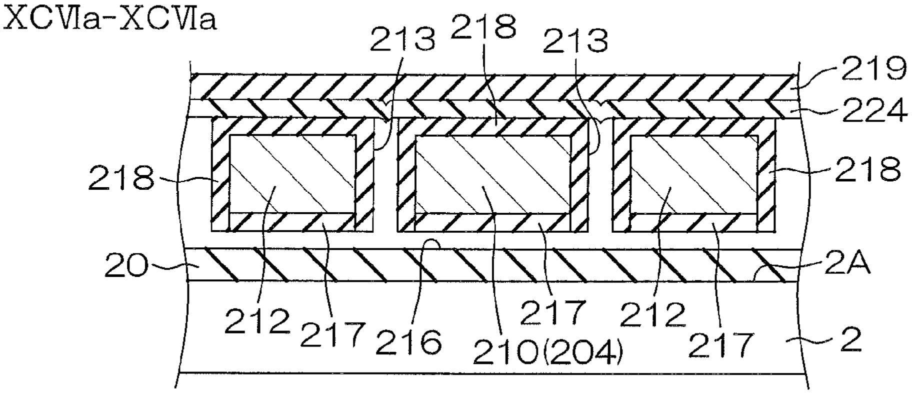
Figure 103:
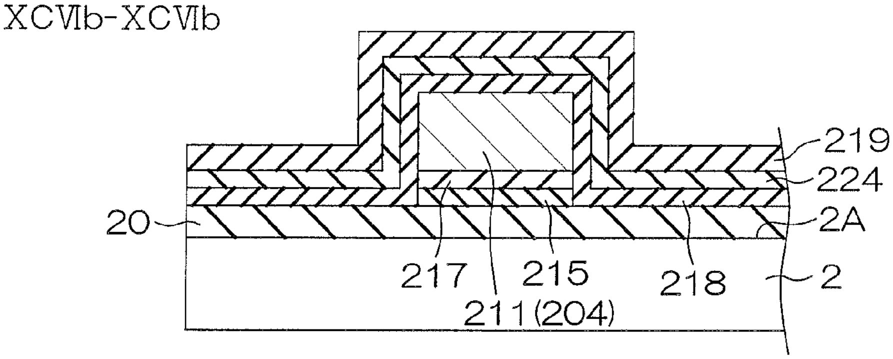
Figure 103:
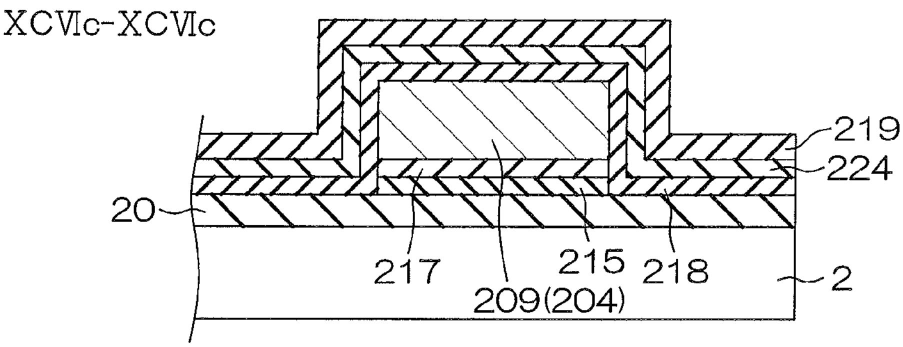

Next, as shown in FIG. 103, for example, a CVD method is employed to deposit silicon nitride (SiN) and USG on the substrate 2 sequentially, thereby forming a nitride film 224 and an oxide film 219 as a sacrifice layer. In this case, the side clearance 213 is 0.6 μm or less and, therefore, the nitride film 224 and the oxide film 219 are formed to extend between a pair of dummy metals 212 for covering the soluble portion 210.

Figure 104:
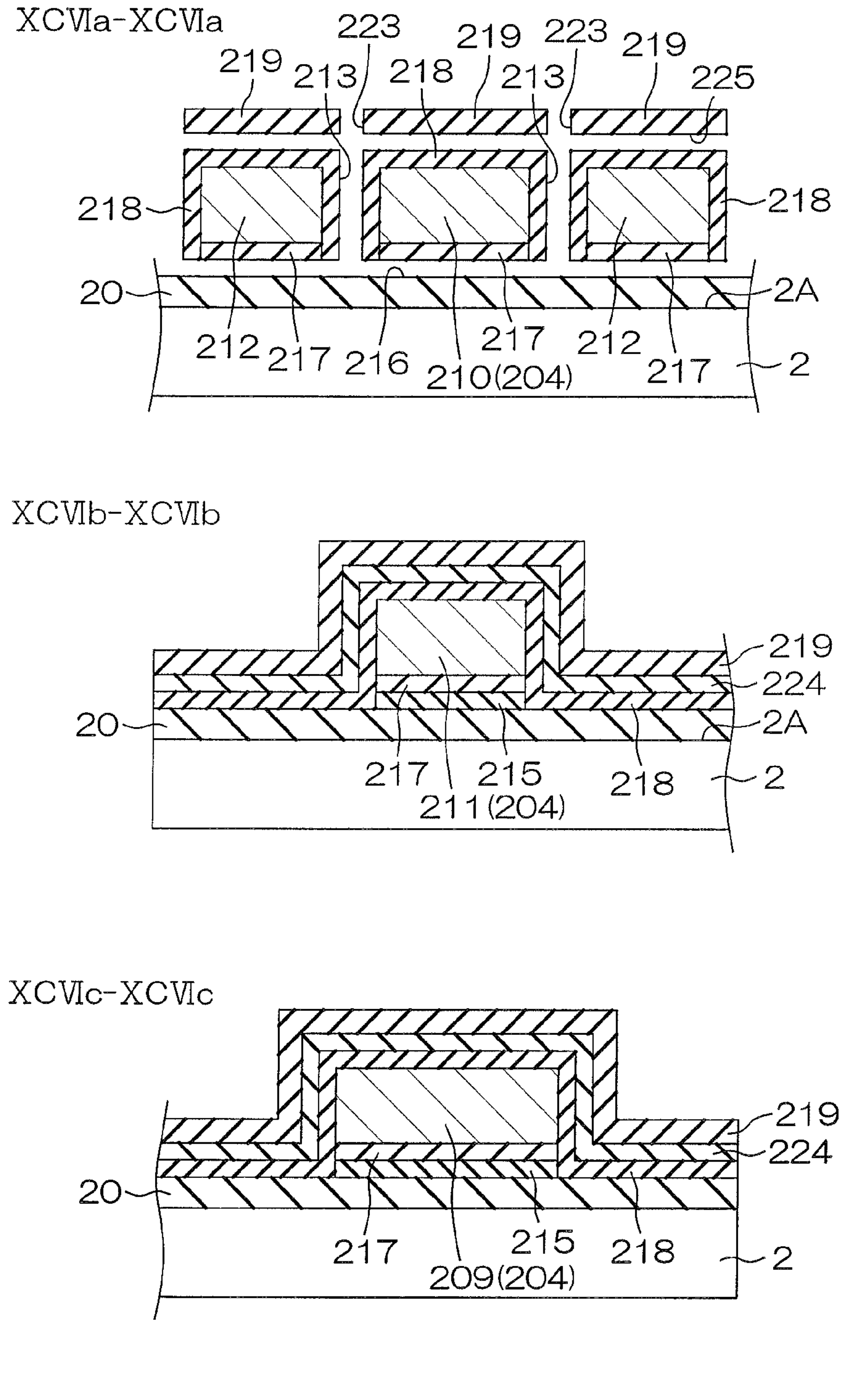

Next, as shown in FIG. 104, the nitride film 224 in a region above the fuse component 204 and the dummy metal 212 is selectively removed by using an etching gas or an etching liquid that has an etching rate relatively greater, for example, for silicon nitride (SiN) than for silicon oxide ($SiO_2$). In the present reference example, after formation of a clearance 223 having the same pattern as that of the side clearance 213 on the oxide film 219, the nitride film 224 is subjected to isotropic etching (side etching) and removed from a bottom portion of the clearance 223 by dry etching using a fluorine based gas. Thereby, an upper clearance 225 is formed in a region above the fuse component 204 and the dummy metal 212.

Figure 105:
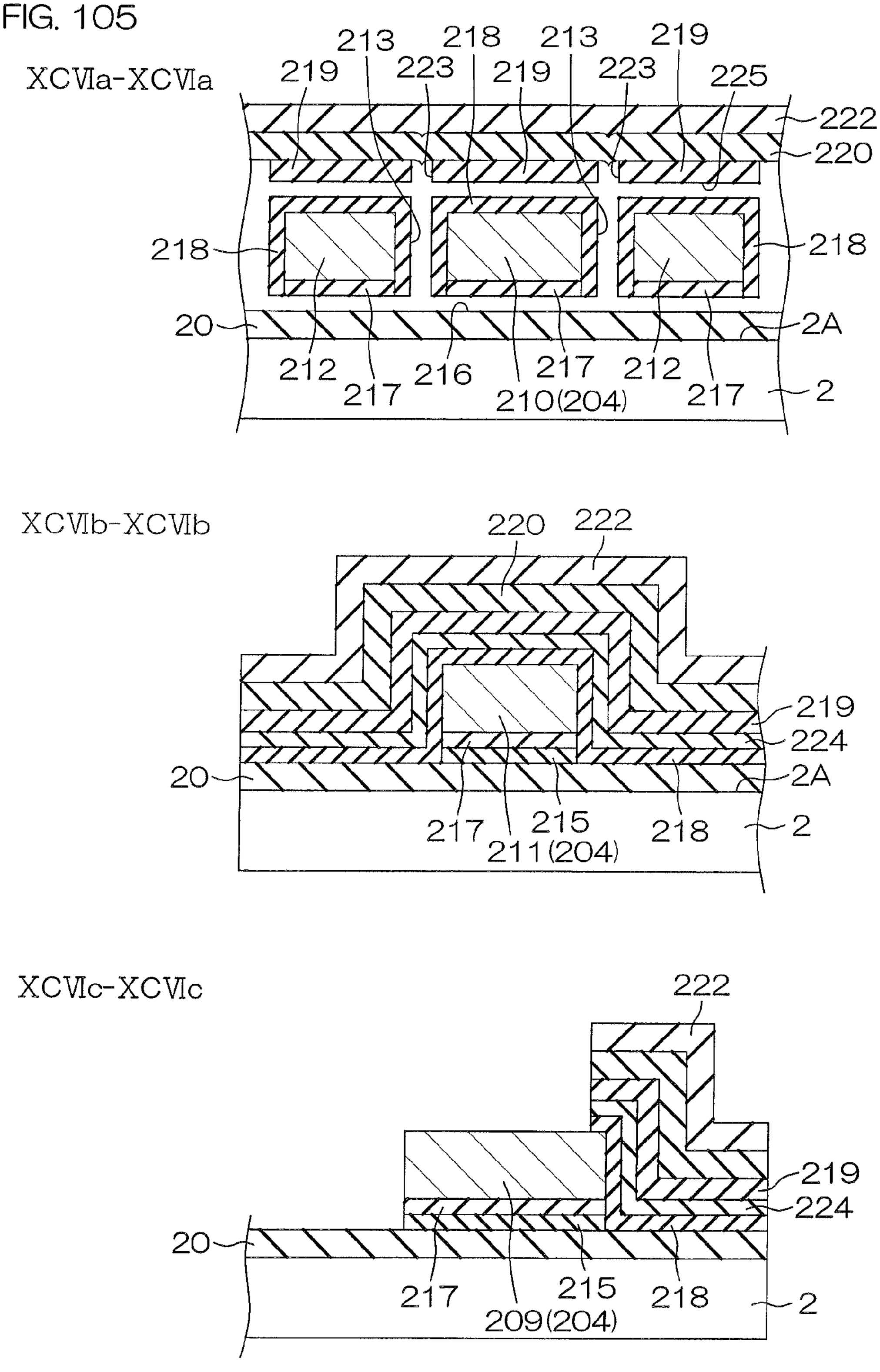

Next, as shown in FIG. 105, for example, a CVD method is employed to deposit silicon nitride (SiN) on the oxide film 219, thereby forming a nitride film 220. Next, polyimide is coated on the nitride film 220 to cure the polyimide, thereby forming a resin film 222. Next, the laminated films 218, 224, 219, 220, 222 on the pad region 209 of the fuse component 204 are selectively removed by etching, thereby forming a pad region 209 in which a pattern PT including the laminated films 219, 220, 222, the nitride film 224 and the covering oxide film 218 is formed (refer to cross-hatched portion in FIG. 98).

Then, plating is applied to the pad region 209 exposed from the pattern PT including the laminated films 219, 220, 222, the nitride film 224 and the covering oxide film 218, thereby forming at the same time a first connection electrode 3 and a second connection electrode 4, each of which has a plurality of raised portions 96 and a flat portion 97 on the front surface. The chip part 1201 is obtained by performing these steps.

As described above, according to the manufacturing step of the chip part 1201, a difference in etching rate between the nitride film 215, the base oxide film 217 and the covering oxide film 218 can be used to easily etch the nitride film 215 in the region below the fuse component 204 and the dummy metal 212 by isotropic etching (refer to FIG. 102). In a similar manner, the difference in etching rate can be used to easily etch the nitride film 224 in the region above the fuse component 204 and the dummy metal 212 (refer to FIG. 104). Further, the fuse component 204 and the dummy metal 212 are made of the same material or an AlCu alloy and, therefore, as shown in FIG. 100, they can be formed in the same step.

Therefore, it is possible to manufacture efficiently the chip part 1201 in which the fuse component 204 can be reliably fused at the soluble portion 210 upon inflow of an excess current.

As described so far, even where the fuse component 204 is formed in the element region 5, the same effects to those described in Reference Example 1 can be obtained.

<Diode>

FIG. 106 is a plan view of a chip part 1301 according to Reference Example 6. FIG. 107 is a sectional view taken along section line CVII-CVII in FIG. 106. FIG. 108 is a sectional view taken along section line CVIII-CVIII in FIG. 106. FIG. 109 is a sectional view taken along section line CIX-CIX in FIG. 106.

The chip part 1301 according to Reference Example 6 is different from the chip part 1001 of Reference Example 1 in that diode cells D301 to D304 are formed as a circuit element formed in an element region 5 in place of the resistor portion 56. The chip part 1301 is similar in other arrangements to the chip part 1001 according to Reference Example 1. In FIG. 106 to FIG. 109, the portions corresponding to the individual portions described in FIG. 1 to FIG. 105 are given the same reference numerals.

The chip part 1301 includes a substrate 2, a plurality of diode cells D301 to D304 formed in the substrate 2, and a cathode electrode 303 and an anode electrode 304 which connect the plurality of diode cells D301 to D304 in parallel. A first connection electrode 3 is connected to the cathode electrode 303 in a similar arrangement as that of Reference Example 1, and a second connection electrode 4 is connected to the anode electrode 304 in a similar arrangement as that of Reference Example 1.

In the present reference example, the substrate 2 is a $p^+$-type semiconductor substrate (for example, a silicon substrate). A cathode pad 305 for connection with the cathode electrode 303 and an anode pad 306 for connection with the anode electrode 304 are disposed at both ends of the substrate 2. A diode cell region 307 is provided between the pads 305, 306 (that is, the element region 5).

In the present reference example, the diode cell region 307 is formed in a rectangular shape. The plurality of diode cells D301 to D304 are disposed within the diode cell region 307. In the present reference example, the plurality (four) of diode cells D301 to D304 are provided and they are two-dimensionally aligned in a matrix form at equal intervals along the long direction and also along the short direction of the substrate 2.

FIG. 110 is a plan view which shows a structure of the front surface of the substrate 2 by removing the cathode electrode 303, the anode electrode 304 and an arrangement formed thereon in the chip part 1301 of FIG. 106.

An $n^+$-type region 310 is formed within a region of each of the diode cells D301 to D304 in a surface layer region of the substrate 2. The $n^+$-type region 310 is separated for each of the diode cells. Thereby, each of the diode cells D301 to D304 is provided with a p-n junction region 311 separated for each diode cell.

In the present reference example, each of the plurality of diode cells D301 to D304 is formed equal in size and shape, specifically, formed in a rectangular shape. The $n^+$-type region 310 is formed in a polygonal shape within each rectangular region of the diode cells. In the present reference example, the $n^+$-type region 310 is formed in an octagonal shape and provided with four sides respectively along four sides which form a rectangular region of each of the diode cells D301 to D304 and four other sides respectively facing four corners in each rectangular region of the diode cells D301 to D304. In the surface layer region of the substrate 2, a $p^+$-type region 312 is also formed separated from the $n^+$-type region 310, at a predetermined interval. The $p^+$-type region 312 is formed within the diode cell region 307 in a pattern which avoids a region in which the cathode electrode 303 is disposed.

As shown in FIG. 107 to FIG. 109, an insulating film 20 is formed on the front surface of the substrate 2. The insulating film 20 is provided with a contact hole 316 which exposes a front surface of the $n^+$-type region 310 of each of the diode cells D301 to D304 and a contact hole 317 of the $p^+$-type region 312. The cathode electrode 303 and the anode electrode 304 are formed on the front surface of the insulating film 20. The cathode electrode 303 enters from the front surface of the insulating film 20 into the contact hole 316, thereby providing an ohmic contact inside the contact hole 316 in relation to each of the $n^+$-type regions 310 of the diode cells D301 to D304. The anode electrode 304 extends from the front surface of the insulating film 20 into the inner side of the contact hole 317, thereby providing an ohmic contact inside the contact hole 317 in relation to the $p^+$-type region 312. In the present reference example, each of the cathode electrode 303 and the anode electrode 304 is constituted of an electrode film made of the same material.

As the electrode film, a Ti/Al laminated film in which a Ti film is given as a lower layer and an Al film is given as an upper layer or an AlCu film may be used. Further, an AlSi film may be used as the electrode film. Use of the AlSi film makes it possible to provide an ohmic contact between the anode electrode 304 and the substrate 2 without forming the $p^+$-type region 312 on the front surface of the substrate 2. Thus, a step of forming the $p^+$-type region 312 may be omitted.

The cathode electrode 303 is separated from the anode electrode 304 by a slit 318. In the present reference example, the slit 318 is formed in a frame shape (that is, an octagonal frame shape) coinciding with a planar shape of the $n^+$-type region 310 so as to rim an $n^+$-type region 310 of each of the diode cells D301 to D304. Accordingly, the cathode electrode 303 is provided with a cell bonding portion 303*a* formed in a planar shape (that is, an octagonal shape) coinciding with the $n^+$-type region 310 at the region of each of the diode cells D301 to D304. A rectilinear bridging portion 303*b* is communicatively connected with the cell bonding portion 303*a*, and another rectilinear bridging portion 303*c* is further connected to an external connection portion 303*d* which is formed in a large rectangular shape directly below the cathode pad 305. On the other hand, the anode electrode 304 is formed on the front surface of the insulating film 20 so as to surround the cathode electrode 303, while keeping an interval corresponding to the slit 318 having a substantially constant width. And, the anode electrode 304 extends to a rectangular region directly below the anode pad 306 and is formed integrally.

The cathode electrode 303 and the anode electrode 304 are covered by a passivation film 320 (not illustrated in FIG. 106) constituted of, for example, a nitride film, and a resin film 321 made of polyimide, etc., is also formed on the passivation film 320. On the passivation film 320 and the resin film 321, notched portions 322, 323 for exposing peripheral edge portions which face the respective side surface portions of the first connection electrode 3 and the second connection electrode 4 are formed. And, the notched portions are connected to the pads 305, 306 to which the previously described first connection electrode 3 and the second connection electrode 4 correspond respectively.

In each of the diode cells D301 to D304, a p-n junction region 311 is formed between the substrate 2 and the $n^+$-type region 310 and, therefore, a p-n junction diode is formed in each of the diode cells. Then, the $n^+$-type regions 310 of the plurality of diode cells D301 to D304 are connected in common to the cathode electrode 303, and the substrate 2 which is a common p-type ($p^+$-type) region of the diode cells D301 to D304 is connected in common via the $p^+$-type region 312 to the anode electrode 304. Thereby, the plurality of diode cells D301 to D304 formed on the substrate 2 are all connected in parallel.

With reference to FIG. 109, a pattern PT is formed on the front surface of the cathode pad 305 in a similar arrangement to that described in Reference Example 1 (refer to FIG. 70A to FIG. 71). The pattern PT according to the present reference example includes the passivation film 320 and the resin film 321. Thereby, raised portions 96 and a flat portion 97 similar to those described in Reference Example 1 are formed on the front surface of the first connection electrode 3 in Reference Example 6. The second connection electrode 4 is similar in arrangement to the first connection electrode 3 and, therefore, an illustration and a description thereof are omitted.

FIG. 111 is an electric circuit diagram which shows an electrical structure of the interior of the chip part 1301.

The p-n junction diode which is arranged by each of the diode cells D301 to D304 is such that the cathode side thereof is connected in common by the cathode electrode 303 (the first connection electrode 3) and the anode side thereof is connected in common by the anode electrode 304 (the second connection electrode 4). Thus, all the p-n junction diodes are connected in parallel and function as one diode as a whole.

According to the arrangement of the present reference example, the chip part 1301 has the plurality of diode cells D301 to D304, and each of the diode cells D301 to D304 has the p-n junction region 311. The p-n junction region 311 is separated for each of the diode cells D301 to D304. Therefore, the chip part 1301 is longer in peripheral length of the p-n junction region 311, that is, a total peripheral length (total extension) of the $n^+$-type regions 310 of the substrate 2. Thereby, it is possible to avoid the concentration of electrical fields in the vicinity of the p-n junction region 311 and disperse the electrical fields, thereby improving ESD resistance. That is, even where the chip part 1301 is formed to be small, the p-n junction region 311 can be increased in total peripheral length to downsize the chip part 1301 and secure the ESD resistance at the same time.

FIG. 112 shows an experimental result obtained by measuring ESD resistance of a plurality of samples made different in total peripheral length (total extension) of the p-n junction region by setting in various ways the size of the diode cell and/or the number of the diode cells formed on a semiconductor substrate equal in area. The experimental result shows that the longer the peripheral length of the p-n junction region is, the greater the ESD resistance becomes. Four or more diode cells have been formed on a semiconductor substrate to realize the ESD resistance exceeding 8 kilovolts.

The chip part 1301 can be obtained by performing a step of forming the diode cell D301 to D304 in place of the step of forming the resistor portion 56 described in Reference Example 1. Hereinafter, a detailed description will be given of a difference from the manufacturing step of Reference Example 1.

That is, first, an insulating film 20 is formed on the front surface of the substrate 2 ($p^+$-type semiconductor substrate) and a resist mask is formed thereon. The $n^+$-type region 310 is formed by ion implantation or diffusion of n-type impurity (for example, phosphorus) via the resist mask. Further, another resist mask having an opening which coincides with the $p^+$-type region 312 is formed, and the $p^+$-type region 312 is formed by ion implantation or diffusion of p-type impurity (for example, arsenic) via the resist mask. The resist mask is peeled off and the insulating film 20 is increased in thickness (for example, CVD is performed to increase the thickness of the film), whenever necessary. Thereafter, still another resist mask which has openings coinciding with the contact holes 316, 317, are formed on the insulating film 20. The contact holes 316, 317 are formed by etching via the resist mask.

Next, an electrode film which constitutes the cathode electrode 303 and the anode electrode 304 is formed on the insulating film 20, for example, by performing sputtering. Then, a resist film having an opening pattern corresponding to a slit 318 is formed on the electrode film, and the slit 318 is formed on the electrode film by etching via the resist film. The electrode film is thereby separated into the cathode electrode 303 and the anode electrode 304.

Next, after the resist film has been peeled off, a passivation film 320 made of a nitride film, etc., is formed, for example, by a CVD method, and polyimide, etc., are coated thereon to form a resin film 321. The passivation film 320 and the resin film 321 are subjected to etching using photolithography, thereby forming notched portions 322, 323 and also a pattern PT including the passivation film 320 and the resin film 321 is formed on the front surface of each of the cathode pad 305 and the anode pad 306 in an arrangement similar to that described in Reference Example 1. Thereafter, through a step similar to that described in Reference Example 1, the chip part 1301 having the first connection electrode 3 and the second connection electrode 4 is formed.

FIG. 113 is a sectional view which shows a chip part 1329 of Reference Example 7. The portions corresponding to individual portions described in FIG. 1 to FIG. 112 are given the same reference numerals in FIG. 113. In FIG. 113, for the sake of description, the pattern PT is omitted.

The chip part 1329 is such that a cathode electrode 303 is disposed on a front surface of a substrate 2 and an anode electrode 328 is disposed on a rear surface of the substrate 2. Therefore, in the present reference example, there is no need for providing the anode pad 306 on the front surface side (the cathode electrode 303 side) of the substrate 2. Accordingly, it is possible to downsize the substrate 2 and increase the number of diode cells D301 to D304. The cathode electrode 303 is formed so as to cover substantially across the entirety of the front surface of the substrate 2, providing an ohmic contact in relation to an $n^+$-type region 310 of each of the diode cells D301 to D304. The anode electrode 328 provides an ohmic contact in relation to the rear surface of the substrate 2. The anode electrode 328 may be made of, for example, gold.

FIG. 114 is a plan view of a chip part 1331 of Reference Example 8. FIG. 115 is a sectional view taken along section line CXV-CXV in FIG. 114. FIG. 116 is a sectional view taken along section line CXVI-CXVI in FIG. 114. In FIG. 114 to FIG. 116, the portions corresponding to the individual portions of FIG. 1 to FIG. 113 are given the same reference numerals.

The chip part 1331 is provided with a substrate 2, an anode electrode 334 and a cathode electrode 333 formed on the substrate 2, and a plurality of diode cells D311 to D314 connected in parallel across the cathode electrode 333 and the anode electrode 334. The substrate 2 is formed substantially in a rectangular shape in a plan view, and a cathode pad 335 and an anode pad 336 are disposed respectively at both ends in the long direction thereof. A diode cell region 337 formed in a rectangular shape is set between the cathode pad 335 and the anode pad 336 (that is, an element region 5). The plurality of diode cells D311 to D314 are aligned two-dimensionally within the diode cell region 337. In the present reference example, the plurality of diode cells D311 to D314 are aligned in a matrix form along the long direction and the short direction of the substrate 2 at an equal interval.

Each of the diode cells D311 to D314 is constituted of a rectangular region and provided with a Schottky junction region 341 which is formed in a polygonal shape (an octagonal shape in the present reference example) in a plan view in the interior of the rectangular region. A Schottky metal 340 is disposed so as to be in contact with each of the Schottky junction regions 341. That is, the Schottky metal 340 provides a Schottky junction between the Schottky metal 340 and the substrate 2 in the Schottky junction region 341.

In the present reference example, the substrate 2 is provided with a p-type silicon substrate 350 and an n-type epitaxial layer 351 which is epitaxially grown thereon. As shown in FIG. 115, on the substrate 2, an $n^+$-type embedded layer 352 which is formed by introducing n-type impurity (for example, arsenic) provided on the front surface of the p-type silicon substrate 350 may be formed. The Schottky junction region 341 is set on the front surface of the n-type epitaxial layer 351, and the Schottky metal 340 is bonded to the front surface of the n-type epitaxial layer 351, thereby forming the Schottky junction. A guard ring 353 is formed for suppressing leakage of a contact edge in the peripheries of the Schottky junction region 341.

The Schottky metal 340 may be made of, for example, Ti or TiN, and a cathode electrode 333 is arranged by laminating a metal film 342 such as an AiSi alloy on the Schottky metal 340. The Schottky metal 340 may be separated for each of the diode cells D311 to D314. However, in the present reference example, the Schottky metal 340 is formed so as to be commonly in contact with the Schottky junction region 341 of each of the plurality of diode cells D311 to D314.

On the n-type epitaxial layer 351, an $n^+$-type well 354 which reaches from the front surface of the n-type epitaxial layer 351 to the $n^+$-type embedded layer 352 is formed in a region which avoids the Schottky junction region 341. And, an anode electrode 334 is formed so as to provide an ohmic contact in relation to the front surface of the $n^+$-type well 354. The anode electrode 334 may be formed of an electrode film which is similar in arrangement to the cathode electrode 333.

An insulating film 20 is formed on the front surface of the n-type epitaxial layer 351. A contact hole 346 corresponding to a Schottky junction region 341 and a contact hole 347 for exposing the $n^+$-type well 354 are formed on the insulating film 20. The cathode electrode 333 is formed so as to cover the insulating film 20 and reaches the interior of the contact hole 346, thereby providing a Schottky junction between the cathode electrode 333 and the n-type epitaxial layer 351 within the contact hole 346. On the other hand, the anode electrode 334 is formed on the insulating film 20 and extends within the contact hole 347, thereby providing an ohmic contact within the contact hole 347 in relation to the $n^+$-type well 354. The cathode electrode 333 is separated from the anode electrode 334 by a slit 348.

A passivation film 356 which is constituted of, for example, a nitride film is formed so as to cover the cathode electrode 333 and the anode electrode 334. Further, a resin film 357 which is made of polyimide, etc., is formed so as to cover the passivation film 356. A notched portion 358 which penetrates through the passivation film 356 and the resin film 357 to expose a portion of a region of the front surface of the cathode electrode 333 which will act as the cathode pad 335 is formed. A notched portion 359 which penetrates through the passivation film 356 and the resin film 357 to expose a portion of a region of the front surface of the anode electrode 334 which will act as the anode pad 336 is also formed.

With reference to FIG. 116, a pattern PT is formed in an arrangement similar to that of Reference Example 1 on a front surface of a metal film 342 (the cathode electrode 333) on the Schottky metal 340 (refer to FIG. 70A to FIG. 71). The pattern PT according to the present reference example includes the passivation film 356 and the resin film 357. Thereby, raised portions 96 and a flat portion 97 similar to those of Reference Example 1 are formed on the front surface of the first connection electrode 3 in Reference Example 8. The second connection electrode 4 is similar in arrangement to the first connection electrode 3 and, therefore, an illustration and a description will be omitted. Then, the first connection electrode 3 and the second connection electrode 4 are formed so as to be respectively connected to pads 335, 336 in an arrangement similar to that of Embodiment 1.

With the arrangement, the cathode electrode 333 is connected in common to a Schottky junction region 341 of each of the diode cells D311 to D314. Also, the anode electrode 334 is connected to an n-type epitaxial layer 351 via an $n^+$-type well 354 and an $n^+$-type embedded layer 352. Therefore, the anode electrode 334 is connected in parallel in common to a Schottky junction region 341 formed in each of the plurality of diode cells D311 to D314. Thereby, a plurality of Schottky barrier diodes, each of which has a Schottky junction region 341 formed in each of the plurality of diode cells D311 to D314, are connected in parallel between the cathode electrode 333 and the anode electrode 334.

As described above, in the present reference example as well, each of the plurality of diode cells D311 to D314 has a Schottky junction region 341 which is mutually separated, thus resulting in an increase in total extension of the peripheral length of the Schottky junction regions 341 (the peripheral length of the Schottky junction regions 341 on the front surface of the n-type epitaxial layer 351). Thereby, the concentration of electrical fields can be suppressed to improve ESD resistance. That is, even where the chip part 1331 is formed to be small, the total peripheral length of the Schottky junction regions 341 can be increased to downsize the chip part 1331 and secure the ESD resistance at the same time.

FIG. 117 is a sectional view of a chip part 1349 of Reference Example 9. In FIG. 117, the portions corresponding to the individual portions shown in FIG. 1 to FIG. 116 are given the same reference numerals. In FIG. 113, for the sake of description, a pattern PT which includes a passivation film 356 and a resin film 357 formed on a cathode pad 335 is omitted.

In the chip part 1349, a substrate 2 includes an $n^+$-type silicon substrate 372 and an n-type epitaxial layer 351 which is formed on a front surface of an $n^+$-type silicon substrate 372. Then, an anode electrode 373 is formed so as to provide an ohmic contact in relation to the rear surface of the substrate 2 (a front surface opposite to the front surface of the n-type epitaxial layer 351). No anode electrode is formed on the front surface of the n-type epitaxial layer 351 and only a cathode electrode 333 is formed which is connected in parallel to a Schottky junction region 341 formed on the n-type epitaxial layer 351.

With this arrangement, it is also possible to provide the operations and effects similar to those described in Reference Example 8. In addition, there is no need for providing the anode electrode on the front surface of the n-type epitaxial layer 351. Thus, a larger number of diode cells can be disposed on the front surface of the n-type epitaxial layer 351 and the Schottky junction regions 341 can be further increased in total extension of the peripheral length thereof to improve the ESD resistance. Alternatively, the $n^+$-type silicon substrate 372 can be decreased in dimension to further downsize the chip diode, with the ESD resistance being secured.

<Bidirectional Zener Diode>

FIG. 118 is a plan view of a chip part 1401 according to Reference Example 10. FIG. 119 is a sectional view taken along section line CXIX-CXIX in FIG. 118. FIG. 120 is a sectional view taken along section line CXX-CXX in FIG. 118. FIG. 121 is a sectional view taken along section line CXXI-CXXI in FIG. 118.

The chip part 1401 according to Reference Example 10 is different from the chip part 1001 of Reference Example 1 in that as a circuit element formed in an element region 5, a first Zener diode D401 and a second Zener diode D402 are formed in place of the resistor portion 56. The chip part 1401 is similar in other arrangements to the chip part 1001 according to Reference Example 1. In FIG. 118 to FIG. 121, the portions corresponding to the individual portions shown in FIG. 1 to FIG. 117 are given the same reference numerals.

The chip part 1401 includes a substrate 2 (for example, a $p^+$-type silicon substrate), a first Zener diode D401 which is formed on the substrate 2, a second Zener diode D402 which is formed on the substrate 2 and connected to the first Zener diode D401 by anti-series connection, a first connection electrode 3 which is connected to the first Zener diode D401 and a second connection electrode 4 which is connected to the second Zener diode D402. The first Zener diode D401 is arranged by a plurality of Zener diodes D411, D412. The second Zener diode D402 is arranged by a plurality of Zener diodes D421, D422.

The first connection electrode 3 connected to a first electrode film 403 and the second connection electrode 4 connected to a second electrode film 404 are disposed at both ends of an element forming surface 2A of Reference Example 10. A diode forming region 407 is provided on the element forming surface 2A between the first connection electrode 3 and the second connection electrode 4. In the present reference example, the diode forming region 407 is formed in a rectangular shape.

FIG. 122 is a plan view which shows a structure of the front surface (element forming surface 2A) of the substrate 2 by removing the first connection electrode 3 and the second connection electrode 4 as well as an arrangement formed thereon in the chip part 1401 shown in FIG. 118.

With reference to FIG. 118 and FIG. 122, in a surface layer region of the substrate 2 ($p^+$-type semiconductor substrate), a plurality of first $n^+$-type diffusion regions (hereinafter, referred to as “first diffusion regions 410”) are formed, each of which forms a p-n junction region 411 in relation to the substrate 2. Further, in the surface layer region of the substrate 2, a plurality of second $n^+$-type diffusion regions (hereinafter, referred to as "second diffusion regions 412") are formed, each of which forms a p-n junction region 413 in relation to the substrate 2.

In the present reference example, each two of the first diffusion regions 410 and the second diffusion regions 412 are formed. These four diffusion regions 410, 412 are such that the first diffusion regions 410 and the second diffusion regions 412 are alternately aligned along the short direction of the substrate 2, at an equal interval. Further, these four diffusion regions 410, 412 are formed longitudinally by extending in a direction intersecting with the short direction of the substrate 2 (in the present reference example, in an orthogonal direction). In the present reference example, the first diffusion region 410 and the second diffusion region 412 are formed so as to be equal in size and shape. Specifically, the first diffusion region 410 and the second diffusion region 412 are formed substantially in a rectangular shape which is longer in the long direction of the substrate 2 in a plan view and with four corners being removed.

Two Zener diodes S411, D412 are arranged, or each of which is arranged by each of the first diffusion regions 410 and a vicinity portion of the first diffusion region 410 in the substrate 2. And, the first Zener diode D401 is arranged by the two Zener diodes D411, D412. The first diffusion region 410 is separated for each of the Zener diodes D411, D412. Thereby, each of the Zener diodes D411, D412 is provided with a p-n junction region 411 separated for each Zener diode.

In a similar manner, two Zener diodes D421, D422 are arranged, each of which is arranged by each of the second diffusion regions 412 and a vicinity portion of the second diffusion region 412 in the substrate 2. And, the second Zener diode D402 is arranged by these two Zener diodes D421, D422. The second diffusion region 412 is separated for each of the Zener diodes D421, D422. Thereby, each of the Zener diodes D421, D422 is provided with a p-n junction region 413 separated for each Zener diode.

As shown in FIG. 119 and FIG. 120, an insulating film 20 (not illustrated in FIG. 118) is formed on an element forming surface 2A of the substrate 2. The insulating film 20 is provided with a first contact hole 416 for exposing a front surface of each of the first diffusion regions 410 and a second contact hole 417 for exposing a front surface of each of the second diffusion regions 412. A first electrode film 403 and a second electrode film 404 are formed on a front surface of the insulating film 20.

The first electrode film 403 is provided with a lead-out electrode L411 which is connected to the first diffusion region 410 corresponding to the Zener diode D411, a lead-out electrode L412 which is connected to the first diffusion region 410 corresponding to the Zener diode D412, and a first pad 405 which is formed integrally with the lead-out electrode L411, L412 (the first lead-out electrode). The first pad 405 is formed in a rectangular shape at one end of the element forming surface 2A. The first connection electrode 3 is connected to the first pad 405. As described above, the first connection electrode 3 is connected in common to the lead-out electrodes L411, L412.

The second electrode film 404 is provided with a lead-out electrode L421 which is connected to the second diffusion region 412 corresponding to the Zener diode D421, a lead-out electrode L422 which is connected to the second diffusion region 412 corresponding to the Zener diode D422 and a second pad 406 which is formed integrally with the lead-out electrodes L421, L422 (the second lead-out electrode). The second pad 406 is formed in a rectangular shape at one end of the element forming surface 2A. The second connection electrode 4 is connected to the second pad 406. As described above, the second connection electrode 4 is connected in common to the lead-out electrodes L421, L422.

The lead-out electrode L411 enters into the first contact hole 416 of the Zener diode D411 from the front surface of the insulating film 20 and provides an ohmic contact inside the first contact hole 416 in relation to the first diffusion region 410 of the Zener diode D411. In the lead-out electrode L411, a portion which is bonded by the Zener diode D411 inside the first contact hole 416 constitutes a bonding portion C411. In a similar manner, the lead-out electrode L412 enters into the first contact hole 416 of the Zener diode D412 from the front surface of the insulating film 20 and provides an ohmic contact inside the first contact hole 416 in relation to the first diffusion region 410 of the Zener diode D412. In the lead-out electrode L412, a portion which is bonded by the Zener diode D412 inside the first contact hole 416 constitutes a bonding portion C412.

The lead-out electrode L421 enters into the second contact hole 417 of the Zener diode D421 from the front surface of the insulating film 20 and provides an ohmic contact inside the second contact hole 417 in relation to the second diffusion region 412 of the Zener diode D421. In the lead-out electrode L421, a portion which is bonded by the Zener diode D421 inside the second contact hole 417 constitutes a bonding portion C421. In a similar manner, the lead-out electrode L422 enters into the second contact hole 417 of the Zener diode D422 from the front surface of the insulating film 20 and provides an ohmic contact inside the second contact hole 417 in relation to the second diffusion region 412 of the Zener diode D422. In the lead-out electrode L422, a portion which is bonded by the Zener diode D422 inside the second contact hole 417 constitutes a bonding portion C422. In the present reference example, the first electrode film 403 and the second electrode film 404 are made of the same material. In the present reference example, an Al film is used as the electrode film.

The first electrode film 403 is separated from the second electrode film 404 by a slit 418. The lead-out electrode L411 is formed in a rectilinear shape along a straight line passing over the first diffusion region 410 corresponding to the Zener diode D411 to the first pad 405. In a similar manner, the lead-out electrode LA12 is formed in a rectilinear shape along a straight line passing over the first diffusion region 410 corresponding to the Zener diode D412 to the first pad 405. Each of the lead-out electrodes L411, LA12 is formed uniform in width at a site between the corresponding first diffusion region 410 and the first pad 405, and the width thereof is greater than the width of each of the bonding portions C411, C412. The width of each of the bonding portions C411, C412 is defined by the length of each of the lead-out electrodes L411, LA12 in a direction orthogonal to a leading-out direction. The leading end portion of each of the lead-out electrodes L411, L412 is shaped so as to coincide with a planar shape of the corresponding first diffusion region 410. The base end portion of each of the lead-out electrodes L411, L412 is connected to the first pad 405.

The lead-out electrode L421 is formed in a rectilinear shape along a straight line passing over the second diffusion region 412 corresponding to the Zener diode D421 to the second pad 406. In a similar manner, the lead-out electrode L422 is formed in a rectilinear shape along a straight line passing over the second diffusion region 412 corresponding to the Zener diode D422 to the second pad 406. Each of the lead-out electrodes L421, L422 is formed uniform in width at a site between the corresponding second diffusion region 412 and the second pad 406, and the width thereof is greater than the width of each of the bonding portions C421, C422. The width of each of the bonding portions C421, C422 is defined by the length of each of the lead-out electrodes L421, L422 in a direction orthogonal to a leading out direction. The leading end portion of each of the lead-out electrodes L421, L422 is shaped so as to coincide with a planar shape of the corresponding second diffusion region 412. The base end portion of each of the lead-out electrodes L421, L422 is connected to the second pad 406.

That is, each of the first connection electrode 3 and the second connection electrode 4 is formed in a comb-teeth-like shape in such a manner that the plurality of first lead-out electrodes L411, L412 mate respectively with the plurality of second lead-out electrodes L421, L422. Further, the first connection electrode 3 and the first diffusion region 410 are arranged so as to be mutually symmetrical with the second connection electrode 4 and the second diffusion region 412 in a plan view. More specifically, the first connection electrode 3 and the first diffusion region 410 are arranged so as to be mutually point symmetrical with the second connection electrode 4 and the second diffusion region 412 in relation to the center of gravity of the element forming surface 2A in a plan view.

It may be deemed that the first connection electrode 3 and the first diffusion region 410 are arranged so as to be substantially line symmetrical with the second connection electrode 4 and the second diffusion region 412. Specifically, it is deemed that the second lead-out electrode L422 at one long side of the substrate 2 and the first lead-out electrode L411 which is adjacent to the second lead-out electrode L422 are substantially at the same position and also that the first lead-out electrode LA12 at the other long side of the substrate 2 and the second lead-out electrode L421 adjacent thereto are substantially at the same position. Then, it can be deemed that the first connection electrode 3 and the first diffusion region 410 are arranged so as to be line symmetrical with the second connection electrode 4 and the second diffusion region 412 in relation to a straight line which is parallel in the short direction of the element forming surface 2A and passes through the center thereof in the long direction in a plan view. A slit 418 is formed so as to rim the lead-out electrodes L411, L412, L421 and L422.

The first electrode film 403 and the second electrode film 404 are covered by a passivation film 420 (not illustrated in FIG. 118) constituted of, for example, a nitride film, and a resin film 421 made of polyimide, etc., is further formed on the passivation film 420. Notched portions 422, 423 for exposing peripheral edge portions facing the respective side surface portions of the first connection electrode 3 and the second connection electrode 4 are formed on the passivation film 420 and the resin film 421.

With reference to FIG. 121, a pattern PT is formed in an arrangement similar to that of Reference Example 1 on the front surface (the first pad 405) of the first electrode film 403 (refer to FIG. 70A to FIG. 71). The pattern PT according to Reference Example 9 includes the passivation film 420 and the resin film 421. Thereby, raised portions 96 and a flat portion 97 similar to those described in Reference Example 1 are formed on the front surface of the first connection electrode 3 in Reference Example 9. The second connection electrode 4 is similar in arrangement to the first connection electrode 3 and, therefore, an illustration and a description are omitted. Then, the first connection electrode 3 and the second connection electrode 4 are formed so as to be connected to the first electrode film 403 and the second electrode film 404 (the first pad 405 and the second pad 406) in an arrangement similar to that of Embodiment 1.

The passivation film 420 and the resin film 421 constitute a predetermined pattern PT on the front surface (the first pad 405) of the first electrode film 403 and also constitute protective films of the chip part 1401, thereby suppressing or preventing water from entering into the first lead-out electrodes L411, L412, the second lead-out electrodes L421, L422 and the p-n junction regions 411, 413 and also absorbing impact, etc., from outside and also contributing to improvement in durability of the chip part 1401.

The first diffusion region 410 of the plurality of Zener diodes D411, D412 which constitute the first Zener diode D401 is connected in common to the first connection electrode 3 and also connected to the substrate 2 which is a p-type region common to the Zener diodes D411, D412. Thereby, the plurality of Zener diodes D411, D412 which constitute the first Zener diode D401 are connected in parallel. On the other hand, the second diffusion region 412 of the plurality of Zener diodes D421, D422 which constitute the second Zener diode D402 is connected to the second connection electrode 4 and also connected to the substrate 2 which is a p-type region common to the Zener diodes D421, D422. Thereby, the plurality of Zener diodes D421, D422 which constitute the second Zener diode D402 are connected in parallel. Then, a parallel circuit of the Zener diodes D421, D422 and a parallel circuit of the Zener diodes D411, D412 are connected by anti-serial connection, and a bidirectional Zener diode is arranged by an anti-series circuit thereof.

FIG. 123 is an electric circuit diagram which shows an electrical structure of the interior of the chip part 1401 shown in FIG. 118. Cathodes of the plurality of Zener diodes D411, D412 which constitute the first Zener diode D401 are connected in common to the first connection electrode 3, and anodes thereof are connected in common to the anodes of the plurality of Zener diodes D421, D422 which constitute the second Zener diode D402. Then, the cathodes of the plurality of Zener diodes D421, D422 are connected in common to the second connection electrode 4. Thereby, they function as one bidirectional Zener diode as a whole.

According to the present reference example, the first connection electrode 3 and the first diffusion region 410 are arranged so as to be mutually symmetrical with the second connection electrode 4 and the second diffusion region 412 and, therefore, characteristics in individual current directions can be made substantially equal.

FIG. 124B is a graph which shows an experimental result obtained by measuring voltage-to-current characteristics of a bidirectional Zener diode chip in individual current directions in which a first connection electrode and a first diffusion region are arranged so as to be asymmetrical with a second connection electrode and a second diffusion region.

In FIG. 124B, the solid line indicates voltage-to-current characteristics obtained where voltage is applied to the bidirectional Zener diode, with one electrode given as a positive electrode and the other electrode given as a negative electrode, and the dotted line indicates voltage-to-current characteristics obtained where voltage is applied to the bidirectional Zener diode, with the one electrode given as a negative electrode and the other electrode given as a positive electrode. The experimental result shows that in the bidirectional Zener diode in which the first connection electrode and the first diffusion region are arranged so as to be asymmetrical with the second connection electrode and the second diffusion region, the voltage-to-current characteristics in individual current directions are not made equal.

FIG. 124A is a graph which shows the experimental result of the chip part 1401 shown in FIG. 118 measured for the voltage-to-current characteristics in individual current directions.

In the bidirectional Zener diode of the present reference example, the voltage-to-current characteristics obtained where voltage is applied, with the first connection electrode 3 given as a positive electrode and the second connection electrode 4 given as a negative electrode and the voltage-to-current characteristics obtained where voltage is applied, with the second connection electrode 4 given as a positive electrode and the first connection electrode 3 given as a negative electrode have both exhibited the characteristics indicated by the solid line in FIG. 124A. That is, in the bidirectional Zener diode of the present reference example, the voltage-to-current characteristics in individual current directions are made substantially equal.

According to the arrangement of the present reference example, the chip part 1401 has the first Zener diode D401 and the second Zener diode D402. The first Zener diode D401 is provided with the plurality of Zener diode D411, D412 (first diffusion region 410) and each of the Zener diodes D411, D412 is provided with a p-n junction region 411. The p-n junction region 411 is separated for each of the Zener diodes D411, D412. Therefore, "a peripheral length of the p-n junction regions 411 of the first Zener diode D401," that is, a total peripheral length (total extension) of the first diffusion region 410 in the substrate 2 is made longer. Thereby, it is possible to avoid the concentration of electrical fields in the vicinity of the p-n junction region 411 and disperse the electrical fields. And, the first Zener diode D401 can be improved in ESD resistance. That is, even where the chip part 1401 is formed to be small, the p-n junction region 411 can be increased in total peripheral length to downsize the chip part 1401 and secure the ESD resistance at the same time.

In a similar manner, the second Zener diode D402 is also provided with the plurality of Zener diodes D421, D422 (second diffusion region 412) and each of the Zener diodes D421, D422 is provided with a p-n junction region 413. The p-n junction region 413 is separated for each of the Zener diodes D421, D422. Therefore, "a peripheral length of the p-n junction regions 413 of the second Zener diode D402," that is, a total peripheral length (total extension) of the p-n junction regions 413 of the substrate 2 is made longer. Thereby, it is possible to avoid concentration of electrical fields in the vicinity of the p-n junction region 413 and disperse the electrical fields. And, the second Zener diode D402 can be improved in ESD resistance. That is, even where the chip part 1401 is formed to be small, the p-n junction region 413 can be increased in total peripheral length to downsize the chip part 1401 and secure the ESD resistance at the same time.

In the present reference example, the peripheral length of the p-n junction regions 411 of the first Zener diode D401 and that of the p-n junction regions 413 of the second Zener diode D402 are each formed to be 400 μm or more to 1500 μm or less. It is more preferable that each of the peripheral lengths is formed to be 500 μm or more to 1000 μm or less.

Each of the peripheral lengths is formed to be 400 μm or more and, therefore, as will be described later by referring to FIG. 125, a bidirectional Zener diode chip with a great ESD resistance can be provided. Further, each of the peripheral lengths is formed to be 1500 μm or less and, therefore, as will be described later by referring to FIG. 126, a bidirectional Zener diode chip with a small capacitance (capacity between terminals) between the first connection electrode 3 and the second connection electrode 4 can be realized. More specifically, it is possible to realize a bidirectional Zener diode chip having a capacity between terminals of 30 [pF] or less. It is more preferable that each of the peripheral lengths is formed to be 500 μm or more to 1000 μm or less.

FIG. 125 is a graph which shows an experimental result obtained by measuring ESD resistance of a plurality of samples made different in peripheral length of the p-n junction region of each of the first Zener diode and the second Zener diode by setting in various ways the number of lead-out electrodes (diffusion regions) and/or a size of the diffusion region formed on a substrate equal in area. However, in each of the samples, as with the reference example, the first connection electrode and the first diffusion region are formed so as to be mutually symmetrical with the second connection electrode and the second diffusion region. Therefore, in each of the samples, the peripheral length of the junction regions 411 of the first Zener diode D401 is substantially equal to the peripheral length of the p-n junction regions 413 of the second Zener diode D402.

The horizontal axis of FIG. 125 indicates one of the peripheral length of the p-n junction regions 411 of the first Zener diode D401 and the peripheral length of the p-n junction region 413 of the second Zener diode D402. The experimental result shows that the longer the peripheral length of each of the p-n junction region 411 and the p-n junction region 413 is, the greater the ESD resistance becomes. Where the peripheral length of each of the p-n junction region 411 and the p-n junction region 413 is formed to be 400 μm or more, the ESD resistance of 8 kilovolts or more which is a target value can be realized.

FIG. 126 is a graph which shows an experimental result obtained by measuring capacities between terminals for a plurality of samples which are made different in peripheral length of the p-n junction region of each of the first Zener diode and the second Zener diode by setting in various ways the number of lead-out electrodes (diffusion regions) and/or a size of the diffusion region formed on a substrate equal in area. However, in each of the samples, as with the reference example, the first connection electrode and the first diffusion region are formed so as to be mutually symmetrical with the second connection electrode and the second diffusion region.

The horizontal axis of FIG. 126 indicates one of the peripheral length of the junction region 411 of the first Zener diode D401 and the peripheral length of the p-n junction region 413 of the second Zener diode D402. The experimental result has revealed that the longer the peripheral length of each of the p-n junction region 411 and the p-n junction region 413 is, the greater the capacity between terminals becomes. Where the peripheral length of each of the p-n junction region 411 and the p-n junction region 413 is formed to be 1500 μm or less, a capacity between terminals with 30 [pF] or less which is a target value can be realized.

Further, in the present reference example, the width of each of the lead-out electrodes L411, L412, L421, L422 is greater at a site from each of the bonding portions C411, C412, C421, C422 to the first pad 405 than the width of each of the bonding portions C411, C412, C421, C422. Thereby, a greater allowable current amount can be obtained to reduce electromigration and improve the reliability with a heavy current. That is, it is possible to provide a bidirectional Zener diode chip which is small in dimension, great in ESD resistance and also secured for the reliability with a heavy current.

The first connection electrode 3 and the second connection electrode 4 are both formed on the element forming surface 2A which is one front surface of the substrate 2. Thus, as described in Reference Example 1, the element forming surface 2A is made to face the mounting substrate 9, by which the first connection electrode 3 and the second connection electrode 4 are bonded to the mounting substrate 9 by means of the solder 13. Thus, it is possible to arrange a circuit assembly in which the chip part 1401 is surface-mounted on the mounting substrate 9 (refer to FIG. 85). That is, it is possible to provide the flip-chip bonding type chip part 1401. Face-down bonding in which the element forming surface 2A is made to face a mounting surface of the mounting substrate 9 is employed, thus making it possible to connect the chip part 1402 to the mounting substrate 9 by wireless bonding. It is thereby possible to decrease a space on the mounting substrate 9 occupied by the chip part 1401. In particular, the chip part 1401 on the mounting substrate 9 can be reduced in height. Accordingly, a space inside a housing of a small-sized electronic device, etc., can be used effectively to mount the chip part at high density and also realize downsizing.

Further, in the present reference example, the insulating film 20 is formed on the substrate 2, and the bonding portions C411, C412 of the lead-out electrodes L411, L412 are connected to the first diffusion regions 410 of the Zener diodes D411, D412 via the first contact hole 416 formed on the insulating film 20. Then, the first pad 405 is disposed on the insulating film 20 in a region outside the first contact hole 416. That is, the first pad 405 is installed at a position spaced away from directly above the p-n junction region 411.

In a similar manner, the bonding portions C421, 422 of the lead-out electrodes L421, L422 are connected to the second diffusion regions 412 of the Zener diodes D421, D422 via the second contact hole 417 formed on the insulating film 20. Then, the second pad 406 is disposed on the insulating film 20 at a region outside the second contact hole 417. The second pad 406 is also positioned so as to be away from a site directly above the p-n junction region 413. Thereby, when the chip part 1401 is mounted on the mounting substrate 9, it is possible to avoid a great impact applied to the p-n junction regions 411, 413. Accordingly, breakage of the p-n junction regions 411, 413 can be avoided to realize a bidirectional Zener diode chip excellent in durability to an external force. Such an arrangement can be made that the first connection electrode 3 or the second connection electrode 4 is not installed but the first pad 405 and the second pad 406 are given as the respective external connection portions of the first connection electrode 3 and the second connection electrode 4, and a bonding wire is connected to each of the first pad 405 and the second pad 406. In this case as well, it is possible to avoid breakage of the p-n junction regions 411, 413 by the impact on wire bonding.

The chip part 1401 can be obtained by performing a step of forming the first and the second Zener diodes D401, D402 in place of the step of forming the resistor portion 56 in Reference Example 1. Hereinafter, with reference to FIG. 127, a detailed description will be given of a difference from the step of manufacturing of Reference Example 1.

FIG. 127 is a flow chart for describing one example of the steps of manufacturing the chip part 1401 shown in FIG. 118.

First, a $p^+$-type semiconductor wafer as a base substrate of the substrate 2 is prepared. The front surface of the semiconductor wafer is an element forming surface and corresponds to the element forming surface 2A of the substrate 2. A plurality of bidirectional Zener diode chip regions corresponding to the plurality of chip parts 1401 are aligned in a matrix form and set on the element forming surface. A boundary region (corresponding to the rectilinear portions 42A, 42B of Reference Example 1 in FIG. 79) is provided between adjacent bidirectional Zener diode chip regions. The boundary region is a band-shaped region having a substantially constant width and formed in a lattice by extending in two directions orthogonal to each other. After the semiconductor wafer has been subjected to necessary steps, the semiconductor wafer is cut off along the boundary region, thereby obtaining the plurality of chip parts 1401.

One example of the steps performed for the semiconductor wafer is as follows.

First, an insulating film 20 is formed on the element forming surface of the semiconductor wafer (Step S131) and a resist mask is formed thereon (Step S132). Openings corresponding to a first diffusion region 410 and a second diffusion region 412 are formed on the insulating film 20 by etching using the resist mask (Step S133). Further, after the resist mask has been peeled off, an n-type impurity is introduced to the surface layer portion of the semiconductor wafer exposed from the openings formed on the insulating film 20 (Step S134). The n-type impurity may be introduced in a step in which phosphorus as the n-type impurity is deposited on the front surface (a so-called phosphorus deposition) or by implantation of n-type impurity ions (for example, phosphorus ions). Phosphorus deposition is such treatment that a semiconductor wafer is conveyed into a diffusion furnace, a $POCl_3$ gas is made to flow inside a diffusion channel to effect heat treatment and phosphorus is deposited on a front surface of the semiconductor wafer exposed inside openings of the insulating film 20 by the heat treatment. After the insulating film 20 is increased in thickness whenever necessary (Step S135), heat treatment (drive) is executed for activating the impurity ions introduced to the semiconductor wafer (Step S136). Thereby, the first diffusion region 410 and the second diffusion region 412 are formed at a surface layer portion of the semiconductor wafer.

Next, another resist mask having openings which coincide with contact holes 416, 417 is formed on the insulating film 20 (Step S137). The contact holes 416, 417 are formed on the insulating film 20 by etching via the resist mask (Step S138). Thereafter, the resist mask is peeled off.

Next, an electrode film which constitutes the first connection electrode 3 and the second connection electrode 4 is formed on the insulating film 20 by performing, for example, sputtering (Step S139). In the present reference example, an electrode film made of Al is formed. Then, another resist mask having an opening pattern corresponding to a slit 418 is formed on the electrode film (Step S140) and the slit 418 is formed on the electrode film by etching via the resist mask (for example, reactive ion etching) (Step S141). Thereby, the electrode film is separated into the first electrode film 403 and the second electrode film 404.

Next, after the resist film has been peeled off, a passivation film 420 such as a nitride film is formed, for example, by a CVD method (Step S142) and a resin film 421 is formed by further coating polyimide, etc. (Step S143). For example, after photosensitivity-imparted polyimide is coated, and a pattern corresponding to a predetermined pattern PT formed on the front surface of each of the first and the second electrode films 403, 404 and a pattern corresponding to each of the notched portions 422, 423 are exposed to light, a polyimide film thereof is developed (Step S144). Thereby, a pattern PT having first and second openings 22B, 22C for selectively exposing the front surfaces of the first and the second electrode films 403, 404 and the resin film 421 having openings which correspond to the notched portions 422, 423 are formed. Thereafter, heat treatment for curing the resin film is performed whenever necessary (Step S145). Then, the predetermined pattern PT and the notched portions 422, 423 are formed on the passivation film 420 by dry etching using the resin film 421 as a mask (for example, reactive ion etching) (Step S146). Thereafter, in accordance with the method described in Reference Example 1 (refer to FIG. 78E to FIG. 78I), the first connection electrode 3 and the second connection electrode 4 are formed as an external connection electrode so as to be connected to the first electrode film 403 and the second electrode film 404, and a semiconductor wafer is separated into individual chips. Thereby, the above-structured chip part 1401 can be obtained.

In the present reference example, the substrate 2 is made of a p-type semiconductor substrate and, therefore, stable characteristics can be realized without forming an epitaxial layer on the substrate 2. That is, an n-type semiconductor wafer is great in in-plane variation of resistivity, and when the n-type semiconductor wafer is used, it is necessary that an epitaxial layer lower in in-plane variation of resistivity is formed on the front surface thereof and an impurity diffusion layer is formed on the epitaxial layer to provide a p-n junction. This is due to the fact that an n-type impurity is small in segregation coefficient and, when an ingot (for example, silicon ingot) which is a base of a semiconductor wafer is formed, there is a great difference in resistivity between the center of the wafer and the peripheral edge portion thereof. In contrast, a p-type impurity is relatively great in segregation coefficient and, therefore, a p-type semiconductor wafer is low in in-plane variation of resistivity. Therefore, use of the p-type semiconductor wafer enables to cut out a bidirectional Zener diode stable in characteristics at any place of the wafer without formation of an epitaxial layer. Thereby, the $p^+$-type substrate 2 can be used to simplify the manufacturing process and also reduce the manufacturing costs.

Each of FIG. 128A to FIG. 128F is a plan view which shows a modification example of the chip part 1401 shown in FIG. 118. Each of FIG. 128A to FIG. 128F shows a plan view corresponding to FIG. 118. In FIG. 128A to FIG. 128F, the portions corresponding to the individual portions shown in FIG. 1 to FIG. 127 are given the same reference numerals.

A chip part 1401A shown in FIG. 128A is provided with each one of a first diffusion region 410 and a second diffusion region 412. A first Zener diode D401 is arranged by one Zener diode corresponding to the first diffusion region 410. A second Zener diode D402 is arranged by one Zener diode corresponding to the second diffusion region 412. Each of the first diffusion region 410 and the second diffusion region 412 is formed substantially in a rectangular shape longer in the long direction of a substrate 2 and disposed in the short direction of the substrate 2, at an interval. The first diffusion region 410 and the second diffusion region 412 are formed so as to be relatively short in length in the long direction (shorter than ½ of an interval between a first pad 405 and a second pad 406). An interval between the first diffusion region 410 and the second diffusion region 412 is set to be shorter than the width of each of the diffusion regions 410, 412.

One lead-out electrode L411 corresponding to the first diffusion region 410 is formed in a first connection electrode 3. In a similar manner, one lead-out electrode L421 corresponding to the second diffusion region 412 is formed in a second connection electrode 4. Each of the first connection electrode 3 and the second connection electrode 4 is formed in a comb-teeth-like shape so that the lead-out electrode L411 mates with the lead-out electrode L421.

The first connection electrode 3 and the first diffusion region 410 are arranged so as to be mutually point symmetrical with the second connection electrode 4 and the second diffusion region 412 in a plan view in relation to the center of gravity of an element forming surface 2A. It may be deemed that the first connection electrode 3 and the first diffusion region 410 are arranged so as to be substantially line symmetrical with the second connection electrode 4 and the second diffusion region 412. That is, if the first lead-out electrode L411 and the second lead-out electrode L421 are deemed to be at the same position, it can be deemed that the first connection electrode 3 and the first diffusion region 410 are arranged so as to be line symmetrical with the second connection electrode 4 and the second diffusion region 412 in relation to a straight line which is parallel in the short direction of the element forming surface 2A and passes through the center thereof in the long direction in a plan view.

In a chip part 1401B shown in FIG. 128B, as with the chip part 1401A shown in FIG. 128A, each of a first Zener diode D401 and a second Zener diode D402 is arranged by one Zener diode. In the chip part 1401B shown in FIG. 128B, the length in the long direction of each of the first diffusion region 410 and the second diffusion region 412 as well as the length of each of the lead-out electrodes L411, L421 are formed so as to be greater than those of the chip part 1401A shown in FIG. 128A (longer than ½ of an interval between the first pad 405 and the second pad 406).

A chip part 1401C shown in FIG. 128C is provided with each four of first diffusion regions 410 and four second diffusion regions 412. A total of eight of the first diffusion regions 410 and the second diffusion regions 412 are formed each in a rectangular shape longer in the long direction of a substrate 2. The first diffusion regions 410 and the second diffusion regions 412 are aligned alternately, at an equal interval, in the short direction of the substrate 2. A first Zener diode D401 is arranged by four Zener diodes D411 to D414 which correspond respectively to the first diffusion regions 410. A second Zener diode D402 is arranged by four Zener diodes D421 to D424 which correspond respectively to the second diffusion regions 412.

A first connection electrode 3 is provided with four lead-out electrodes L411 to L414 which correspond respectively to the first diffusion regions 410. In a similar manner, a second connection electrode 4 is provided with four lead-out electrodes L421 to L424 which correspond respectively to the second diffusion regions 412. Each of the first connection electrode 3 and the second connection electrode 4 is formed in a comb-teeth-like shape in such a manner that the lead-out electrodes L411 to L414 mate respectively with the lead-out electrodes L421 to L424.

The first connection electrode 3 and the first diffusion region 410 are arranged so as to be point symmetrical with the second connection electrode 4 and the second diffusion region 412 in a plan view in relation to the center of gravity of an element forming surface 2A. It can be deemed that the first connection electrode 3 and the first diffusion region 410 are arranged so as to be substantially line symmetrical with the second connection electrode 4 and the second diffusion region 412. That is, if the first lead-out electrodes L411 to L414 and the second lead-out electrodes L421 to L424, each of which is mutually adjacent (that is, L424 and L411, L423 and L412, L422 and L413, L421 and L414) are deemed to be at the same position, it can be deemed that the first connection electrode 3 and the first diffusion region 410 are arranged so as to be line symmetrical with the second connection electrode 4 and the second diffusion region 412 in relation to a straight line which is parallel in the short direction of the element forming surface 2A and passes through the center thereof in the long direction in a plan view.

As with the reference example in FIG. 118, a chip part 1401D shown in FIG. 128D is provided with two each of first diffusion regions 410 and second diffusion region 412. These four of the first diffusion regions 410 and second diffusion regions 412 are formed each in a rectangular shape longer in the long direction of the substrate 2. And, the first diffusion regions 410 and the second diffusion regions 412 are alternately aligned along the short direction of a substrate 2. A first Zener diode D401 is arranged by two Zener diodes D411, D412 which correspond respectively to the first diffusion regions 410. A second Zener diode D402 is arranged by two Zener diodes D421, D422 which correspond respectively to the second diffusion regions 412. These four Zener diodes are disposed sequentially in the order of D422, D411, D421 and D412 at the short side of an element forming surface 2A.

The second diffusion region 412 corresponding to the Zener diode D422 and the first diffusion region 410 corresponding to the Zener diode D411 are disposed so as to be mutually adjacent to a portion close to one long side of the element forming surface 2A. The second diffusion region 412 corresponding to the Zener diode D421 and the first diffusion region 410 corresponding to the Zener diode D412 are disposed so as to be mutually adjacent to a portion close to the other long side of the element forming surface 2A. That is, the first diffusion region 410 corresponding to the Zener diode D411 and the second diffusion region 412 corresponding to the Zener diode D421 are disposed, at a great interval (an interval greater than the width between the diffusion regions 410 and 412) kept.

A first connection electrode 3 is provided with two lead-out electrodes L411, L412 which correspond respectively to the first diffusion regions 410. In a similar manner, a second connection electrode 4 is provided with two lead-out electrodes L421, L422 which correspond respectively to the second diffusion regions 412. The first connection electrode 3 and the second connection electrode 4 are formed in a comb-teeth-like shape so that the lead-out electrodes L411, L412 mate respectively with the lead-out electrodes L421, L422.

The first connection electrode 3 and the first diffusion region 410 are arranged so as to be point symmetrical with the second connection electrode 4 and the second diffusion region 412 in relation to the center of gravity of the element forming surface 2A in a plan view. It may be deemed that the first connection electrode 3 and the first diffusion region 410 are arranged to be substantially line symmetrical with the second connection electrode 4 and the second diffusion region 412. That is, it is deemed that the second lead-out electrode L422 at one long side of the substrate 2 and the first lead-out electrode L411 adjacent thereto are substantially at the same position and it is also deemed that the first lead-out electrode L412 at the other long side of the substrate 2 and the second lead-out electrode L421 adjacent thereto are substantially at the same position. Then, it can be deemed that the first connection electrode 3 and the first diffusion region 410 are arranged so as to be line symmetrical with the second connection electrode 4 and the second diffusion region 412 in relation to a straight line which is parallel in the short direction of the element forming surface 2A and passes through the center thereof in the long direction in a plan view.

A chip part 1401E shown in FIG. 128E is provided with two each of first diffusion regions 410 and second diffusion regions 412. The first diffusion regions 410 and the second diffusion regions 412 are each formed substantially in a rectangular shape longer in the long direction of the first diffusion region 410. One second diffusion region 412 is formed at a portion close to one long side of an element forming surface 2A, and the other second diffusion region 412 is formed at a portion close to the other long side of the element forming surface 2A. The two first diffusion regions 410 are formed so as to be mutually adjacent to the respective second diffusion regions 412 in a region between the two second diffusion regions 412. That is, the two first diffusion regions 410 are disposed, at a great interval (an interval greater than the width of each of the diffusion region 410 and the diffusion region 412), and each one of the second diffusion regions 412 is disposed in the exterior of each of the first diffusion regions.

A first Zener diode D401 is arranged by two Zener diodes D411, D412 which correspond respectively to the first diffusion regions 410. A second Zener diode D402 is arranged by two Zener diodes D421, D422 which correspond respectively to the second diffusion regions 412. Two lead-out electrodes L411, LA12 which correspond respectively to the first diffusion regions 410 are formed in a first connection electrode 3. In a similar manner, two lead-out electrodes L421, L422 which correspond respectively to the second diffusion regions 412 are formed in a second connection electrode 4.

It may be deemed that the first connection electrode 3 and the first diffusion region 410 are arranged so as to be substantially line symmetrical with the second connection electrode 4 and the second diffusion region 412. That is, it is deemed that the second lead-out electrode L422 at one long side of the substrate 2 and the first lead-out electrode LA11 adjacent thereto are substantially at the same position and it is also deemed that the second lead-out electrode L421 at the other long side of the substrate 2 and the first lead-out electrode L412 adjacent thereto are substantially at the same position. If so, it may be deemed that the first connection electrode 3 and the first diffusion region 410 are arranged so as to be line symmetrical with the second connection electrode 4 and the second diffusion region 412 in relation to a straight line passing through the center of the element forming surface 2A in the long direction in a plan view.

In the chip part 1401E shown in FIG. 128E, the second lead-out electrode L422 at one long side of the substrate 2 is arranged so as to be mutually point symmetrical with the first lead-out electrode L411 adjacent thereto at the center of a predetermined point between them. Further, the second lead-out electrode L421 at the other long side of the substrate 2 is arranged so as to be mutually point symmetrical with the first lead-out electrode L412 adjacent thereto at the center of a predetermined point between them. As described above, where the first connection electrode 3 and the first diffusion region 410 are arranged in combination with the second connection electrode 4 and the second diffusion region 412 so as to give a partially symmetrical structure, it may be deemed that the first connection electrode 3 and the first diffusion region 410 are arranged so as to be substantially symmetrical with the second connection electrode 4 and the second diffusion region 412.

In a chip part 1401F shown in FIG. 128F, a plurality of first diffusion regions 410 are discretely disposed on a surface layer region of a substrate 2, and also a plurality of second diffusion regions 412 are discretely disposed. The first diffusion regions 410 and the second diffusion regions 412 are formed each in a circular shape equal in size in a plan view. The plurality of first diffusion regions 410 are disposed in a region between the center of the element forming surface 2A in the width direction and one long side, and the plurality of second diffusion regions 412 are disposed in a region between the center of the element forming surface 2A in the width direction and the other long side. Then, a first connection electrode 3 is provided with a single lead-out electrode L411 connected in common to the plurality of first diffusion regions 410. In a similar manner, a second connection electrode 4 is provided with a single lead-out electrode L421 connected in common to the plurality of second diffusion regions 412. In this modification example as well, the first connection electrode 3 and the first diffusion regions 410 are arranged so as to be point symmetrical with the second connection electrode 4 and the second diffusion regions 412 in relation to the center of gravity of the element forming surface 2A in a plan view.

Each of the first diffusion region 410 and the second diffusion region 412 may be formed in a triangular shape, a tetragonal shape or any other arbitrary polygonal shape in a plan view. The plurality of first diffusion regions 410 which extend in the long direction of the element forming surface 2A are formed in a region between the center of the element forming surface 2A in the width direction and one long side, at an interval in the short direction of the element forming surface 2A, and the plurality of first diffusion regions 410 may be connected in common to the lead-out electrode L411. In this case, the plurality of second diffusion regions 412 which extend in the long direction of the element forming surface 2A are formed in a region between the center of the element forming surface 2A in the width direction and the other one side, at an interval in the short direction of the element forming surface 2A. The plurality of second diffusion regions 412 are connected in common to the lead-out electrode L421.

<Composite Chip Part>

FIG. 129A is a schematic perspective view which describes an arrangement of a chip part 501 of Reference Example 11.

The chip part 501 according to Reference Example 11 is different from the chip part 1001 of Reference Example 1 in that two circuit elements are formed in one substrate 502 (that is, an element region 5 includes two element regions 505 on one substrate 502). The chip part 501 is similar in other arrangements to the chip part 1001 according to Reference Example 1. In FIG. 129A, the portions corresponding to the individual portions shown in FIG. 1 to FIG. 128F are given the same reference numerals. Hereinafter, the chip part 501 is referred to as a "composite chip part 501."

As shown in FIG. 129A, the composite chip part 501 is a pair chip in which two of the circuit elements described in Reference Example 1 to Reference Example 10 (a resistor portion, a capacitor, a fuse, a diode, a Zener diode, etc.) are selectively loaded on the common substrate 502. The two circuit elements are adjacently disposed to each other so as to be symmetrical with a boundary region 507 thereof.

The composite chip part 501 is formed in a rectangular parallelepiped shape. The planar shape of the composite chip part 501 is a tetragon having sides (transverse sides 582) along a direction at which the two circuit elements are aligned (hereinafter, referred to as a lateral direction of the substrate 502) and sides orthogonal to the transverse sides 582 (longitudinal sides 581). The composite chip part 501 has a planar dimension, for example, of 0303 size in combination of two circuit elements, each of which has a length L5 (length of the longitudinal side 581)=approximately 0.3 mm and a width W5=approximately 0.15 mm, that is, 03015 size. As a matter of course, the planar dimension of the composite chip part 501 shall not be limited thereto, and it may be, for example, 0404 size in combination of two elements, each of which has the length L5=approximately 0.4 mm, the width W5=approximately 0.2 mm, that is, 0402 size. Further, it is preferable that the thickness T5 of the composite chip part 501 is approximately 0.1 mm and the width of the boundary region 507 between the mutually adjacent two circuit elements is approximately 0.03 mm.

The composite chip part 501 is obtained in procedures in which a plurality of composite chip parts 501 are formed in a lattice on a wafer to form a groove on the wafer and, thereafter, rear surface polishing (or the substrate is divided by the groove) is performed to separate the surface into individual composite chip parts 501.

Each of the two circuit elements is mainly provided with a substrate 502 which constitutes a main body of the composite chip part 501, a first connection electrode 503 and a second connection electrode 504 acting as an external connection electrode, and an element region 505 externally connected by the first connection electrode 503 and the second connection electrode 504. In the present reference example, the first connection electrode 503 is formed so as to extend via the two circuit elements and acts as a common electrode of two circuit elements.

The substrate 502 is formed substantially in a rectangular parallelepiped chip shape. One front surface which is an upper surface of the substrate 502 in FIG. 129A is an element forming surface 502A. The element forming surface 502A is formed substantially in an oblong shape and is a front surface of the substrate 502 in which elements are formed. A surface on the opposite side of the element forming surface 502A in the thickness direction of the substrate 502 is a rear surface 502B. The element forming surface 502A and the rear surface 502B are substantially equal in size and shape, and they are parallel to each other. A tetragonal edge defined by the pair of longitudinal sides 581 and the pair of transverse sides 582 of the element forming surface 502A is referred to as a peripheral edge portion 585, and a tetragonal edge defined by the longitudinal sides 581 and the pair of transverse sides 582 of the rear surface 502B is referred to as a peripheral edge portion 590. When viewed in a direction of a normal orthogonal to the element forming surface 502A (the rear surface 502B), the peripheral edge portion 585 overlaps the peripheral edge portion 590 (refer to FIG. 129C, 128D to be described later). The substrate 502 may be a substrate which is thinned by grinding or polishing, for example, from the rear surface 502B side. The substrate 502 may be made of a semiconductor substrate represented by a silicon substrate and may be made of a glass substrate or a resin film.

The substrate 502 is provided with a plurality of side surfaces (a side surface 502C, a side surface 502D, a side surface 502E, and a side surface 502F) as front surfaces other than the element forming surface 502A and the rear surface 502B. The plurality of side surfaces 502C to 502F extend so as to intersect with each of the element forming surface 502A and the rear surface 502B (specifically, so as to be orthogonal thereto), thereby joining between the element forming surface 502A and the rear surface 502B.

The side surface 502C is constructed between the transverse sides 582 at one side (the front left side in FIG. 129A)

in a longitudinal direction (hereinafter, referred to as the longitudinal direction of the substrate 502) orthogonal to the lateral direction of each of the element forming surface 502A and the rear surface 502B of the substrate 502. The side surface 502D is constructed between the transverse sides 582 at the other side (the inner right side in FIG. 129A) in a longitudinal direction of each of the element forming surface 502A and the rear surface 502B of the substrate 502. The side surface 502C and the side surface 502D are the respective end surfaces of the substrate 502 in the longitudinal direction.

The side surface 502E is constructed between the longitudinal sides 581 at one side (the inner left side in FIG. 129A) in a lateral direction of each of the element forming surface 502A and the rear surface 502B of the substrate 502. The side surface 502F is constructed between the longitudinal sides 581 at the other side (the front right side in FIG. 129A) in a lateral direction of each of the element forming surface 502A and the rear surface 502B of the substrate 502. The side surface 502E and the side surface 502F are the respective end surfaces of the substrate 502 in the lateral direction.

The side surface 502C and the side surface 502D intersect respectively with the side surface 502E and the side surface 502F (specifically being orthogonal thereto). As a result, mutually adjacent surfaces among the element forming surface 502A to the side surface 502F form a right angle.

With the substrate 502, the respective entireties of the element forming surface 502A to the side surfaces 502C to 502F are covered by a passivation film 523. Therefore, to be exact, in FIG. 129A, the respective entireties of the element forming surface 502A and the side surfaces 502C to 502F are positioned at the inner sides (rear sides) of the passivation film 523 and not exposed to the exterior. The composite chip part 501 is further provided with a resin film 524. The passivation film 523 is different from the resin film 524 in that the substrate 2 is the substrate 502. However, they are formed substantially similar in arrangement to the passivation film 23 and the resin film 24 of Reference Example 1 to Reference Example 3, and a description thereof will be omitted.

The first connection electrode 503 and the second connection electrode 504 are provided respectively with a peripheral edge portion 586 and a peripheral edge portion 587 which are formed to extend from the element forming surface 502A and the side surfaces 502C to 502F in such a manner as to cover the peripheral edge portion 585 on the element forming surface 502A of the substrate 502. In the present reference example, the peripheral edge portions 586, 587 are formed so as to cover the individual corner portions 511 at which the side surfaces 502C to 502F of the substrate 502 intersect with each other. Further, the substrate 502 is formed in a round shape in which each of the corner portions 511 is chamfered in a plan view. Thereby, such a structure to suppress chipping in a step of manufacturing the composite chip part 501 and at the time of mounting the composite chip part 501 is provided.

The first connection electrode 503 is provided with a pair of long sides 503A and a pair of short sides 503B which constitute four sides in a plan view. The long side 503A is orthogonal to the short side 503B in a plan view. The second connection electrode 504 is provided with a pair of long sides 504A and a pair of short sides 504B which constitute four sides in a plan view. The long side 504A is orthogonal to the short side 504B in a plan view. The long side 503A and the long side 504A extend parallel with the transverse sides 582 of the substrate 502, while the short side 503B and the short side 504B extend parallel with the longitudinal sides 581 of the substrate 502. Further, the composite chip part 501 is not provided with an electrode on the rear surface 502B of the substrate 502.

A plurality of raised portions 96 and a flat portion 97 are formed on the front surface of each of the first connection electrode 503 and the second connection electrode 504. The plurality of raised portions 96 and the flat portion 97 are formed in a similar arrangement by a predetermined pattern PT formed in a region directly below the first connection electrode 503 and the second connection electrode 504, as described in Reference Example 1 to Reference Example 10.

FIG. 129B is a schematic sectional view of a circuit assembly 100 in a state that a composite chip part 501 is mounted on a mounting substrate 9. FIG. 129C is a schematic plan view of the circuit assembly 100 which is viewed from a rear surface 502B side of the composite chip part 501. FIG. 129D is a schematic plan view of the circuit assembly 100 which is viewed from an element forming surface 502A side of the composite chip part 501. In addition, only major portions are shown in FIG. 129B to FIG. 129D.

As shown in FIG. 129B to FIG. 129D, the composite chip part 501 is mounted on a mounting substrate 9. The composite chip part 501 and the mounting substrate 9 in this state constitute the circuit assembly 100. In FIG. 129B to FIG. 129D, raised portions 96 and a flat portion 97 in a first connection electrode 503 and a second connection electrode 504 are omitted for the sake of description.

As shown in FIG. 129B, the upper surface of the mounting substrate 9 is a mounting surface 9A. A mounting region 589 for the composite chip part 501 is defined on the mounting surface 9A. In the present reference example, the mounting region 589 is formed in a square in a plan view, as shown in FIG. 129C and FIG. 129D and includes a land region 592 in which lands 588 are disposed and a solder resist region 593 surrounding the land region 592.

In a case where the composite chip part 501 is a pair chip, each of which has one circuit element, for example, with a 03015 size, the land region 592 is a tetragon (square) having a planar size of 410 μm×410 μm. That is, the length L501 of one side of the land region 592 is equal to 410 μm. On the other hand, the solder resist region 593 is formed in a rectangular annular shape, for example, having the width L502 of 25 μm, so as to rim the land region 592.

The land 588 is disposed one each at four corners of the land region 592, that is, a total of four. In the present reference example, each of the lands 588 is provided at such a position that is kept at a fixed interval from each of the sides which defines the land region 592. For example, an interval between each side of the land region 592 and each land 588 is 25 Further, mutually adjacent lands 588 are kept apart from each other at an interval of 80 Each of the lands 588 is made of, for example, Cu and connected to an internal circuit (not shown) of the mounting substrate 9. As shown in FIG. 129B, a solder 13 is provided on a front surface of each of the lands 588 so as to project from the front surface.

Where the composite chip part 501 is mounted on the mounting substrate 9, as shown in FIG. 129B, a suction nozzle 76 (refer to FIG. 83, etc.) of an automatic mounting machine (not shown) is made to move, while the suction nozzle 76 suctions the rear surface 502B of the composite chip part 501, thereby conveying the composite chip part 501. In this process, a substantially central part of the rear surface 502B in the longitudinal direction of the substrate 502 is suctioned by the suction nozzle 76. As described above, the first connection electrode 503 and the second connection electrode 504 are provided only at one side (the element forming surface 502A) of the composite chip part 501 and at each ends of the element forming surface 502A side of the side surfaces 502C to 502F and, therefore, with the composite chip part 501, the rear surface 502B is a flat surface with no electrode (unevenness). Thus, where the suction nozzle 76 is made to move while suctioning the composite chip part 501, the flat rear surface 502B can be suctioned by the suction nozzle 76. In other words, a portion which can be suctioned by the suction nozzle 76 can be increased in margin on the flat rear surface 502B. Thereby, the composite chip part 501 can be reliably suctioned by the suction nozzle 76 and the composite chip part 501 can be conveyed reliably without falling off from the suction nozzle 76 midway.

Further, the composite chip part 501 is a pair chip which has a pair of circuit elements (two circuit elements). Therefore, in comparison to a case where, for example, a single chip having a single resistor or a single capacitor is mounted twice, a chip part having the same function can be mounted one time. Still further, as compared with a single chip, a rear surface area per chip can be increased to an area covering two or more resistors or capacitors. Thereby, the suction nozzle 76 can be made stable in suction motions.

Then, the suction nozzle 76 which has suctioned the composite chip part 501 is made to move to the mounting substrate 9. In this process, the element forming surface 502A of the composite chip part 501 faces the mounting surface 9A of the mounting substrate 9. In this state, the suction nozzle 76 is made to move and pressed to the mounting substrate 9. And, in the composite chip part 501, the first connection electrode 503 and the second connection electrode 504 are brought into contact with a solder 13 of each of the lands 588.

Next, the solder 13 is heated to melt the solder 13. When the solder 13 is cooled and solidified, the first connection electrode 503 and the second connection electrode 504 are bonded to the land 588 via the solder 13. That is, each of the lands 588 is solder-bonded to a corresponding electrode, which is the first connection electrode 503 or the second connection electrode 504. Thereby, the composite chip part 501 is completely mounted on the mounting substrate 9 (flip-chip bonding) and the circuit assembly 100 is completed.

In the circuit assembly 100 which has been completed, the element forming surface 502A of the composite chip part 501 and the mounting surface 9A of the mounting substrate 9 extend parallel, while facing each other, with a clearance kept. The dimension of the clearance corresponds to a total of the thickness of a portion projected from the element forming surface 502A in the first connection electrode 503 or the second connection electrode 504 and the thickness of the solder 13.

In the circuit assembly 100, the peripheral edge portions 586, 587 of the first connection electrode 503 and the second connection electrode 504 are formed so as to extend from the element forming surface 502A of the substrate 502 and the side surfaces 502C to 502F thereof (only the side surfaces 502C, 502F are illustrated in FIG. 129B). Therefore, it is possible to increase an adhesion area of solder when the composite chip part 501 is soldered on the mounting substrate 9. As a result, the solder 13 can be increased in adsorption amount onto the first connection electrode 503 and the second connection electrode 504, thereby improving the adhesion strength.

Further, in the mounting state, the chip part can be held in two directions, at least from the element forming surface 502A and the side surfaces 502C to 502F of the substrate 502. Therefore, the chip part 1001 can be mounted stably. Still further, the chip part 1001 which has been mounted on the mounting substrate 9 can be held at four points of the four lands 588, by which the chip part can be mounted in a more stable form.

Further, the composite chip part 501 is a pair chip having a pair of circuit elements (two elements), each having a 03015 size. Therefore, an area of the mounting region 589 for the composite chip part 501 can be decreased to a greater extent than a conventional chip part.

In the present reference example, for example, with reference to FIG. 129C, an area of the mounting region 589 can be reduced to L503×L503=(L502+L501+L502)×(L502+L501+L502)=(25+410+25)×(25+410+25)=211600 μm$^2$.

On the other hand, as shown in FIG. 129E, where the two single chip part 550 with a 0402 size, a minimum size producible by a conventional method, is mounted on the mounting surface 9A of the mounting substrates 9, there is a need for a mounting region 551 having a 319000 μm$^2$. Thus, when the mounting region 589 of the present reference example is compared with the conventional mounting region 551, it is apparent that, with the arrangement of the present reference example, it is possible to reduce a mounting area by approximately as much as 34%.

In addition, an area of the mounting region 551 shown in FIG. 129E is calculated to be (L506+L504+L505+L504+L506)×(L506+L507+L506)=(25+250+30+250+25)×(25+500+25)=319000 μm$^2$ on the basis of the lateral width L504 of the mounting area 552 of each single chip part 550 in which a land 554 is disposed=250 μm, the interval L 505 of mutually adjacent mounting areas 552=30 μm, the width L506 of the solder resist region constituting an outer circumference of the mounting region 551=25 μm, and the length L507 of the mounting area 552=500 μm.

<Smartphone>

FIG. 130 is a perspective view which shows an outer appearance of a smartphone that is an example of an electronic device in which chip parts according to Reference Example 1 to Reference Example 11 are used. A smartphone 1601 is arranged by housing electronic parts in the interior of a housing 602 with a flat rectangular parallelepiped shape. The housing 602 has a pair of rectangular major surfaces at its front side and rear side, and the pair of major surfaces are joined by four side surfaces. A display surface of a display panel 603 constituted of a liquid crystal panel or an organic EL panel, etc., is exposed at one of the major surfaces of the housing 602. The display surface of the display panel 603 constitutes a touch panel and provides an input interface for a user.

The display panel 603 is formed in a rectangular shape that occupies most of one of the major surfaces of the housing 602. Operation buttons 604 are disposed along one short side of the display panel 603. In the present reference example, the plurality of (three) operation buttons 604 are aligned along the short side of the display panel 603. By operating the operation buttons 604 and the touch panel, the user can operate the smartphone 1601, thereby calling and executing necessary functions.

A speaker 605 is disposed in the vicinity of the other short side of the display panel 603. The speaker 605 provides an earpiece for telephone functions and is also used as an acoustic conversion unit for reproducing music data, etc. On the other hand, close to the operation buttons 604, a microphone 606 is disposed on one of the side surfaces of the housing 602. The microphone 606 provides a mouthpiece for telephone functions and also may be used as a microphone for sound recording.

FIG. 131 is an illustrative plan view which shows an arrangement of the circuit assembly 100 housed in the interior of the housing 602. The circuit assembly 100 includes a mounting substrate 9 and circuit parts mounted on a mounting surface 9A of the mounting substrate 9. The plurality of circuit parts include a plurality of integrated circuit elements (IC) 612 to 620 and a plurality of chip parts. The plurality of ICs include a transmission processing IC 612, a one-segment TV receiving IC 613, a GPS receiving IC 614, an FM tuner IC 615, a power supply IC 616, a flash memory 617, a microcomputer 618, a power supply IC 619, and a baseband IC 620.

The plurality of chip part include chip inductors 1621, 1625, 1635, chip resistors 1622, 1624, 1633, chip capacitors 1627, 1630, 1634, chip diodes 1628, 1631 and bidirectional Zener diode chips 1641 to 1648. These chip parts correspond to the chip parts described in Reference Example 1 to Reference Example 11 and are mounted on the mounting surface 9A of the mounting substrate 9 by, for example, flip-chip bonding.

The bidirectional Zener diode chips 1641 to 1648 are provided for absorbing plus/minus surges, etc., on a signal input line to the one-segment TV receiving IC 613, the GPS receiving IC 614, the FM tuner IC 615, the power supply IC 616, the flash memory 617, the microcomputer 618, the power supply IC 619 and the baseband IC 620.

The transmission processing IC 612 incorporates therein an electronic circuit arranged to generate display control signals for the display panel 603 and receive input signals from the touch panel on a front surface of the display panel 603. For connection with the display panel 603, the transmission processing IC 612 is connected to a flexible wiring 609.

The one-segment TV receiving IC 613 incorporates therein an electronic circuit that constitutes a receiver for receiving one-segment broadcast (terrestrial digital television broadcast targeted for reception by portable devices) radio waves. A plurality of chip inductors 1621, a plurality of chip resistors 1622 and a plurality of bidirectional Zener diode chips 1641 are disposed in the vicinity of the one-segment TV receiving IC 613. The one-segment TV receiving IC 613, the chip inductors 1621, the chip resistors 1622 and the bidirectional Zener diode chips 1641 constitute a one-segment broadcast receiving circuit 623. The chip inductors 1621 and the chip resistors 1622 individually have accurately adjusted inductances and resistors, thereby providing circuit constants of high precision to the one-segment broadcast receiving circuit 623.

The GPS receiving IC 614 incorporates therein an electronic circuit that receives radio waves from GPS satellites and outputs positional information of the smartphone 1601. A plurality of bidirectional Zener diode chips 1642 are disposed in the vicinity of the GPS receiving IC 614.

The FM tuner IC 615 constitutes an FM broadcast receiving circuit 626, together with a plurality of chip resistors 1624 mounted on the mounting substrate 9, a plurality of chip inductors 1625 and a plurality of bidirectional Zener diode chips 1643 in the vicinity thereof. The chip resistors 1624 and the chip inductors 1625 individually have accurately adjusted resistance values and inductances, thereby providing circuit constants of high precision to the FM broadcast receiving circuit 626.

A plurality of chip capacitors 1627, a plurality of chip diodes 1628 and a plurality of bidirectional Zener diode chips 1644 are mounted on the mounting surface 9A of the mounting substrate 9 in the vicinity of the power supply IC 616. The power supply IC 616 constitutes a power supply circuit 629, together with the chip capacitors 1627, the chip diodes 1628 and the bidirectional Zener diode chips 1644.

The flash memory 617 is a storage device for recording operating system programs, data generated in the interior of the smartphone 1601, and data and programs obtained from the exterior by communication functions. A plurality of bidirectional Zener diode chips 1645 are disposed in the vicinity of the flash memory 617.

The microcomputer 618 is a computing processing circuit that incorporates therein a CPU, a ROM and a RAM and realizes a plurality of functions of the smartphone 1601 by executing computational processes. More specifically, computational processes for image processing and various application programs are realized by actions of the microcomputer 618. A plurality of bidirectional Zener diode chips 1646 are disposed in the vicinity of the microcomputer 618.

A plurality of chip capacitors 1630, a plurality of chip diodes 1631 and a plurality of bidirectional Zener diode chips 1647 are mounted on the mounting surface 9A of the mounting substrate 9 in the vicinity of the power supply IC 619. The power supply IC 619 constitutes a power supply circuit 632, together with the chip capacitors 1630, the chip diodes 1631 and the bidirectional Zener diode chips 1647.

A plurality of chip resistors 1633, a plurality of chip capacitors 1634, a plurality of chip inductors 1635 and a plurality of bidirectional Zener diode chips 1648 are mounted on the mounting surface 9A of the mounting substrate 9 in the vicinity of the baseband IC 620. The baseband IC 620 constitutes a baseband communication circuit 636, together with the chip resistors 1633, the chip capacitors 1634, the chip inductors 1635 and the plurality of bidirectional Zener diode chips 1648. The baseband communication circuit 636 provides communication functions for telephone communication and data communication.

With the arrangement, electric power that is appropriately adjusted by the power supply circuits 629, 632 is supplied to the transmission processing IC 612, the GPS receiving IC 614, the one-segment broadcast receiving circuit 623, the FM broadcast receiving circuit 626, the baseband communication circuit 636, the flash memory 617 and the microcomputer 618. The microcomputer 618 performs computational processes in response to input signals input via the transmission processing IC 612 and outputs the display control signals from the transmission processing IC 612 on the display panel 603, thereby allowing the display panel 603 to make various displays.

When receiving of one-segment broadcast is commanded by operation of the touch panel or the operation buttons 604, the one-segment broadcast is received by actions of the one-segment broadcast receiving circuit 623. Computational processes for outputting received images to the display panel 603 and making the received audio signals be acoustically converted by the speaker 605 are executed by the microcomputer 618.

Also, when positional information of the smartphone 1601 is needed, the microcomputer 618 obtains the positional information output by the GPS receiving IC 614 and executes computational processes using the positional information.

Further, when an FM broadcast receiving command is input by operation of the touch panel or the operation buttons 604, the microcomputer 618 starts up the FM broadcast receiving circuit 626 and executes computational processes for outputting received audio signals from the speaker 605.

The flash memory 617 is used to store data obtained by communication and also to store data prepared by computations by the microcomputer 618 and input from the touch panel. The microcomputer 618 writes data into the flash memory 617 or reads data from the flash memory 617, whenever necessary.

The telephone communication or data communication functions are realized by the baseband communication circuit 636. The microcomputer 618 controls the baseband communication circuit 636 to perform processing for sending and receiving audio signals and data.

A description has been so far given of modes according to the embodiments and reference examples of the present invention. The modes according to the embodiments and reference examples of the present invention can be implemented by other modes.

For example, in Embodiment 1 to Embodiment 11, a description has been given of a case where the resistor portion, the capacitor, the fuse and the diode are individually formed in one chip part. However, an example in which the resistor portion, the capacitor, the fuse and the diode are selectively formed in one chip part (for example, so as to give a 0603 chip, a 0402 chip, a 03015 chip), may be adopted. Therefore, for example, the element region 5 formed in one chip part is divided into two regions, and a resistor portion and a capacitor may be formed in each of the thus divided element regions, or a capacitor and a diode may be formed.

Further, in Embodiment 1 to Embodiment 11, a description has been given of a case where the plurality of recessed portions 6 are formed so as to be recessed toward the thickness direction of the first connection electrode 3 or the second connection electrode 4. The plurality of recessed portions 6 may be formed so as to penetrate through the first connection electrode 3 and the second connection electrode 4.

Still further, in Embodiment 1 to Embodiment 11, a description has been given of a case where the plurality of recessed portions 6 are formed in the first connection electrode 3 and the second connection electrode 4, and a line-shaped (closed-circular) recessed portion 6 may be formed in which the plurality of recessed portions 6 continue in an integrated manner. The line-shaped recessed portion 6 can be obtained by forming a line-shaped (closed-circular) base recessed portion 8 in a step of forming, for example, the insulating film 20 described in FIG. 14A. In this case, it will be sufficient to change the lay-out of a mask so as to form the line-shaped base recessed portion 8. A second, a third and a still another line-shaped recessed portions may be formed so as to surround the line-shaped recessed portion 6.

Also, in Embodiment 1 to Embodiment 11, a description has been given of a case where the plurality of recessed portions 6 are formed in regions along the long sides 3A, 4A and the short sides 3B, 4B of the first connection electrode 3 and the second connection electrode 4. Such an example where the recessed portions 6 are formed in a region along only either the long sides 3A, 4A or the short sides 3B, 4B of the first connection electrode 3 and the second connection electrode 4 may be adopted. In this case, as compared with a case where the recessed portions 6 are formed both along the long side 3A and the short side 3B, the number of the recessed portions 6 is decreased, thus resulting in a decrease in portions at which light is reflected from a light source 15 by these recessed portions 6. Accordingly, it may be preferable that the recessed portions 6 are formed both along the long side 3A and also along the short side 3B.

Such an arrangement that the recessed portions 6 are formed across the entireties of the first connection electrode 3 and the second connection electrode 4 may also be adopted. In this case, light from the light source 15 can be reflected from the entireties of the first connection electrode 3 and the second connection electrode 4 and, therefore, it becomes possible to make detection more satisfactory by a part recognizing camera 14. On the other hand, since no flat portion 7 is formed in the first connection electrode 3 or the second connection electrode 4, there is a possibility that at the time of an electrical test by using a probe 70*a* (for example, in a step of detecting a resistance value, etc. (refer to FIG. 11B), the probe 70*a* may enter into a recessed portion 6 to make an erroneous measurement. Therefore, it is preferable that the plurality of recessed portions 6 are formed in the first connection electrode 3 and the second connection electrode 4 to such an extent as to secure a contact region of the probe 70*a*.

Further, in Embodiment 1 to Embodiment 11, a description has been given of an example where the flat portion 7 is formed in the internal portion of the first connection electrode 3 (the second connection electrode 4). An example where the flat portion is formed at a corner region in which the long side 3A (long side 4A) of the first connection electrode 3 (second connection electrode 4) intersects with the short side 3B (short side 4B) may be adopted.

Still further, in Embodiment 1 to Embodiment 11, a description has been given of a case where the first connection electrode 3 and the second connection electrode 4 are formed on the side surfaces and the element forming surface 2A so as to cover edges of the substrate 2. The first connection electrode 3 and the second connection electrode 4 may be formed only on the element forming surface 2A. In this case, for example, in the step of FIG. 11D in Embodiment 1, in place of a step of forming the notched portions 25, contact holes for exposing selectively the wiring film 22 may be formed so as to penetrate through the insulating film 45 and the resin film 46 and, thereafter, the first connection electrode 3 and the second connection electrode 4 may be formed so as to refill the contact holes.

Also, in Embodiment 2 to Embodiment 4, such an arrangement that one of the upper electrode film and the lower electrode film is divided into a plurality of electrode films is shown. However, both of the upper electrode film and the lower electrode film may be divided into a plurality of electrode film portions.

Also, in Embodiment 2 to Embodiment 4, an example in which the upper electrode film or the lower electrode film is formed integrally with the fuse unit has been shown. However, the fuse unit may be formed by using a conductor film other than the upper electrode film or the lower electrode film.

Also, in Embodiment 2 to Embodiment 4, an example in which the plurality of capacitor components are such a plurality of capacitor components, each of which has a capacitance value which forms a geometric progression with a common ratio of r ($0<r$, $r=1$)=2, has been shown. However, the common ratio of the geometric progression may be a number other than 2.

Also, in Embodiment 2 to Embodiment 4, a conductive substrate is used as the substrate 2, the conductive substrate is used as a lower electrode, and the capacitance film 112 may be formed so as to be in contact with a front surface of the conductive substrate. In this case, one of the external electrodes may lead out from a rear surface of the conductive substrate.

Further, in Embodiment 5, the wall portions formed at both sides of the soluble portion 210, for which the dummy metal 212 is given as an example, are not required to be raised in relation to the substrate 2 but may be fixed on the substrate 2.

Further, in Embodiment 5, the lower clearance 216 and the upper clearance 225 are formed by isotropic dry etching. However, the clearances 216, 225 may be formed by wet etching.

Further, in Embodiment 6 to Embodiment 9, a description has been given of an example in which four diode cells are formed on the substrate 2. However, two or three diode cells may be formed on the substrate 2 and also four or more diode cells may be formed thereon.

Further, in Embodiment 6 to Embodiment 9, a description has been given of an example in which the p-n junction region and the Schottky junction region may be formed in an octagonal shape in a plan view. The p-n junction region and the Schottky junction region may be formed in an arbitrary polygonal shape having the number of sides of 3 or more or formed so as to give a circular planar shape or an oval planar shape. Where the p-n junction region and the Schottky junction region are formed in a polygonal shape, they are not required to be formed in a regular polygonal shape, and the regions may be formed in a polygon with two or more different side lengths. Still further, the p-n junction region and the Schottky junction region are not required to be formed equal in size, but a plurality of diode cells having junction regions different in dimension may be present together on the substrate 2. In addition, the p-n junction region and the Schottky junction region are not required to be shaped in one type, but the p-n junction region and the Schottky junction region may be shaped in two or more types and present together on the substrate 2.

Further, in Embodiment 10, a description has been given of an example in which the substrate 2 is made of a p-type semiconductor substrate. Instead, the substrate may be made of an n-type semiconductor substrate. In the case of using the n-type semiconductor substrate, an n-type epitaxial layer is formed on a major surface thereof, a $p^+$-type first diffusion region and a $p^+$-type second diffusion region may be formed at a surface layer portion of the n-type epitaxial layer.

Further, in Embodiment 10, each of the first diffusion region 410 and the second diffusion region 412 is formed in the long direction so as to extend in a direction orthogonal to a direction at which they are aligned. However, they may be formed in the long direction so as to extend obliquely with respect to the direction at which they are aligned.

Further, in Reference Example 1 to Reference Example 11, a description has been given of an example in which the plurality of raised portions 96 are formed each in a rectangular shape in a plan view. However, the plurality of raised portions 96 may be formed each in a circular shape in a plan view.

Further, the plurality of raised portions 96 may be aligned in a honeycomb shape in a plan view. Where the plurality of raised portions 96 are formed in a honeycomb shape in a plan view, the widths between mutually adjacent raised portions 96 all become equal. Therefore, the raised portions 96 can be laid fully on the front surfaces of the first connection electrode 3 and the second connection electrode 4 and, as described in Reference Example 1, the same effects can be provided as those of a case where the raised portions 96 are aligned in a staggered manner (also refer to FIG. 71). In this case, the pattern PT having a first and a second openings 22B, 22C (the resin film 24) is formed on the wiring film 22 so that the front surface of the wiring film 22 is exposed in a honeycomb shape.

Further, in Reference Example 1 to Reference Example 11, a description has been given of an example in which the plurality of raised portions 96 are formed, at an interval from each other. Some of the plurality of raised portions 96 may be formed so as to be continuous and arranged in a rectangular shape in a plan view, in a raised manner in a plan view or in a recessed manner in a plan view.

Further, in Reference Example 1 to Reference Example 11, a description has been given of an example in which the flat portion 97 and the plurality of raised portions 96 which have been formed in the peripheries of the flat portion 97 are formed, at an interval from each other. The flat portion 97 and the plurality of raised portions 96 which have been formed in the peripheries of the flat portion 97 may be formed so as to be continuous with each other.

Further, in Reference Example 1 to Reference Example 11, a description has been given of an example in which the plurality of raised portions 96 are formed in the first connection electrode 3 and the second connection electrode 4. A line-shaped (annular) raised portion in which the plurality of raised portions 96 continue in an integrated manner may be formed. The line-shaped raised portion 96 can be obtained by changing a patterning method for the insulating film 45 and the insulating film 20, for example, in a step of forming the pattern PT (notched portions 25) described in FIG. 78C. That is, for example, as described in Reference Example 1, an annular pattern in a plan view is formed so that the first opening 22B is formed in a region directly below the flat portion 97. A plurality of annular patterns may be formed so as to further surround the peripheries of the annular pattern. Thereby, on each front surface of the first connection electrode 3 and the second connection electrode 4, a plurality of line-shaped (annular) raised portions are formed so as to surround the peripheries of the flat portion 97.

Further, in Reference Example 1 to Reference Example 11, a description has been given of an example in which the flat portion 97 is formed on front surfaces of the first connection electrode 3 and the second connection electrode 4. Such an arrangement that the raised portions 96 are formed across the entireties of the front surfaces of the first connection electrode 3 and the second connection electrode 4 may be adopted. In this case, light from the light source 15 can be reflected from the entireties of the surfaces of the first connection electrode 3 and the second connection electrode 4, therefore, it becomes possible to make detection more satisfactory by a part recognizing camera 14. On the other hand, no flat portion 97 is formed in the first connection electrode 3 or the second connection electrode 4 and, therefore, at the time of conducting an electrical test by using probes 70*a*, 70*b* (for example, a step of detecting a resistance value, etc. (refer to FIG. 78D, FIG. 78H), there is a possibility that the probes 70*a*, 70*b* (more specifically, portions of the probes 70*a*, 70*b* other than the leading end portions) may be in contact with the raised portions 96. It is therefore preferable that the plurality of raised portions 96 are formed in the first connection electrode 3 and the second connection electrode 4 to such an extent so as to secure a region in contact with the probes 70*a*, 70*b*.

Further, in Reference Example 1 to Reference Example 11, a description has been given of an example in which the flat portion 97 is formed at internal portions of the first connection electrode 3 and the second connection electrode 4. Such an example that the flat portion is formed in a corner region where the long sides 3A, 4A of the first connection electrode 3 and the second connection electrode 4 intersect with the short sides 3B, 4B thereof may be adopted.

Further, in Reference Example 1 to Reference Example 11, a description has been given of an example in which the rectangular-shaped flat portion 97 in a plan view is formed on the front surface of each of the first connection electrode 3 and the second connection electrode 4. A flat portion which is in a polygonal shape or in a circular shape in a plan view may be formed in place of the rectangular flat portion 97 in a plan view. In this case, a pattern PT which includes the first opening 22B which is in a polygonal shape or in a circular shape in a plan view may be formed on the wiring film 22 at a position corresponding to a region in which the flat portion may be formed.

Further, in Reference Example 1 to Reference Example 11, a description has been given of an example in which the pattern PT which includes a resin film is formed on the wiring film 22. However, the pattern PT may be made of a material other than the resin film, for example, an insulating material such as $SiO_2$ or SiN.

Further, in Reference Example 1 to Reference Example 11, a description has been given of an example in which the first connection electrode 3 and the second connection electrode 4 are formed on the side surfaces and the element forming surface 2A so as to cover edges of the substrate 2. The first connection electrode 3 and the second connection electrode 4 may be formed only on the element forming surface 2A. In this case, in the step of FIG. 78B in Reference Example 1, for example, in place of a step of forming the notched portions 25, contact holes for selectively exposing the wiring films 22 may be formed so as to penetrate through the insulating film 45 and the resin film 46 and, thereafter, the first connection electrode 3 and the second connection electrode 4 may be formed so as to refill these contact holes.

Further, in Reference Example 1 to Reference Example 5, the insulating film 20 is formed on the front surface of the substrate 2. If the substrate 2 is an insulating substrate (for example, a ceramic substrate), the insulating film 20 may be omitted. It is therefore possible to simplify the steps of manufacturing the chip part.

Further, in Reference Example 2 to Reference Example 4, such an arrangement that one of the upper electrode film and the lower electrode film is divided into a plurality of electrode films has been shown. However, both of the upper electrode film and the lower electrode film may be divided into a plurality of electrode film portions.

Further, in Reference Example 2 to Reference Example 4, an example in which the upper electrode film or the lower electrode film is formed integrally with the fuse unit has been shown. However, the fuse unit may be formed by a conductor film which is different from the upper electrode film or the lower electrode film.

Further, in Reference Example 2 to Reference Example 4, an example in which each of the plurality of capacitor components is provided with a plurality of capacitor components having a capacitance value which forms a geometric progression with a common ratio of r ($0<r$, $r\neq 1$)=2, has been shown. However, the common ratio of the geometric progression may be a number other than 2.

Further, in Reference Example 2 to Reference Example 4, a conductive substrate is used as the substrate 2, the conductive substrate is used as a lower electrode, and the capacitance film 112 may be formed so as to be in contact with a front surface of the conductive substrate. In this case, one of the external electrodes may lead out from a rear surface of the conductive substrate.

Further, in Reference Example 5, the wall portions which are formed at both sides of the soluble portion 210, for which the dummy metal 212 is given as an example, are not required to be raised in relation to the substrate 2 but may be fixed on the substrate 2.

Further, in Reference Example 5, the lower clearance 216 and the upper clearance 225 are formed by isotropic dry etching. However, these clearances 216, 225 may be formed by wet etching.

Further, in Reference Example 6 to Reference Example 9, a description has been given of an example in which four diode cells are formed on the substrate 2. However, on the substrate 2, two or three diode cells may be formed or four or more diode cells may be formed.

Further, in Reference Example 6 to Reference Example 9, a description has been given of an example in which the p-n junction region or the Schottky junction region may be formed in an octagonal in a plan view. The p-n junction region and the Schottky junction region may be formed in an arbitrary polygonal shape having the number of sides of 3 or more or formed in a circular planar shape or an oval planar shape. Where the p-n junction region and the Schottky junction region are formed in a polygonal shape, the regions are not required to be in a regular polygonal shape and may be formed in a polygonal shape having two different side lengths. Still further, the p-n junction region or the Schottky junction region is not required to be formed equal in size but a plurality of diode cells, each of which has a junction region different in dimension, may be present together on the substrate 2. In addition, the p-n junction region or the Schottky junction region is not required to be shaped in one type but the p-n junction region and the Schottky junction region may be shaped in two or more types and may be present together on the substrate 2.

Further, in Reference Example 10, a description has been given of an example in which the substrate 2 is constituted of a p-type semiconductor substrate. Instead, the substrate may be constituted of an n-type semiconductor substrate. Where the n-type semiconductor substrate is used, an n-type epitaxial layer is formed on a major surface thereof, and a $p^+$-type first diffusion region and a $p^+$-type second diffusion region may be formed on a surface layer portion of the n-type epitaxial layer.

Further, in Reference Example 10, the first diffusion region 410 and the second diffusion region 412 are formed in the long direction by extending in a direction orthogonal to a direction at which they are aligned. However, they may be formed in the long direction by extending obliquely to a direction at which they are aligned.

In addition, various design changes may be applied within the scope of the matters described in the claims. The followings are features extracted from the specification and the drawings.

Where, for example, with reference to FIG. 67 to FIG. 131, a chip part by which it is possible to make a front-surface or rear-surface determination satisfactorily and which can be smoothly mounted on a mounting substrate and a method for manufacturing the chip part are provided, and also where a circuit assembly including the chip part and an electronic device including the circuit assembly are provided, a chip part which has features shown in A1 to A23 given below can be extracted.

A1: A chip part which includes a substrate, an electrode which is formed on the substrate and has a front surface containing a raised-portion forming portion in which a plurality of raised portions are formed, each of which has a predetermined pattern that projects above, and an element region which has a circuit element electrically connected to the electrode.

According to the arrangement, even if the chip part is suctioned in an inclined manner, light irradiated to the electrode from a light source is irregularly reflected by the raised portions of the electrode formed on the frontmost surface of the chip part. The plurality of raised portions are formed in the electrode of the chip part and, therefore, even if the chip part is suctioned in an inclined manner by a suction nozzle, incident light from the light source can be reflected in all directions. Therefore, irrespective of the way in which a part recognizing camera is disposed in relation to a part detection position (a position at which the part recognizing camera makes a front-surface or rear-surface determination), it is possible to detect electrode satisfactorily by the part recognizing camera. Thus, an automatic mounting machine is less likely to perform misrecognition by a specification of the chip part, making it possible to smoothly mount the chip part on a mounting substrate.

In addition, only such processing will be sufficient that the raised portions are formed in the electrode of the chip part and can be applied to a chip part different in specification. Thus, a necessity for changing the condition (the specification) of a light source disposed in the peripheries of the part recognizing camera for each specification of the chip part is eliminated.

A2: The chip part described in A1 which includes a wiring film that is formed between the substrate and the electrode to electrically connect the electrode with the circuit element and an insulation pattern that is formed on the wiring film to have selectively an opening below the plurality of raised portions.

According to the arrangement, the raised portions formed on a front surface of the electrode can be formed by the insulation pattern formed on the wiring film. That is, without adding separately a step of forming the raised portions on the front surface of the electrode, the insulation pattern is formed in advance on the wiring film and, thereafter, the opening is refilled with an electrode material under a predetermined condition. Thus, it is possible to form the electrode and also form the raised portions on the front surface of the electrode by using the insulation pattern formed on the wiring film.

A3: The chip part described in A2 in which the insulation pattern is provided with a laminated structure of the insulating film that has a resin film on the frontmost surface thereof.

A4: The chip part described in A3 in which the resin film is made of polyimide.

A5: The chip part described in any one of A1 to A4 in which the raised-portion forming portion includes a pattern in which the plurality of raised portions are aligned at fixed intervals in a matrix form in a row direction and in a column direction which are orthogonal to each other.

According to the arrangement, light from a light source can be reflected uniformly and, therefore, the part recognizing camera can be used to detect the electrode more satisfactorily.

A6: The chip part described in any one of A1 to A5 in which the raised-portion forming portion includes a pattern in which the plurality of raised portions are aligned in a staggered manner in a row direction and in a column direction which are orthogonal to each other, while deviating at their positions every other column in the row direction.

In the case of the arrangement which includes a pattern in which the raised portions are aligned in a matrix form, portions which are recessed in the thickness direction from the top portions of the raised portions (hereinafter referred to as "bottom portions of the electrode") are formed on the front surface of the electrode in a net-like form. The bottom portion of the electrode includes a pattern extending in the row direction and a pattern extending in the column direction. At a cross-shaped crossing portion in which the patterns on the bottom portion of the electrode extending in the row direction and in the column direction intersect with each other, the width of the crossing portion in a diagonal direction (that is, a straight-line direction which connects a corner of a raised portion with a corner facing across the center of the raised portion) is formed to be greater than each width of the bottom portions of the electrode extending in the row direction and in the column direction. At the crossing portion, the bottom portion of the electrode extending in the row direction and that extending in the column direction are formed so as to overlap. Therefore, there is a possibility that the bottom portion of the electrode formed at the crossing portion may be formed deeper than other portions. As a result, for example, where an insulation pattern is formed as a base layer in a region directly below the bottom portion of the electrode, there is a possibility that the front surface of the insulation pattern may be exposed.

Thus, the front surface of the electrode is formed so as to include a pattern in which the raised portions are aligned in a staggered manner, thus making it possible to change a crossing portion of the patterns formed by the bottom portions of the electrode from a cross shape to a T-letter shape. That is, the number of the raised portions adjacent to the crossing portion can be decreased from four to three, and a distance between three raised portions mutually adjacent at the crossing portion can be made to coincide with a distance between mutually adjacent raised portions in the row direction and in the column direction. Thereby, it is possible to prevent the bottom portion of the electrode from being formed to overlap at the crossing portion and effectively suppress the bottom portion of the electrode from being formed deeply.

A7: The chip part described in any one of A1 to A6 in which a flat portion having a wider area than each of the raised portions is formed on the front surface of the electrode.

In the steps of manufacturing the chip part, the circuit elements formed in the element region are subjected to probing (electrical test). In the arrangement in which the flat portion having a wider area than a raised portion is provided on the front surface of the electrode, it is possible to suppress or prevent a probe (more specifically, a portion of the probe other than the leading end portion) from being in contact with a raised portion. As a result, probing can be performed satisfactorily. It is also possible to secure satisfactorily a connection area used in mounting the chip part on a mounting substrate.

It is preferable that the flat portion is formed in an internal portion of the electrode. According to the arrangement, a position at which the probe is in contact with the electrode is limited to the internal portion of the electrode, thereby making it possible to effectively suppress or prevent the probe from being in contact with a raised portion.

A8: The chip part described in A7 in which the raised-portion forming portion is formed so as to surround the flat portion.

A9: The chip part described in any one of A1 to A8 in which the electrode is formed integrally on the front surface and the side surfaces so as to cover an edge of the front surface of the substrate.

A10: The chip part described in A9 in which the substrate is formed in a rectangular shape in a plan view and the electrode is formed so as to cover three directional edges of the substrate.

A11: The chip part described in any one of A1 to A10 in which the electrode includes a pair of electrodes which are formed, at an interval from each other, and the element region is formed between the pair of electrodes.

A12: The chip part described in any one of A1 to A11 in which the element region includes a plurality of element regions in which on the substrate, a plurality of circuit elements, each of which has mutually different functions, are disposed, at an interval from each other, and the electrode includes a pair of electrodes formed on the front surface of the substrate so as to be individually connected to the plurality of circuit elements.

According to the arrangement, the chip part constitutes a composite chip part in which a plurality of circuit elements are disposed on a common substrate. With the composite chip part, it is possible to reduce a junction area (mounting area) when being mounted on a mounting substrate. Also, the composite chip part is made into an N-sequentially connected chip (N denotes a positive integer). Thereby, in comparison to a case where a chip part having a single element is mounted N number of times, a chip part having the same functions can be mounted one time. Further, as compared with a single chip, it is possible to increase an area per chip part, thus making it possible to stabilize suction motions by a suction nozzle of an automatic mounting machine.

A13: the chip part described in any one of A1 to A12 in which the electrode includes an Ni layer, an Au layer, and a Pd layer interposed between the Ni layer and the Au layer.

According to the arrangement, the Au layer is formed on the frontmost surface of the electrode which functions as an external connection electrode of the chip part. Therefore, when the chip part is mounted on a mounting substrate, it is possible to achieve excellent solder wettability and high reliability. Further, in the thus arranged electrode, the Au layer is made thin and, thereby, even upon formation of a penetrating hole (pinhole) on the Au layer, the Pd layer interposed between the Ni layer and the Au layer closes the penetrating hole. It is therefore possible to prevent oxidation of the Ni layer resulting from exposure to the exterior through the penetrating hole.

A14: The chip part described in any one of A1 to A13 in which the circuit element includes a resistor portion.

A15: The chip part described in any one of A1 to A14 in which the circuit element includes a capacitor.

A16: The chip part described in any one of A1 to A15 in which the circuit element includes a fuse.

A17: The chip part described in any one of A1 to A16 in which the circuit element includes a diode.

The diode includes, for example, a pn diode, a Schottky diode and a Zener diode.

A18: A circuit assembly which includes the chip part described in any one of A1 to A17 and a mounting substrate which has a land solder-bonded to the electrode on a mounting surface which faces the front surface of the substrate.

A19: An electronic device which includes the circuit assembly described in A18 and a housing which houses the circuit assembly.

A20: A method for manufacturing a chip part which includes a step of forming on a substrate a wiring film electrically connected to a circuit element housed in an element region set on the substrate, a step of forming an insulation pattern on the wiring film so as to form a plurality of openings for selectively exposing the wiring films, and a step of forming an electrode on the insulation pattern by covering the insulation pattern with an electrode material so as to form a raised-portion forming portion which has selectively a plurality of raised portions above the plurality of openings of the insulation pattern.

According to the method, it is possible to manufacture a chip part in which the plurality of raised portions are formed on a front surface of the electrode formed on the substrate. Therefore, a chip part which has the effects similar to those of the chip part can be manufactured.

A21: The method for manufacturing the chip part described in A20 in which the step of forming the insulation pattern includes a step of forming the insulation pattern in such a pattern that the plurality of openings are aligned at fixed intervals in a matrix form in a row direction and in a column direction which are orthogonal to each other.

According to the method, it is possible to manufacture the chip part in which the plurality of raised portions are formed in a matrix form on the front surface of the electrode.

A22: The method for manufacturing the chip part described in A20 or A21 in which the step of manufacturing the insulation pattern includes a step of forming the insulation pattern in such a pattern that the plurality of openings are aligned in a staggered manner in a row direction and in a column direction which are orthogonal to each other, while deviating at their positions every other column in the row direction.

According to the method, it is possible to manufacture the chip part in which the plurality of raised portions are formed in a staggered manner on the front surface of the electrode.

A23: The method for manufacturing the chip part described in any one of A20 to A22 in which the step of forming the insulation pattern includes a step of forming the insulation pattern in such a pattern that forms a flat insulating material portion having a wider area than that of each of the openings.

According to the method, it is possible to manufacture the chip part in which the flat portion is formed on the front surface of the electrode.

The invention claimed is:

1. A chip part, comprising:

a substrate having a front surface;

an element region having a circuit element;

an electrode disposed on the front surface of the substrate and electrically connected to the circuit element, the electrode having a rear surface, and a front surface in which a plurality of recessed dented portions are provided such that the recessed dented portions are exposed outside such that incident light from a light source directed to the recessed dented portions is reflected in all directions, each recessed dented portion having a bottom disposed in a thickness direction between the rear surface and the front surface of the electrode, the electrode having a flat portion in which the recessed dented portions are not disposed, the flat portion being formed at an internal portion of the electrode, the recessed dented portions being arranged along an entire outer periphery of the electrode and within an outermost edge of the front surface of the substrate, so as to surround the flat portion, each two adjacent recessed dented portions being spaced apart from each other at a predetermined distance, greater than zero, each recessed dented portion being formed on an outermost front surface of the electrode such that a conductive material of the electrode at the bottom of each said recessed dented portion is viewable from above the electrode; and an insulating film between the substrate and the electrode, wherein the insulating film includes a plurality of base recessed portions overlapping the recessed dented portions of the electrode, each base recessed portion having a bottom defined by a part of the insulating film.

2. The chip part according to claim 1, further comprising:

a wiring film disposed between the insulating film and the electrode, the wiring film configured to electrically connect the electrode with the circuit element.

3. The chip part according to claim 1, wherein the electrode is formed integrally on a front surface of the substrate and side surfaces of the substrate such that the electrode covers an edge of the front surface of the substrate.

4. The chip part according to claim 3, wherein the substrate has a rectangular shape, and the electrode covers three-directional edges of the substrate.

5. The chip part according to claim 1, wherein the electrode includes a pair of electrodes disposed at an interval, greater than zero, from each other, and the element region is formed between the pair of electrodes.

6. The chip part according to claim 1, wherein the element region includes a plurality of element regions in which a plurality of circuit elements, each of which has mutually different functions, are disposed, and the electrode includes a pair of electrodes individually connected to the plurality of circuit elements.

7. The chip part according to claim 1, wherein the electrode includes a nickel (Ni) layer, a gold (Au) layer, and a palladium (Pd) layer between the Ni layer and the Au layer.

8. The chip part according to claim 1, wherein the circuit element includes a resistor portion.

9. The chip part according to claim 1, wherein the circuit element includes a capacitor.

10. The chip part according to claim 1, wherein the circuit element includes a fuse.

11. The chip part according to claim 1, wherein the circuit element includes a diode.

12. The chip part according to claim 1, wherein the substrate comprises an insulating material, and the substrate includes a plurality of base recessed portions overlapping the recessed dented portions of the electrode.

13. The chip part according to claim 1, wherein only two of the recessed dented portions are disposed on a straight line that extends through the flat portion.

14. The chip part according to claim 1, wherein the recessed dented portions are disposed as a whole on a rectangular ring line that extends along the periphery of the flat portion, and each of the two adjacent recessed dented portions are arranged a same distance.

15. A circuit assembly, comprising:

a chip part which includes a substrate having a front surface, an element region having a circuit element, an electrode disposed on the front surface of the substrate and electrically connected to the circuit element, the electrode having a rear surface, and a front surface in which a plurality of recessed dented portions are provided such that the recessed dented portions are exposed outside such that incident light from a light source directed to the recessed dented portions is reflected in all directions, each recessed dented portion having a bottom disposed in a thickness direction between the rear surface and the front surface of the electrode, the electrode having a flat portion in which the recessed dented portions are not disposed, the flat portion being formed at an internal portion of the electrode, the recessed dented portions being arranged along an entire outer periphery of the electrode and within an outermost edge of the front surface of the substrate, as to surround the flat portion, each two adjacent recessed dented portions being spaced apart from each other at a predetermined distance, greater than zero, each recessed dented portion being formed on an outermost front surface of the electrode such that a conductive material of the electrode at the bottom of each said recessed dented portion is viewable from above the electrode; and an insulating film between the substrate and the electrode, wherein the insulating film includes a plurality of base recessed portions overlapping the recessed dented portions of the electrode, each base recessed portion having a bottom defined by a part of the insulating film.

16. The circuit assembly according to claim 15, wherein the recessed dented portions are disposed as a whole on a rectangular ring line that extends along the periphery of the flat portion, and each of the two adjacent recessed dented portions are arranged a same distance.

17. An electronic device, comprising:

a circuit assembly including a chip part which includes a substrate having a front surface, an element region having a circuit element, an electrode disposed on the front surface of the substrate and electrically connected to the circuit element, the electrode having a front surface in which a plurality of recessed dented portions are provided such that the recessed dented portions are exposed outside such that incident light from a light source directed to the recessed dented portions is reflected in all directions, each dented portion having a bottom disposed in a thickness direction between a rear surface of the electrode and the front surface of the electrode, the electrode including a flat portion in which a plurality of recessed dented portions are not disposed, the flat portion being formed at an internal portion of the electrode, the recessed dented portions being arranged along an entire outer periphery of the electrode and within an outermost edge of the front surface of the substrate so as to surround the flat portion, each two adjacent recessed dented portions being spaced apart from each other at a predetermined distance, greater than zero, each recessed dented portion being formed on an outermost front surface of the electrode such that a conductive material of the electrode at the bottom of each said recessed dented portion is viewable from above the electrode, and an insulating film between the substrate and the electrode; and a mounting substrate having a land that is bonded to the electrode; and a housing which houses the circuit assembly, wherein the insulating film includes a plurality of base recessed portions overlapping the recessed dented portions of the electrode, each base recessed portion having a bottom defined by a part of the insulating film.

* * * * *